US012588427B2

(12) United States Patent
Gilbert et al.

(10) Patent No.: US 12,588,427 B2
(45) Date of Patent: *Mar. 24, 2026

(54) ELECTRICAL, MECHANICAL, COMPUTING, AND/OR OTHER DEVICES FORMED OF EXTREMELY LOW RESISTANCE MATERIALS

(71) Applicant: Ambature Inc., Scottsdale, AZ (US)

(72) Inventors: Douglas J. Gilbert, Flagstaff, AZ (US);
Y. Eugene Shteyn, Cupertino, CA (US); Michael J. Smith, Seattle, WA (US); Joel Patrick Hanna, Sacramento, CA (US); Paul Greenland, Morgan Hill, CA (US); Brian Coppa, Phoenix, AZ (US); Forrest North, Palo Alto, CA (US)

(73) Assignee: Ambature, Inc., Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/648,619

(22) Filed: Apr. 29, 2024

(65) Prior Publication Data

US 2025/0098551 A1 Mar. 20, 2025

Related U.S. Application Data

(60) Continuation of application No. 17/705,847, filed on Mar. 28, 2022, now Pat. No. 12,063,874, which is a
(Continued)

(51) Int. Cl.
*H01B 1/00* (2006.01)
*C04B 35/45* (2006.01)
(Continued)

(52) U.S. Cl.
CPC ........... *H10N 60/857* (2023.02); *C04B 35/45* (2013.01); *G01K 7/006* (2013.01); *G01L 21/12* (2013.01); *G01R 33/0354* (2013.01); *H01B 1/00* (2013.01); *H01F 6/06* (2013.01); *H02K 3/02* (2013.01); *H02K 55/00* (2013.01); *H10N 60/124* (2023.02); *H10N 60/203* (2023.02); *H10N 60/858* (2023.02); *H01L 23/53285* (2013.01); *H01L 2224/48091* (2013.01); *H01L 2224/48247* (2013.01); *H01L 2924/01015* (2013.01); *H01L 2924/01047* (2013.01); *H01L 2924/10253* (2013.01); *H01L 2924/10329* (2013.01);
(Continued)

(58) Field of Classification Search
CPC .. H01B 1/00; H01B 1/08; H01L 39/12; H01L 39/125; H01L 39/143; C04B 35/4504
See application file for complete search history.

(56) References Cited

PUBLICATIONS

Uchiyama et al "Preparation of Superconductive Y—Ba—Cu—O/Bi—Sr—Ca—Cu—0 Heteroepitaxial Bilayer Films by Nd:YAG Laser Ablation", IEEE Transactions on Applied Superconductivity, vol. 11, No. I, Mar. 2001.*
(Continued)

*Primary Examiner* — Mark Kopec
(74) *Attorney, Agent, or Firm* — Toering Patents PLLC

(57) ABSTRACT

Electrical, mechanical, computing, and/or other devices that include components formed of extremely low resistance (ELR) materials, including, but not limited to, modified ELR materials, layered ELR materials, and new ELR materials, are described.

15 Claims, 283 Drawing Sheets

Related U.S. Application Data division of application No. 16/407,160, filed on May 8, 2019, now Pat. No. 11,289,639, which is a division of application No. 14/008,932, filed as application No. PCT/US2012/031554 on Mar. 30, 2012, now Pat. No. 10,333,047, which is a continuation-in-part of application No. 13/076,188, filed on Mar. 30, 2011, now Pat. No. 8,404,620.

(60) Provisional application No. 61/469,283, filed on Mar. 30, 2011, provisional application No. 61/469,567, filed on Mar. 30, 2011, provisional application No. 61/469,571, filed on Mar. 30, 2011, provisional application No. 61/469,573, filed on Mar. 30, 2011, provisional application No. 61/469,576, filed on Mar. 30, 2011, provisional application No. 61/469,293, filed on Mar. 30, 2011, provisional application No. 61/469,580, filed on Mar. 30, 2011, provisional application No. 61/469,584, filed on Mar. 30, 2011, provisional application No. 61/469,585, filed on Mar. 30, 2011, provisional application No. 61/469,586, filed on Mar. 30, 2011, provisional application No. 61/469,589, filed on Mar. 30, 2011, provisional application No. 61/469,590, filed on Mar. 30, 2011, provisional application No. 61/469,592, filed on Mar. 30, 2011, provisional application No. 61/469,303, filed on Mar. 30, 2011, provisional application No. 61/469,591, filed on Mar. 30, 2011, provisional application No. 61/469,595, filed on Mar. 30, 2011, provisional application No. 61/469,600, filed on Mar. 30, 2011, provisional application No. 61/469,602, filed on Mar. 30, 2011, provisional application No. 61/469,605, filed on Mar. 30, 2011, provisional application No. 61/469,609, filed on Mar. 30, 2011, provisional application No. 61/469,613, filed on Mar. 30, 2011, provisional application No. 61/469,618, filed on Mar. 30, 2011, provisional application No. 61/469,652, filed on Mar. 30, 2011, provisional application No. 61/469,313, filed on Mar. 30, 2011, provisional application No. 61/469,620, filed on Mar. 30, 2011, provisional application No. 61/469,622, filed on Mar. 30, 2011, provisional application No. 61/469,627, filed on Mar. 30, 2011, provisional application No. 61/469,630, filed on Mar. 30, 2011, provisional application No. 61/469,632, filed on Mar. 30, 2011, provisional application No. 61/469,635, filed on Mar. 30, 2011, provisional application No. 61/469,640, filed on Mar. 30, 2011, provisional application No. 61/469,645, filed on Mar. 30, 2011, provisional application No. 61/469,318, filed on Mar. 30, 2011, provisional application No. 61/469,599, filed on Mar. 30, 2011, provisional application No. 61/469,604, filed on Mar. 30, 2011, provisional application No. 61/469,608, filed on Mar. 30, 2011, provisional application No. 61/469,612, filed on Mar. 30, 2011, provisional application No. 61/469,617, filed on Mar. 30, 2011, provisional application No. 61/469,619, filed on Mar. 30, 2011, provisional application No. 61/469,624, filed on Mar. 30, 2011, provisional application No. 61/469,628, filed on Mar. 30, 2011, provisional application No. 61/469,324, filed on Mar. 30, 2011, provisional application No. 61/469,637, filed on Mar. 30, 2011, provisional application No. 61/469,641, filed on Mar. 30, 2011, provisional application No. 61/469,644, filed on Mar.

30, 2011, provisional application No. 61/469,331, filed on Mar. 30, 2011, provisional application No. 61/469,650, filed on Mar. 30, 2011, provisional application No. 61/469,335, filed on Mar. 30, 2011, provisional application No. 61/469,656, filed on Mar. 30, 2011, provisional application No. 61/469,658, filed on Mar. 30, 2011, provisional application No. 61/469,659, filed on Mar. 30, 2011, provisional application No. 61/469,662, filed on Mar. 30, 2011, provisional application No. 61/469,342, filed on Mar. 30, 2011, provisional application No. 61/469,667, filed on Mar. 30, 2011, provisional application No. 61/469,679, filed on Mar. 30, 2011, provisional application No. 61/469,684, filed on Mar. 30, 2011, provisional application No. 61/469,769, filed on Mar. 30, 2011, provisional application No. 61/469,358, filed on Mar. 30, 2011, provisional application No. 61/469,603, filed on Mar. 30, 2011, provisional application No. 61/469,606, filed on Mar. 30, 2011, provisional application No. 61/469,610, filed on Mar. 30, 2011, provisional application No. 61/469,615, filed on Mar. 30, 2011, provisional application No. 61/469,621, filed on Mar. 30, 2011, provisional application No. 61/469,625, filed on Mar. 30, 2011, provisional application No. 61/469,633, filed on Mar. 30, 2011, provisional application No. 61/469,639, filed on Mar. 30, 2011, provisional application No. 61/469,642, filed on Mar. 30, 2011, provisional application No. 61/469,653, filed on Mar. 30, 2011, provisional application No. 61/469,657, filed on Mar. 30, 2011, provisional application No. 61/469,665, filed on Mar. 30, 2011, provisional application No. 61/469,668, filed on Mar. 30, 2011, provisional application No. 61/469,361, filed on Mar. 30, 2011, provisional application No. 61/469,623, filed on Mar. 30, 2011, provisional application No. 61/469,634, filed on Mar. 30, 2011, provisional application No. 61/469,643, filed on Mar. 30, 2011, provisional application No. 61/469,648, filed on Mar. 30, 2011, provisional application No. 61/469,363, filed on Mar. 30, 2011, provisional application No. 61/469,655, filed on Mar. 30, 2011, provisional application No. 61/469,660, filed on Mar. 30, 2011, provisional application No. 61/469,666, filed on Mar. 30, 2011, provisional application No. 61/469,671, filed on Mar. 30, 2011, provisional application No. 61/469,675, filed on Mar. 30, 2011, provisional application No. 61/469,678, filed on Mar. 30, 2011, provisional application No. 61/469,685, filed on Mar. 30, 2011, provisional application No. 61/469,691, filed on Mar. 30, 2011, provisional application No. 61/469,367, filed on Mar. 30, 2011, provisional application No. 61/469,697, filed on Mar. 30, 2011, provisional application No. 61/469,700, filed on Mar. 30, 2011, provisional application No. 61/469,703, filed on Mar. 30, 2011, provisional application No. 61/469,704, filed on Mar. 30, 2011, provisional application No. 61/469,710, filed on Mar. 30, 2011, provisional application No. 61/469,371, filed on Mar. 30, 2011, provisional application No. 61/469,717, filed on Mar. 30, 2011, provisional application No. 61/469,721, filed on Mar. 30, 2011, provisional application No. 61/469,727, filed on Mar. 30, 2011, provisional application No. 61/469,731, filed on Mar. 30, 2011, provisional application No. 61/469,735, filed on Mar.

30, 2011, provisional application No. 61/469,740, filed on Mar. 30, 2011, provisional application No. 61/469,756, filed on Mar. 30, 2011, provisional application No. 61/469,398, filed on Mar. 30, 2011, provisional application No. 61/469,654, filed on Mar. 30, 2011, provisional application No. 61/469,673, filed on Mar. 30, 2011, provisional application No. 61/469,683, filed on Mar. 30, 2011, provisional application No. 61/469,687, filed on Mar. 30, 2011, provisional application No. 61/469,692, filed on Mar. 30, 2011, provisional application No. 61/469,711, filed on Mar. 30, 2011, provisional application No. 61/469,716, filed on Mar. 30, 2011, provisional application No. 61/469,723, filed on Mar. 30, 2011, provisional application No. 61/469,638, filed on Mar. 30, 2011, provisional application No. 61/469,646, filed on Mar. 30, 2011, provisional application No. 61/469,728, filed on Mar. 30, 2011, provisional application No. 61/469,737, filed on Mar. 30, 2011, provisional application No. 61/469,743, filed on Mar. 30, 2011, provisional application No. 61/469,745, filed on Mar. 30, 2011, provisional application No. 61/469,751, filed on Mar. 30, 2011, provisional application No. 61/469,754, filed on Mar. 30, 2011, provisional application No. 61/469,761, filed on Mar. 30, 2011, provisional application No. 61/469,766, filed on Mar. 30, 2011, provisional application No. 61/469,770, filed on Mar. 30, 2011, provisional application No. 61/469,772, filed on Mar. 30, 2011, provisional application No. 61/469,774, filed on Mar. 30, 2011, provisional application No. 61/469,775, filed on Mar. 30, 2011, provisional application No. 61/469,401, filed on Mar. 30, 2011, provisional application No. 61/469,672, filed on Mar. 30, 2011, provisional application No. 61/469,674, filed on Mar. 30, 2011, provisional application No. 61/469,676, filed on Mar. 30, 2011, provisional application No. 61/469,681, filed on Mar. 30, 2011, provisional application No. 61/469,376, filed on Mar. 30, 2011, provisional application No. 61/469,686, filed on Mar. 30, 2011, provisional application No. 61/469,690, filed on Mar. 30, 2011, provisional application No. 61/469,693, filed on Mar. 30, 2011, provisional application No. 61/469,694, filed on Mar. 30, 2011, provisional application No. 61/469,695, filed on Mar. 30, 2011, provisional application No. 61/469,696, filed on Mar. 30, 2011, provisional application No. 61/469,698, filed on Mar. 30, 2011, provisional application No. 61/469,392, filed on Mar. 30, 2011, provisional application No. 61/469,707, filed on Mar. 30, 2011, provisional application No. 61/469,709, filed on Mar. 30, 2011, provisional application No. 61/469,712, filed on Mar. 30, 2011, provisional application No. 61/469,424, filed on Mar. 30, 2011, provisional application No. 61/469,714, filed on Mar. 30, 2011, provisional application No. 61/469,718, filed on Mar. 30, 2011, provisional application No. 61/469,720, filed on Mar. 30, 2011, provisional application No. 61/469,724, filed on Mar. 30, 2011, provisional application No. 61/469,726, filed on Mar. 30, 2011, provisional application No. 61/469,730, filed on Mar. 30, 2011, provisional application No. 61/469,387, filed on Mar. 30, 2011, provisional application No. 61/469,732, filed on Mar. 30, 2011, provisional application No. 61/469,736, filed on Mar.

30, 2011, provisional application No. 61/469,739, filed on Mar. 30, 2011, provisional application No. 61/469,554, filed on Mar. 30, 2011, provisional application No. 61/469,742, filed on Mar. 30, 2011, provisional application No. 61/469,744, filed on Mar. 30, 2011, provisional application No. 61/469,747, filed on Mar. 30, 2011, provisional application No. 61/469,749, filed on Mar. 30, 2011, provisional application No. 61/469,750, filed on Mar. 30, 2011, provisional application No. 61/469,560, filed on Mar. 30, 2011, provisional application No. 61/469,753, filed on Mar. 30, 2011, provisional application No. 61/469,755, filed on Mar. 30, 2011, provisional application No. 61/469,757, filed on Mar. 30, 2011, provisional application No. 61/469,758, filed on Mar. 30, 2011, provisional application No. 61/469,759, filed on Mar. 30, 2011, provisional application No. 61/469,760, filed on Mar. 30, 2011, provisional application No. 61/469,762, filed on Mar. 30, 2011, provisional application No. 61/469,763, filed on Mar. 30, 2011, provisional application No. 61/583,855, filed on Jan. 6, 2012.

(51) Int. Cl.

| | |
|---|---|
| *G01K 7/00* | (2006.01) |
| *G01L 21/12* | (2006.01) |
| *G01R 33/035* | (2006.01) |
| *H01F 6/06* | (2006.01) |
| *H01L 39/12* | (2006.01) |
| *H02K 3/02* | (2006.01) |
| *H02K 55/00* | (2006.01) |
| *H10N 60/12* | (2023.01) |
| *H10N 60/20* | (2023.01) |
| *H10N 60/85* | (2023.01) |
| *H01L 23/532* | (2006.01) |

(52) U.S. Cl.

CPC ................. *H01L 2924/1305* (2013.01); *H01L 2924/13091* (2013.01); *H01L 2924/1461* (2013.01); *H01L 2924/181* (2013.01); *H01L 2924/30107* (2013.01); *H01L 2924/3011* (2013.01); *H01L 2924/3025* (2013.01); *Y02E 40/60* (2013.01)

(56) References Cited

PUBLICATIONS

Takamura et al "Matching field effects in c-axis in-plane aligned a axis-oriented YBa2Cu3Oy films with two dimensional artificial pinning centers induced by multilayered nano-structures", 2010 Supercond. Sci. Technol. 23 045023.*

Myers et al "Superconducting and Normal Metal Multilayers of Thallium-Lead Cuprates", IEEE Transactions on Applied Superconducitvity, vol. 5, No. 2, Jun. 1995.*

Hontsu et al "a-axis oriented epitaxial YBa 2Cu3O7-y/PrBa2Cu3-xNbxO7-z multistructures", Appl. Phys. Lett. 63, 1576-1578 (1993).*

Sung et al."Josephson junction characteristics of the all a-axis oriented YBCO/PBCO/YBCO planar sandwich-type juncfions", Physica C 235-240 (1994) 3345-3346.*

Fujimaki et al "Layered Structure Devices with a-Axis-Oriented YBa,Cu, O,-x Films", Electronics and Communications in Japan, Part 2, vol. 76, No. 12, 1993 Translated from Denshi Joho Tsushin Gakkai Ronbunshi, vol. 76-C-II, No. 6, Jun. 1993, pp. 371-377.*

* cited by examiner

Form an Appropriate
Surface On or Within
an ELR Material          3410

Layer Modifying
Material On the          3420
Appropriate Surface

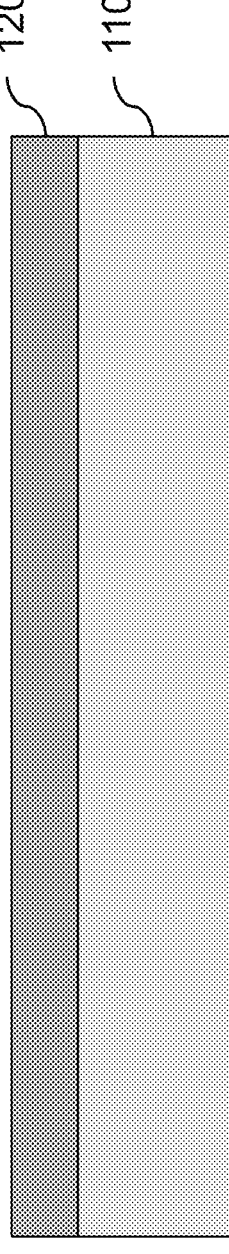
FIG. 37

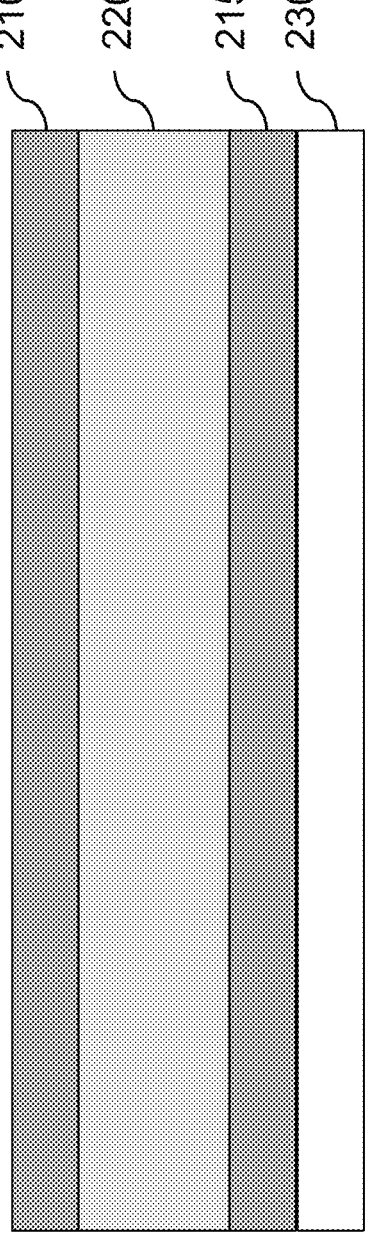
FIG. 38

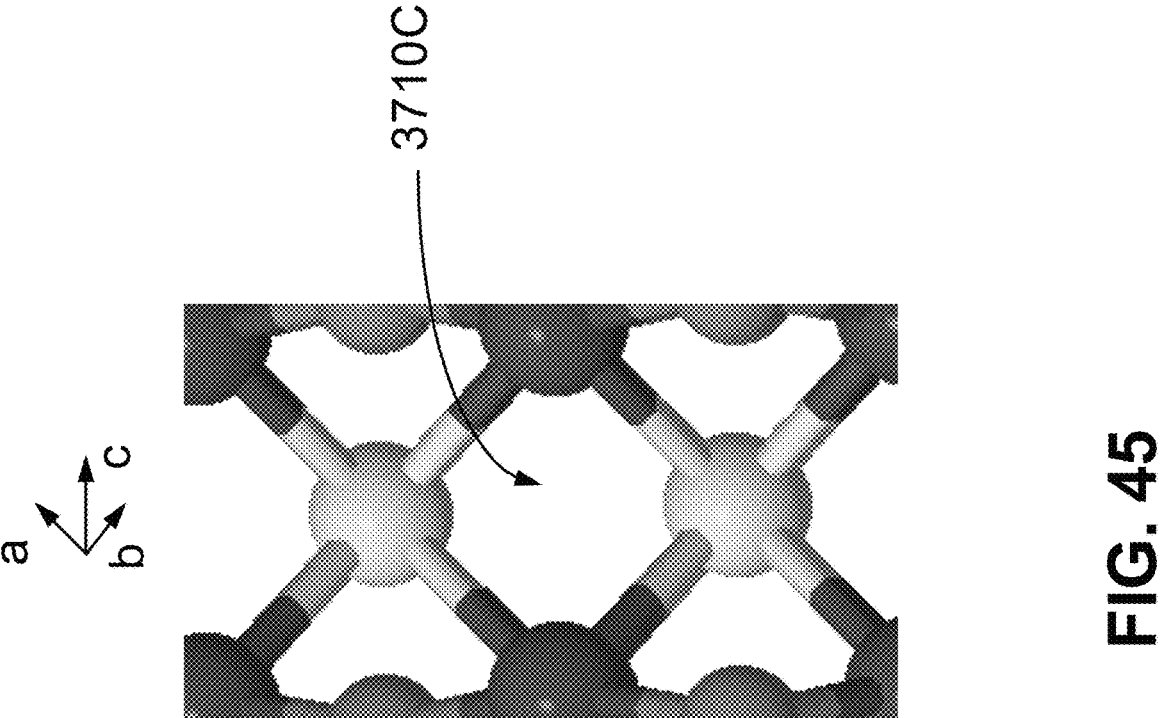
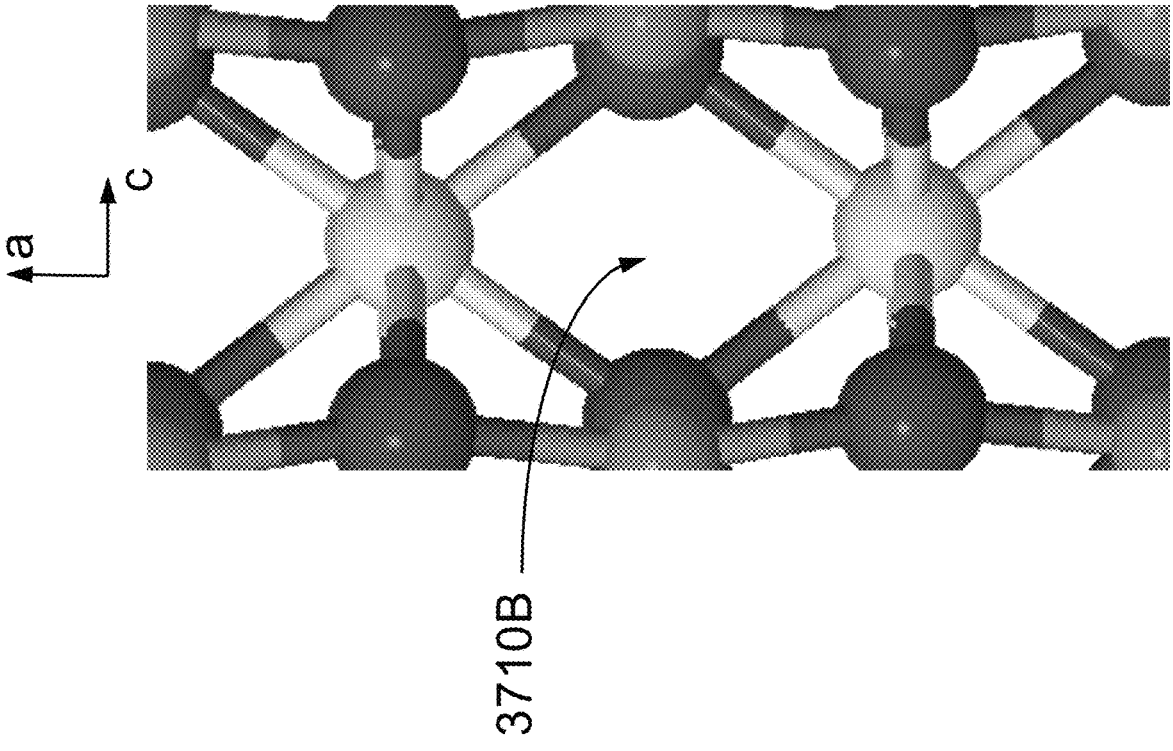
FIG. 45

4100J
4100K
4100L
4100M
4100N

4400

4510

4400

4500D

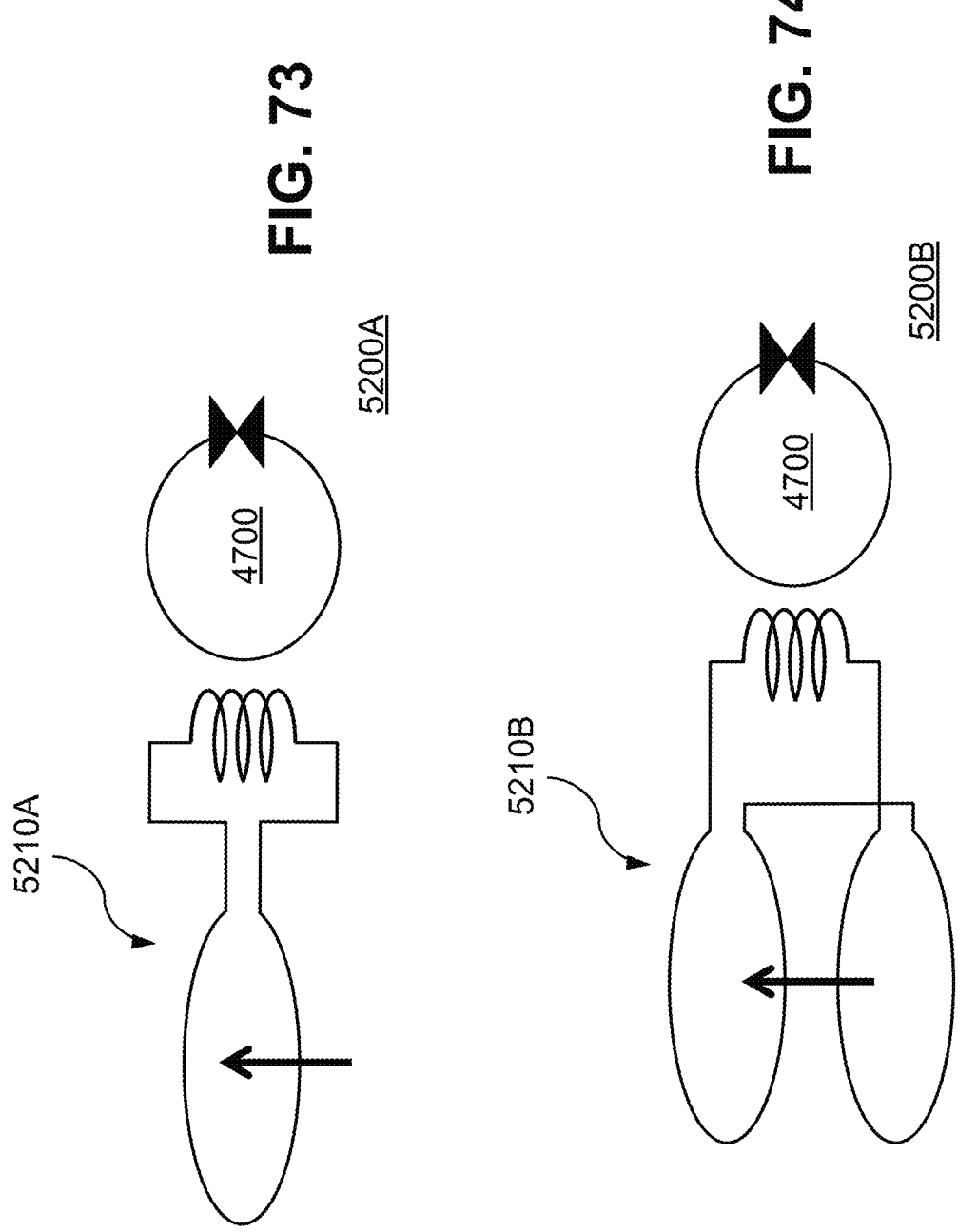

5210C

4700

5200C

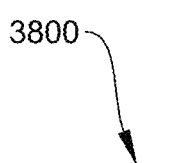
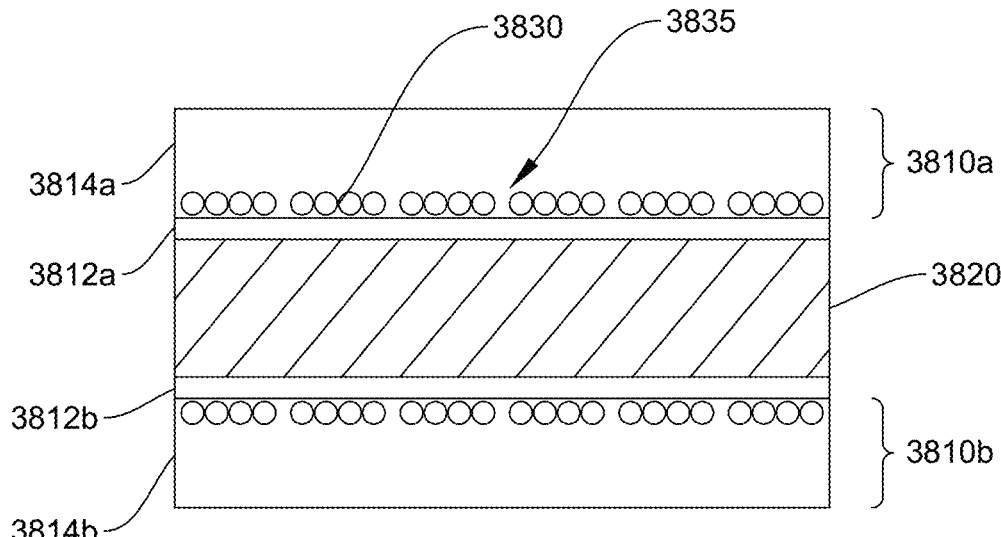
FIG. 89

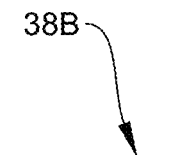
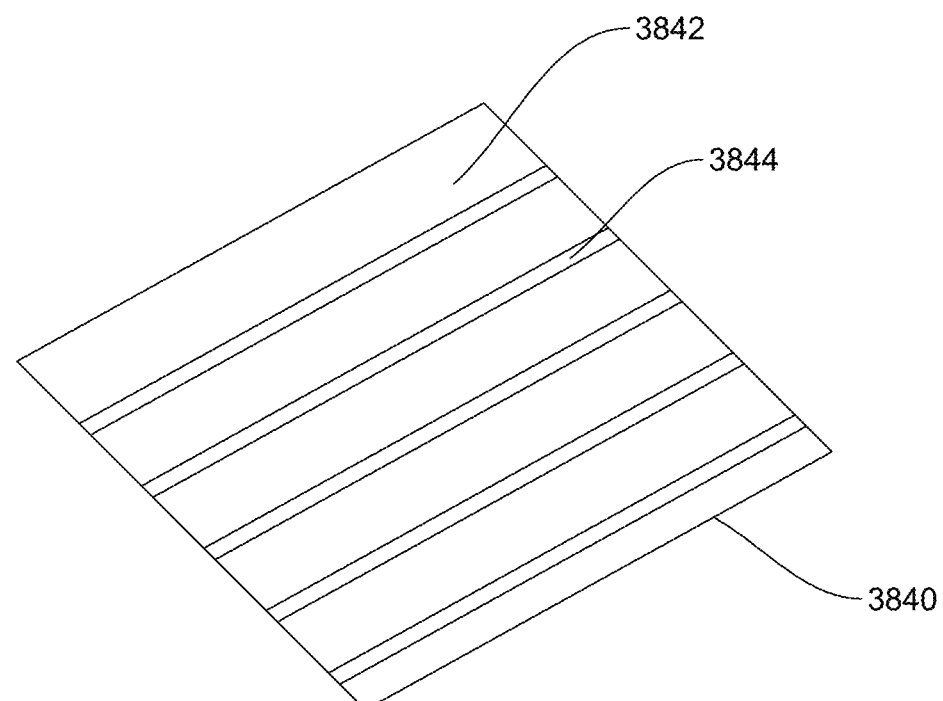
FIG. 90

3900
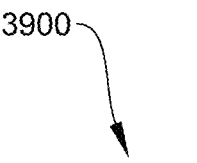
3920
3910
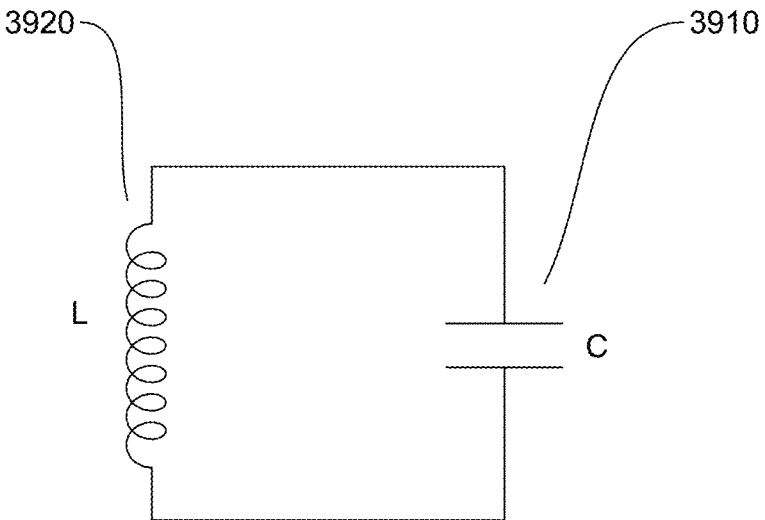
L
C
FIG. 91

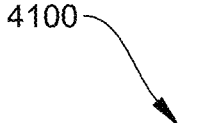
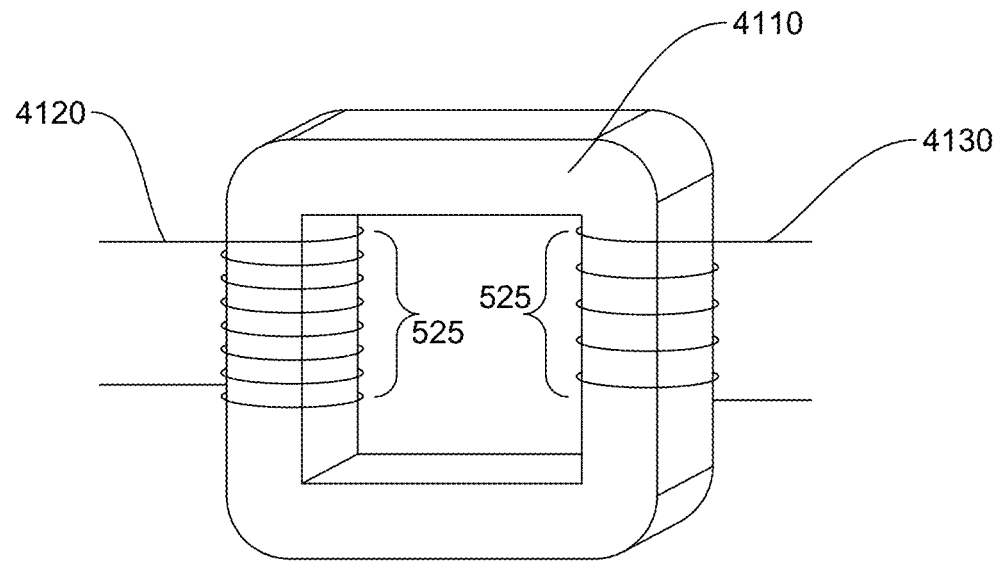
FIG. 102

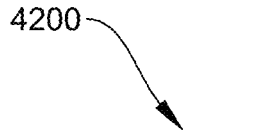
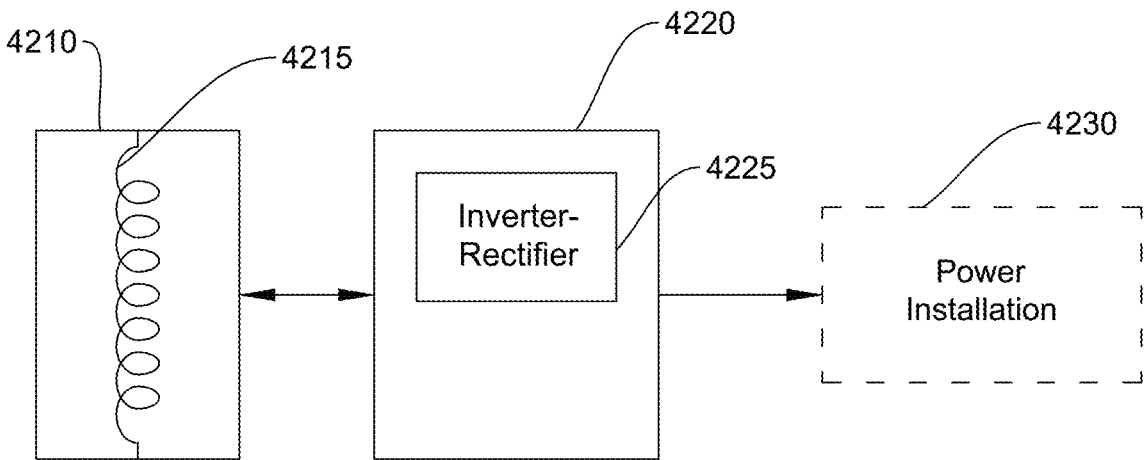
FIG. 103

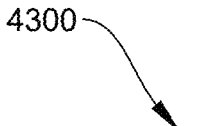
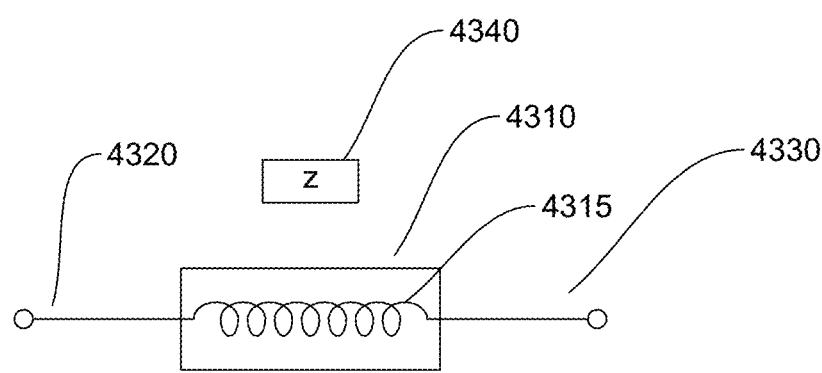
FIG. 104

3800

3810     3820     3830

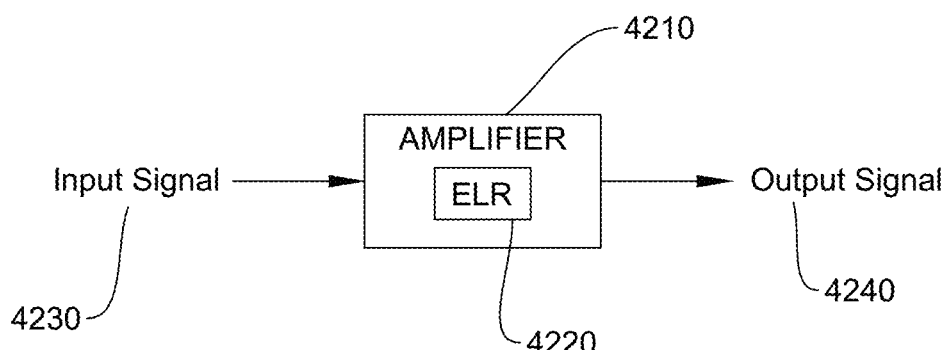
FIG. 110

4400

DEPOSIT A FIRST LAYER
OF ELR MATERIAL ON IC
4110

4000

DEPOSIT A SECOND LAYER OF A
MODIFYING METERIAL ON THE FIRST
LAYER OF THE ELR MATERIAL TO FROM
AN ELR INTERCONNECT
4120

PROCESS THE ELRI TO FROM RF
CIRCUITRY, RF ANTENNAS, AN MMIC
WITH PASSIVE ELRI COMPONENTS,
AND/OR EMBEDDDED RF CIRCUIT
FUNCTIONS
4130

4000

4010

DEPOSIT A FIRST LAYER OF ELR MATERIAL ON AN IC SUBSTRATE

4020

DEPOSIT A SECOND LAYER OF A MODIFYING MATERIAL ON THE FIRST LAYER OF THE ELR MATERIAL TO FORM AN ELR INTERCONNECT

4030

PROCESS THE ELR INTERCONNECT TO FORM A RF ANTENNA, A POWER DISTRIBUTION SYSTEM, AND/OR A SIGNAL BUS IN THE SUBSTRATE

3800

3802

3804

3820

3822

3824

3860

3862

3864

3862

3864

4100

4110

4120

4112

4114

4116

4200

4210

4214

4212

4222

4220

4224

6500

6510

6505 f

6515

Displacement Sensor

V_out

6550

6555

6560 f pressure sensor

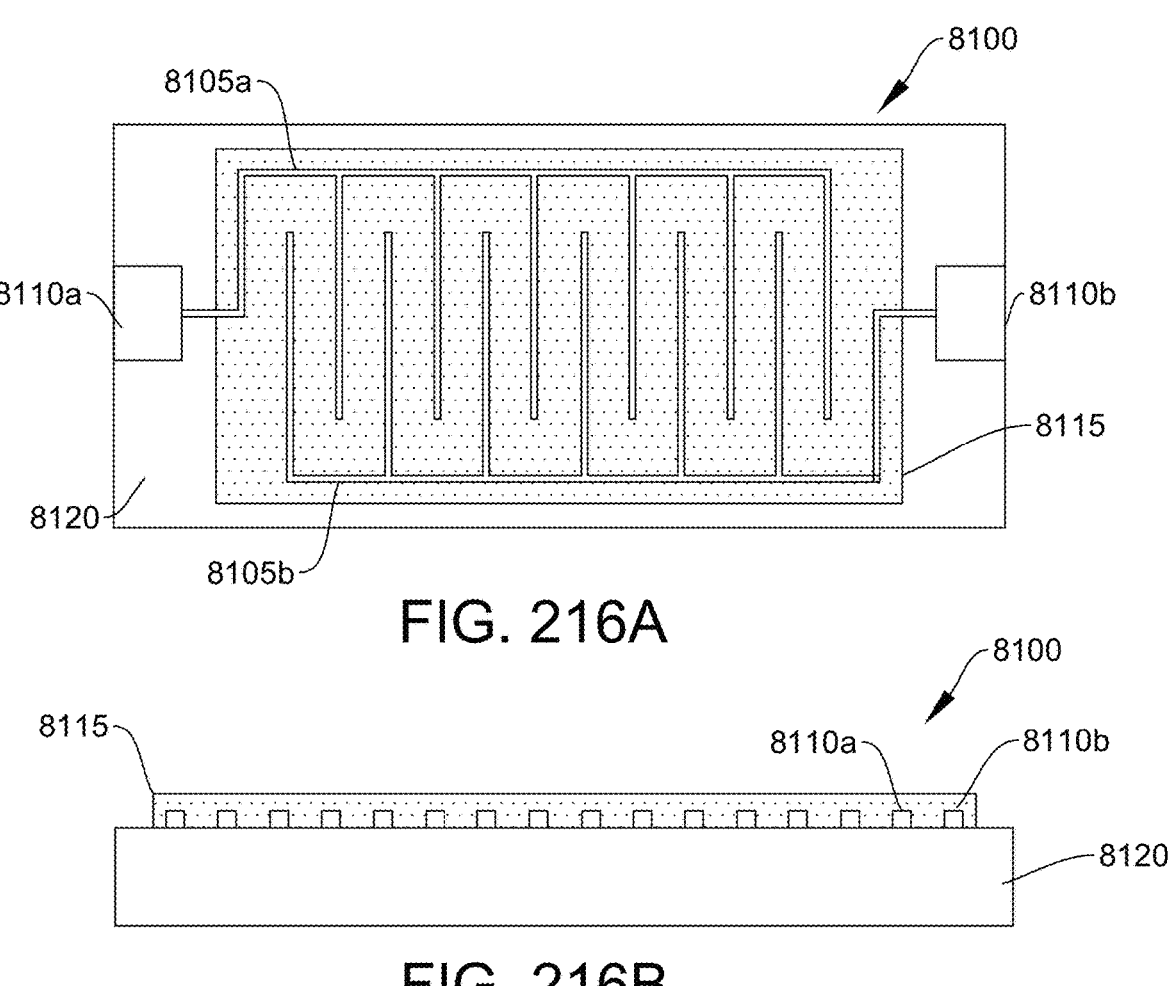
FIG. 216A
FIG. 216B
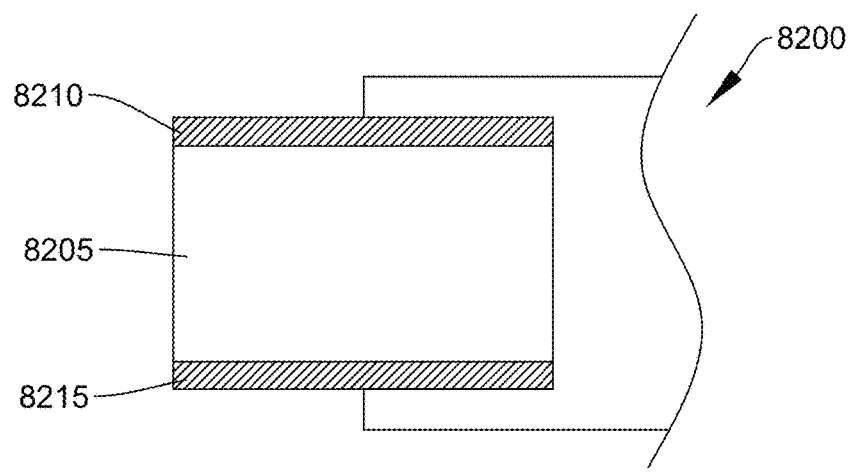
FIG. 217

8600A

8605A

8625A

8600B

8605B

8610

$V_{out}$

3850

3856

3852

3854

3870

3872

3876

3880

3878

3874

4405

4105

4110

4415

4415

4405

4410

4405

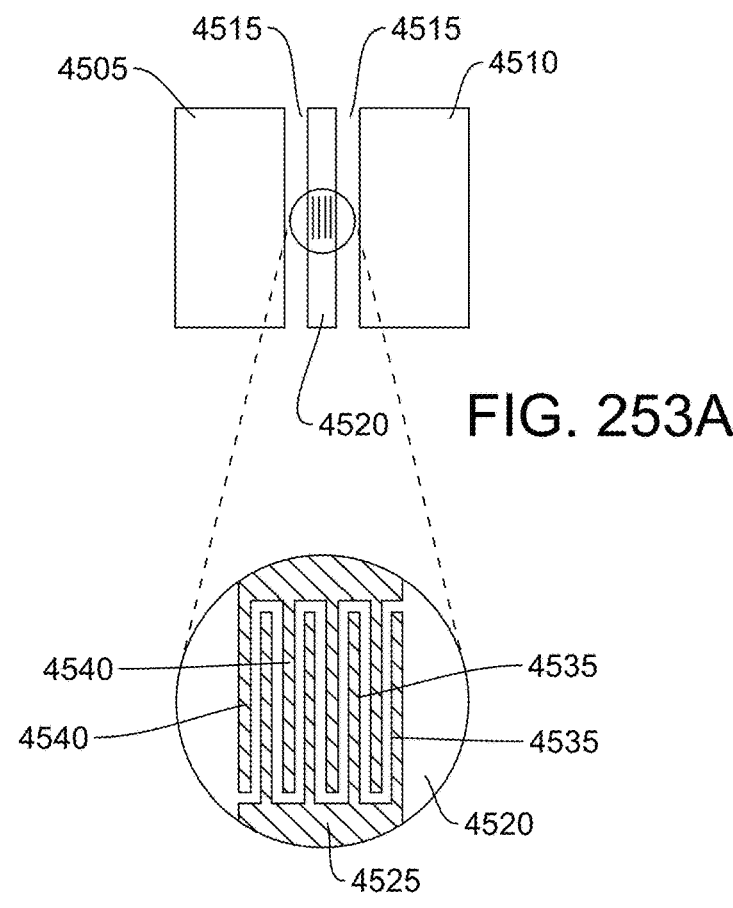
FIG. 253A
FIG. 253B
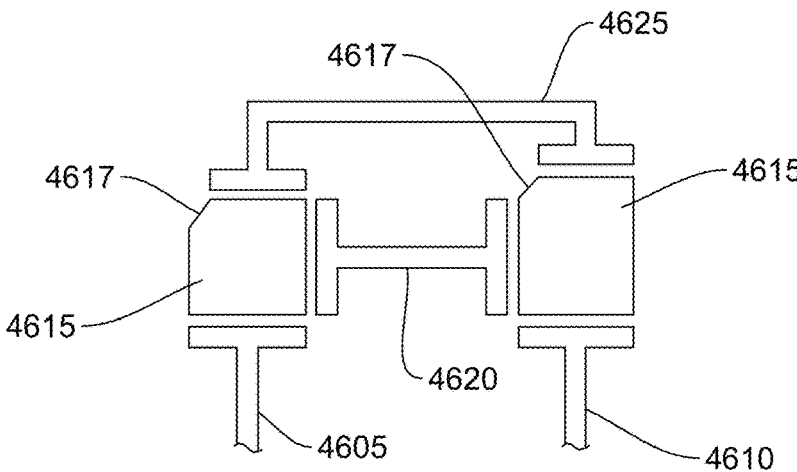
FIG. 254

4104
4102
4106
4108

4204
4202
4206
4208

4304
4302
4306

4902
4904
4906

5002
5004
5006
5008

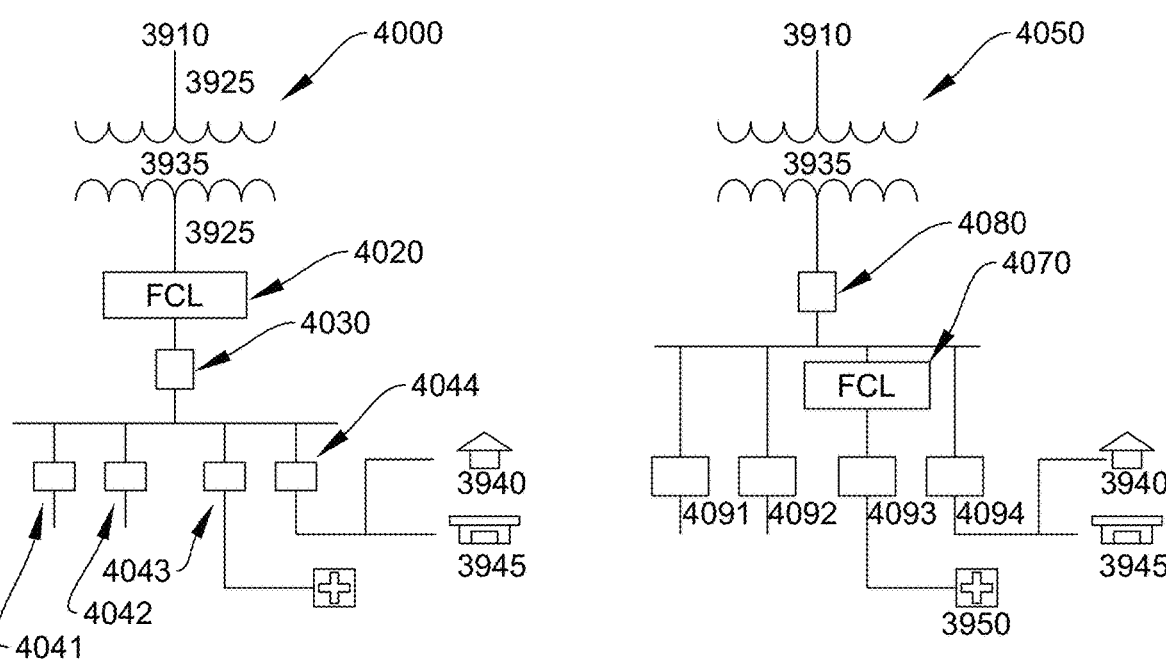
FIG. 292A
FIG. 292B
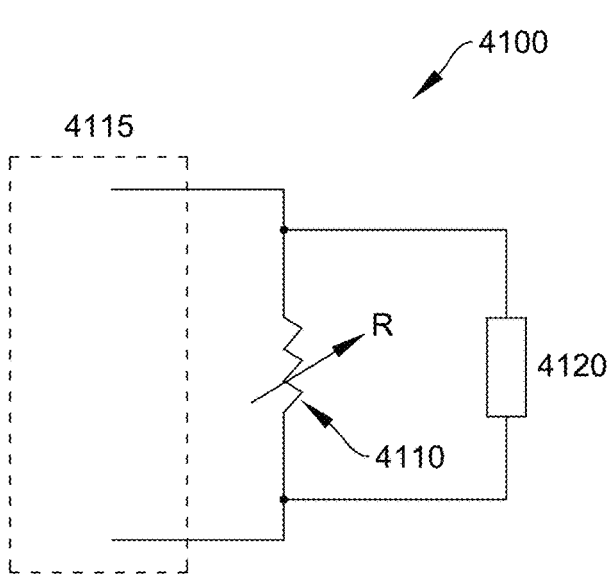
FIG. 293

PRIMARY

SECONDARY

4900

4902

4920

4926

4922

4924

5000

5015

Temp. Control

5020

5010

Logic

Circuitry

4700

4702

4920

5000

ELECTRICAL, MECHANICAL, COMPUTING, AND/OR OTHER DEVICES FORMED OF EXTREMELY LOW RESISTANCE MATERIALS

CROSS-REFERENCE TO RELATED APPLICATIONS

This Application is a divisional application of U.S. patent application Ser. No. 17/705,847, filed on Mar. 28, 2022, entitled "Electrical, Mechanical, Computing, and/or Other Devices Formed of Extremely Low Resistance Materials," now granted as U.S. Pat. No. 12,063,874; which in turn is a continuation application of U.S. patent application Ser. No. 16/407,160, filed on May 8, 2019, entitled "Electrical, Mechanical, Computing, and/or Other Devices Formed of Extremely Low Resistance Materials", now granted as U.S. Pat. No. 11,298,639; which in turn is a divisional application of U.S. patent application Ser. No. 14/008,932, having a 371(c) date of Dec. 9, 2013, entitled "Electrical, Mechanical, Computing, and/or Other Devices Formed of Extremely Low Resistance Materials," now granted as U.S. Pat. No. 10,333,047; which in turn is a 371 National Stage application of International Application No. PCT/US2012/031554, filed Mar. 30, 2012, entitled "Electrical, Mechanical, Computing, and/or Other Devices Formed of Extremely Low Resistance Materials"; which is turn claims priority to: U.S. Provisional Patent Application Nos. 61/469,283, 61/469,567, 61/469,571, 61/469,573, and 61/469,576, entitled "Extremely Low Resistance Nanowires"; U.S. Provisional Patent Application Nos. 61/469,293, 61/469,580, 61/469,584, 61/469,585, 61/469,586, 61/469,589, 61/469,590, and 61/469,592, entitled "Inductors Formed of Extremely Low Resistance Materials"; U.S. Provisional Patent Application Nos. 61/469,303, 61/469,591, 61/469,595, 61/469,600, 61/469,602, 61/469,605, 61/469,609, 61/469,613, 61/469,618, and 61/469,652 entitled "Capacitors Formed of Extremely Low Resistance Materials"; U.S. Provisional Patent Application Nos. 61/469,313, 61/469,620, 61/469,622, 61/469,627, 61/469,630, 61/469,632, 61/469,635, 61/469,640, and 61/469,645 entitled "Transistors Formed of Extremely Low Resistance Materials"; U.S. Provisional Patent Application Nos. 61/469,318, 61/469,599, 61/469,604, 61/469,608, 61/469,612, 61/469,617, 61/469,619, 61/469,624, and 61/469,628, entitled "Rotating Machines Formed of Extremely Low Resistance Materials"; U.S. Provisional Patent Application Nos. 61/469,324, 61/469,637, 61/469,641, and 61/469,644 entitled "Bearings Assemblies Formed of Extremely Low Resistance Materials"; U.S. Provisional Patent Application Nos. 61/469,331 and 61/469,650 entitled "Transformer Formed of Extremely Low Resistance Materials"; U.S. Provisional Patent Application Nos. 61/469,335, 61/469,656, 61/469,658, 61/469,659, and 61/469,662 entitled "Power Transmission Components Formed of Extremely Low Resistance Materials"; U.S. Provisional Patent Application Nos. 61/469,342, 61/469,667, 61/469,679, 61/469,684, and 61/469,769 entitled "Fault Current Limiter Formed of Extremely Low Resistance Materials"; U.S. Provisional Patent Application Nos. 61/469,358, 61/469,603, 61/469,606, 61/469,610, 61/469,615, 61/469,621, 61/469,625, 61/469,633, 61/469,639, 61/469,642, 61/469,653, 61/469,657, 61/469,665, and 61/469,668 entitled "MRI Components and Apparatus Employing Extremely Low Resistance Materials"; U.S. Provisional Patent Application Nos. 61/469,361, 61/469,623, 61/469,634, 61/469,643, and 61/469,648 entitled "Extremely Low Resistance Josephson Junctions"; U.S.

Provisional Patent Application Nos. 61/469,363, 61/469,655, 61/469,660, 61/469,666, 61/469,671, 61/469,675, 61/469,678, 61/469,685, and 61/469,691 entitled "Extremely Low Resistance Quantum Interference Devices"; U.S. Provisional Patent Application Nos. 61/469,367, 61/469,697, 61/469,700, 61/469,703, 61/469,704, and 61/469,710 entitled "Antennas Formed from Extremely Low Resistance Materials"; U.S. Provisional Patent Application Nos. 61/469,371, 61/469,717, 61/469,721, 61/469,727, 61/469,731, 61/469,735, 61/469,740, and 61/469,756 entitled "Filters Formed of Extremely Low Resistance Materials"; U.S. Provisional Patent Application Nos. 61/469,398, 61/469,654, 61/469,673, 61/469,683, 61/469,687, 61/469,692, 61/469,711, 61/469,716, 61/469,723, 61/469,638, 61/469,646, 61/469,728, 61/469,737, 61/469,743, 61/469,745, 61/469,751, 61/469,754, 61/469,761, 61/469,766, 61/469,770, 61/469,772, 61/469,774 and 61/469,775 entitled "Sensors Formed of Extremely Low Resistance Materials"; U.S. Provisional Patent Application Nos. 61/469,401, 61/469,672, 61/469,674, 61/469,676, and 61/469,681 entitled "Actuators Formed of Extremely Low Resistance Materials"; U.S. Provisional Patent Application Nos. 61/469,376, 61/469,686, 61/469,690, 61/469,693, 61/469,694, 61/469,695, 61/469,696, and 61/469,698 entitled "Integrated Circuits Formed of Extremely Low Resistance Materials"; U.S. Provisional Patent Application Nos. 61/469,392, 61/469,707, 61/469,709, and 61/469,712 entitled "Extremely Low Resistance Interconnect (ELRI) For System in Package (SIP) Applications"; U.S. Provisional Patent Application Nos. 61/469,424, 61/469,714, 61/469,718, 61/469,720, 61/469,724, 61/469,726, and 61/469,730 entitled "Extremely Low Resistance Interconnect (ELRI) Connecting MEMS to Circuits on a Semiconductor IC"; U.S. Provisional Patent Application Nos. 61/469,387, 61/469,732, 61/469,736, and 61/469,739 entitled "Extremely Low Resistance Interconnect (ELRI) for RF Circuits on a Semiconductor Integrated Circuit"; U.S. Provisional Patent Application Nos. 61/469,554, 61/469,742, 61/469,744, 61/469,747, 61/469,749, and 61/469,750 entitled "Integrated Circuit Devices Formed of Extremely Low Resistance Materials"; and U.S. Provisional Patent Application Nos. 61/469,560, 61/469,753, 61/469,755, 61/469,757, 61/469,758, 61/469,759, 61/469,760, 61/469,762, and 61/469,763 entitled "Energy Storage Devices Formed of Extremely Low Resistance Materials." Each of the aforementioned provisional applications was filed on Mar. 30, 2011. International Application No. PCT/US2012/031554 is a continuation-in-part application of U.S. patent application Ser. No. 13/076,188, filed Mar. 30, 2011, entitled "Extremely Low Resistance Compositions and Methods for Creating Same," now U.S. Pat. No. 8,404,620. Each of the aforementioned applications is incorporated herein by reference in its entirety.

International Application No. PCT/US2012/031554 also claims priority to U.S. Provisional Patent Application No. 61/583,855 entitled "Layered Compositions, Such as Compositions that Exhibit Extremely Low Resistance," filed on Jan. 6, 2012, which is incorporated herein by reference in its entirety.

BACKGROUND

Electrical, mechanical, computing, and/or other devices that operate using conventional superconducting elements suffer from various drawbacks, including the reliance on expensive cooling systems to maintain the superconducting elements in their superconducting states. For example, conventional superconducting capacitors utilize high temperature superconducting (HTS) materials for various components, relying on their ability to transfer current with minimal or zero resistance to the current. However, HTS materials require very low operating temperatures (e.g., temperatures under 120 K) typically realized by cooling the components to such temperatures using expensive systems, such as liquid nitrogen-based cooling systems. Such cooling systems increase implementation costs and discourage widespread commercial and consumer use and/or application of capacitors that employ these materials. These and other problems exist with respect to current HTS-based devices.

BRIEF DESCRIPTION OF THE DRAWINGS

FIG. 37 is a block diagram of a composition that includes an extremely low material component and a modifying component according to various implementations of the invention.

FIG. 38 is a block diagram of a composition that includes an extremely low resistance material and two or more modifying components according to various implementations of the invention.

FIGS. 44 to 53 illustrate the forming of nanowires using ELR materials.

FIGS. 64 to 76 illustrate the forming of SQUIDs using ELR materials.

FIGS. 85 to 95 illustrate the forming of capacitors using ELR materials.

FIGS. 96 to 104 illustrate the forming of inductors using ELR materials.

FIGS. 105 to 112 illustrate the forming of transistors using ELR materials.

FIGS. 240 to 258 illustrate the forming of filters using ELR materials.

FIGS. 289 to 304 illustrate the forming of fault current limiters using ELR materials.

FIGS. 321A to 325 illustrate the forming of transmission lines using ELR materials.

DETAILED DESCRIPTION

Figure 1:
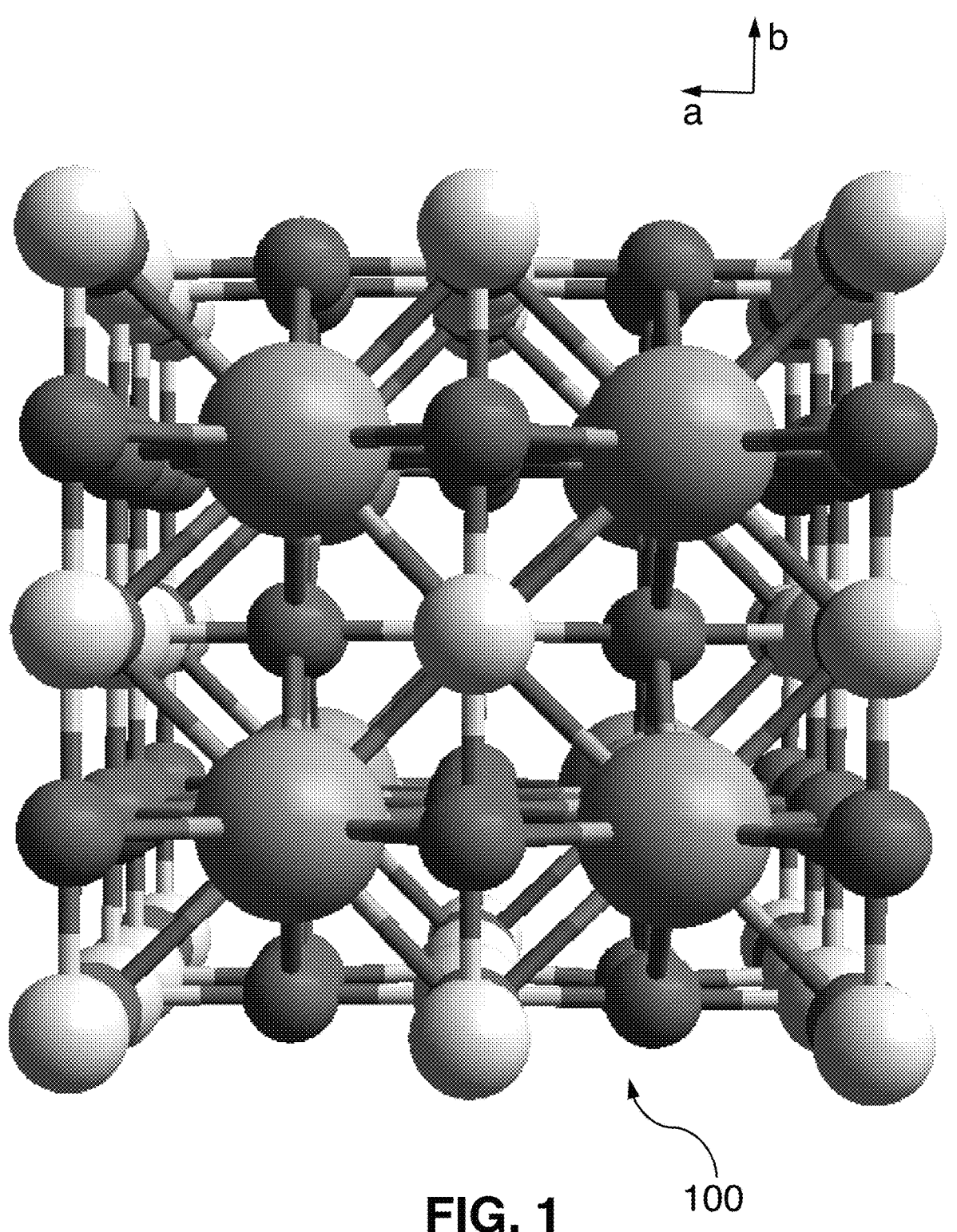
FIG. 1 illustrates a crystalline structure of an exemplary ELR material as viewed from a first perspective.

Electrical, mechanical, computing, and/or other devices, components, systems, and/or apparatuses that include one or more components formed of modified, apertured, layered, and/or other new extremely low resistance (ELR) materials, are described. The ELR materials provide extremely low resistances to current at temperatures higher than temperatures normally associated with current high temperature superconductors (HTS), enhancing the operational characteristics of the devices at these higher temperatures, among other benefits.

In some examples, the ELR materials are manufactured based on the type of materials, the application of the ELR materials, the size of the component employing the ELR materials, the operational requirements of a device or machine employing the ELR materials, and so on. As such, during the design and manufacturing of a device, the material used as a base layer of an ELR material and/or the material used as one or more modifying layers of the ELR material may be selected based on various considerations and desired operating and/or manufacturing characteristics.

Various devices, applications, and/or systems may employ the ELR components described herein. These devices, applications, and/or systems will be discussed in greater detail in Chapters 1-18 of this application.

The technology will now be described with respect to various examples and/or embodiments. The following description provides specific details for a thorough understanding of, and enabling description for, these examples of the system. However, one skilled in the art will understand that the system may be practiced without these details. In other instances, well-known structures and functions have not been shown or described in detail to avoid unnecessarily obscuring the description of the examples of the system.

The terminology used in the description presented below is intended to be interpreted in its broadest reasonable manner, even though it is being used in conjunction with a detailed description of certain specific embodiments of the system. Certain terms may even be emphasized below; however, any terminology intended to be interpreted in any restricted manner will be overtly and specifically defined as such in this Detailed Description section.

Various features, advantages, and implementations of the invention may be set forth or be apparent from consideration of the following detailed description, the drawings, and the claims. It is to be understood that the detailed description and the drawings are exemplary and intended to provide further explanation without limiting the scope of the invention except as set forth in the claims.

For purposes of this description, extremely low resistance ("ELR") materials may include: superconducting materials, including, but not limited to, HTS materials; perfectly conducting materials (e.g., perfect conductors); and other conductive materials with extremely low resistance. As discussed herein, these ELR materials may be described as modified ELR materials, apertured ELR materials and/or new ELR materials, any of which may be used to form ELR films and/or other ELR components (e.g., nanowires, wires, tapes, etc.). These ELR materials exhibit extremely low resistance to electrons and/or extremely high conductance of electrons at high temperatures, such as temperatures above 150 K, at ambient or standard pressure. This section describes, among other things, the structure and operational characteristics of these ELR materials.

Generally speaking, various implementations of the invention relate to incorporating an ELR material (e.g., a modified ELR material, a new ELR material, etc.) with improved operating characteristics, or an ELR material exhibiting some or all of the improved operating characteristics described herein, into various products, systems and/or devices as described herein. Various implementations of the invention may include such ELR materials in the form of ELR films, ELR tapes, ELR nanowires, ELR wires, and other configurations of such ELR materials.

For purposes of this description, operating characteristics with regard to ELR materials and/or various implementations of the invention may include, but are not limited to, a resistance of the ELR material in its ELR state (for example, with regard to superconductors, a superconducting state), a transition temperature of the ELR material to its ELR state, a charge propagating capacity of the ELR material in its ELR state, one or more magnetic properties of the ELR material, one or more mechanical properties of the ELR material, and/or other operating characteristics of the ELR material. Further, for purposes of this description, improved operating characteristics may include, but are not limited to, operating in an ELR state (including, for example, a super-conducting state) at higher temperatures, operating with increased charge propagating capacity at the same (or higher) temperatures, operating with improved magnetic properties, operating with improved mechanical properties, and/or other improved operating characteristics.

For purposes of this description, "extremely low resistance" is resistance similar in magnitude to the flux flow resistance of Type II superconducting materials in their superconducting state, and may generally be expressed in terms of resistivity in a range of zero Ohm-cm to one fiftieth ($\frac{1}{50}$) of the resistivity of substantially pure copper at 293 K. For example, as used herein, substantially pure copper is 99.999% copper. In various implementations of the invention, portions of ELR materials have a resistivity in a range of zero Ohm-cm to $3.36 \times 10^{-8}$ Ohm-cm.

As generally understood, the transition temperature is a temperature below which the ELR material "operates" or exhibits (or begins exhibiting) extremely low resistance, and/or other phenomenon associated with ELR materials. When operating with extremely low resistance, the ELR material is referred to as being in an ELR state. At temperatures above the transition temperature, the ELR material ceases to exhibit extremely low resistance and the ELR material is referred to as being in its non-ELR or normal state. In other words, the transition temperature corresponds to a temperature at which the ELR material changes between its non-ELR state and its ELR state. As would be appreciated, for some ELR materials, the transition temperature may be a range of temperatures over which the ELR material changes between its non-ELR state and its ELR state. As would also be appreciated, the ELR material may have hysteresis in its transition temperature with one transition temperature as the ELR material warms and another transition temperature as the ELR material cools.

Figure 13:
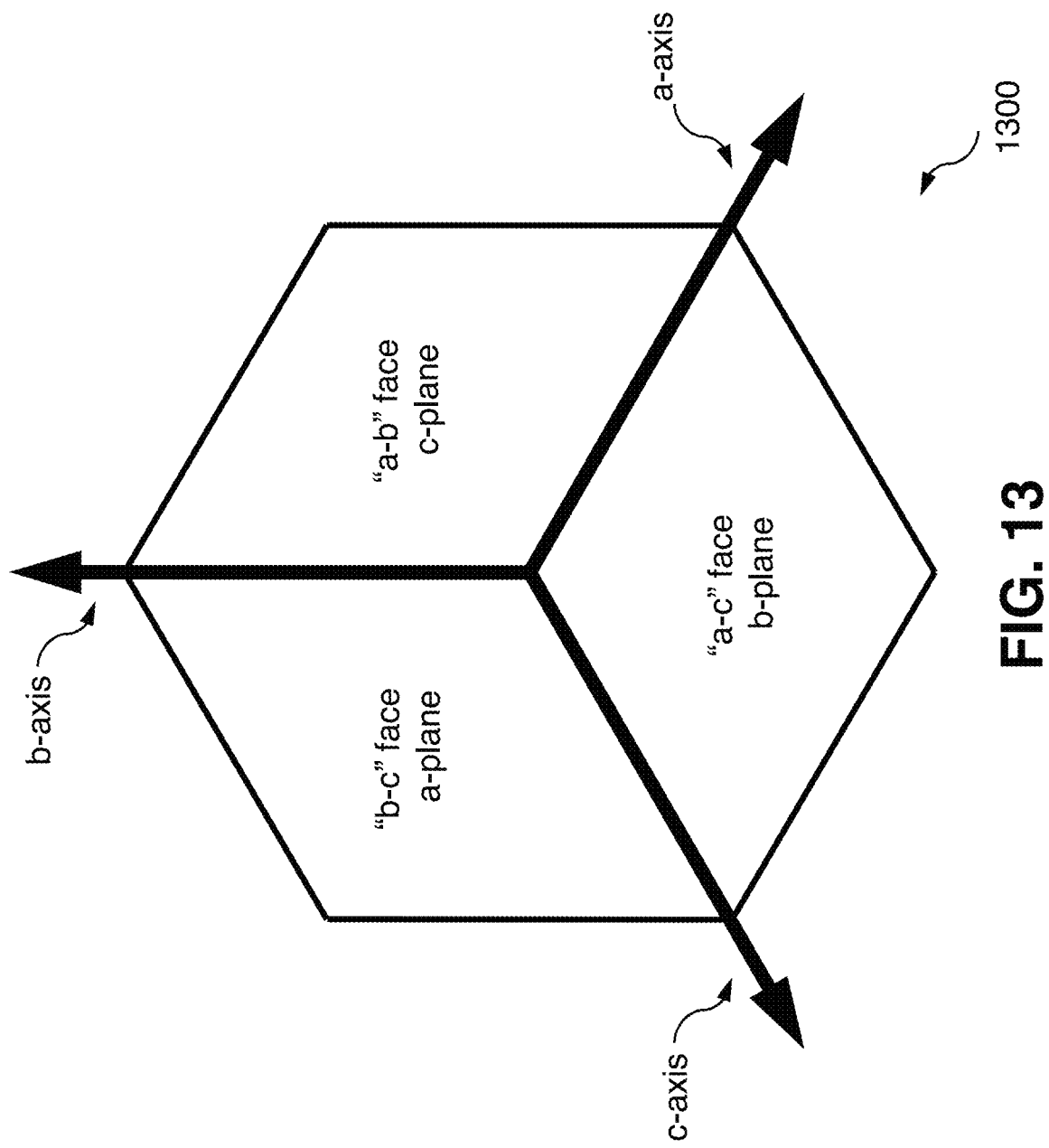
FIG. 13 illustrates a reference frame useful for describing various implementations of the invention.

FIG. 13 illustrates a reference frame 1300 which may be used to describe various implementations of the invention. Reference frame 1300 includes a set of axes referred to as an a-axis, a b-axis, and a c-axis. For purposes of this description: reference to the a-axis includes the a-axis and any other axis parallel thereto; reference to the b-axis includes the b-axis and any other axis parallel thereto; and reference to the c-axis includes the c-axis and any other axis parallel thereto. Various pairs of the axes form a set of planes in reference frame 1300 referred to as an a-plane, a b-plane, and a c-plane, where: the a-plane is formed by the b-axis and the c-axis and is perpendicular to the a-axis; the b-plane is formed by the a-axis and the c-axis and is perpendicular to the b-axis; and the c-plane is formed by the a-axis and the b-axis and is perpendicular to the c-axis. For purposes of this description: reference to the a-plane includes the a-plane and any plane parallel thereto; reference to the b-plane includes the b-plane and any plane parallel thereto; and reference to the c-plane includes the c-plane and any plane parallel thereto. Further, with regard to various "faces" or "surfaces" of the crystalline structures described herein, a face parallel to the a-plane may sometimes be referred to as a "b-c" face; a face parallel to the b-plane may sometimes be referred to as an "a-c" face; and a face parallel to the c-plane may sometimes be referred to as a "a-b" face.

8

Figure 2:
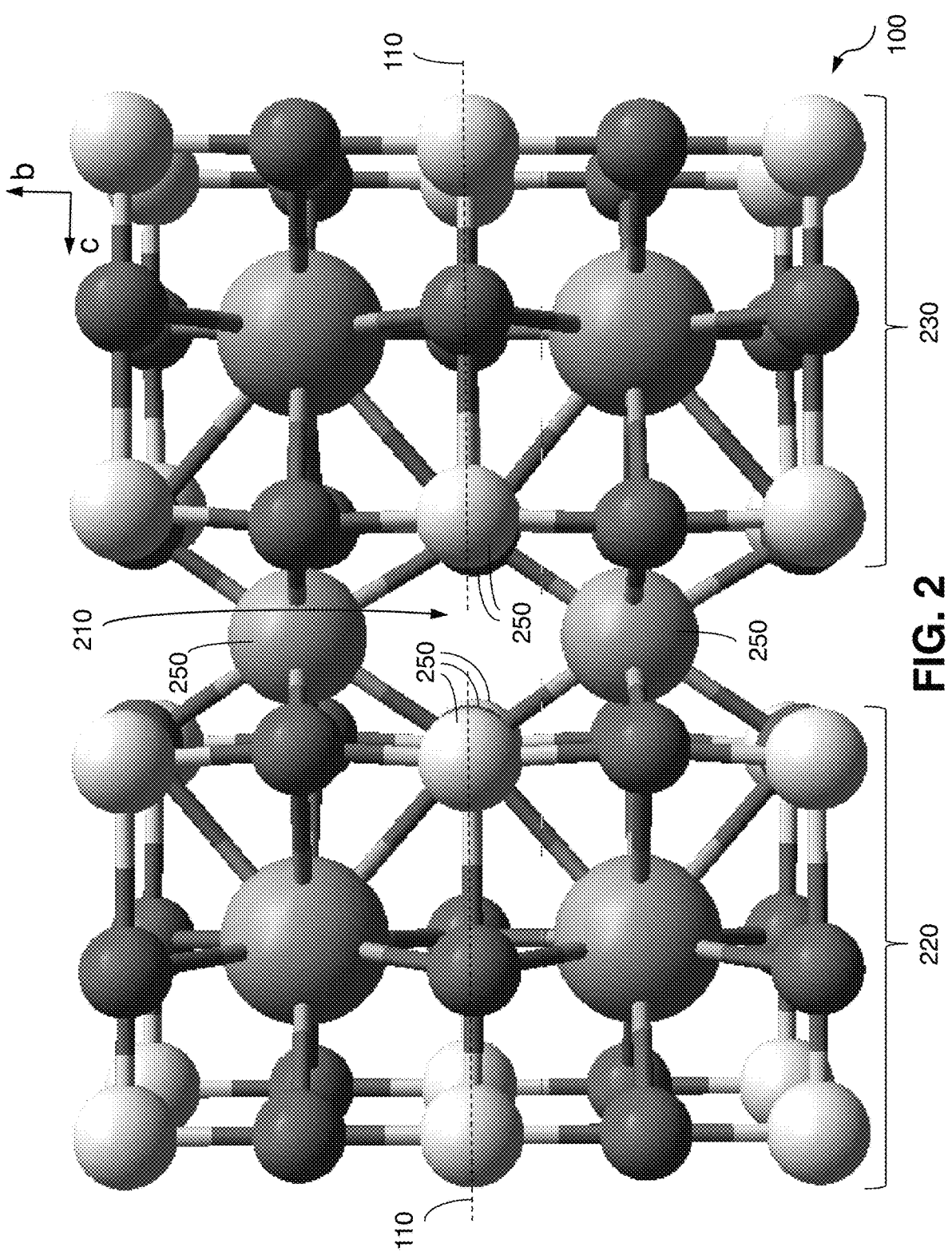
FIG. 2 illustrates a crystalline structure of an exemplary ELR material as viewed from a second perspective.

FIG. 1 illustrates a crystalline structure 100 of an exemplary ELR material as viewed from a first perspective, namely, a perspective perpendicular to an "a-b" face of crystalline structure 100 and parallel to the c-axis thereof. FIG. 2 illustrates crystalline structure 100 as viewed from a second perspective, namely, a perspective perpendicular to a "b-c" face of crystalline structure 100 and parallel to the a-axis thereof. For purposes of this description, the exemplary ELR material illustrated in FIG. 1 and FIG. 2 is generally representative of various ELR materials. In some implementations of the invention, the exemplary ELR material may be a representative of a family of superconducting materials referred to as mixed-valence copper-oxide perovskites. The mixed-valence copper-oxide perovskite materials include, but are not limited to, LaBaCuOx, LSCO (e.g., La2-xSrxCuO4, etc.), YBCO (e.g., YBa2Cu3O7, etc.), BSCCO (e.g., Bi2Sr2Ca2Cu3O10, etc.), TBCCO (e.g., Tl2Ba2Ca2Cu3O10 or TlmBa2Can-1CunO2n+m+2+δ), HgBa2Ca2Cu3Ox, and other mixed-valence copper-oxide perovskite materials. The other mixed-valence copper-oxide perovskite materials may include, but are not limited to, various substitutions of the cations as would be appreciated. As would also be appreciated, the aforementioned named mixed-valence copper-oxide perovskite materials may refer to generic classes of materials in which many different formulations exist. In some implementations of the invention, the exemplary ELR materials may include an HTS material outside of the family of mixed-valence copper-oxide perovskite materials ("non-perovskite materials"). Such non-perovskite materials may include, but are not limited to, iron pnictides, magnesium diboride (MgB2), and other non-perovskites. In some implementations of the invention, the exemplary ELR materials may be other super-conducting materials.

Figure 4:
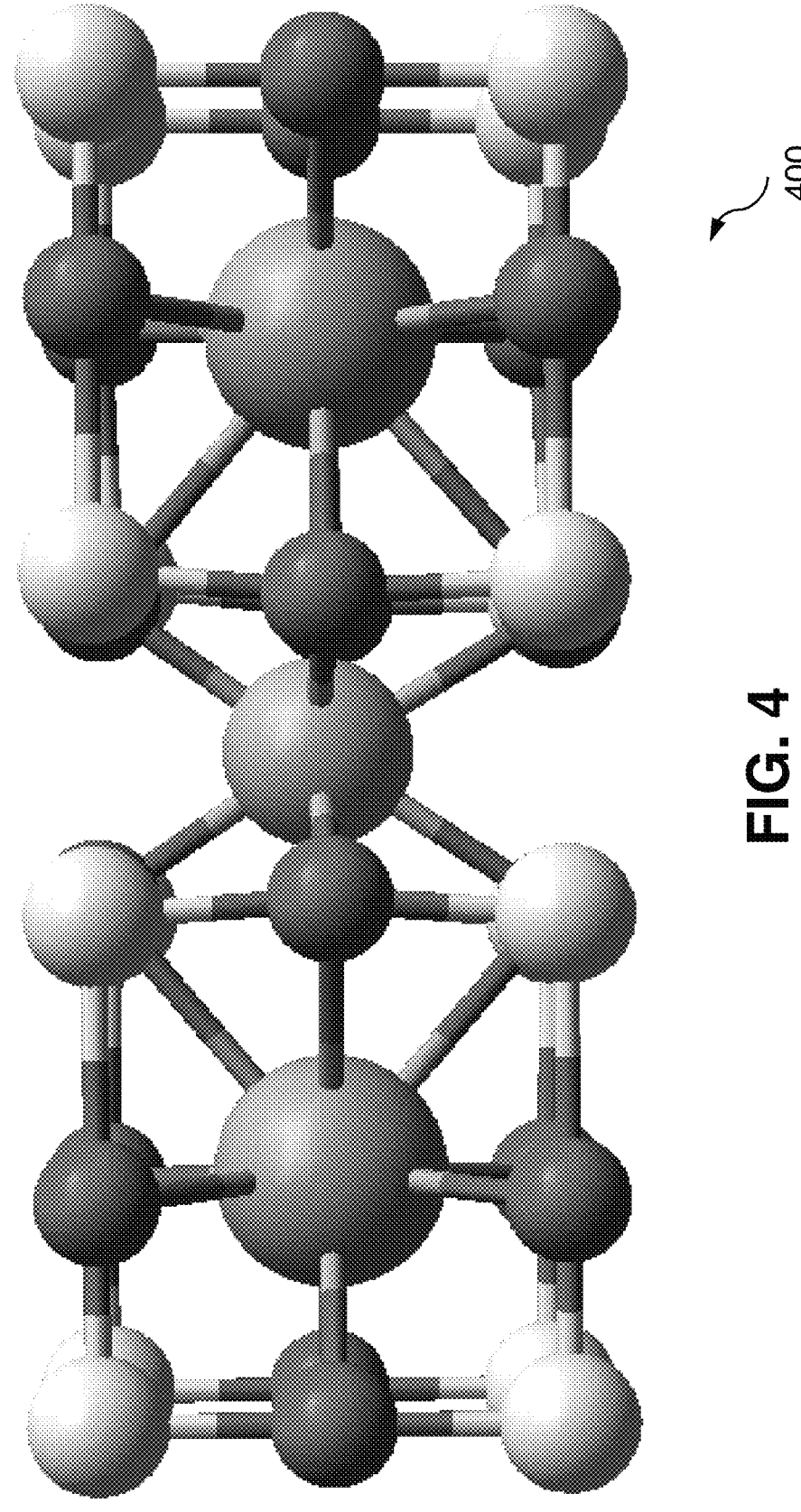
FIG. 4 illustrates a single unit cell of an exemplary ELR material.

Many ELR materials have a structure similar to (though not necessarily identical to) that of crystalline structure 100 with different atoms, combinations of atoms, and/or lattice arrangements as would be appreciated. As illustrated in FIG. 2, crystalline structure 100 is depicted with two complete unit cells of the exemplary ELR material, with one unit cell above reference line 110 and one unit cell below reference line 110. FIG. 4 illustrates a single unit cell 400 of the exemplary ELR material.

Generally speaking and as would be appreciated, a unit cell 400 of the exemplary ELR material includes six "faces": two "a-b" faces that are parallel to the c-plane; two "a-c" faces that are parallel to the b-plane; and two "b-c" faces that are parallel to the a-plane (see, e.g., FIG. 13). As would also be appreciated, a "surface" of ELR material in the macro sense may be comprised of multiple unit cells 400 (e.g., hundreds, thousands or more). Reference in this description to a "surface" or "face" of the ELR material being parallel to a particular plane (e.g., the a-plane, the b-plane or the c-plane) indicates that the surface is formed predominately (i.e., a vast majority) of faces of unit cell 400 that are substantially parallel to the particular plane. Furthermore, reference in this description to a "surface" or "face" of the ELR material being parallel to planes other than the a-plane, the b-plane, or the c-plane (e.g., an ab-plane as described below, etc.) indicates that the surface is formed from some mixture of faces of unit cell 400 that, in the aggregate macro sense, form a surface substantially parallel to such other planes.

Studies indicate that some ELR materials demonstrate an anisotropic (i.e., directional) dependence of the resistance phenomenon. In other words, resistance at a given temperature and current density depends upon a direction in relation to crystalline structure 100. For example, in their ELR state, some ELR materials can carry significantly more current, at extremely low resistance, in the direction of the a-axis and/or in the direction of the b-axis than such materials do in the direction of the c-axis. As would be appreciated, various ELR materials exhibit anisotropy in various performance phenomenon, including the resistance phenomenon, in directions other than, in addition to, or as combinations of those described above. For purposes of this description, reference to a material that tends to exhibit the resistance phenomenon (and similar language) in a first direction indicates that the material supports such phenomenon in the first direction; and reference to a material that tends not to exhibit the resistance phenomenon (and similar language) in a second direction indicates that the material does not support such phenomenon in the second direction or does so in a reduced manner from other directions.

With reference to FIG. 2, conventional understanding of known ELR materials has thus far failed to appreciate an aperture 210 formed within crystalline structure 100 by a plurality of aperture atoms 250 as being responsible for the resistance phenomenon. (See e.g., FIG. 4, where an aperture is not readily apparent in a depiction of single unit cell 400.) In some sense, aperture atoms 250 may be viewed as forming a discrete atomic "boundary" or "perimeter" around aperture 210. In some implementations of the invention and as illustrated in FIG. 2, aperture 210 appears between a first portion 220 and a second portion 230 of crystalline structure 100 although in some implementations of the invention, aperture 210 may appear in other portions of various other crystalline structures. Aperture 210 is illustrated in FIG. 2 based on depictions of atoms as simple "spheres;" it would be appreciated that such apertures are related to and shaped by, among other things, electrons and their associated electron densities (not otherwise illustrated) of various atoms in crystalline structure 100, including aperture atoms 250.

According to various aspects of the invention, aperture 210 facilitates propagation of electrical charge through crystalline structure 100 and when aperture 210 facilitates propagation of electrical charge through crystalline structure 100, ELR material operates in its ELR state. For purposes of this description, "propagates," "propagating," and/or "facilitating propagation" (along with their respective forms) generally refer to "conducts," "conducting" and/or "facilitating conduction" and their respective forms; "transports," "transporting" and/or "facilitating transport" and their respective forms; "guides," "guiding" and/or "facilitating guidance" and their respective forms; and/or "carry," "carrying" and/or "facilitating carrying" and their respective forms. For purposes of this description, electrical charge may include positive charge or negative charge, and/or pairs or other groupings of such charges; further, such charge may propagate through crystalline structure 100 in the form of one or more particles or in the form of one or more waves or wave packets.

In some implementations of the invention, propagation of electrical charge through crystalline structure 100 may be in a manner analogous to that of a waveguide. In some implementations of the invention, aperture 210 may be a waveguide with regard to propagating electrical charge through crystalline structure 100. Waveguides and their operation are generally well understood. In particular, walls surrounding an interior of the waveguide may correspond to the boundary or perimeter of aperture atoms 250 around aperture 210. One aspect relevant to an operation of a waveguide is its cross-section. At the atomic level, aperture 210 and/or its cross-section may change substantially with changes in temperature of the ELR material. For example, in some implementations of the invention, changes in temperature of the ELR material may cause changes in aperture 210, which in turn may cause the ELR material to transition between its ELR state to its non-ELR state. For example, as temperature of the ELR material increases, aperture 210 may restrict or impede propagation of electrical charge through crystalline structure 100 and the corresponding ELR material may transition from its ELR state to its non-ELR state. Likewise, for example, as temperature of the ELR material decreases, aperture 210 may facilitate (as opposed to restrict or impede) propagation of electrical charge through crystalline structure 100 and the corresponding ELR material may transition from its non-ELR state to its ELR state.

Apertures, such as aperture 210 in FIG. 2, exist in various ELR materials, such as, but not limited to, various ELR materials illustrated in FIG. 3 and FIGS. 5-9, etc., and described below. As illustrated, such apertures are intrinsic to the crystalline structure of some or all the ELR materials. Various forms, shapes, sizes, and numbers of apertures 210 exist in ELR materials depending on the precise configuration of the crystalline structure, composition of atoms, and arrangement of atoms within the crystalline structure of the ELR material as would be appreciated in light of this description.

Figure 3:
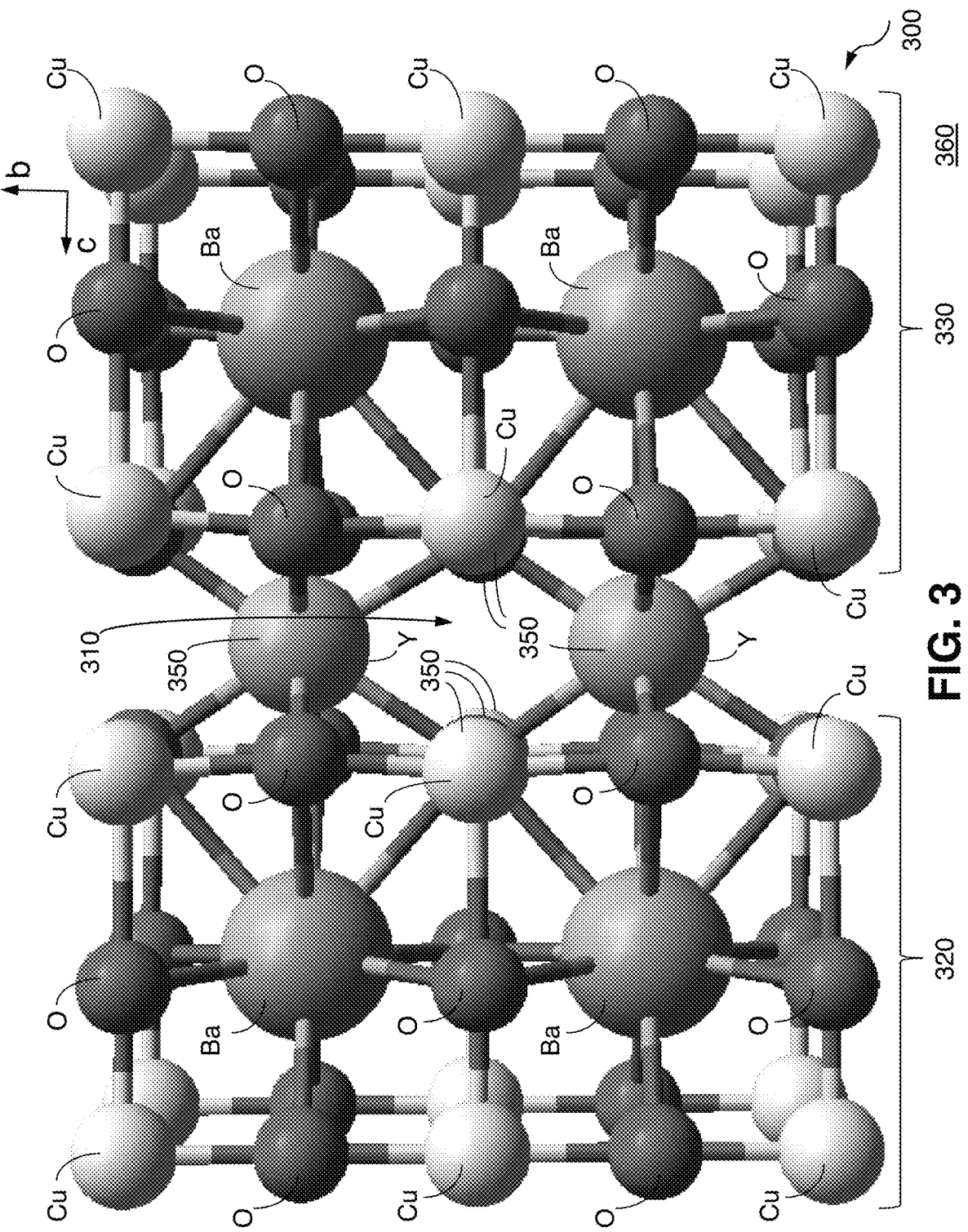
FIG. 3 illustrates a crystalline structure of an exemplary ELR material as viewed from a second perspective.
Figure 11:
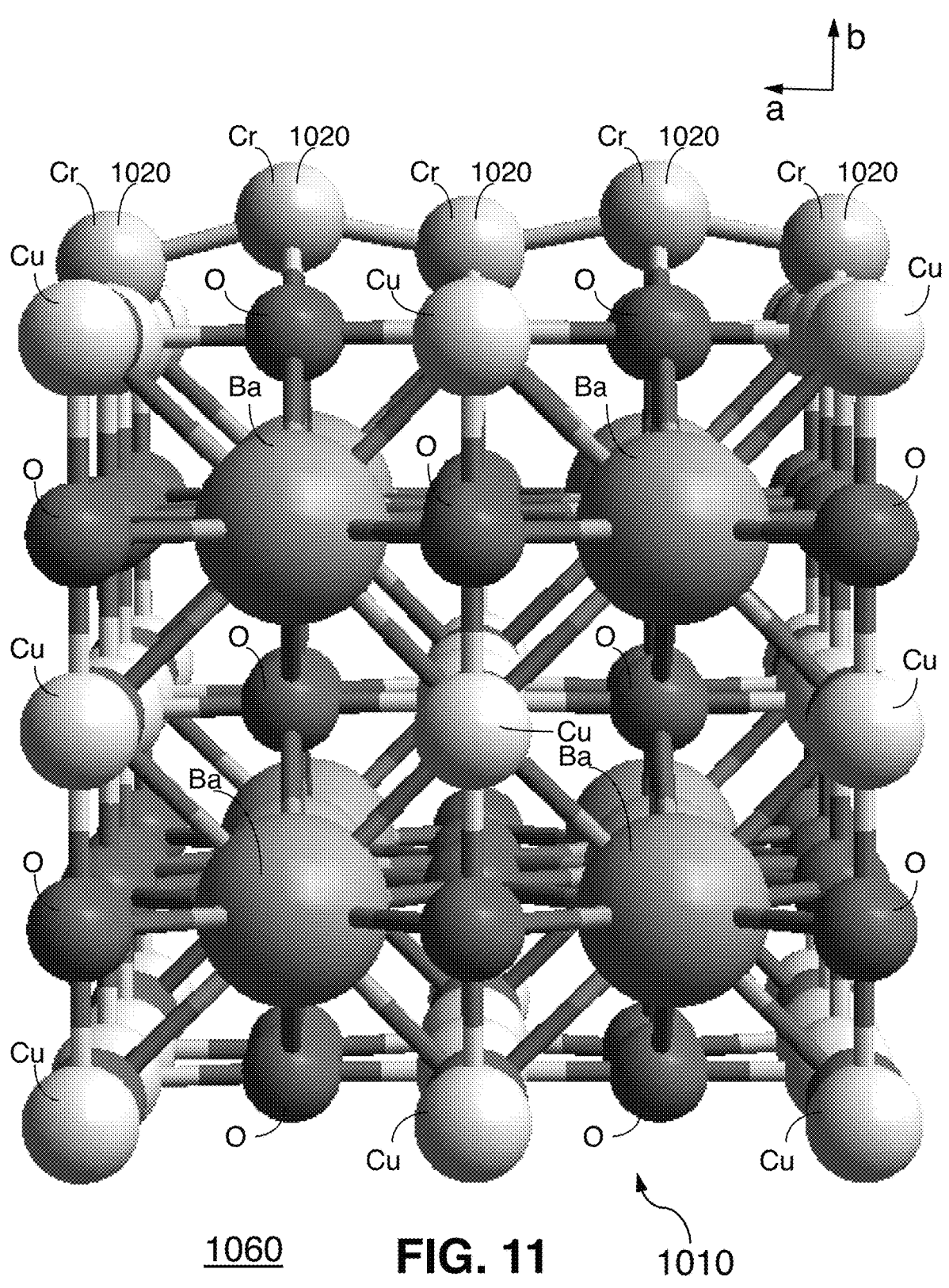
FIG. 11 illustrates a modified crystalline structure, according to various implementations of the invention, of an ELR material as viewed from a first perspective.
Figure 12:
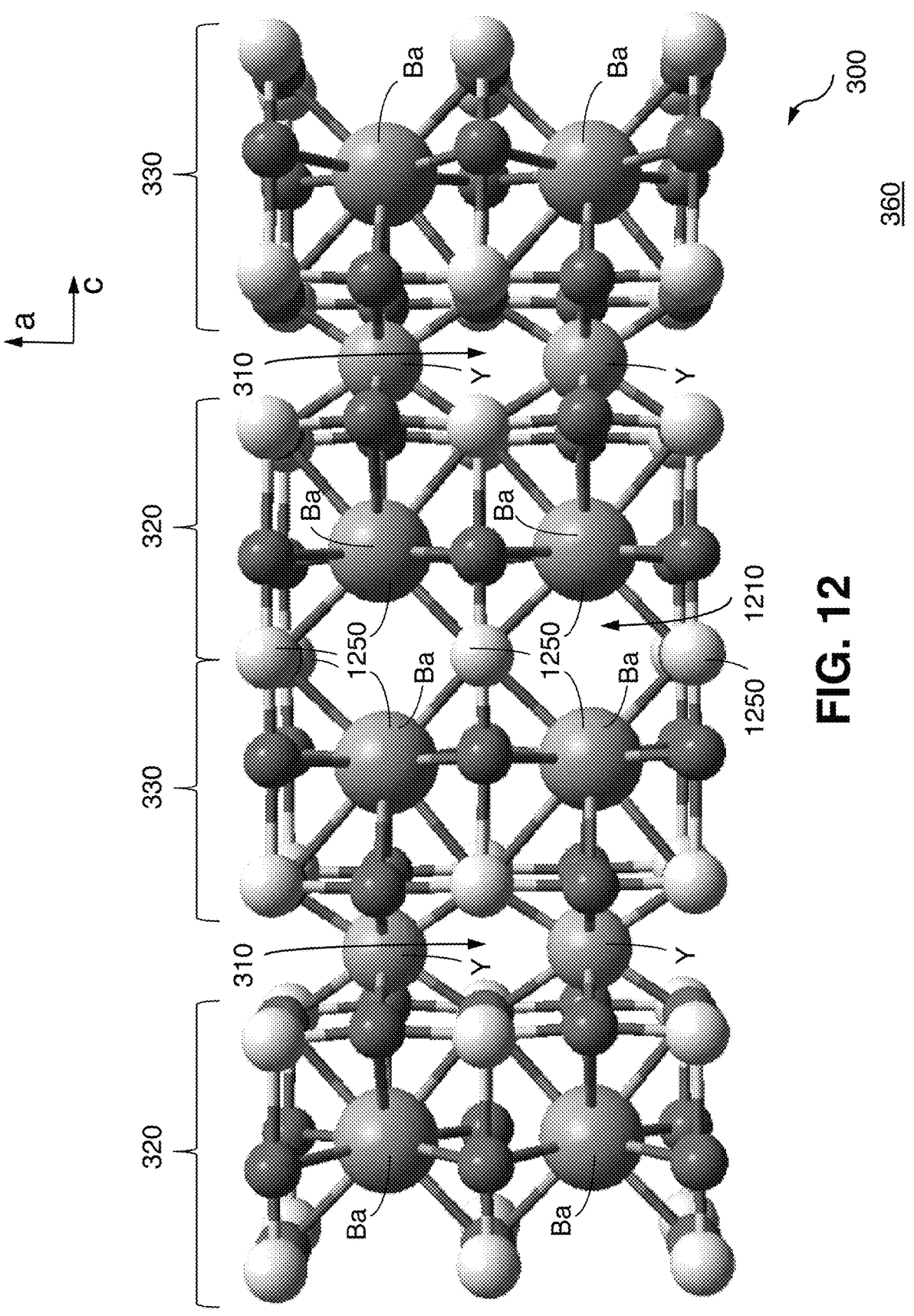
FIG. 12 illustrates a crystalline structure of an exemplary ELR material as viewed from a third perspective.

The presence and absence of apertures 210 that extend in the direction of various axes through the crystalline structures 100 of various ELR materials is consistent with the anisotropic dependence demonstrated by such ELR materials. For example, ELR material 360, which is illustrated in FIG. 3, FIG. 11, and FIG. 12, corresponds to YBCO-123, which exhibits the resistance phenomenon in the direction of the a-axis and the b-axis, but tends not to exhibit the resistance phenomenon in the direction of the c-axis. Consistent with the anisotropic dependence of the resistance phenomenon demonstrated by YBCO-123, FIG. 3 illustrates that apertures 310 extend through crystalline structure 300 in the direction of the a-axis; FIG. 12 illustrates that apertures 310 and apertures 1210 extend through crystalline structure 300 in the direction of the b-axis; and FIG. 11 illustrates that no suitable apertures extend through crystalline structure 300 in the direction of the c-axis.

Aperture 210 and/or its cross-section may be dependent upon various atomic characteristics of aperture atoms 250 and/or "non-aperture atoms" (i.e., atoms in crystalline structure 100 other than aperture atoms 250). Such atomic characteristics include, but are not limited to, atomic size, atomic weight, numbers of electrons, electron structure, number of bonds, types of bonds, differing bonds, multiple bonds, bond lengths, bond strengths, bond angles between aperture atoms, bond angles between aperture atoms and non-aperture atoms, and/or isotope number. Aperture atoms 250 and non-aperture atoms may be selected based on their corresponding atomic characteristics to optimize aperture 210 in terms of its size, shape, rigidity, and modes of vibration (in terms of amplitude, frequency, and direction) in relation to crystalline structure and/or atoms therein.

According to various implementations of the invention, changes in a physical structure of aperture 210, including changes to a shape and/or size of its cross-section and/or changes to the shape or size of aperture atoms 205, may have an impact on the resistance phenomenon. For example, as temperature of crystalline structure 100 increases, the cross-section of aperture 210 may be changed due to vibration of various atoms within crystalline structure 100 as well as changes in energy states, or occupancy thereof, of the atoms in crystalline structure 100. Physical flexure, tension or compression of crystalline structure 100 may also affect the positions of various atoms within crystalline structure 100 and therefore the cross-section of aperture 210. Magnetic fields imposed on crystalline structure 100 may also affect the positions of various atoms within crystalline structure 100 and therefore the cross-section of aperture 210.

Phonons correspond to various modes of vibration within crystalline structure 100. Phonons in crystalline structure 100 may interact with electrical charge propagated through crystalline structure 100. More particularly, phonons in crystalline structure 100 may cause atoms in crystalline structure 100 (e.g., aperture atoms 250, non-aperture atoms, etc.) to interact with electrical charge propagated through crystalline structure 100. Higher temperatures result in higher phonon amplitude and may result in increased interaction among phonons, atoms in crystalline structure 100, and such electrical charge. Various implementations of the invention may minimize, reduce, or otherwise modify such interaction among phonons, atoms in crystalline structure 100, and such electrical charge within crystalline structure 100.

FIG. 3 illustrates a crystalline structure 300 of an exemplary ELR material 360 from a second perspective. Exemplary ELR material 360 is a superconducting material commonly referred to as "YBCO" which, in certain formulations, has a transition temperature of approximately 90 K. In particular, exemplary ELR material 360 depicted in FIG. 3 is YBCO-123. Crystalline structure 300 of exemplary ELR material 360 includes various atoms of yttrium ("Y"), barium ("Ba"), copper ("Cu") and oxygen ("O"). As illustrated in FIG. 3, an aperture 310 is formed within crystalline structure 300 by aperture atoms 350, namely atoms of yttrium, copper, and oxygen. A cross-sectional distance between the yttrium aperture atoms in aperture 310 is approximately 0.389 nm, a cross-sectional distance between the oxygen aperture atoms in aperture 310 is approximately 0.285 nm, and a cross-sectional distance between the copper aperture atoms in aperture 310 is approximately 0.339 nm.

FIG. 12 illustrates crystalline structure 300 of exemplary ELR material 360 from a third perspective. Similar to that described above with regard to FIG. 3, exemplary ELR material 360 is YBCO-123, and aperture 310 is formed within crystalline structure 300 by aperture atoms 350, namely atoms of yttrium, copper, and oxygen. In this orientation, a cross-sectional distance between the yttrium aperture atoms in aperture 310 is approximately 0.382 nm, a cross-sectional distance between the oxygen aperture atoms in aperture 310 is approximately 0.288 nm, and a cross-sectional distance between the copper aperture atoms in aperture 310 is approximately 0.339 nm. In this orientation, in addition to aperture 310, crystalline structure 300 of exemplary ELR material 360 includes an aperture 1210. Aperture 1210 occurs in the direction of the b-axis of crystalline structure 300. More particularly, aperture 1210 occurs between individual unit cells of exemplary ELR material 360 in crystalline structure 300. Aperture 1210 is formed within crystalline structure 300 by aperture atoms 1250, namely atoms of barium, copper and oxygen. A cross-sectional distance between the barium aperture atoms 1250 in aperture 1210 is approximately 0.430 nm, a cross-sectional distance between the oxygen aperture atoms 1250 in aperture 1210 is approximately 0.382 nm, and a cross-sectional distance between the copper aperture atoms 1250 in aperture 1210 is approximately 0.382 nm. In some implementations of the invention, aperture 1210 operates in a manner similar to that described herein with regard to aperture 310. For purposes of this description, aperture 310 in YBCO may be referred to as an "yttrium aperture," whereas aperture 1210 in YBCO may be referred to as a "barium aperture," based on the compositions of their respective aperture atoms 350, 1250.

Figure 5:
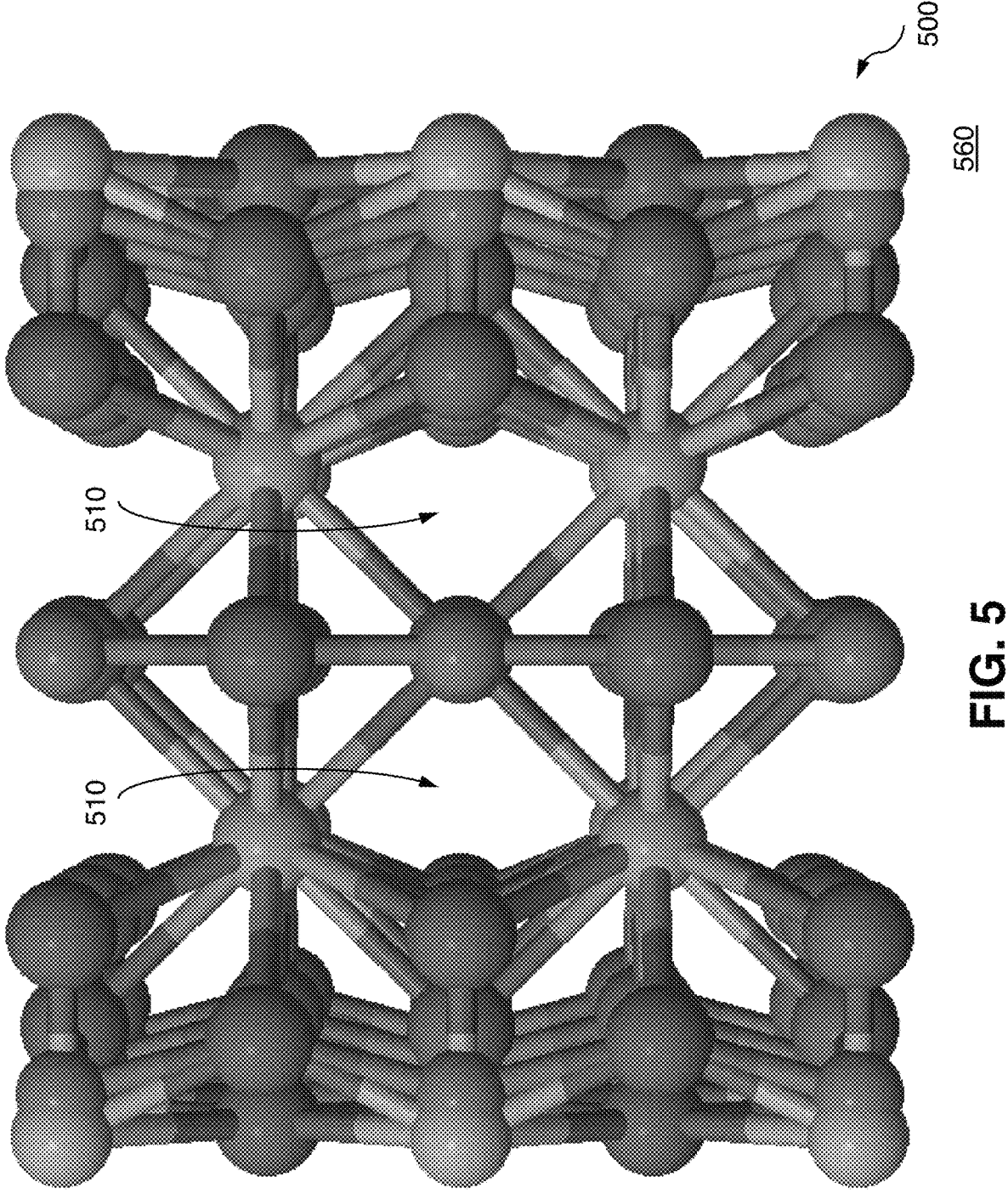
FIG. 5 illustrates a crystalline structure of an exemplary ELR material as viewed from a second perspective.

FIG. 5 illustrates a crystalline structure 500 of an exemplary ELR material 560 as viewed from the second perspective. Exemplary ELR material 560 is an HTS material commonly referred to as "HgBa2CuO4" which has a transition temperature of approximately 94 K. Crystalline structure 500 of exemplary ELR material 560 includes various atoms of mercury ("Hg"), barium ("Ba"), copper ("Cu"), and oxygen ("O"). As illustrated in FIG. 5, an aperture 510 is formed within crystalline structure 500 by aperture atoms which comprise atoms of barium, copper, and oxygen.

Figure 6:
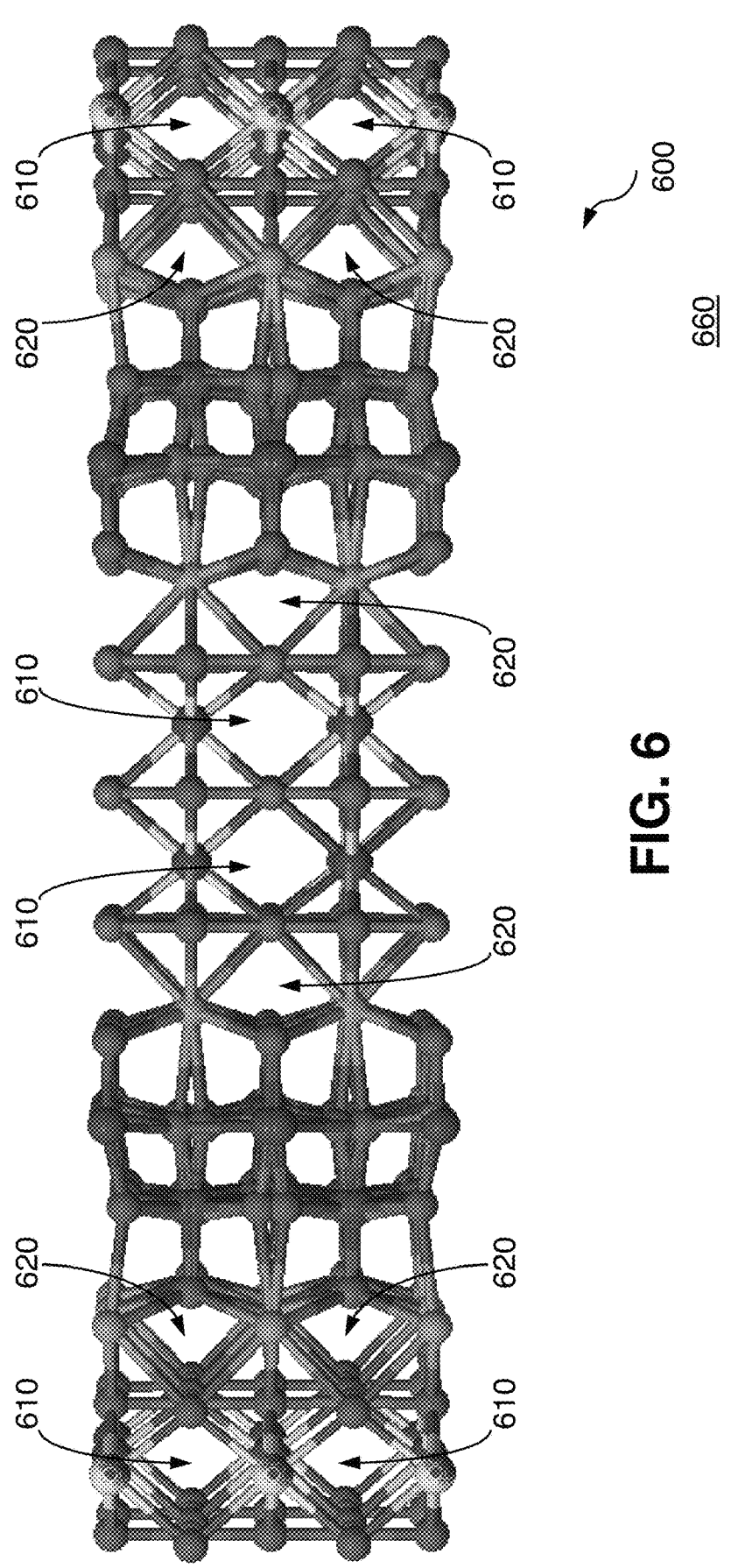
FIG. 6 illustrates a crystalline structure of an exemplary ELR material as viewed from a second perspective.

FIG. 6 illustrates a crystalline structure 600 of an exemplary ELR material 660 as viewed from the second perspective. Exemplary ELR material 660 is an HTS material commonly referred to as "Tl2Ca2Ba2Cu3O10" which has a transition temperature of approximately 128 K. Crystalline structure 600 of exemplary ELR material 660 includes various atoms of thallium ("Tl"), calcium ("Ca"), barium ("Ba"), copper ("Cu"), and oxygen ("O"). As illustrated in FIG. 6, an aperture 610 is formed within crystalline structure 600 by aperture atoms which comprise atoms of calcium, barium, copper and oxygen. As also illustrated in FIG. 6, a secondary aperture 620 may also be formed within crystalline structure 600 by secondary aperture atoms which comprise atoms of calcium, copper and oxygen. Secondary apertures 620 may operate in a manner similar to that of apertures 610.

Figure 7:
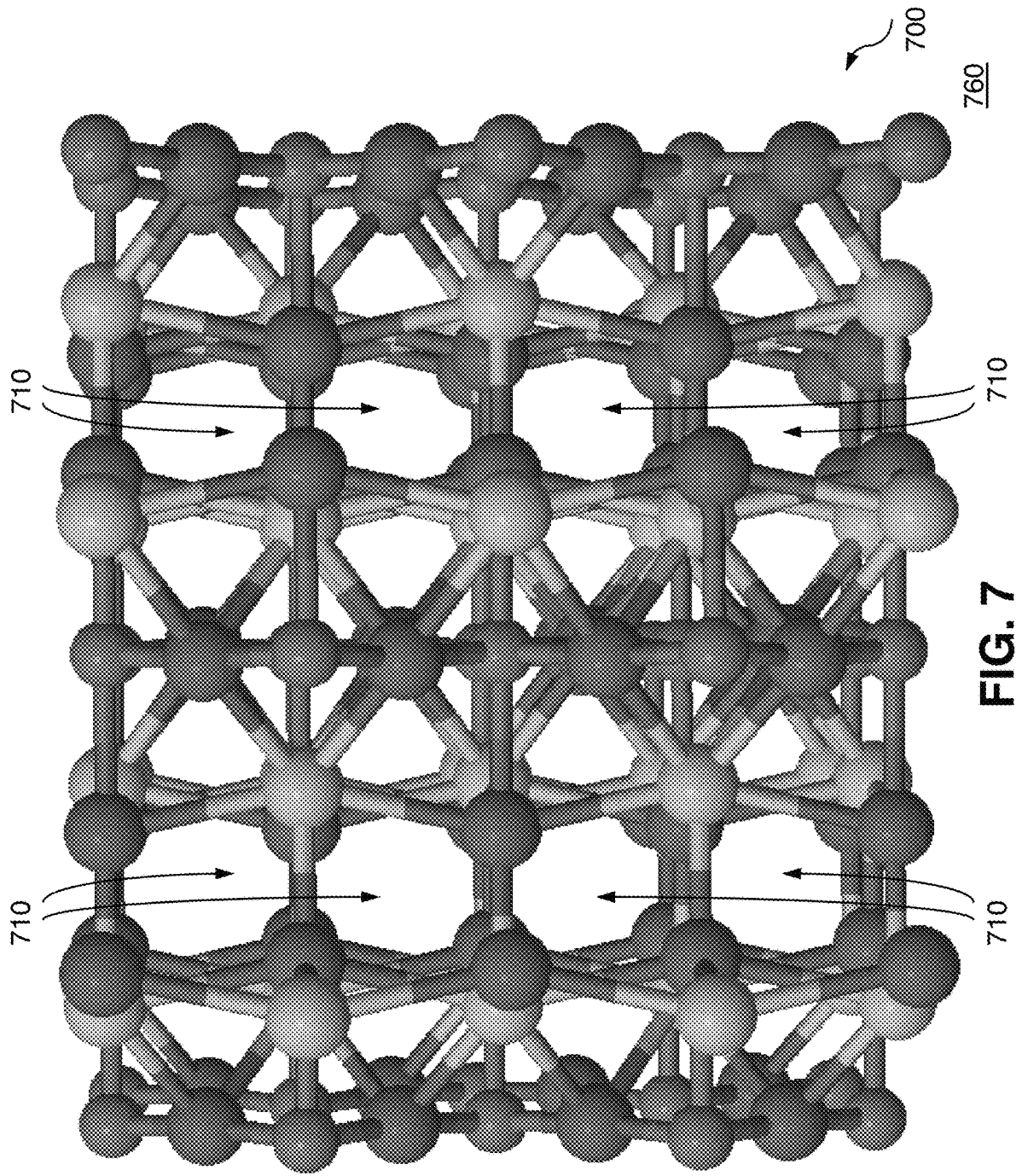
FIG. 7 illustrates a crystalline structure of an exemplary ELR material as viewed from a second perspective.

FIG. 7 illustrates a crystalline structure 700 of an exemplary ELR material 760 as viewed from the second perspective. Exemplary ELR material 760 is an HTS material commonly referred to as "La2CuO4" which has a transition temperature of approximately 39 K. Crystalline structure 700 of exemplary ELR material 760 includes various atoms of lanthanum ("La"), copper ("Cu"), and oxygen ("O"). As illustrated in FIG. 7, an aperture 710 is formed within crystalline structure 700 by aperture atoms which comprise atoms of lanthanum and oxygen.

Figure 8:
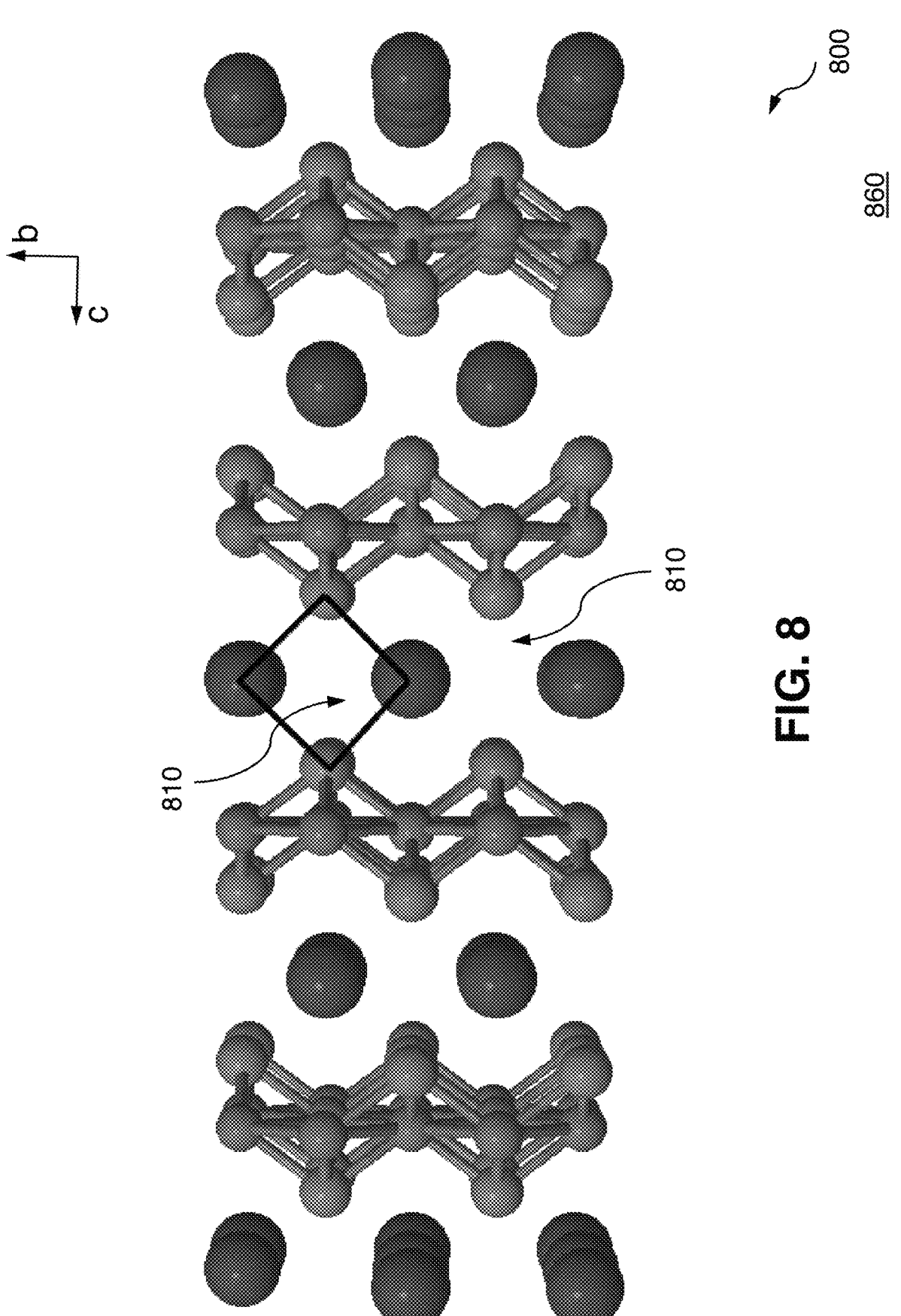
FIG. 8 illustrates a crystalline structure of an exemplary ELR material as viewed from a second perspective.

FIG. 8 illustrates a crystalline structure 800 of an exemplary ELR material 860 as viewed from the second perspective. Exemplary ELR material 860 is an HTS material commonly referred to as "As2Ba0.34Fe2 K0.66" which has a transition temperature of approximately 38 K. Exemplary ELR material 860 is representative of a family of ELR materials sometimes referred to as "iron pnictides." Crystalline structure 800 of exemplary ELR material 860 includes various atoms of arsenic ("As"), barium ("Ba"), iron ("Fe"), and potassium ("K"). As illustrated in FIG. 8, an aperture 810 is formed within crystalline structure 800 by aperture atoms which comprise atoms of potassium and arsenic.

Figure 9:
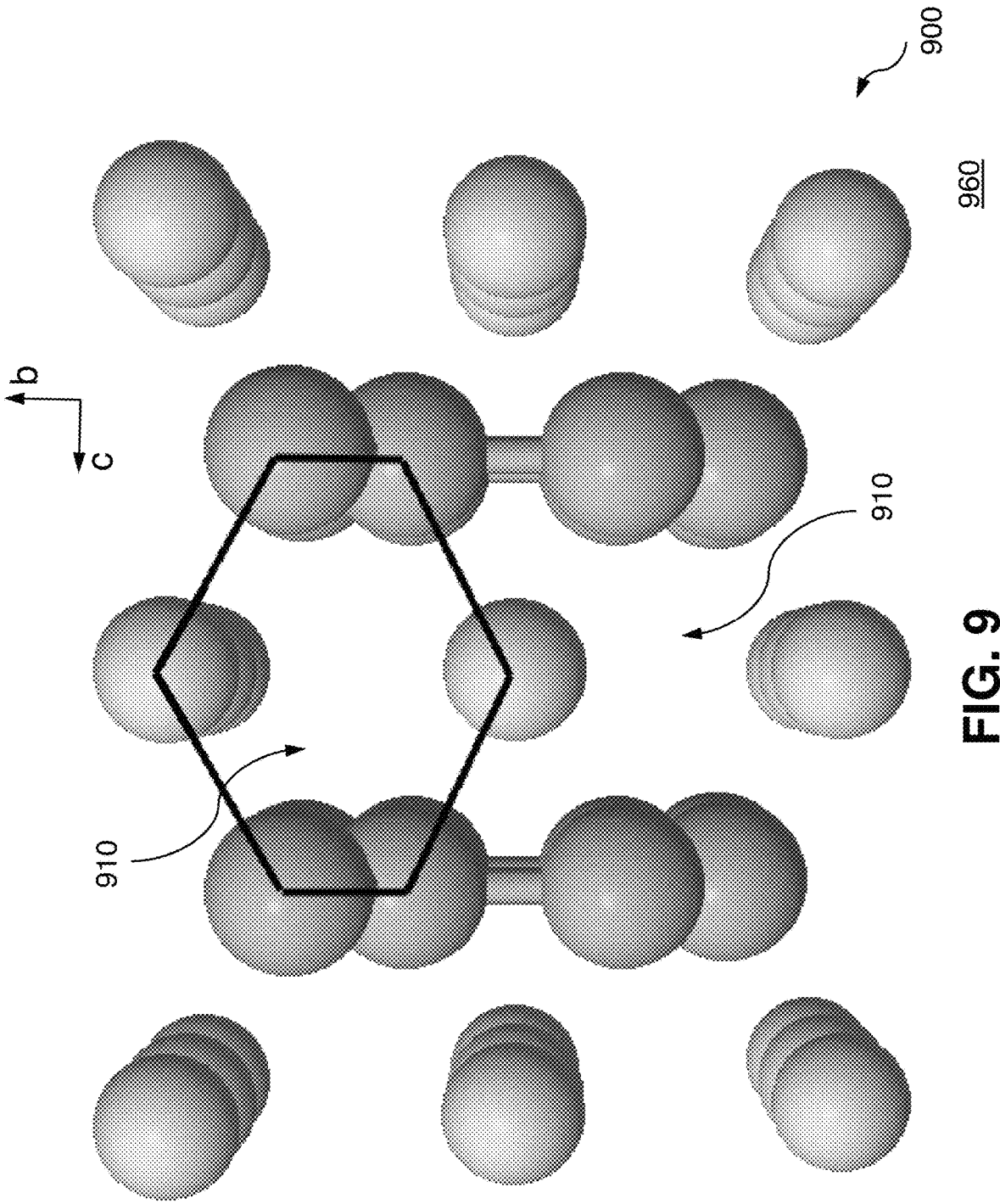
FIG. 9 illustrates a crystalline structure of an exemplary ELR material as viewed from a second perspective.

FIG. 9 illustrates a crystalline structure 900 of an exemplary ELR material 960 as viewed from the second perspective. Exemplary ELR material 960 is an HTS material commonly referred to as "MgB2" which has a transition temperature of approximately 39 K. Crystalline structure 900 of exemplary ELR material 960 includes various atoms of magnesium ("Mg") and boron ("B"). As illustrated in FIG. 9, an aperture 910 is formed within crystalline structure 900 by aperture atoms which comprise atoms of magnesium and boron.

The foregoing exemplary ELR materials illustrated in FIG. 3, FIGS. 5-9, and FIG. 12 each demonstrate the presence of various apertures within such materials. Various other ELR materials have similar apertures. Once attributed to the resistance phenomenon, apertures and their corresponding crystalline structures may be exploited to improve operating characteristics of existing ELR materials, to derive improved ELR materials from existing ELR materials, and/or to design and formulate new ELR materials. For convenience of description, ELR material 360 (and its attendant characteristics and structures) henceforth generally refers to various ELR materials, including, but not limited to, ELR material 560, ELR material 660, ELR material 760, and other ELR materials illustrated in the drawings, not just that ELR material illustrated and described with reference to FIG. 3.

According to various implementations of the invention, the crystalline structure of various known ELR materials may be modified such that the modified ELR material operates with improved operating characteristics over the known and/or unmodified ELR material. In some implementations of the invention, this may also be accomplished, for example, by layering a material over crystalline structure 100 such that atoms of the material span aperture 210 by forming one or more bonds between first portion 220 and second portion 230 as would be appreciated. This particular modification of layering a material over crystalline structure 100 is described in further detail below in connection with various experimental test results.

Figure 10:
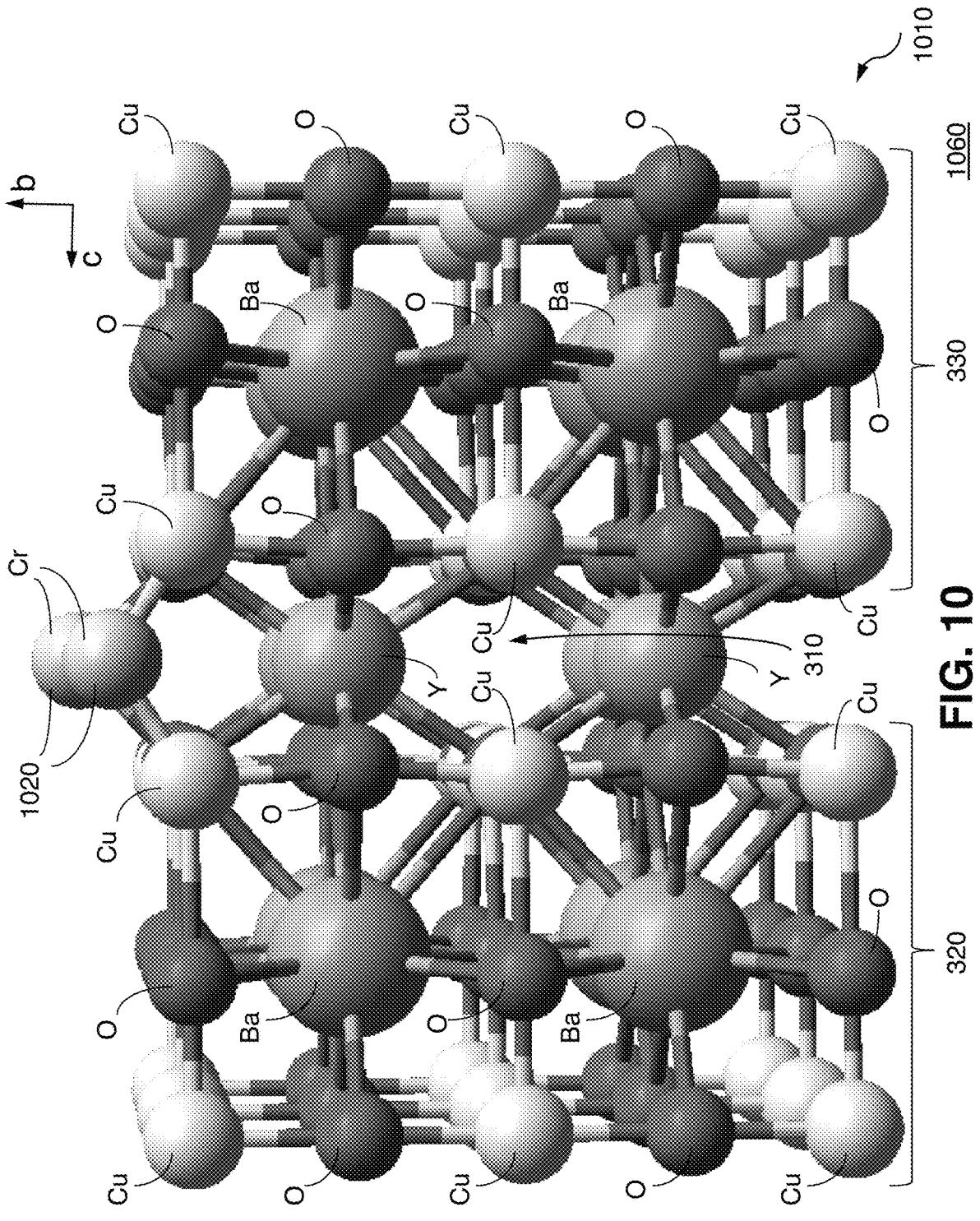
FIG. 10 illustrates a modified crystalline structure, according to various implementations of the invention, of an ELR material as viewed from a second perspective.

FIG. 10 illustrates a modified crystalline structure 1010 of a modified ELR material 1060 as viewed from the second perspective in accordance with various implementations of the invention. FIG. 11 illustrates modified crystalline structure 1010 of modified ELR material 1060 as viewed from the first perspective in accordance with various implementations of the invention. ELR material 360 (e.g., for example, as illustrated in FIG. 3 and elsewhere) is modified to form modified ELR material 1060. Modifying material 1020 forms bonds with atoms of crystalline structure 300 (of FIG. 3) of ELR material 360 to form modified crystalline structure 1010 of modified ELR material 1060 as illustrated in FIG. 11. As illustrated, modifying material 1020 bridges a gap between first portion 320 and second portion 330 thereby changing, among other things, vibration characteristics of modified crystalline structure 1010, particularly in the region of aperture 310. In doing so, modifying material 1020 maintains aperture 310 at higher temperatures. Accordingly, in some implementations of the invention, modifying material 1020 is specifically selected to fit in and bond with appropriate atoms in crystalline structure 300.

In some implementations of the invention and as illustrated in FIG. 10, modifying material 1020 is bonded to a face of crystalline structure 300 that is parallel to the b-plane (e.g., an "a-c" face). In such implementations where modifying material 1020 is bonded to the "a-c" face, apertures 310 extending in the direction of the a-axis and with cross-sections lying in the a-plane are maintained. In such implementations, charge carriers flow through aperture 310 in the direction of the a-axis.

In some implementations of the invention, modifying material 1020 is bonded to a face of crystalline structure 300 that is parallel to the a-plane (e.g., a "b-c" face). In such implementations where modifying material 1020 is bonded to the "b-c" face, apertures 310 extending in the direction of the b-axis and with cross-sections lying in the b-plane are maintained. In such implementations, charge carriers flow through aperture 310 in the direction of the b-axis.

Various implementations of the invention include layering a particular surface of ELR material 360 with modifying material 1020 (i.e., modifying the particular surface of ELR material 360 with the modifying material 1020). As would be recognized from this description, reference to "modifying a surface" of ELR material 360, ultimately includes modifying a face (and in some cases more that one face) of one or more unit cells 400 of ELR material 360. In other words, modifying material 1020 actually bonds to atoms in unit cell 400 of ELR material 360.

For example, modifying a surface of ELR material 360 parallel to the a-plane includes modifying "b-c" faces of unit cells 400. Likewise, modifying a surface of ELR material 360 parallel to the b-plane includes modifying "a-c" faces of unit cells 400. In some implementations of the invention, modifying material 1020 is bonded to a surface of ELR material 360 that is substantially parallel to any plane that is parallel to the c-axis. For purposes of this description, planes that are parallel to the c-axis are referred to generally as ab-planes, and as would be appreciated, include the a-plane and the b-plane. As would be appreciated, a surface of ELR material 360 parallel to the ab-plane is formed from some mixture of "a-c" faces and "b-c" faces of unit cells 400. In such implementations where modifying material 1020 is bonded to a surface parallel to an ab-plane, apertures 310 extending in the direction of the a-axis and apertures 310 extending in the direction of the b-axis are maintained.

In some implementations of the invention, modifying material 1020 may be a conductive material. In some implementations of the invention, modifying material 1020 may a material with high oxygen affinity (i.e., a material that bonds easily with oxygen) ("oxygen bonding material"). In some implementations of the invention, modifying material 1020 may be a conductive material that bonds easily with oxygen ("oxygen bonding conductive materials"). Such oxygen bonding conductive materials may include, but are not limited to: chromium, copper, bismuth, cobalt, vanadium, and titanium. Such oxygen bonding conductive materials may also include, but are not limited to: rhodium or beryllium. Other modifying materials may include gallium or selenium. Other modifying materials may include silver. Still other modifying materials may be used.

In some implementations of the invention, oxides of modifying material 1020 may form during various operations associated with modifying ELR material 360 with modifying material 1020. Accordingly, in some implementations of the invention, modifying material 1020 may include a substantially pure form of modifying material 1020 and/or various oxides of modifying material 1020. In other words, in some implementations of the invention, ELR material 360 is modified with modifying material 1020 and/or various oxides of modifying material 1020. By way of example, but not limitation, in some implementations of the invention, modifying material 1020 may comprise chromium and/or chromium oxide (CrxOy).

In some implementations of the invention, ELR material 360 may be YBCO and modifying material 1020 may be an oxygen bonding conductive material. In some implementations of the invention, ELR material 360 may be YBCO and modifying material 1020 may be selected from the group including, but not limited to: chromium, copper, bismuth, cobalt, vanadium, titanium, rhodium, or beryllium. In some implementations of the invention, ELR material 360 may be YBCO and modifying material 1020 may be selected from the group consisting of: chromium, copper, bismuth, cobalt, vanadium, titanium, rhodium, and beryllium. In some implementations of the invention, ELR material 360 may be YBCO and modifying material 1020 may be another modifying material.

In some implementations of the invention, various other combinations of mixed-valence copper-oxide perovskite materials and oxygen bonding conductive materials may be used. For example, in some implementations of the invention, ELR material 360 corresponds to a mixed-valence copper-oxide perovskite material commonly referred to as "BSCCO." BSCCO includes various atoms of bismuth ("Bi"), strontium ("Sr"), calcium ("Ca"), copper ("Cu") and oxygen ("O"). By itself, BSCCO has a transition temperature of approximately 100 K. In some implementations of the invention, ELR material 360 may be BSCCO and modifying material 1020 may be an oxygen bonding conductive material. In some implementations of the invention, ELR material 360 may be BSCCO and modifying material 1020 may be selected from the group including, but not limited to: chromium, copper, bismuth, cobalt, vanadium, titanium, rhodium, or beryllium. In some implementations of the invention, ELR material 360 may be BSCCO and modifying material 1020 may be selected from the group consisting of: chromium, copper, bismuth, cobalt, vanadium, titanium, rhodium, and beryllium. In some implementations of the invention, ELR material 360 may be BSCCO and modifying material 1020 may be another modifying material.

In some implementations of the invention, various combinations of other ELR materials and modifying materials may be used. For example, in some implementations of the invention, ELR material 360 corresponds to an iron pnictide material. Iron pnictides, by themselves, have transition temperatures that range from approximately 25-60 K. In some implementations of the invention, ELR material 360 may be an iron pnictide and modifying material 1020 may be an oxygen bonding conductive material. In some implementations of the invention, ELR material 360 may be an iron pnictide and modifying material 1020 may be selected from the group including, but not limited to: chromium, copper, bismuth, cobalt, vanadium, titanium, rhodium, or beryllium. In some implementations of the invention, ELR material 360 may be an iron pnictide and modifying material 1020 may be selected from the group consisting of: chromium, copper, bismuth, cobalt, vanadium, titanium, rhodium, and beryllium. In some implementations of the invention, ELR material 360 may be an iron pnictide and modifying material 1020 may be another modifying material.

In some implementations of the invention, various combinations of other ELR materials and modifying materials may be used. For example, in some implementations of the invention, ELR material 360 may be magnesium diboride ("MgB2"). By itself, magnesium diboride has a transition temperature of approximately 39 K. In some implementations of the invention, ELR material 360 may be magnesium diboride and modifying material 1020 may be an oxygen bonding conductive material. In some implementations of the invention, ELR material 360 may be magnesium diboride and modifying material 1020 may be selected from the group including, but not limited to: chromium, copper, bismuth, cobalt, vanadium, titanium, rhodium, or beryllium. In some implementations of the invention, ELR material 360 may be magnesium diboride and modifying material 1020 may be selected from the group consisting of: chromium, copper, bismuth, cobalt, vanadium, titanium, rhodium, and beryllium. In some implementations of the invention, ELR material 360 may be magnesium diboride and modifying material 1020 may be another modifying material.

In some implementations of the invention, modifying material 1020 may be layered onto a sample of ELR material 360 using various techniques for layering one composition onto another composition as would be appreciated. For example, such layering techniques include, but are not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering techniques. In some implementations of the invention, ELR material 360 may be layered onto a sample of modifying material 1020 using various techniques for layering one composition onto another composition. In some implementations of the invention, a single atomic layer of modifying material 1020 (i.e., a layer of modifying material 1020 having a thickness substantially equal to a single atom or molecule of modifying material 1020) may be layered onto a sample of ELR material 360. In some implementations of the invention, a single unit layer of the modifying material (i.e., a layer of the modifying material having a thickness substantially equal to a single unit (e.g., atom, molecule, crystal, or other unit) of the modifying material) may be layered onto a sample of the ELR material. In some implementations of the invention, the ELR material may be layered onto a single unit layer of the modifying material. In some implementations of the invention, two or more unit layers of the modifying material may be layered onto the ELR material. In some implementations of the invention, the ELR material may be layered onto two or more unit layers of the modifying material.

In some implementations of the invention, modifying ELR material 360 with modifying material 1020 maintains aperture 310 within modified ELR material 1060 at temperatures at, about, or above that of the boiling point of nitrogen. In some implementations of the invention, aperture 310 is maintained at temperatures at, about, or above that the boiling point of carbon dioxide. In some implementations of the invention, aperture 310 is maintained at temperatures at, about, or above that of the boiling point of ammonia. In some implementations of the invention, aperture 310 is maintained at temperatures at, about, or above that of the boiling point of various formulations of Freon. In some implementations of the invention, aperture 310 is maintained at temperatures at, about, or above that of the melting point of water. In some implementations of the invention, aperture 310 is maintained at temperatures at, about, or above that of the melting point of a solution of water and antifreeze. In some implementations of the invention, aperture 310 is maintained at temperatures at, about, or above that of room temperature (e.g., 21° C.). In some implementations of the invention, aperture 310 is maintained at temperatures at, about, or above a temperature selected from one of the following set of temperatures: 150 K, 160 K, 170 K, 180 K, 190 K, 200 K, 210 K, 220 K, 230 K, 240 K, 250 K, 260 K, 270 K, 280 K, 290 K, 300 K, 310 K. In some implementations of the invention, aperture 310 is maintained at temperatures within the range of 150 K to 315 K.

Figure 14A:
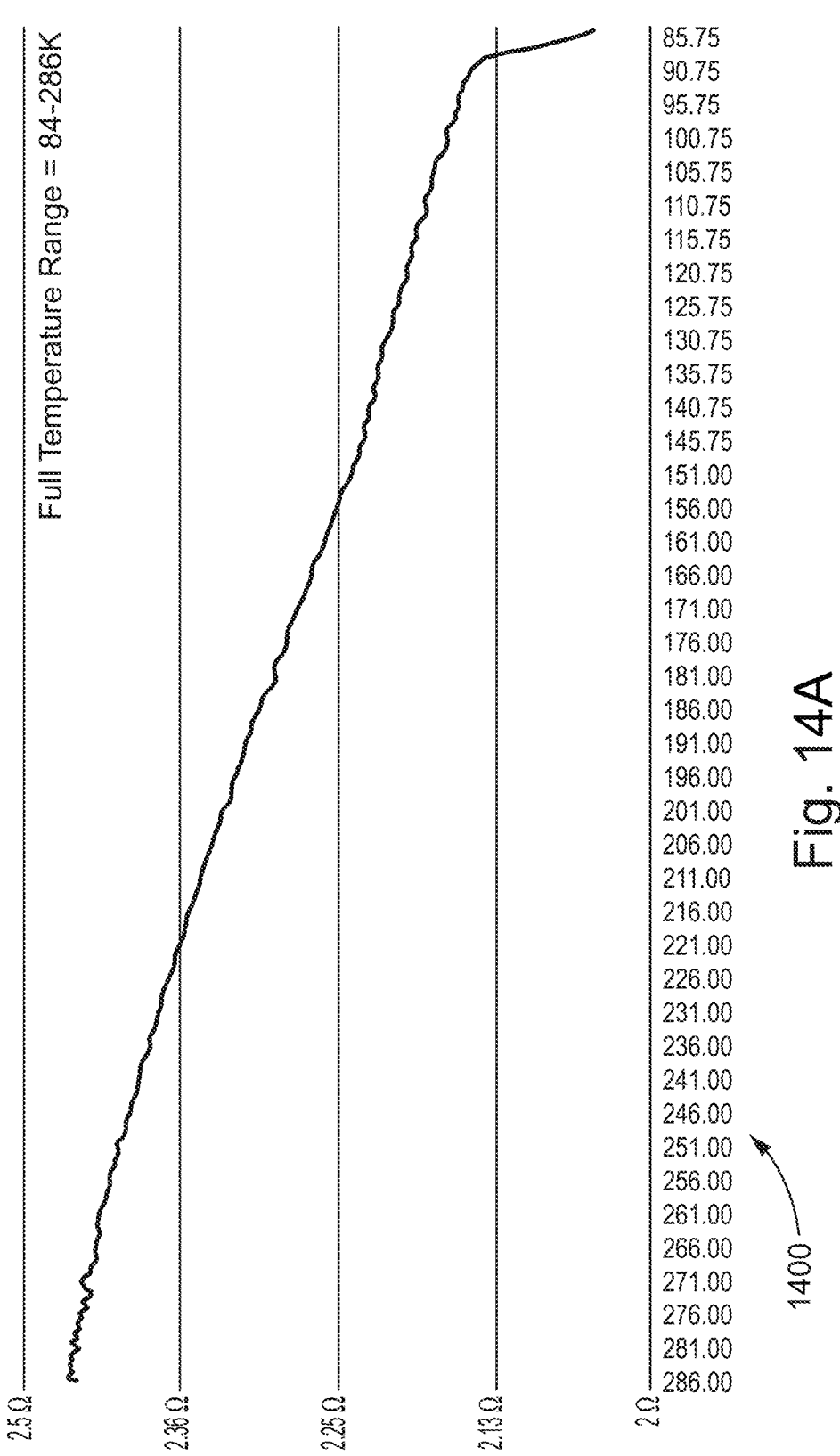
FIGS. 14A-14G illustrate test results demonstrating various operational characteristics of a modified ELR material.
Figure 14B:
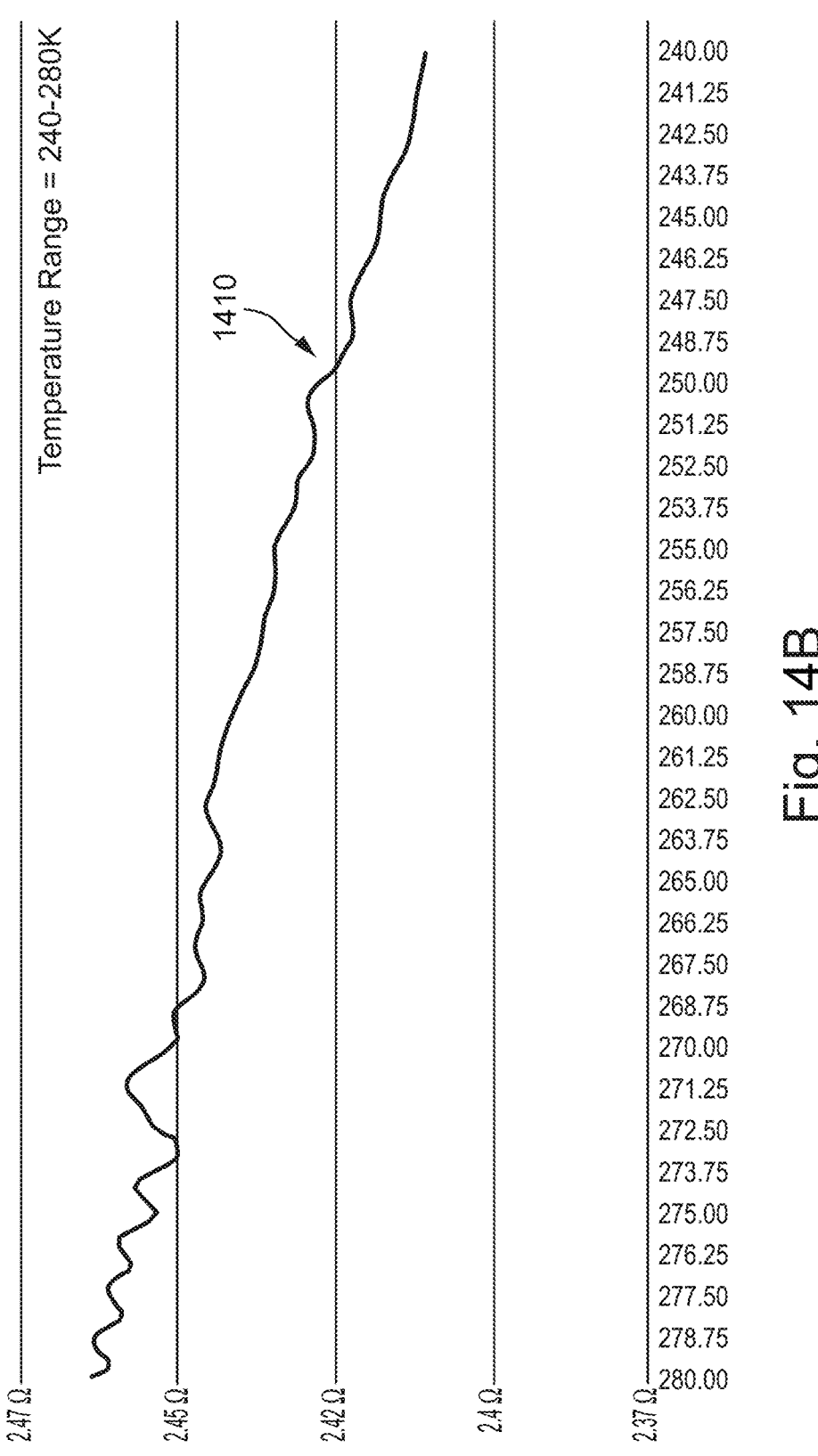
Figure 14C:
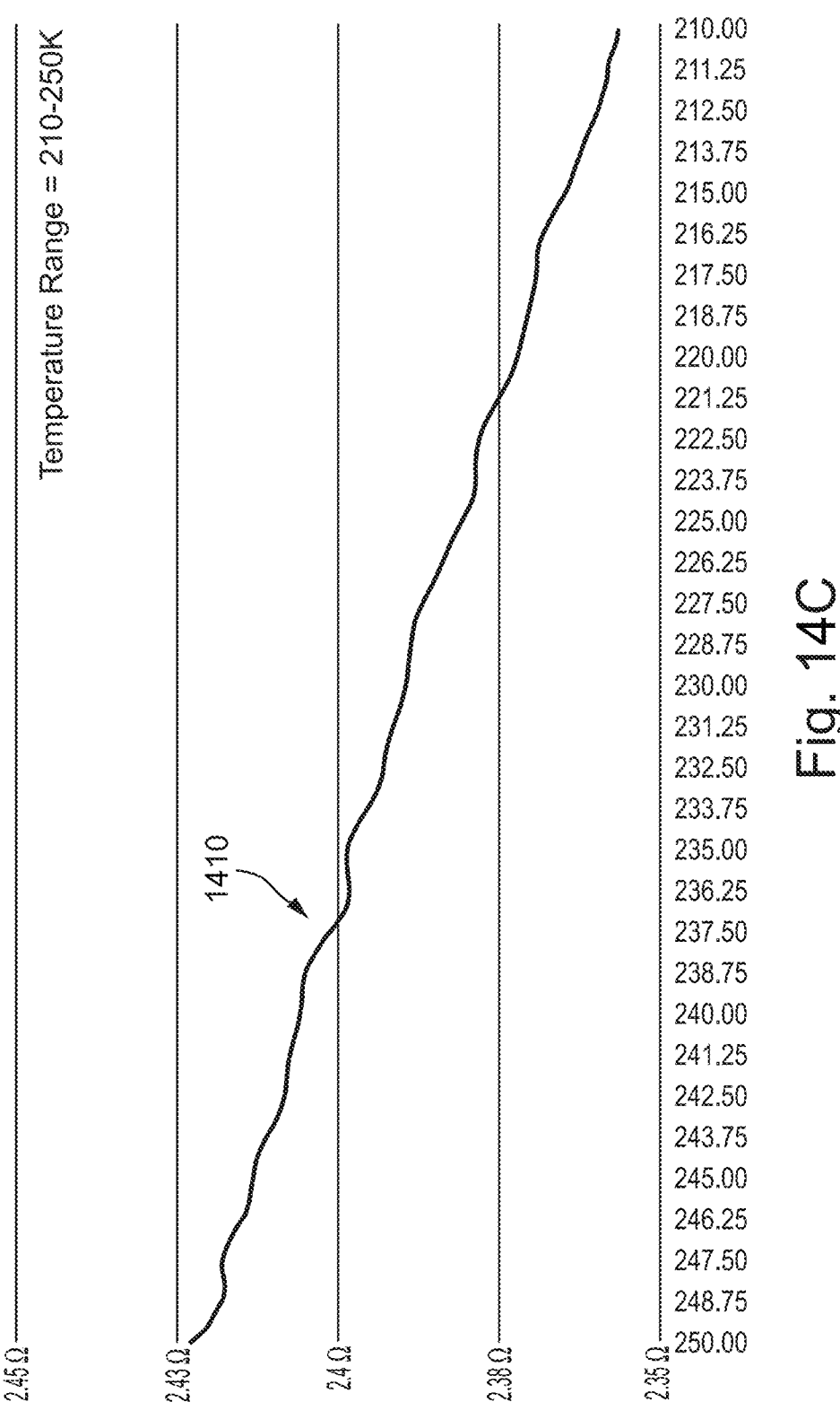
Figure 14D:
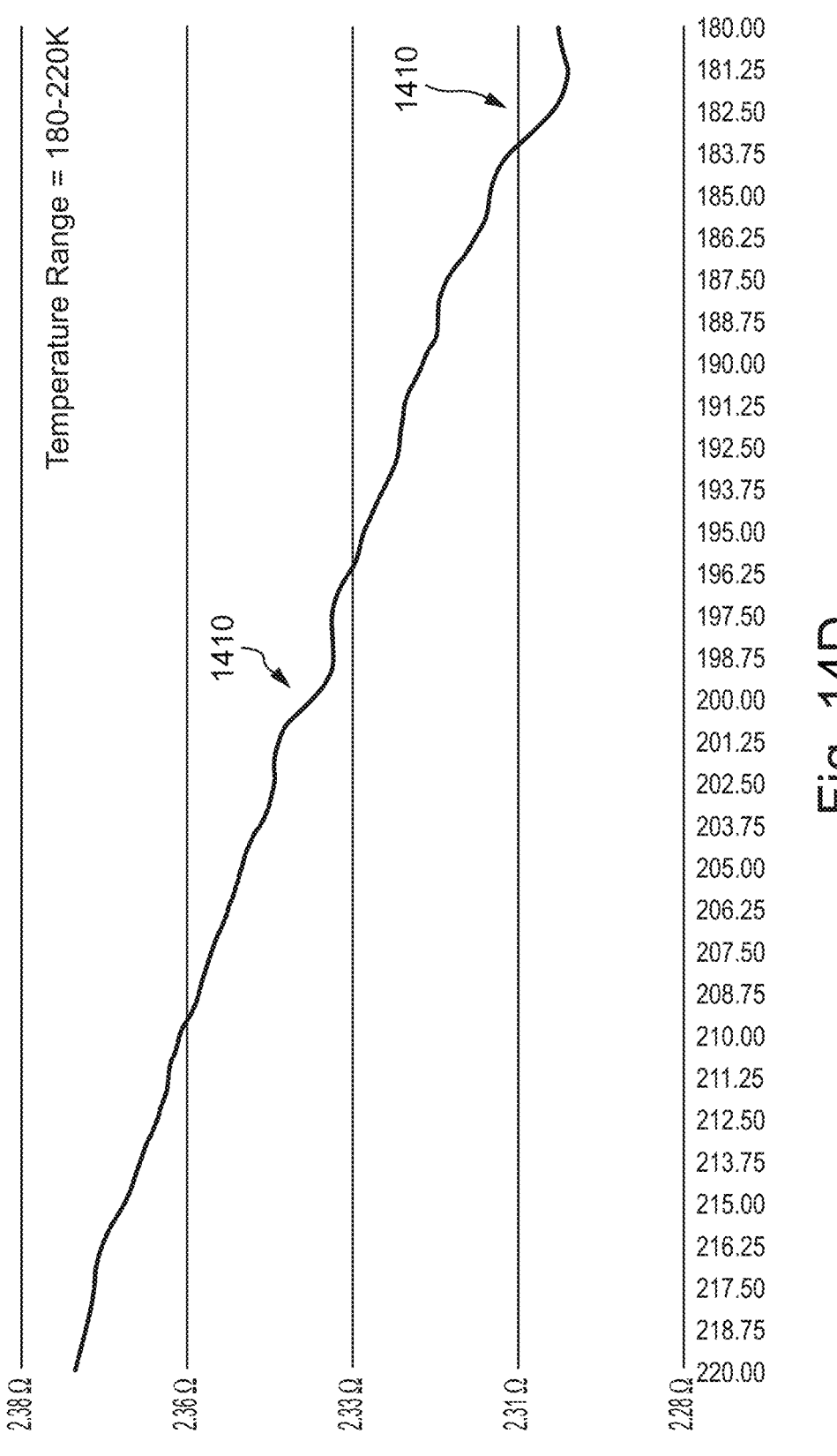
Figure 14E:
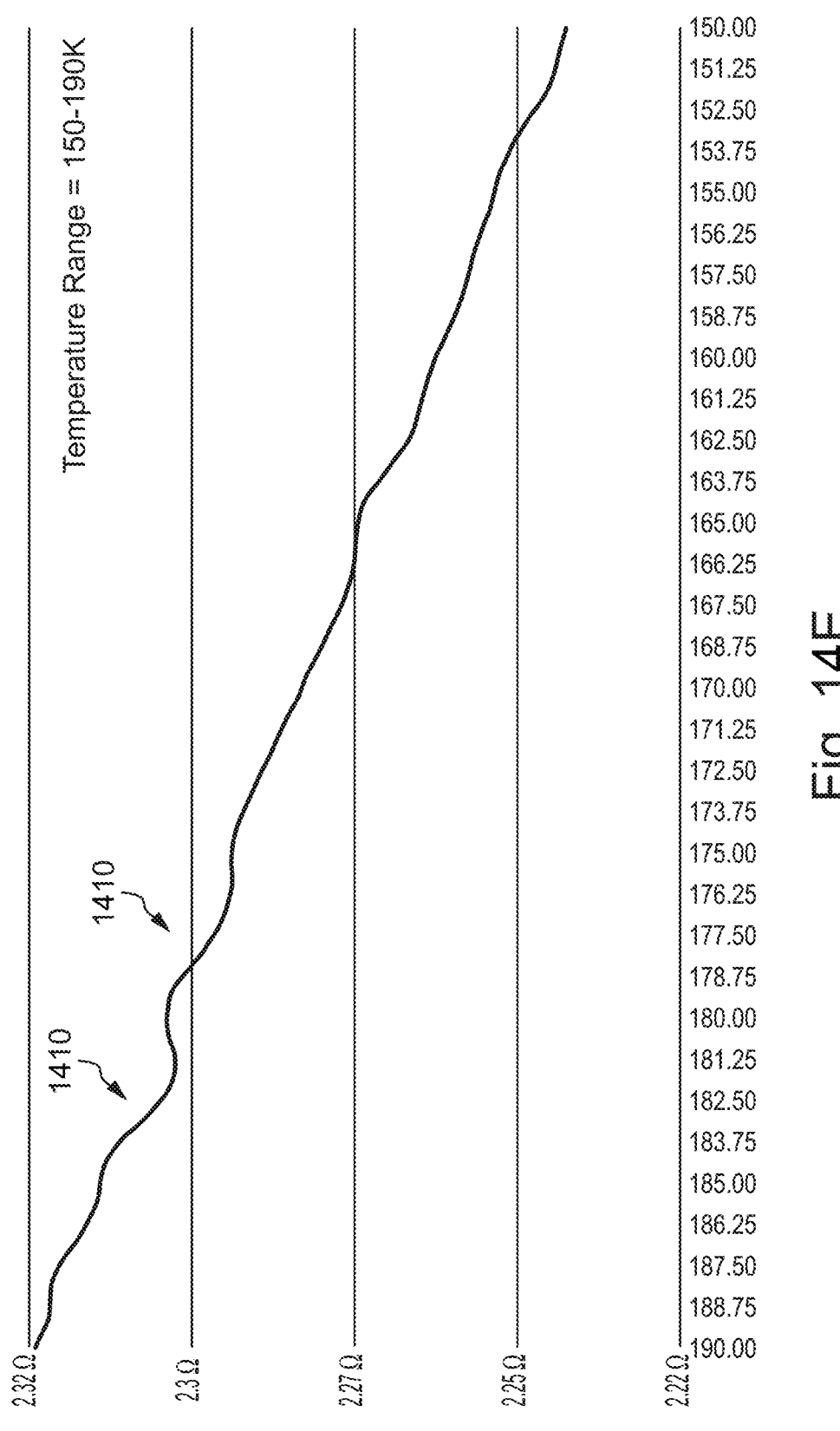
Figure 14F:
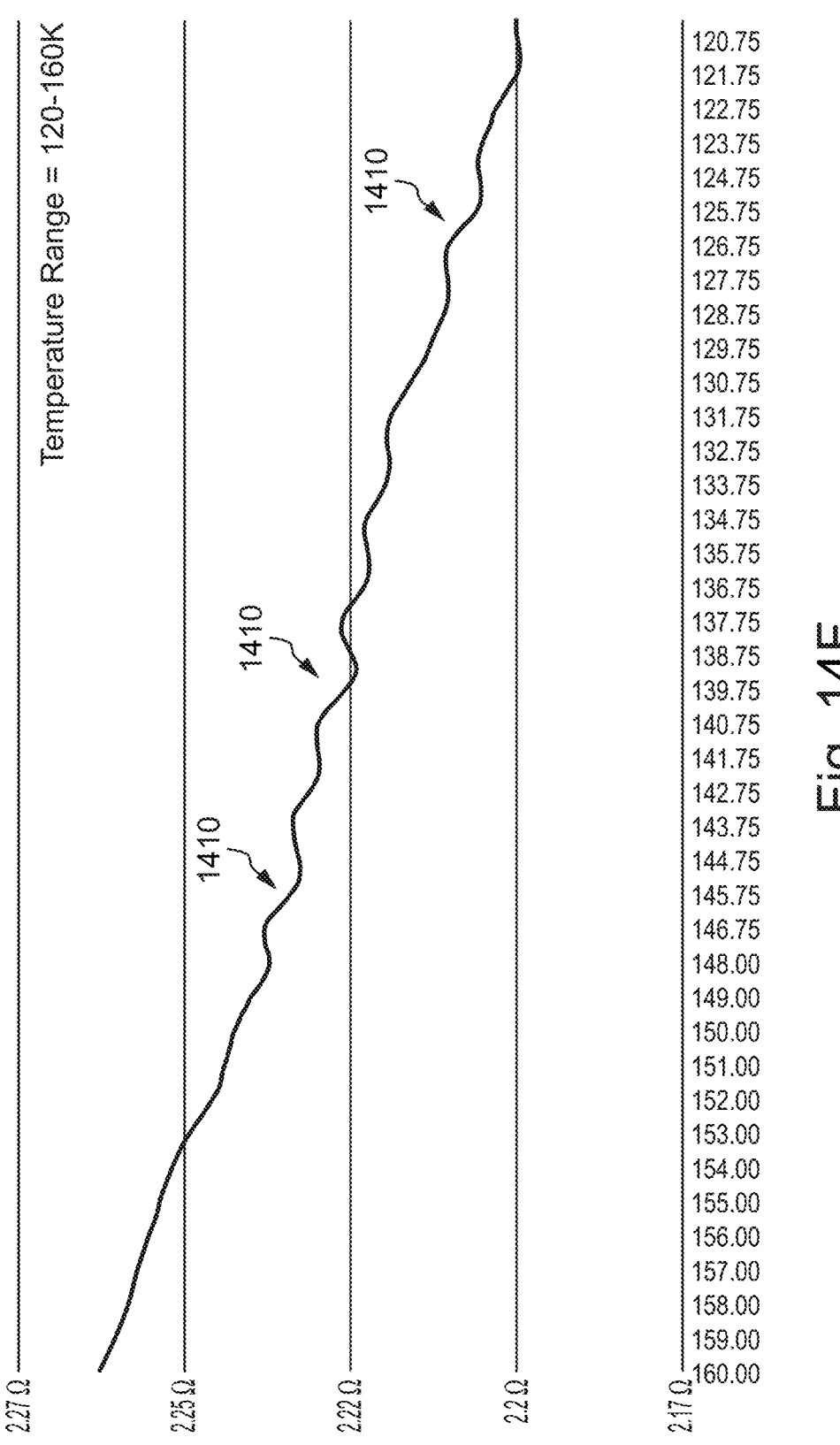
Figure 14G:
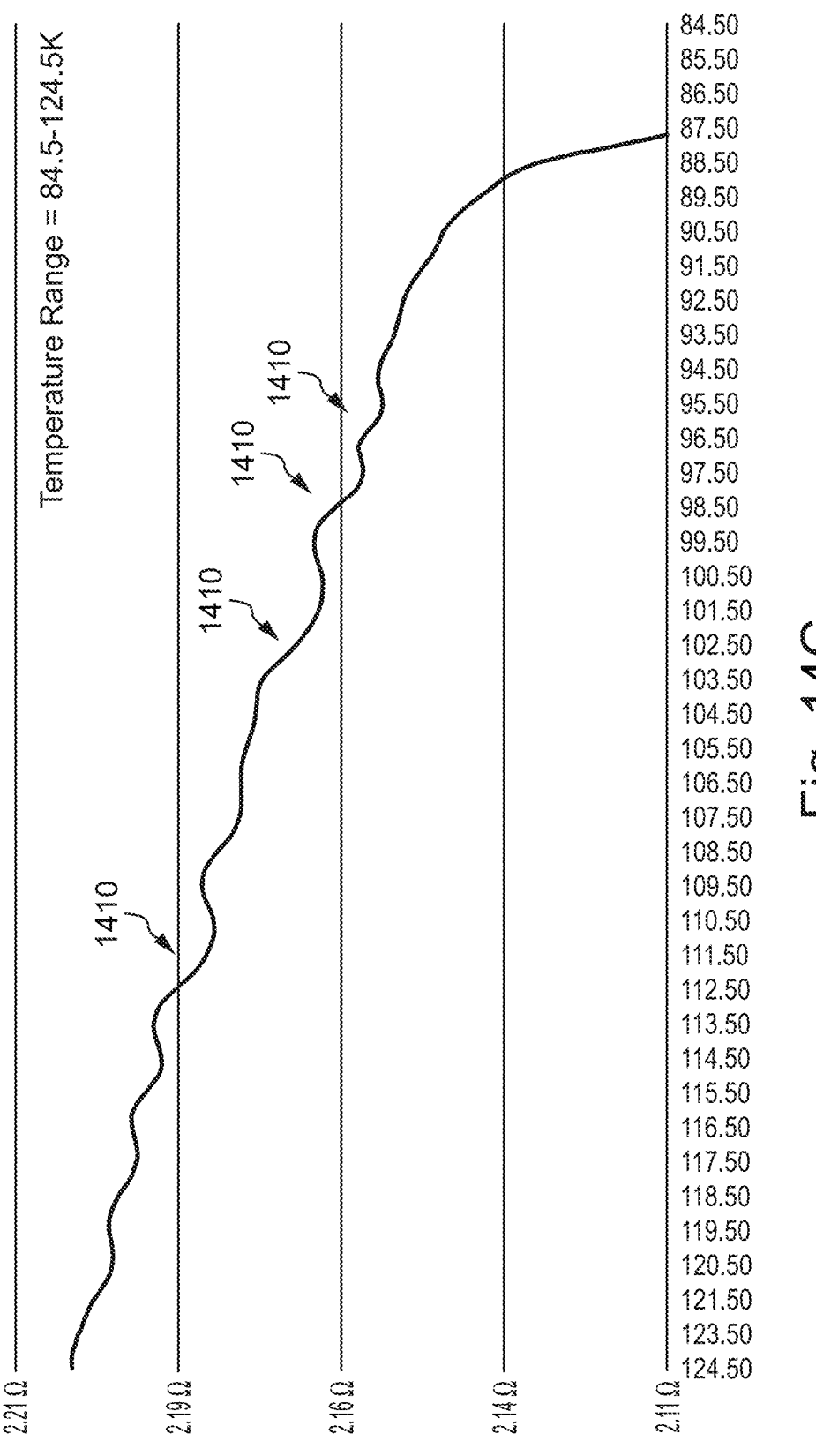

FIGS. 14A-14G illustrate test results 1400 obtained as described above. Test results 1400 include a plot of resistance of modified ELR material 1060 as a function of temperature (in K). More particularly, test results 1400 correspond to modified ELR material 1060 where modifying material 1020 corresponds to chromium and where ELR material 360 corresponds to YBCO. FIG. 14A includes test results 1400 over a full range of temperature over which resistance of modified ELR material 1060 was measured, namely 84 K to 286 K. In order to provide further detail, test results 1400 were broken into various temperature ranges and illustrated. In particular, FIG. 14B illustrates those test results 1400 within a temperature range from 240 K to 280 K; FIG. 14C illustrates those test results 1400 within a temperature range from 210 K to 250 K; FIG. 14D illustrates those test results 1400 within a temperature range from 180 K to 220 K; FIG. 14E illustrates those test results 1400 within a temperature range from 150 K to 190 K; FIG. 14F illustrates those test results 1400 within a temperature range from 120 K to 160 K; and FIG. 14G illustrates those test results 1400 within a temperature range from 84.5 K to 124.5 K.

Test results 1400 demonstrate that various portions of modified ELR material 1060 operate in an ELR state at higher temperatures relative to ELR material 360. Six sample analysis test runs were made. For each sample analysis test run, modified ELR material 1060 was slowly cooled from approximately 286 K to 83 K. While being cooled, the current source applied +60 nA and –60 nA of current in a delta mode configuration in order to reduce impact of any DC offsets and/or thermocouple effects. At regular time intervals, the voltage across modified ELR material 1060 was measured by the voltmeter. For each sample analysis test run, the time series of voltage measurements were filtered using a 512-point fast Fourier transform ("FFT"). All but the lowest 44 frequencies from the FFT were eliminated from the data and the filtered data was returned to the time domain. The filtered data from each sample analysis test run were then merged together to produce test results 1400. More particularly, all the resistance measurements from the six sample analysis test runs were organized into a series of temperature ranges (e.g., 80 K-80.25 K, 80.25 K to 80.50, 80.5 K to 80.75 K, etc.) in a manner referred to as "binning." Then the resistance measurements in each temperature range were averaged together to provide an average resistance measurement for each temperature range. These average resistance measurements form test results 1400.

Test results 1400 include various discrete steps 1410 in the resistance versus temperature plot, each of such discrete steps 1410 representing a relatively rapid change in resistance over a relatively narrow range of temperatures. At each of these discrete steps 1410, discrete portions of modified ELR material 1060 begin propagating electrical charge up to such portions' charge propagating capacity at the respective temperatures. At very small scales, the surface of ELR material 360 being modified is not perfectly smooth, and thus apertures 310 exposed within the surface of ELR material 360 typically do not extend across the entire width or length of the sample of modified ELR material 1060. Accordingly, in some implementations of the invention, modifying material 1020 covers an entire surface of ELR material 360 and may act as a conductor that carries electrical charge between apertures 310.

Before discussing test results 1400 in further detail, various characteristics of ELR material 360 and modifying material 1020 are discussed. Resistance versus temperature ("R-T") profiles of these materials individually are generally well known. The individual R-T profiles of these materials are not believed to include features similar to discrete steps 1410 found in test results 1400. In fact, unmodified samples of ELR material 360 and samples of modifying material 1020 alone have been tested under similar and often identical testing and measurement configurations. In each instance, the R-T profile of the unmodified samples of ELR material 360 and the R-T profile of the modifying material alone did not include any features similar to discrete steps 1410. Accordingly, discrete steps 1410 are the result of modifying ELR material 360 with modifying material 1020 to maintain aperture 310 at increased temperatures thereby allowing modified material 1060 to remain in an ELR state at such increased temperatures in accordance with various implementations of the invention.

At each of discrete steps 1410, various ones of apertures 310 within modified ELR material 1060 start propagating electrical charge up to each aperture's 310 charge propagating capacity. As measured by the voltmeter, each charge propagating aperture 310 appears as a short-circuit, dropping the apparent voltage across the sample of modified ELR material 1060 by a small amount. The apparent voltage continues to drop as additional ones of apertures 310 start propagating electrical charge until the temperature of the sample of modified ELR material 1060 reaches the transition temperature of ELR material 360 (i.e., the transition temperature of the unmodified ELR material which in the case of YBCO is approximately 90 K).

Test results 1400 indicate that certain apertures 310 within modified ELR material 1060 propagate electrical charge at approximately 97 K, 100 K, 103 K, 113 K, 126 K, 140 K, 146 K, 179 K, 183.5 K, 200.5 K, 237.5 K, and 250 K. Certain apertures 310 within modified ELR material 1060 may propagate electrical charge at other temperatures within the full temperature range as would be appreciated.

Test results 1400 include various other relatively rapid changes in resistance over a relatively narrow range of temperatures not otherwise identified as a discrete step 1410. Some of these other changes may correspond to artifacts from data processing techniques used on the measurements obtained during the test runs (e.g., FFTs, filtering, etc.). Some of these other changes may correspond to changes in resistance due to resonant frequencies in modified crystalline structure 1010 affecting aperture 310 at various temperatures. Some of these other changes may correspond to additional discrete steps 1410. In addition, changes in resistance in the temperature range of 270-274 K are likely to be associated with water present in modified ELR material 1060, some of which may have been introduced during preparation of the sample of modified ELR material 1060.

In addition to discrete steps 1410, test results 1400 differ from the R-T profile of ELR material 360 in that modifying material 1020 conducts well at temperatures above the transition temperature of ELR material 360 whereas ELR material 360 typically does not.

Figure 15:
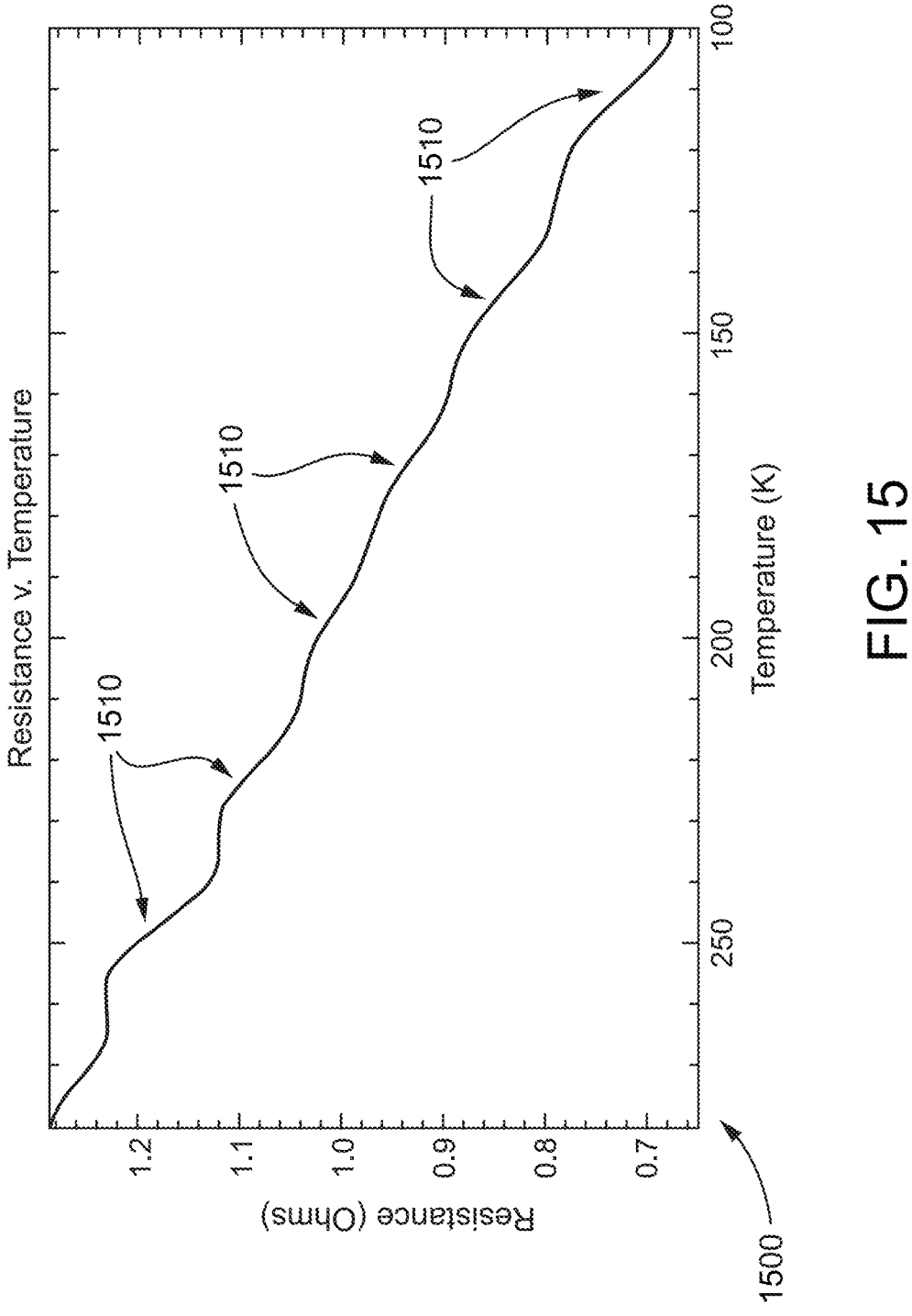
FIG. 15 illustrates test results for a modified ELR material, namely with chromium as a modifying material and YBCO as an ELR material.

FIG. 15 illustrates additional test results 1500 for samples of ELR material 360 and modifying material 1020. More particularly, for test results 1500, modifying material 1020 corresponds to chromium and ELR material 360 corresponds to YBCO. For test results 1500, samples of ELR material 360 were prepared, using various techniques discussed above, to expose a face of crystalline structure 300 parallel to the a-plane or the b-plane. Test results 1500 were gathered using a lock-in amplifier and a K6221 current source, which applied a 10 nA current at 24.0, Hz to modified ELR material 1060. Test results 1500 include a plot of resistance of modified ELR material 1060 as a function of temperature (in K). FIG. 15 includes test results 1500 over a full range of temperature over which resistance of modified ELR material 1060 was measured, namely 80 K to 275 K. Test results 1500 demonstrate that various portions of modified ELR material 1060 operate in an ELR state at higher temperatures relative to ELR material 360. Five sample analysis test runs were made with a sample of modified ELR material 1060. For each sample analysis test run, the sample of modified ELR material 1060 was slowly warmed from 80 K to 275 K. While being warmed, the voltage across the sample of modified ELR material 1060 was measured at regular time intervals and the resistance was calculated based on the source current. For each sample analysis test run, the time series of resistance measurements were filtered using a 1024-point FFT. All but the lowest 15 frequencies from the FFT were eliminated from the data and the filtered resistance measurements were returned to the time domain. The filtered resistance measurements from each sample analysis test run were then merged together using the binning process referred to above to produce test results 1500. Then the resistance measurements in each temperature range were averaged together to provide an average resistance measurement for each temperature range. These average resistance measurements form test results 1500.

Test results 1500 include various discrete steps 1510 in the resistance versus temperature plot, each of such discrete steps 1510 representing a relatively rapid change in resistance over a relatively narrow range of temperatures, similar to discrete steps 1410 discussed above with respect to FIGS. 14A-14G. At each of these discrete steps 1510, discrete portions of modified ELR material 1060 propagate electrical charge up to such portions' charge propagating capacity at the respective temperatures.

Test results 1500 indicate that certain apertures 310 within modified ELR material 1060 propagate electrical charge at approximately 120 K, 145 K, 175 K, 225 K, and 250 K. Certain apertures 310 within modified ELR material 1060 may propagate electrical charge at other temperatures within the full temperature range as would be appreciated.

FIGS. 16-20 illustrate additional test results for samples of ELR material 360 and various modifying materials 1020. For these additional test results, samples of ELR material 360 were prepared, using various techniques discussed above, to expose a face of crystalline structure 300 substantially parallel to the a-plane or the b-plane or some combination of the a-plane or the b-plane and the modifying material was layered onto these exposed faces. Each of these modified samples was slowly cooled from approximately 300 K to 80 K. While being warmed, a current source applied a current in a delta mode configuration through the modified sample as described below. At regular time intervals, the voltage across the modified sample was measured. For each sample analysis test run, the time series of voltage measurements were filtered in the frequency domain using an FFT by removing all but the lowest frequencies, and the filtered measurements were returned to the time domain. The number of frequencies kept is in general different for each data set. The filtered data from each of test runs were then binned and averaged together to produce the test results illustrated in FIGS. 16-21.

Figure 16:
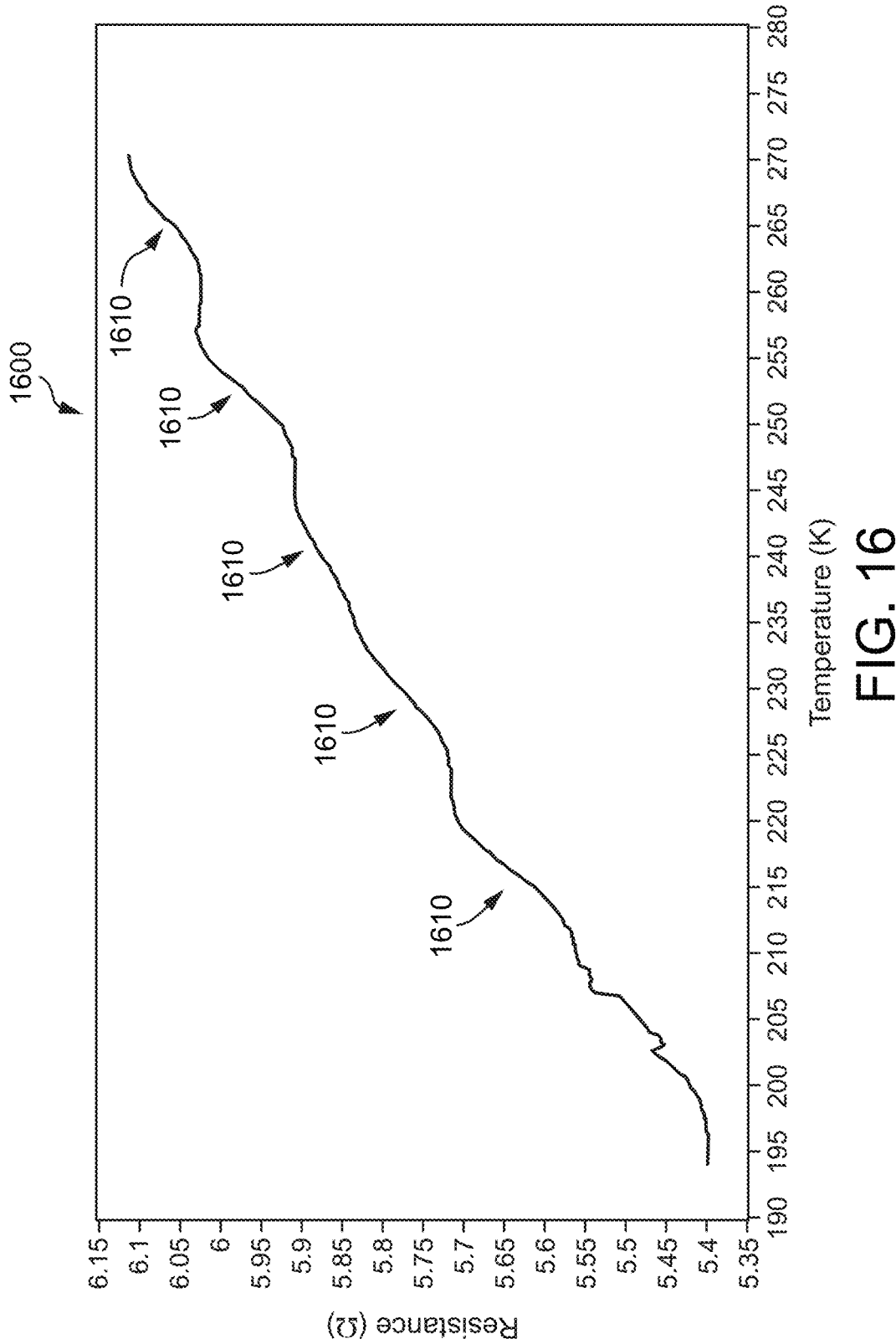
FIG. 16 illustrates test results for a modified ELR material, namely with vanadium as a modifying material and YBCO as an ELR material.

FIG. 16 illustrates test results 1600 including a plot of resistance of modified ELR material 1060 as a function of temperature (in K). For test results 1600, modifying material 1020 corresponds to vanadium and ELR material 360 corresponds to YBCO. Test results 1600 were produced over 11 test runs using a 20 nA current source, a 1024-point FFT was performed, and information from all but the lowest 12 frequencies were eliminated. Test results 1600 demonstrate that various portions of modified ELR material 1060 operate in an ELR state at higher temperatures relative to ELR material 360. Test results 1600 include various discrete steps 1610 in the resistance versus temperature plot, similar to those discussed above with regard to FIGS. 14A-14G. Test results 1600 indicate that certain apertures 310 within modified ELR material 1060 propagate electrical charge at approximately 267 K, 257 K, 243 K, 232 K, and 219 K.

Certain apertures 310 within modified ELR material 1060 may propagate electrical charge at other temperatures.

Figure 17:
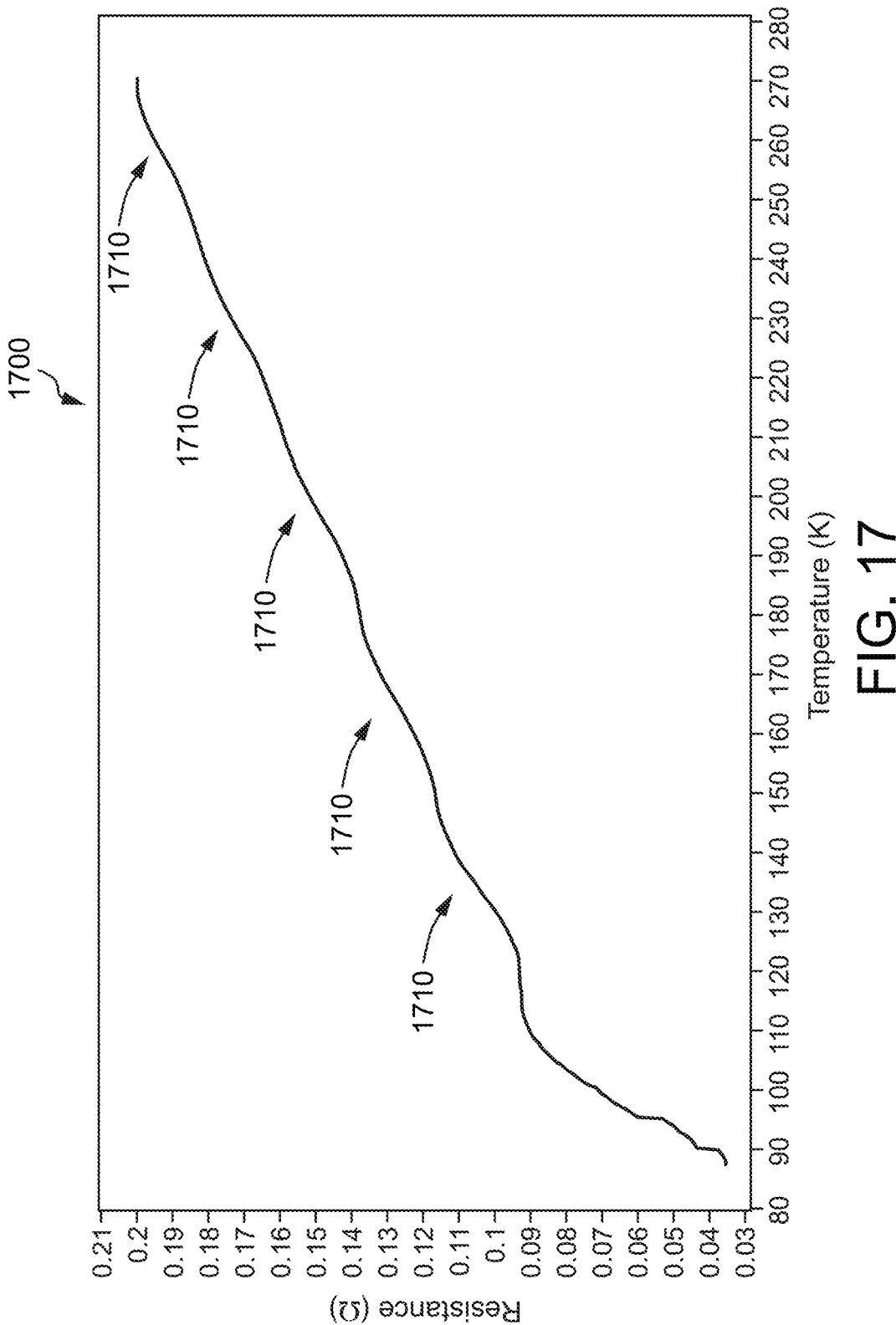
FIG. 17 illustrates test results for a modified ELR material, namely with bismuth as a modifying material and YBCO as an ELR material.

FIG. 17 illustrates test results 1700 including a plot of resistance of modified ELR material 1060 as a function of temperature (in K). For test results 1700, modifying material 1020 corresponds to bismuth and ELR material 360 corresponds to YBCO. Test results 1700 were produced over 5 test runs using a 400 nA current source, a 1024-point FFT was performed, and information from all but the lowest 12 frequencies were eliminated. Test results 1700 demonstrate that various portions of modified ELR material 1060 operate in an ELR state at higher temperatures relative to ELR material 360. Test results 1700 include various discrete steps 1710 in the resistance versus temperature plot, similar to those discussed above with regard to FIGS. 14A-14G. Test results 1700 indicate that certain apertures 310 within modified ELR material 1060 propagate electrical charge at approximately 262 K, 235 K, 200 K, 172 K, and 141 K. Certain apertures 310 within modified ELR material 1060 may propagate electrical charge at other temperatures.

Figure 18:
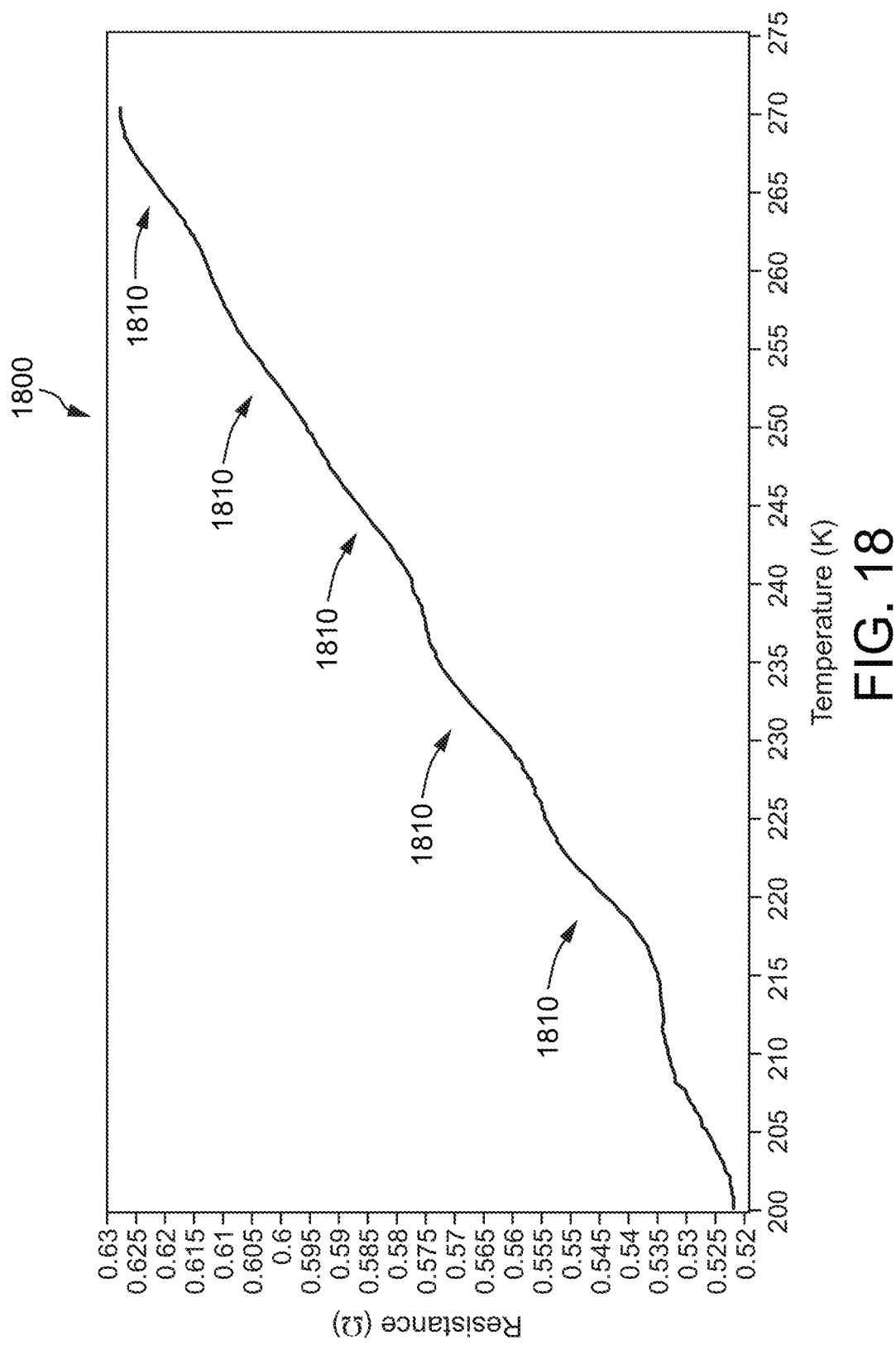
FIG. 18 illustrates test results for a modified ELR material, namely with copper as a modifying material and YBCO as an ELR material.

FIG. 18 illustrates test results 1800 including a plot of resistance of modified ELR material 1060 as a function of temperature (in K). For test results 1800, modifying material 1020 corresponds to copper and ELR material 360 corresponds to YBCO. Test results 1800 were produced over 6 test runs using a 200 nA current source, a 1024-point FFT was performed, and information from all but the lowest 12 frequencies were eliminated. Test results 1800 demonstrate that various portions of modified ELR material 1060 operate in an ELR state at higher temperatures relative to ELR material 360. Test results 1800 include various discrete steps 1810 in the resistance versus temperature plot, similar to those discussed above with regard to FIGS. 14A-14G. Test results 1800 indicate that certain apertures 310 within modified ELR material 1060 propagate electrical charge at approximately 268 K, 256 K, 247 K, 235 K, and 223 K. Certain apertures 310 within modified ELR material 1060 may propagate electrical charge at other temperatures.

Figure 19:
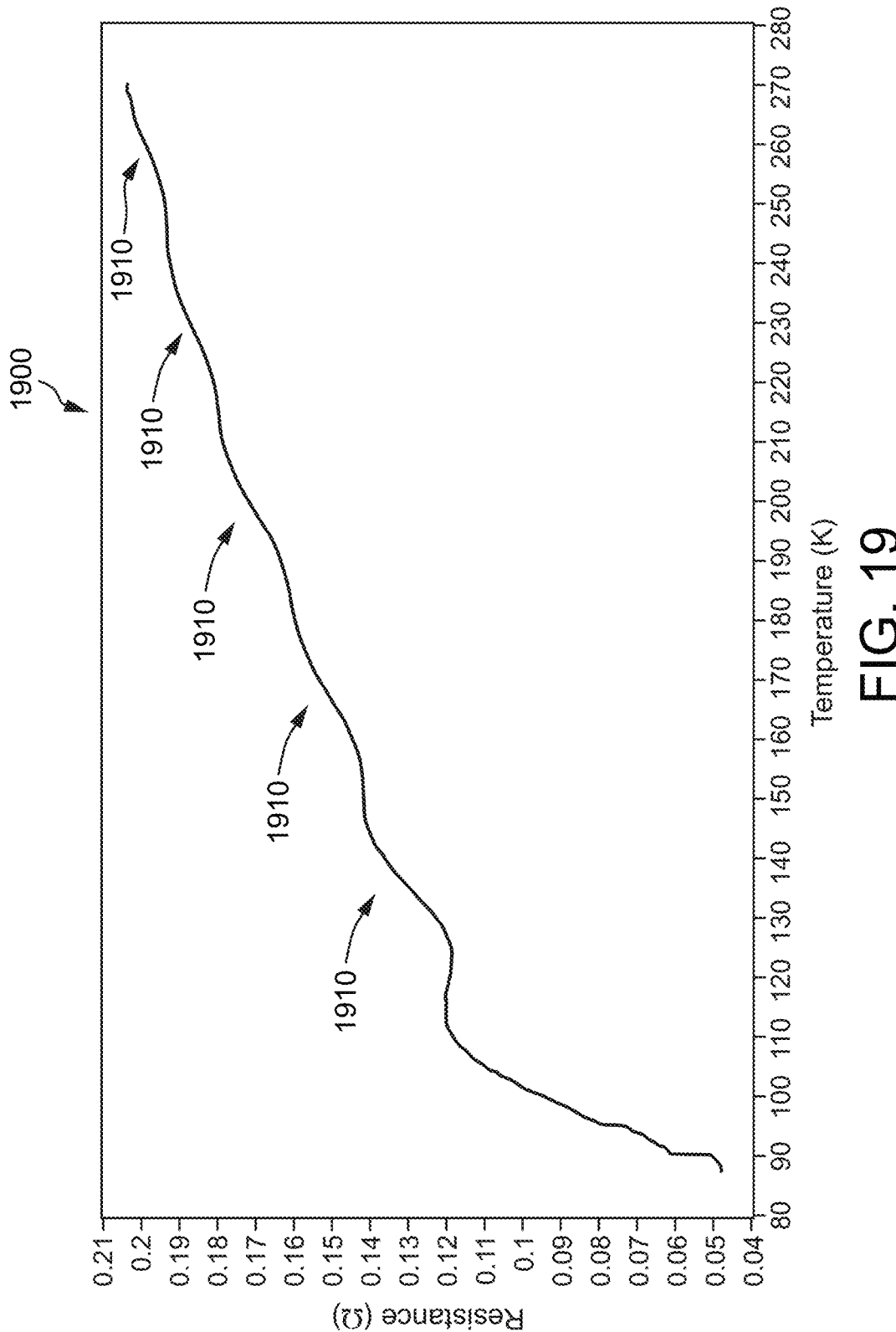
FIG. 19 illustrates test results for a modified ELR material, namely with cobalt as a modifying material and YBCO as an ELR material.

FIG. 19 illustrates test results 1900 including a plot of resistance of modified ELR material 1060 as a function of temperature (in K). For test results 1900, modifying material 1020 corresponds to cobalt and ELR material 360 corresponds to YBCO. Test results 1900 were produced over 11 test runs using a 400 nA current source, a 1024-point FFT was performed, and information from all but the lowest 12 frequencies were eliminated. Test results 1900 demonstrate that various portions of modified ELR material 1060 operate in an ELR state at higher temperatures relative to ELR material 360. Test results 1900 include various discrete steps 1910 in the resistance versus temperature plot, similar to those discussed above with regard to FIGS. 14A-14G. Test results 1900 indicate that certain apertures 310 within modified ELR material 1060 propagate electrical charge at approximately 265 K, 236 K, 205 K, 174 K, and 143 K. Certain apertures 310 within modified ELR material 1060 may propagate electrical charge at other temperatures.

Figure 20:
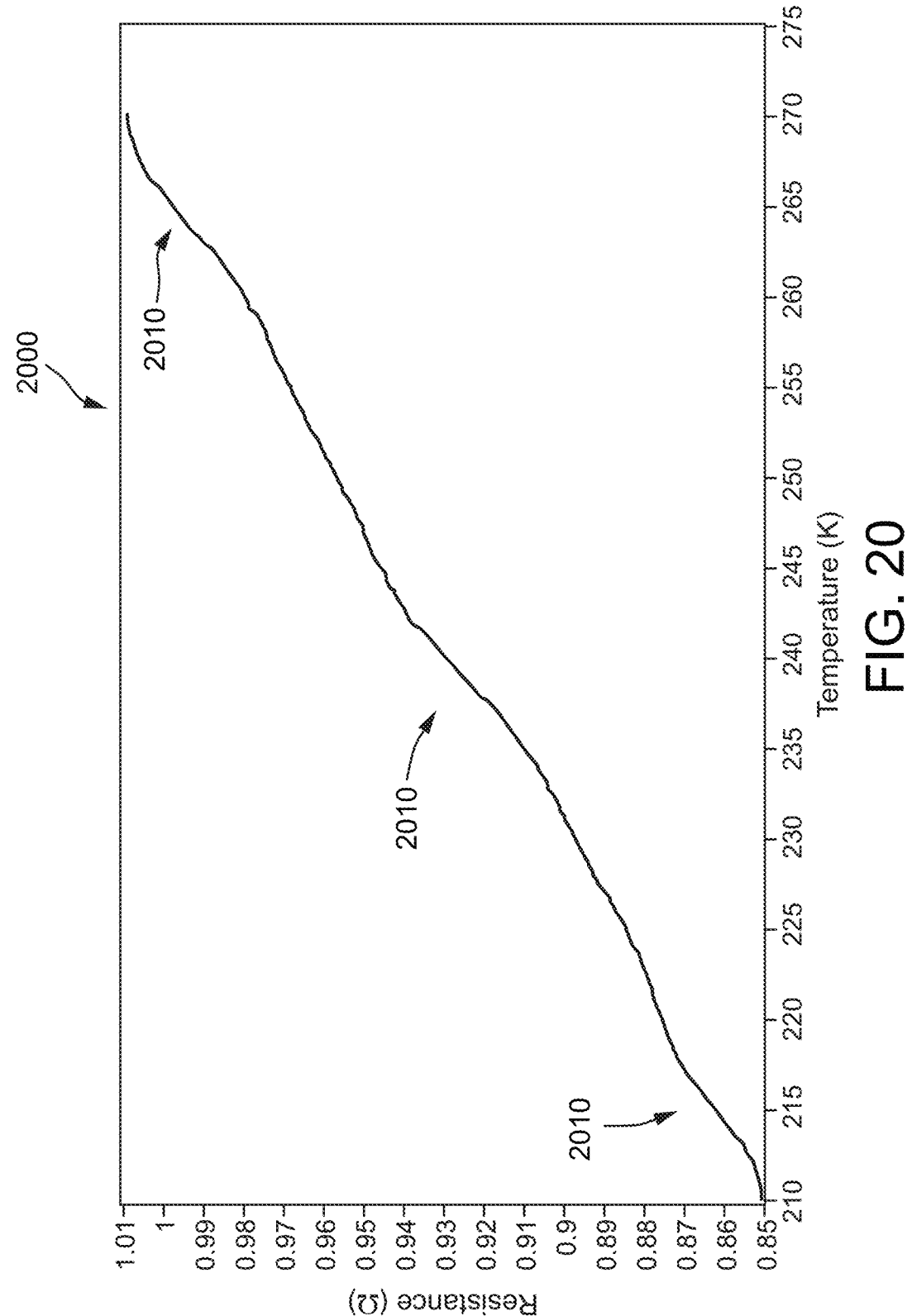
FIG. 20 illustrates test results for a modified ELR material, namely with titanium as a modifying material and YBCO as an ELR material.

FIG. 20 illustrates test results 2000 including a plot of resistance of modified ELR material 1060 as a function of temperature (in K). For test results 2000, modifying material 1020 corresponds to titanium and ELR material 360 corresponds to YBCO. Test results 2000 were produced over 25 test runs using a 100 nA current source, a 512-point FFT was performed, and information from all but the lowest 11 frequencies were eliminated. Test results 2000 demonstrate that various portions of modified ELR material 1060 operate in an ELR state at higher temperatures relative to ELR material 360. Test results 2000 include various discrete steps 2010 in the resistance versus temperature plot, similar to those discussed above with regard to FIGS. 14A-14G. Test results 2000 indicate that certain apertures 310 within modified ELR material 1060 propagate electrical charge at approximately 266 K, 242 K, and 217 K. Certain apertures 310 within modified ELR material 1060 may propagate electrical charge at other temperatures.

Figure 21A:
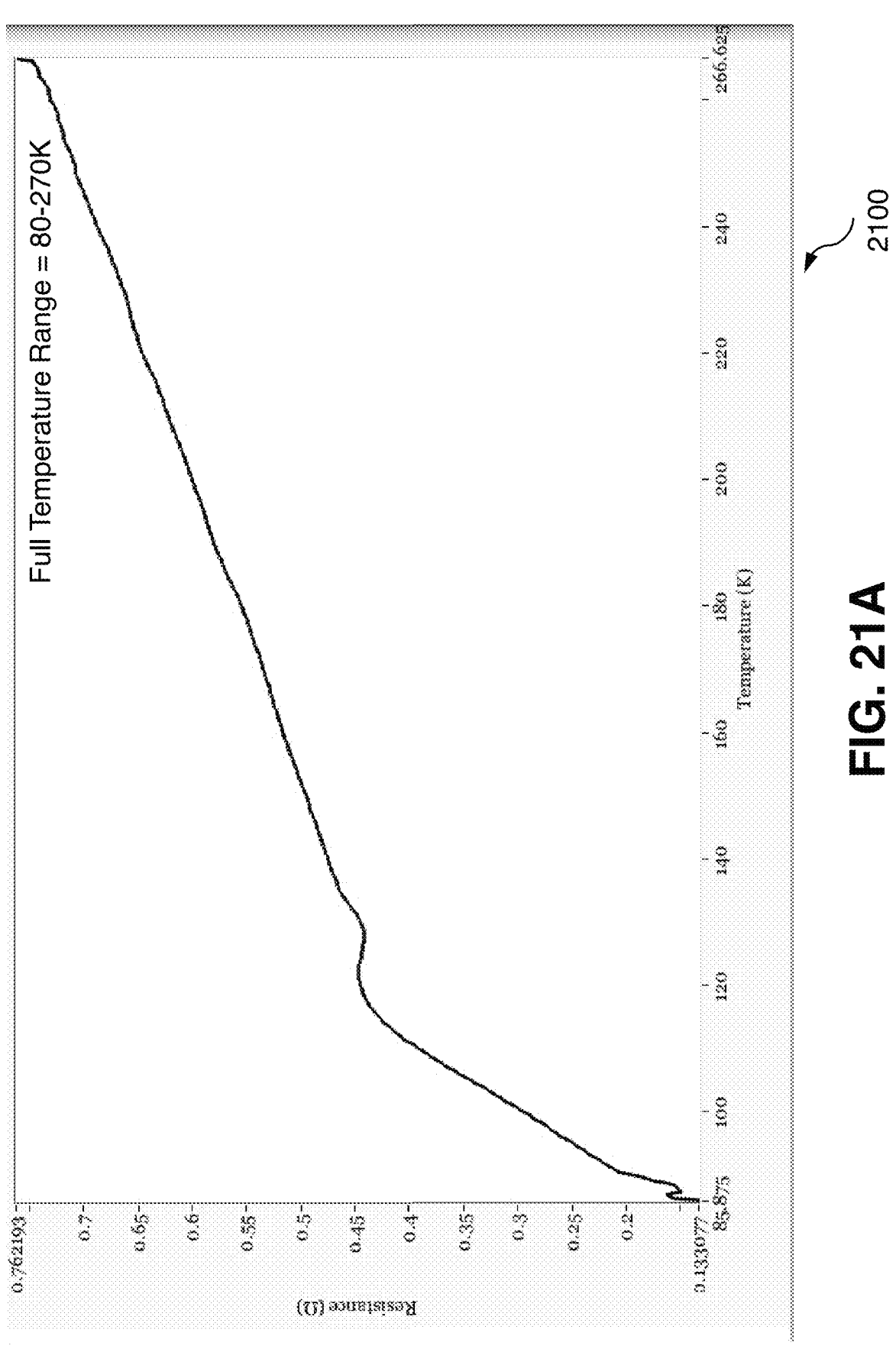
FIGS. 21A-21B illustrate test results for a modified ELR material, namely with chromium as a modifying material and BSCCO as an ELR material.
Figure 21B:
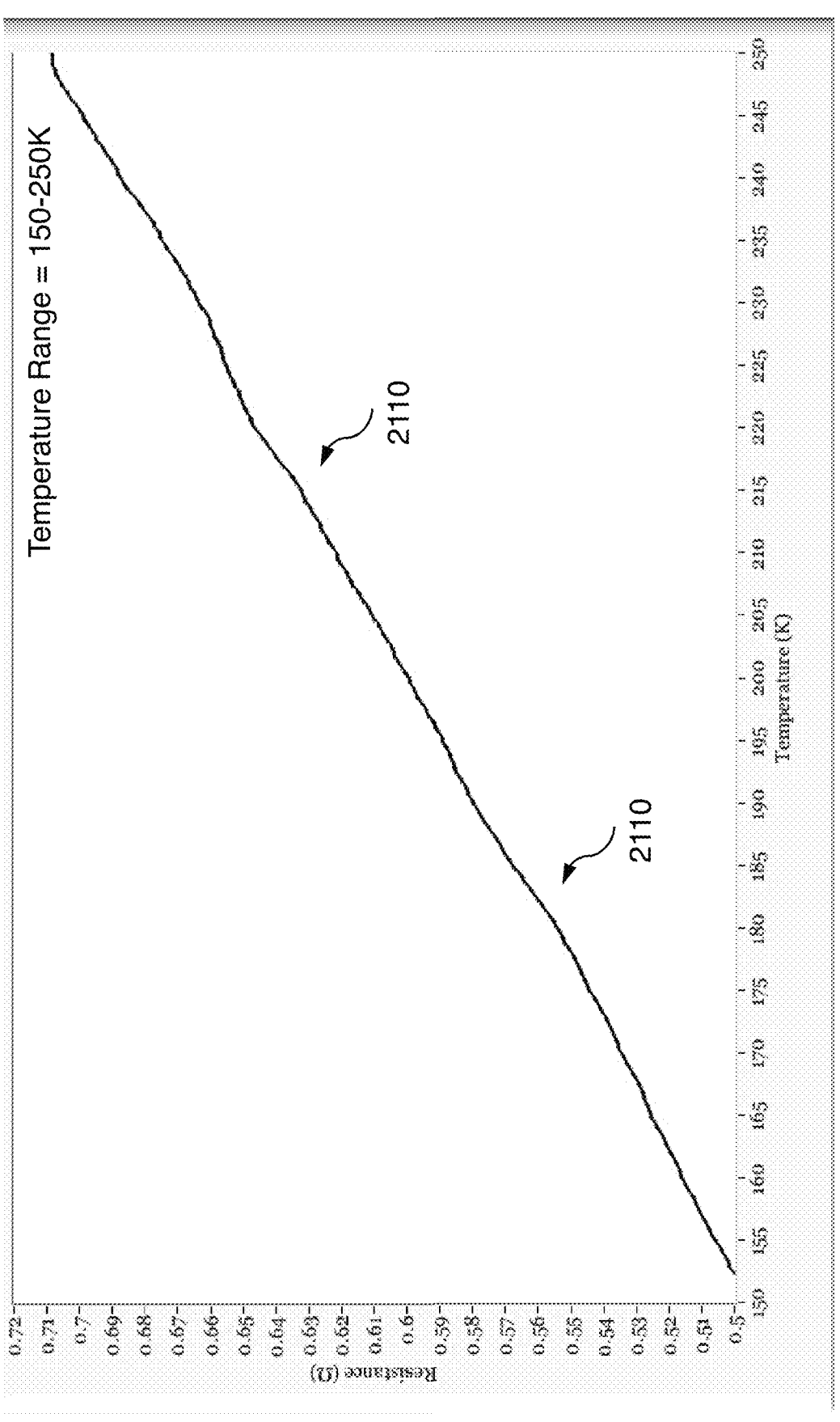

FIG. 21A-21B illustrates test results 2100 including a plot of resistance of modified ELR material 1060 as a function of temperature (in K). For test results 2100, modifying material 1020 corresponds to chromium and ELR material 360 corresponds to BSSCO. FIG. 21A includes test results 2100 over a full range of temperature over which resistance of modified ELR material 1060 was measured, namely 80 K to 270 K. In order to provide further detail, test results 2100 were expanded over a temperature range of 150 K-250 K as illustrated in FIG. 21B. Test results 2100 were gathered in a manner similar to those discussed above with regard to FIGS. 16-20. In particular, test results 2100 were produced over 25 test runs using a 300 nA current source. The data from these test runs was Savitzy-Golay smoothed, using 64 side points and 4th order polynomials. Test results 2100 demonstrate that various portions of modified ELR material 1060 operate in an ELR state at higher temperatures relative to ELR material 360 (here, BSSCO). Test results 2100 include various discrete steps 2110 in the resistance versus temperature plot, similar to those discussed above with regard to FIGS. 14A-14G. Test results 2100 indicate that certain apertures within modified ELR material 1060 propagate electrical charge at approximately 184 K and 214 K. Certain apertures 310 within modified ELR material 1060 may propagate electrical charge at other temperatures.

In other experiments, modifying material 1020 was layered onto a surface of ELR material 360 substantially parallel to the c-plane of crystalline structure 300. These tests results (not otherwise illustrated) demonstrate that layering a surface of ELR material 360 parallel to the c-plane with modifying material 1020 did not produce any discrete steps such as those described above (e.g., discrete steps 1410). These test results indicate that modifying a surface of ELR material 360 that is perpendicular to a direction in which ELR material 360 does not (or tends to not) exhibit the resistance phenomenon does not improve the operating characteristics of the unmodified ELR material. In other words, modifying such surfaces of ELR material 360 may not maintain aperture 310. In accordance with various principles of the invention, modifying material should be layered with surfaces of the ELR material that are parallel to the direction in which ELR material does not (or tends to not) exhibit the resistance phenomenon. More particularly, and for example, with regard to ELR material 360 (illustrated in FIG. 3), modifying material 1020 should be bonded to an "a-c" face or a "b-c" face of crystalline structure 300 (both of which faces are parallel to the c-axis) in ELR material 360 (which tends not to exhibit the resistance phenomenon in the direction of the c-axis) in order to maintain aperture 310.

Figure 22:
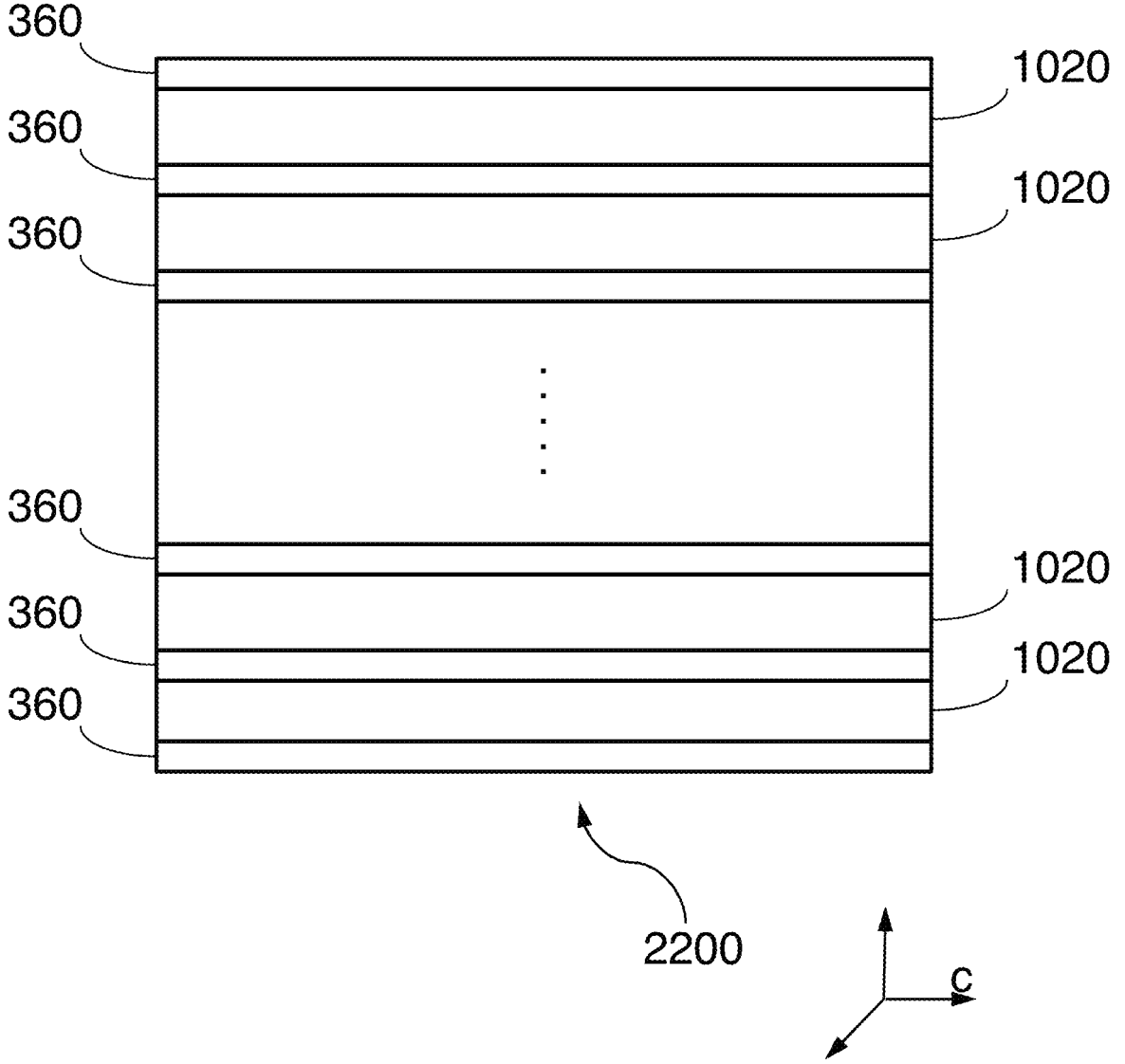
FIG. 22 illustrates an arrangement of an ELR material and a modifying material useful for propagating electrical charge according to various implementations of the invention.

FIG. 22 illustrates an arrangement 2200 including alternating layers of ELR material 360 and a modifying material 1020 useful for propagating additional electrical charge according to various implementations of the invention. Such layers may be deposited onto one another using various deposition techniques. Various techniques may be used to improve alignment of crystalline structures 300 within layers of ELR material 360. Improved alignment of crystalline structures 300 may result in apertures 310 of increased length through crystalline structure 300 which in turn may provide for operation at higher temperatures and/or with increased charge propagating capacity. Arrangement 2200 provides increased numbers of apertures 310 within modified ELR material 1060 at each interface between adjacent layers of modifying material 1020 and ELR material 360. Increased numbers of apertures 310 may increase a charge propagating capacity of arrangement 2200.

In some implementations of the invention, any number of layers may be used. In some implementations of the invention, other ELR materials and/or other modifying materials may be used. In some implementations of the invention, additional layers of other material (e.g., insulators, conductors, or other materials) may be used between paired layers of ELR material 360 and modifying material 1020 to mitigate various effects (e.g., magnetic effects, migration of materials, or other effects) or to enhance the characteristics of the modified ELR material 1060 formed within such paired layers. In some implementations of the invention, not all layers are paired. In other words, arrangement 2200 may have one or more extra (i.e., unpaired) layers of ELR material 360 or one or more extra layers of modifying material 1020.

Figure 23:
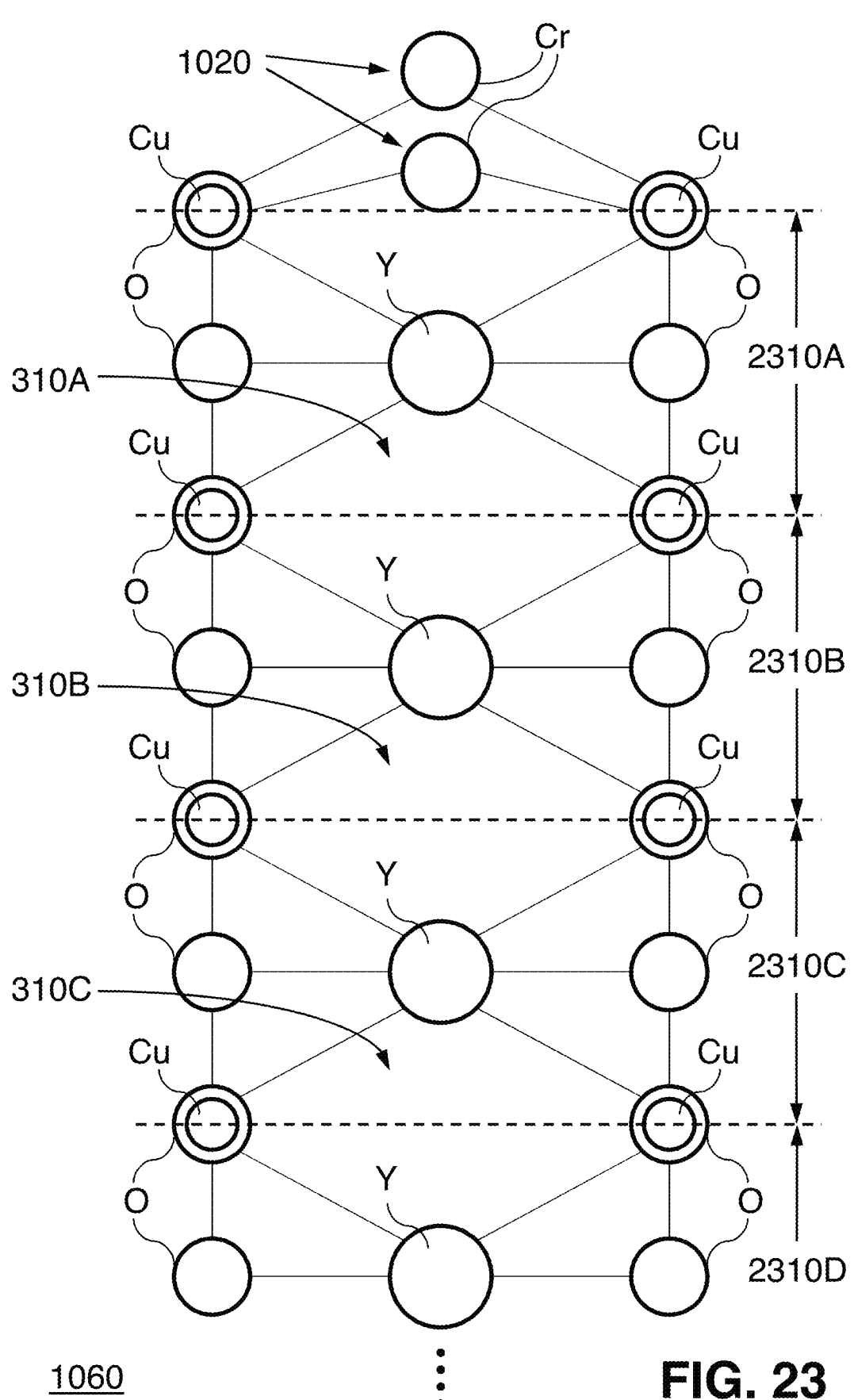
FIG. 23 illustrates multiple layers of crystalline structures of an exemplary surface-modified ELR material according to various implementations of the invention.

FIG. 23 illustrates additional layers 2310 (illustrated as a layer 2310A, a layer 2310B, a layer 2310C, and a layer 2310D) of modified crystalline structure 1010 in modified ELR material 1060 according to various implementations of the invention. As illustrated, modified ELR material 1060 includes various apertures 310 (illustrated as an aperture 310A, an aperture 310B, and an aperture 310C) at different distances into material 1060 from modifying material 1020 that form bonds with atoms of crystalline structure 300 (of FIG. 3). Aperture 310A is nearest modifying material 1020, followed by aperture 310B, which in turn is followed by aperture 310C, etc. In accordance with various implementations of the invention, an impact of modifying material 1020 is greatest with respect to aperture 310A, followed by a lesser impact with respect to aperture 310B, which in turn is followed by a lesser impact with respect to aperture 310C, etc. According to some implementations of the invention, modifying material 1020 should better maintain aperture 310A than either aperture 310B or aperture 310C due to aperture 310A's proximity to modifying material 1020; likewise, modifying material 1020 should better maintain aperture 310B than aperture 310C due to aperture 310B's proximity to modifying material 1020, etc. According to some implementations of the invention, modifying material 1020 should better maintain the cross-section of aperture 310A than the cross-sections of either aperture 310B or aperture 310C due to aperture 310A's proximity to modifying material 1020; likewise, modifying material 1020 should better maintain the cross-section of aperture 310B than the cross-section of aperture 310C due to aperture 310B's proximity to modifying material 1020, etc. According to some implementations of the invention, modifying material 1020 should have a greater impact on a charge propagating capacity of aperture 310A at a particular temperature than on a charge propagating capacity of either aperture 310B or aperture 310C at that particular temperature due to aperture 310A's proximity to modifying material 1020; likewise, modifying material 1020 should have a greater impact on the charge propagating capacity of aperture 310B at a particular temperature than on the charge propagating capacity of aperture 310C at that particular temperature due to aperture 310B's proximity to modifying material 1020, etc. According to some implementations of the invention, modifying material 1020 should enhance the propagation of electrical charge through aperture 310A more than the propagation of electrical charge through either aperture 310B or aperture 310C due to aperture 310A's proximity to modifying material 1020; likewise, modifying material 1020 should enhance the propagation of electrical charge through aperture 310B more than the propagation of electrical charge through aperture 310C due to aperture 310B's proximity to modifying material 1020, etc.

Various test results described above, for example, test results 1400 of FIG. 14, among others, support these aspects of various implementations of the invention, i.e., generally, that the impact of modifying material 1020 on apertures 310 varies in relation to their proximity to one another. In particular, each discrete step 1410 in test results 1400 may correspond to a change in electrical charge carried by modified ELR material 1060 as those apertures 310 in a particular layer 2310 (or more appropriately, those apertures 310 formed between adjacent layers 2310 as illustrated) propagate electrical charge up to such apertures' 310 charge propagating capacity. Those apertures 310 in layers 2310 closer in proximity to modifying material 1020 correspond to discrete steps 1410 at higher temperatures whereas those apertures 310 in layers 2310 further from modifying material 1020 correspond to discrete steps 1410 at lower temperatures. Discrete steps 1410 are "discrete" in the sense that apertures 310 at a given relative distance to modifying material 1020 (i.e., apertures 310A between layers 2310A and 2310B) propagate electrical charge at a particular temperature and quickly reach their maximum charge propagating capacity. Another discrete step 1410 is reached when apertures 310 at an increased distance from modifying material 1020 (i.e., apertures 310B between layers 2310B and 2310C) propagate electrical charge at a lower temperature as a result of the increased distance and hence the lessened impact of modifying material 1020 on those apertures 310. Each discrete step 1410 corresponds to another set of apertures 310 beginning to carry electrical charge based on their distance from modifying material 1020. At some distance, however, modifying material 1020 may have insufficient impact on some apertures 310 to cause them to carry electrical charge at a higher temperature than they otherwise would; hence, such apertures 310 propagate electrical charge at a temperature consistent with that of ELR material 360.

In some implementations of the invention, a distance between modifying material 1020 and apertures 310 is reduced so as to increase impact of modifying material 1020 on more apertures 310. In effect, more apertures 310 should propagate electrical charge at discrete steps 1410 associated with higher temperatures. For example, in arrangement 2200 of FIG. 22 and in accordance with various implementations of the invention, layers of ELR material 360 may be made to be only a few unit cells thick in order to reduce the distance between apertures 310 in ELR material 360 and modifying material 1020. Reducing this distance should increase the number of apertures 310 impacted by modifying material 1020 at a given temperature. Reducing this distance also increases the number of alternating layers of ELR material 360 in a given overall thickness of arrangement 2200 thereby increasing an overall charge propagating capacity of arrangement 2200.

Figure 24:
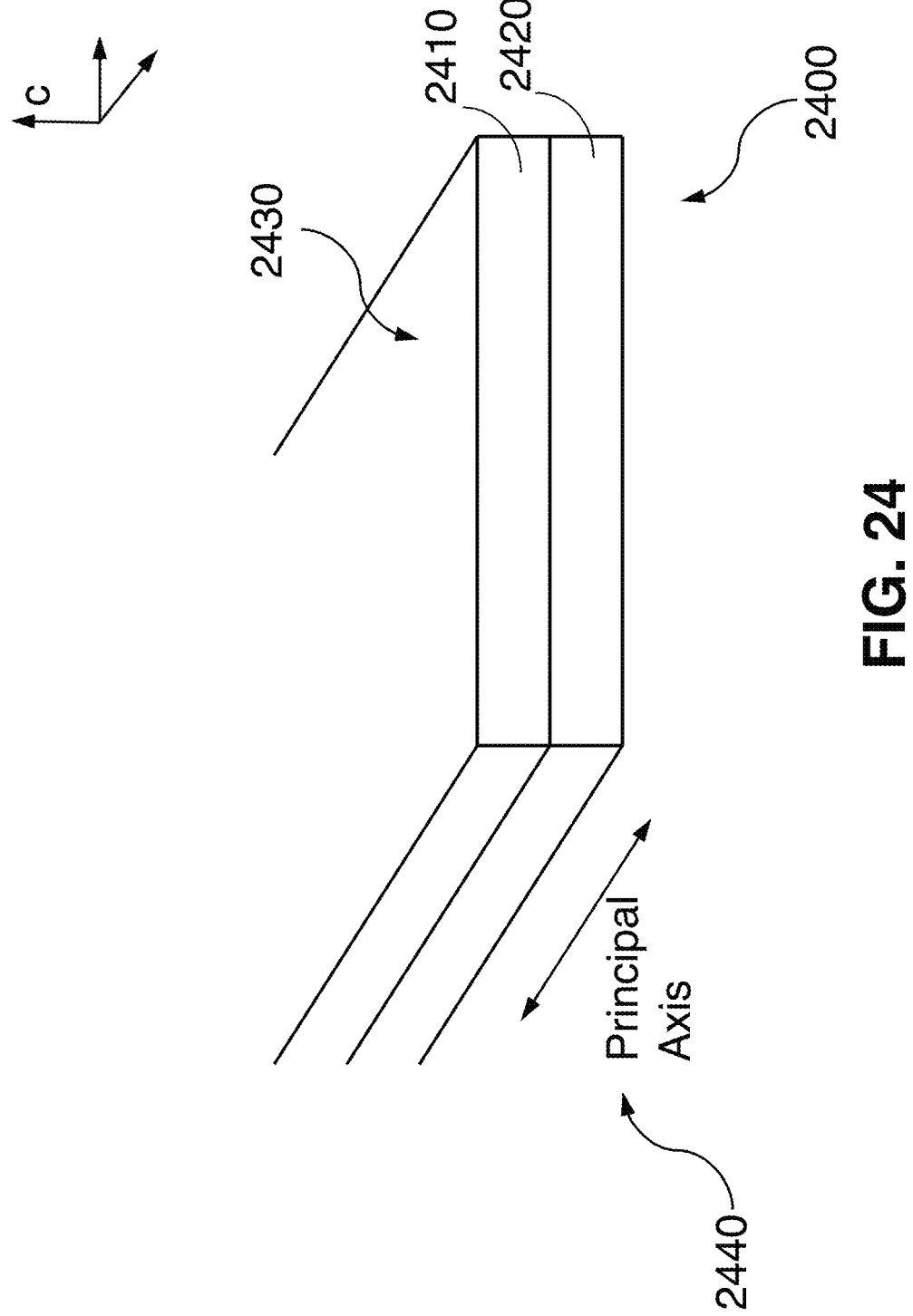
FIG. 24 illustrates a c-film of ELR material according to various implementations of the invention.

FIG. 24 illustrates a film 2400 of an ELR material 2410 formed on a substrate 2420, although, substrate 2420 may not be necessary in various implementations of the invention. In various implementations of the invention, film 2400 may be formed into a tape having a length, for example, greater than 10 cm, 1 m, 1 km or more. Such tapes may be useful, for example, as ELR conductors or ELR wires. As would be appreciated, while various implementations of the invention are described in reference to ELR films, such implementations apply to ELR tapes as well.

For purposes of this description and as illustrated in FIG. 24, film 2400 has a primary surface 2430 and a principal axis 2440. Principal axis 2440 corresponds to a axis extending along a length of film 2400 (as opposed to a width of film 2400 or a thickness of film 2400). Principal axis 2440 corresponds to a primary direction in which electrical charge flows through film 2400. Primary surface 2430 corresponds to the predominant surface of film 2400 as illustrated in FIG. 24, and corresponds to the surface bound by the width and the length of film 2400. It should be appreciated that films 2400 may have various lengths, widths, and/or thicknesses without departing from the scope of the invention.

In some implementations of the invention, during the fabrication of film 2400, the crystalline structures of ELR material 2410 may be oriented such that their c-axis is substantially perpendicular to primary surface 2430 of film 2400 and either the a-axis or the b-axis of their respective crystalline structures is substantially parallel to principal axis 2440. Hence, as illustrated in FIG. 24, the c-axis is referenced by name and the a-axis and the b-axis are not specifically labeled, reflecting their interchangeability for purposes of describing various implementations of the invention. In some fabrication processes of film 2400, the crystalline structures of ELR material may be oriented such that any given line within the c-plane may be substantially parallel with principal axis 2440.

For purposes of this description, films 2400 having the c-axis of their respective crystalline structures oriented substantially perpendicular to primary surface 2430 (including film 2400 depicted in FIG. 24) are referred to as "c-films" (i.e., c-film 2400). C-film 2400, with ELR material 2410 comprised of YBCO, is commercially available from, for example, American Superconductors™ (e.g., 344 Superconductor-Type 348C) or Theva Dünnschichttechnik GmbH (e.g., HTS coated conductors).

In some implementations of the invention, substrate 2420 may include a substrate material including, but not limited to, MgO, STO, LSGO, a polycrystalline material such as a metal or a ceramic, an inert oxide material, a cubic oxide material, a rare earth oxide material, or other substrate material as would be appreciated.

According to various implementations of the invention (and as described in further detail below), a modifying material 1020 is layered onto an appropriate surface of ELR material 2410, where the appropriate surface of ELR material 2410 corresponds to any surface not substantially perpendicular to the c-axis of the crystalline structure of ELR material 2410. In other words, the appropriate surface of ELR material 2410 may correspond to any surface that is not substantially parallel to the primary surface 2430. In some implementations of the invention, the appropriate surface of ELR material 2410 may correspond to any surface that is substantially parallel to the c-axis of the crystalline structure of ELR material 2410. In some implementations of the invention, the appropriate surface of ELR material 2410 may correspond to any surface that is not substantially perpendicular to the c-axis of the crystalline structure of ELR material 2410. In order to modify an appropriate surface of c-film 2400 (whose primary surface 2430 is substantially perpendicular to the c-axis of the crystalline structure of ELR material 2410), the appropriate surface of ELR material 2410 may be formed on or within c-film 2400. In some implementations of the invention, primary surface 2430 may be processed to expose appropriate surface(s) of ELR material 2410 on or within c-film 2400 on which to layer modifying material. In some implementations of the invention, primary surface 2430 may be processed to expose one or more apertures 210 of ELR material 2410 on or within c-film 2400 on which to layer modifying material. It should be appreciated, that in various implementations of the invention, modifying material may be layered onto primary surface 2430 in addition to the appropriate surfaces referenced above.

Processing of primary surface 2430 of c-film 2400 to expose appropriate surfaces and/or apertures 210 of ELR material 2410 may comprise various patterning techniques, including various wet processes or dry processes. Various wet processes may include lift-off, chemical etching, or other processes, any of which may involve the use of chemicals and which may expose various other surfaces within c-film 2400. Various dry processes may include ion or electron bream irradiation, laser direct-writing, laser ablation or laser reactive patterning or other processes which may expose various appropriate surfaces and/or apertures 210 of ELR material 2410 within c-film 2400.

Figure 25:
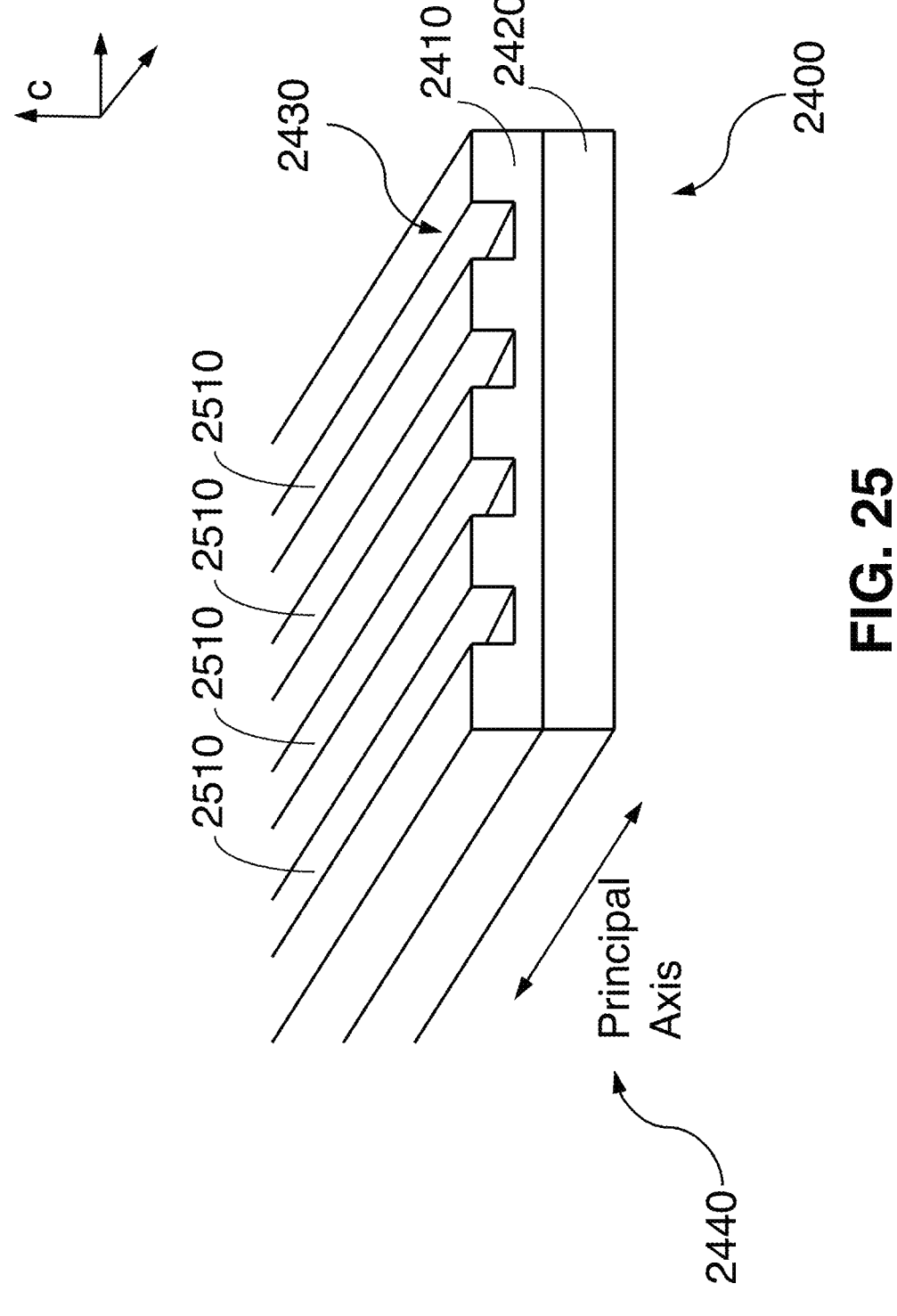
FIG. 25 illustrates a c-film with appropriate surfaces of ELR material according to various implementations of the invention.

As illustrated in FIG. 25, primary surface 2430 of c-film 2400 may be processed to expose an appropriate surface within c-film 2400. For example, c-film 2400 may be processed to expose a face within c-film 2400 substantially parallel to the b-plane of crystalline structure 100 or a face within c-film 2400 substantially parallel to the a-plane of crystalline structure 100. More generally, in some implementations of the invention, primary surface 2430 of c-film 2400 may be processed to expose an appropriate surface within c-film 2400 corresponding to an a/b-c face (i.e., a face substantially parallel to ab-plane). In some implementations of the invention, primary surface 2430 of c-film may be processed to expose any face within c-film 2400 that is not substantially parallel with primary surface 2430. In some implementations of the invention, primary surface 2430 of c-film may be processed to expose any face within c-film 2400 that is not substantially parallel with primary surface 2430 and also substantially parallel with principal axis 2440. Any of these faces, including combinations of these faces, may correspond to appropriate surfaces of ELR material 2410 on or within c-film 2400. According to various implementations of the invention, appropriate surfaces of ELR material 2410 provide access to or otherwise "expose" apertures 210 in ELR material 2410 for purposes of maintaining such apertures 210.

Figure 26:
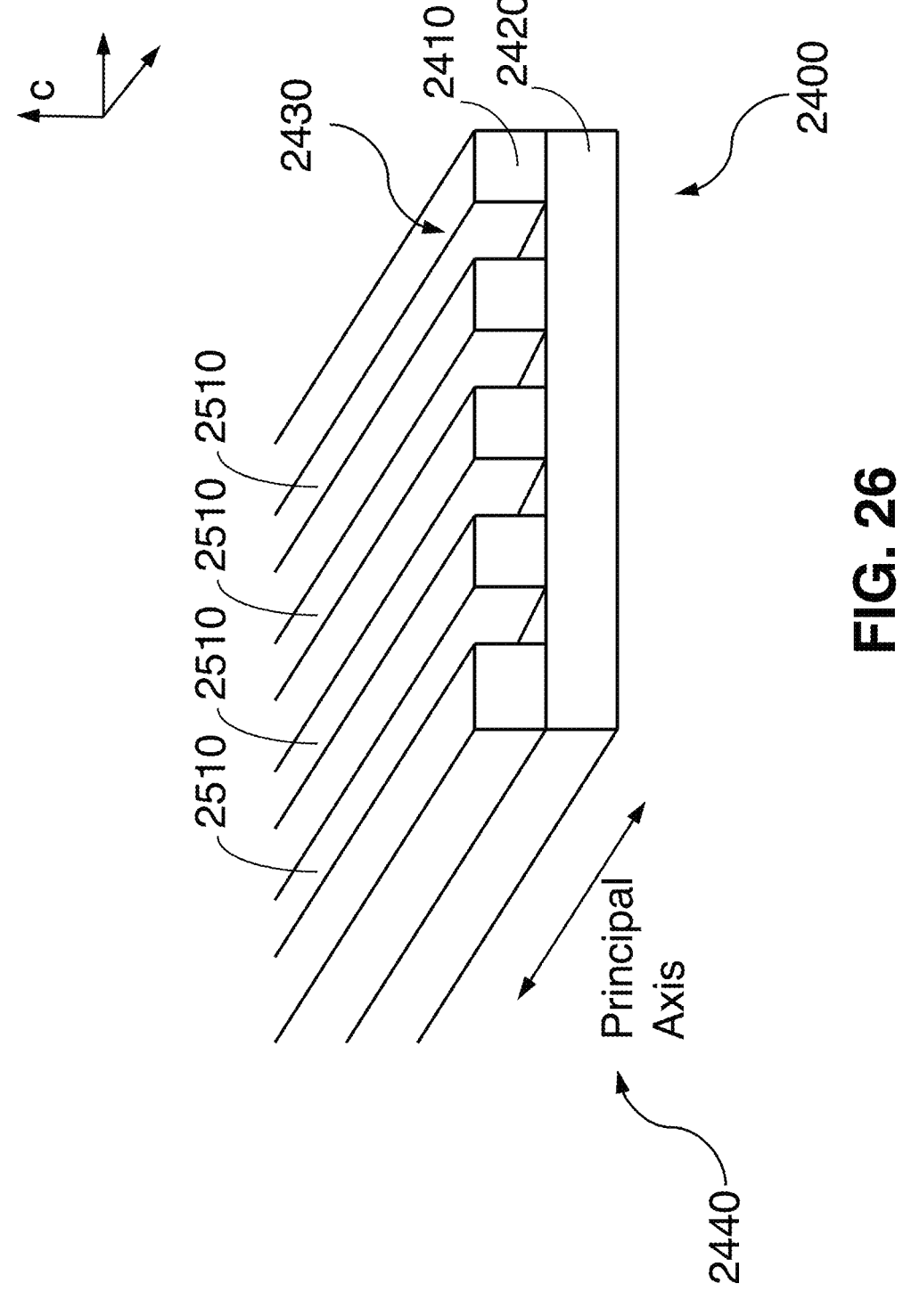
FIG. 26 illustrates a c-film with appropriate surfaces of ELR material according to various implementations of the invention.

In some implementations of the invention, as illustrated in FIG. 25, primary surface 2430 is processed to form one or more grooves 2510 in primary surface 2430. Grooves 2510 include one or more appropriate surfaces (i.e., surfaces other than one substantially parallel to primary surface 2430) on which to deposit modifying material. While grooves 2510 are illustrated in FIG. 25 as having a cross section substantially rectangular in shape, other shapes of cross sections may be used as would be appreciated. In some implementations of the invention, the width of grooves 2510 may be greater than 10 nm. In some implementations of the invention and as illustrated in FIG. 25, the depth of grooves 2510 may be less than a full thickness of ELR material 2410 of c-film 2400. In some implementations of the invention and as illustrated in FIG. 26, the depth of grooves 2510 may be substantially equal to the thickness of ELR material 2410 of c-film 2400. In some implementations of the invention, the depth of grooves 2510 may extend through ELR material 2410 of c-film 2400 and into substrate 2420 (not otherwise illustrated). In some implementations of the invention, the depth of grooves 2510 may correspond to a thickness of one or more units of ELR material 2410 (not otherwise illustrated). Grooves 2510 may be formed in primary surface 2430 using various techniques, such as, but not limited to, laser etching, or other techniques.

In some implementations of the invention, the length of grooves 2510 may correspond to the full length of c-film 2400. In some implementations of the inventions, grooves 2510 are substantially parallel to one another and to principal axis 2440. In some implementations of the invention, grooves 2510 may take on various configurations and/or arrangements in accordance with the various aspects of the invention. For example, grooves 2510 may extend in any manner and/or direction and may include lines, curves and/or other geometric shapes in cross-section with varying sizes and/or shapes along its extent.

While various aspects of the invention are described as forming grooves 2510 within primary surface 2430, it will be appreciated that bumps, angles, or protrusions that include appropriate surfaces of ELR material 2410 may be formed on substrate 2420 to accomplish similar geometries.

According to various implementations of the invention, c-film 2400 may be modified to form various modified c-films. For example, referring to FIG. 27, a modifying material 2720 (i.e., modifying material 1020, modifying material 1020) may be layered onto primary surface 2430 and into grooves 2510 formed within primary surface 2430 of an unmodified c-film (e.g., c-film 2400) and therefore onto various appropriate surfaces 2710 to form a modified c-film 2700. Appropriate surfaces 2710 may include any appropriate surfaces discussed above. While appropriate surfaces 2710 are illustrated in FIG. 27 as being perpendicular to primary surface 2430, this is not necessary as would be appreciated from this description.

Figure 27:
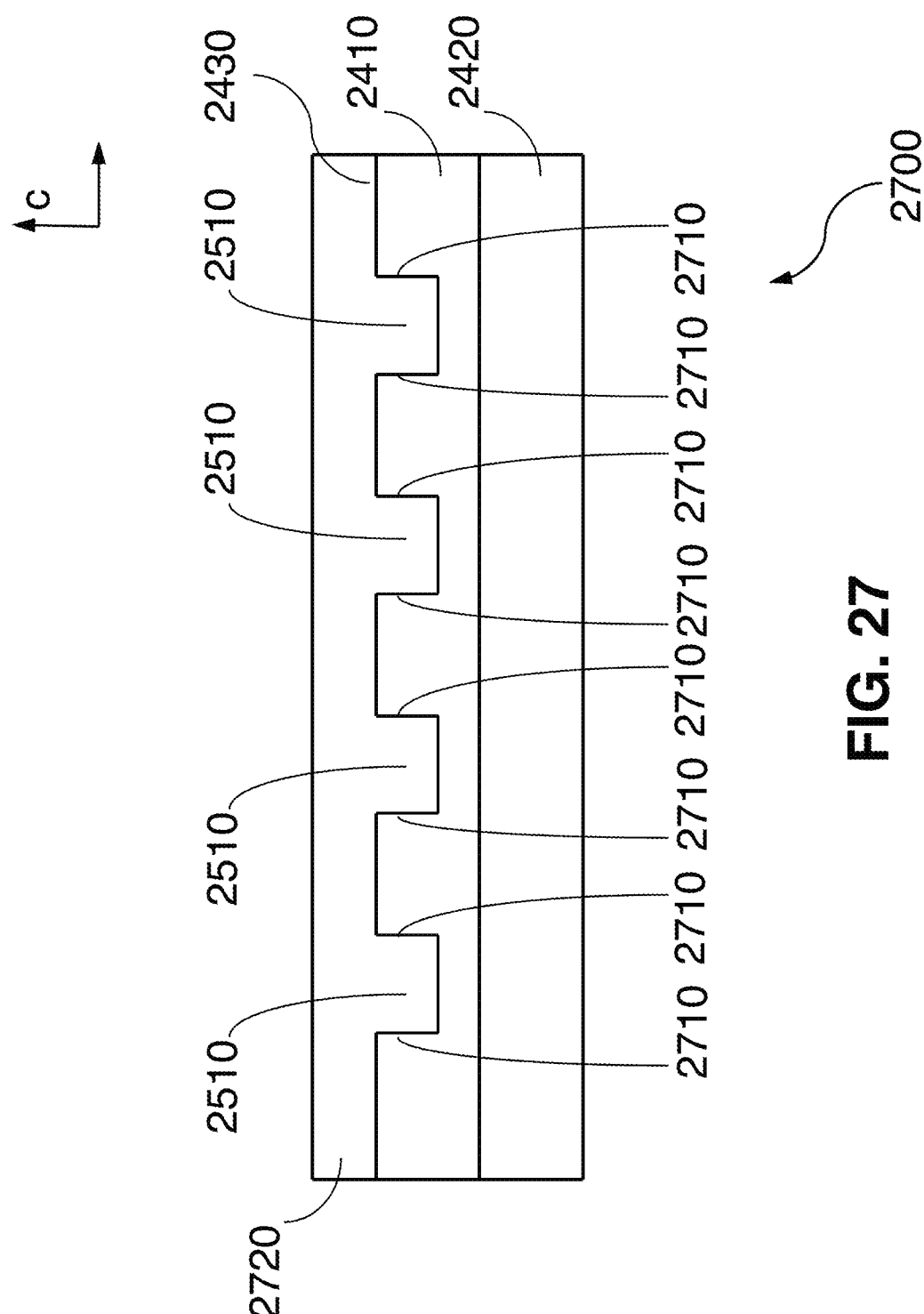
FIG. 27 illustrates a modifying material layered onto appropriate surfaces of ELR material according to various implementations of the invention.
Figure 28:
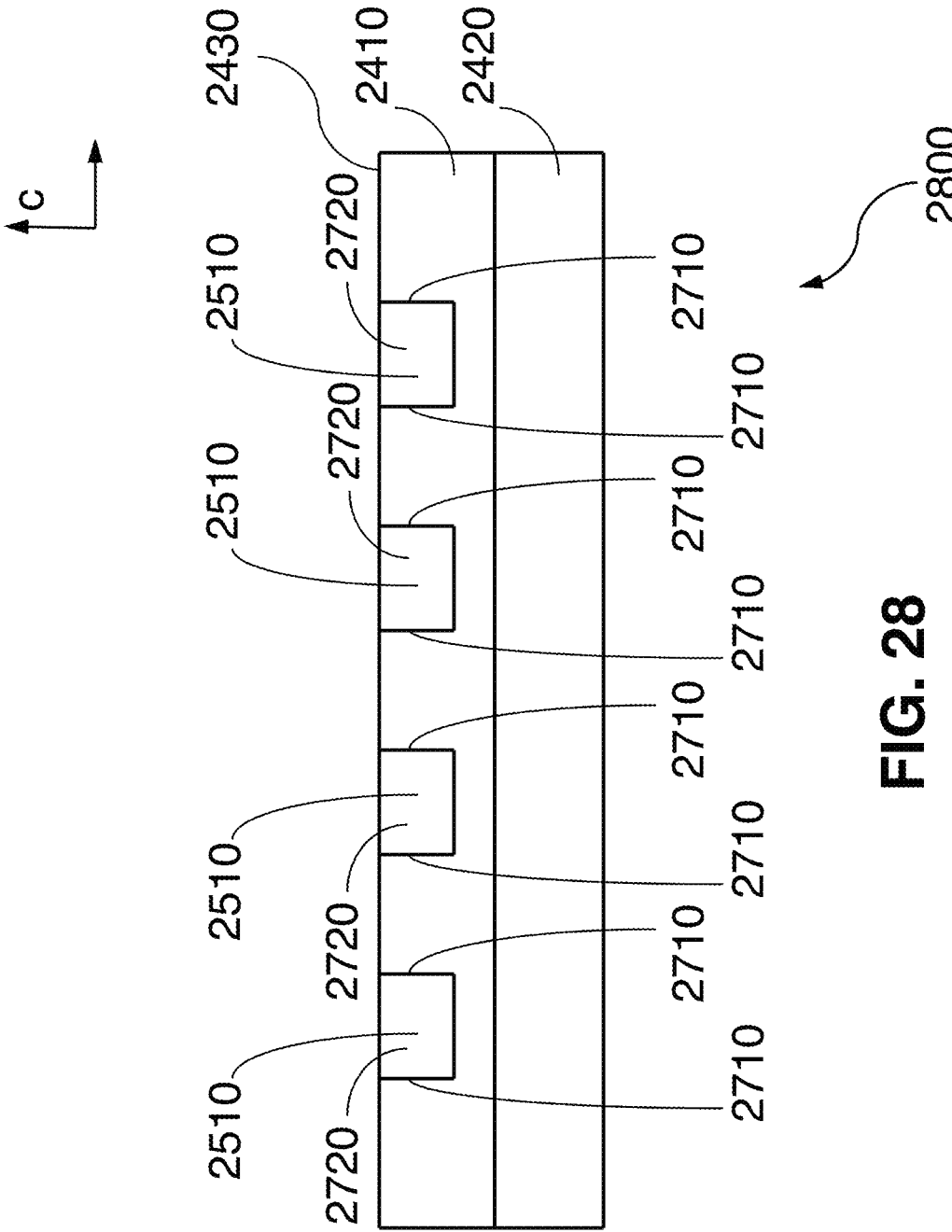
FIG. 28 illustrates a modifying material layered onto appropriate surfaces of ELR material according to various implementations of the invention.

In some implementations of the invention, modifying material 2720 may be layered onto primary surface 2430 and into grooves 2510 as illustrated in FIG. 27. In some implementations, such as illustrated in FIG. 28, modifying material 2720 may be removed from primary surface 2430 to form modified c-film 2800 using various techniques such that modifying material 2720 remains only in grooves 2510 (e.g., various polishing techniques). In some implementations, modified c-film 2800 may be accomplished by layering modifying material 2720 only in grooves 2510. In other words, in some implementations, modifying material 2720 may be layered only into grooves 2510 and/or onto appropriate surfaces 2710, without layering modifying material 2720 onto primary surface 2430 or may be layered such that modifying material 2720 does not bond or otherwise adhere to primary surface 2430 (e.g., using various masking techniques). In some implementations of the invention, various selective deposition techniques may be employed to layer modifying material 2720 directly onto appropriate surfaces 2710.

The thickness of modifying material 2720 in grooves 2510 and/or on primary surface 2430 may vary according to various implementations of the invention. In some implementations of the invention, a single unit layer of modifying material 2720 (i.e., a layer having a thickness substantially equal to a single unit of modifying material 2720) may be layered onto appropriate surfaces 2710 of grooves 2510 and/or on primary surface 2430. In some implementations of the invention, two or more unit layers of modifying material 2720 may be layered into onto appropriate surfaces 2710 of grooves 2510 and/or on primary surface 2430.

Modified c-films 2700, 2800 (i.e., c-film 2400 modified with modifying material 2720) in accordance with various implementations of the invention may be useful for achieving one or more improved operational characteristics over those of unmodified c-film 2400.

Figure 29:
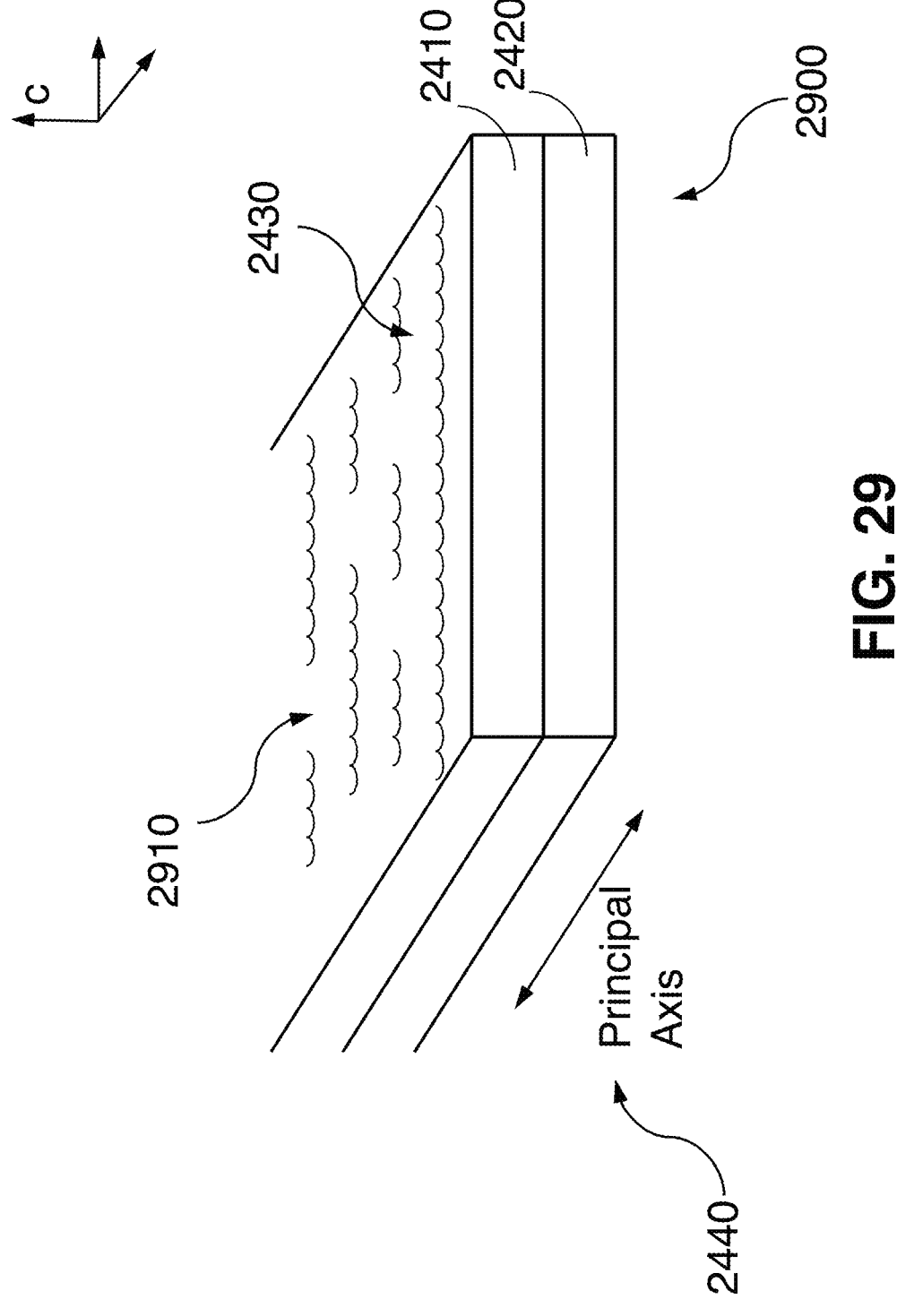
FIG. 29 illustrates a c-film with an etched surface including appropriate surfaces of ELR material according to various implementations of the invention.

As illustrated in FIG. 29, in some implementations of the invention, primary surface 2430 of unmodified c-film 2400 may be modified, via a chemical etch, to expose or otherwise increase an area of appropriate surfaces 2710 available on primary surface 2430. In some implementations of the invention, one manner of characterizing an increased area of appropriate surfaces 2710 within primary surface 2430 may be based on the root mean square (RMS) surface roughness of primary surface 2430 of c-film 2400. In some implementations of the invention, as a result of chemical etching, primary surface 2430 of c-film 2400 may include an etched surface 2910 having a surface roughness in a range of about 1 nm to about 50 nm. RMS surface roughness may be determined using, for example, Atomic Force Microscopy (AFM), Scanning Tunneling Microscopy (STM), or SEM and may be based on a statistical mean of an R-range, wherein the R-range may be a range of the radius (r) of a grain size as would be appreciated. After the chemical etch, an etched surface 2910 of c-film 2900 may correspond to appropriate surface 2710 of ELR material 2410.

Figure 30:
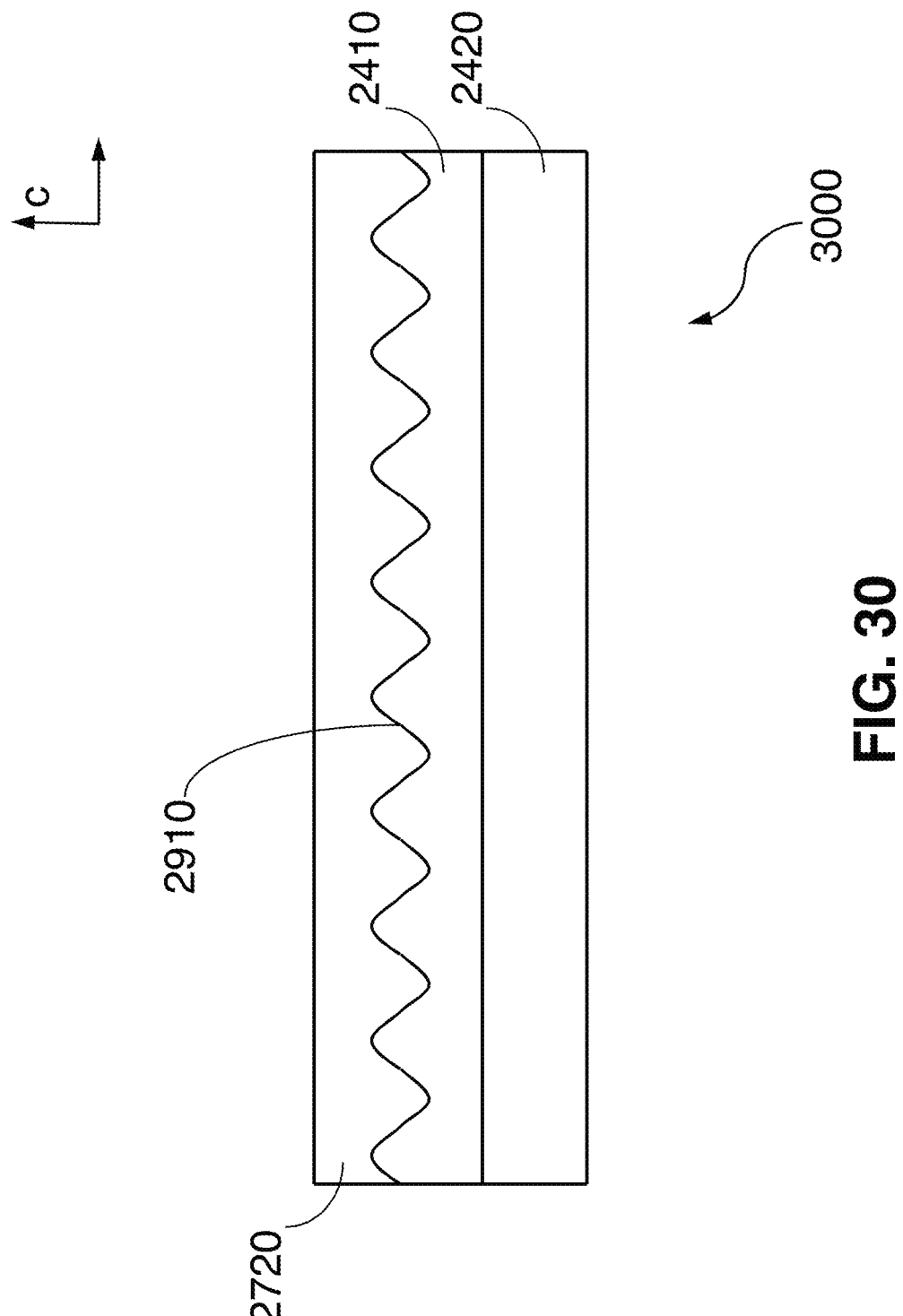
FIG. 30 illustrates a modifying material layered onto an etched surface of a c-film with appropriate surfaces of ELR material according to various implementations of the invention.

As illustrated in FIG. 30, after the chemical etch, modifying material 2720 may be layered on to etched surface 2910 of c-film 2900 to form a modified c-film 3000. Modifying material 2720 may cover substantially all of surface 2910 and the thickness of modifying material 2720 may vary in accordance with various implementations of the invention. In some implementations of the invention, a single unit layer of modifying material 2720 may be layered onto etched surface 2910. In some implementations of the invention, two or more unit layers of modifying material 2720 may be layered onto etched surface 2910.

Figure 31:
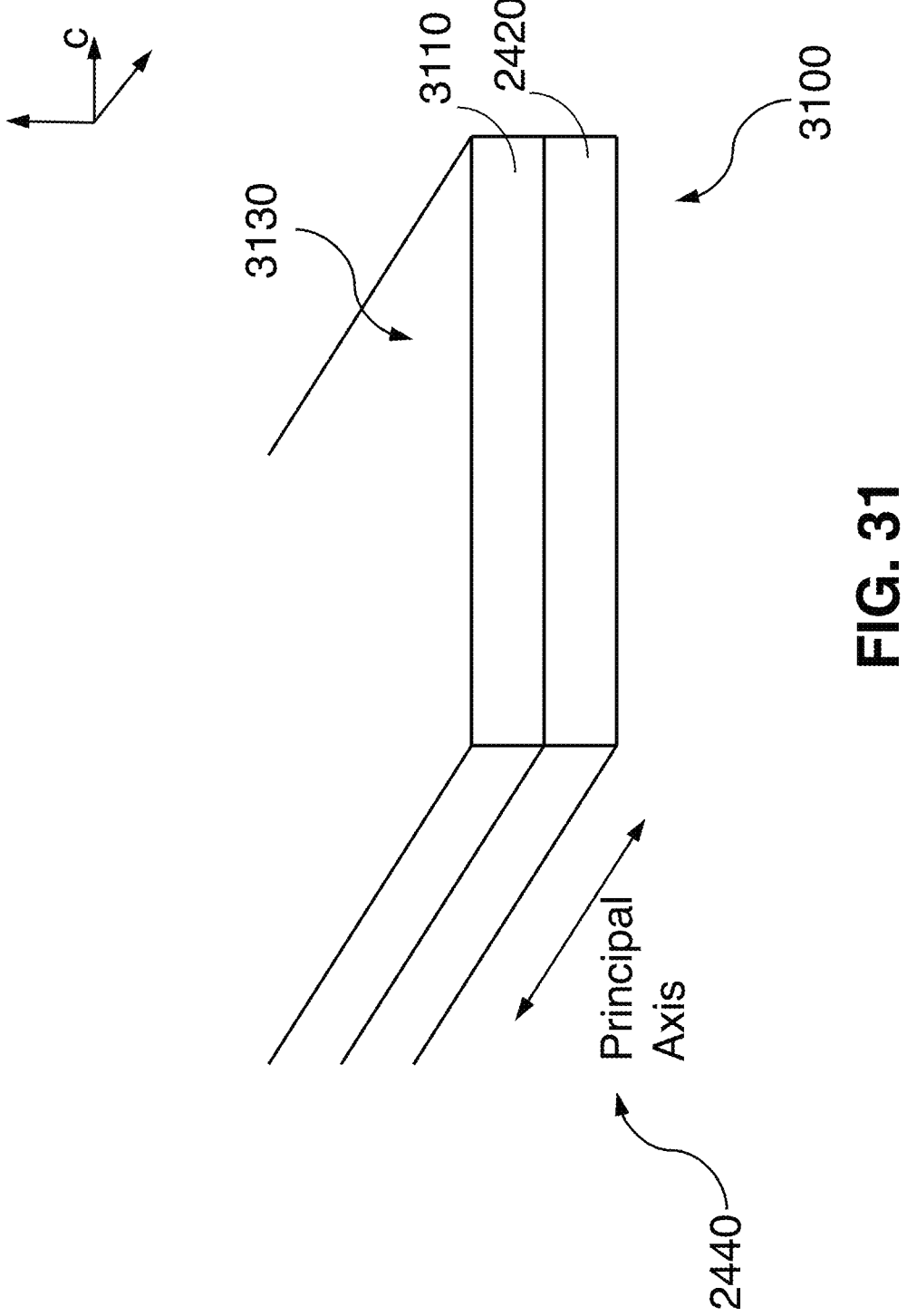
FIG. 31 illustrates an a-b film, including an optional substrate, with appropriate surfaces of ELR material according to various implementations of the invention.

In some implementations of the invention, films having orientations of crystalline structure of ELR material other than that of c-film 2400 may be used. For example, in reference to FIG. 31, and according to various implementations of the invention, instead of the c-axis oriented perpendicular to primary surface 2430 as with c-film 2400, a film 3100 may have the c-axis oriented perpendicular to the principal axis 2440 and a b-axis of ELR material 3110 oriented perpendicular to primary surface 2430. Similarly, a film 3100 may have the c-axis oriented perpendicular to the principal axis 2440 and an a-axis of ELR material 3110 oriented perpendicular to primary surface 2430. In some implementations of the invention, film 3100 may have the c-axis oriented perpendicular to the principal axis 2440 and any line parallel to the c-plane oriented along principal axis 2440. As illustrated in FIG. 31, in these implementations of the invention, film 3100 includes ELR material 3110 with the c-axis of its crystalline structure oriented perpendicular to principal axis 2440 and parallel to a primary surface 3130 and are generally referred to herein as a-b films 3100. While FIG. 31 illustrates the other two axes of the crystalline structure in a particular orientation, such orientation is not necessary as would be appreciated. As illustrated, a-b films 3100 may include an optional substrate 2420 (as with c-films 2400).

In some implementations of the invention, a-b film 3100 is an a-film, having the c-axis of the crystalline structure of ELR material 3110 oriented as illustrated in FIG. 31 and the a-axis perpendicular to primary surface 3130. Such a-films may be formed via various techniques including those described at Selvamanickam, V., et al., "High Current Y—Ba—Cu—O Coated Conductor using Metal Organic Chemical Vapor Deposition and Ion Beam Assisted Deposition," Proceedings of the 2000 Applied Superconductivity Conference, Virginia Beach, Virginia, Sep. 17-22, 2000, which is incorporated herein by reference in its entirety. In some implementations, a-films may be grown on substrates 2420 formed of the following materials: LGSO, LaSrAlO4, NdCaAlO4, Nd2CuO4, or CaNdAlO4. Other substrate materials may be used as would be appreciated.

In some implementations of the invention, a-b film 3100 is a b-film, having the c-axis of the crystalline structure of ELR material 3110 oriented as illustrated in FIG. 31 and the b-axis perpendicular to primary surface 3130.

Figure 32:
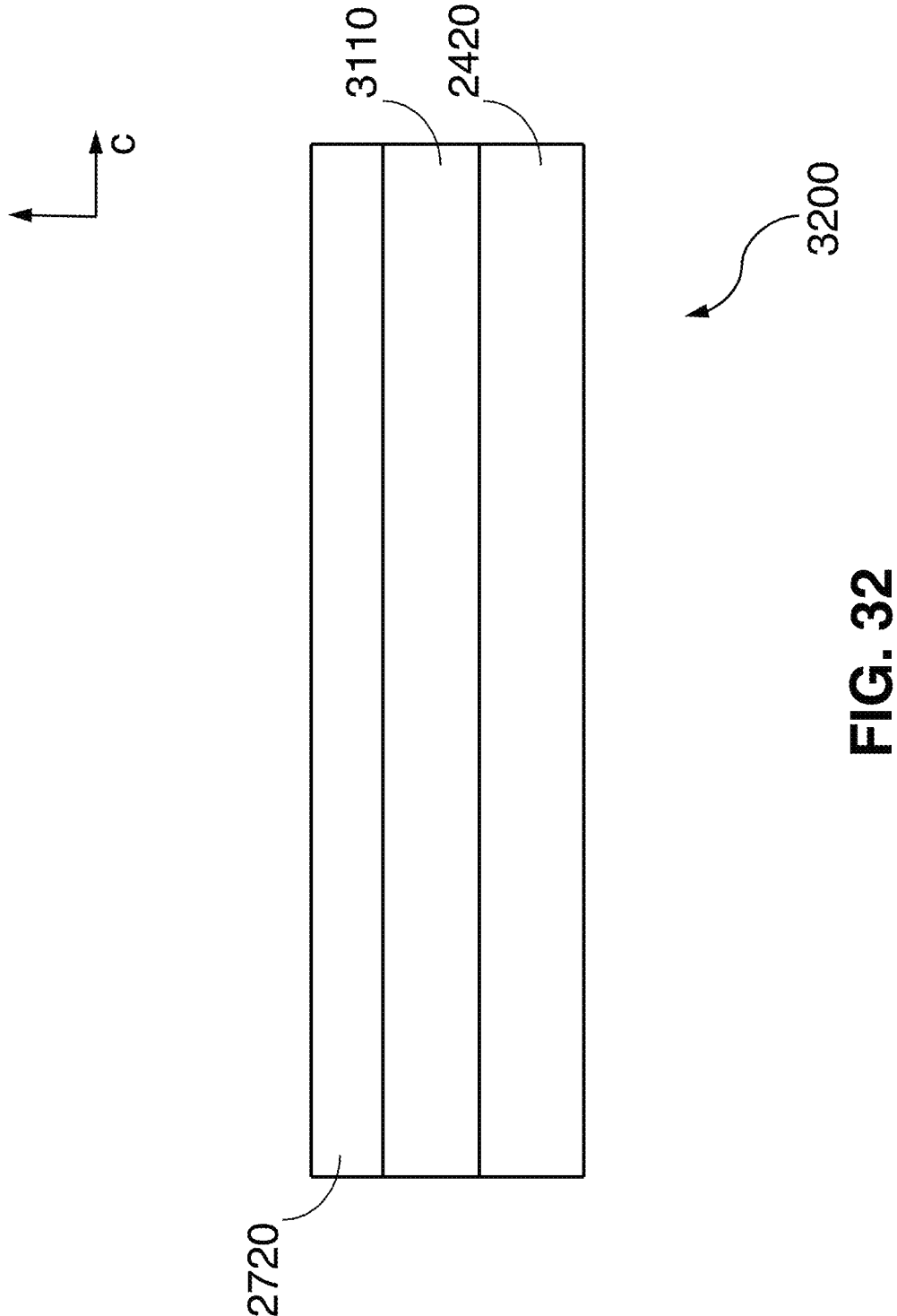
FIG. 32 illustrates a modifying material layered onto appropriate surfaces of ELR material of an a-b film according to various implementations of the invention.

According to various implementations of the invention, primary surface 3130 of a-b film 3100 corresponds to an appropriate surface 2710. In some implementations that employ a-b film 3100, forming an appropriate surface of ELR material 3110 may include forming a-b film 3100. Accordingly, for implementations of the invention that include a-b film 3100, modifying material 2720 may be layered onto primary surface 3130 of a-b film 3100 to create a modified a-b film 3200 as illustrated in FIG. 32. In some implementations of the invention, modifying material 2720 may cover primary surface 3130 of a-b film 3100 in whole or in part. In some implementations of the invention, the thickness of modifying material 2720 may vary as discussed above. More particularly, in some implementations of the invention, a single unit layer of modifying material 2720 may be layered onto primary surface 3130 of a-b film 3100; and in some implementations of the invention, two or more unit layers of modifying material 2720 may be layered onto primary surface 3130 of a-b film 3100. In some implementations of the invention, a-b film 3100 may be grooved or otherwise modified as discussed above with regard to c-film 2400, for example, to increase an overall area of appropriate surfaces 2710 of ELR material 3110 on which to layer modifying material 2720.

As would be appreciated, rather than utilizing a-b film 3100, some implementations of the invention may utilize a layer of ELR material 2410 having its crystalline structure oriented in a manner similar to that of a-b film 3100.

In some implementations of the invention (not otherwise illustrated) a buffer or insulating material may be subsequently layered onto modifying material 2720 of any of the aforementioned films. In these implementations, the buffer or insulating material and the substrate form a "sandwich" with ELR material 2410, 3110 and modifying material 2720 there between. The buffer or insulating material may be layered onto modifying material 2720 as would be appreciated.

Any of the aforementioned materials may be layered onto any other material. For example, ELR materials may be layered onto modifying materials. Likewise, modifying materials may be layered onto ELR materials. Further, layering may include combining, forming, or depositing one material onto the other material as would be appreciated. Layering may use any generally known layering technique, including, but not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering technique.

Figure 33:
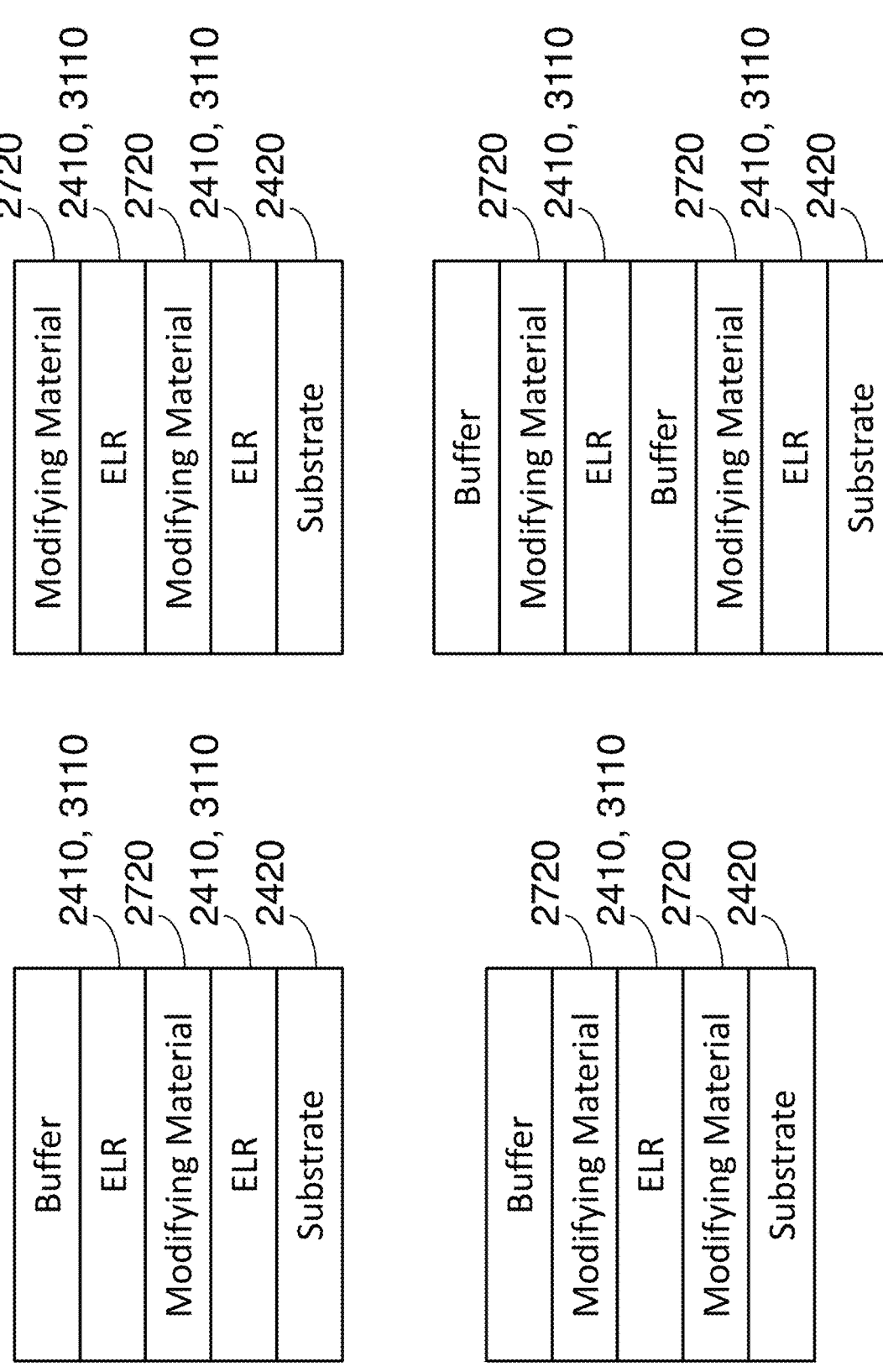
FIG. 33 illustrates various exemplary arrangements of layers of ELR material, modifying material, buffer or insulating layers, and/or substrates in accordance with various implementations of the invention.

Multiple layers of ELR material 2410, 3110, modifying material 2720, buffer or insulating layers, and/or substrates 1120 may be arranged in various implementations of the invention. FIG. 33 illustrates various exemplary arrangements of these layers in accordance with various implementations of the invention. In some implementations, a given layer may comprise a modifying material 2720 that also acts as a buffer or insulating layer or a substrate. Other arrangements or combinations of arrangements may be used as would be appreciated from reading this description. Furthermore, in some implementations of the invention, various layers of ELR material may have different orientations from one another in a given arrangement. For example, one layer of ELR material in an arrangement may have the a-axis of its crystalline structure oriented along the principal axis 2440 and another layer of the ELR material in the arrangement may have the b-axis of its crystalline structure oriented along the principal axis 2440. Other orientations may be used within a given arrangement in accordance with various implementations of the invention.

Figure 34:
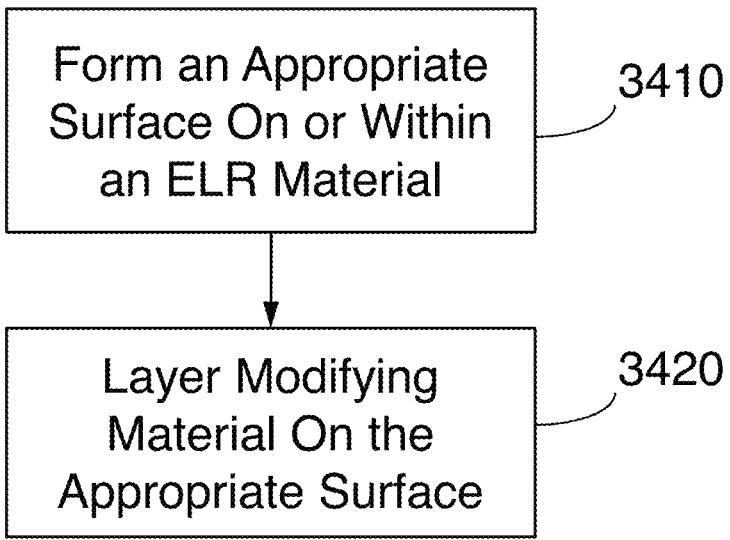
FIG. 34 illustrates a process for forming a modified ELR material according to various implementations of the invention.

FIG. 34 illustrates a process for creating a modified ELR material according to various implementations of the invention. In an operation 3410, an appropriate surface 2710 is formed on or within an ELR material. In some implementations of the invention where ELR material exists as ELR material 2410 of c-film 2400, appropriate surface 2710 is formed by exposing appropriate surface(s) 2710 on or within primary surface 2430 of a c-film 2400. In some implementations of the invention, appropriate surfaces of ELR material 2410 may be exposed by modifying primary surface 2430 using any of the wet or dry processing techniques, or combinations thereof, discussed above. In some implementations of the invention, primary surface 2430 may be modified by chemical etching as discussed above.

In some implementations of the invention where ELR material exists as ELR material 3110 of a-b film 3100 (with or without substrate 2420), appropriate surface 2710 is formed by layering ELR material 3110 (in a proper orientation as described above) onto a surface, which may or may not include substrate 2420.

In some implementations of the invention, appropriate surfaces 2710 include surfaces of ELR material parallel to the ab-plane. In some implementations of the invention, appropriate surfaces 2710 include faces of ELR material parallel to the b-plane. In some implementations of the invention, appropriate surfaces 2710 include faces of ELR material parallel to the a-plane. In some implementations of the invention, appropriate surfaces 2710 include one or more faces of ELR material parallel to different ab-planes. In some implementations of the invention, appropriate surfaces 2710 include one or more faces not substantially perpendicular to the c-axis of ELR material.

In some implementations of the invention, various optional operations may be performed. For example, in some implementations of the invention, appropriate surfaces 2710 or ELR material may be annealed. In some implementations of the invention, this annealing may be a furnace anneal or a rapid thermal processing (RTP) anneal process. In some implementations of the invention, such annealing may be performed in one or more annealing operations within predetermined time periods, temperature ranges, and other parameters. Further, as would be appreciated, annealing may be performed in the chemical vapor deposition (CVD) chamber and may include subjecting appropriate surfaces 2710 to any combination of temperature and pressure for a predetermined time which may enhance appropriate surfaces 2710. Such annealing may be performed in a gas atmosphere and with or without plasma enhancement.

In an operation 3420, modifying material 2720 may be layered onto one or more appropriate surfaces 2710. In some implementations of the invention, modifying material 2720 may be layered onto appropriate surfaces 2710 using various layering techniques, including various ones described above.

Figure 35:
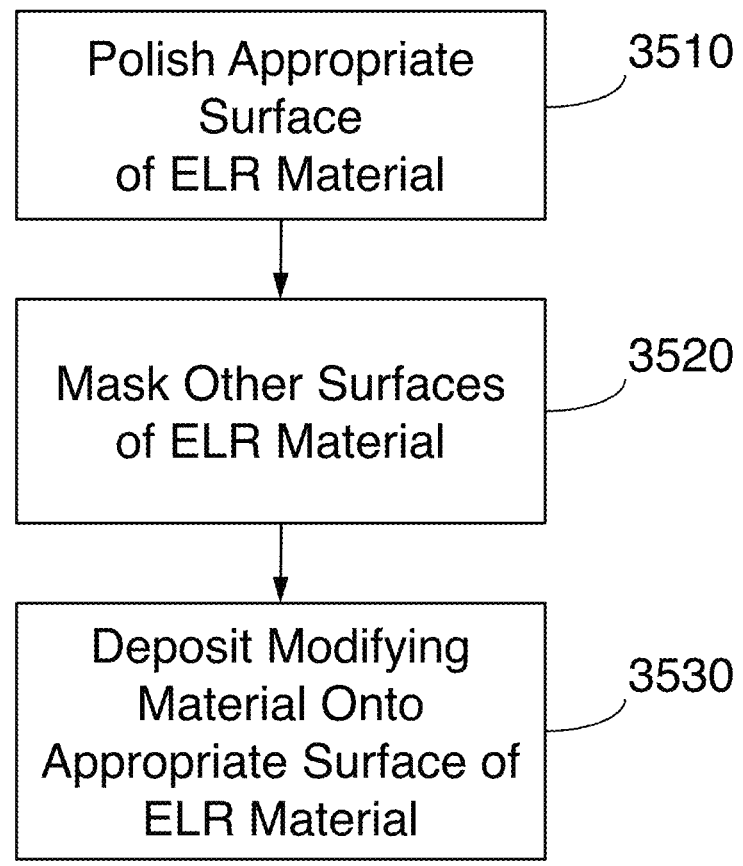
FIG. 35 illustrates an example of additional processing that may be performed according to various implementations of the invention.

FIG. 35 illustrates an example of additional processing that may be performed during operation 3420 according to various implementations of the invention. In an operation 3510, appropriate surfaces 2710 may be polished. In some implementations of the invention, one or more polishes may be used as discussed above.

In an operation 3520, various surfaces other than appropriate surfaces 2710 may be masked using any generally known masking techniques. In some implementations, all surfaces other than appropriate surfaces 2710 may be masked. In some implementations of the invention, one or more surfaces other than appropriate surfaces 2710 may be masked.

In an operation 3530, modifying material 2720 may be layered on to (or in some implementations and as illustrated in FIG. 35, deposited on to) appropriate surfaces 2710 using any generally known layering techniques discussed above. In some implementations of the invention, modifying material 2720 may be deposited on to appropriate surfaces 2710 using MBE. In some implementations of the invention, modifying material 2720 may be deposited on to appropriate surfaces 2710 using PLD. In some implementations of the invention, modifying material 2720 may be deposited on to appropriate surfaces 2710 using CVD. In some implementations of the invention, approximately 40 nm of modifying material 2720 may be deposited on to appropriate surfaces 2710, although as little as 1.7 nm of certain modifying materials 2720 (e.g., cobalt) has been tested. In various implementations of the invention, much smaller amounts of modifying materials 2450, for example, on the order of a few angstroms, may be used. In some implementation of the invention, modifying material 2720 may be deposited on to appropriate surfaces 2710 in a chamber under a vacuum, which may have a pressure of $5 \times 10{-}6$ torr or less. Various chambers may be used including those used to process semiconductor wafers. In some implementations of the invention, the CVD processes described herein may be carried out in a CVD reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing MBE, PLD or CVD may be used.

Figure 36:
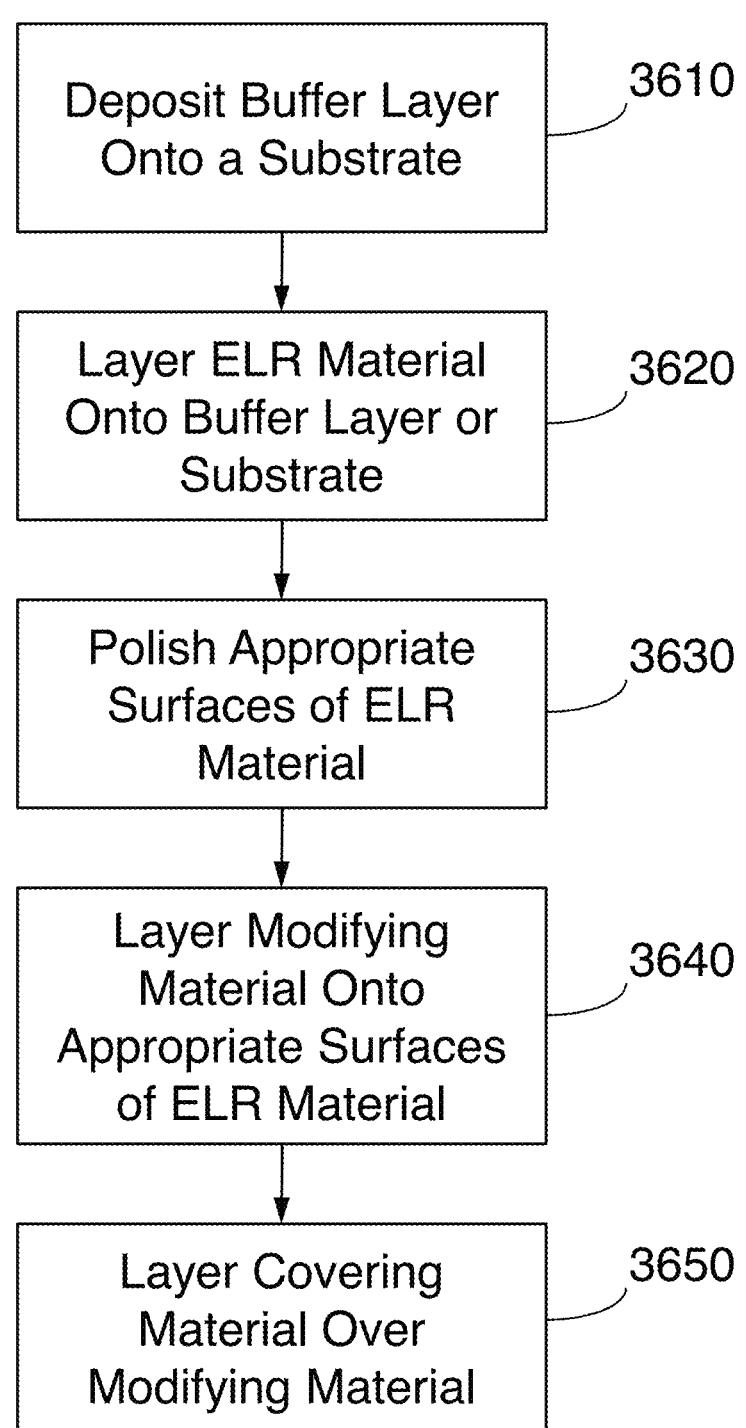
FIG. 36 illustrates a process for forming a modified ELR material according to various implementations of the invention.

FIG. 36 illustrates a process for forming a modified ELR material according to various implementations of the invention. In particular, FIG. 36 illustrates a process for forming and/or modifying an a-b film 3100. In an optional operation 3610, a buffer layer is deposited onto a substrate 2420. In some implementations of the invention, the buffer layer includes PBCO or other suitable buffer material. In some implementations of the invention, substrate 2420 includes LSGO or other suitable substrate material. In an operation 3620, ELR material 3110 is layered onto substrate 2420 with a proper orientation as described above with respect to FIG. 31. As would be appreciated, depending on optional operation 3610, ELR material 3110 is layered onto substrate 2420 or the buffer layer. In some implementations of the invention, the layer of ELR material 3110 is two or more unit layers thick. In some implementations of the invention, the layer of ELR material 3110 is a few unit layers thick. In some implementations of the invention, the layer of ELR material 3110 is several unit layers thick. In some implementations of the invention, the layer of ELR material 3110 is many unit layers thick. In some implementations of the invention, ELR material 3110 is layered onto substrate 2420 using an IBAD process. In some implementations of the invention, ELR material 3110 is layered onto substrate 2420 while subject to a magnetic field to improve an alignment of the crystalline structures within ELR material 3110.

In an optional operation 3630, appropriate surface(s) 2710 (which with respect to a-b films 3100, corresponds to primary surface 3130) of ELR material 3110 is polished using various techniques described above. In some implementations of the invention, the polishing is accomplished without introducing impurities onto appropriate surfaces 2710 of ELR material 3110. In some implementations of the invention, the polishing is accomplished without breaking the clean chamber. In an operation 3640, modifying material 2720 is layered onto appropriate surfaces 2710. In an optional operation 3650, a covering material, such as, but not limited to, silver, is layered over entire modifying material 2720.

In various implementations of the invention, modified ELR materials 1060, whether used in bulk, incorporated into films (e.g., ELR material 2410 in c-film 2400, ELR material 3110 in a-b film 3100, or other films or tapes), or utilized in other ways (e.g., wires, foils, nanowires, etc.), may be incorporated into various products, systems and/or devices as described herein.

While various implementations of the invention are described below in terms of "modified" ELR materials, various implementations may include new ELR materials with improved operating characteristics without departing from the scope of the invention as would be appreciated. Furthermore, various implementations may include any materials exhibiting some or all of the improved operating characteristics described herein without departing from the scope of the invention as would be appreciated. That is, various implementations may include modified ELR materials, apertured ELR materials, non-conventional ELR materials, and/or other materials that exhibit some or all of the improved operating characteristics described herein. In various implementations, the ELR materials described herein, such as the modified ELR materials and/or the apertured ELR materials, may be part of or formed into a number of different current carrying components, such as films/tapes, wires, nanowires, and so on, to be used in devices, systems, and other implementations of the invention. The following are a few examples current carrying components, although one of ordinary skill will appreciate that others may also be utilized:

Nanowires—nanostructures that have widths or diameters on the order of tens of nanometers or less and generally unconstrained lengths, used to form segments, contours, coils, and/or other structures capable of carrying current from one point to another with extremely low resistance. Nanostructures may be formed into a variety of nanowire configurations including discrete structures, integrated on or into a substrate, implemented on or into a supporting structure, and other nanowire configurations;

Foils—configuring ELR material on or into flexible films/ tapes, such as, but not limited to metal tapes, and optionally coating the metal and/or ELR material with buffering metal oxides. Texture may be introduced into the tape, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. Other techniques may utilize chemical vapor deposition CVD processes, physical vapor deposition (PVD) processes, molecular beam epitaxy (MBE), Atomic-Layer-By-Layer molecular beam epitaxy (ALL-MBE), and other solution deposition techniques to produce ELR tapes;

Wires-one or more ELR components may be sandwiched together to form a macroscale wire; and other current carrying components.

Thus, in some implementations, forming and/or integrating the ELR materials described herein into various current carrying components enables and/or facilitates the implementation of the ELR materials into devices and systems that utilize, generate, transform and/or transport electric energy, such as electric current. These devices and systems may benefit from the improved operating characteristics by operating more efficiently in comparison to conventional devices and systems, operating more cost-effectively in comparison to conventional devices and systems, operating less wastefully in comparison to conventional devices and systems, and other improved operating characteristics.

Layered Compositions that Exhibit Extremely Low Resistance

This section of the description refers to FIG. 37 through FIG. 43; accordingly all reference numbers included in this section refer to elements found in such figures.

For purposes of this description and according to various implementations of the invention, the compositions of matter generally include an ELR material, such as, but not limited to, a perovskite material (e.g., YBCO, etc.), and a modifying material or modifying component (referenced interchangeably) such as: one or more layers of modifying component externally applied to the ELR material; one or more modifying components that facilitate application of a strain within the ELR material; one or more layers of differing ELR materials, one or more of which facilitate application of a strain within the ELR material of another layer(s); one or more layers of the ELR material having different crystal orientations, one or more of which facilitate application of a strain within the ELR material of another layer(s); one or more modifying components that facilitate a strain within the ELR material; one or more modifying components such as described above; and/or other modifying components.

In some implementations, the compositions of matter may include one or more modifying components applied to or formed on the ELR material within a certain proximity to a charge plane and/or charge reservoir of the ELR material. For example, a composition of matter may include a layer of YBCO and a layer of modifying material that is applied to or formed on an appropriate surface of the layer of YBCO. In some implementations, this surface is substantially parallel to a c-axis of the YBCO. In some implementations, this surface is substantially perpendicular to an a-axis of the YBCO. In some implementations, this surface is substantially perpendicular to a b-axis of the YBCO. In some implementations, other appropriate surfaces may be used.

In some implementations, application of the modifying component to the ELR material may cause one or more oxygen atoms within a crystalline structure of the ELR material to move within the ELR material, forming an oxygen concentration gradient that strains the crystalline structure of the ELR material. In some implementations, a modifying component, such as chromium, may act as a "getter" for the oxygen atoms within the ELR material, thereby causing the oxygen atoms to move towards the modifying component, which in turn strains various areas within or portions of the crystalline structure of the ELR material.

In some implementations, a composition of matter may include multiple layers of different ELR materials, such different ELR materials including different atoms, including but not limited to, differing rare earth metal atoms, with respect to one another (e.g., YBCO vs. DyBCO, YBCO vs. NBCO, DyBCO vs. NBCO, etc.); different oxygen content within their crystalline structures with respect to one another (e.g., the oxygen stoichiometry/fraction in YBCO between $O_6$ and $O_7$); and/or different crystalline orientation with respect to one another (e.g., a-axis YBCO vs. b-axis YBCO, etc.). Such compositions may be layered in a fashion such that the differing layers of ELR materials may strain various areas within or portions of the composition.

In some implementations of the invention, the strains within various areas or portions of the composition impact apertures in the crystalline structures of the ELR material so as to improve the operating characteristics (e.g., operating temperature, current carrying capacity, etc.) of the ELR material.

Modification of a material, such as a material having a crystalline structure, may cause the material to exhibit lower resistance, such as extremely low resistance, to current within the material at higher than expected temperatures. In some implementations, the modification may include applying or forming a layer of modifying material onto an appropriate surface as discussed above. The applied or formed layer of modifying material may cause a strain or otherwise apply a force to some or all of the atoms and/or bonds that make up the crystalline structure of the material. This force or strain may alter the material such that the material exhibits different resistance characteristics, such as lower resistance or extremely low resistance. That is, causing a force or strain within the material may: cause the material to generate, exhibit, and/or maintain a certain oxygen diffusion gradient at certain locations and/or areas within the material; cause the material to generate, exhibit, and/or maintain a certain level of oxygen diffusion within or proximate to a charge reservoir within the material; and/or cause the crystalline structure of the material to twist, warp, open, close, stiffen, or otherwise maintain or change orientation and/or geometry, such as maintain or change geometry with respect to apertures within the material that may facilitate the transport of electrons from one location to another; and so on.

Various implementations of the invention may facilitate the application of forces or strains to or within an ELR material. In some implementations, the forces may be externally and/or non-invasively applied to various portions of the ELR material. In some implementations, the forces may result in internal stresses, strains or other forces applied within various portions of the ELR material. For example, the portions may be a portion of the ELR material that includes oxygen atoms, a portion of the ELR material that includes a copper-oxygen plane of atoms, a portion of the ELR material that includes a reservoir of charges, a portion of the ELR material that includes an aperture within the crystalline structure of the ELR material, a portion of the ELR material that corresponds to (i.e., substantially parallel with) an a-plane of the material, a portion of the ELR material that corresponds to (i.e., substantially parallel with) a b-plane of the material, a portion of the ELR material that corresponds to a plane substantially parallel to a c-axis the material, a portion of the ELR material that is located near or proximate to a surface of the material, or other portion of the ELR material.

Using the various observations described herein, various implementations of the invention may be realized as various compositions of matter, which are now described in detail.

Various implementations of the invention may comprise various compositions, such as compositions having ELR materials and modifying materials, configured and/or adapted to carry current from one location to another. That is, such compositions conduct electrons from one location to another, among other things.

In some implementations, various compositions comprise one or more modifying materials applied to or formed on appropriate surfaces of an ELR material. FIG. 37 illustrates a composition 100 of a modified ELR material (also referred to herein as a modified ELR material 100), having an ELR material 110 (also referred to herein as an unmodified ELR material 110) and a modifying material 120 applied to a surface of the ELR material 110.

In some implementations, the ELR material 110 may be a representative of a family of superconducting materials commonly referred to as mixed-valence cuprate perovskites as discussed above. Such mixed-valence cuprate perovskite materials may also include, but are not limited to, various substitutions of the cations of the materials. The aforementioned named mixed-valence cuprate perovskite materials may refer to generic classes of materials in which many different formulations exist, such as a class of perovskite materials that include a rare earth metal (Re), Barium (Ba), Copper (Cu), and Oxygen (O), or "ReBCO." Example ReBCO materials may include YBCO, NBCO, HoBCO, GdBCO, DyBCO, and others, such as others having a suitable 1-2-3 stoichiometry.

In some implementations, the ELR material 110 may include an HTS material outside of the family of mixed-valence cuprate perovskite materials ("non-perovskite materials"). Such non-perovskite materials may include, but are not limited to, iron pnictides, magnesium diboride ($MgB_2$), and other non-perovskites. In some implementations, the ELR material 110 may be other superconducting materials or non-superconducting materials.

In some implementations, the modifying material 120 may be a metal, such as chromium, copper, bismuth, cobalt, vanadium, titanium, rhodium, or beryllium, or metal oxides of such metals. In some implementations, the modifying material 120 may be any material capable of applying strain to or within the ELR material 110, such as a metal having a high oxygen affinity, a "getter" material, a material (including another ELR material) having one or more lattice constants different from those of the ELR material 110, and so on. For example, in some implementations, the modifying material 120 may have a strong oxygen affinity, such as a material that readily bonds to, attracts, or "gets," oxygen or changes the oxygen content and/or oxygen distribution within the ELR material in order to cause a strain within the ELR material 110. In some implementations, modifying material 120 may have one or more lattice constants that is mismatched with those of the ELR material 110 in order to cause a strain within the ELR material 110.

For example, one effect of depositing a modifying material 120 of chromium on the surface of the ELR material 110 may be to create an oxygen gradient near the surface of the ELR material 110. In some implementations, the modifying layer 120 is placed onto surfaces of the ELR material substantially perpendicular to the a-axis or the b-axis of the ELR material, which may result in the creation of the oxygen concentration gradient, among other things, within the ELR material. In some implementations, the modifying layer 120 is placed onto surfaces of the ELR material substantially parallel to the c-axis of the ELR material, which may result in the creation of the oxygen concentration gradient, among other things, within the ELR material.

In some implementations, the ELR material 110 includes a charge plane that includes one or more atoms that, in part, form the aperture. For example, YBCO is formed of various atoms of yttrium ("Y"), barium ("Ba"), copper ("Cu") and oxygen ("O"). Apertures within YBCO are formed by aperture atoms, namely atoms of yttrium, copper, and oxygen, and charge planes within YBCO are formed by various atoms of copper ("Cu") and oxygen ("O").

FIG. 38 illustrates a composition 200 that includes a substrate 230, two or more modifying components 210, 215 and an ELR material 220, located between the modifying components 210, 215. In particular, the modifying components 210, 215 are bonded to or formed on a top surface and a bottom surface, respectively, of the ELR material 220. In some implementations of the invention, the top and bottom surfaces of the ELR material 220 are appropriate surfaces of the ELR material 220 (e.g., surfaces substantially perpendicular to an a-axis of the ELR material 220, etc.) The composition 200, therefore, may be strained proximate to the top surface of the ELR material 220 by the modifying component 210 and strained proximate to the bottom surface of the ELR material 220 by the modifying component 215 located on the substrate 230.

By applying modifying material(s) to one or more surfaces of the ELR material, various implementations of the invention may control the application of the strain and/or may strain the ELR material at various locations of the ELR material, such as at one or more locations having charge planes, at one or more unit cells of the ELR material, at one or more apertures of the ELR material, and/or other locations.

Some implementations of the invention may comprise a superlattice of layers of ELR material(s) which may act to enhance the properties of one or more of the layers of ELR material of the superlattice.

Figure 39:
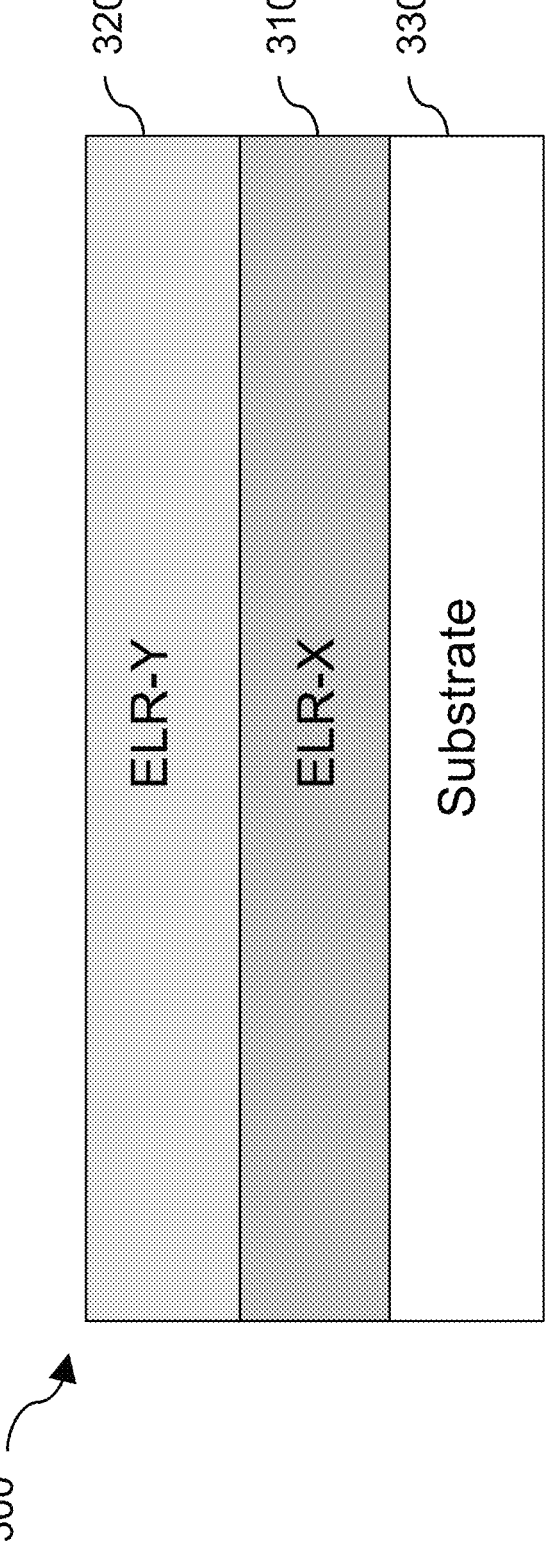
FIG. 39 is a block diagram of a composition that includes layers of different extremely low resistance materials according to various implementations of the invention.

FIG. 39 is a block diagram of a composition 300 that includes layers of different ELR materials according to various implementations of the invention. More specifically, composition 300 includes a first layer 310 of ELR material referenced as "ELR-X" and a second layer 320 of ELR material referenced as "ELR-Y." As illustrated in FIG. 39, first layer 310 is formed on or applied to a substrate 330 and second layer 320 is formed on or applied to first layer 310. As would be appreciated, in some implementations of the invention, substrate 330 is optional. While illustrated as only having first layer 310 and second layer 320, composition 300 may comprise any number of pairs of first layer 310 and second layer 320 formed in a pattern alternating between first layer 310 and second layer 320. In some implementations, ELR-X corresponds to a first ELR material and ELR-Y corresponds to a second ELR material different from the first ELR material. For example, in some implementations of the invention, ELR-X may correspond to YBCO and ELR-Y may correspond to NBCO. Other ELR materials may be used as would be appreciated.

Figure 40:
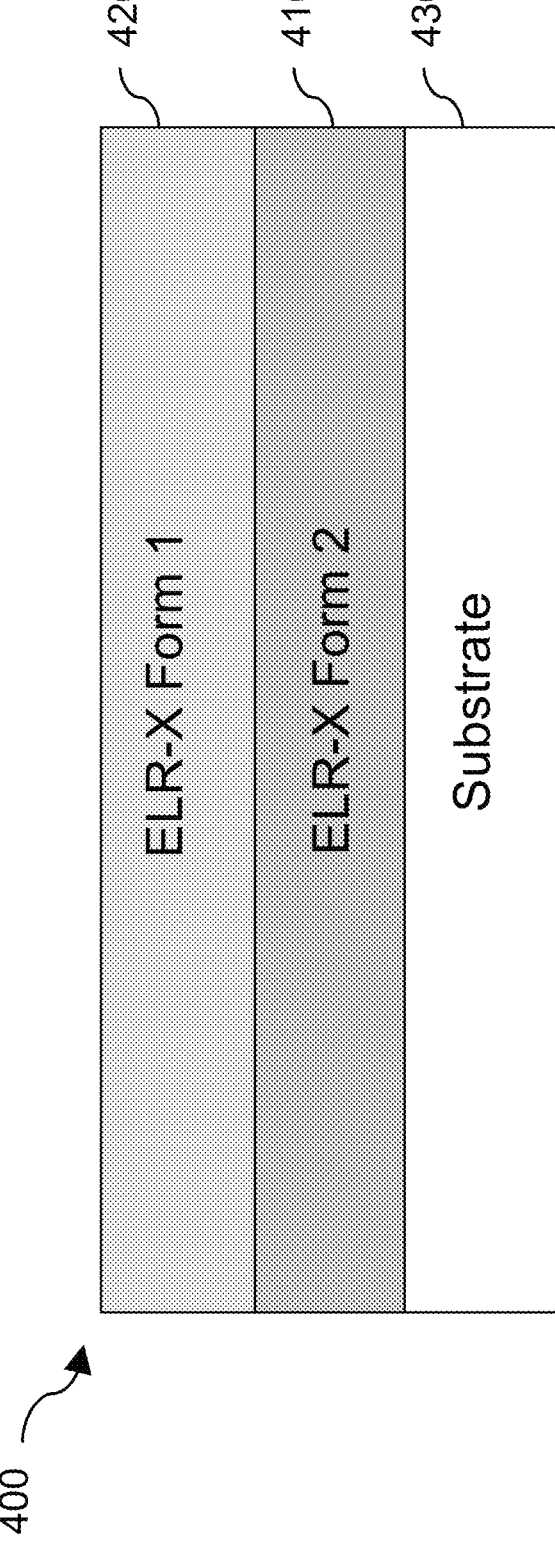
FIG. 40 is a block diagram of a composition that includes layers of different forms of the same extremely low resistance material according to various implementations of the invention.

FIG. 40 is a block diagram of a composition 400 that includes layers of different forms of the same ELR material according to various implementations of the invention. More specifically, composition 400 includes a first layer 410 of a first form of the ELR material referenced as "ELR-X Form 1" and a second layer 420 of a second form of the same ELR material referenced as "ELR-X Form 2." In some implementations, the same basic ELR material has different forms, such as, but not limited to, different crystalline orientations, different oxygen stoichiometry/fractions (e.g., $O_6$ and $O_7$ in YBCO, etc.), different variants, and other different forms. Other forms of the same ELR materials may be used as would be appreciated. As illustrated, first layer 410 is formed on or applied to a substrate 430 and second layer 420 is formed on or applied to first layer 410. As would be appreciated, in some implementations of the invention, substrate 430 is optional. While illustrated as only having first layer 410 and second layer 420, composition 400 may comprise any number of pairs of first layer 410 and second layer 420 formed in a pattern alternating between first layer 410 and second layer 420.

As discussed, the composition 400 may include layers of different forms or variant of the same ELR material (e.g., ReBCO) and these different forms of the same ELR material may cause strain to or within one or more layers of the ELR material. For example, varying the oxygen content between layers (e.g., changing the oxygen stoichiometry/fraction in YBCO between $O_6$ and $O_7$) may cause lattice mismatches between layers, which may strain the bonds of the crystalline structures of the ELR materials within the layers. Also for example, varying the crystal orientation of the ELR material between layers (e.g., one layer of the ELR material has an a-axis orientation while another layer of the ELR material has a b-axis orientation) may also cause lattice mismatch between the layers, thereby causing similar strain.

Figure 41:
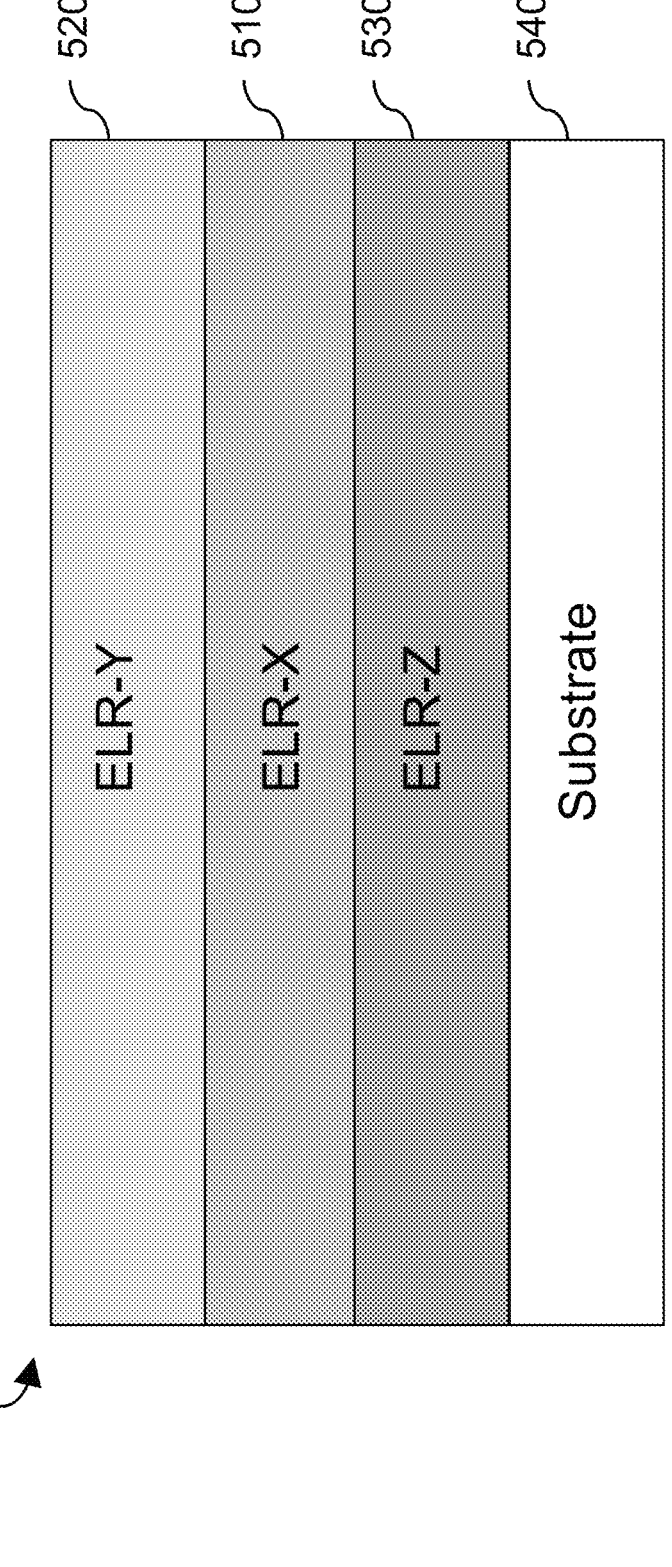
FIG. 41 is a block diagram of a composition that includes multiple layers of different extremely low resistance materials according to various implementations of the invention.

FIG. 41 depicts a composition 500 that includes layers of a plurality of different ELR materials. As illustrated, the composition 500 includes a first layer 510 of ELR material referenced as "ELR-X", a second layer 520 of ELR material referenced as "ELR-Y", and a third layer 530 of ELR material referenced as "ELR-Z". As illustrated, first layer 530 is formed on or applied to a substrate 540, second layer 510 is formed on or applied to first layer 530, and third layer 520 is formed on or applied to second layer 510. As would be appreciated, in some implementations of the invention, substrate 530 is optional. In some implementations of the invention, the ELR materials included in the layers of composition 500 may be different ELR materials altogether (as discussed above with reference to FIG. 39) or different forms of the same ELR material (as discussed above with reference to FIG. 40).

While not otherwise illustrated in FIGS. 39 to 41, various other layers of non-ELR materials may be included in various compositions 300, 400, 500 (or any of the other compositions described herein) including layers interspersed between one of more of the layers illustrated in FIG. 41.

Creating compositions 300, 400, 500 that are formed of layers of different ELR materials or different forms of ELR materials, enables various implementations of the invention to utilize lattice mismatches between various ReBCO materials (e.g., YBCO and NBCO, among others), or other materials having similar lattice parameters (e.g., BSCCO and others) in order to stress/strain various ones of the layers of ELR materials. In some implementations, the added strains may a change the phonon frequency and/or distribution and/or amplitude around the apertures in the crystalline structure of these ELR materials, allowing for drops in the resistance of the materials, improved operating characteristics such as, but not limited to operating in an ELR state at higher temperatures, and other benefits.

In some implementations of the invention, the layers of the superlattice of compositions 300, 400, 500 are formed such that appropriate surfaces of the ELR material (e.g., surfaces substantially perpendicular to an a-axis of the ELR material, surfaces substantially perpendicular to a b-axis of the ELR material, surfaces substantially parallel to a c-axis of the ELR material, etc.) in the layers correspond to the interface surfaces between the ELR materials. In other words, the surface forming the interface between layers 520 and 510 of FIG. 41, for example, corresponds to a surface that is substantially perpendicular to the a-axis of both ELR-Y and ELR-X, that is substantially perpendicular to the b-axis of both ELR-Y and ELR-X, or that is otherwise substantially parallel to the c-axis of both ELR-X and ELR-Y.

Of course, there may be many layers of similar and/or different ELR materials within the compositions of various implementations of the invention. In some implementations, the composition 500 may be formed by depositing a layer having a first thickness of a first ReBCO material, then depositing a layer having a second thickness of a second ReBCO material, and then depositing a layer having a third thickness of a third ReBCO material, where at least the ReBCO material of the second layer has one or more lattice constants different from those of the materials of the first and third layers. In addition, the first, second and third thicknesses may be the same as one another, entirely different from one another, or the same as some and different from others, etc. Any number of different ReBCO layers and/or thicknesses of the layers may be deposited in order to improve operating characteristics of the compositions, including, but not limited to, improving various temperature, resistance and/or current carrying capacities of the composition, among other things.

In some implementations of the invention, the composition may be layered as follows (bottom to top):

$ELR_1:ELR_2:ELR_1:ELR_2:ELR_1:ELR_2:ELR_1:ELR_2: \ldots$

In some implementations of the invention, the composition may be layered as follows (bottom to top):

$ELR_1:ELR_2:ELR_3:ELR_4:ELR_3:ELR_2:ELR_1:ELR_2: ELR_3: \ldots$

In some implementations of the invention, the composition may be layered as follows (bottom to top):

$ELR_1:ELR_2:ELR_3:ELR_4:ELR_3:ELR_4:ELR_3:ELR_4: ELR_3: \ldots$

In some implementations of the invention, the composition 500 may be layered as follows (bottom to top):

$ELR_1:ELR_2:ELR_3:ELR_2:ELR_3:ELR_2:ELR_3:ELR_2: ELR_3: \ldots$

Thus, the layers may be chosen for a variety of reasons, such as to create a mismatch of lattice constants, to create a controlled strain within one or more layers, to increase current carrying capacity of the composition, to improve manufacturing of the compositions, to improve the manufacturability of the layers onto one another, and so on. In addition, the thickness of the layers, such as the number of unit cells of material per layer, may be chosen to adjust the strain on a layer, to increase the current carrying capacity, and so on.

In some implementations of the invention, the number of layers, the type of ELR material within one or more layers, the type of other, non-ELR material within one or more layers, the thickness of one or more layers, the orientation of one or more layers, the sequence of one or more layers, and/or other parameters of a composition may be modified, defined, and/or chosen to achieve desired characteristics for the composition or the manufacturability of the composition, among other benefits.

Figure 42:
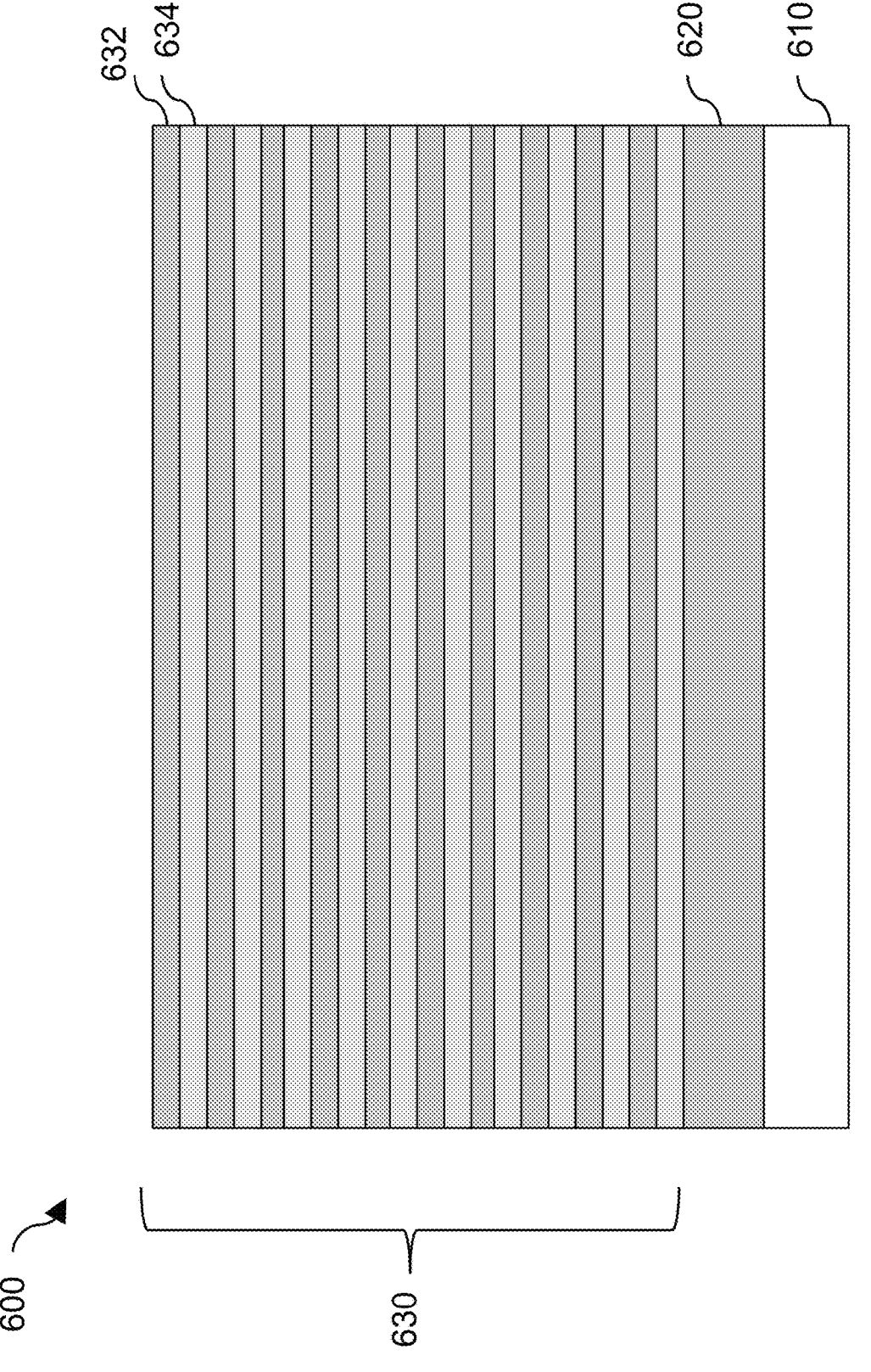
FIG. 42 is a block diagram of an exemplary composition that includes multiple layers of extremely low resistance materials according to various implementations of the invention.

FIG. 42 depicts an example composition 600 formed of superlattice comprising a plurality of layers of various ELR materials according to various implementations of the invention. As illustrated in FIG. 42, the composition 600 comprises a LaSrGaO4 (LSGO) substrate 610, having a top surface substantially perpendicular to an a-axis of the substrate. Other substrates may be used such as, but not limited to, strontium titanate (STO) or magnesium oxide (MgO). A layer 620 of YBCO is formed on the substrate 610, followed by alternating a layer 634 of NBCO with a layer 632 of YBCO. By way of example, composition 600 may comprise a layer 620 of YBCO formed with a thickness of 200 nm, followed by ten (10) pairs of alternating layers 634, 632 of NBCO and YBCO, respectively, each of such alternating layers having a thickness of 10 nm (i.e., 10 nm of NBCO alternating with 10 nm of YBCO) formed on the YBCO layer 620. Although not otherwise illustrated, the composition 600 may include other layers, such as layers of buffer material, additional or fewer pairs of alternating layers, additional layers of other ELR materials, additional or other substrate layers, layers of other or differing thicknesses, and so on.

In some implementations of the invention, a barrier material may be used to substantially encase various compositions described above. The barrier material may be used to substantially prevent oxygen in the crystalline structures of the ELR materials from diffusing out of the composition. In some implementations, gold may be deposited onto all surfaces of the composition to substantially encase the composition. Other barrier materials such as, but not limited, to silicon dioxide or indium tin oxide (ITO) may be used. In some implementations, 5-10 nm of gold is deposited onto all the surfaces of the composition, although other thicknesses may be used.

FIGS. 43A to 43I illustrate test results obtained from testing a sample of composition of an LSGO substrate; followed by approximately 200 nm of YBCO formed with an a-axis orientation on the LSGO substrate (e.g., a-axis of the YBCO up); followed by 10 pairs of alternating layers of approximately 10 nm of NBCO and approximately 10 nm of YBCO, each of these layers formed with an a-axis orientation on the prior layer; and followed by approximately 8.5 nm of gold as a barrier material encasing the sample.

The test results of FIGS. 43A to 43I include relevant portions of plots of resistance of the sample as a function of temperature (in Kelvin) over various runs and conditions as described below. More particularly, the plots correspond to measurements of the resistance of the sample over a temperature range of 180 K-270 K. Before describing the test results in further detail, a brief description of the testing equipment and setup is provided.

The sample was mounted on a PCB board using double-side tape. Tinned copper wires having a diameter of 0.004" were attached to the top gold surface of the sample with indium solder. The opposite ends of these wires were attached to pads on the PCB board. This assembly was placed in a cryostat. A Keithley 6221 current source provided a DC current through the sample while a Keithley 2182a voltmeter measured the voltage drop across the sample to provide a "delta-mode" resistance measurement (e.g., $R=((V+)-(V-))/2*I))$. Resistive thermal devices ("RTDs") were used to measure temperature.

For some of the test runs, the sample was initially cooled to a temperature below the transition temperature of YBCO and allowed to warm. For other tests runs (to save time and coolant, and also to avoid thermally stressing the sample unnecessarily), the sample was only cooled to just below 160 K and allowed to warm. In either case, as the sample warmed, measurements of the voltage across the sample were obtained along with measurements of the sample's temperature. From the voltage measurements, the delta-mode resistances were determined and subsequently plotted as resistance versus temperature, or R(T) curves (also sometimes referred to as R-T profiles), corresponding to the test results illustrated in the FIGS. 43A to 43I.

Figure 43A:
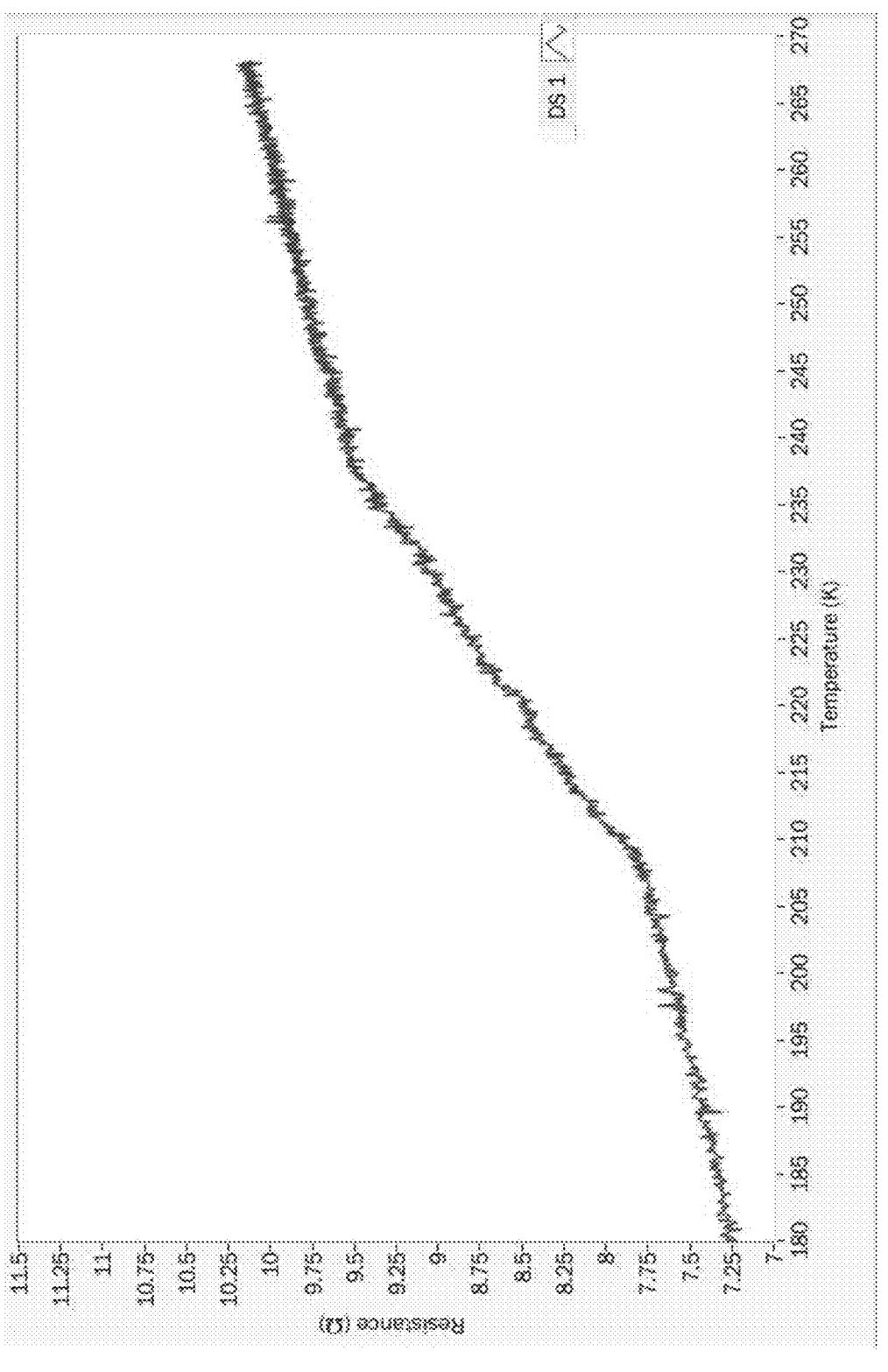
FIGS. 43A to 43I include test results demonstrating various operational characteristics of the exemplary composition illustrated in FIG. 42.
Figure 43B:
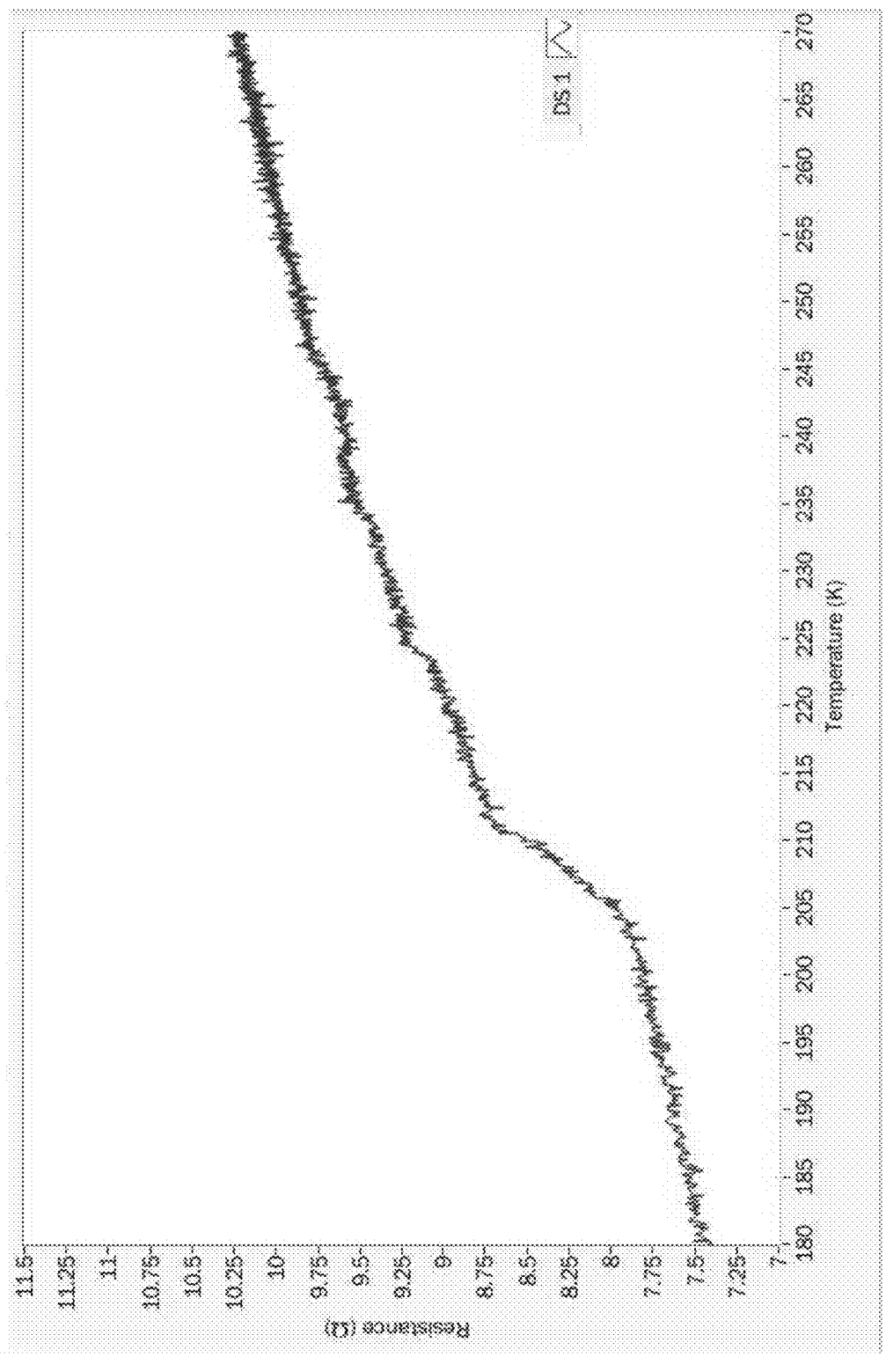
Figure 43C:
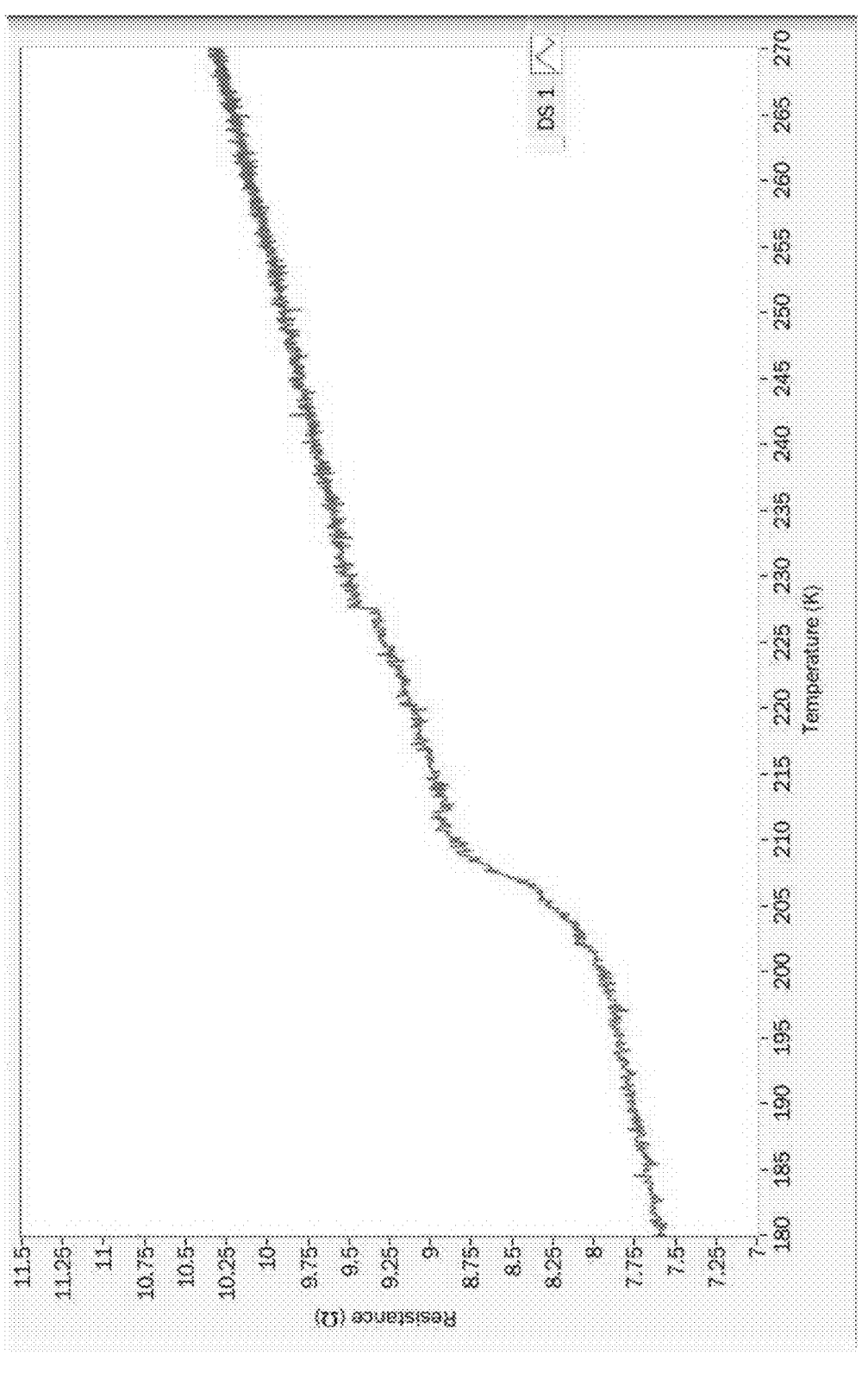
Figure 43D:
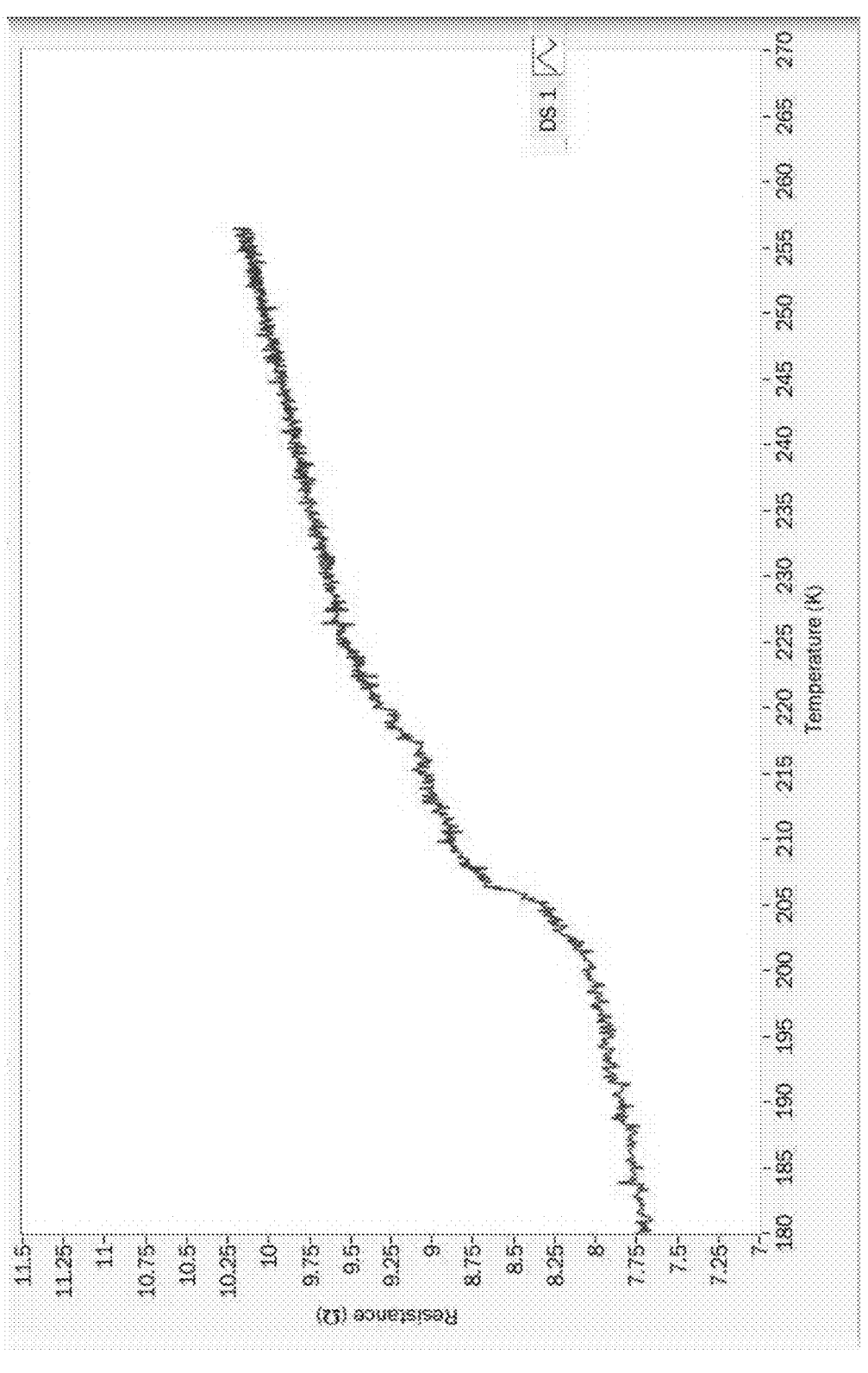
Figure 43E:
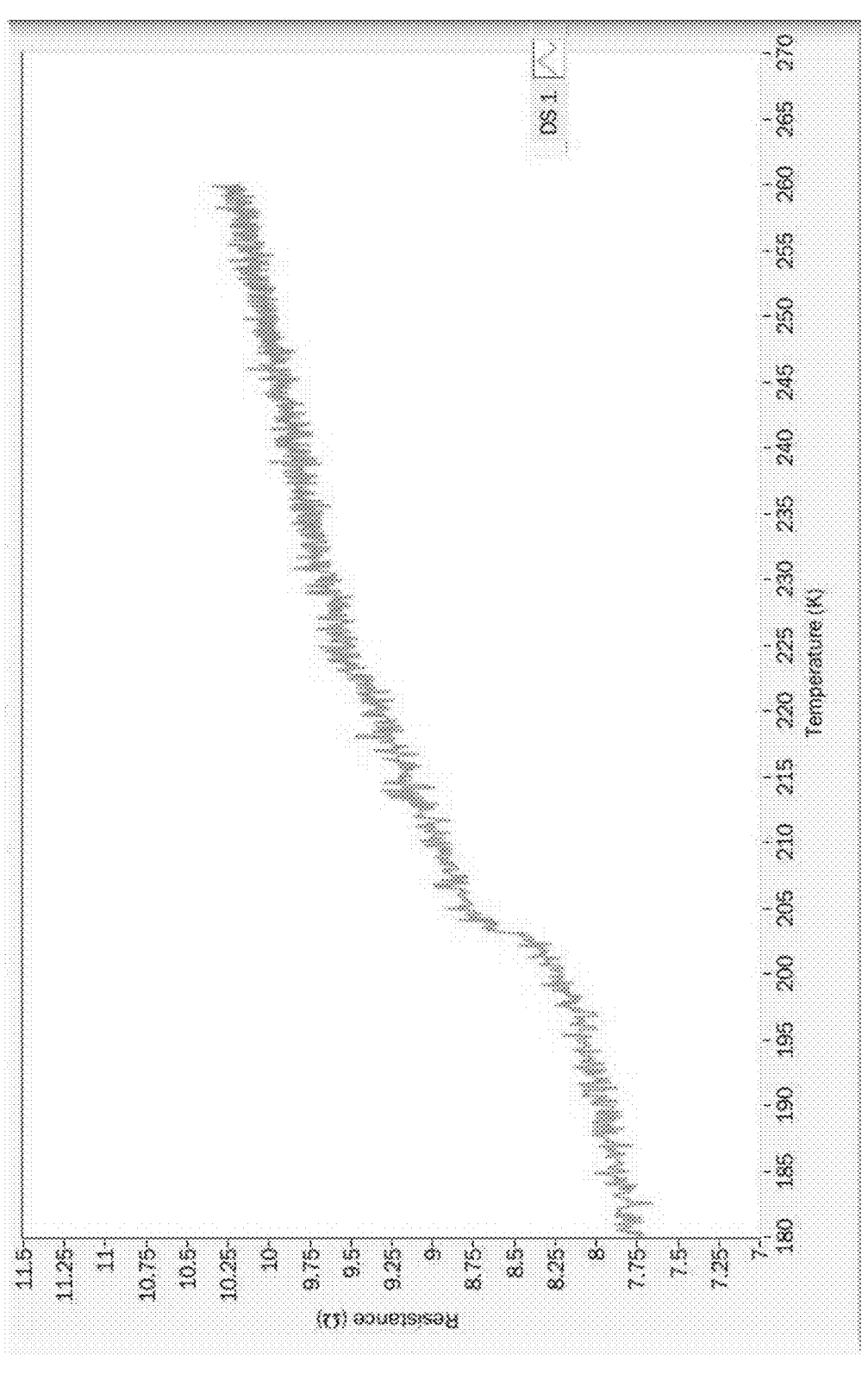
Figure 43F:
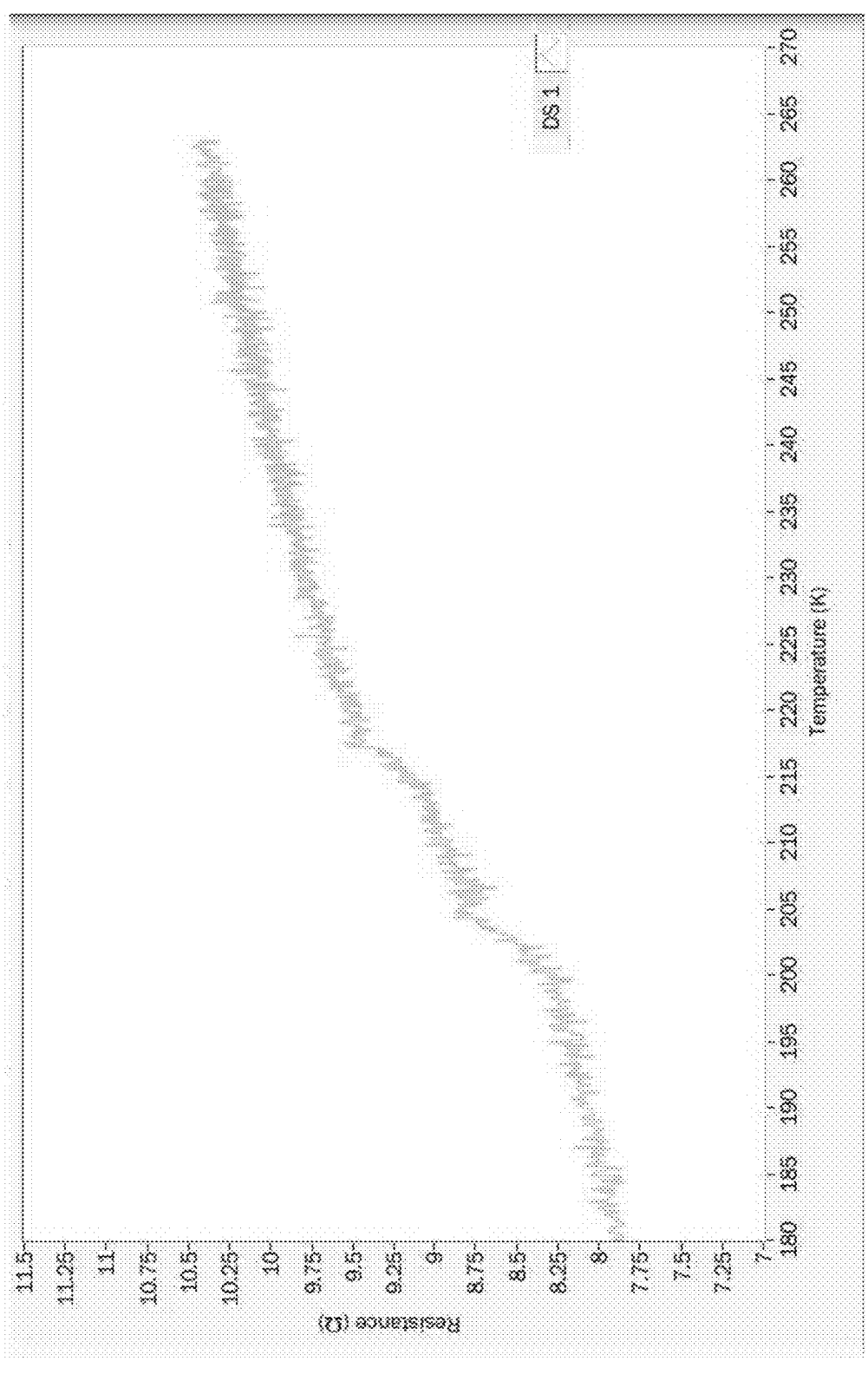
Figure 43G:
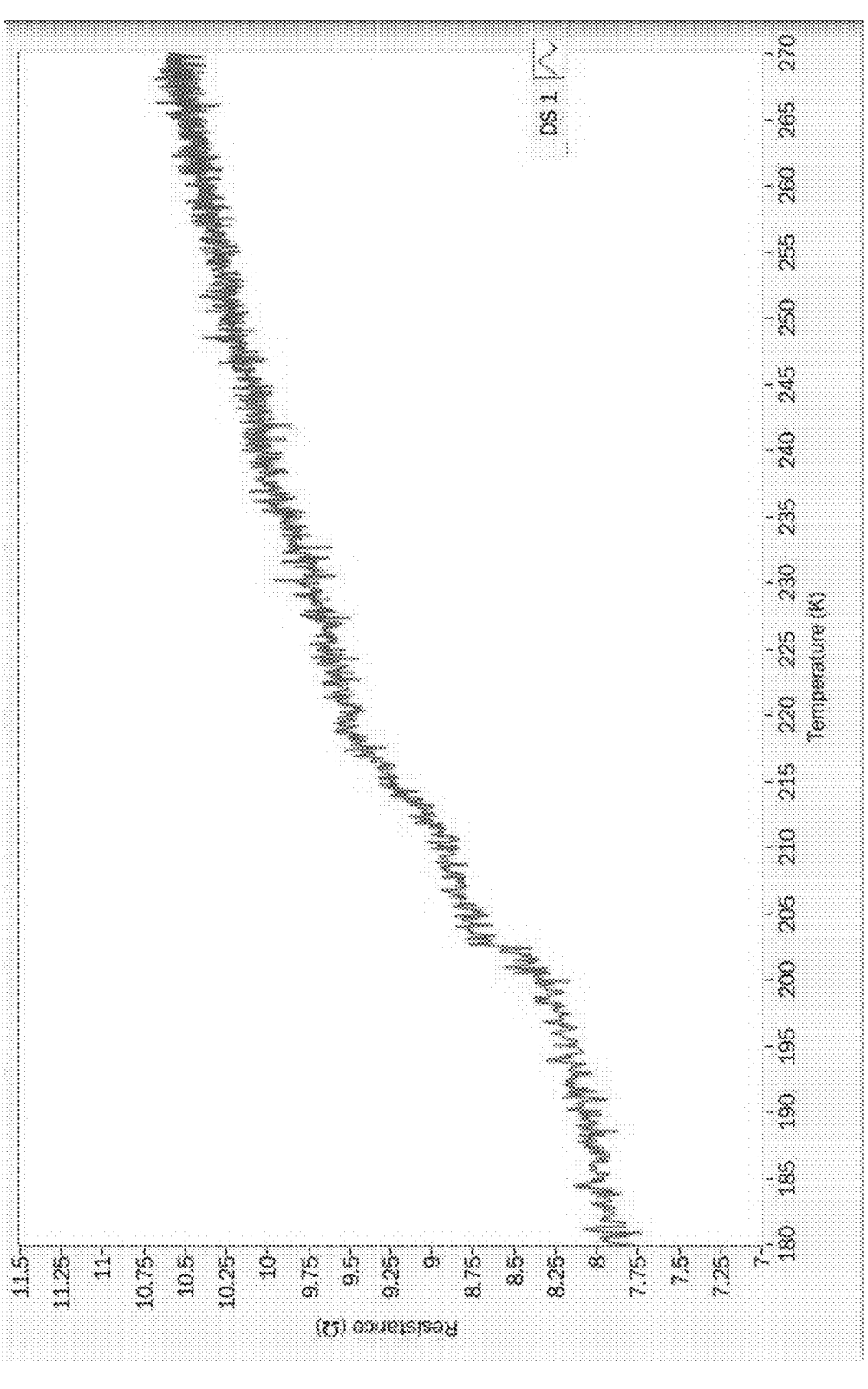
Figure 43H:
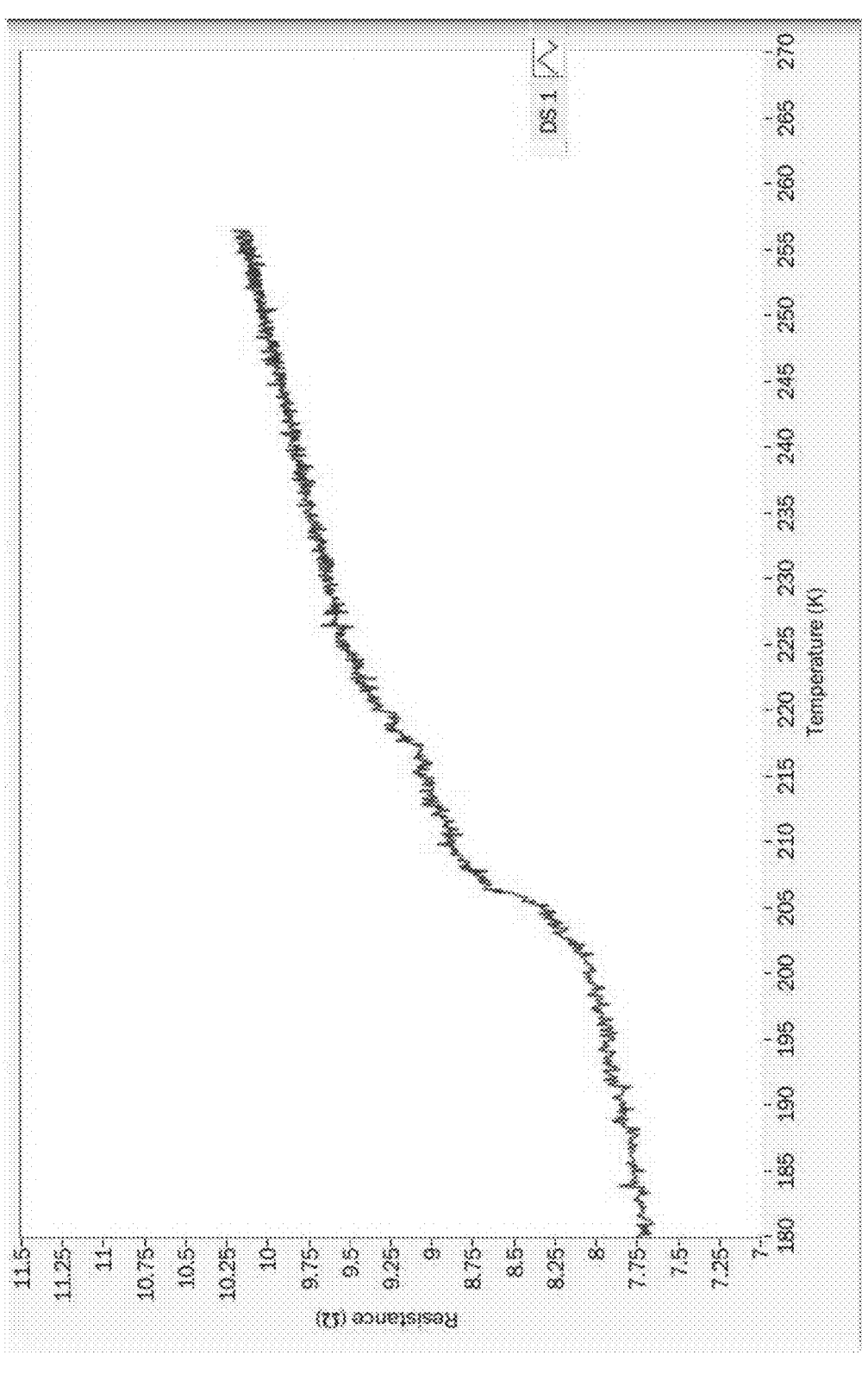

FIGS. 43A to 43H correspond to the individual R(T) curves of eight test runs of the sample, in the order in which the test runs were conducted (i.e., FIG. 43A corresponds to the R(T) curve for the first test run, FIG. 43B corresponds to the R(T) curve for the second test run, etc.) FIGS. 43A to 43D and 43H correspond to the R(T) curves for test runs where the sample was driven by 200 nA of DC current. FIGS. 43E to 43G correspond to the R(T) curves for test runs where the sample was driven by 100 nA of DC current. Other than the determination of the delta-mode resistance form the voltage measurement, no other smoothing, averaging or other data processing was used.

Figure 43I:
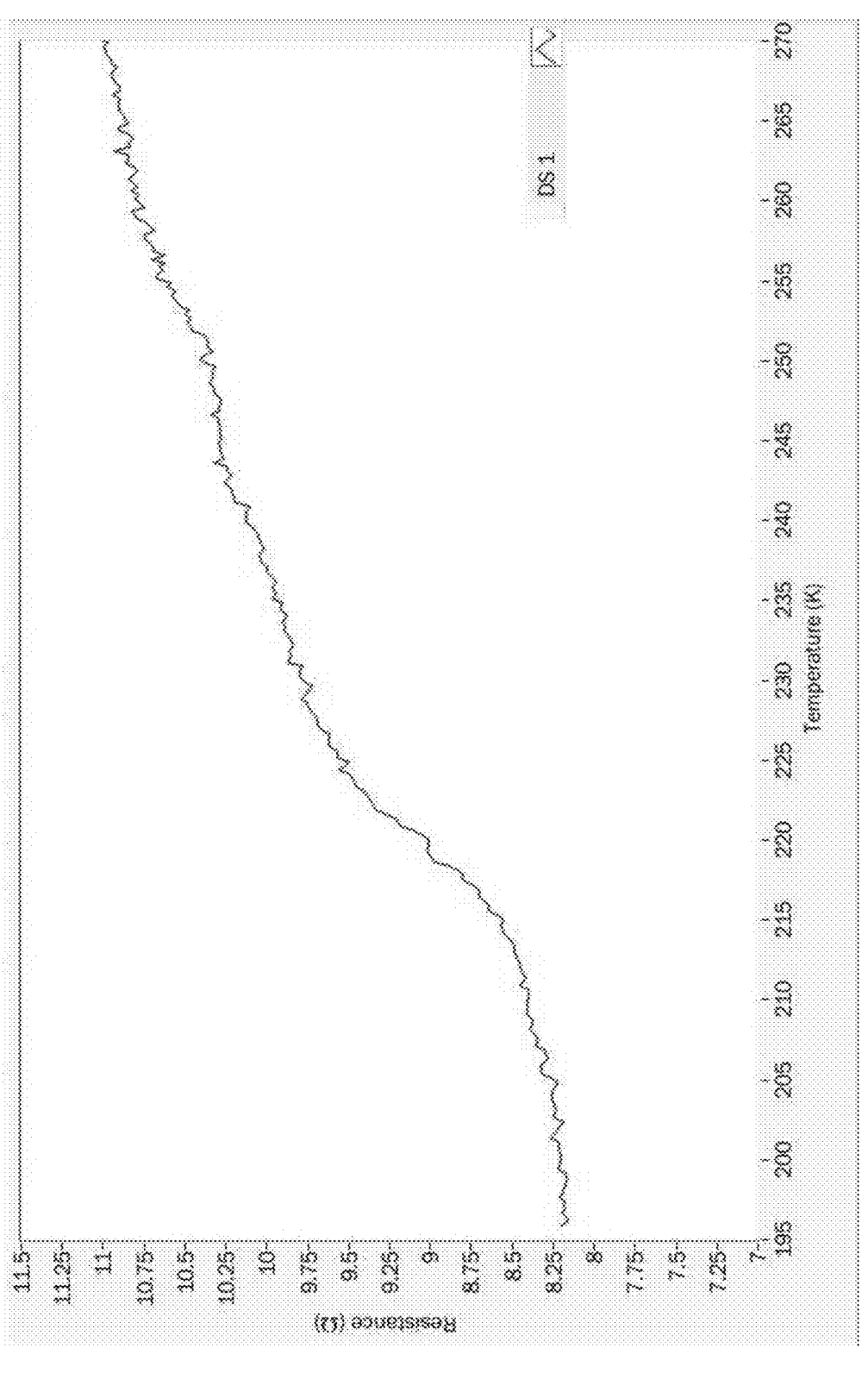

FIG. 43I corresponds to the R(T) curve of a single test run of the sample in a different test bed and under different conditions of those of FIGS. 43A to 43H. In particular, during this test run, a SR830 lock-in amplifier (LIA) was employed, and the sample was driven by 200 nA of AC current at 24 Hz, using a 1 second time constant.

As illustrated, all of the test runs include one or more changes in the respective R(T) curve in roughly the range of 210 K-240 K. These changes in the slope of the R(T) curve are believed to be consistent with portions of the sample entering a reduced resistance or ELR state. As would be appreciated, similar changes are not observed in either the R(T) curves of YBCO or NBCO.

Some implementations of the invention may comprise alternating layers having thicknesses greater or less than those described above with regard to FIG. 42. In some implementations of the invention, at least one of the layers in the superlattice may be one, two, three or more unit cells thick. In some implementations of the invention, each of the layers in the alternating pair of layers in the superlattice may be one, two, three or more unit cells thick. In some implementations of the invention, a thickness of one layer in a pair (or other grouping) of alternating layers is different from a thickness of the other layer in the pair. In some implementations of the invention, a thickness of the layers of one pair of alternating layers in the superlattice differs from a thickness of the layers of another pair of alternating layers in the superlattice. Other thicknesses may be used as would be appreciated to achieve various operational characteristics as discussed herein.

Some implementations of the invention may comprise multiple Re atoms within a single layer, such as a layer having multiple Re atoms with different sizes with respect to one another. For example, a ReBCO layer may have a lattice structure where 4 out of every 5 Re atoms is a Y atom, and every $5^{th}$ atom is a Dy atom. These types of layers, which include two or more rare earth atoms within their crystalline structures, may introduce additional strain forces within a composition due to ordering effects, localized lattice mismatches, additional vibrational constants, and so on.

Some implementations of the invention may comprise Re atoms which are selected based on their oxidation states. For example, although Y and Nd have one oxidation state (3+), the elements Samarium (Sm), Europium (Eu), Erbium (Er), Thulium (Tm), and Ytterbium (Yb) may have two oxidation states of $3^+$ and $2^+$, and Cesium (Ce) and Terbium (Tb) may have two oxidation states of $3^+$ and $4^+$. Other Re atoms with other oxidation states may be selected as would be appreciated. In such implementations, Re atoms with variable oxidation states in an ELR layer of a composition may assist in fixing oxygen sites and/or carrier defects within a crystalline structure or aperture of the crystalline structure, and/or may stabilize a local amount of more or less oxygen in a certain layer, among other benefits. For example, a layer of ELR material within a superlattice may include mostly Y atoms as the Re atoms, along with a few Ce $3^+$ atoms and a few Ce $4^+$ atoms to be used in controlling the oxygen/carrier defects within such layer, among other things.

In some implementations of the invention, a layer of material having a very low oxygen affinity (e.g., gold) is formed on an outermost layer of ELR material in the superlattice to reduce a rate at which oxygen diffuses out of or into various ones of the layers of the superlattice. In some implementations of the invention, a layer of material having a very low oxygen affinity (e.g., gold) is formed on all outermost surfaces of the superlattice to reduce a rate at which oxygen diffuses out of or into various ones of the layers of the superlattice.

In some implementations of the invention, various manufacturing processes used in creating a superlattice of layers of ELR material may introduce a desired strain into a material. For example, when depositing layers of ELR material on a substrate, varying a temperature of the substrate and/or the oxygen partial pressures during the depositions may allow the materials to be deposited at their "natural" temperature, and strain would be introduced as the materials cool below the deposition temperatures, among other things.

Thus, some implementations of the invention may comprise a superlattice, where, in effect, each layer within the superlattice may act to modify adjoining layers, among other things. In other word, a layer may correspond to both an ELR material in and of itself, and as a modifying material to another layer of ELR material, such that layers within the superlattice together form a modified ELR material. According to various implementations of the invention, a composition of various different layers of ELR material, varying in type, oxygen content, Re atom type, orientation, and so on, may provide sufficient strain to one or more layers of the composition such that these layers exhibit lower or extremely low resistance to current carried within or between the layers, among other benefits.

According to various implementations of the invention, the compositions 100, 200, 300, 400, 500, and/or 600 of this section, whether used in bulk, incorporated into films or tapes, or utilized in other ways (e.g., wires, foils, nanowires, and so on) may be incorporated into various apparatuses and associated devices, as described herein. For example, the compositions may be utilized by and/or incorporated into capacitors, inductors, transistors, conductors and conductive elements, integrated circuits, antennas, filters, sensors, magnets, medical devices, power cables, energy storage devices, transformers, electrical appliances, mobile devices, computing devices, information storage devices, and other devices and systems that transfer electrons and/or information when in use.

Thus, in some implementations, forming and/or integrating the modified ELR materials described herein into various current carrying components enables and/or facilitates the implementation of the modified ELR materials into devices and systems that utilize, generate, transform and/or transport electric energy, such as electric current. These devices and systems may benefit from the improved operating characteristics by operating more efficiently in comparison to conventional devices and systems, operating more cost-effectively in comparison to conventional devices and systems, operating less wastefully in comparison to conventional devices and systems, and so on.

In some implementations, a composition of matter comprises a first layer of ELR material having a crystalline structure; and a second layer of material formed on the first layer that applies a strain within at least a portion of the crystalline structure of the ELR material. In some implementations, the second layer of material applies a controlled strain within at least a portion of a crystalline structure of the ELR material. In some implementations, the second layer of material applies a strain within a location of the crystalline structure of the ELR material that includes a charge plane. In some implementations, the second layer of material applies a strain within a location of the crystalline structure of the ELR material that includes an aperture of the crystalline structure.

In some implementations, a composition that conducts current, comprises a first layer of ELR material having a copper oxide charge plane; and a second layer of material formed on the first layer that induces a strain within at least a portion of the first layer of ELR material that contains the copper oxide charge plane. In some implementations, the second layer of material induces an external strain to the at least of the first layer of ELR material. In some implementations, the second layer of material induces an internal strain within the at least of the first layer of ELR material. In some implementations, the second layer of material induces a diffusion of oxygen atoms within the first layer of ELR material. In some implementations, the second layer of material induces a diffusion gradient of oxygen atoms within the first layer of ELR material.

In some implementations, a composition comprises a conductive material having a crystalline structure; and a material formed on the conductive material that causes a force to be applied to or within a portion of the crystalline structure of the conductive material. In some implementations, the conductive material is a rare earth copper oxide material, and the material that causes a force to be applied to a portion of the crystalline structure of the conductive material is a metal having a high oxygen affinity.

In some implementations, a composition comprises a first ELR material having a crystalline structure; and a second ELR material formed on the first ELR material, the second ELR material causing a force within a portion of the crystalline structure of the first ELR material.

In some implementations, a composition comprises a first ELR material; and a second ELR material having a crystalline structure, the second ELR material formed on the first ELR material, the first ELR material causing a force within a portion of the crystalline structure of the second ELR material.

In some implementations, a composition comprises a first ELR material having a crystalline structure; and a second ELR material having a crystalline structure, the second ELR material formed on the first ELR material, the second ELR material causing a force within a portion of the crystalline structure of the first ELR material and the first ELR material causing a force within a portion of the crystalline structure of the second ELR material.

In some implementations, a composition comprises a first layer of an ELR material having a first form; a second layer of the ELR material having a second form, wherein the second layer is formed on the first layer; and a third layer of the ELR material having the first form, wherein the third layer is formed on the second layer.

In some implementations, a composition comprises a first layer of YBCO; and a plurality of layers formed on a top surface of the YBCO, the plurality of layers comprising pairs of alternating layers of NBCO and YBCO. In some implementations, a thickness of the first layer of YBCO is approximately 200 nanometers and a thickness of each of the layers within the plurality of layers is approximately 10 nanometers. In some implementations, the plurality of layers comprises ten pairs of alternating layers of NBCO and YBCO. In some implementations, the plurality of layers comprises at least two pairs of alternating layers of NBCO and YBCO.

In some implementations, a composition for propagating current, the composition comprises a plurality of layers comprising at least one pair of alternating layers of NBCO and YBCO. In some implementations, the group of layers comprises at least ten pairs of alternating layers of NBCO and YBCO. In some implementations, a substrate having a surface substantially perpendicular to an a-axis of the substrate; a layer of YBCO applied to the surface of the substrate, the layer of YBCO having a surface substantially perpendicular to an a-axis of the YBCO; and wherein the group of layers are applied to the surface of the YBCO.

In some implementations, a composition comprises a base layer of YBCO, the base layer having a surface substantially parallel to a c-axis of the YBCO; a first layer of NBCO formed on the surface of the base layer of YBCO, the first layer of NBCO having a surface substantially parallel to a c-axis of the NBCO; a first layer of YBCO formed on the surface of the first layer of NBCO, the first layer of YBCO having a surface substantially parallel to a c-axis of the YBCO; a second layer of NBCO formed on the surface of the first layer of YBCO, the second layer of NBCO having a surface substantially parallel to a c-axis of the NBCO; a second layer of YBCO formed on the surface of the second layer of NBCO, the second layer of YBCO having a surface substantially parallel to a c-axis of the YBCO; a third layer of NBCO formed on the surface of the second layer of YBCO, the third layer of NBCO having a surface substantially parallel to a c-axis of the NBCO; a third layer of YBCO formed on the surface of the third layer of NBCO, the third layer of YBCO having a surface substantially parallel to a c-axis of the YBCO; a fourth layer of NBCO formed on the surface of the third layer of YBCO, the fourth layer of NBCO having a surface substantially parallel to a c-axis of the NBCO; a fourth layer of YBCO formed on the surface of the fourth layer of NBCO, the fourth layer of YBCO having a surface substantially parallel to a c-axis of the YBCO; a fifth layer of NBCO formed on the surface of the fourth layer of YBCO, the fifth layer of NBCO having a surface substantially parallel to a c-axis of the NBCO; a fifth layer of YBCO formed on the surface of the fifth layer of NBCO, the fifth layer of YBCO having a surface substantially parallel to a c-axis of the YBCO; a sixth layer of NBCO formed on the surface of the fifth layer of YBCO, the sixth layer of NBCO having a surface substantially parallel to a c-axis of the NBCO; a sixth layer of YBCO formed on the surface of the sixth layer of NBCO, the sixth layer of YBCO having a surface substantially parallel to a c-axis of the YBCO; a seventh layer of NBCO formed on the surface of the sixth layer of YBCO, the seventh layer of NBCO having a surface substantially parallel to a c-axis of the NBCO; a seventh layer of YBCO formed on the surface of the seventh layer of NBCO, the seventh layer of YBCO having a surface substantially parallel to a c-axis of the YBCO; an eighth layer of NBCO formed on the surface of the seventh layer of YBCO, the eighth layer of NBCO having a surface substantially parallel to a c-axis of the NBCO; an eighth layer of YBCO formed on the surface of the eighth layer of NBCO, the eighth layer of YBCO having a surface substantially parallel to a c-axis of the YBCO; a ninth layer of NBCO formed on the surface of the eighth layer of YBCO, the ninth layer of NBCO having a surface substantially parallel to a c-axis of the NBCO; a ninth layer of YBCO formed on the surface of the ninth layer of NBCO, the ninth layer of YBCO having a surface substantially parallel to a c-axis of the YBCO; a tenth layer of NBCO formed on the surface of the ninth layer of YBCO, the tenth layer of NBCO having a surface substantially parallel to a c-axis of the NBCO; and a tenth layer of YBCO formed on the surface of the tenth layer of NBCO, the tenth layer of YBCO having a surface substantially parallel to a c-axis of the YBCO. In some implementations, the composition further comprises a layer of gold formed on the surface of the tenth layer of YBCO. In some implementations, the composition further comprises a layer of gold substantially encasing the composition.

Devices Formed of and/or Incorporating ELR Materials

Various devices, applications, components, apparatuses, and/or systems may employ the ELR materials described herein. These devices, applications, components, apparatuses and/or systems are now discussed in greater detail in the following Chapters.

Chapter 1—Nanowires Formed of ELR Materials

This chapter of the description refers to FIGS. 1-36 and FIGS. 37-53; accordingly all reference numbers included in this section refer to elements found in such figures.

Figure 46:
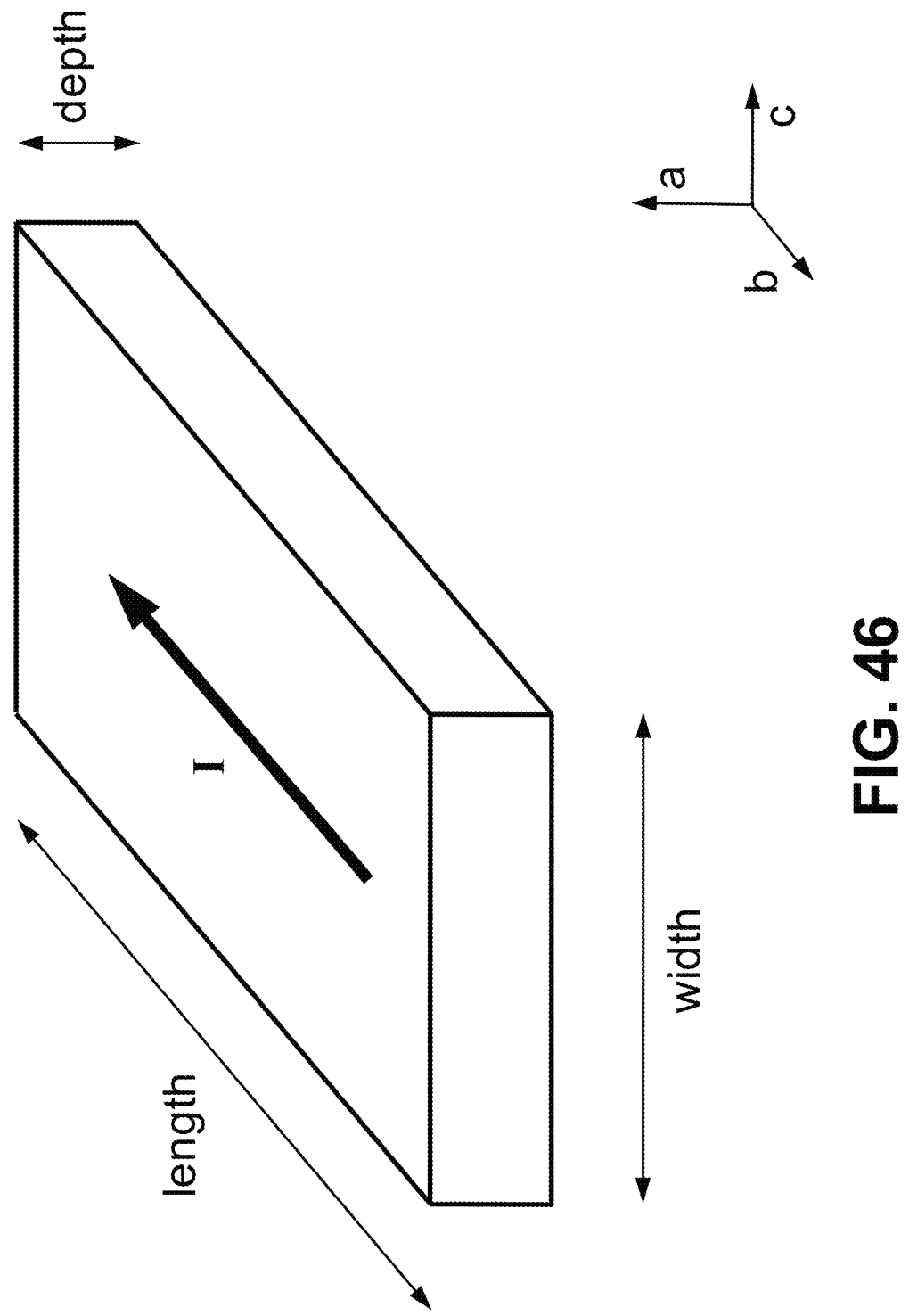

In various implementations of the invention, ELR materials may be used to form various nanowires and nanowire components as will be described in further detail below. Accordingly, in some implementations of the invention, these ELR materials may be formed into various nanowire components so that current is primarily conducted along a b-axis of the ELR material. In these implementations, the ELR material may be formed with a length referenced to the b-axis, a width referenced to the c-axis, and a depth (or thickness) referenced to the a-axis as illustrated in FIG. 46, although other reference frames, orientations and configurations may be used for ELR materials as will become apparent from this description. The reference frame depicted in FIG. 46 will be used for the following discussion.

In some implementations of the invention, various ELR materials may be used to form nanowires. In conventional terms, nanowires are nanostructures that have widths or diameters on the order of tens of nanometers or less and generally unstrained lengths. In some implementations of the invention, various modified ELR materials 1060 may be formed into nanowires having a width and/or a depth of 50 nanometers. In some implementations of the invention, various modified ELR materials 1060 may be formed into nanowires having a width and/or a depth of 40 nanometers. In some implementations of the invention, various modified ELR materials 1060 may be formed into nanowires having a width and/or a depth of 30 nanometers. In some implementations of the invention, various modified ELR materials 1060 may be formed into nanowires having a width and/or a depth of 20 nanometers. In some implementations of the invention, various modified ELR materials 1060 may be formed into nanowires having a width and/or a depth of 10 nanometers. In some implementations of the invention, various modified ELR materials 1060 may be formed into nanowires having a width and/or a depth of 5 nanometers. In some implementations of the invention, various modified ELR materials 1060 may be formed into nanowires having a width and/or a depth less than 5 nanometers. In some implementations of the invention, various new ELR materials designed as described above may be formed into nanowires having a width and/or a depth of 50 nanometers. In some implementations of the invention, various new ELR materials designed as described above may be formed into nanowires having a width and/or a depth of 40 nanometers. In some implementations of the invention, new ELR materials designed as described above may be formed into nanowires having a width and/or a depth of 30 nanometers. In some implementations of the invention, various new ELR materials designed as described above may be formed into nanowires having a width and/or a depth of 20 nanometers. In some implementations of the invention, various new ELR materials designed as described above may be formed into nanowires having a width and/or a depth of 10 nanometers. In some implementations of the invention, various new ELR materials designed as described above may be formed into nanowires having a width and/or a depth of 5 nanometers. In some implementations of the invention, various new ELR materials designed as described above may be formed into nanowires having a width and/or a depth less than 5 nanometers.

In some implementations of the invention, nanowires may be stacked on top of one another with a buffer and/or substrate layer disposed in between to form layered nanowires. Each of the nanowires disposed in each layer may be formed from new ELR materials or modified ELR materials 1060 as discussed above and may have any of the widths and/or depths set forth above.

In some implementations of the invention, nanowires may be used to carry charge from a first end to a second end. Each of these ends may be connected to an electrical component including, but not limited to, another nanowire, a wire, a trace, a lead, an interconnect, an electronic device, an electronic circuit, a semiconductor device, a transistor, a memristor, a resistor, a capacitor, an inductor, a MEMs device, a pad, a voltage source, a current source, a ground, or other electrical component. In some implementations of the invention, nanowires may be coupled to may be coupled directly to one or more of these electrical components via the ELR material of the nanowire. In some implementations of the invention, nanowires may be coupled indirectly to these electrical components via another type of ELR material (i.e., modified versus unmodified ELR material, an ELR material in the same family or class of ELR materials, etc.). In some implementations of the invention, nanowires may be coupled indirectly to these electrical components via a conductive material, including but not limited to, a conductive metal.

Figure 44:
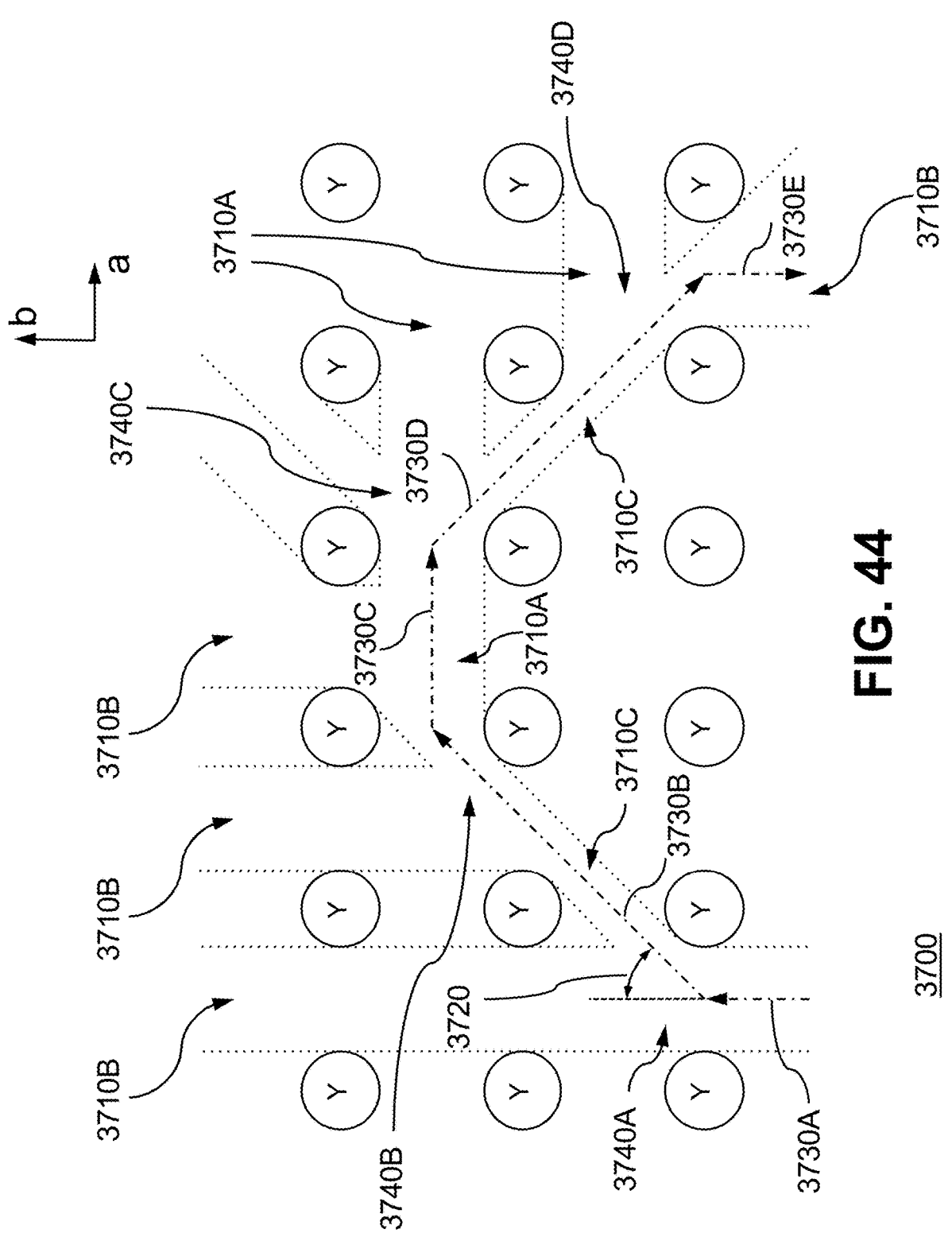

FIG. 44 illustrates a cross-section of an exemplary ELR material 3700 parallel to the c-plane and through the centers of apertures 3710 formed in ELR material 3700 in accordance with various implementations of the invention. For purposes of the following discussion and implementations of the invention, ELR material 3700 corresponds to conventional ELR materials (i.e., unmodified superconducting and/or HTS materials (e.g., unmodified YBCO, etc.)) as well as various modified ELR materials 1060 and new ELR materials, various implementations of which are described above. FIG. 44 illustrates various apertures 3710 through ELR material 3700 including a-axis apertures 3710A, b-axis apertures 3710B, and ab-axis apertures 3710C. A-axis apertures 3710A correspond to apertures 3710 through ELR material 3700 that are substantially parallel to the a-axis; b-axis apertures 3710B correspond to apertures 3710 through ELR material 3700 that are substantially parallel to the b-axis; ab-axis apertures 3710C correspond to apertures 3710 through ELR material 3700 that are substantially parallel to various axes in the c-plane offset from the a-axis (or the b-axis) by various angles, such as an angle 3720. As would be appreciated, not all apertures 3710 through ELR material 3700 are illustrated in FIG. 44—many have not been illustrated for purposes of clarity and ease of illustration.

As would also be appreciated, apertures 3710 are dependent upon the crystalline structure of ELR material 3700. For example, as illustrated in FIG. 44, ab-axis apertures 3710C of ELR material 3700 (which in this example corresponds to YBCO) exist at an angle of +/−45 degrees from the a-axis. By way of further example, FIG. 45 illustrates a b-axis aperture 3710B in ELR material 3700 relative to an ab-axis aperture 3710C in exemplary ELR material 3700. Other ab-axis apertures 3710C may exist in other ELR materials, including additional ab-axis apertures 3710C at other angles (e.g., +/−30 degrees, +/−60 degrees, etc.) as would be appreciated. Similarly, while a-axis apertures 3710A and b-axis apertures 3710B are illustrated in FIG. 44 as orthogonal to one another in ELR material 3700, other orientations of such apertures 3700 may exist depending on the crystalline structure of other ELR materials as would be appreciated.

Conventional superconducting materials, including HTS materials, exhibit various phenomenon typically associated with such superconducting materials. In addition to extremely low resistance, these superconducting materials exhibit the Meissner effect which manifests as an apparent absence or expulsion of electromagnetic fields from the interior of the superconducting materials as would be appreciated. The Meissner effect is believed to be the result of vortices, or loop currents, formed in the interior of the superconducting material. These vortices are believed to produce magnetic fields in the interior of the superconducting material that, in the aggregate, tend to cancel one another out, thereby creating the apparent absence or expulsion of the electromagnetic fields in the interior. Controlling (or eliminating) these vortices may control (or eliminate) the Meissner effect exhibited by the superconducting material. In other words, controlling (or eliminating) these vortices may prevent the net cancellation of magnetic fields in the interior of the superconducting material.

Vortices are believed to be formed within ELR material 3700 when current "loops back" on itself within ELR material 3700. This is now described with reference to current path 3730 (illustrated in FIG. 44 as a current path 3730A, a current path 3730B, a current path 3730C, a current path 3730D, and a current path 3730E). As illustrated, as a current flows through ELR material 3700, the current may proceed along current path 3730A through an aperture 3710A. The current proceeds through aperture 3710A until reaching an intersection between various apertures 3710 in ELR material 3700, namely intersection 3740A.

At intersections 3740 generally, current is believed to be capable of deviating from its current "straightline" path in one aperture 3710 to another path through a different aperture 3710. For example, when reaching intersection 3740A, the current may continue along current path 3730A through aperture 3710A or deviate in some fashion from current path 3730A, such as along current path 3730B through aperture 3710B. As illustrated, the current has deviated by 45 degrees from its original path on current path 3730A to current path 3730B.

After current deviates from current path 3730A to current path 3730B, current proceeds along current path 3730B through aperture 3710C until reaching intersection 3740B.

Again, the current may continue along current path 3730B through aperture 3710C or deviate in some fashion from current path 3730B, such as along current path 3730C through aperture 3710B. As illustrated, the current has deviated by a total of 90 degrees from its original path (by two 45-degree deviations). This process may continue as the current reaches other intersections, such as intersection 3740C and intersection 3740D. At intersection 3740C, the current may deviate from current path 3730C through aperture 3710B to current path 3730D through aperture 3710C, and at intersection 3740D, the current may deviate from current path 3730D through aperture 3710C to current path 3730E through aperture 3710A. As illustrated, at current path 3730E, the current has deviated by a total of 180 degrees from its original path (by four 45-degree deviations). While not otherwise illustrated, this process may continue until the current loops back on itself along current path 3730A as would be appreciated.

FIG. 44 illustrates that there may be a threshold depth of ELR material 3700 (which as illustrated in FIG. 46, depth is referenced to the a-axis) necessary for current loops to form in ELR material 3700. More particularly, as illustrated in FIG. 44, a depth of ELR material 3700 sufficient to include five adjacent apertures 3710B may be necessary for current loops to form in ELR material 3700. In other words, fewer than this number of apertures 3710B may not provide a sufficient number of deviations (or turns) and subsequent paths for current to loop back on itself within this threshold depth of ELR material 3700. If the depth of ELR material 3700 is less than this threshold depth, then loop currents may not form in ELR material 3700 thereby preventing the Meissner effect from occurring. Similarly, FIG. 44 illustrates that there may be a threshold length (which as illustrated in FIG. 46, length is referenced to the b-axis) of ELR material 3700 necessary for current loops to form in ELR material 3700. More particularly, as extrapolated from FIG. 44, a length of ELR material 3700 sufficient to include five adjacent apertures 3710B may be necessary for current loops to form in ELR material 3700. If the length of ELR material 3700 is less than this threshold length, then loop currents may not form in ELR material 3700 thereby preventing the Meissner effect from occurring. These threshold depths and/or lengths may be different for other ELR materials with having crystalline structures other than that depicted in FIG. 44, more or fewer apertures, apertures with different directions, apertures at different deviation angles, etc., as would be appreciated.

Furthermore, these threshold depths and/or lengths presume that current may deviate by a single turn at each intersection 3740. In other words, the current is presumed in the example illustrated to deviate only in increments of +/−45 degrees (as opposed to 90 degrees or more) at each intersection 3740. If larger incremental deviations may occur or if deviations occur at locations other than intersections 3740, then the threshold depth and/or threshold length of ELR material 3700 where the Meissner effect (or other superconducting phenomenon) does not occur may be less as would be appreciated. Similarly, if deviations may only occur at certain intersections 3740 (and not all intersections 3740), then the threshold depth and/or threshold length of ELR material 3700 where the Meissner effect (or other superconducting phenomenon) does not occur may be more as would be appreciated. Nonetheless, according to various implementations of the invention, ELR material 3700 has a threshold depth and/or a threshold length necessary to form loop currents.

According to various implementations of the invention, a nanowire may be formed using an ELR material, where the nanowire exhibits extremely low resistance but does not exhibit certain other superconductivity phenomenon (e.g., the Meissner effect) by controlling one or more dimensional parameters of the nanowire. For example, according to various implementations of the invention, a depth of the nanowire is selected to be less than the threshold depth of ELR material necessary for loop currents to form in the ELR material. According to various implementations of the invention, a length of the nanowire is selected to be less than the threshold length of ELR material necessary for loop currents to form in the ELR material. According to various implementations of the invention, the depth and the length of the nanowire may be less than those thresholds necessary for loop currents to form in the ELR material. These nanowires may then appear as perfect conductors along their depth and/or length without exhibiting other superconducting phenomenon. Stated differently, according to various implementations of the invention, nanowires have a threshold depth or a threshold length (and in some implementations and/or with some ELR materials, potentially a threshold width) within which the nanowires operate as perfect conductors and beyond which the nanowires operate as superconductors. While discussed above in terms of a threshold depth and/or a threshold length of ELR material 3700, it will be appreciated from FIG. 44 that in some instances loop currents may actually require a threshold area of ELR material 3700 to form.

For purposes of this description, these thresholds may be expressed in terms of a number of adjacent apertures 3710 along a given dimension, a number of unit crystals along a given dimension, or other number of unit measures associated with the crystalline structure of ELR material 3700 as would be appreciated. As would also be appreciated, these thresholds may be expressed in terms of units of measure (nanometers, Angstroms, etc.).

According to various implementations of the invention, nanowires that operate as perfect conductors may be formed of any length of ELR material 3700 provided that their depth does not exceed a threshold depth as discussed above. Likewise, according to various implementations of the invention, nanowires that operate as perfect conductors may be formed of any depth of ELR material 3700 provided that their length does not exceed a threshold length as discussed above. More particularly, according to various implementations of the invention, nanowires that operate as perfect conductors and that do not exhibit the Meissner effect may be formed of any length of ELR material 3700A provided that their depth does not exceed a threshold depth as discussed above. Likewise, according to various implementations of the invention, nanowires that operate as perfect conductors and that do not exhibit the Meissner effect may be formed of any depth of ELR material 3700 provided that their length does not exceed a threshold length as discussed above.

As would be appreciated, changing an orientation of the ELR material in FIG. 46 would change the relevant threshold dimensions necessary for the Meissner effect to occur. For example, if the ELR material were oriented such that the a-axis and the c-axis were interchanged (i.e., the depth was referenced to the c-axis and the width was referenced to the a-axis), then width and/or length would be the dimensional parameters to control to avoid the Meissner effect as would be appreciated.

As mentioned above, nanowires may be formed from ELR material 3700, which may include conventional ELR materials (e.g., unmodified YBCO, etc.), modified ELR materials (e.g., ELR material 1060, chromium-modified YBCO, etc.), new ELR materials, or other ELR materials. Further, in some implementations of the invention, nanowires may be formed by depositing ELR material 3700 onto a substrate or buffer material as would be appreciated. In some implementations of the invention, nanowires may be formed by affixing ELR material 3700 onto a substrate such as a circuit board as would be appreciated.

In some implementations of the invention, such as those that utilize modified ELR materials (e.g., modified ELR material 1060), nanowires may be formed and operated above certain temperatures where only a portion of a modified ELR material 1060 has apertures 310 maintained at that certain temperature, and this portion of modified ELR material 1060 has a depth less that the threshold depth above which loop currents may be formed. For example, with reference to FIG. 23, modified ELR material 1060 may be operated at a certain temperature where only apertures 310A and 310B are maintained. In this example, apertures 310A and 310B may not correspond to a sufficient depth of modified ELR material 1060 to form loop currents in modified ELR material 1060 and the Meissner effect may not occur.

Figures 47A, 47B:
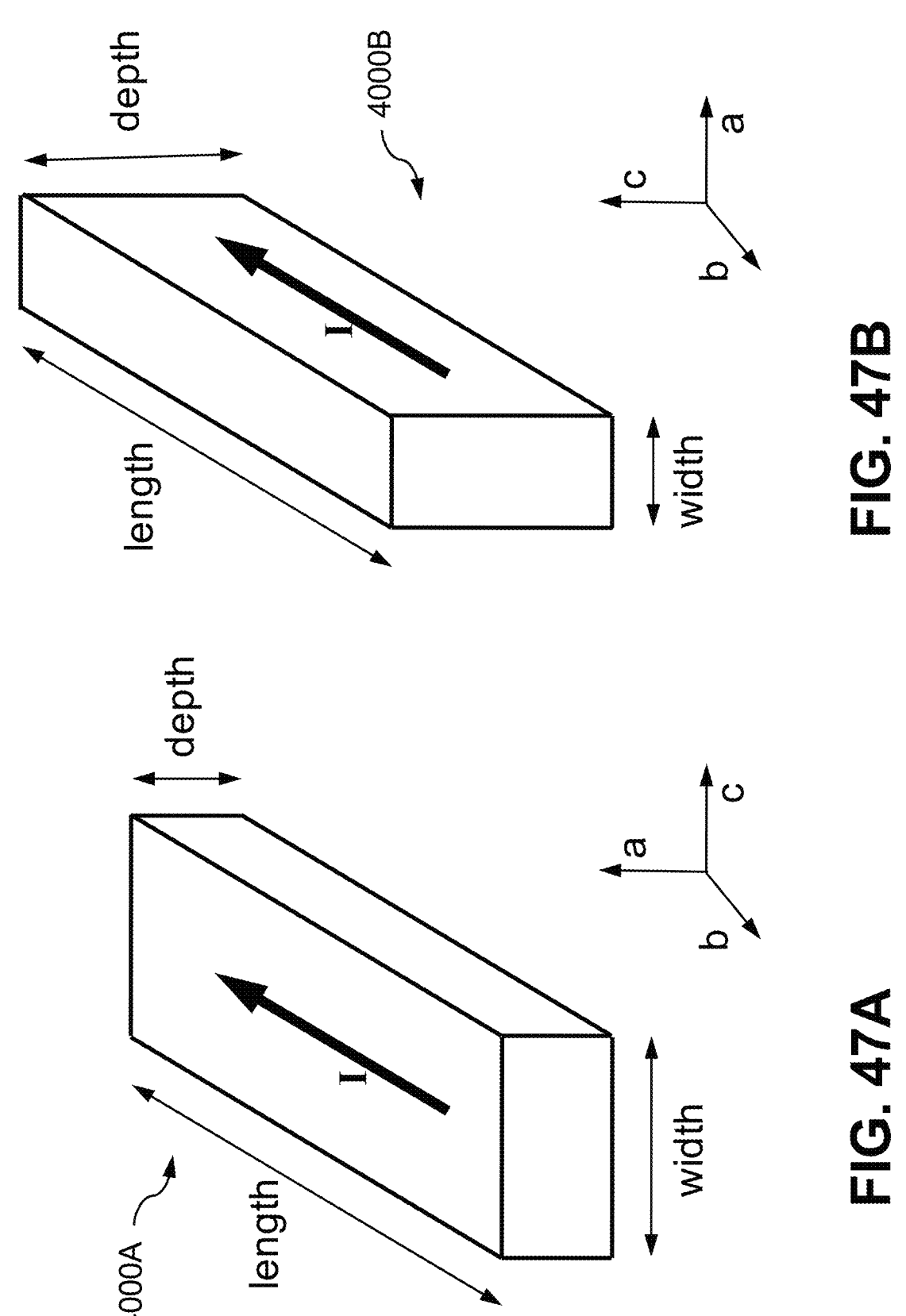

According to various implementations of the invention, nanowires may be used to form various electrical components, including, but not limited to, a nanowire connector, a nanowire contour, a nanowire coil, and a nanowire converter. FIG. 47 illustrates examples of a nanowire connector 4000 according to various implementations of the invention. More particularly, FIG. 47A illustrates a nanowire connector 4000A formed from a nanowire including an ELR material oriented in a manner similar to that of FIG. 46 and described above, where the depth of the nanowire is less than the threshold depth necessary for loop currents to form in the ELR material. FIG. 47B illustrates a nanowire connector 4000B formed from a nanowire including the ELR material oriented in a manner where the a-axis and the c-axis are interchanged from that of FIG. 46, where the width of the nanowire is less than the threshold width necessary for loop currents to form in the ELR material. Other nanowire connectors 4000 may be formed from nanowires that include ELR materials in different orientations as would be appreciated. In some implementations of the invention, nanowire connector 4000 includes a nanowire that is a perfect conductor but that does not exhibit all the characteristics of a superconductor. In some implementations of the invention, nanowire connector 4000 includes a nanowire that is a perfect conductor that does not exhibit the Meissner effect. In some implementations of the invention, nanowire connector 4000 includes a nanowire that is formed from a conventional HTS material with a dimensional parameter controlled so that the nanowire operates as a perfect conductor but does not exhibit the Meissner effect. In some implementations of the invention, nanowire connector 4000 includes a nanowire that is formed from a modified ELR material 1060 with a dimensional parameter controlled so that the nanowire operates as a perfect conductor but does not exhibit the Meissner effect. In some implementations of the invention, nanowire connector 4000 includes a nanowire that is formed from a new ELR material with a dimensional parameter controlled so that the nanowire operates as a perfect conductor but does not exhibit the Meissner effect. As would be appreciated, nanowire connectors 4000 may be used to connect one electrical component to another electrical component (not otherwise illustrated).

Figure 48:
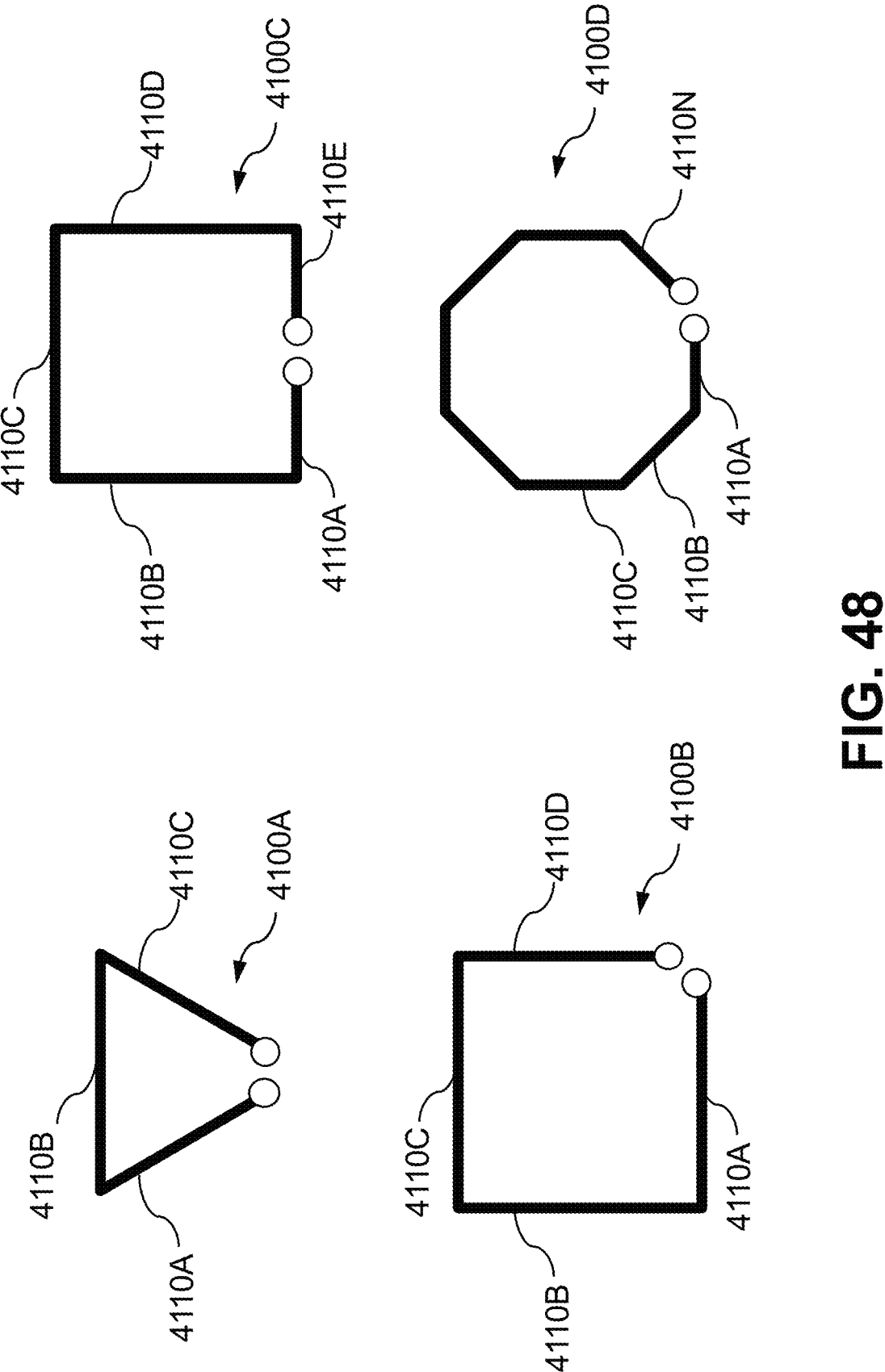

FIG. 48 illustrates various single nanowire contours 4100 that may be formed from individual nanowires or nanowire segments according to various implementations of the invention. In some implementations of the invention, a nanowire contour 4100A includes three nanowire segments 4110, namely a nanowire segment 4110A, a nanowire segment 4110B, and a nanowire segment 4110C. In some implementations of the invention, a nanowire contour 4100B includes four nanowire segments 4110, namely a nanowire segment 4110A, a nanowire segment 4110B, a nanowire segment 4110C, and a nanowire segment 4110D. In some implementations of the invention, a nanowire contour 4100C includes five segments 4110, namely a nanowire segment 4110A, a nanowire segment 4110B, a nanowire segment 4110C, a nanowire segment 4110D, and a nanowire segment 4110E. Nanowire contour 4100C differs from nanowire contour 4100B by the location of a pair of contour terminals. Other locations for contour terminals may be used in these or other nanowire contours 4100 as would be appreciated. In some implementations of the invention, a nanowire contour 4100D includes N nanowire segments 4110, namely a nanowire segment 4110A, a nanowire segment 4110B, a nanowire segment 4110C, . . . , and a nanowire segment 4110N. In some implementations of the invention, individual nanowire segments 4110 of nanowire contours 4100 may be coupled directly to one another via the ELR material of the nanowire. In some implementations of the invention, individual nanowire segments 4110 may be coupled indirectly to one another via a conductive material, including but not limited to, a conductive metal. Leads to nanowire contour 4100 (not otherwise illustrated) may or may not be formed from nanowires. Nanowire contours 4100 may be used for a variety of applications as would be appreciated and may be formed in a variety of shapes and sizes depending upon, for example, such applications. For example, nanowire contour 4100 may be used to form a so-called "current loop," which has various applications involving sensing and/or generating electric fields as would be appreciated.

Figure 49:
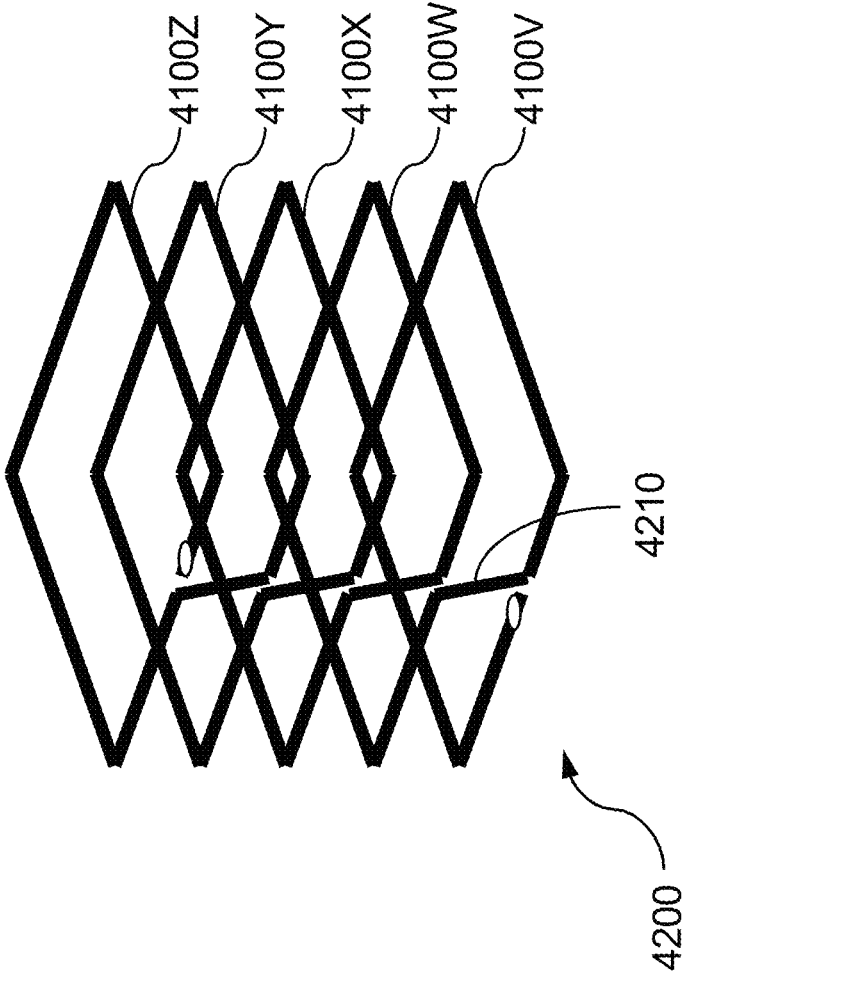

FIG. 49 illustrates an exemplary nanowire coil 4200 that may be formed from one or more individual nanowire contours 4100 according to various implementations of the invention. Individual nanowire contours 4100 may be separated from one another by a substrate or buffer material and coupled to one another by, for example, a coupler 4210. As illustrated, nanowire coil 4200 is formed from a nanowire contour 4100V, a nanowire contour 4100W, a nanowire contour 4100X, a nanowire contour 4100Y, and a nanowire contour 4100Z. While illustrated in FIG. 49 as including five nanowire contours 4100, nanowire coil 4200 may include any number of nanowire contours 4100 as would be appreciated. As also illustrated in FIG. 49, nanowire coil 4200 is configured to conduct current through each nanowire contour 4100 in the same general direction (e.g., clockwise or counter-clockwise). Nanowire coil 4200 may be used for a variety of applications as would be appreciated and may be formed in a variety of shapes and sizes depending upon, for example, such applications.

Figure 50:
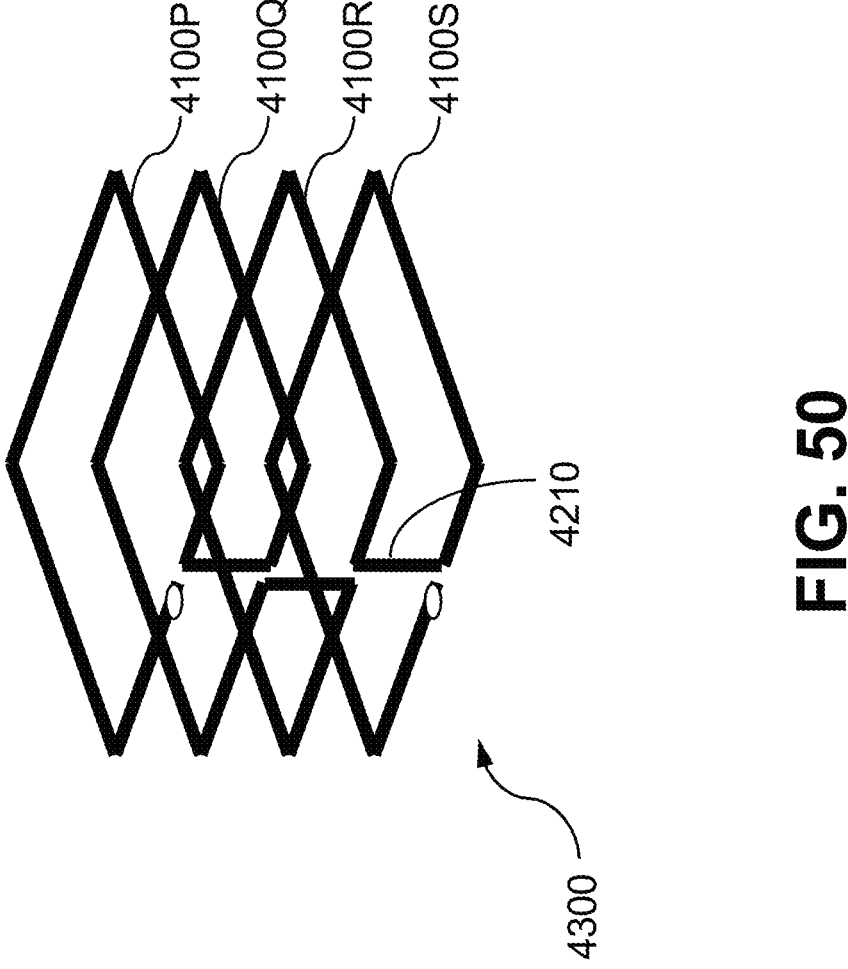

FIG. 50 illustrates a differential nanowire coil 4300 that may be formed from one or more pairs of nanowire contours 4100 according to various implementations of the invention. As illustrated in FIG. 50, nanowire coil 4300 is formed from two pairs of a nanowire contours: a first pair including a nanowire contour 4100P and a nanowire contour 4100Q; and a second pair including a nanowire contour 4100R and a nanowire contour 4100S. While illustrated in FIG. 50 as including two pairs of nanowire contours 4100, any number of pairs may be used in various implementations of the invention. Furthermore, in some implementations of the invention, nanowire coil 4300 may include a single nanowire contour 4100 in addition to one or more pairs of nanowire contours 4100 as would be appreciated. Nanowire contours 4100 in each pair of nanowire contours 4100 are coupled to one another (by, for example, coupler 4210) such that they conduct current in a different direction from one another. For example, as illustrated in FIG. 50, nanowire contour 4100P conducts current in a direction different from that of nanowire contour 4100Q (i.e., one may conduct current clockwise while the other conducts current counter-clockwise). The same is true for nanowire contour 4100R and nanowire contour 4100S. Nanowire coil 4300 may be used for a variety of applications as would be appreciated and may be formed in a variety of shapes and sizes depending upon, for example, such applications.

Figure 51:
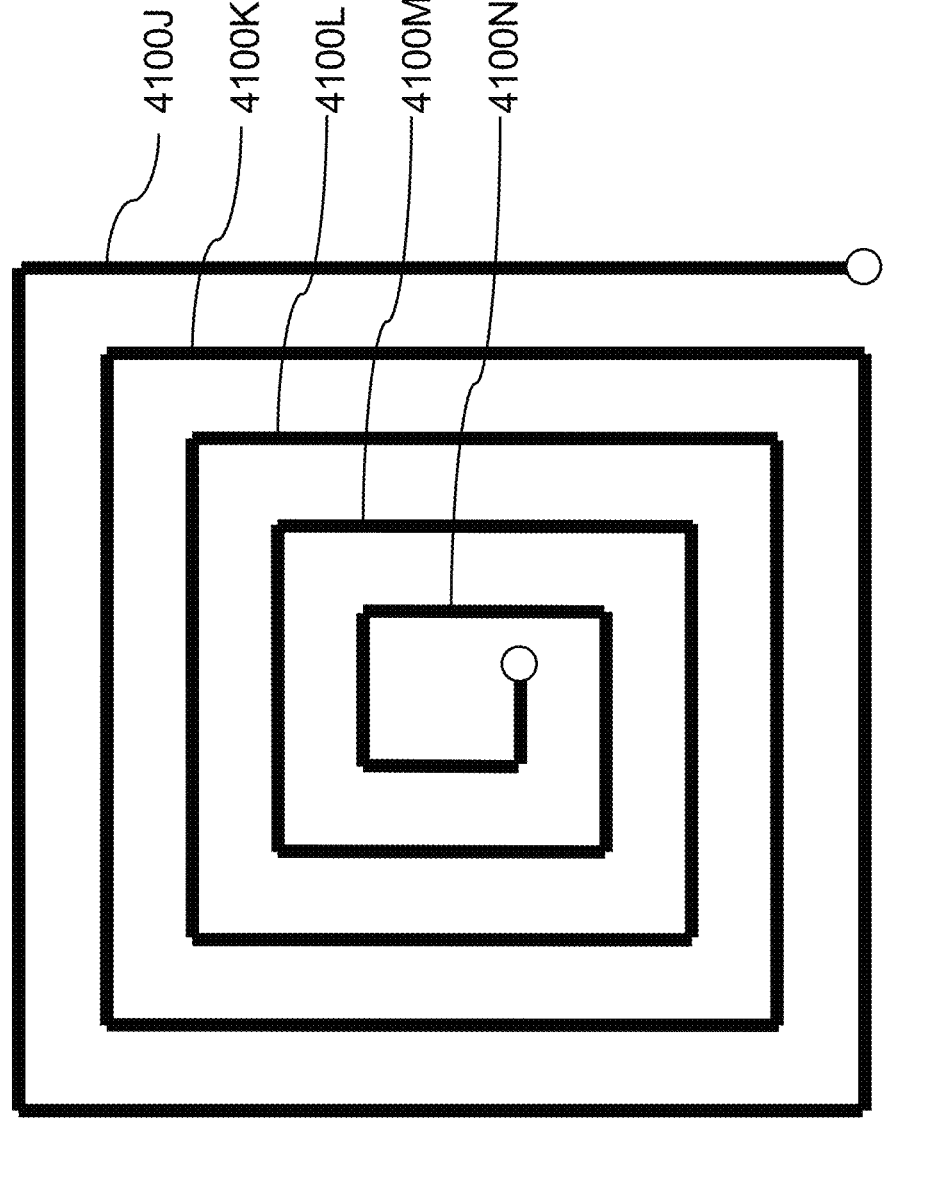

FIG. 51 illustrates a nanowire coil 4400 that may be formed from one or more concentric nanowire contours 4100 according to various implementations of the invention. As illustrated in FIG. 51, nanowire coil 4400 is formed from five nanowire contours 4100, including a nanowire contour 4100J, a nanowire contour 4100K, a nanowire contour 4100L, a nanowire contour 4100M, and a nanowire contour N. While illustrated in FIG. 51 as including five nanowire contours 4100, any number of nanowire contours 4100 may be used in various implementations of the invention. As illustrated in FIG. 51, nanowire contours 4100 are concentric with one another and successive nanowire contours 4100 reduce in size. For example, nanowire contour 4100K fits within and is smaller than nanowire contour 4100J. Likewise, nanowire contour 4100L fits within and is smaller than nanowire contour 4100K; nanowire contour 4100M fits within and is smaller than nanowire contour 4100-L; and nanowire contour 4100N fits within and is smaller than nanowire contour 4100M. As illustrated in FIG. 51, nanowire contours 4100 are coupled to one another to form, for example a "spiral" nanowire coil 4400. Nanowire coil 4400 may be used for a variety of applications as would be appreciated and may be formed in a variety of shapes and sizes. Whereas nanowire coil 4200 and nanowire coil 4300 may be considered as being three-dimensional in nature (i.e., nanowire contours 4100 in each are "stacked" on one another), nanowire coil 4400 may be considered as being two-dimensional in nature (i.e., no stacking of nanowire contours 4100).

Figure 52:
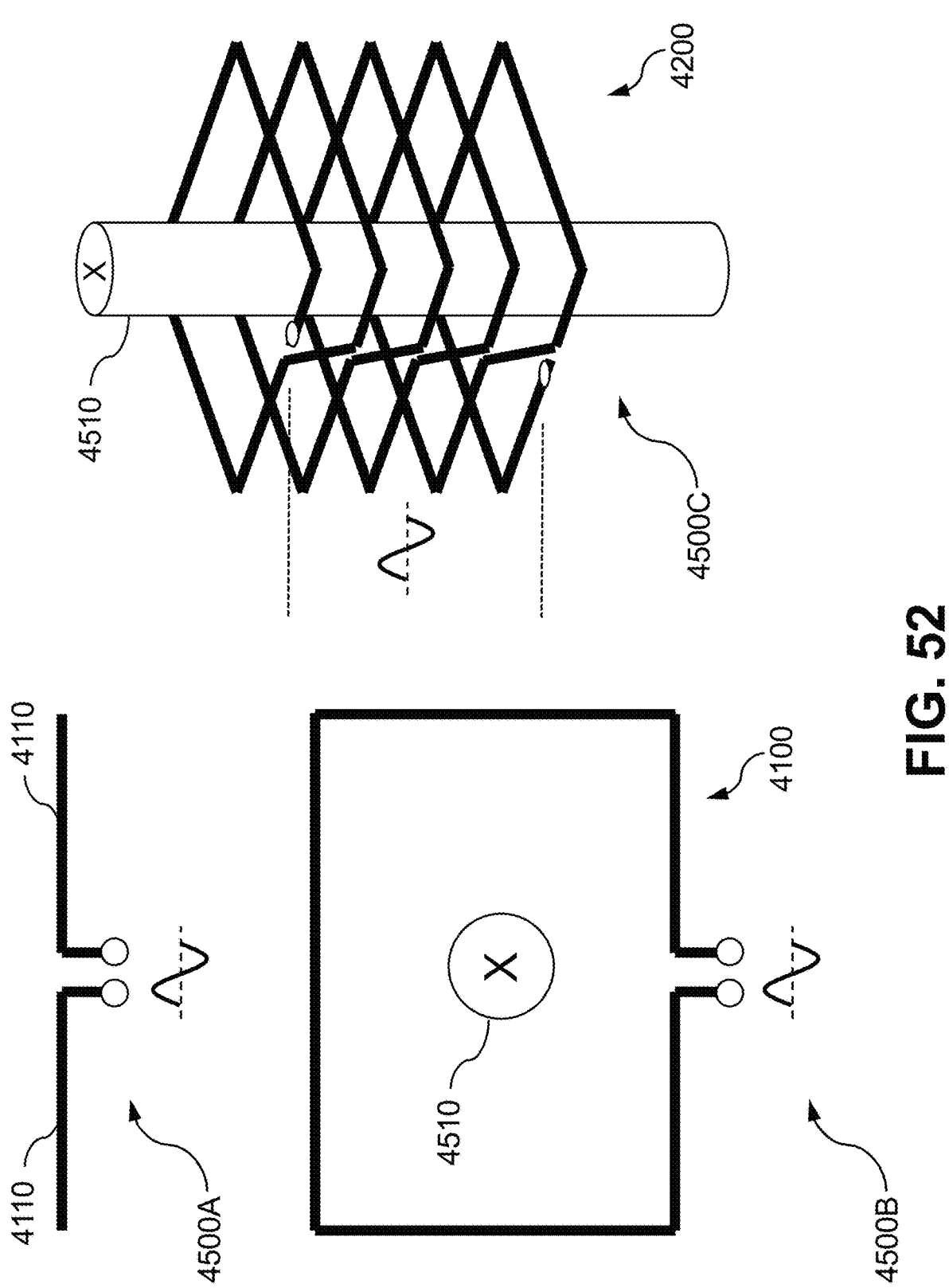
Figure 53:

FIGS. 52 and 53 illustrate various nanowire converters 4500, according to various implementations of the invention, that may be used to convert energy from one form of energy to another form of energy. For example, a nanowire converter 4500A including at least two nanowire segments 4110 configured as a dipole may be used to convert electromagnetic radiation to an alternating voltage (e.g., $V_{rms}$) appearing across its terminals. In this mode, nanowire converter 4500A may be considered as a receiver (i.e., receiving or otherwise responsive to electromagnetic radiation). Conversely, nanowire converter 4500A may be used to convert an alternating voltage appearing across its terminals to electromagnetic radiation. In this mode, nanowire converter 4500A may be considered as a transmitter (i.e., transmitting or otherwise propagating electromagnetic radiation).

By way of another example, a nanowire converter 4500B including a nanowire contour 4100 (and which may also be considered a nanowire coil 4100) may be used to sense a changing current being carried by in a conductor 4510. More particularly, the current carried by conductor 4510 generates an electromagnetic field which in turn produces a current through terminals of nanowire converter 4500B according to well-known principles of physics. Conversely, a changing current applied to terminals of nanowire converter 4500B may be used to induce a current in conductor 4510. The changing current through the terminals of nanowire converter 4500B induces an electromagnetic field which in turn induces a current in conductor 4510.

By way of still further example, a nanowire converter 4500C including a nanowire coil 4200 may be used to sense a changing current being carried by in a conductor 4510. More particularly, the current carried by conductor 4510 generates an electromagnetic field which in turn produces a current through terminals of nanowire converter 4500C according to well-known principles of physics. Conversely, a changing current applied to terminals of nanowire converter 4500C may be used to induce a current in conductor 4510. Again, the changing current through the terminals of nanowire converter 4500C induces an electromagnetic field within the loops of nanowire converter 4500C which in turn induces a current in conductor 4510.

By way of yet still further example, a nanowire converter 4500D including a nanowire coil 4400 may be used to sense a changing current being carried by in a conductor 4510. More particularly, the current carried by conductor 4510 generates an electromagnetic field which in turn produces a current through terminals of nanowire converter 4500D according to well-known principles of physics. Conversely, a changing current applied to terminals of nanowire converter 4500D may be used to induce a current in conductor 4510. Again, the changing current through the terminals of nanowire converter 4500D induces an electromagnetic field within the loops of nanowire converter 4500C which in turn induces a current in conductor 4510.

As would be appreciated, conductor 4510 is not necessary in various implementations of the invention discussed above with reference to FIG. 52-53. In fact, any changing electromagnetic field present within the "loop(s)" of nanowire converter 4500, whether from conductor 4510 or otherwise, produces a current through the terminals of nanowire converter 4500. Likewise, a changing current through the terminals of nanowire converter 4500 produces an electromagnetic field within the loops of nanowire converter 4500. As would also be appreciated, the "changing electromagnetic field" referred to above may occur as a result of the field within the loop(s) of nanowire converter 4500 changing, the position of nanowire converter 4500 changing relative to the field, the position of nanowire converter 4500 changing relative to conductor 4510, and/or a change in the current being carried by conductor 4510 as would also be appreciated.

In some implementations, a nanowire that includes modified ELR materials may be described as follows:

A nanowire comprising a modified ELR material.

A nanowire comprising a plurality of layers of modified ELR material, each of the plurality of layers of ELR material separated from another of the plurality of layers by a buffer or substrate material.

An electrical system comprising: a first nanowire comprising a modified ELR material; and a second nanowire comprising a non-ELR material, wherein the first nanowire is electrically coupled to the second nanowire.

An ELR nanowire comprising: an ELR material having three dimensional parameters, including a length, a width, and depth, wherein at least one of the dimensional parameters is less than a threshold such that the ELR nanowire does not exhibit at least one superconducting phenomenon while operating with extremely low resistance.

An ELR nanowire comprising: an ELR material having three dimensional parameters, including a length, a width, and depth; and a modifying material disposed on an appropriate surface of the ELR material, wherein at least one of the dimensional parameters is less than a threshold such that the ELR nanowire does not exhibit at least one superconducting phenomenon while operating with extremely low resistance.

An ELR nanowire contour comprising: at least one ELR nanowire segment, each ELR nanowire segment comprising: an ELR material having three dimensional parameters, including a length, a width, and depth, wherein at least one of the dimensional parameters is less than a threshold such that the ELR nanowire segment does not exhibit at least one superconducting phenomenon while operating with extremely low resistance.

An ELR nanowire contour comprising: a plurality of ELR nanowire segments, each of the plurality of ELR nanowire segments comprising an ELR material having three dimensional parameters, including a length, a width, and depth, a modifying material disposed on an appropriate surface of the ELR material, wherein at least one of the dimensional parameters is less than a threshold such that the ELR nanowire segment does not exhibit at least one superconducting phenomenon while operating with extremely low resistance.

An ELR nanowire coil comprising: at least one ELR nanowire contour, each of the at least one ELR nanowire contour comprising a plurality of ELR nanowire segments, each of the plurality of ELR nanowire segments coupled to at least one other of the plurality of ELR nanowire segments to substantially form a polygon, each of the at least one ELR nanowire segments comprising: an ELR material having three dimensional parameters, including a length, a width, and depth, wherein at least one of the dimensional parameters is less than a threshold such that the ELR nanowire segment does not exhibit at least one superconducting phenomenon while operating with extremely low resistance.

An ELR nanowire coil comprising: a plurality of ELR nanowire contours, each of the plurality of ELR nanowire contours comprising a plurality of ELR nanowire segments, each of the plurality of ELR nanowire segments coupled to at least one other of the plurality of ELR nanowire segments to substantially form a polygon, each of the plurality of ELR nanowire segments comprising: an ELR material having three dimensional parameters, including a length, a width, and depth, a modifying material disposed on an appropriate surface of the ELR material, wherein at least one of the dimensional parameters is less than a threshold such that the ELR nanowire segment does not exhibit at least one superconducting phenomenon while operating with extremely low resistance.

A nanowire converter comprising: at least one nanowire segment, wherein the nanowire converter either senses an electromagnetic field or induces an electromagnetic field.

A nanowire converter comprising: at least one nanowire segment disposed within an electromagnetic field, wherein the nanowire converter senses the electromagnetic fields and converts it to an alternating voltage.

A nanowire converter comprising: at least one nanowire segment electrically couples to an alternating voltage source, wherein the nanowire converter induces an electromagnetic field in response to the alternating voltage source.

Chapter 2—Josephson Junctions Formed of ELR Materials

This chapter of the description refers to FIGS. 1-36 and FIGS. 37-63; accordingly all reference numbers included in this section refer to elements found in such figures.

Figure 54:
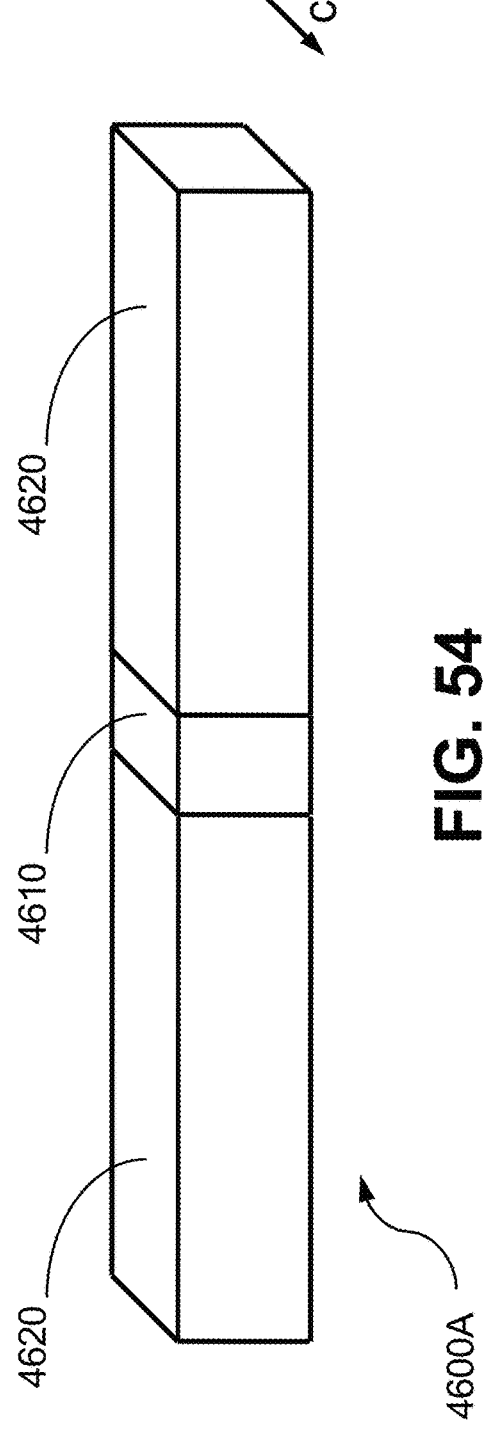
FIGS. 54 to 63 illustrate the forming of Josephson Junctions (JJs) using ELR materials.

FIGS. 54-61 illustrate various Josephson junctions 4600 (illustrated in the figures as a Josephson junction 4600A in FIG. 54, a Josephson junction 4600B in FIG. 55, a Josephson junction 4600C in FIG. 56, a Josephson junction 4600D in FIG. 57, a Josephson junction 4600E in FIG. 58, a Josephson junction 4600F in FIG. 59, a Josephson junction 4600G in FIG. 60, and a Josephson junction 4600H in FIG. 61) according to one or more implementations of the invention. FIG. 54 illustrates Josephson junction 4600A, which includes two ELR conductors 4620 separated by a barrier 4610. In some implementations of the invention, each ELR conductor 4620 comprises ELR materials that operate with improved operational characteristics in accordance with various implementations of the invention. For example, in some implementations of the invention, each ELR conductor 4620 comprises modified ELR material 1060; and in some implementations of the invention, each ELR conductor 4620 comprise new ELR materials with improved operating characteristics. In some implementations of the invention, each ELR conductor 4620 comprises a nanowire segment 4110 in accordance with various implementations of the invention.

In some implementations of the invention, barrier 4610 comprises an insulating material disposed between and electrically coupled to ELR conductors 4620 In these implementations, barrier 4610 is very thin, typically 30 angstroms or less, as would be appreciated. In some implementations of the invention, barrier 4610 comprises a conductive material, such as a conductive metal, disposed between ELR conductors 4620. In some implementations of the invention, barrier 4610 comprises a conductive material, such as a ferromagnetic metal, disposed between ELR conductors 4620. In these implementations, barrier 4610 may be thicker than with insulating materials, typically several microns thick, as would be appreciated. In some implementations of the invention, barrier 4610 comprises a semi-conductive material, such as a conductive metal, disposed between ELR conductors 4620. In some implementations of the invention, barrier 4610 comprises other materials, such as but not limited to, a different ELR material from that of ELR conductors 4620 (i.e., different in the sense that it may have a different chemical composition, a different crystalline structure, a different crystalline structure orientation, a different phase, a different grain boundary, a different critical current, a different critical temperature, or other difference). In some implementations of the invention, barrier 4610 comprises the same ELR material as that of ELR conductors 4620, but different in the sense of one or more mechanical aspects (i.e., a different thickness of ELR material from that of ELR conductors 4620, a different width of ELR material from that of ELR conductors 4620, or other mechanical difference). In some implementations, barrier 4610 comprises a partial or complete gap formed between ELR conductors 4620. In these implementations, barrier 4610 may comprise a gap filled with air or other gas. In some implementations of the invention where ELR conductors 4620 comprise modified ELR material 1020, barrier 4610 may comprise unmodified ELR material 360.

Figure 62:
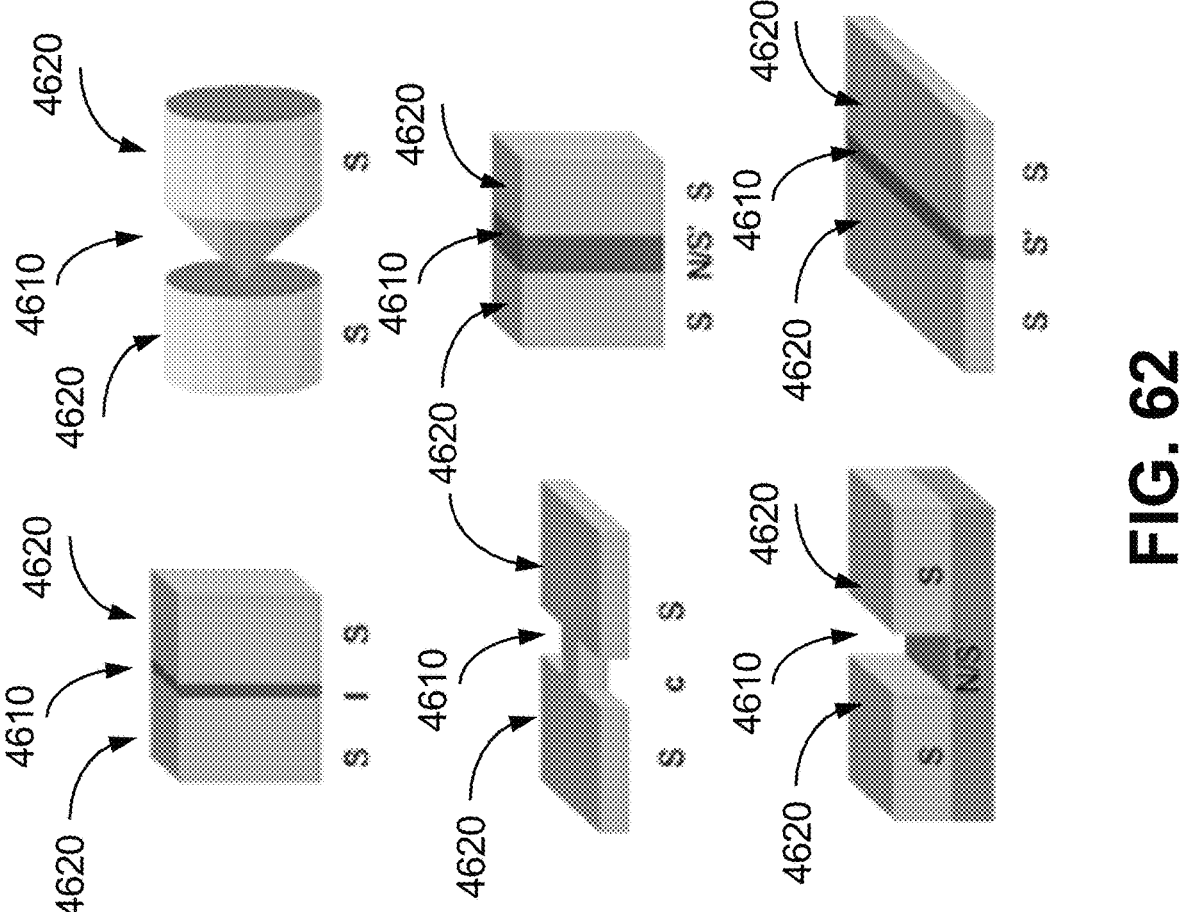
Figure 63:
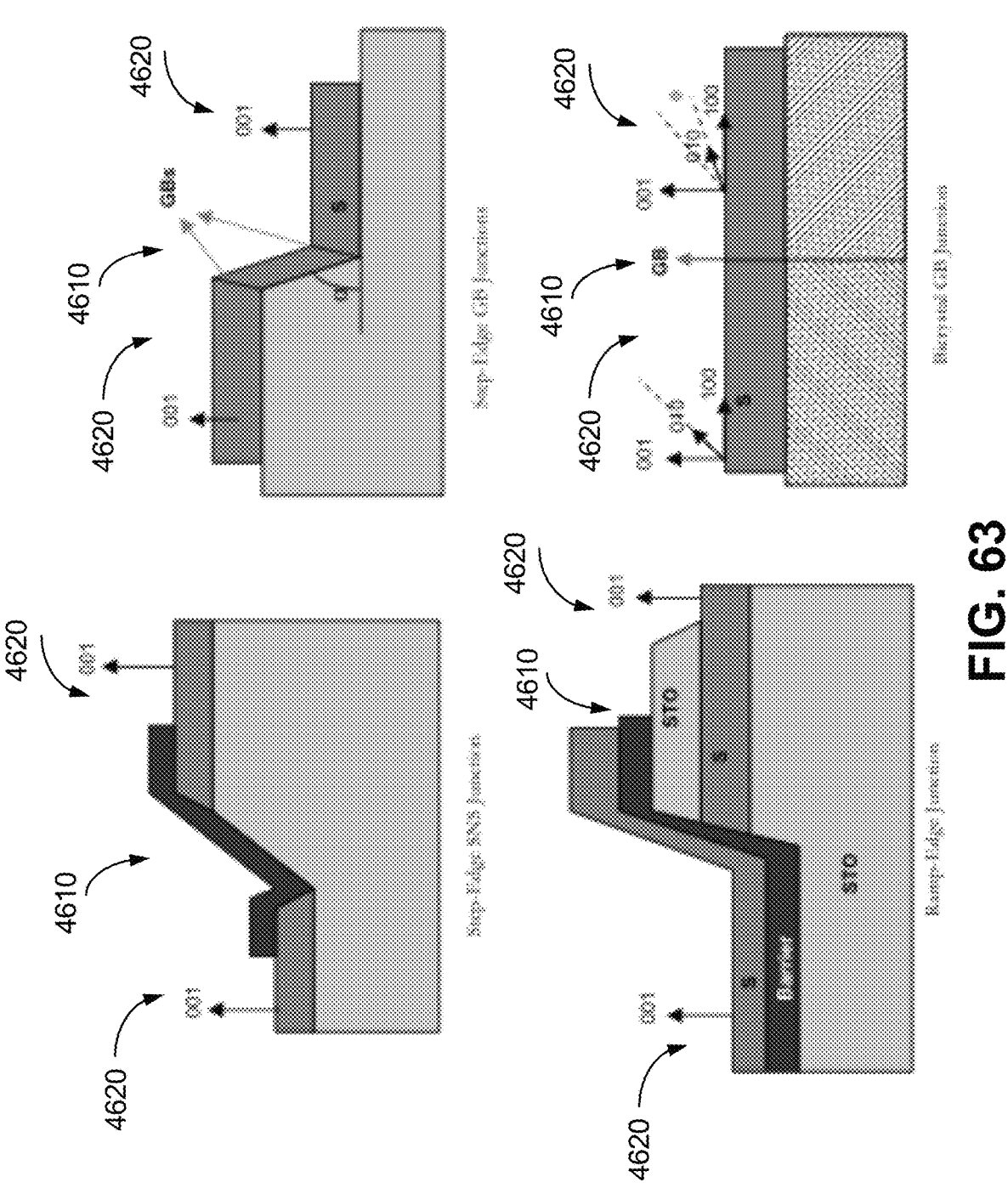

Common types of conventional Josephson junctions include: superconductor-insulator-superconductor ("SIS"); superconductor-normal conductor-superconductor ("SNS"); superconductor-ferromagnetic metal-superconductor ("SFS"); superconductor-insulator-normal conductor-insulator-superconductor ("SINIS"); superconductor-insulatornormal conductor-superconductor ("SINS"); superconductor-constriction-superconductor ("SCS"); and others. FIG. 62 illustrates various examples of these Josephson junctions, including, but not limited to (from left to right, top down): a tunnel junction (SIS); a point contact; a Daydem bridge (SCS); a sandwich junction; a variable thickness bridge; and an ion-implanted bridge. FIG. 63 illustrates various other examples of Josephson junctions, including but not limited to (from left to right, top down): a step-edge SNS junction; a step-edge grain boundary junction; a ramp edge junction; and a bi-crystal grain boundary junction. According to various implementations of the invention, any of these aforementioned types of Josephson junctions may be configured using improved ELR materials, such as those discussed above, in place of the superconducting material of conventional Josephson junctions.

Generally speaking, Josephson junctions 4600 exhibit a so-called Josephson effect where current flowing in an ELR state through ELR conductors 4620 is also able to flow across a junction between ELR conductors 4620 in an extremely low resistance state, where the junction may comprise, for example, a barrier 4610. The current that flows through barrier 4610 is referred to as a Josephson current. Up until it reaches a critical current, the Josephson current is able to flow through barrier 4610 with extremely low resistance. However, when the critical current of barrier 4610 is exceeded, a voltage appears across barrier 4610 which in turn further reduces the critical current thereby producing a larger voltage across barrier 4610. The Josephson effect may be exploited with Josephson junctions 4600 in various circuits as would be appreciated.

FIG. 54 illustrates various implementations of Josephson junctions 4600A in a "wire configuration," and include, but are not limited to, bulk material conductors, wires, nanowires, traces, and other configurations as would be appreciated.

Figure 55:
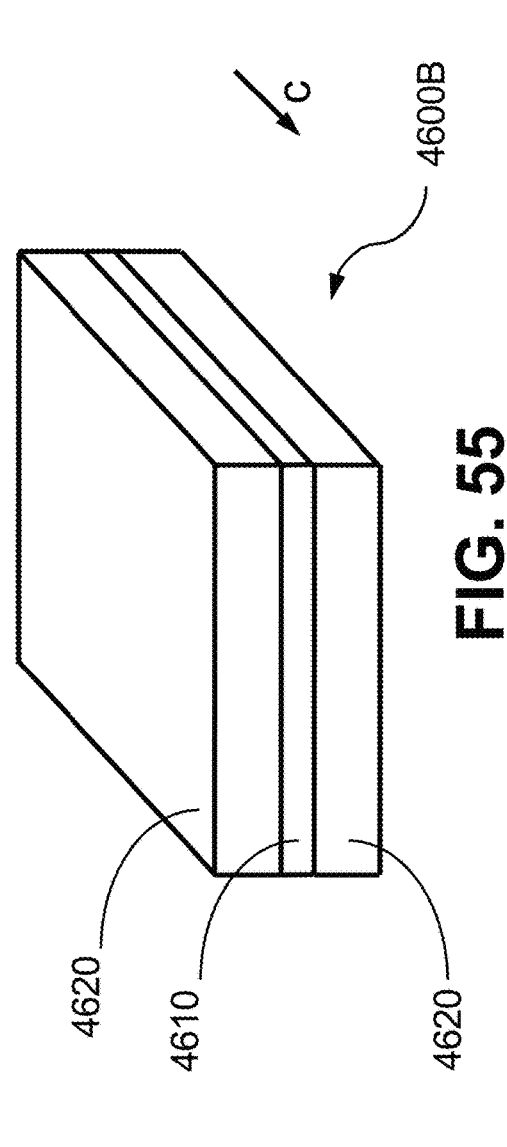

FIG. 55 illustrates a Josephson junction 4600B in a "foil configuration" or "plate configuration," and include, but are not limited to, bulk material plates, foils, or other layered configurations as would be appreciated in accordance with various implementations of the invention. Josephson junction 4600B may be used, for example, to detect photons incident on one of ELR conductors 4620. Other uses for Josephson junction 4600B exist as would be appreciated.

Figures 56, 57:
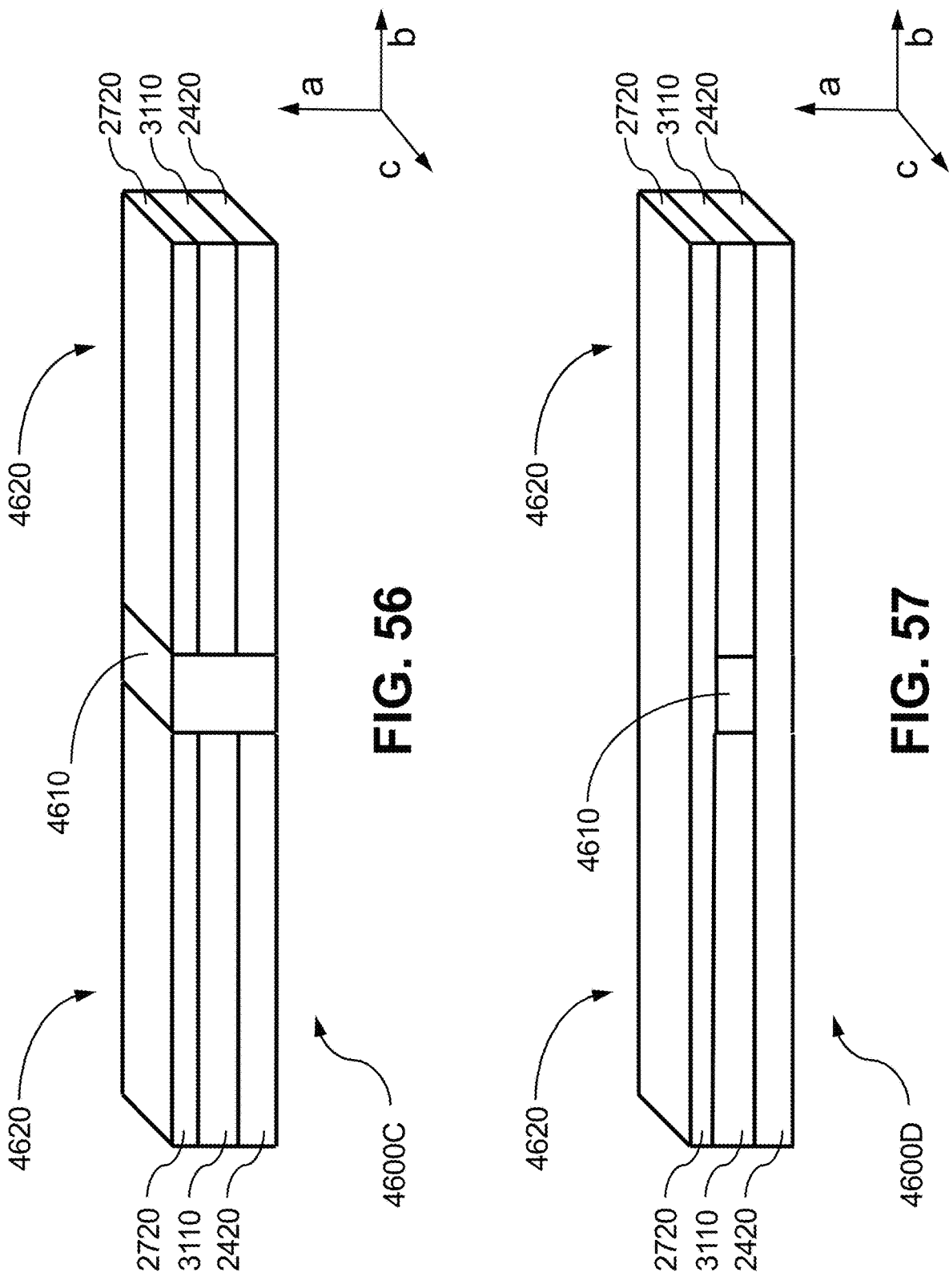

FIG. 56 and FIG. 57 illustrate Josephson junctions 4600 in the so-call "wire configuration." FIG. 56 illustrates a Josephson junction 4600C that comprises ELR conductors 4620 that include a modified ELR material that has improved operating characteristics in accordance with various implementations of the invention. As illustrated in FIG. 56, in some implementations of the invention, each ELR conductor 4620 of Josephson junction 4600C includes a modified ELR material comprising modifying material 2720 layered onto an ELR material 3110. In some implementation of the invention, the modified ELR material may be layered onto substrate 2420 (i.e., ELR material is layered onto substrate 2420). ELR conductors 4620 may comprise other forms of modified ELR material as would be appreciated. As illustrated, barrier 4610 is disposed between and electrically coupled to ELR conductors 4620.

FIG. 57 illustrates a Josephson junction 4600D that comprises ELR conductors 4620 that include a modified ELR material that has improved operating characteristics in accordance with various implementations of the invention. As illustrated in FIG. 57, in some implementations of the invention, each ELR conductor 4620 of Josephson junction 4600D includes a modified ELR material comprising modifying material 2720 layered onto an ELR material 3110. In some implementation of the invention, the modified ELR material may be layered onto substrate 2420 (i.e., ELR material is layered onto substrate 2420). ELR conductors 4620 may comprise other forms of modified ELR material as would be appreciated. As illustrated, barrier 4610 is disposed between and electrically coupled to ELR conductors 4620, and more particularly barrier 4610 is disposed between the layers of ELR material 3110, and under a continuous layer of modifying material 2720. Josephson junction 4600D may be desirable, for example, from a manufacturing standpoint over Josephson junction 4600C as would be appreciated. In some implementations of the invention, such as, but not limited to, those illustrated in FIG. 56 and FIG. 57, barrier 4610, may comprise modifying material 2720.

Figures 58, 59:
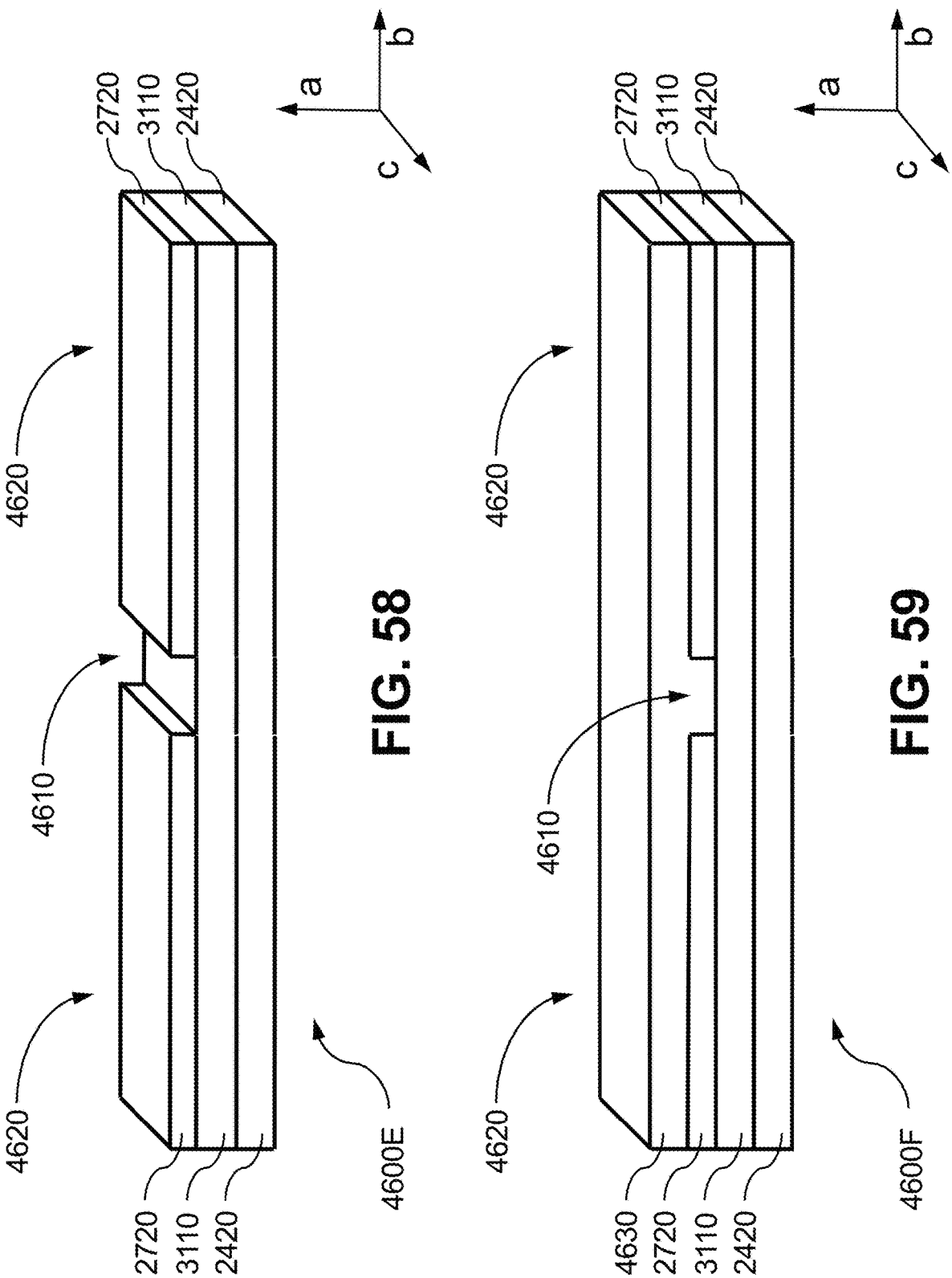

FIG. 58 illustrates a Josephson junction 4600E that comprises ELR conductors 4620 that include a modified ELR material that has improved operating characteristics in accordance with various implementations of the invention. As illustrated in FIG. 58, in some implementations of the invention, each ELR conductor 4620 of Josephson junction 4600E includes a modified ELR material comprising modifying material 2720 layered onto an ELR material 3110. As illustrated in FIG. 58, barrier 4610 is formed by a break (e.g., a gap) in a layer of modifying material 2720 over a continuous layer of ELR material 3110. Such a gap in the layer of modifying material 2720 may be formed by a variety of processing techniques including etching, milling, shadowmask, or other processing techniques as would be appreciated. Josephson junction 4600E is formed then from two ELR conductors 4620 comprising the modified ELR material (e.g., a layer of modifying material 2720 over a layer of ELR material 3110) separated by a barrier 4610 comprising a layer of ELR material 3110 without modifying material 2720 (i.e., a layer of unmodified ELR material 3110). Josephson junction 4600E may be desirable, for example, from a manufacturing standpoint over other Josephson junctions as would be appreciated.

FIG. 59 illustrates a Josephson junction 4600F that comprises ELR conductors 4620 that include a modified ELR material that has improved operating characteristics in accordance with various implementations of the invention. As illustrated in FIG. 59, in some implementations of the invention, each ELR conductor 4620 of Josephson junction 4600F includes a modified ELR material comprising modifying material 2720 layered onto an ELR material 3110. As with Josephson junction 4600E, barrier 4610 of Josephson junction 4600F is formed by a gap in the layer of modifying material 2720 over the continuous layer of ELR material 3110. As a result, Josephson junction 4600F is also formed from two ELR conductors 4620 comprising the modified ELR material separated by a barrier 4610 comprising the unmodified ELR material 3110. In some implementations of the invention, a layer of insulating or buffer material 4630 may be layered over modifying material 2720, and as illustrated in FIG. 59, such material 4630 may fill the gap in the layer of modifying material 2720, thereby providing a further aspect to barrier 4610.

Figures 60, 61:
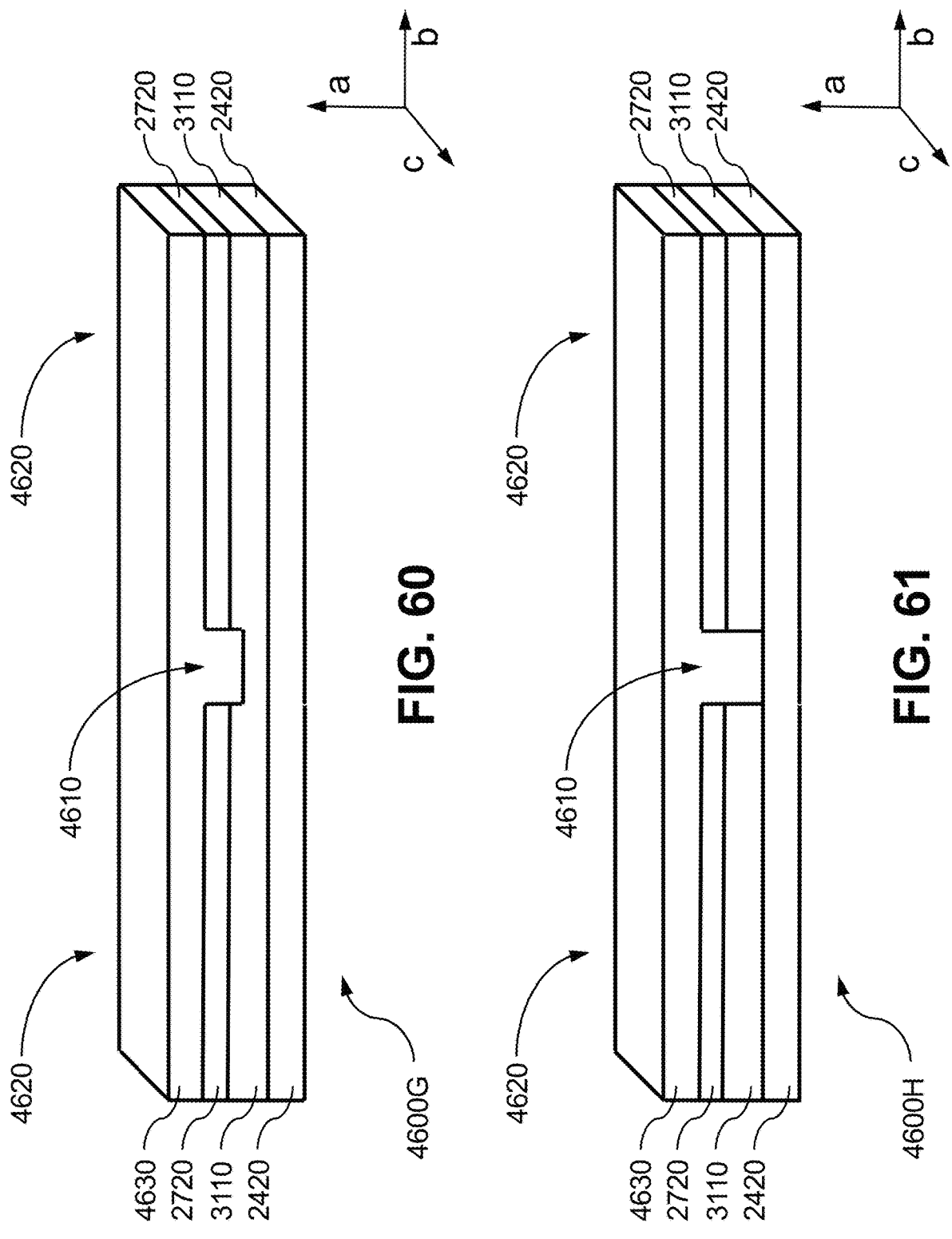

FIG. 60 illustrates a Josephson junction 4600G that comprises ELR conductors 4620 that include a modified ELR material that has improved operating characteristics in accordance with various implementations of the invention. As illustrated in FIG. 60, in some implementations of the invention, each ELR conductor 4620 of Josephson junction 4600G includes a modified ELR material comprising modifying material 2720 layered onto an ELR material 3110. As with Josephson junctions 4600E and 4600F, barrier 4610 of Josephson junction 4600G is formed by a gap in the layer of modifying material 2720 over a layer of ELR material 3110. In addition, barrier 4610 of Josephson junction 4600G also includes a partial gap (i.e., a mechanical constriction in depth or thickness) in the layer of ELR material 3110. For example, the processing techniques used to create the gap in the layer of modifying material 2720 may, intentionally or unintentionally, create the partial gap in the underlying layer of ELR material 3110. As a result, Josephson junction 4600G is formed from two ELR conductors 4620 comprising the modified ELR material separated by a barrier 4610 comprising the unmodified ELR material 3110 with a further mechanical constriction. In some implementations of the invention, a layer of insulating or buffer material 4630 may be layered over modifying material 2720, and as illustrated in FIG. 60, such material 4630 may fill the gap in the layer of modifying material 2720 as well as the partial gap in the layer of ELR material 3110, thereby providing a further aspect to barrier 4610.

FIG. 61 illustrates a Josephson junction 4600H that comprises ELR conductors 4620 that include a modified ELR material that has improved operating characteristics in accordance with various implementations of the invention. As illustrated in FIG. 61, in some implementations of the invention, each ELR conductor 4620 of Josephson junction 4600H includes a modified ELR material comprising modifying material 2720 layered onto an ELR material 3110. As above, barrier 4610 of Josephson junction 4600H is formed by a gap in both the layer of modifying material 2720 and the layer of ELR material 3110. As a result, Josephson junction 4600H is formed from two ELR conductors 4620 comprising the modified ELR material separated by the gap. In some implementations of the invention, a layer of insulating or buffer material 4630A may be layered over modifying material 2720, and as illustrated in FIG. 61, such material 4630 may fill the gap in both the layer of modifying material 2720 and the layer of ELR material 3110.

In some implementations of the invention, a plurality of Josephson junctions 4600 may be organized in a one-dimensional array of serially-coupled Josephson junctions 4600 as would be appreciated. In some implementations of the invention, a plurality of Josephson junctions 4600 may be organized in a two-dimensional array of Josephson junctions including a plurality of one-dimensional arrays of serially-coupled Josephson junctions 4600 coupled in parallel with one another as would be appreciated.

In some implementations, a Josephson Junction that includes modified ELR materials may be described as follows:

A Josephson junction comprising: a first ELR conductor comprising an ELR material having improved operating characteristics; a second ELR conductor comprising the ELR material; and a barrier material disposed between the first ELR conductor and the second ELR conductor.

A Josephson junction comprising: a first ELR conductor comprising an ELR material having a critical temperature greater than 150 K; a second ELR conductor comprising the ELR material; and a barrier material disposed between the first ELR conductor and the second ELR conductor.

A circuit comprising: a plurality of Josephson junctions, wherein each of the plurality of Joseph junctions comprises: a first ELR conductor comprising an ELR material having a critical temperature greater than 150 K, a second ELR conductor comprising the ELR material, and a barrier material disposed between the first ELR conductor and the second ELR conductor.

A Josephson junction comprising: a first ELR conductor comprising a modified ELR material; a second ELR conductor comprising the modified ELR material; and a barrier material disposed between the first ELR conductor and the second ELR conductor, wherein the modified ELR material comprises a first layer of ELR material and a second layer of modifying material bonded to the ELR material of the first layer, where the modified ELR material has improved operating characteristics over those of the ELR material alone.

A Josephson junction comprising: a first ELR conductor comprising a modified ELR material; a second ELR conductor comprising the modified ELR material; and a barrier material disposed between the first ELR conductor and the second ELR conductor, wherein the modified ELR material comprises a first layer of ELR material and a second layer of modifying material bonded to the ELR material of the first layer, where the modified ELR material has a critical temperature greater than 150 K.

A circuit comprising a plurality of Josephson junctions, wherein each of the plurality of Joseph junctions comprises a first ELR conductor comprising a modified ELR material; a second ELR conductor comprising the modified ELR material; and a barrier material disposed between the first ELR conductor and the second ELR conductor, wherein the modified ELR material comprises a first layer of ELR material and a second layer of modifying material bonded to the ELR material of the first layer, where the modified ELR material has a critical temperature greater than 150 K.

A Josephson junction comprising: a first layer of ELR material; and a second layer of modifying material bonded onto the first layer of ELR material, the second layer having a first portion and a second portion with a gap formed between the first portion and the second portion and over the first layer of ELR material, wherein the first portion of the second layer of modifying materials bonded to the first layer of ELR material forms a first portion of a modified ELR material, wherein the second portion of the second layer of modifying materials bonded to the first layer of ELR material forms a second portion of the modified ELR material, and wherein the gap in the second layer of modifying material provides an unmodified portion of ELR material, wherein the unmodified portion of ELR material forms a barrier of the Josephson junction, wherein the modified ELR material has improved operating characteristics over those of the ELR material alone.

A Josephson junction comprising: a first layer of ELR material; and a second layer of modifying material bonded onto the first layer of ELR material, the second layer having a first portion and a second portion with a gap formed between the first portion and the second portion and over the first layer of ELR material, wherein the first portion of the second layer of modifying materials bonded to the first layer of ELR material forms a first portion of a modified ELR material, wherein the second portion of the second layer of modifying materials bonded to the first layer of ELR material forms a second portion of the modified ELR material, and wherein the gap in the second layer of modifying material provides an unmodified portion of ELR material, wherein the unmodified portion of ELR material forms a barrier of the Josephson junction, wherein the modified ELR material operates in an ELR state at temperatures greater than 150 K.

A circuit comprising: a first layer of ELR material; and a second layer of modifying material bonded onto the first layer of ELR material, the second layer having a plurality of portions of modifying material with a gap formed between each pair of adjacent ones of the plurality of portions of modifying material, wherein each of the plurality of portions of modifying material is bonded to the first layer of ELR material to form a portion of a modified ELR material, and wherein the gap formed between each pair of adjacent ones of the plurality of portions of modifying material provides an unmodified portion of ELR material, wherein the unmodified portion of ELR material forms a barrier of a Josephson junction, wherein the modified ELR material operates in an ELR state at temperatures greater than 150 K.

A Josephson junction comprising: a first ELR wire comprising an ELR material having a critical temperature greater than 150 K; a second ELR wire comprising the ELR material; and a barrier material disposed between the first ELR wire and the second ELR wire.

A Josephson junction comprising: a first ELR foil comprising an ELR material having a critical temperature greater than 150 K; a second ELR foil comprising the ELR material; and a barrier material disposed between the first ELR foil and the second ELR foil.

Chapter 3—QUIDS Formed of ELR Materials

This chapter of the description refers to FIGS. 1-36 and FIGS. 37-76; accordingly all reference numbers included in this section refer to elements found in such figures.

Figure 64:
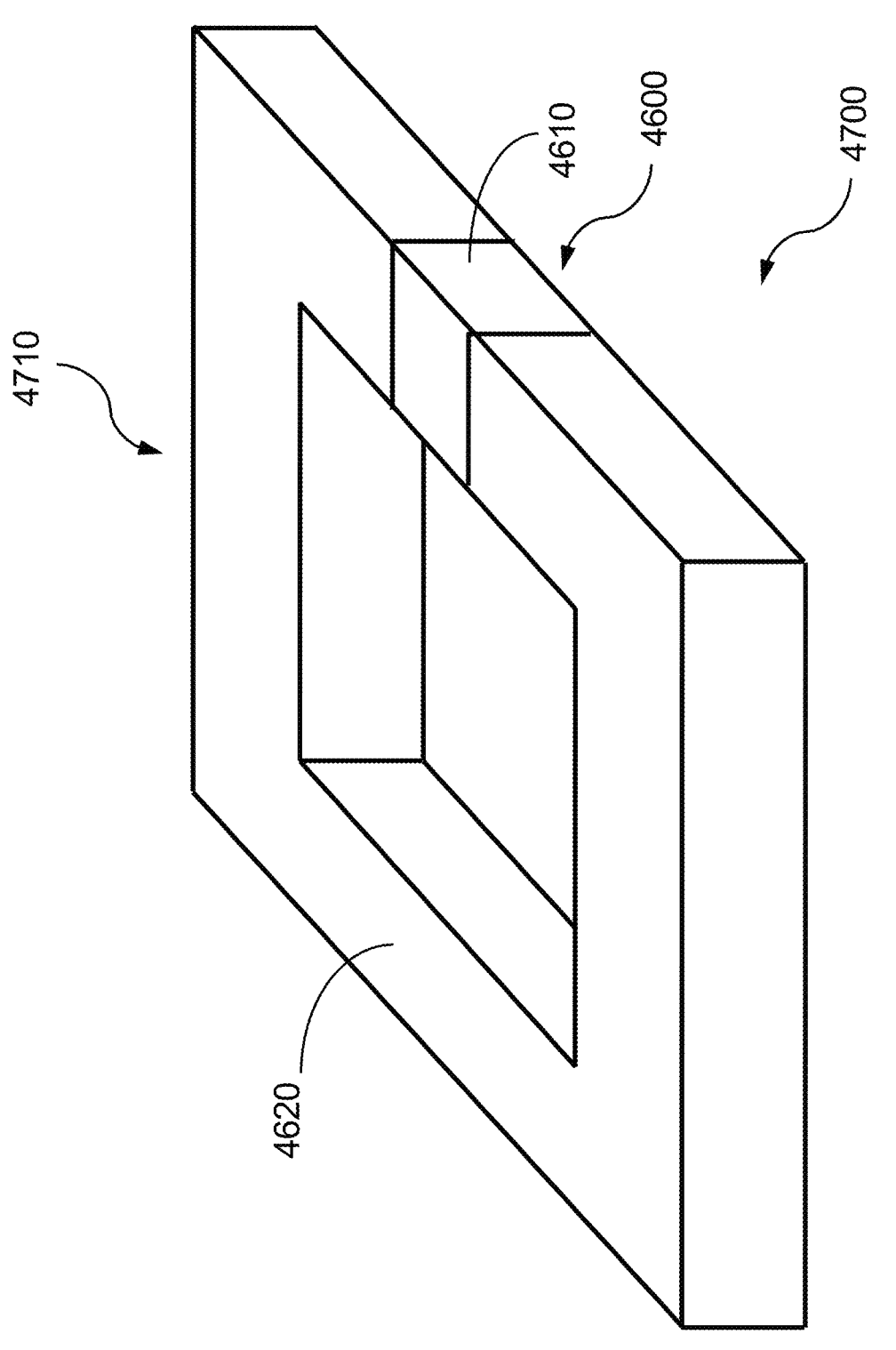

FIG. 64 illustrates an ELR QUID 4700 (i.e., ELR quantum interference device) that includes an ELR loop 4710 with a single ELR Josephson junction 4600 according to various implementations of the invention. More particularly, ELR loop 4710 includes an ELR conductor 4620 formed in a loop with a single barrier 4610 disposed within a leg of loop to form ELR Josephson junction 4600. ELR QUID 4700 generally operates in a manner similar to other quantum interference devices, including superconducting quantum interference devices or "SQUIDs" The operation and use of SQUIDs are generally well known. As would be appreciated, ELR QUID 4700 may sometimes be referred to as a "single-junction QUID, a "one-junction QUID," or "RF QUID." ELR QUID 4700 is formed from ELR materials that operate with improved operational characteristics in accordance with various implementations of the invention. For example, in some implementations of the invention, ELR QUID 4700A comprises modified ELR material 1060; in some implementations of the invention, ELR QUID 4700 comprises apertured ELR material with improved operational characteristics; and in some implementations of the invention, ELR QUID 4700 comprises new ELR materials in accordance with various implementations of the invention.

Figures 71, 72:
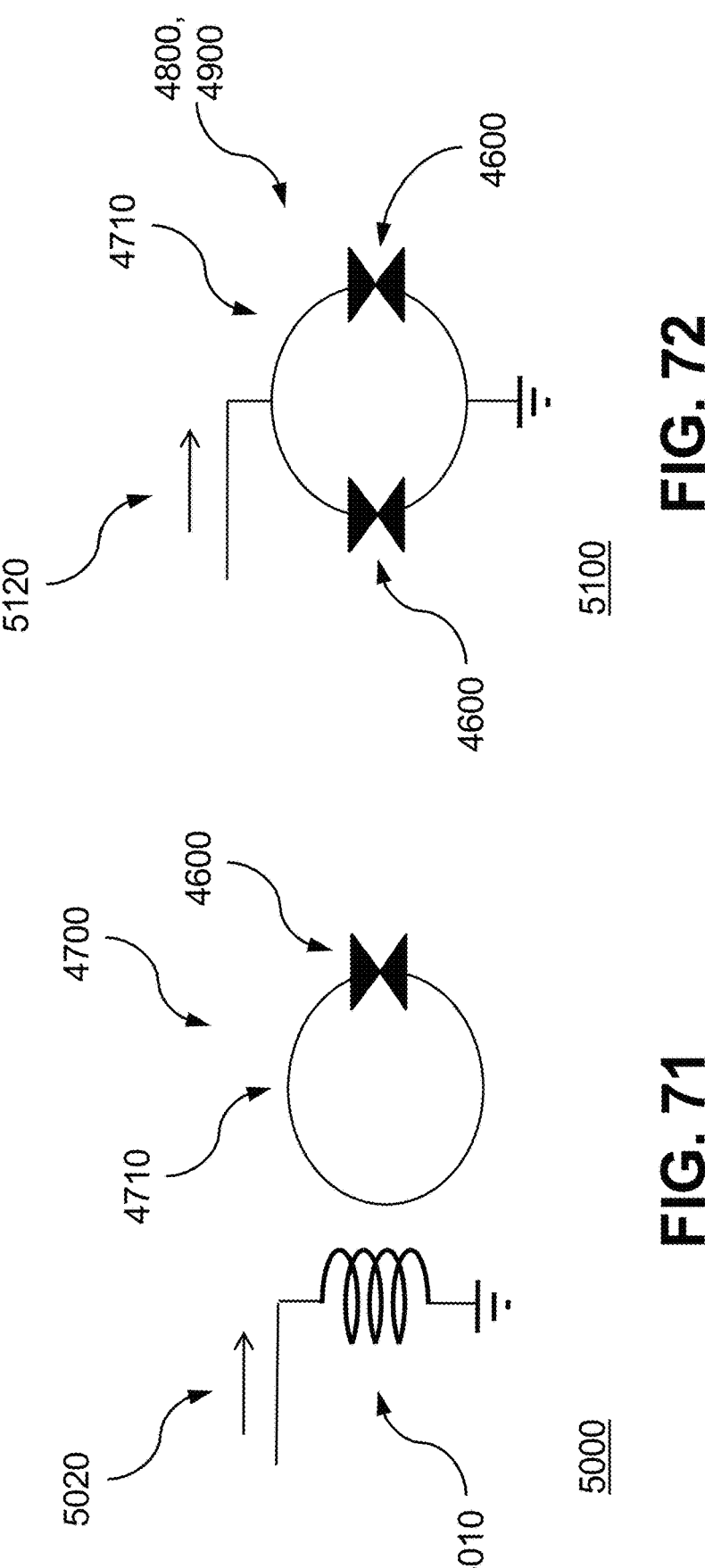

Generally, speaking ELR QUID 4700 may be used to detect magnetic fields that flow through ELR loop 4710 (i.e., perpendicular to and through the interior area formed by ELR loop 4710) as would be appreciated. More particularly, ELR QUID 4700 may be coupled to a RF generator that induces a current in ELR loop 4710. Such an RF generator, sometimes also referred to as an AC biasing circuit 5000, is illustrated in FIG. 71. AC biasing circuit 5000 utilizes an AC current 5020 through an inductor 5010 to generate an RF field that, in turn, induces a current in ELR loop 4710 of ELR QUID 4700. In various implementations of the invention, the current in ELR loop 4710 (which may be controlled via current 5020 through inductor 5010) is kept at or just below the critical current of barrier 4610 of Josephson junction 4600 in ELR QUID 4700. A magnetic field flowing through the interior area of ELR loop 4710 causes the current in ELR loop 4710 to exceed the critical current of barrier 4610, thereby producing a voltage across barrier 4610 which can be detected and/or measured as would be appreciated.

Figure 65:
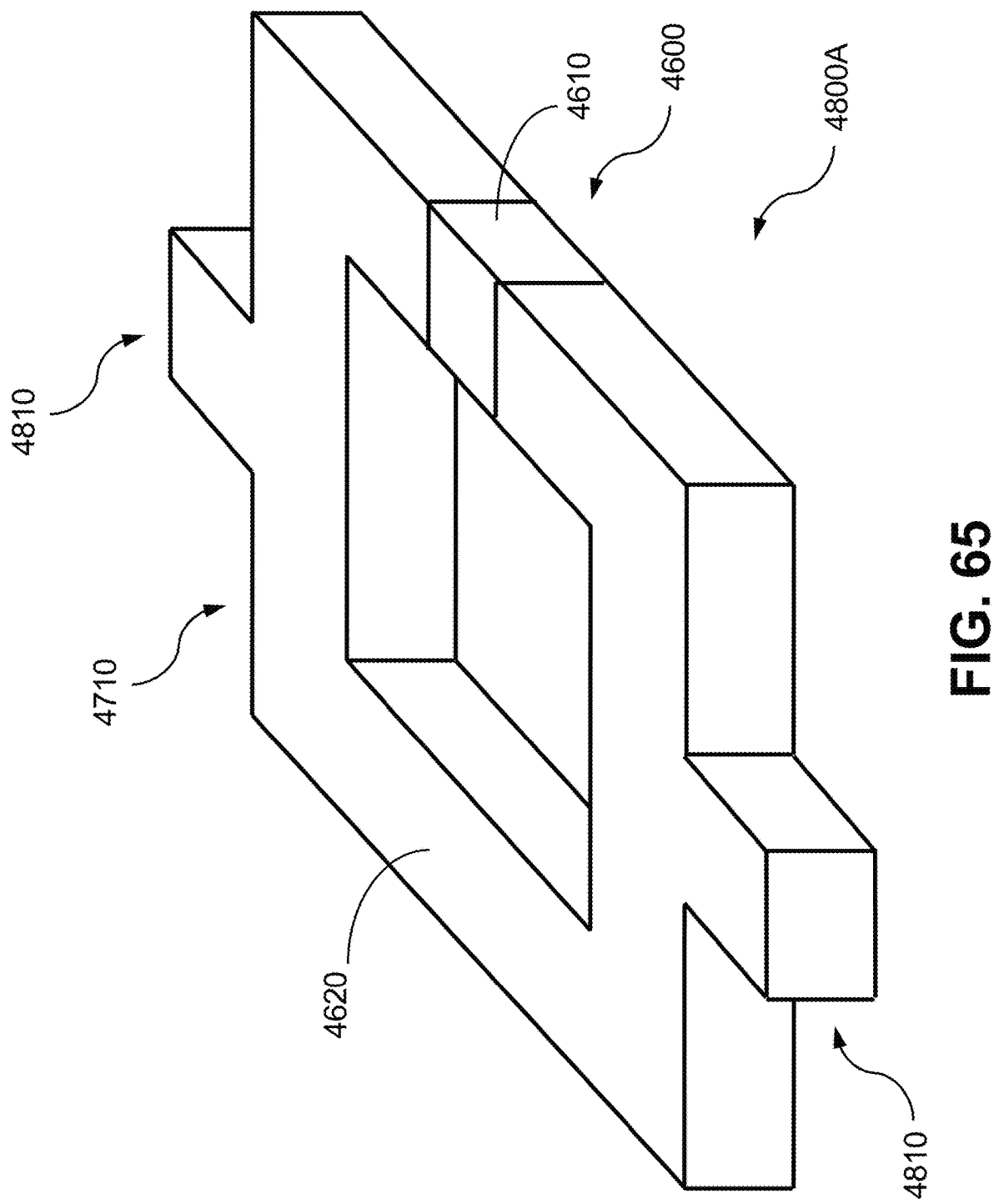

FIG. 65 illustrates a dual-feed ELR QUID 4800 generally, and more particularly a dual-feed ELR QUID 4800A. ELR QUID 4800A includes an ELR loop 4710 with a single ELR Josephson junction 4600 and two feeds 4810 (sometimes referred to as an input feed 4810A and an output feed 4810 depending on the flow of current through ELR QUID 4800A) according to various implementations of the invention. Feeds 4810 are symmetrically placed in ELR loop 4710 to ensure that the current through each leg of ELR loop 4710 are equal. As such, ELR loop 4710 is sometimes referred to as a symmetrical ELR loop.

ELR loop 4710 of ELR QUID 4800A includes an ELR conductor 4620 formed in a loop with a single barrier 4610 disposed within a leg of loop to form ELR Josephson junction 4600. ELR QUIDs 4800 may be formed from ELR materials that operate with improved operational characteristics in accordance with various implementations of the invention. For example, in some implementations of the invention, ELR QUID 4800 comprises modified ELR material 1060; in some implementations of the invention, ELR QUID 4800 comprises apertured ELR material with improved operational characteristics; and in some implementations of the invention, ELR QUID 4800 comprises new ELR materials in accordance with various implementations of the invention.

Figure 66:
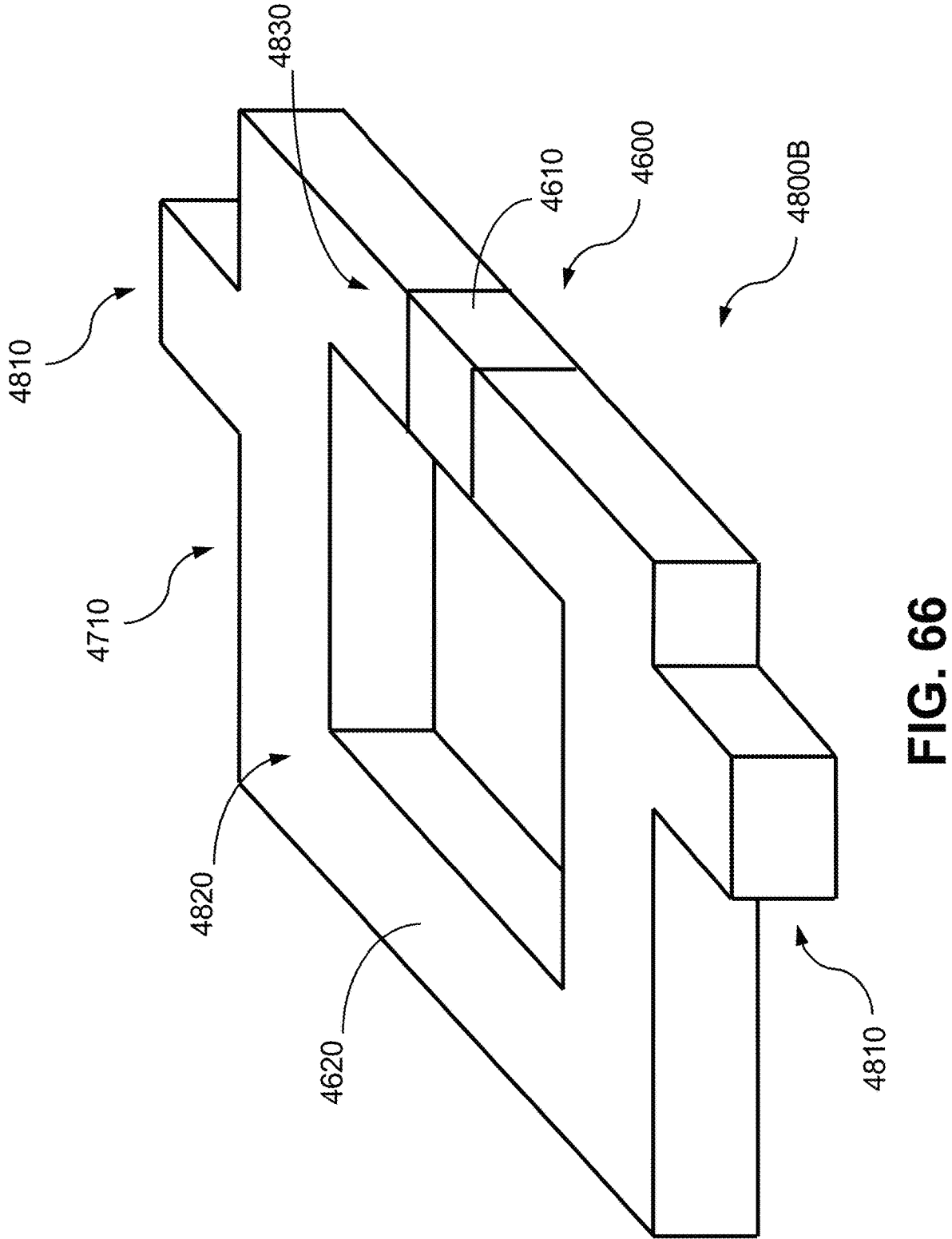

FIG. 66 illustrates a dual-feed ELR QUID 4800B according to various implementations of the invention. ELR QUID 4800B differs from ELR QUID 4800A in that feeds 4810 are offset from a center axis of ELR loop 4710 such that feeds 4810 are disposed closer to a leg 4830 (which includes barrier 4610) of ELR loop 4710 and farther from a leg 4820 of ELR loop 4710. As thus described, feeds 4810 are asymmetrically placed in ELR loop 4710. While not otherwise illustrated, in various implementations of the invention, feeds 4810 may be offset from a center axis of ELR loop 4710 such that feeds 4810 are disposed closer to leg 4820 and farther from leg 4830. Similarly, in various implementations of the invention (not otherwise illustrated), one feed may be disposed closer to leg 4820 while the other feed may be disposed closer to leg 4830. The location of feeds 4810 in ELR loop 4710 may change a respective flow of current through each of legs 4820, 4830, and hence change an overall operation and/or sensitivity of ELR QUID 4800B as would be appreciated. As such, ELR loop 4710 of ELR QUID 4800B is sometimes referred to as an asymmetrical ELR loop.

Figure 67:
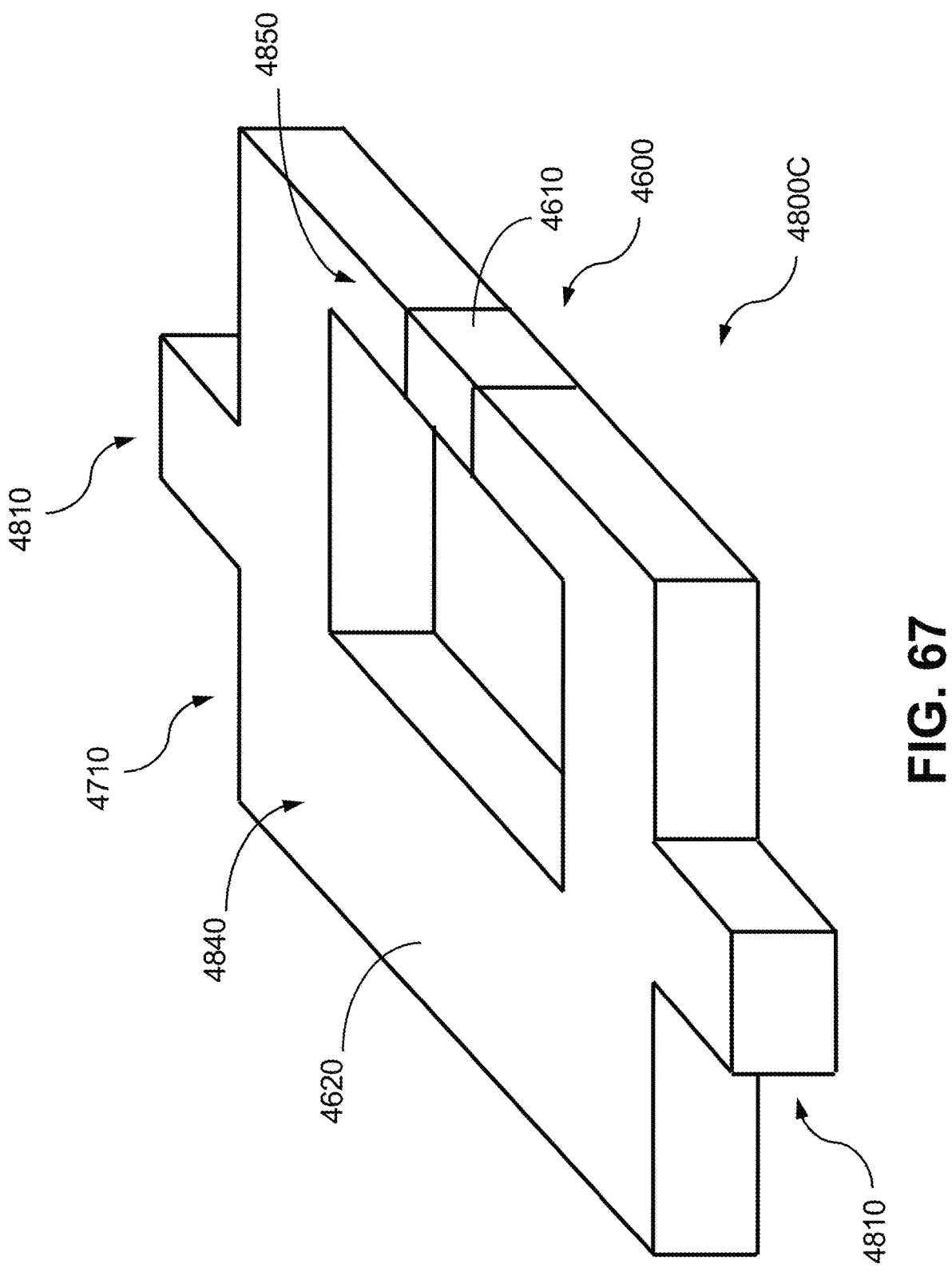

FIG. 67 illustrates a dual-feed ELR QUID 4800C according to various implementations of the invention. ELR QUID 4800C differs from ELR QUID 4800A in that a leg 4840 may be wider than a leg 4850 (which includes barrier 4610) of ELR loop 4710. As thus described, legs 4840, 4850 represent another asymmetry that may be utilized in ELR loop 4710. While not otherwise illustrated, in various implementations of the invention, leg 4850 may be wider than leg 4840. The widths of legs 4840, 4850 in ELR loop 4710 may change a respective flow of current through each of legs 4840, 4850, and hence change an overall operation and/or sensitivity of ELR QUID 4800C as would be appreciated. As such, ELR loop 4710 of ELR QUID 4800C is also sometimes referred to as an asymmetrical ELR loop.

Generally, speaking ELR QUID 4800 may be used as rapid single quantum flux ("RSQF") logic that may be used to generate a single pulse when a flux state of ELR QUID 4800A changes. In other words, ELR QUID 4800 generates a single pulse when a field through the interior area formed by ELR loop 4710 changes. The pulse generated by ELR QUID 4800 typically has a relatively short pulse width as would be appreciated.

Figure 68:
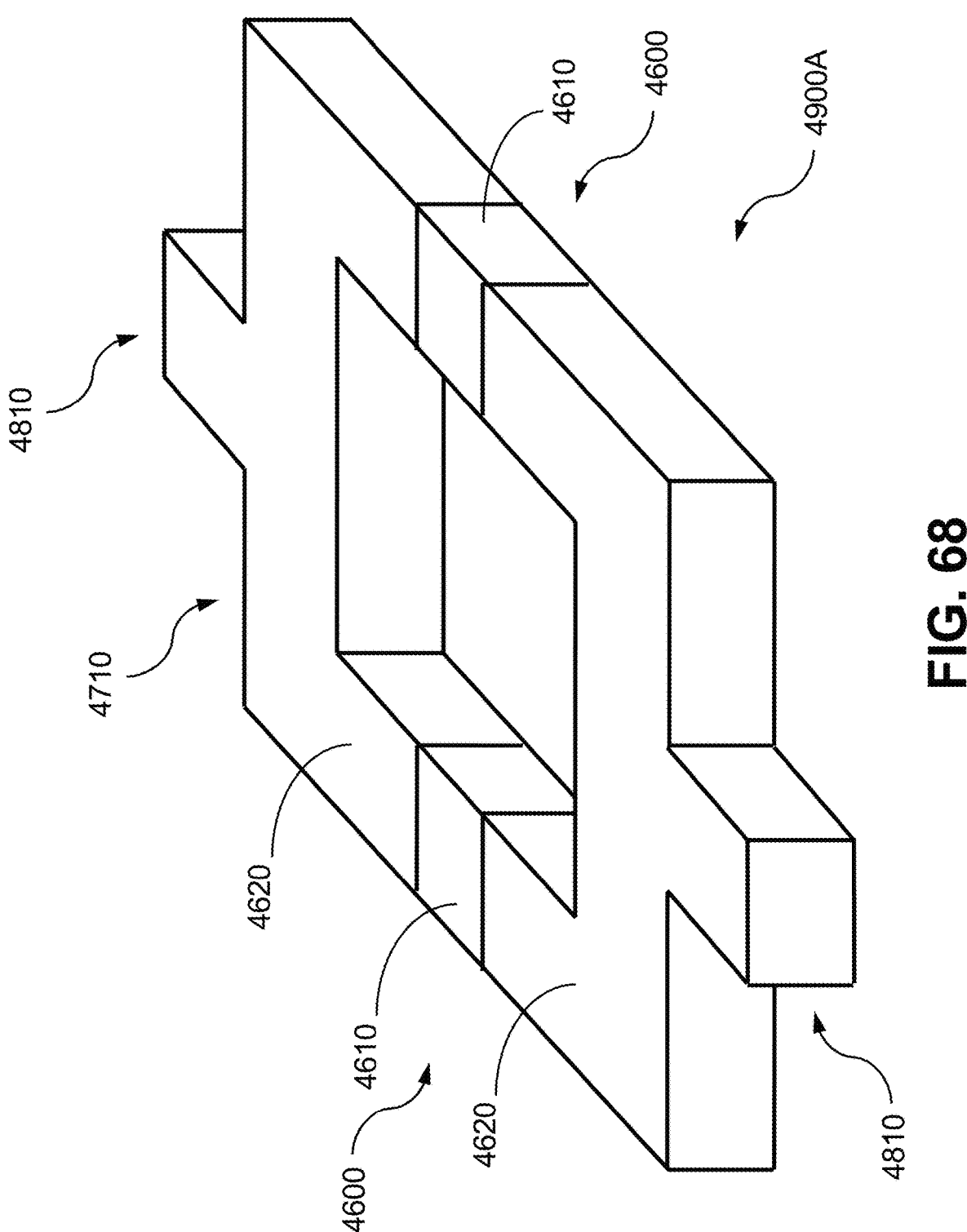

FIG. 68 illustrates a dual-feed, two Josephson junctions ELR QUID 4900 generally, and more particularly a dual-feed, two Josephson junction ELR QUID 4900A. ELR QUID 4900A includes an ELR loop 4710 with two ELR Josephson junctions 4600 and two feeds 4810 according to various implementations of the invention. As illustrated, ELR QUID 4900 includes a symmetrical loop 4710. ELR loop 4710 of ELR QUID 4900A includes an ELR conductor 4620 formed in a loop with two barriers 4610, each disposed within a leg of loop to form ELR Josephson junction 4600. ELR QUIDs 4900 may be formed from ELR materials that operate with improved operational characteristics in accordance with various implementations of the invention. For example, in some implementations of the invention, ELR QUID 4900 comprises modified ELR material 1060; in some implementations of the invention, ELR QUID 4900 comprises apertured ELR material with improved operational characteristics; and in some implementations of the invention, ELR QUID 4900A comprises new ELR materials in accordance with various implementations of the invention.

Figure 69:
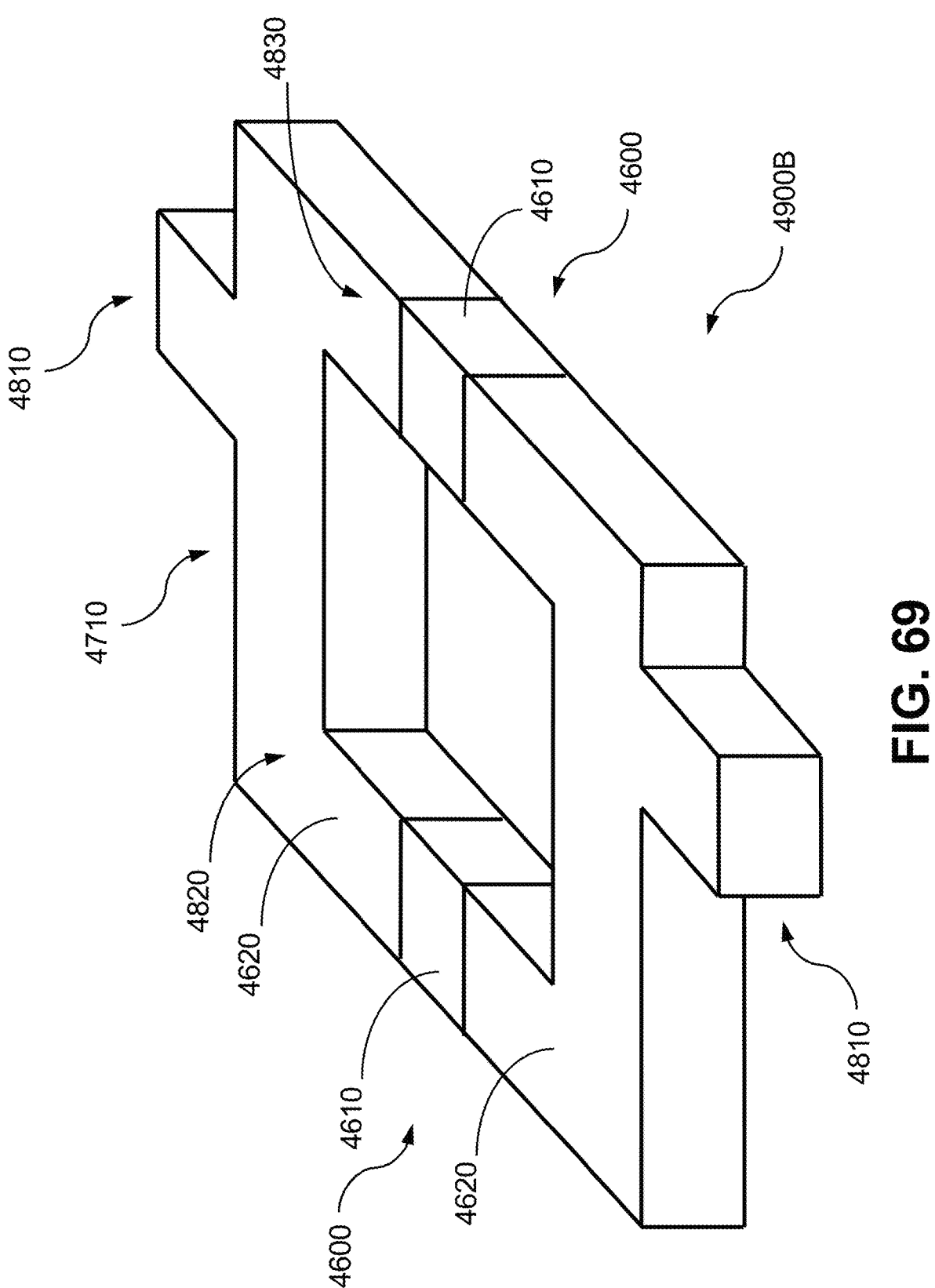

FIG. 69 illustrates a dual-feed, two Josephson junction ELR QUID 4900B according to various implementations of the invention. ELR QUID 4900B includes an asymmetrical ELR loop 4710 in that feeds 4810 are offset from a center axis of ELR loop 4710 as discussed above with reference to FIG. 66. While not otherwise illustrated, in various implementations of the invention, feeds 4810 may be offset from a center axis of ELR loop 4710 such that feeds 4810 are disposed closer to leg 4820 and farther from leg 4830. Similarly, in various implementations of the invention (not otherwise illustrated), one feed may be disposed closer to leg 4820 while the other feed may be disposed closer to leg 4830. The location of feeds 4810 in ELR loop 4710 may change a respective flow of current through each of legs 4820, 4830, and hence change an overall operation and/or sensitivity of ELR QUID 4900B as would be appreciated.

Figure 70:
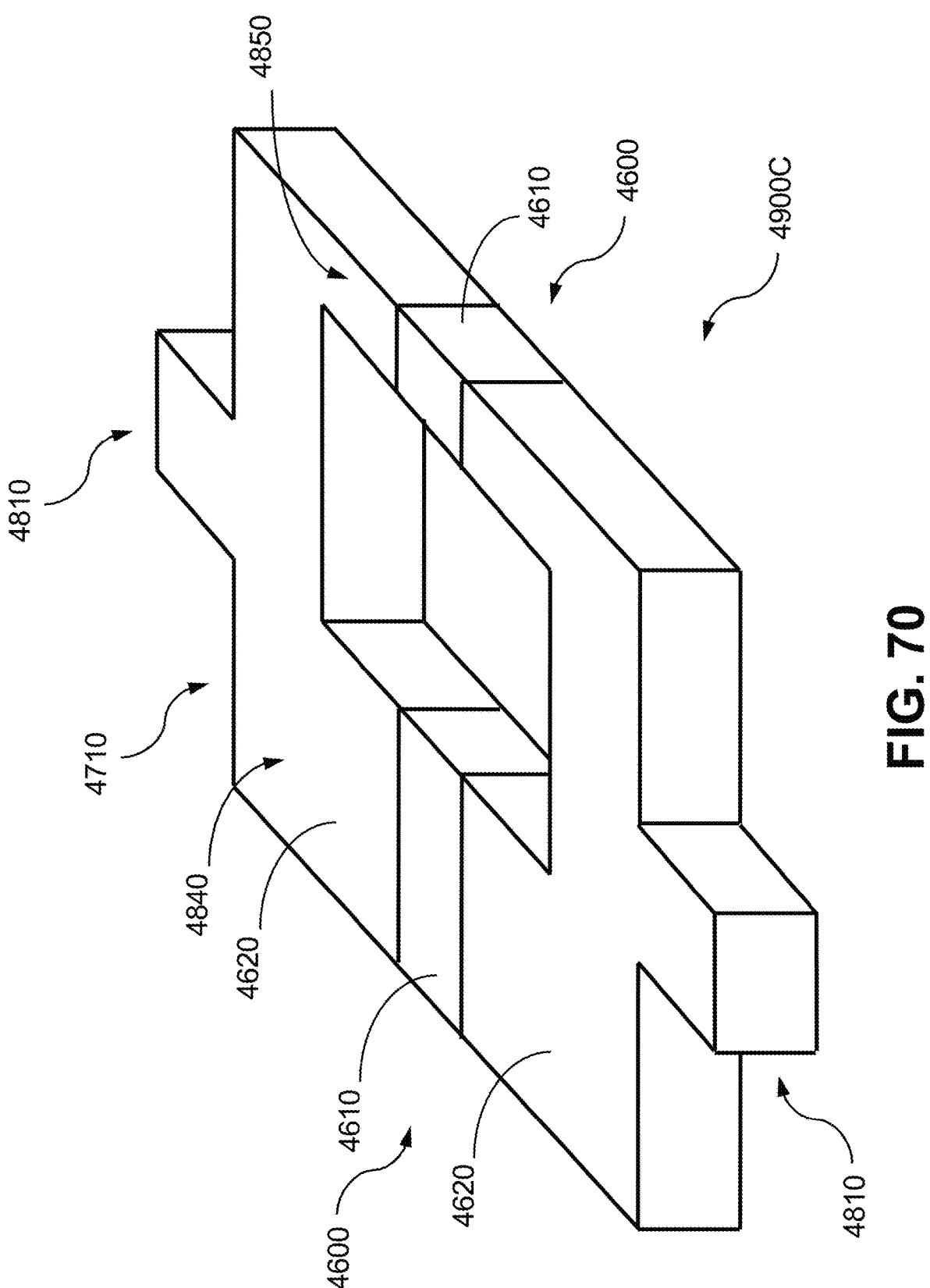

FIG. 70 illustrates a dual-feed, two Josephson junction ELR QUID 4900C according to various implementations of the invention. ELR QUID 4900C includes an asymmetrical ELR loop 4710 in that legs 4840, 4850 are sized differently from one another as discussed above with reference to FIG. 67. While not otherwise illustrated, in various implementations of the invention, leg 4850 may be wider than leg 4840. The widths of legs 4840, 4850 in ELR loop 4710 may change a respective flow of current through each of legs 4840, 4850, and hence change an overall operation and/or sensitivity of ELR QUID 4900C as would be appreciated.

While ELR QUIDs 4900A in FIGS. 68-70 are illustrated as having two Josephson junctions 4600, ELR QUIDs 4900A may comprise three or more Josephson junctions 4600 as would be appreciated. Generally speaking, such ELR QUIDs 4900 may be considered as parallel arrays of Josephson junctions 4600 interconnected with ELR segments 5320 (as will be described in further detail below with reference to FIG. 76).

Generally, speaking ELR QUID 4900 may be used to detect magnetic fields that flow through the interior area formed by ELR loop 4710 as would be appreciated. More particularly, ELR QUID 4900 may be used with a DC biasing circuit 5100A—as illustrated in FIG. 72. DC biasing circuit 5100 utilizes a DC current 5120 to provide a bias current through each of the legs of ELR loop 4710 of ELR QUID 4900. In this configuration, ELR QUID 4900 is sometimes referred to as DC QUID 4900. In various implementations of the invention, the bias currents through the legs of in ELR loop 4710 are kept at or just below the critical current of barriers 4610A of Josephson junctions 4600 in ELR QUID 4900. A magnetic field flowing through the interior area formed by ELR loop 4710 causes the current in ELR loop 4710 to exceed the critical current of barrier 4610A-, thereby producing a voltage across barriers 4610 which can be detected and/or measured as would be appreciated. ELR QUIDs 4900 are generally more sensitive to magnetic fields than, for example, ELR QUIDs 4700 as would be appreciated.

Figure 76:
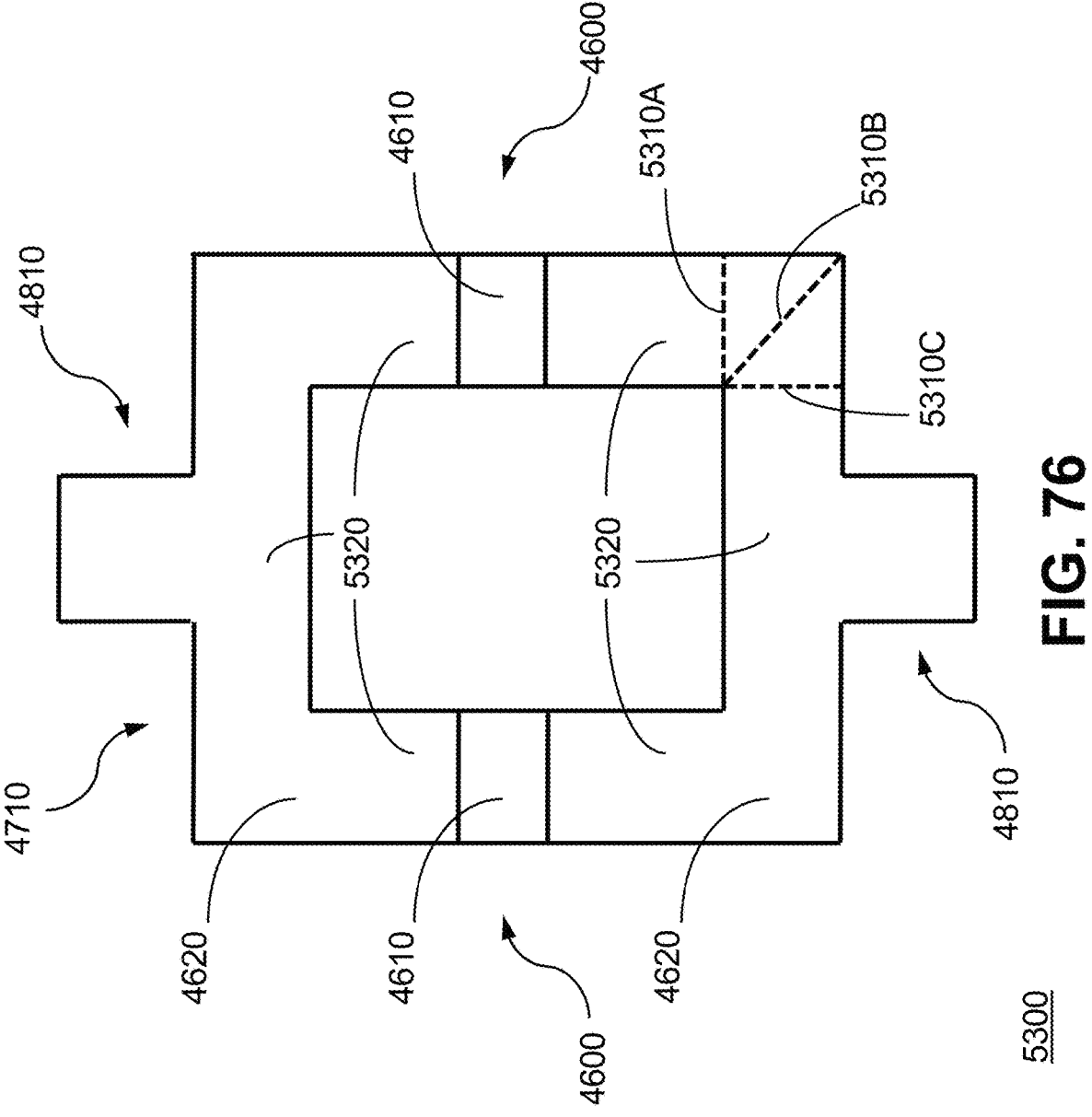

A construction of ELR QUID 4900 in accordance with various implementations of the invention is now described in reference FIG. 76. As would be appreciated, the following description may apply to various implementations of ELR QUIDs 4700, 4800. As illustrated in FIG. 76, ELR QUID 4900 may be comprised of a plurality of ELR segments 5320. Each ELR segment 5320 may have a structure similar to that of nanowire segment 4110. In some implementations of the invention, ELR segments 5320 may have dimensions larger, and in many cases substantially larger, than those of nanowire segments 4110. In some implementations of the invention, ELR segments 5320 comprise nanowire segments 4110. In some implementations of the invention, ELR segments 5320 comprise an ELR material such as those described above.

In some implementations of the invention, ELR QUID 4900 may comprise feeds 4810 formed from an ELR material such as those described above. In some implementations of the invention, ELR QUID 4900 may comprise feeds 4810 formed from a material different from ELR material. In some implementations of the invention, ELR QUID 4900 may comprise feeds 4810 formed from a conductive material. In some implementations of the invention, ELR QUID 4900 may comprise feeds 4810 formed from a conductive metal. In some implementations of the invention, ELR QUID 4900 may comprise one feed 4810 formed from one material and another feed 4810A formed from another material.

In some implementations of the invention, various interfaces 5310 (illustrated as an interface 5310A, an interface 5310B, and an interface 5310C) may be used between ELR segments 5320 to form ELR loop 4710 as would be appreciated. (As would be appreciated, not all interfaces 5310 in ELR loop 4710 are illustrated for convenience.) According to various implementations of the invention, interfaces 5310 represent a transition between an orientation of crystalline structure of one ELR segment 5320 and that of another ELR segment 5320.

ELR QUIDs 4700, 4800, 4900 (henceforth referenced interchangeably as ELR QUIDs) often find their way into a variety of circuits and/or applications. For example, both ELR QUIDs 4700 and ELR QUIDs 4900 may be used to form very sensitive magnetometers (such as that illustrated in FIG. 73 and discussed below). Depending on a sophistication of the biasing, amplification and feedback circuits employed (not otherwise illustrated) as would be appreciated, magnetometers may be formed that detect magnetic fields able to detect on the order of one ten-billionth ($10^{-10}$) of the earth's magnetic field.

Figure 75:
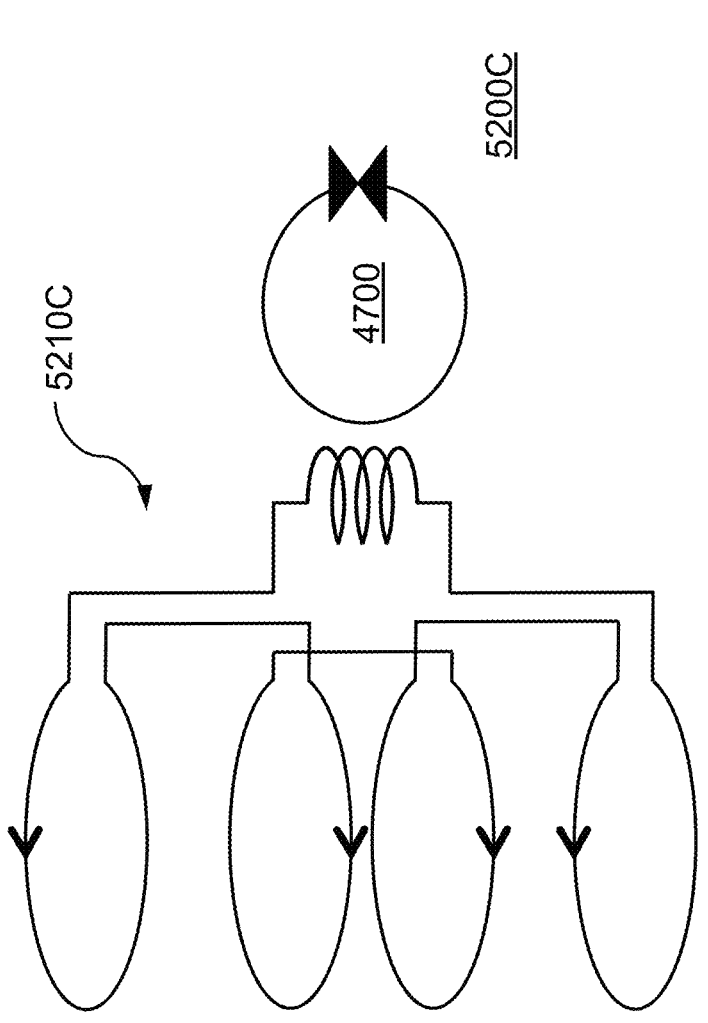

FIGS. 73-75 illustrate various gradiometers 5200 according to various implementations of the invention. Generally speaking, gradiometers 5200 are instruments capable of measuring changes or gradients in magnetic fields. FIG. 73 illustrates a gradiometer 5200A (also referred to as a magnetometer 5200A) that uses an ELR QUID 4700, 4900 to measure a magnetic field through a loop of a loop circuit 5210A as would be appreciated. As would be appreciated, ELR QUID 4700, 4900 may be magnetically shielded.

FIG. 74 illustrates a gradiometer 5200B that uses an ELR QUID 4700 to measure a first derivative of the magnetic field through loops of a loop circuit 5210B as would be appreciated. More particularly, the two loops of loop circuit 5210B are configured to be equal in size, parallel to one another, and wound with opposite senses so that the currents induced in each loop cancel one another in the presence of a uniform field. With such a configuration, the loops of loop circuit 5210B capture the difference between the loops as would be present in a changing field.

FIG. 75 illustrates a gradiometer 5200C that uses an ELR QUID 4700 to measure a second derivative of the magnetic field through loops of a loop circuit 5210C as would be appreciated. More particularly, the four loops of loop circuit 5210C are configured to be equal in size, parallel to one another, and wound as illustrated so that the currents induced in each loop cancel one another in the presence of a uniformly changing field. With such a configuration, the loops of loop circuit 5210B capture the rate of change in the field through the loops.

FIG. 76 illustrates, in further detail, an exemplary ELR QUID 5300 according to various implementations of the invention. As illustrated, ELR QUID 5300 may be comprised of a plurality of ELR segments 5320 coupled together at exemplary intersections 5310 (illustrated in FIG. 76 as a potential intersection 5310A, a potential intersection 5310B, or a potential intersection 5310C). For example, two ELR segments 5320 may form intersection 5310 via one of potential intersections 5310A, 5310B, or 5310C. In some implementations of the invention, potential intersections 5310A and 5310C form perpendicular intersections between two ELR segments 5320; whereas, potential intersection 5310B forms a 45% intersections between two ELR segments 5320; and other potential intersections are possible as would be appreciated. As, one or more barriers 4610 (two are illustrated in FIG. 76) are disposed between two ELR segments 5320 to form Josephson junctions 4600. As also illustrated, a plurality of ELR segments 5320 form a loop 4710, the loop having at least one barrier 4610 disposed between two of the plurality of ELR segments 5320.

In some implementations of the invention, two or more ELR QUIDs may be coupled together in parallel. In some implementations of the invention, two or more ELR QUIDs may be coupled together in series. In some implementations of the invention, two or more ELR QUIDs may be coupled together in series and also coupled in parallel with at least one other ELR QUID. In some implementations of the invention, an N-by-M matrix of ELR QUIDs may be formed on a surface (planar or otherwise) as a sensor matrix, capable of sensing, measuring, and/or locating various fields within the N-by-M matrix. In some implementations of the invention, an N-by-M-by-L lattice of ELR QUIDs may be formed as a sensor lattice, capable of sensing, measuring, and/or locating various fields within the volume of the N-by-M-by-L lattice. Various other configurations of ELR QUIDs may be formed as would be appreciated.

Because of their sensitivity, ELR QUIDs may be used to measure susceptance of materials, to non-destructively evaluate defects in metals, for geophysical surveying, for microscopic magnetic observations, and for biological measurements. The improved operating characteristics of the ELR materials utilized by ELR QUIDs of various implementations of the invention open widespread use of such ELR QUIDs in the field of medical and mental diagnostics and other applications where the measured sample must be maintained well above cryogenic temperatures.

In some implementations, a QUID that includes modified ELR materials may be described as follows:

An ELR QUID comprising: an ELR loop comprising an ELR material having improved operating characteristics and a Josephson junction.

An ELR QUID comprising: an ELR loop comprising an ELR material having a critical temperature greater than 150 K and a barrier material, wherein the ELR material and the barrier material form at least one Josephson junction in the ELR loop.

An ELR QUID comprising: a plurality of ELR segments arranged to form an ELR loop, the ELR segments formed from an ELR material having a critical temperature greater than 150 K; and a barrier disposed between two of the ELR segments to form a Josephson junction in the ELR loop.

An ELR QUID comprising: an ELR loop comprising a modified ELR material and a Josephson junction, wherein the modified ELR material comprises a first layer of ELR material and a second layer of modifying material bonded to the ELR material of the first layer, where the modified ELR material has improved operating characteristics over those of the ELR material alone.

An ELR QUID comprising: an ELR loop comprising a modified ELR material having a critical temperature greater than 150 K and a barrier material, wherein the ELR material and the barrier material form at least one Josephson junction in the ELR loop, wherein the modified ELR material comprises a first layer of ELR material and a second layer of modifying material bonded to the ELR material of the first layer.

An ELR QUID comprising: a plurality of ELR segments arranged to form an ELR loop, the ELR segments formed from a modified ELR material, wherein the modified ELR material comprises a first layer of ELR material and a second layer of modifying material bonded to the ELR material of the first layer, where the modified ELR material has improved operating characteristics over those of the ELR material alone; and a barrier disposed between two of the ELR segments to form a Josephson junction in the ELR loop.

An asymmetric ELR QUID comprising: an ELR loop comprising a ELR material and a Josephson junction, wherein the ELR material has improved operating characteristics, wherein the ELR loop has a first leg and a second leg, wherein the first leg carries more current than the second leg.

A circuit comprising: an ELR QUID comprising an ELR loop comprising a modified ELR material and a Josephson junction; and an inductor coupled to the ELR QUID, wherein an alternating current flowing through the inductor induces a current in the ELR loop of the ELR QUID.

A circuit comprising: an ELR QUID comprising an ELR loop comprising a modified ELR material and a Josephson junction, the ELR QUID having at least one feed for introducing a current into the ELR loop; a source for providing the current to the ELR QUID through the feed; and an input coil that senses a sensed current and that induces an induced current in the ELR QUID.

A magnetometer comprising: an ELR QUID comprising an ELR loop comprising a modified ELR material and a Josephson junction; an inductor; and a sensing loop coupled to the inductor, wherein a field flowing through the sensing loop provides a current to the inductor, and wherein the current through the inductor induces a second current in the ELR loop of the ELR QUID.

A gradiometer comprising: an ELR QUID comprising an ELR loop comprising a modified ELR material and a Josephson junction; and a sensing circuit comprising: an inductor, a first loop coupled to the inductor, and a second loop coupled to the first loop and the inductor, wherein the first loop is substantially the same size as the second loop, wherein the first loop is parallel to and disposed along a concentric axis of the second loop, and wherein the first loop is wound around the concentric axis in a direction opposite that of the second loop, wherein the first loop and the second loop provide a current to the inductor, wherein the current corresponds to a difference between a field flowing through the first loop and a field flowing through the second loop, and wherein the current through the inductor induces a second current in the ELR loop of the ELR QUID.

A gradiometer comprising: an ELR QUID comprising an ELR loop comprising a modified ELR material and a Josephson junction; and a sensing circuit comprising: an inductor, a first loop coupled to the inductor, and a second loop coupled to the first loop, a third loop coupled to the second loop, a fourth loop coupled to the third loop and the inductor, wherein the first loop, the second loop, the third loop and the fourth loop are substantially the same size, wherein the first loop, the second loop, the third loop and the fourth loop are substantially are substantially parallel to one another, wherein the first loop, the second loop, the third loop and the fourth loop share a concentric axis, wherein the first loop is wound around the concentric axis in a direction opposite that of the second loop, wherein the third loop is wound around the concentric axis in a direction opposite that of the fourth loop, wherein the first loop, the second loop, the third loop, and the fourth loop provide a current to the inductor, wherein the current corresponds to a difference between a first difference and a second difference, the first difference corresponding to a difference between a field flowing through the first loop and a field flowing through the second loop, and the second difference corresponding to a difference between a field flowing through the third loop and a field flowing through the fourth loop, and wherein the current through the inductor induces a second current in the ELR loop of the ELR QUID.

A circuit comprising: a plurality of ELR QUIDs coupled in series with one another, each of the plurality of ELR QUIDs comprising an ELR loop comprising a modified ELR material and a Josephson junction.

A circuit comprising: a plurality of ELR QUIDs coupled in parallel with one another, each of the plurality of ELR QUIDs comprising an ELR loop comprising a modified ELR material and a Josephson junction.

A circuit comprising: a plurality of series ELR QUID arrays coupled in parallel with one another, each of the plurality of series ELR QUID arrays comprising a plurality of ELR QUIDs coupled in series with one another, each of the plurality of ELR QUIDs comprising an ELR loop comprising a modified ELR material and a Josephson junction.

A circuit comprising: a plurality of parallel ELR QUID arrays coupled in series with one another, each of the plurality of parallel ELR QUID arrays comprising a plurality of ELR QUIDs coupled in parallel with one another, each of the plurality of ELR QUIDs comprising an ELR loop comprising a modified ELR material and a Josephson junction.

A circuit comprising: an ELR QUID matrix comprised of N rows and M columns of ELR QUIDs, each of the plurality of ELR QUIDs comprising an ELR loop comprising a modified ELR material and a Josephson junction.

A circuit comprising: an ELR QUID lattice disposed in a volume, the ELR QUID comprised of L matrices comprised of N rows and M columns of ELR QUIDs disposed at intervals in each matrix, each of the plurality of ELR QUIDs comprising an ELR loop comprising a modified ELR material and a Josephson junction, wherein the modified ELR material comprises a first layer of ELR material and a second layer of modifying material bonded to the ELR material of the first layer, where the modified ELR material has improved operating characteristics over those of the ELR material alone.

Chapter 4—Medical Devices formed of ELR Materials

This chapter of the description refers to FIGS. 1-36 and FIGS. 44-84; accordingly all reference numbers included in this section refer to elements found in such figures.

Because of their sensitivity, ELR QUIDs may be used to measure susceptance of materials, to non-destructively evaluate defects in metals, for geophysical surveying, for microscopic magnetic observations, and for biological measurements. The improved operating characteristics of the ELR materials utilized by ELR QUIDs of various implementations of the invention open widespread use of such ELR QUIDs in the field of medical and mental diagnostics and other applications where the measured sample must be maintained well above cryogenic temperatures.

Figure 77:
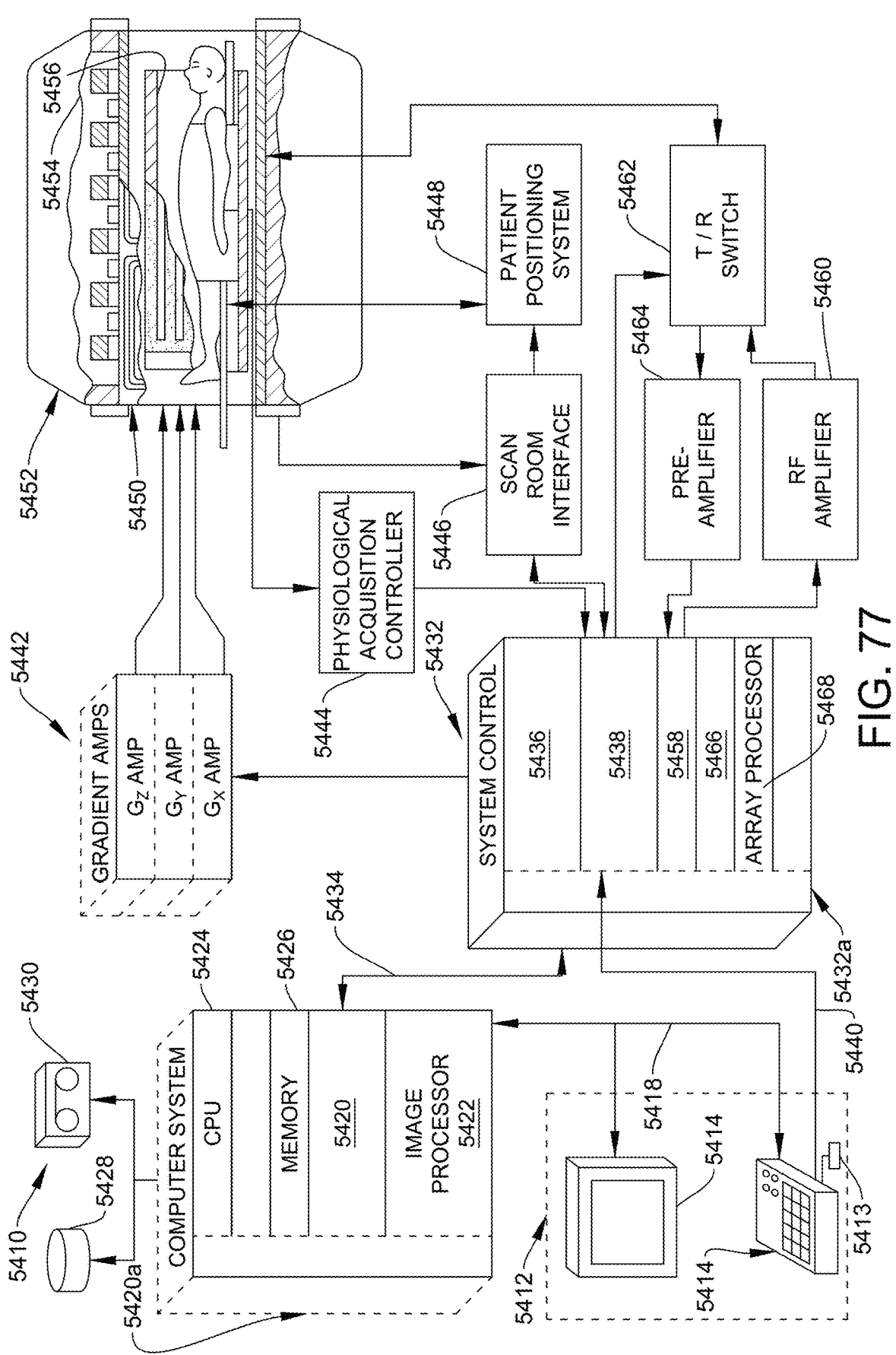
FIGS. 77 to 84 illustrate the forming of medical devices using ELR materials.

FIG. 77 illustrates an exemplary MRI system 5410, according to various implementations of the invention. In some implementations of the invention, MRI system 5410 may be controlled from an operator console 5412 which may include, without limitation, an input device 5413, a control panel 5414, and a display screen 5416. In some implementations of the invention, input device 5413 can include, without limitation, a mouse, a joystick, a keyboard, a track ball, a touch activated screen, a light wand, a voice control, or any similar or equivalent input device, and may be used for interactive geometry prescription.

In some implementations of the invention, operator console 5412 communicates via a link 5418 with a separate computer system 5420 that allows an operator to control the production and display of images on display screen 5416. In some implementations of the invention, computer system 5420 includes a number of modules that communicate with each other through a backplane 5420A. These modules may include, without limitation, an image processor module 5422, a CPU module 5424 and a memory module 5426, known in the art as a frame buffer for storing image data arrays. In some implementations of the invention, computer system 5420 is linked to disk storage 5428 and a tape drive 5430 for storage of image data and programs.

In some implementations of the invention, computer system 5420 communicates with a separate system control 5432 through a high speed serial link 5434. In some implementations of the invention, system control 5432 includes a set of modules connected together by a backplane 5432*a*. These modules may include, without limitation, a CPU module 5436A and a pulse generator module 5438A that connects to operator console 5412 through a serial link 5440, through which system control 5432 may receive commands from the operator to indicate the scan sequence that is to be performed. In some implementations of the invention, pulse generator module 5438 operates the system components to carry out the desired scan sequence and produces data which indicates the timing, strength and shape of the RF pulses produced, and the timing and length of the data acquisition window. Pulse generator module 5438 connects to a set of gradient amplifiers 5442 to indicate the timing and shape of the gradient pulses that are produced during the scan. In some implementations of the invention, pulse generator module 5438 can also receive patient data from a physiological acquisition controller 5444 that receives signals from a number of different sensors connected to the patient, such as ECG signals from electrodes attached to the patient. In some implementations of the invention, pulse generator module 5438 connects to a scan room interface circuit 5446, which receives signals from various sensors associated with the condition of the patient and the magnet system. In some implementations of the invention, through scan room interface circuit 5446, a patient-positioning system 5448 may receive commands to move the patient to the desired position for the scan. In some implementations of the invention, patient positioning system 5448 may control patient position such that the patient is continuously or incrementally translated during data acquisition.

In some implementations of the invention, the gradient waveforms produced by pulse generator module 5438 are applied to gradient amplifiers 5442 having $G_x$, $G_y$, and $G_z$ amplifiers. Each gradient amplifier 5442 excites a corresponding physical gradient coil in a gradient coil assembly generally designated 5450 to produce the magnetic field gradients used for spatially encoding acquired signals. In some implementations of the invention, gradient coil assembly 5450 may form part of a magnet assembly 5452 which includes a polarizing magnet 5454 and a whole-body RF coil 5456. In some implementations of the invention, a transceiver module 5458 in system control 5432 produces pulses that are amplified by an RF amplifier 5460, which is coupled to whole-body RF coil 5456 by a transmit/receive switch 5462. The resulting signals emitted by the excited nuclei in the patient may be sensed by the same whole-body RF coil 5456 and coupled through the transmit/receive switch 5462 to a preamplifier 5464. The amplified MR signals are demodulated, filtered, and digitized in the receiver section of transceiver module 5458. Transmit/receive switch 5462 is controlled by a signal from pulse generator module 5438 to electrically connect RF amplifier 5460 to whole-body RF coil 5456 during the transmit mode and to connect preamplifier 5464 to whole-body RF coil 5456 during the receive mode. In some implementations of the invention, transmit/receive switch 5462 can also allow a separate RF coil (for example, a surface coil) to be used in either the transmit or receive mode.

The MR signals picked up by whole-body RF coil RF coil 5456 are digitized by transceiver module 5458 and transferred to a memory module 5466 in system control 5432. A scan is complete when an array of raw k-space data has been acquired in memory module 5466. This raw k-space data is rearranged into separate k-space data arrays for each image to be reconstructed, and each of these is input to an array processor 5468, which performs a Fourier transform of the data into an array of image data. This image data is conveyed through serial link 5434 to computer system 5420 where it is stored in memory, such as disk storage 5428A. In response to commands received from operator console 5412, this image data may be archived in long term storage, such as on tape drive 5430, or it may be further processed by image processor 5422, conveyed to operator console 5412 and presented via display 5416.

Various implementations of the invention include methods and systems suitable for use with MRI system 5410, or any similar or equivalent system for obtaining magnetic resonance images.

Figures 78, 79, 80:
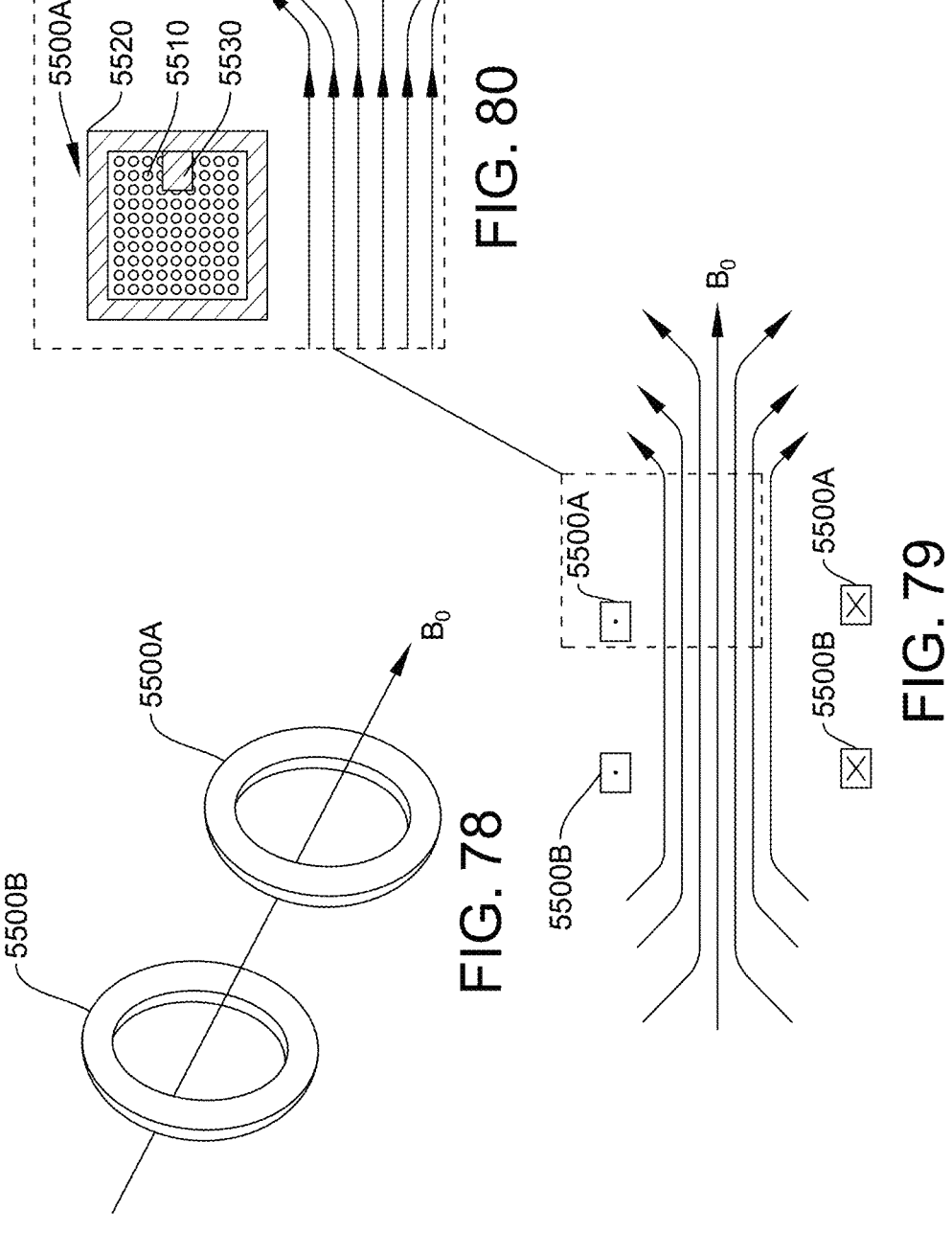

FIG. 78 illustrates exemplary MRI magnets 5500A and 5500B employing various ELR materials, including modified ELR materials, apertured ELR materials, and/or new ELR materials, in accordance with various implementations of the invention. Magnets 5500A and 5500B generate magnetic field B$_0$. During an MRI procedure, the magnetic field B$_0$ aligns certain atoms of a subject (e.g., a human body, etc.) that are distributed within the internal body tissues of the subject. In some implementations, the subject may be placed along a path substantially parallel to the magnetic field B$_0$ such that the subject is placed through magnets 5500 (such as in "closed" bore MRI applications). In some implementations, the subject may be placed along a path substantially perpendicular to the magnetic field B$_0$ such that the subject is placed between magnets 5500 (such as in "open" MRI applications).

Although a pair of MRI magnets 5500 are illustrated in FIGS. 78-80, any number of magnets may be used as would be appreciated. Furthermore, although MRI magnet 5500 is illustrated in FIG. 78 as toroidal shaped, other configurations may be used as would be appreciated.

FIG. 79 illustrates a cross-section of MRI magnets 5500A and 5500B and the magnetic field B$_0$ they generate, according to various implementations of the invention.

FIG. 80 illustrates a cross section of a portion of magnet 5500A, according to various implementations of the invention. In some implementations of the invention, magnet 5500A may include, without limitation, a housing 5520, an ELR material 5510, and a switch 5530 coupled to a power supply (not illustrated in FIG. 80).

In some implementations of the invention, windings of ELR material 5510 are made about housing 5520. In some implementations of the invention, housing 5520 may include a cavity that includes windings of ELR material 5510. In some implementations of the invention, housing 5520 may house or otherwise include windings of ELR material 5510.

In some implementations of the invention, switch 5530 may be coupled to a power supply that provides current to ELR material 5510, thereby generating magnetic field B$_0$. In some implementations of the invention, ELR material 5510 may be configured as a tape or wire. In some implementations, ELR material may be configured as a plurality of nanowire segments such as nanowire segment 4110. In some implementations of the invention, ELR material 5510 may be configured as nanowire coils such as, but not limited to, nanowire coils 4200, 4300, and/or 4400. In various implementations of the invention ELR material 5510 may comprise modified ELR materials 1060, apertured ELR materials, and/or other new ELR materials in accordance with various implementations of the invention.

In some implementations of the invention, magnet 5500 operates with improved operating characteristics such as operating at temperatures above cryogenic temperatures. In some implementations of the invention, magnet 5500 operates with improved operating characteristics such as operating at temperatures above 150 K. In some implementations, magnet 5500 may generate magnetic field B$_0$ having magnetic flux densities above at least 1.0 T, 1.5 T, 3.0 T, 4.5 T, or 6.0 T without cryogenic coolants.

Figure 81:
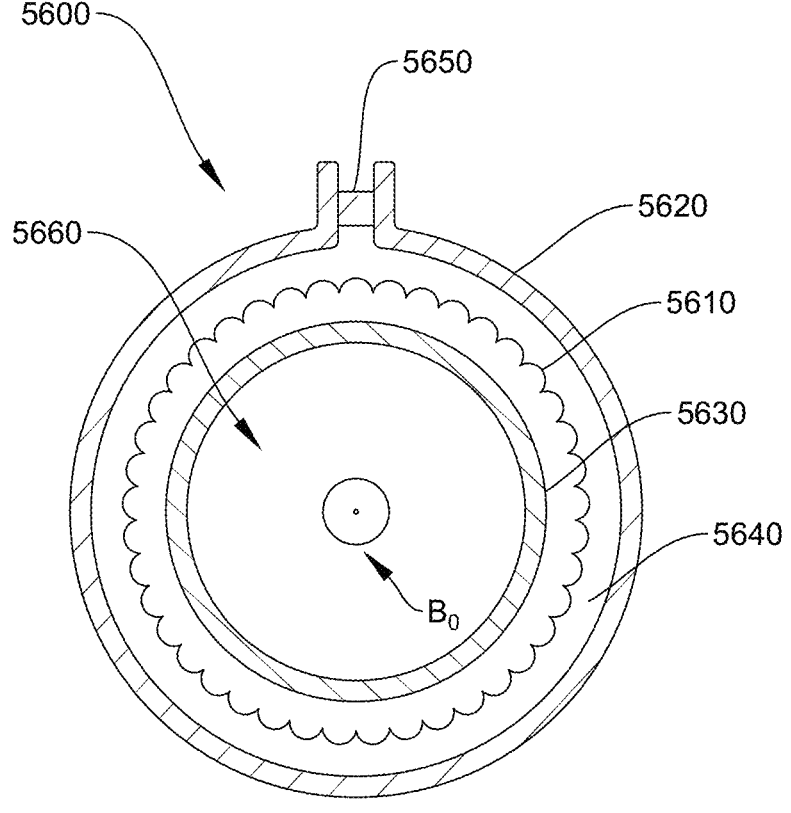

FIG. 81 illustrates a cross-sectional view of an MRI magnet assembly 5600, according to various implementations of the invention. Although MRI magnet assembly 5600 is illustrated in FIG. 81 as a toroidal bore-type magnet assembly, other configurations, such as a helix, oval, or other shape, may be used as would be appreciated. For example, open or portable MRI configurations using a magnet with ELR materials may be used.

According to various implementations of the invention, MRI magnet assembly 5600 may include, without limitation, an ELR material 5610, a housing 5620, an insulating layer 5630, a cavity 5640, a cold head 5650, and a bore 5660A. In some implementations of the invention, ELR material 5610A may comprise modified ELR material 1060, an apertured ELR material, and/or new ELR material in accordance with various implementations of the invention. In some implementations of the invention, ELR material 5610 may be configured as a tape or wire. In some implementations of the invention, ELR material 5610 may be configured as a nanowire such as a plurality of nanowire segments 4110. In some implementations of the invention, ELR material 5610 may be configured as nanowire coils such as nanowire coils 4200, 4300, and/or 4400.

In some implementations of the invention, ELR material 5610 is disposed within cavity 5640 of housing 5620. In some implementations of the invention, cavity 5640 is filled with a coolant such that magnet 5610 is immersed in the coolant. In some implementations of the invention, the coolant may include a cryogenic coolant or a non-cryogenic coolant. In these implementations, cold head 5650 includes a structure for maintaining the coolant as would be appreciated. In some implementations of the invention, cavity 5640 may be filled with a coolant such as a gas (e.g., ambient air, or other gases) or a liquid (e.g., water, carbon dioxide, ammonia, Freon™, a water-glycol mixture, a water-betaine mixture, or other liquids) or other coolants.

In some implementations of the invention (not illustrated in FIG. 81), magnet 5610 may be disposed within or on a solid material.

According to various implementations of the invention, ELR material 5610 operates with improved operating characteristics such as operating at temperatures above cryogenic temperatures. In some implementations of the invention, ELR material 5610 operates with improved operating characteristics such as operating at temperatures above 150 K. Thus, without a cryogenic coolant, MRI magnet assembly 5100 may produce a magnetic field B$_0$ substantially comparable to or better than that of conventional superconducting magnets that operate using cryogenic coolants (e.g., liquid helium, liquid nitrogen, or other cryogenic coolants). In some implementations of the invention, MRI magnet assembly 5100 generates a magnetic field B$_0$ substantially comparable to conventional superconducting magnets that operate using cryogenic coolants such as liquid helium or liquid nitrogen.

Figure 82:
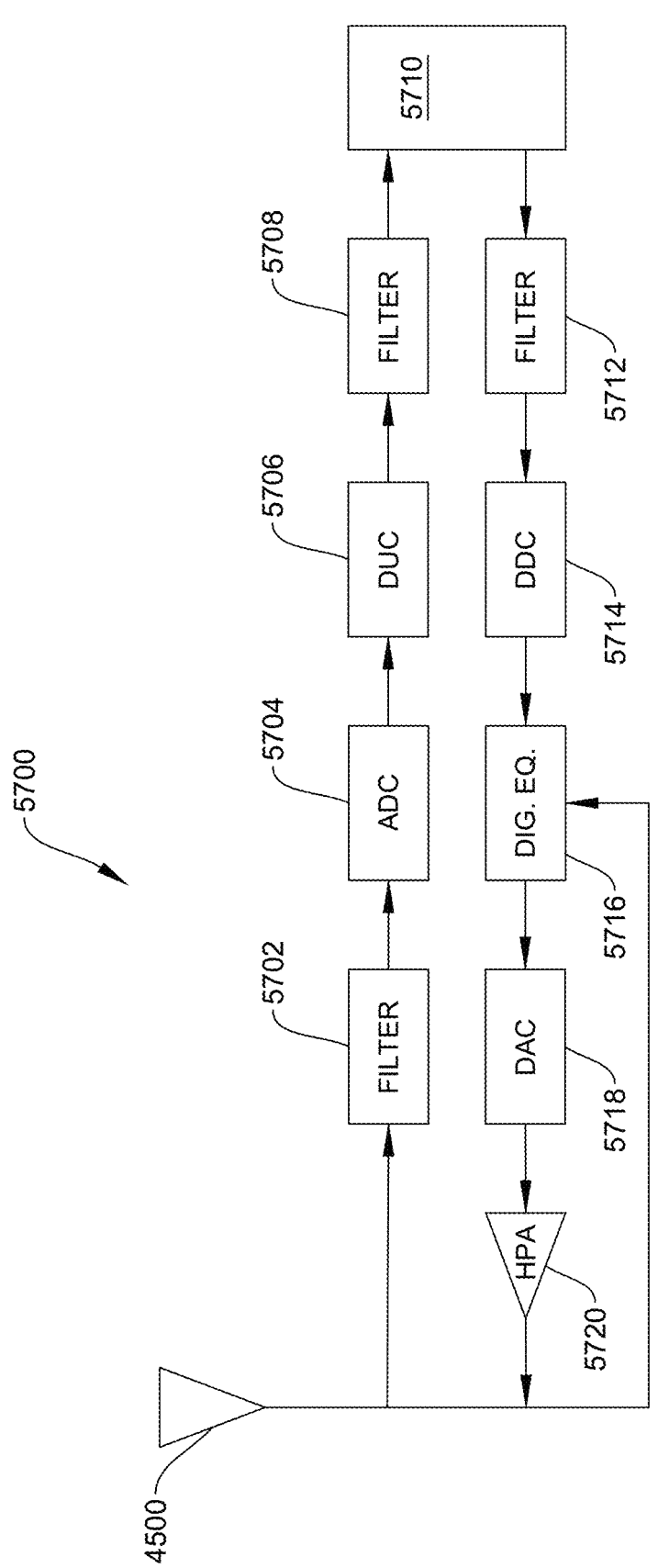

FIG. 82 is a block diagram illustrating an exemplary MRI circuitry 5700, according to various implementations of the invention. According to various implementations of the invention, MRI circuitry 5700 may include, without limitation, a converter 4500, a filter 5702, an Analog-to-Digital Converter (ADC) 5704, a digital up-converter (DUC) 5706, a filter 5708, a processor/detector 5710, a filter 5712, a digital down-converter (DDC) 5714, a digital equalizer 5716, a digital-to-analog converter (DAC) 5718, and a high power amplifier (HPA) 5720.

In some implementations of the invention, filters 5702 and 5708, ADC 5704, and digital up-converter 5706 may be configured as a receiver circuit as would be appreciated. Similarly, in some implementations of the invention, filter 5712, digital down-converter 5714, digital equalizer 5716, DAC 5718 and HPA 5720 may be configured as a transmitter circuit as would be appreciated. In some implementations of the invention, the foregoing receiver circuit and transmitter circuit may be configured as a transceiver circuit as would be appreciated.

In some implementations of the invention, one or more components, or one or more elements (e.g., as interconnects, etc.) of the one or more components, of the receiver circuit, transmitter circuit, or transceiver circuit may comprise (i.e., be constructed from) an improved ELR material such as modified ELR material 1060, an apertured ELR material, and/or a new ELR material in accordance with various implementations of the invention. In some implementations of the invention, improved ELR material may be configured as an ELR nanowire and may include a plurality of nanowire segments 4110. In some implementations of the invention, ADC 5704 may include a low noise and high sensitivity digitizer front-end, such as an ELR QUID detector that employs one or more ELR QUIDs (e.g., ELR QUID 4700, ELR QUID 4800, ELR QUID 4900). In some implementations, using an ELR QUID detector in MRI increases the resolution of RF detection. In some implementations, using high Q ELR filters reduces insertion loss and bandwidth, and improves SNR. In some implementations of the invention, the ELR QUID detector is sensitive enough to eliminate the need for a low-noise amplifier.

In some implementations of the invention, processor 5710 may be configured to receive voltage induced by converter 4500. Processor 5710 may be configured to process information based on various components (which may be formed of the improved ELR material) of the receiver circuit and/or transmitter circuit operating in an ELR state. This may improve signal-processing speed, thereby reducing scan times. In some implementations of the invention, processor 5710 may be configured to control voltage delivered to converter 4500 to produce an RF pulse.

Figure 83:
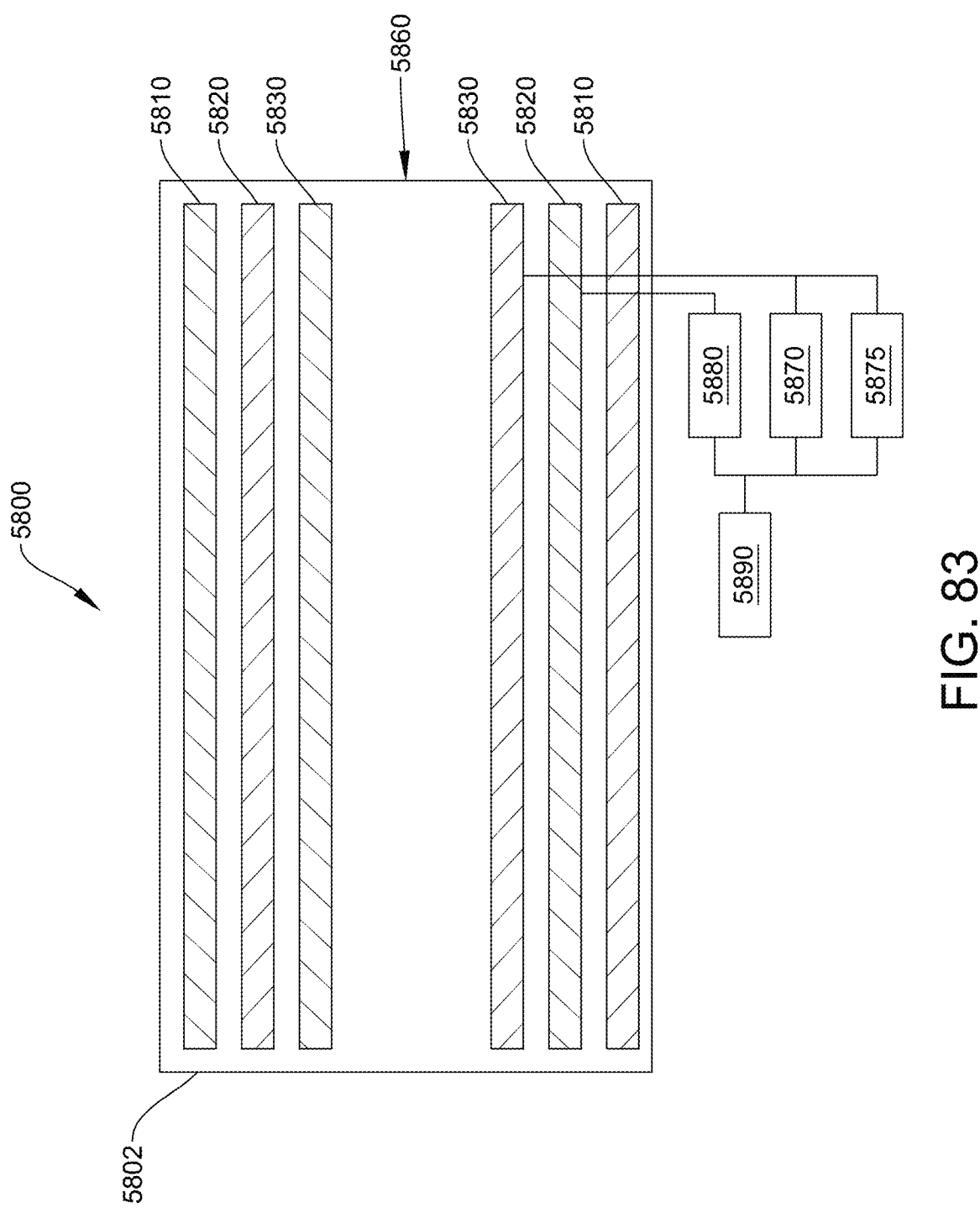

FIG. 83 illustrates a cross-sectional view of an MRI apparatus 5800, according to various implementations of the invention. According to various implementations of the invention, MRI apparatus 5800 may include, without limitation, a housing 5802, a magnet 5810, a gradient coil 5820, an RF coil 5830, a magnet bore 5860, circuitry 5870, an RF coil controller 5875, a gradient coil controller 5880, and a computing device 5890. In some implementations of the invention, circuitry 5870 may include one or more components and/or one or more elements of circuitry 5700 illustrated in FIG. 82. In some implementations of the invention, computing device 5890 may be coupled to RF coil controller 5875, gradient coil controller 5880A and circuitry 5870. Computing device 5890 may control via RF coil controller 5875 and gradient coil controller 5880 electromagnetic fields emitted by gradient coil 5820 and/or RF coil 5830. In some implementations of the invention, computing device 5890 controls circuitry 5870.

In some implementations of the invention, various components of MRI apparatus 5800 may employ improved ELR materials described herein. For example, magnet 5810, gradient coil 5820, RF coil 5830, and/or circuitry 5870 may employ improved ELR materials disclosed herein.

By including various components that employ such improved ELR materials disclosed herein, MRI apparatus 5800 may achieve better performance than conventional MRI scanners that do not employ such improved ELR materials. For example, MRI apparatus 5800 may achieve improved SNR, higher resolution, simplified and reliable cooling, reduced size, larger opening (magnet bore 5860) for the subject, and higher energy efficiency.

In some implementations of the invention, magnet 5810 may comprise a improved ELR material, such as modified ELR material 1060, an apertured ELR material, and/or a new ELR material in accordance with various implementations of the invention. In some implementations of the invention, magnet 5810 can include magnet 5500A illustrated in FIG. 80.

By using various improved ELR materials disclosed herein, magnet 5810 exhibits improved operating characteristics over conventional MRI magnets. As previously noted, such improved operational characteristics include higher temperatures of operation while providing magnetic intensities from 0.5 T to 3.0 T and greater. By operating at higher temperatures, magnet 5810 requires smaller or no cooling systems thereby facilitating, among other advantages, a more compact design of MRI apparatus 5800 and less operational cost. For example, less space devoted to cooling systems allows larger bore openings through which the subject may be placed. In this manner, more open systems and therefore larger patients or patients on gurneys may be scanned. For example, a gurney or other structure on which the subject lies may be wheeled or otherwise placed inside MRI apparatus 5800 for scanning the subject or MRI apparatus 5800 may itself be wheeled or placed around the gurney. Because of the larger opening facilitated by using magnet 5810, MRI apparatus 5800 is not limited to the rigid table of conventional MRI scanners.

In some implementations of the invention, gradient coil 5820 may comprise a improved ELR material such as modified ELR material 1060, an apertured ELR material, and/or a new ELR material in accordance with various implementations of the invention. By using various improved ELR materials disclosed herein, gradient coil 5820 exhibits improved operating characteristics over conventional gradient coils. In some implementations of the invention, RF coil 5830 may comprise an improved ELR material such as modified ELR material 1060, an apertured ELR material, and/or a new ELR material in accordance with various implementations of the invention. By using various improved ELR materials disclosed herein, RF coil 5830 exhibits improved operating characteristics over conventional RF coils. For example, using improved ELR materials, gradient coil 5820 and/or RF coil 5830 may reduce or eliminate resistive losses, and increase selectivity and resolution over conventional coils.

In some implementations of the invention, RF coil 5830 may include various converters disclosed herein such as converter 4500.

In some implementations of the invention, circuitry 5870 may include an ELR QUID detector that employs one or more ELR QUIDs (e.g., ELR QUID 4700, ELR QUID 4800, ELR QUID 4900). In some implementations, using an ELR QUID detector in MRI increases the resolution and sensitivity of RF detection. In some implementations, using high Q ELR filters reduces insertion loss and bandwidth, and improves SNR.

In some implementations, enhanced transmission and detection capabilities resulting from use of improved ELR materials (such as those described above) facilitates use of low field (e.g., less than 0.5 T) MRI while achieving higher resolution than conventional low field MRI. In these implementations, low field MRI allows portability, a larger, less restrictive field of measurement, reduction of chemical shift and a dramatically lower system cost. Chemical shift refers to the resonance frequency variations resulting from intrinsic magnetic shielding of anatomic structures. Molecular structure and electron orbital characteristics produce fields that shield the main magnetic field and give rise to distinct peaks in the magnetic resonance spectrum. In the case of proton spectra, peaks correspond to water and fat, and in the case of breast imaging, silicone material. Lower frequencies of about 3.5 parts per million ("ppm") for protons in fat and 5.0 ppm for protons in silicone occur, compared to the resonance frequency of protons in water. Since resonance frequency increases linearly with field strength, the absolute difference between the fat and water resonance also increases, making high field strength magnets more susceptible to chemical shift artifact. Thus, using low field MRI while maintaining high resolution may reduce or eliminate effects of chemical shift.

In some implementations of the invention, low field MRI relaxes the requirement for a closely coupled arrangement of gradient coil 5820 and/or RF coil 5830, thus opening up the enclosure in which the subject is scanned. In these implementations, MRI apparatus 5800 may be more portable such as being wheeled/positioned so that it encloses a gurney or other structure carrying the subject. As would be appreciated, the gurney or other structure may be made from MRI-inert material.

Figure 84:
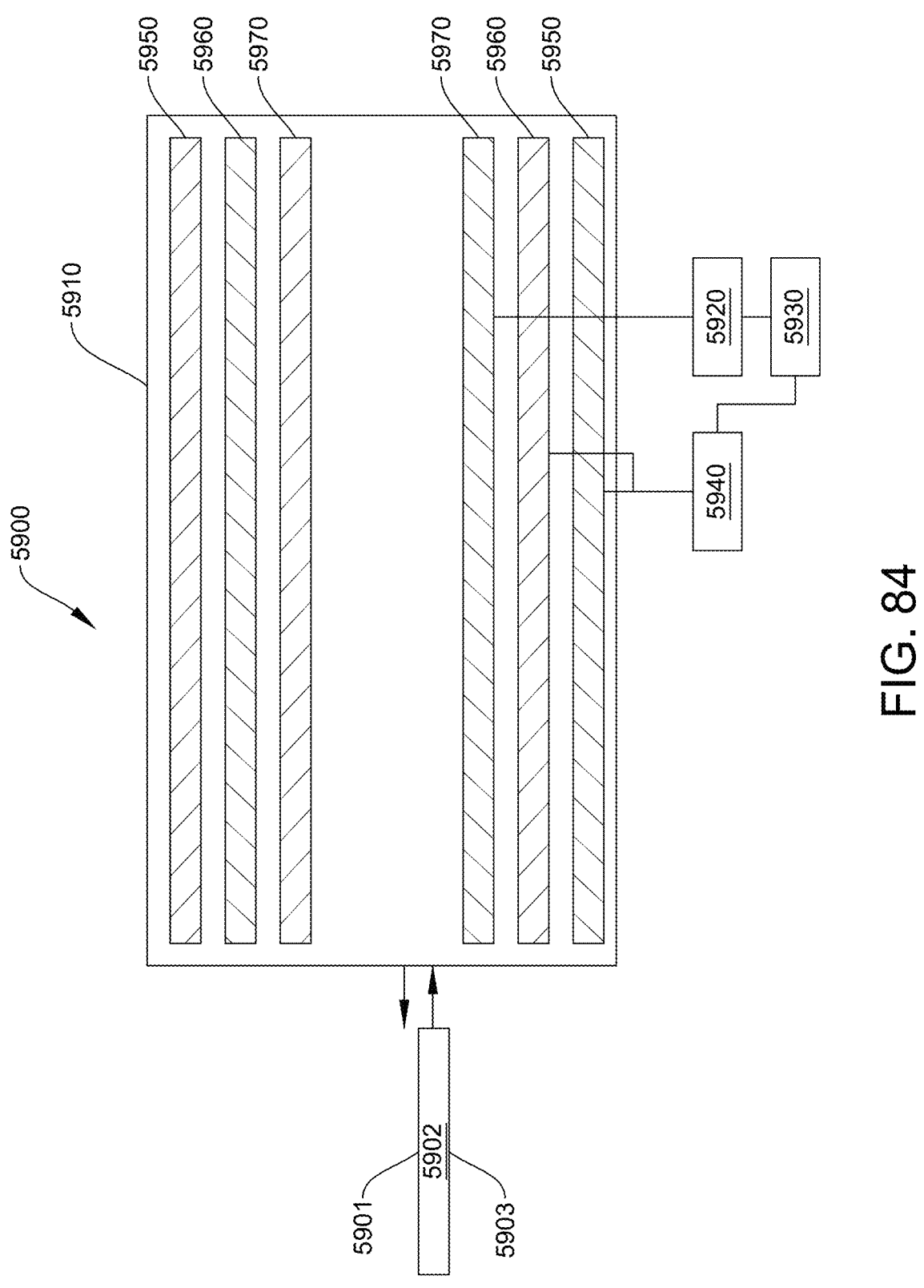

FIG. 84 illustrates a portable MRI apparatus system 5900, according to various implementations of the invention. In some implementations of the invention, portable MRI apparatus system 5900 may include, without limitation, a portable MRI apparatus 5910, a sensor 5920, an ELR QUID detector 5930, a magnet 5950, a gradient coil 5960, an RF coil 5970, and a computing device 5940. In some implementations of the invention, ELR QUID detector 5930 (e.g., ELR QUID 4700, 4800, 4900, etc.) employs improved ELR materials thereby having improved operating characteristics as described above. In some implementations, computing device 5940 controls the magnetic field from magnet 5950. In some implementations, computing device 5940 controls the gradient field from gradient coil 5960. In some implementations, computing device 5940 controls the excitation pulses from RF coil 5970.

In some implementations of the invention, computing device 5940 may be coupled to magnet 5950 and ELR QUID detector 5930. In some implementations of the invention, computing device 5940 causes magnet 5950 to generate a magnetic field for low field MRI scanning. In some implementations of the invention, magnet 5950 may include a low-intensity magnet that produces the low intensity field of less than approximately 0.5 Tesla, which is facilitated by the sensitivity of ELR QUID detector 5930. In some implementations of the invention, gradient coil 5960 may generate a gradient field that allows location of certain atoms of the subject. In some implementations of the invention, RF coil 5970 may generate an excitation pulse, which cause a resonance signal from atoms of the subject.

According to various implementations of the invention, sensor 5920 may include, without limitation, a magnetometer, gradiometer, a flux transformer, or other sensing component that senses a resonance signal caused by the low-intensity magnetic field generated by magnet 5950. ELR QUID detector 5930 may receive and process the sensed signal as would be appreciated.

Unlike conventional devices that use SQUID detectors, portable MRI apparatus 5910 does not require using a cryogenic coolant/cooler to cool ELR QUID detector 5930. Accordingly, among other benefits such as higher image quality, lower cost, and easier maintenance, portable MRI apparatus 5910 may be easily movable without requiring a cryogenic cooler.

As illustrated in FIG. 84, for example, portable MRI apparatus 5910 may be positioned adjacent to a structure 5902 such as, without limitation, a gurney, an examination table or wall/floor/ceiling. In some implementations of the invention, portable MRI apparatus 5910 is rigidly coupled to structure 5902. In other implementations, portable MRI apparatus 5910 may be moved about structure 5902. For example, structure 5902 may be removably placed inside MRI apparatus 5910 and/or MRI apparatus 5910 may be removably placed around structure 5902. In these implementations, magnet 5950 may itself be portable, be rigidly coupled to a housing of portable MRI apparatus 5910 (not illustrated in FIG. 84) or may be rigidly coupled to structure 5902 or other structure.

In some implementations of the invention, structure 5902 may include opposing surfaces 5901 and 5903. Surface 5901 and/or surface 5903 may have a substantially flat, curved, or other shape based on site or other specifications. In some implementations of the invention, a subject such as a patient may be scanned while on or near surface 5901. For example, a patient may stand adjacent to, lie on or underneath surface 5901, or place a body part such as an arm, a head, or other extremity near, on or underneath surface 5901. In some implementations of the invention, portable MRI apparatus 5910 may be placed adjacent to surface 5903 (i.e., on a side of structure 5902 opposite the scanned subject). In this manner, an open MRI procedure may be achieved, where the subject stands near, lies on, or lies underneath structure 5902 without scanning instrumentation or components of portable MRI apparatus 5910 adjacent to the side of the subject opposite portable MRI apparatus 5910. In these implementations, medical procedures such as surgery or examinations can be assisted by images produced by portable MRI apparatus 5910.

According to various implementations of the invention, magnet 5950, gradient coil 5960 and/or RF coil 5970 employs improved ELR materials thereby having improved operating characteristics as described herein. In these implementations, employing improved ELR materials facilitates various configurations of magnet 5950, gradient coil 5960, and/or RF coil 5970. For example, the tight coupling among conventional magnets, gradient coils and RF coils required for conventional MRI scanners is relaxed using magnet 5950, gradient coil 5960 and/or RF coil 5970. These relaxed configurations may result in a larger bore opening than conventional scanners that use conventional magnets, gradient coils, and RF coils that do not employ improved ELR materials disclosed herein. The larger bore opening facilitates portability of portable MRI apparatus 5910 (such as being removable about structure 5902 or vice versa) as well as accommodation of larger subjects.

In some implementations of the invention, portable MRI apparatus 5910 may include active and/or passive electromagnetic shielding (not illustrated) as would be appreciated. In some implementations of the invention, portable MRI apparatus 5910 may be used in a "clean" or otherwise shielded room. In some implementations of the invention (not illustrated) structure 5902 may include one or more shielding elements.

Although illustrated as being positioned on a side of structure 5902 opposite the subject, portable MRI apparatus 5910 may be placed at various locations relative to the subject due to the portability of portable MRI apparatus 5910. Furthermore, any combination of sensor 5920, ELR QUID detector 5930, computing device 5940, magnet 5950, gradient coil 5960, and RF coil 5970 may be housed in a single housing (as illustrated in FIG. 77, for example), or in multiple housings. For example, magnet 5950 may also be portable, be included with portable MRI apparatus 5910, or may be coupled to structure 5902.

As would be appreciated, computing device 5940 may include a memory that stores instructions that configure one or more processors (not illustrated in FIG. 84) that control magnet 5950 and generates an MRI image based on processing by ELR QUID detector 5930.

In some implementations, a medical device that includes modified ELR materials may be described as follows:

A magnetic resonance imaging (MRI) magnet, comprising: an ELR material, the ELR material having an improved operating characteristic; wherein the ELR material propagates a current that generates a magnetic field during an MRI procedure, wherein the magnetic field causes certain atoms in a body of a subject to align.

A magnetic resonance imaging (MRI) magnet assembly, comprising: a housing; and an MRI magnet coupled to the housing, the MRI magnet comprising: an ELR material having an improved operating characteristic, wherein the ELR material generates a magnetic field during an MRI procedure, wherein the magnetic field causes certain atoms in a body of a subject to align.

A magnetic resonance imaging (MRI) magnet, comprising: a wire comprising an ELR material, the ELR material having an improved operating characteristic; wherein the wire propagates a current that generates a magnetic field during an MRI procedure, wherein the magnetic field causes certain atoms in a body of a subject to align.

A magnetic resonance imaging (MRI) magnet assembly, comprising: a housing; and an MRI magnet coupled to the housing, the MRI magnet comprising an ELR material having an improved operating characteristic, wherein the ELR material generates a magnetic field during an MRI procedure, wherein the magnetic field causes certain atoms in a body of a subject to align.

A Magnetic Resonance Imaging (MRI) magnet, comprising: an ELR nanowire, the ELR nanowire configured to conduct an electrical current to generate a magnetic field during an MRI procedure, wherein the ELR nanowire comprises: an ELR material having three dimensional parameters, including a length, a width, and depth, wherein at least one of the dimensional parameters is less than a threshold such that the ELR nanowire does not exhibit at least one superconducting phenomenon while operating with extremely low resistance.

A Magnetic Resonance Imaging (MRI) magnet assembly, comprising: a housing; and an MRI magnet coupled to the housing, the MRI magnet comprising: an ELR nanowire, the ELR nanowire configured to conduct an electrical current to generate a magnetic field during an MRI procedure, wherein the ELR nanowire comprises: an ELR material having three dimensional parameters, including a length, a width, and depth, wherein at least one of the dimensional parameters is less than a threshold such that the ELR nanowire does not exhibit at least one superconducting phenomenon while operating with extremely low resistance.

A magnetic resonance imaging (MRI) magnet, comprising: a nanowire comprising an ELR material having an improved operating characteristic, wherein the nanowire propagates a current that generates a magnetic field during an MRI procedure, wherein the magnetic field causes certain atoms in a body of a subject to align.

A magnetic resonance imaging (MRI) magnet assembly, comprising: a housing; and an MRI magnet coupled to the housing, the MRI magnet comprising: a nanowire comprising an ELR material having an improved operating characteristic, wherein the nanowire generates a magnetic field during an MRI procedure, wherein the magnetic field causes certain atoms in a body of a subject to align.

A magnetic resonance imaging (MRI) magnet, comprising: an ELR nanowire contour, the ELR nanowire contour configured to conduct an electrical current to generate a magnetic field during an MRI procedure, wherein the magnetic field causes certain atoms in a body of a subject to align, wherein the ELR nanowire contour comprises: at least one ELR nanowire segment, each ELR nanowire segment comprising an ELR material having an improved operating characteristic.

A magnetic resonance imaging (MRI) magnet assembly, comprising: a housing; and an MRI magnet coupled to the housing, the MRI magnet comprising: an ELR nanowire contour, the ELR nanowire contour configured to conduct an electrical current to generate a magnetic field during an MRI procedure, wherein the magnetic field causes certain atoms in a body of a subject to align, wherein the ELR nanowire contour comprises: at least one ELR nanowire segment, each ELR nanowire segment comprising an ELR material having an improved operating characteristic.

A magnetic resonance imaging (MRI) magnet, comprising: an ELR nanowire coil, the ELR nanowire coil configured to conduct an electrical current to generate a magnetic field during an MRI procedure, wherein the magnetic field causes certain atoms in a body of a subject to align, wherein the ELR nanowire coil comprises: at least one ELR nanowire contour, each of the at least one ELR nanowire contours comprising a plurality of ELR nanowire segments, each of the plurality of ELR nanowire segments coupled to at least one other of the plurality of ELR nanowire segments to substantially form a polygon, each of the at least one ELR nanowire segments comprising an ELR material having an improved operating characteristic.

A magnetic resonance imaging (MRI) magnet assembly, comprising: a housing; and an MRI magnet coupled to the housing, the MRI magnet comprising: an ELR nanowire coil, the ELR nanowire coil configured to conduct an electrical current to generate a magnetic field during an MRI procedure, wherein the magnetic field causes certain atoms in a body of a subject to align, wherein the ELR nanowire coil comprises: at least one ELR nanowire contour, each of the at least one ELR nanowire contours comprising a plurality of ELR nanowire segments, each of the plurality of ELR nanowire segments coupled to at least one other of the plurality of ELR nanowire segments to substantially form a polygon, each of the at least one ELR nanowire segments comprising an ELR material having an improved operating characteristic.

A magnetic resonance imaging (MRI) nanowire converter comprising: at least one nanowire segment comprised of an improved ELR material, wherein the MRI nanowire converter either: induces a magnetic field when a current is applied to the at least one nanowire segment during an MRI procedure, wherein the electromagnetic field causes certain atoms in a body of a subject to align, or senses a resonance signal emitted by certain atoms in the body of the subject as certain aligned atoms become unaligned during the MRI procedure.

A magnetic resonance imaging (MRI) nanowire converter comprising: at least one nanowire segment comprised of an improved ELR material, wherein when exposed to a resonance signal during an MRI procedure, the MRI nanowire converter senses the resonance signal via the at least one nanowire segment and converts the sensed resonance signal to an alternating current that can be measured and used for imaging.

A magnetic resonance imaging (MRI) nanowire converter comprising: at least one nanowire segment comprised of an improved ELR material, wherein the MRI nanowire converter is electrically coupled to an alternating current source, wherein the MRI nanowire converter induces an electromagnetic field during an MRI procedure in response to the alternating current source, the induced electromagnetic field causes certain atoms in a body of a subject to align and subsequently emit a resonance signal as the certain atoms become unaligned, wherein the resonance signal can be detected and used for imaging.

A magnetic resonance imaging (MRI) nanowire converter comprising: an ELR material having an improved operating characteristic, wherein the MRI nanowire converter either: induces a magnetic field when a current is applied to the MRI nanowire converter during an MRI procedure, wherein the electromagnetic field causes certain atoms in a body of a subject to align, or senses a resonance signal emitted by certain atoms in the body of the subject as certain aligned atoms become unaligned during the MRI procedure.

A magnetic resonance imaging (MRI) nanowire converter comprising: an ELR material having an improved operating characteristic, wherein when exposed to a resonance signal during an MRI procedure, the MRI nanowire converter senses the resonance signal and converts the sensed resonance signal to an alternating current that can be measured and used for imaging.

A magnetic resonance imaging (MRI) nanowire converter comprising: an ELR material having an improved operating characteristic, wherein the MRI nanowire converter is electrically coupled to an alternating current source, wherein the MRI nanowire converter induces an electromagnetic field during an MRI procedure in response to the alternating current source, the induced electromagnetic field causes certain atoms in a body of a subject to align and subsequently emit a resonance signal as the certain atoms become unaligned, wherein the resonance signal can be detected and used for imaging.

A Magnetic Resonance Imaging (MRI) transmitter circuit, comprising: a digital-to-analog converter (DAC) that generates an analog signal based on digital output of an MRI system; and a converter electrically coupled to the DAC, the converter comprising: an improved ELR material, wherein the converter induces a magnetic field when the analog signal is applied to the improved ELR material wherein the electromagnetic field causes certain atoms in a body of a subject to align.

A Magnetic Resonance Imaging (MRI) receiver circuit, comprising: a converter, comprising: an improved ELR material, wherein the converter senses a resonance signal emitted by certain atoms in a body of a subject as certain aligned atoms become unaligned during an MRI procedure; and an analog-to-digital converter (ADC) electrically coupled to the converter, wherein the ADC digitizes the resonance signal, wherein the digitized resonance signal is used to generate an MRI image.

A Magnetic Resonance Imaging (MRI) transceiver circuit, comprising: a converter, comprising: an improved ELR material, wherein during an MRI procedure, the converter: senses a resonance signal emitted by certain atoms in a body of a subject as certain aligned atoms become unaligned during an MRI procedure, or induces a magnetic field when an analog signal is applied to the improved ELR material wherein the electromagnetic field causes certain atoms in a body of a subject to align; and an analog-to-digital converter (ADC) electrically coupled to the converter, wherein the ADC digitizes the resonance signal, wherein the digitized resonance signal is used to generate an MRI image; and a digital-to-analog converter (DAC) that generates the analog signal based on digital output of an MRI system.

A magnetic resonance imaging (MRI) scanner, comprising: an MRI magnet comprising an improved ELR material; an MRI RF converter configured to: induce a magnetic field when a current is applied to the MRI RF converter during an MRI procedure, wherein the electromagnetic field causes certain atoms in a body of a subject to align, and sense a resonance signal emitted by the certain atoms as they become unaligned during the MRI procedure; and an MRI detector that detects the sensed resonance signal from the MRI RF converter to generate an MRI image.

An MRI detector, comprising: an ELR QUID comprising an improved ELR material, wherein the ELR QUID detects a resonance signal emitted by certain aligned atoms in a body of a subject as they become unaligned during an MRI procedure.

An MRI detector, comprising: an ELR QUID comprising an ELR material having at least one improved operating characteristic, wherein the ELR QUID detects a resonance signal emitted by certain aligned atoms in a body of a subject as they become unaligned during an MRI procedure.

An MRI detector, comprising: an ELR QUID comprising a modified ELR material, the modified ELR material comprising an ELR material bonded to a modifying material, the modified ELR material having an improved operating characteristic over that of the ELR material alone, wherein the ELR QUID detects a resonance signal emitted by certain aligned atoms in a body of a subject as they become unaligned during an MRI procedure.

A portable MRI scanner, comprising: an MRI magnet comprising an improved ELR material, wherein the improved ELR material operates in an ELR state at temperatures greater than 150 K such that the MRI magnet requires no cryogenic cooling during an MRI procedure, wherein a bore of the MRI magnet is enlarged such that the portable MRI scanner is removable about a structure on which a subject is scanned during the MRI procedure; an MRI RF converter configured to: induce a magnetic field when a current is applied to the MRI RF converter during the MRI procedure, wherein the electromagnetic field causes certain atoms in a body of a subject to align, and sense a resonance signal emitted by the certain atoms as they become unaligned during the MRI procedure; and an MRI detector that detects the sensed resonance signal from the MRI RF converter to generate an MRI image.

A portable MRI scanner, comprising: an MRI magnet comprising an improved ELR material, wherein the improved ELR material operates in an ELR state at temperatures greater than 150 K such that the MRI magnet requires no cryogenic cooling during an MRI procedure, wherein a bore of the MRI magnet is enlarged such that a structure on which a subject is scanned during the MRI procedure is removable from the portable MRI scanner; an MRI RF converter configured to: induce a magnetic field when a current is applied to the MRI RF converter during an MRI procedure, wherein the electromagnetic field causes certain atoms in a body of a subject to align, and sense a resonance signal emitted by the certain atoms as they become unaligned during the MRI procedure; and an MRI detector that detects the sensed resonance signal from the MRI RF converter to generate an MRI image.

A portable MRI scanner, comprising: a low intensity magnet that generates a low intensity magnetic field; an MRI RF converter configured to: induce a magnetic field when a current is applied to the MRI RF converter during an MRI procedure, wherein the electromagnetic field causes certain atoms in a body of a subject to align, and sense a resonance signal emitted by the certain atoms as they become unaligned during the MRI procedure; and an ELR QUID detector that detects the resonance signal.

A portable MRI scanner, comprising: an MRI magnet; an MRI gradient coil, comprising: an improved ELR material, wherein the MRI gradient coil conducts an electrical current to generate a gradient field during an MRI procedure, wherein the gradient field causes certain atoms in a body of a subject to spin at different speeds based on a location in the body of the certain atoms, wherein the improved ELR material allows a particular configuration of the MRI gradient coil that allows a bore of the MRI magnet to be enlarged; and an MRI detector that detects a resonance signal during an MRI procedure to generate an MRI image.

A portable MRI scanner, comprising: an MRI magnet; an MRI RF coil, comprising: an improved ELR material, wherein the MRI RF coil: induces a magnetic field when a current is applied to the MRI RF coil during an MRI procedure, wherein the electromagnetic field causes certain atoms in a body of a subject to align, or senses a resonance signal emitted by the certain atoms as they become unaligned during the MRI procedure, wherein the improved ELR material allows a particular configuration of the MRI RF coil that allows a bore of the MRI magnet to be enlarged; and an MRI detector that detects a resonance signal during an MRI procedure to generate an MRI image.

A magnetic resonance imaging (MRI) gradient coil, comprising: an improved ELR material, wherein the MRI gradient coil conducts an electrical current to generate a gradient field during an MRI procedure, wherein the gradient field causes certain atoms in a body of a subject to spin at different speeds based on a location in the body of the certain atoms.

A magnetic resonance imaging (MRI) gradient coil, comprising: a nanowire comprising an improved ELR material, wherein the nanowire conducts an electrical current to generate a gradient field during an MRI procedure, wherein the gradient field causes certain atoms in a body of a subject to spin at different speeds based on a location in the body of the certain atoms.

A magnetic resonance imaging (MRI) apparatus, comprising an MRI magnet; an MRI RF coil that either: induces a magnetic field when a current is applied to the MRI RF coil during an MRI procedure, wherein the electromagnetic field causes certain atoms in a body of a subject to align, or senses a resonance signal emitted by the certain atoms as they become unaligned during the MRI procedure; and a gradient coil, comprising: an improved ELR material, wherein the MRI gradient coil conducts an electrical current to generate a gradient field during an MRI procedure, wherein the gradient field causes certain atoms in a body of a subject to spin at different speeds based on a location in the body of the certain atoms; and an MRI detector that detects the sensed resonance signal from the MRI RF coil to generate an MRI image.

A Magnetic Resonance Imaging (MRI) Radio Frequency (RF) coil, comprising: an improved ELR material, wherein during an MRI procedure the RF coil: induces a magnetic field when a current is applied to the at least one nanowire segment during an MRI procedure, wherein the electromagnetic field causes certain atoms in a body of a subject to align, or senses a resonance signal emitted by certain atoms in the body of the subject as certain aligned atoms become unaligned during the MRI procedure.

A Magnetic Resonance Imaging (MRI) Radio Frequency (RF) coil, comprising: an improved ELR material, wherein when exposed to a resonance signal during an MRI procedure, the RF coil senses the resonance signal converts the sensed resonance signal to an alternating current that can be measured and used for imaging.

A Magnetic Resonance Imaging (MRI) Radio Frequency (RF) coil, comprising: an improved ELR material, wherein the RF coil is electrically coupled to an alternating current source, wherein the RF coil induces an electromagnetic field during an MRI procedure in response to the alternating current source, the induced electromagnetic field causes certain atoms in a body of a subject to align and subsequently emit a resonance signal as the certain atoms become unaligned, wherein the resonance signal can be detected and used for imaging.

A magnetic resonance imaging (MRI) apparatus, comprising: an MRI magnet; an MRI RF coil, comprising: an improved ELR material, wherein during an MRI procedure the RF coil: induces a magnetic field when a current is applied to the at least one nanowire segment during an MRI procedure, wherein the electromagnetic field causes certain atoms in a body of a subject to align, or senses a resonance signal emitted by certain atoms in the body of the subject as certain aligned atoms become unaligned during the MRI procedure; a gradient coil, wherein the MRI gradient coil conducts an electrical current to generate a gradient field during an MRI procedure, wherein the gradient field causes certain atoms in a body of a subject to spin at different speeds based on a location in the body of the certain atoms; and an MRI detector that detects the sensed resonance signal from the MRI RF coil to generate an MRI image.

Chapter 5—Capacitors formed of ELR Materials

This chapter of the description refers to FIGS. 1-36 and FIGS. 85-95; accordingly all reference numbers included in this section refer to elements found in such figures.

Capacitors that include components formed of modified, apertured, and/or other new extremely low resistance (ELR) materials, are described. In some examples, the capacitors include one or more plates formed of ELR materials. In some examples, the capacitors include two plates or elements formed of ELR materials and a dielectric placed between the plates or elements. In some examples, the capacitors are formed using thin-film ELR materials. The ELR materials provide extremely low resistances to current at temperatures higher than temperatures normally associated with current high temperature superconductors (HTS), enhancing the operational characteristics of the capacitors at these higher temperatures, among other benefits.

In some examples, the ELR materials are manufactured based on the type of materials, the application of the ELR materials, the size of the component employing the ELR materials, the operational requirements of a device or machine employing the ELR materials, and so on. As such, during the design and manufacturing of a capacitor, the material used as a base layer of an ELR material and/or the material used as a modifying layer of the ELR material may be selected based on various considerations and desired operating and/or manufacturing characteristics.

Various devices, applications, and/or systems may employ the ELR capacitors described herein. In some examples, tuned and other resonant circuits employ the ELR capacitors. In some examples, storage devices employ the ELR capacitors. In some examples, coupling elements employ the ELR capacitors. In some examples, pulsed power systems employ the ELR capacitors. In some examples, timing elements employ the ELR capacitors. In some examples, filtering elements employ the ELR capacitors.

Figure 85:
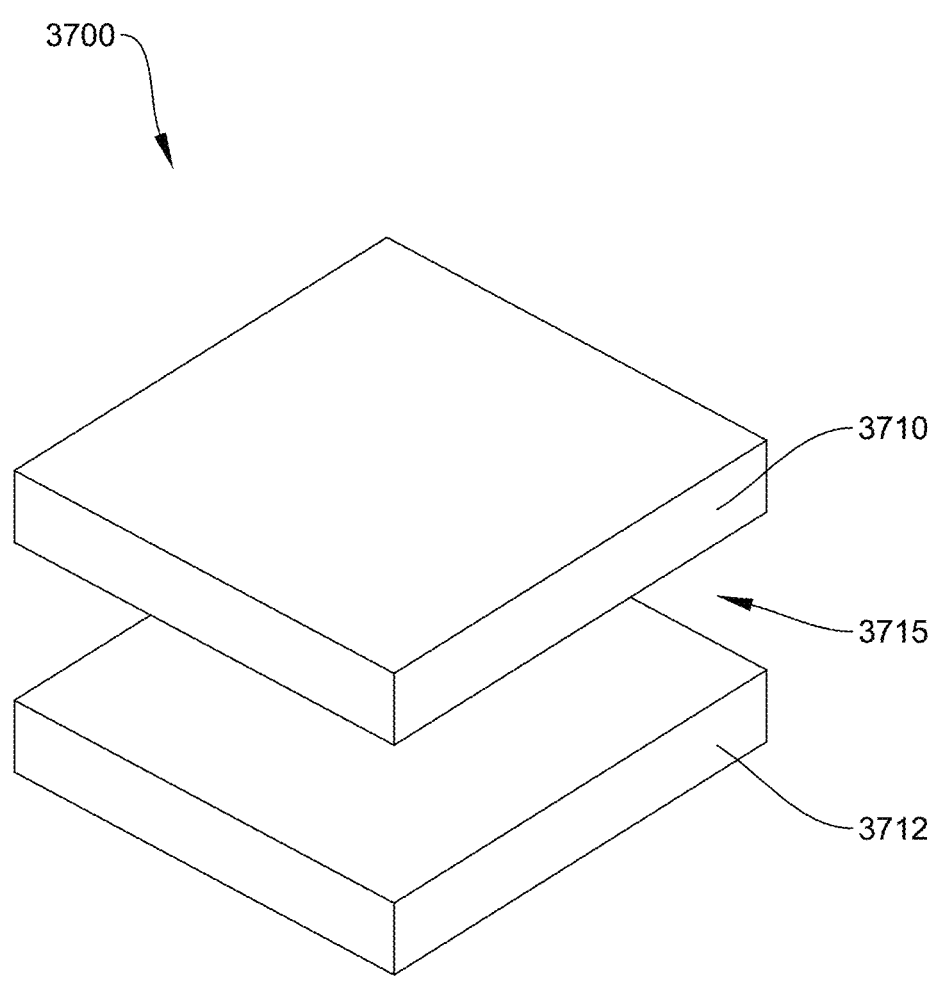

As described herein, some or all of the modified, apertured, and/or other new ELR materials may be utilized by capacitors and associated devices and systems. FIG. 85 is a schematic diagram illustrating a capacitor 3700 employing an ELR material. The capacitor includes a first plate 3710, or first conductive element, a second plate 3712, or second conductive element, and a space or gap 3715 that separates the first plate 3710 from the second plate 3712.

Applying a voltage or potential difference across the first plate 3710 and the second plate 3712 causes a static electric field to develop within the space 3715 between the two plates. The static electric field stores energy and produces a force between the plates. The "capacitance" of the capacitor, measured in Farads, is a ratio of the charge on each plate to the applied potential difference, or C=Q/V. The capacitance depends on the distance between the plates, and increases as the distance between the plates decreases.

Figure 86:
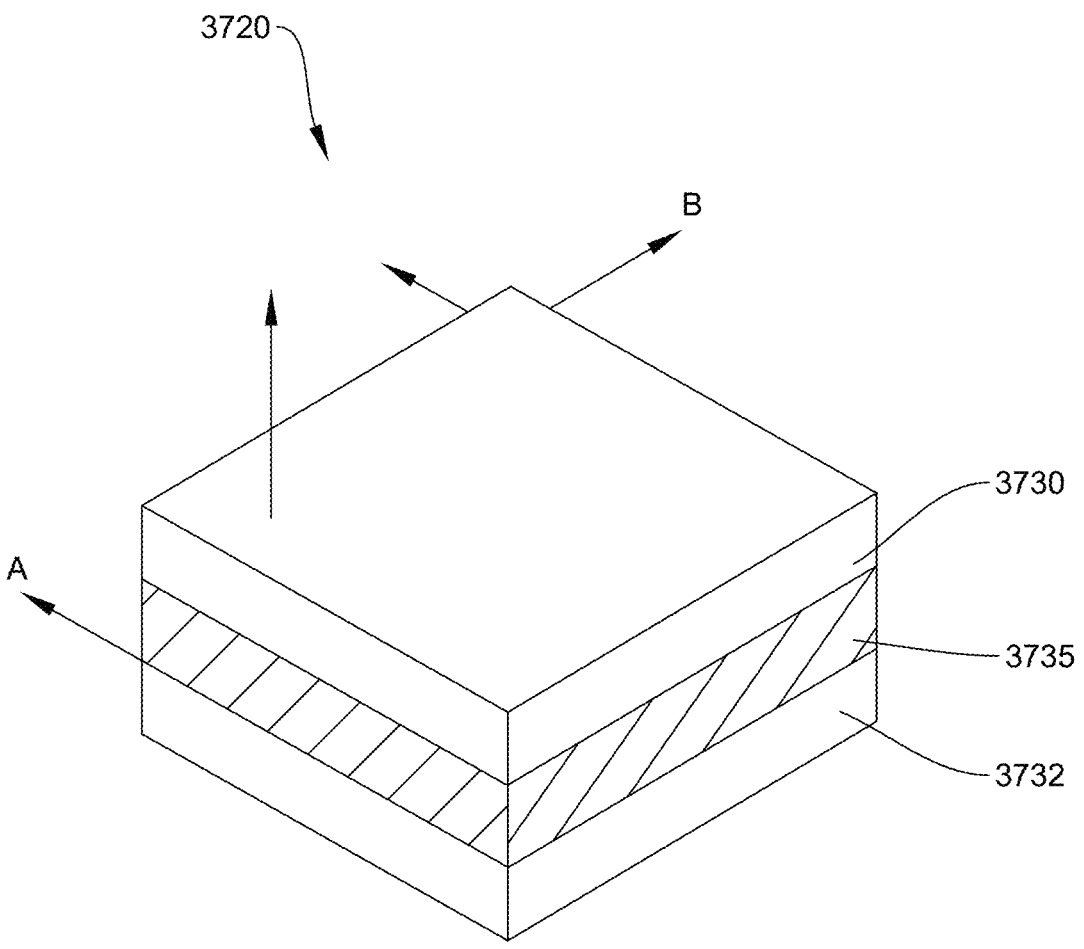

Although the capacitor 3700 does not include a dielectric layer, many capacitors employ dielectric layers in order to increase their capacitance. FIG. 86 is a schematic diagram illustrating a capacitor 3720 employing a modified ELR film. The capacitor 3720 includes a first plate 3730, a second plate 3732, and a dielectric, or non-conductive, layer 3735 located between the first plate 3730 and the second plate 3732. In some examples, the dielectric layer 3735 is formed of a material having a high permittivity and/or high breakdown voltage, in order to increase the amount of charge stored by the capacitor.

In some examples, the dielectric layer 3735 is an insulator. Example dielectric materials for use as dielectric layer 3735 include papers, plastics, glass, mica, ceramics, electrolytics, oxides, and/or other class 1 or class 2 dielectrics. The following listing represents various capacitor/dielectric types that may employ the modified, apertured, and/or other new ELR materials described herein, although others are of course possible:

"air-gap"—capacitors with no dielectric layer, they generally have low dielectric loss. Air-gap capacitors may be employed as tunable capacitors for resonating HF antennas, among other implementations;

"ceramic"—capacitors having a ceramic dielectric layer, with varying permittivity values and dielectric losses. Examples include COG, NP0, X7R, X8R, Z5U, and 2E6 capacitors. Ceramic capacitors may be employed by filters, timing elements, and crystal oscillators, among other implementations;

"glass"—capacitors having a glass dielectric layer, they are generally very stable and reliable;

"paper"—capacitors having a paper dielectric layer. Paper capacitors may be employed by radio equipment, power supplies, motors, and other implementations;

"polycarbonate"—capacitors having a polycarbonate dielectric layer, they generally have a low temperature coefficient and age well. Polycarbonate capacitors may be employed by filters, among other implementations;

"polyester"—capacitors having a PET film dielectric layer. Polyester capacitors may be employed by signal capacitors and integrators, among other implementations;

"polystyrene"—capacitors having a polystyrene dielectric layer. Polystyrene capacitors may be employed as signal capacitors, among other implementations;

"polypropylene"—capacitors having a polypropylene dielectric layer, they general exhibit low dielectric losses and high breakdown voltages. Polypropylene capacitors may be employed as signal capacitors, among other implementations;

"plastic"—capacitors having a plastic dielectric layer, they include PTFE or Teflon™ dielectrics, among others;

"mica"—capacitors having a mica, such as a silvered mica, dielectric layer. Mica capacitors may be employed by HF and VHF RF circuits, among other implementations;

"electrolytic"—capacitors having an oxide dielectric layer surrounded by a dielectric solution, they generally have a larger capacitance per unit volume than other types. Electrolytic capacitors, which may be ultracapacitors and/or supercapacitors, may be employed in electrical circuits, as power-supply filters, coupling capacitors, energy storage devices, and other implementations;

"variable"—capacitors having a mechanical construction that changes the distance between the plates, or the amount of plate surface area which overlaps, and/or variable capacitance (VARICAP) diodes that change their capacitance as a function of an applied reverse bias voltage. They may be employed by sensors, such as microphones, among other implementations;

"vacuum"—capacitors having a vacuum between conductive plates, they have no dielectric losses, self heal, and are variable and/or adjustable. They may be employed in high power RF transmitters, among other implementations; and other dielectric/capacitor types not specifically described herein.

Figure 87:
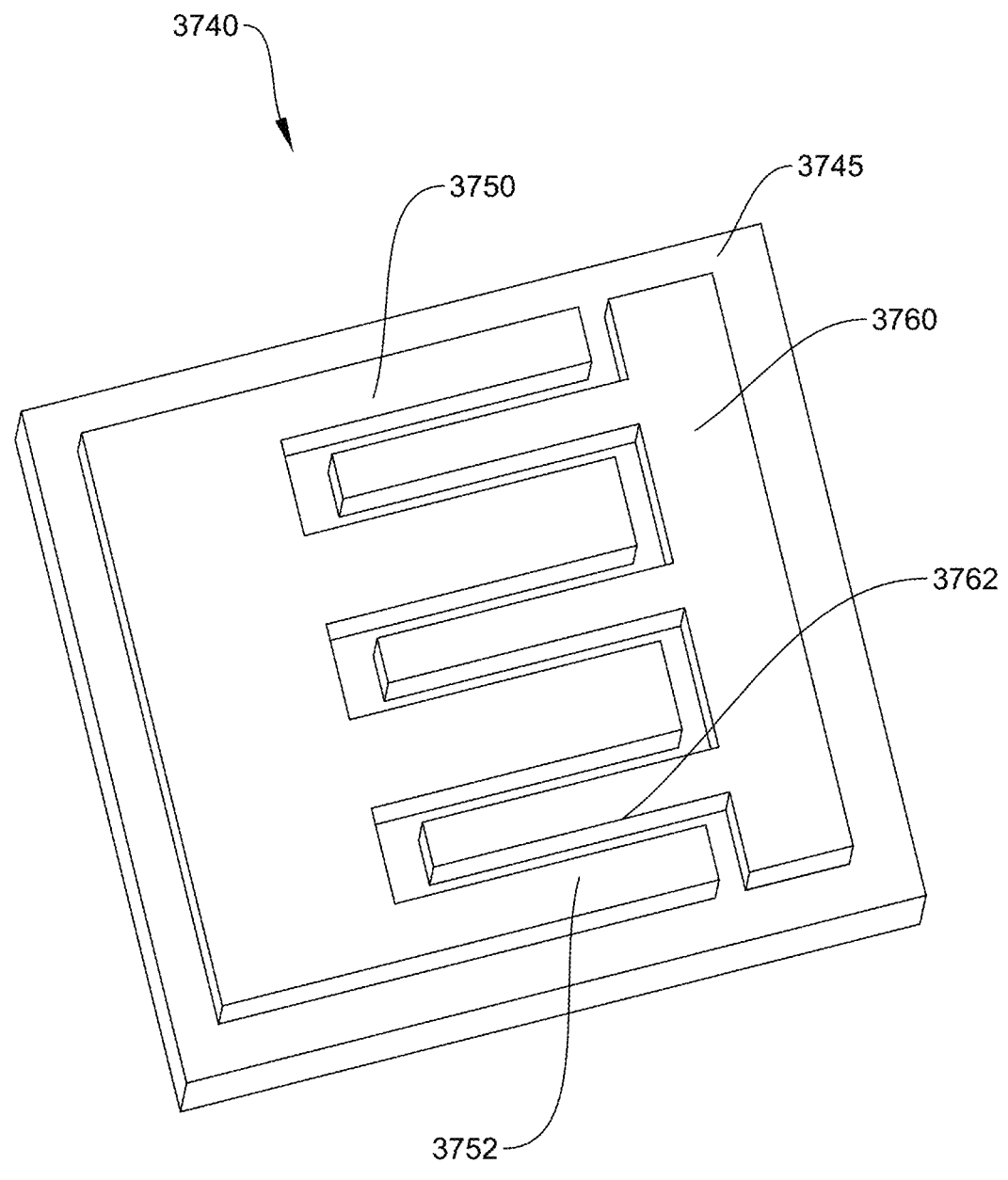

In addition to capacitors formed of two plates separated by a dielectric layer, there are other ways in which to form capacitors. For example, metal conductive areas in different layers of a multi-layer printed circuit board or substrate may act as a highly stable capacitor. Additionally, a capacitor may be formed into various patterns of metallization on a substrate. FIG. 87 is a schematic diagram illustrating a substrate-based capacitor 3740 employing ELR materials.

The capacitor 3740 is formed on a substrate 3745, and includes a first conductive element 3750 having various first conductive portions 3755, and a second conductive element 3760 having various second conductive portions 3765. As shown in the Figure, the capacitor 3740 may store charge within many electric fields produced between one of the first conductive portions 3755 and one of the second conductive portions 3765.

Figure 88:
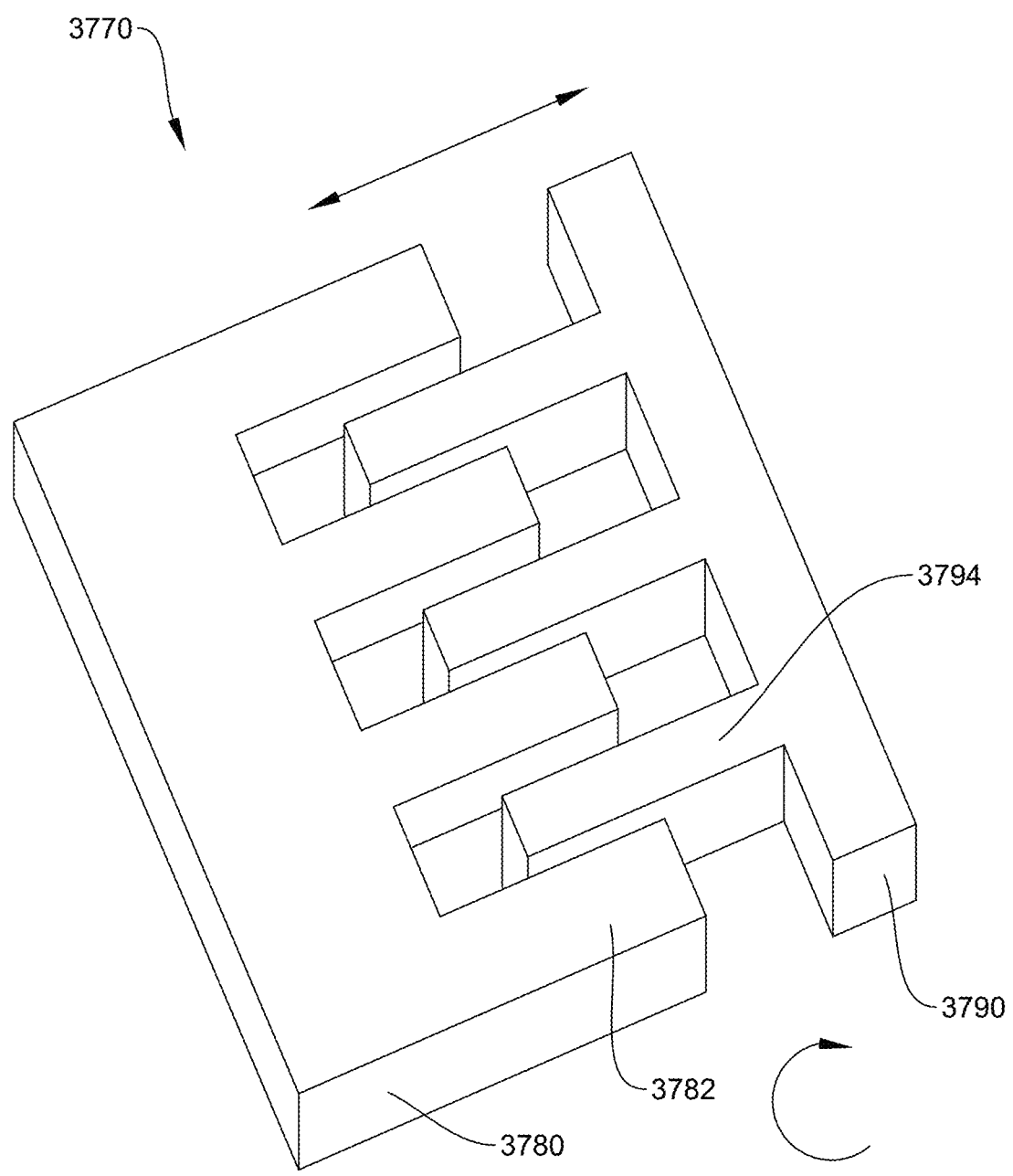

FIG. 88 is a schematic diagram illustrating a MEMS type capacitor 3770 employing ELR materials. The capacitor 3770 is formed on or attached to a substrate (not shown), and includes a first conductive element 3780 having multiple first conductive portions 3782 and a second conductive element 3790 having multiple second conductive portions 3792 spaced apart from the multiple first conductive portions 3782. As shown in the Figure, the second conductive element 3790 may translationally move towards and/or away from the first conductive element 3780, increasing and/or decreasing a capacitance between the elements as the area between the respective conductive portions increases and/or decreases due to the movement. Additionally, the second conductive element 3790 may rotate with respect to the first conductive element 3780, increasing and/or decreasing a capacitance between the elements as the area between the respective conductive portions increases and/or decreases due to the rotation.

In some examples, the ELR materials described herein carry and/or propagate charge via apertures in the materials. Thus, in these examples, employing the ELR materials as conductive elements may lead to a collection of charges within a conductive element, or plate, in discrete rows or sections, generally corresponding to the apertures within the materials.

FIG. 89 is a cross-sectional view of the capacitor of FIG. 86 taken at line BA. The capacitor 3800 includes a first conductive element 3810*a* having an apertured ELR material 3814*a* and a modifying layer 3812*a* bonded to the apertured ELR material 3814*a*, and a second conductive element 3810*b* having an apertured ELR material 3814*b* and a modifying layer 3812*b* bonded to the apertured ELR material 3814*b*. The first conductive element 3810*a* is separated form the second conductive element 3810*b* by a dielectric layer 3820.

After application of a potential difference between the first conductive element 3810*a* and the second conductive element 3810*b*, an electric field is produced between the elements and in the dielectric layer 3820, as charges 3830 move towards the dielectric layer 3820. However, because the charges are contained within apertures, they collect into groups of charges 3830 generally isolated from one another by walls 3835 of the apertures within the ELR material 3814*a*.

FIG. 90 is a cross-sectional view of the capacitor of FIG. 86 taken at line BB. The group charges may form strips of charges 3842 on or near a surface of the modifying layer 3840 or wall of the aperture, separated by the walls 3844 of the apertures of the material. Thus, the charges within the ELR material may, in response to an electric field within the capacitor, form strips and/or groupings of charges within the conductive elements of the capacitor.

In some examples, the ELR materials forming conductive elements of a capacitor may exhibit extremely low resistance to the flow of current at temperatures between the transition temperatures of conventional HTS materials (e.g. at ~80 to 135 K) and room temperatures (e.g., at ~275 K to 313 K). In these examples, an ELR-based capacitor and/or ELR-based device employing a capacitor may include a cooling system (not shown), such as a cyrocooler or cryostat, used to cool the capacitor to a critical temperature for the type of modified ELR material utilized by the capacitor. For example, the cooling system may be a system capable of cooling the capacitor to a temperature similar to that of liquid Freon™, to a temperature similar to that of ice, or other temperatures discussed herein. That is, the cooling system may be selected based on the type and structure of the ELR materials utilized in the ELR-based capacitor and/or ELR-based device.

As described herein, in some examples, conductive elements (e.g., plates) of a capacitor exhibit extremely low resistances to carried current because it is formed of modified ELR materials. The conductive elements may be formed of a nanowire, a tape or foil, and/or a wire.

In forming an ELR wire, multiple ELR tapes or foils may be sandwiched together to form a macroscale wire. For example, a coil may include a supporting structure and one or more ELR tapes or foils supported by the supporting structure.

In addition to ELR wires, capacitors may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

In addition to nanowires, ELR tapes or foils may also be utilized by the capacitors and devices described herein. There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials.

Thus, the modified ELR films may formed into tapes, foils, rods, strips, nanowires, thin films, other shapes or structures, and/or other geometries capable of storing charge within conductive elements, such as plates. That is, while some suitable geometries are shown and described herein for some capacitors, numerous other geometries are possible. These other geometries include different patterns, configurations or layouts with respect to length and/or width, in addition to differences in thickness of materials, use of different layers, and other three-dimensional structures.

In some examples, the type of materials used as ELR materials may be determined by the type of application utilizing the ELR materials. For example, some applications may utilize ELR materials having a BSCCO ELR layer, whereas some applications may utilize a YBCO layer. That is, the ELR materials described herein may be formed into certain structures (e.g., tapes or nanowires) and formed from certain ELR materials, among other factors.

Various manufacturing processes may be employed when forming the ELR-based capacitors described herein. In some examples, an ELR nanowire conductive element is deposited onto a positioned substrate. In some examples, an ELR tape is placed or fixed onto a substrate, non-conductive element, and/or conductive element. One of ordinary skill will appreciate that other manufacturing processes may be utilized when manufacturing and/or forming the capacitors described herein.

As discussed herein, many devices and systems may utilize, employ and/or incorporate capacitors, such as modified, apertured, and/or other new ELR capacitors that exhibit extremely low resistances at high or ambient temperatures. The following section describes a few example devices, systems, and/or applications. One of ordinary skill will appreciate that other devices, systems, and/or applications may also utilize the modified ELR capacitors.

In some examples, a tuned or resonant circuit may employ the ELR-capacitors described herein. In general, a tuned circuit includes both a capacitor and inductor to select information in particular frequency bands. For example, a radio receiver relies on variable capacitors to tune the radio to a station frequency.

FIG. 91 is a schematic diagram illustrating a tuned or resonant circuit 3900 having an ELR capacitor 3910 and another component, such as an inductor 3920. Analog circuits, such as circuits used in signal processing applications, may utilize the capacitors described herein. These circuits may include a capacitor along with other components (e.g., LC circuits, RLC circuits, and so on). In some examples, the circuit 3900 may be a tuned or resonant circuit that emphasizes or filters out signal frequencies. In some examples, the circuit 3900 may remove residual hum in large-scale power applications. In some examples, the circuit 3900 may be a tuned circuit used in radio reception and broadcasting. One skilled in the art will appreciate that circuit 3900 may be implemented in many other applications not described herein.

In some examples, an energy storage component may employ the ELR-based capacitors described herein. For example, a capacitor stores electric energy when disconnected from a charging circuit, exhibiting similar characteristics to those batteries, and are often used in electronic devices to maintain power supplies while batteries are being changed, among other things.

Figure 92:
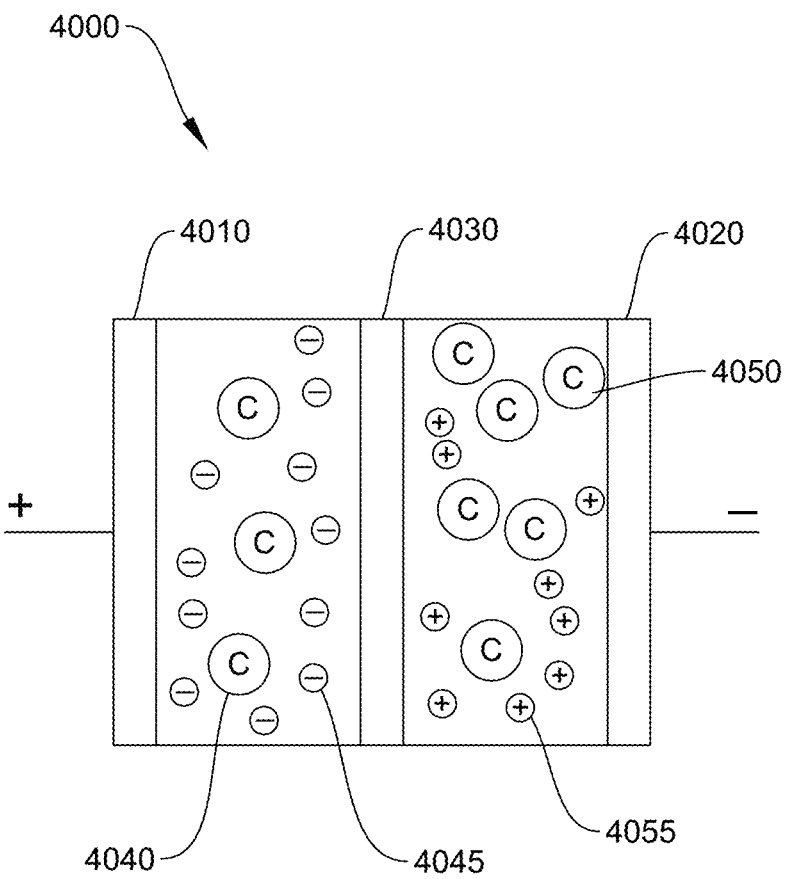

FIG. 92 is a schematic diagram illustrating a storage element 4000 having an ELR capacitor. The storage element 4000 is representative of a supercapacitor, and includes a first electrode 4010, a second electrode 4020, and a separation layer. The separation layer 4030 separates a first electrolytic solution 4045 that contains charges 4040, and a second electrolytic solution 4055 containing charges 4050. Such a supercapacitor, employing the ELR-based materials described herein, may store energy for a variety of applications, such as electric vehicles and grid applications, among other things.

In some examples, a coupling component may employ the ELR-based capacitors described herein. For example, the ELR-based capacitor may facilitate capacitive coupling within a circuit, whereby the capacitor passes AC signals but blocks DC signals. As another example, the ELR-based capacitor may act as a decoupling capacitor that suppresses noise or transient signals between circuit elements.

Figure 93:
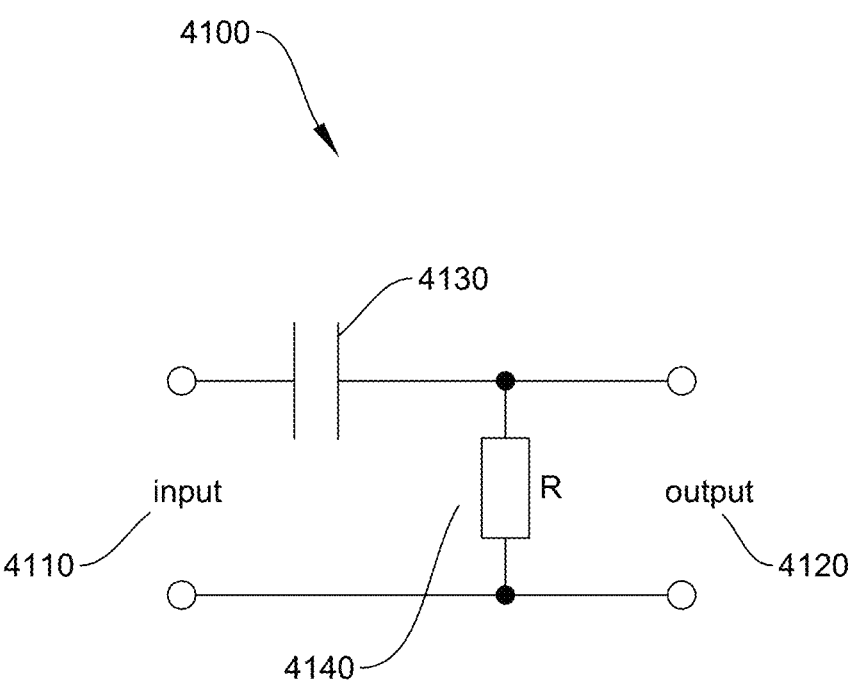

FIG. 93 is a schematic diagram illustrating a coupling element 4100 having an ELR capacitor 4130 and a resistor 4140. The coupling element 4100 receives an input signal 4110, conditions the input based, in part on a time of charging a capacitor versus a time constant of the signal, and outputs a conditioned signal 4120. Such a coupling circuit, employing the ELR-based capacitors described herein, may pass audio signals in a radio system, among other things.

In some examples, a pulsed power system may employ the ELR-based capacitors described herein. For example, groups of large, specially constructed, low-inductance high-voltage capacitors may be used to supply large pulses of current for pulsed power applications, such as electromagnetic forming, Marx generators, pulsed lasers, pulse forming networks, radar, fusion, particle accelerators, railguns, coilguns, and other applications.

Figure 94:
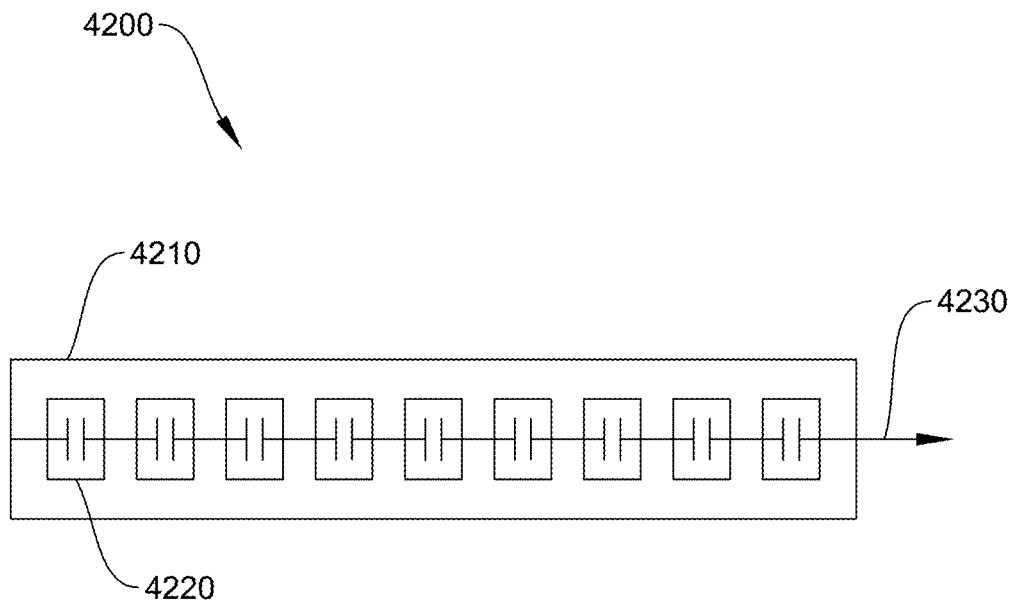

FIG. 94 is a schematic diagram illustrating a pulsed power system 4200 having an ELR capacitor. The pulsed power system 4200 includes a capacitor bank 4100 formed of a number of capacitors 4220, which, when discharged, supply pulses of power to various output 4230 applications. For example, the system 4200 may be a Marx Bank, where capacitors, such as ELR-based capacitors, are charged in parallel with a moderate voltage, and discharged in series by triggering spark gaps that deliver a high voltage to the load. In some examples, a timing element may employ the ELR-based capacitors described herein.

Figure 95:
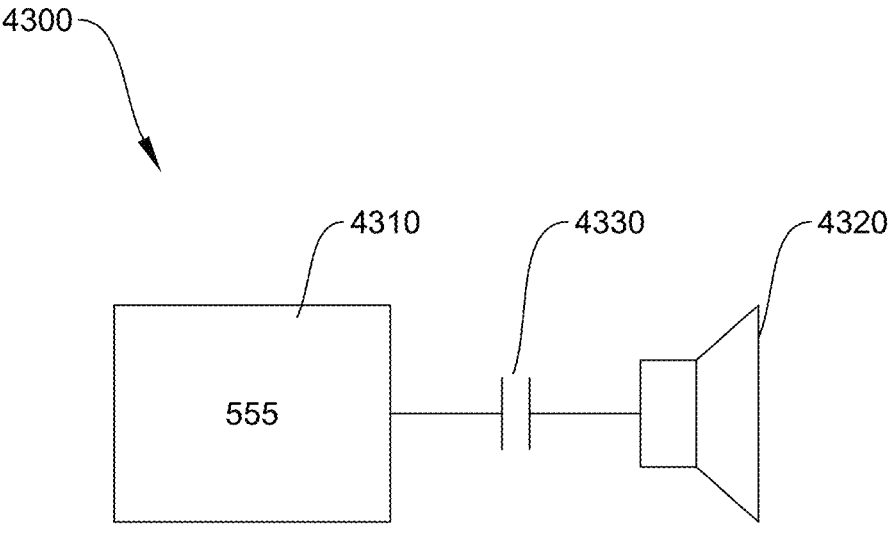

FIG. 95 is a schematic diagram illustrating a timing element 4310, such as an element configured as an astable multivibrator 4310 delivering a pulse train via the ELR-based capacitor 4330 to a loudspeaker 4320. The timing element 4300 includes a 555 timer, an ELR-based capacitor 4330, and a loudspeaker 4320. The capacitor 4330 enables steady AC signaling to the loudspeaker while blocking DC signals, among other things.

Of course, other systems and devices may employ the ELR-based capacitors described herein. For example, power conditioning systems, power factor correction systems, noise filters, snubbers, motor starters, signal processors, sensors, measurement devices, touch input devices, human interface elements, neural networks, and so on.

In some implementations, a capacitor that includes modified ELR materials may be described as follows:

A capacitor, comprising: a first plate formed of a modified ELR material; and a second plate formed of a modified ELR material; wherein the modified ELR material includes a layer of ELR material and a modifying layer that modifies one or more operating characteristics of the layer of ELR material.

A method of forming a capacitor, the method comprising: forming a first plate of a modified ELR material; forming a second plate of the modified ELR material; and positioning the first plate a certain distance from the second plate.

A capacitor, comprising: a first modified extremely low resistance (ELR) element; and a second modified ELR element spaced a certain distance from the first modified ELR element.

A capacitor, comprising: a first plate formed of a modified ELR material; a second plate formed of a modified ELR material; and a dielectric positioned between the first plate and the second plate; wherein the modified ELR material includes a layer of ELR material and a modifying layer that modifies one or more operating characteristics of the layer of ELR material.

A method of forming a capacitor, the method comprising: forming a first plate of a modified ELR material; forming a second plate of the modified ELR material; positioning the first plate a certain distance from the second plate; and placing a dielectric between the first plate and the second plate.

A capacitor, comprising: a first modified extremely low resistance (ELR) element; a second modified ELR element spaced a certain distance from the first modified ELR element; and a dielectric material positioned between the first modified ELR element and the second modified ELR element.

A capacitor, comprising: a substrate; a first conductive element deposited onto the substrate and formed of a modified ELR material; a second conductive element deposited onto the substrate proximate to the first conductive element and formed of a modified ELR material; and wherein the modified ELR material includes a layer of ELR material and a modifying layer that modifies one or more operating characteristics of the layer of ELR material.

A method of forming a capacitor, the method comprising: depositing a first conductive element formed of a modified ELR material onto a substrate; and depositing a second conductive element formed of a modified ELR material proximate to the first conductive element onto the substrate.

A capacitor, comprising: a first modified extremely low resistance (ELR) element deposited onto a substrate; and a second modified ELR element deposited onto the substrate proximate to the first modified ELR element and spaced a certain distance from the first modified ELR element.

A capacitor, comprising: a first conductive element formed of a modified ELR material; a second conductive element formed of a modified ELR material and configured to move relative to the first conductive element; and wherein the modified ELR material includes a layer of ELR material and a modifying layer that modifies one or more operating characteristics of the layer of ELR material.

A capacitor, comprising: a first modified extremely low resistance (ELR) element; a second modified ELR element; and a positioning component, wherein the positioning component is configured to move the second modified ELR element relative to the first modified ELR element.

A conductive element for use in a MEMS based capacitor, comprising: a first layer of ELR material; and a second layer of modifying material that modifies phonon characteristics of the ELR material.

A circuit, comprising: an inductor; and a capacitor, wherein the capacitor includes: a first conductive element formed of a modified ELR material; a second conductive element formed of a modified ELR material.

A capacitor for use in a signal processing device, comprising: a first conductive element formed of a modified ELR material; and a second conductive element formed of the modified ELR material; wherein the modified ELR material includes a layer of ELR material and a modifying layer that modifies one or more operating characteristics of the layer of ELR material.

A capacitor configured to exchange energy with an inductor in a circuit, comprising: a first conductive element formed on a substrate; and a second conductive element formed on the substrate and positioned proximate to the first conductive element; wherein the first conductive element and the second conductive element exhibit extremely low resistance to electrical charge at temperatures above 150 K at standard pressure.

An ultracapacitor, comprising: a first conductive element formed of a modified ELR material; a second conductive element formed of a modified ELR material; a separating layer placed between the first conductive element and the second conductive element.

An ultracapacitor, comprising: a first conductive element formed of an apertured ELR material; a second conductive element formed of the apertured ELR material; a separating layer placed between the first conductive element and the second conductive element;

A coupling circuit, comprising: a resistor; and a capacitor, wherein the capacitor includes: a first conductive element formed of a modified ELR material; and a second conductive element formed of a modified ELR material; wherein the modified ELR material includes a layer of ELR material and a modifying layer that modifies one or more operating characteristics of the layer of ELR material.

A coupling circuit, comprising: a resistor; and a capacitor, wherein the capacitor includes: a first conductive element formed of an apertured ELR material; and a second conductive element formed of the apertured ELR material; wherein the apertured ELR material includes a layer of ELR material and a modifying layer that modifies one or more operating characteristics of the layer of ELR material.

A pulsed power system, comprising: a capacitor bank, wherein each of the capacitors within the capacitor bank includes: a first conductive element formed of a modified ELR material; and a second conductive element formed of a modified ELR material; wherein the modified ELR material includes a layer of ELR material and a modifying layer that modifies one or more operating characteristics of the layer of ELR material.

A pulsed power system, comprising: a capacitor bank, wherein each of the capacitors within the capacitor bank includes: a first conductive element formed of an ELR material; and a second conductive element formed of an ELR material; wherein the ELR material includes a layer of apertured ELR material and a modifying layer that modifies one or more operating characteristics of the layer of apertured ELR material.

A sensor, comprising: a capacitor, wherein the capacitor includes: a first conductive element formed of a modified ELR material; and a second conductive element formed of a modified ELR material; wherein the modified ELR material includes a layer of ELR material and a modifying layer that modifies one or more operating characteristics of the layer of ELR material.

A sensor, comprising: a capacitor, wherein the capacitor includes: a first conductive element formed of an ELR material; and a second conductive element formed of an ELR material; wherein the ELR material includes a layer of apertured ELR material and a modifying layer that modifies one or more operating characteristics of the layer of apertured ELR material.

Chapter 6—Inductors Formed of ELR Materials

This chapter of the description refers to FIGS. 1-36 and FIGS. 96-104; accordingly all reference numbers included in this section refer to elements found in such figures.

Inductors, such as air core or magnetic core inductors, that include components formed of extremely low resistance (ELR) materials, such as modified ELR materials, apertured ELR materials, and/or other new ELR materials, are described. In some examples, the inductors include a core and a nanowire coil formed of ELR materials. In some examples, the inductors include a core and coil formed of ELR materials, such as ELR tapes or foils. In some examples, the inductors are formed using thin-film ELR materials. The ELR materials provide and/or exhibit extremely low resistances to current at temperatures higher than temperatures normally associated with conventional high temperature superconductors (HTS), enhancing the operational characteristics of inductors at these higher temperatures, among other benefits.

In some examples, the ELR materials are manufactured based on the type of materials, the application of the ELR materials, the size of the component employing the ELR materials, the operational requirements of a device, system, and/or machine employing the ELR materials, and so on. As such, during the design and manufacturing of an inductor or inductor-based device, the material used as a base layer of an ELR component and/or the material used as a modifying layer of an ELR component may be selected based on various considerations and desired operating and/or manufacturing characteristics.

Various devices, applications, and/or systems may employ the modified, apertured, and/or new ELR-based inductors. In some examples, tuned or resonant circuits and associated applications employ ELR inductors. In some examples, transformers and associated applications employ ELR inductors. In some examples, energy storage devices and associated applications employ ELR inductors. In some examples, current limiting devices, such as fault current limiters, and associated applications employ ELR inductors.

Figure 96:
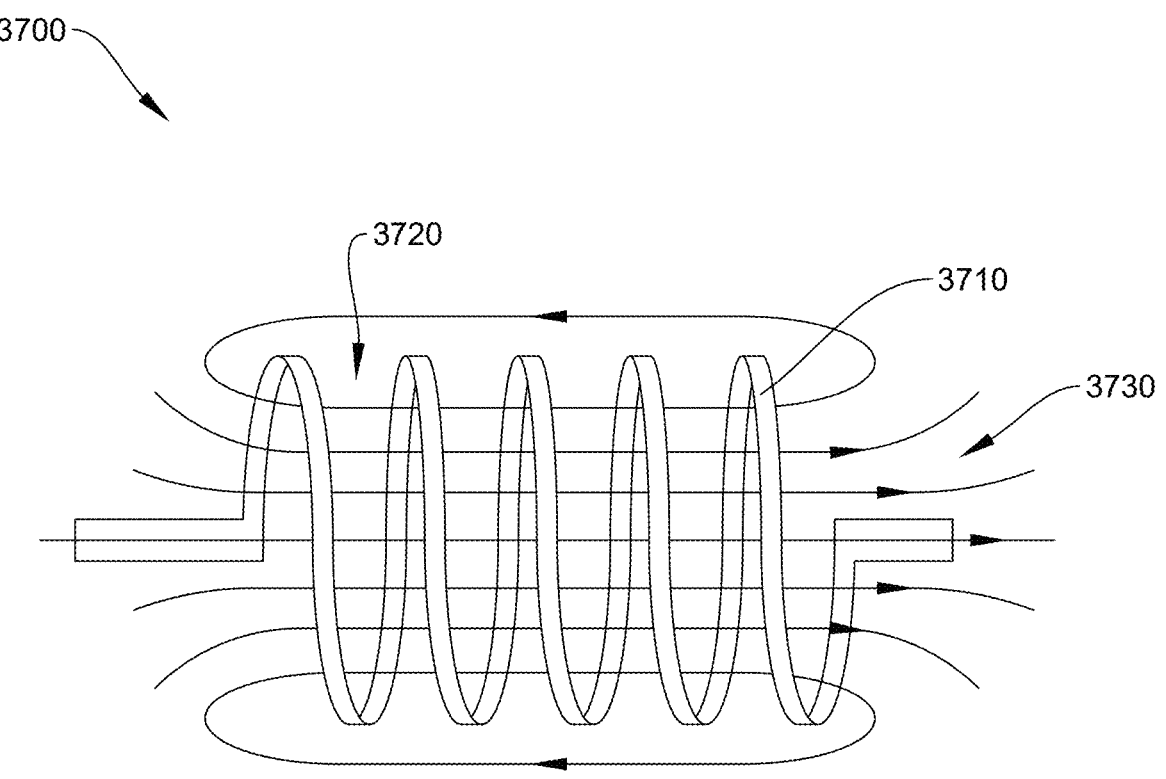

FIG. 96 is a schematic diagram illustrating an air core inductor 3700 formed of modified, apertured, and/or new ELR materials. The inductor 3700 includes a coil 3710 and an air core 3720. When the coil 3710 carries a current (e.g., in a direction towards the right of the page), a magnetic field 3730 is produced in the air core 3720 (that is, in the area where a core would be found). The coil is formed, at least in part, of ELR materials, such as an ELR film having a ELR material base layer and a modifying layer formed on the base layer. Various suitable ELR films are described in detail herein.

A battery or other power source (not shown) may apply a voltage to the ELR coil 3710, causing current to flow within the coil 3710. Being formed of ELR materials, the coil 3710 provides little or no resistance to the flow of current in at temperatures higher than those used in conventional HTS materials, such as room or ambient temperatures (e.g., at ~21 degrees C.). The current flow in the coil produces a magnetic field within the core area 3720, which may be used to transfer energy, limit energy, and so on.

Because the inductor 3700 includes a coil 3710 formed of extremely low resistance materials (i.e. a modified ELR film), the inductor may act similarly to an ideal inductor, where the coil 3710 exhibits little or no losses due to winding or series resistance typically found in inductors with conventional conductive coils (e.g., copper coils), regardless of the current through the coil 3710. That is, the inductor 3700 may exhibit a very high quality (Q) factor (e.g., approaching infinity), which is the ratio of its inductive reactance to resistance at a given frequency, or Q=(inductive reactance)/resistance.

In some examples, the ELR coil provides extremely low resistance to the flow of current at temperatures between the transition temperatures of conventional HTS materials (e.g., at ~80 to 135 K) and room temperatures (e.g., at ~294 K). In these examples, the inductor may include a cooling system (not shown), such as a cyrocooler or cryostat, used to cool the coil 3710 to a critical temperature for the type of ELR materials utilized by the coil 3710. For example, the cooling system may be a system capable of cooling the coil 3710 to a temperature similar to that of liquid Freon™, to a temperature similar to that of ice, or to other temperatures discussed herein. That is, the cooling system may be selected based on the type and structure of the ELR materials utilized in the coil 3710.

In some examples, the air core 3720 does not include any additional material, and the inductor 3700 is a coil without a physical core, such as a stand-alone coil (e.g., the coil shown in the Figure). In some examples, the air core 3720 is formed of a non-magnetic material (not shown), such as plastic or ceramic materials. The material or shape of the core may be selected based on a variety of factors. For example, selecting a core material having a higher permeability than the permeability of air will generally increase the density of the produced magnetic field 3730, and thus increase the inductance of the inductor 3700. In another example, selecting a core material may be governed by a desire to reduce core losses within high frequency applications. One skilled in the art will appreciate the core may be formed of a number of different materials and into a number of different shapes in order to achieve certain desired properties and/or operating characteristics.

As is known in the art, the configuration of the coil 3710 may affect certain operational characteristics, such as the inductance. For example, the number of turns of a coil, the cross-sectional area of a coil, the length of a coil, and so on, may affect the inductance of an inductor. It follows that inductor 3700, although shown in one configuration, may be configured in a variety of ways in order to achieve certain operational characteristics (e.g., inductance values), to reduce certain undesirable effects (e.g. skin effects, proximity effects, parasitic capacitances), and so on.

In some examples, the coil 3710 may include many turns lying parallel to one another. In some examples, the coil may include few turns that are wound at different angles to one another. Thus, coil 3710 may be formed into a variety of different configurations, such as honeycomb, basket-weave patterns, wave windings where successive turns criss-cross at various angles to one another, spiderweb patterns or pi windings, where the coil is formed of flat spiral coils spaced apart from one another, as litz wires, where various strands are insulated from one another to reduce arc resistance, and so on. These techniques may be adopted to increase the self-resonant frequency and quality factor (Q) of an inductor, among other benefits.

Figure 97:
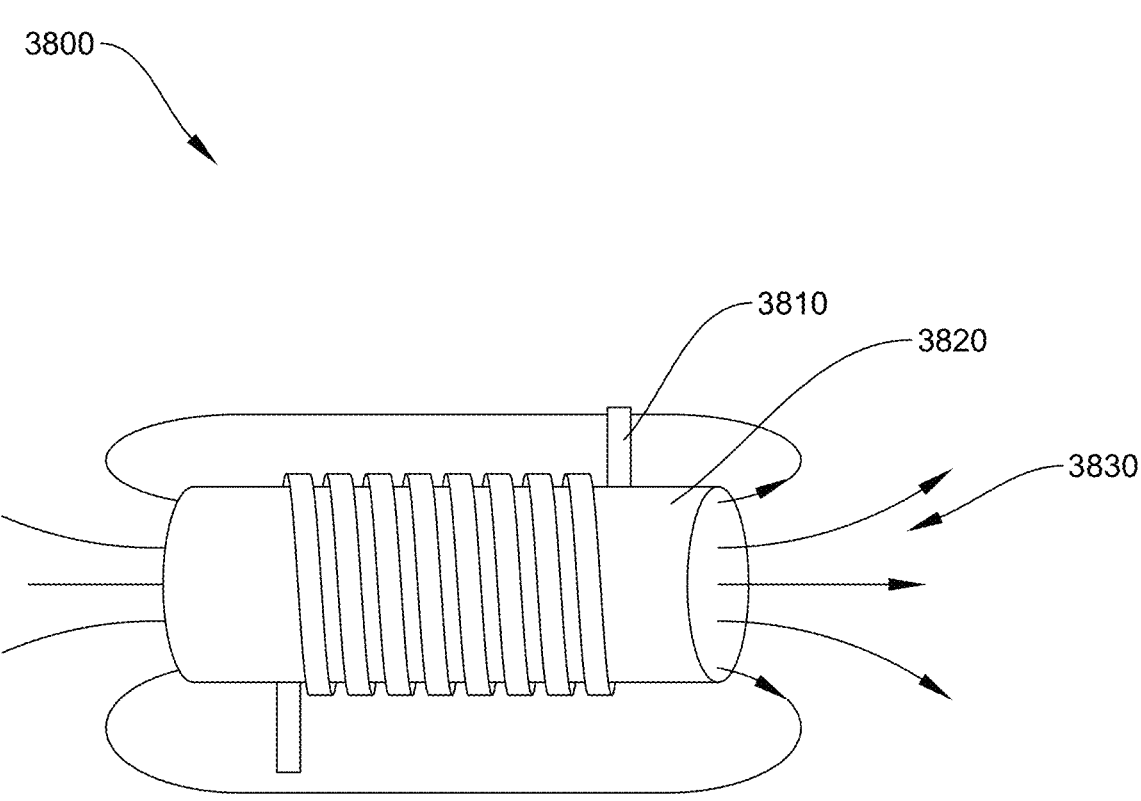

In addition to air core inductors, magnetic core inductors, such as inductor 3800, may also utilize the modified, apertured, and/or new ELR materials discussed herein. FIG. 97 is a schematic diagram illustrating a magnetic core inductor 3800 employing ELR materials. The inductor 3800 includes a coil 3810 and a magnetic core 3820, such as a core formed of ferromagnetic or ferromagnetic materials. Similar to the inductor 3700 of FIG. 96, a magnetic field 3830 is produced in the core 3820 when current is carried by the coil 3810. The coil is formed, at least in part, of an ELR film, such as a film having a ELR material base layer and a modifying layer formed on the base layer. Various suitable ELR films are described in detail herein. Being formed of an ELR film, the coil 3810 provides little or no resistance to the flow of current in at temperatures higher than those used in conventional HTS materials, such as room or ambient temperatures (e.g., at ~21 degrees C.). The current flow in the coil produces a magnetic field 3830 within the core 3820, which may be used to store energy, transfer energy, limit energy, and so on.

The magnetic core 3820, being formed of ferromagnetic or ferromagnetic materials, increases the inductance of the inductor 3800 because the magnetic permeability of the magnetic material within the produced magnetic field 3830 is higher than the permeability of air, and thus is more supportive of the formation of the magnetic field 3830 due to the magnetization of the magnetic material. For example, a magnetic core may increase the inductance by a factor of 1,000 times or greater.

The inductor 3800 may utilize various different materials within the magnetic core 3820. In some examples, the magnetic core 3820 is formed of a ferromagnetic material, such as iron. In some examples, the magnetic core 3820 is formed of a ferromagnetic material, such as ferrite. In some examples, the magnetic core 3820 is formed of laminated magnetic materials, such as silicon steel laminations, metglas, or other materials. One of ordinary skill will appreciate that other materials may be used, depending on the needs and requirements of the inductor 3800.

In addition, the magnetic core 3820 (and, thus, the inductor 3800) may be configured into a variety of different shapes. In some examples, the magnetic core 3820 may be a rod or cylinder. In some cases, the magnetic core 3820 may be a donut or toroid. In some cases, the magnetic core 3820 may be moveable, enabling the inductor 3800 to realize variable inductances. One of ordinary skill will appreciate that other shapes and configurations may be used, depending on the needs and requirements of the inductor 3800. For example, the magnetic core 3820 may be constructed to limit various drawbacks, such as core losses due to eddy currents and/or hysteresis, and/or nonlinearity of the inductance, among other things.

Thus, in some examples, forming the coil 3710 of the inductor 3700 or the coil 3810 of the inductor 3800 using modified ELR materials and/or components, such as modified ELR films, increases the Q factor of the inductors by lowering or eliminating the resistance to current within the coils, among other benefits.

Figure 98:
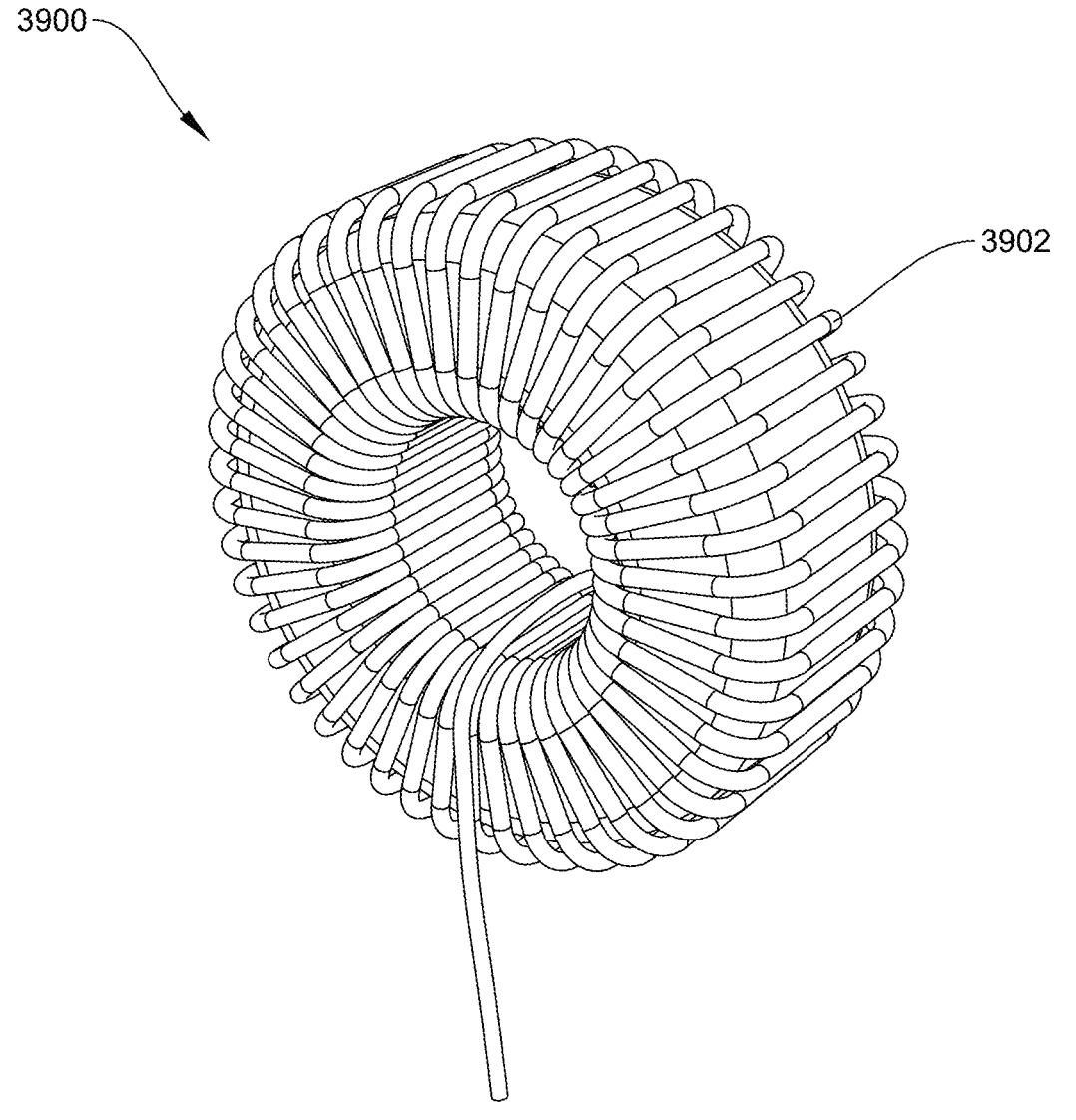

As described herein, in some examples, a coil of an inductor exhibits extremely low resistances to carried current because it is formed of ELR materials, such as modified ELR materials, apertured ELR materials, new ELR materials, and so on. FIG. 98 is a schematic diagram illustrating an inductor 3900 employing an ELR wire. The inductor 3900 includes a coil 3902 formed as an ELR wire that is composed of the ELR components described herein, such as modified ELR films.

In forming an ELR wire, multiple ELR tapes or foils may be sandwiched together to form a macroscale wire. For example, a coil may include a supporting structure and one or more ELR tapes or foils supported by the supporting structure.

In addition to ELR wires, inductors may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

Figure 99:
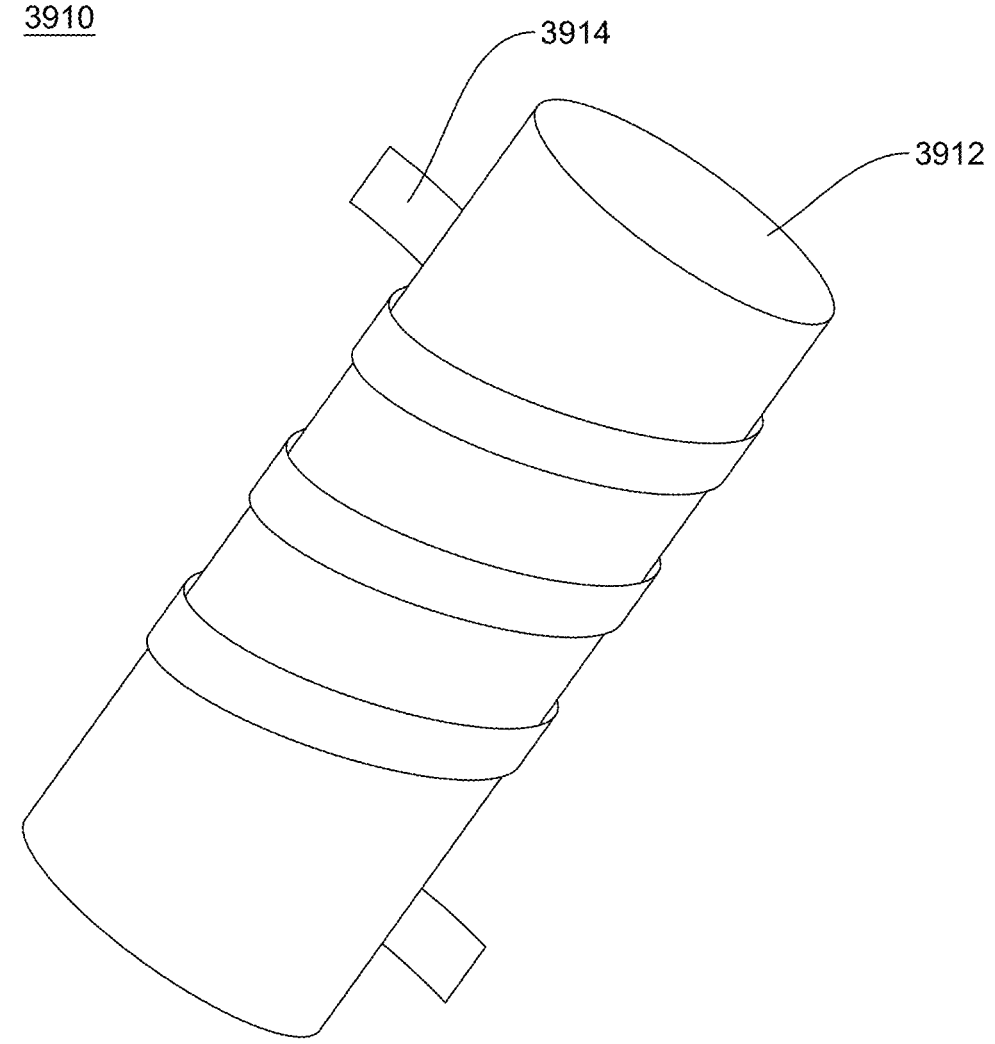

In addition to nanowires, ELR tapes or foils may also be utilized by the inductors and devices described herein. FIG. 99 is a schematic diagram illustrating an inductor 3910 employing an ELR tape or foil. The inductor 3910 includes a core 3912, such as an iron core, and a coil 3914 formed of an ELR tape.

There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABiTS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials.

Figure 100:
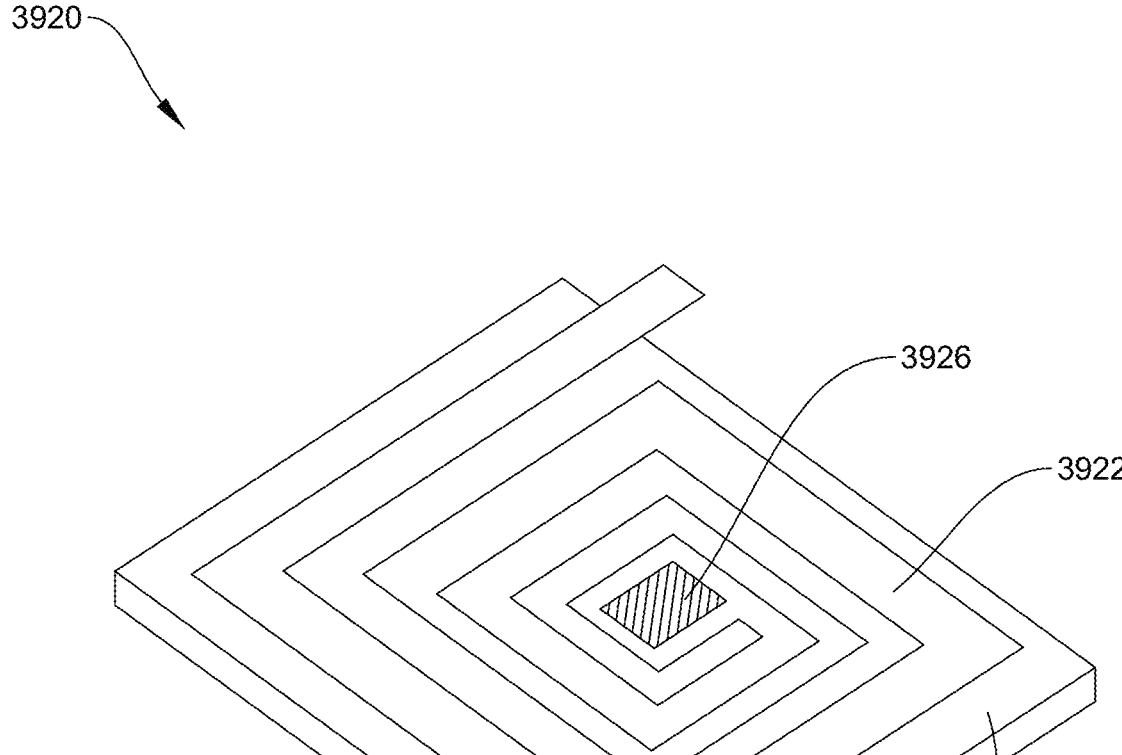

In some examples, thin film inductors may utilize the ELR components described herein. FIG. 100 is a schematic diagram illustrating an inductor 3920 employing an ELR thin film component, such as a modified, apertured, and/or new ELR component. The inductor 3920 includes an ELR coil 3922 formed onto a printed circuit board 3924 or other suitable substrate (e.g., LaSrGaO), and an optional magnetic core 3926. The coil 3922, which may be a modified ELR film etched into the board 3924 or substrate, or a nanowire located on or at a substrate, may be formed in a variety of configurations and/or patterns, depending on the needs of the device or system employing the inductor. Further, the optional magnetic core 3926 may be etched into the board 3924, as shown, or may be a planar core (not shown) positioned above and/or below the coil 3922.

Thus, the ELR materials may formed into wires, tapes, foils, rods, strips, nanowires, thin films, other coiled/spiral shapes, structures, and/or geometries capable of moving or carrying current from one point to another in order to produce a magnetic field. That is, while some suitable geometries are shown and described herein for some inductors, numerous other geometries are possible. These other geometries include different patterns, configurations or layouts with respect to length and/or width, in addition to differences in thickness of materials, use of different layers, and other three-dimensional structures.

In some examples, the type of materials used in the ELR materials may be determined by the type of application utilizing the ELR materials. For example, some applications may utilize a BSCCO ELR layer, whereas other applications may utilize a YBCO ELR layer. That is, the ELR materials described herein may be formed into certain structures (e.g., wires, tapes, foils, thin films, and/or nanowires) and formed from certain materials (e.g., YBCO or BSCCO) based on the type of machine or component utilizing the ELR materials, among other factors.

Various processes may be employed in manufacturing an inductor, such as inductors 3900, 3910, and/or 3920. In some examples, a core is formed, maintained, fixed, received and/or positioned. The core may take on various shapes or configurations. Example configurations include a cylindrical rod, a single "I" shape, a "C" or "U" shape, an "E" shape, a pair of "E" shapes, a pot-shape, a toroidal shape, a ring or bead shape, a planar shape, and so on. The core may be formed of various non-magnetic and magnetic materials. Example materials include iron or soft iron, silicon steel, various laminated materials, alloys of silicon, carbonyl iron, iron powders, ferrite ceramics, vitreous or amorphous metals, ceramics, plastics, metglas, air, and so on.

In addition, a coil, such as a coil formed of an ELR nanowire, tape, or thin film, is configured into a desirable shape or pattern and coupled to the formed or maintained core. In some examples, there is no core, and the modified ELR nanowire is configured to the desirable shape or pattern. In some examples, a modified ELR nanowire coil is etched directly on a printed circuit board or formed or etched into an integrated circuit, and a planar magnetic core is positioned with respect to the etched coil. One of ordinary skill will appreciate that other manufacturing processes may be utilized when manufacturing and/or forming the inductors described herein.

As discussed herein, many devices and systems may utilize, employ and/or incorporate inductors, such as modified, apertured, and/or new ELR inductors that exhibit extremely low resistances at high or ambient temperatures, such as temperatures between 150 K to 313 K, or higher than 313 K. That is, virtually any device or system that utilizes energy stored in a magnetic field produced from an electric current may incorporate the ELR inductors described herein. For example, systems that transfer, transform and/or store energy, information and/or objects may employ the ELR inductors described herein. The following section describes a few example devices, systems, and/or applications. One of ordinary skill will appreciate that other devices, systems, and/or applications may also utilize the ELR inductors described herein.

Figure 101:
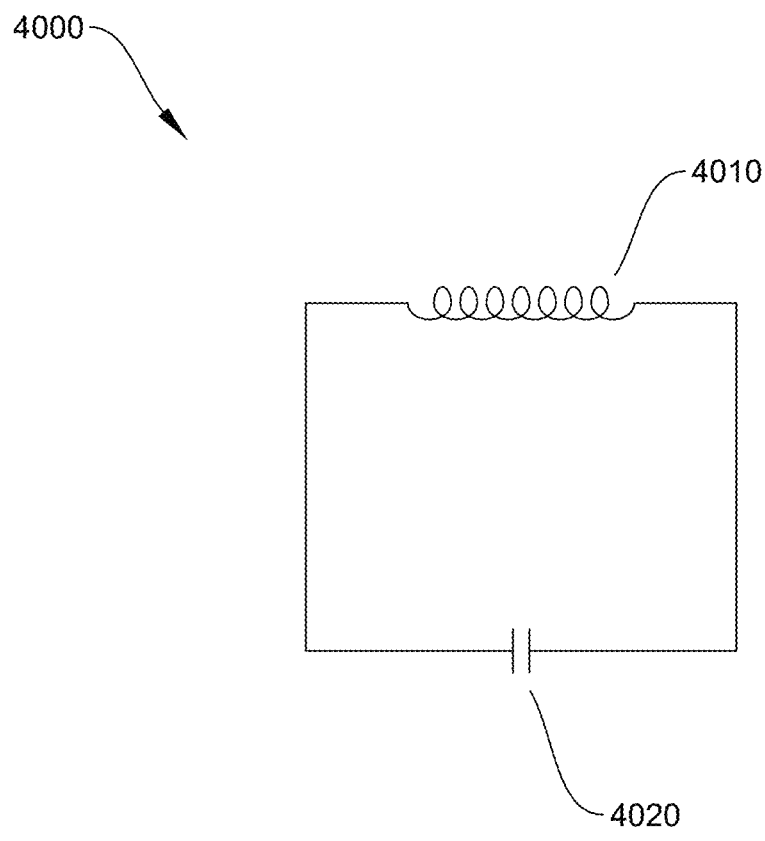

In some examples, analog circuits, such as circuits used in signal processing applications, may utilize the inductors described herein. FIG. 101 is a schematic diagram illustrating a tuned or resonant circuit 4000 having an ELR-based inductor 4010, and a capacitor 4020. Such circuits may include an inductor along with other components (e.g., LC circuits, RLC circuits, and so on). In some examples, the circuit 4000 may be a tuned or resonant circuit that amplifies and/or attenuates signal frequencies. In some examples, the circuit 4000 may be remove residual hums (e.g. by filtering out 60 Hz signals and associated harmonics) in large-scale power applications. In some examples, the circuit 4000 may be a tuned circuit used in radio reception and broadcasting. One skilled in the art will appreciate that circuit 4000 may be implemented in many other applications not described herein.

Utilization of extremely low resistance materials, such as the modified ELR materials described herein, may provide a variety of advantages and benefits to circuit 4000. For example, a circuit having ELR inductors utilized in a magnetometer (e.g., a SQUID) may enable the magnetometer to measure extremely small magnetic fields (e.g., on the order of one fluxon), among other benefits, without the reliance on expensive cooling systems typical of magnetometers employing conventional HTS superconducting elements.

In some examples, transformers and other energy transfer devices and systems may utilize the inductors described herein. FIG. 102 is a schematic diagram illustrating a transformer 4100 having an ELR inductor. The transformer 4100 includes a magnetic core 4110, a primary winding 4120 having primary winding turns 4125, and a secondary winding 4130 having secondary winding turns 4135. The primary winding 4120 and the secondary winding 4130 are formed of the ELR materials, such as modified ELR nanowires. In some examples, the transformer 4100 may be part of a utility power grid. In some examples, the transformer 4100 may be part of appliances and other electronic devices that step up and/or step down supply voltages during operation. In some examples, the transformer 4100 may be a signal or audio transformer. One skilled in the art will appreciate that the transformer 4100 may be implemented in many other applications and devices not described herein.

Utilization of extremely low resistance materials, such as the modified ELR materials described herein, may provide a variety of advantages and benefits to the transformer 4100 and/or various applications. For example, transformers utilizing modified ELR materials within coils exhibit fewer resistive losses, which can greatly affect the cost of operation by minimizing energy losses within the transformer, among other benefits, while avoiding the problems associated with conventional superconducting materials, such as high costs due to expensive cooling systems, among other things.

In some examples, energy storage devices, such as superconducting magnetic energy storage (SMES) systems and other magnetic storage systems, may utilize the ELR inductors described herein. FIG. 103 is a schematic diagram illustrating an energy storage system 4200 having an ELR inductor. The energy storage system 4200 includes a storage component 4210 having an inductor coil 4215 or coils and a power conditioning system 4220 having an inverter-rectifier 4225. The storage component 4210 stores energy in magnetic fields produced by inductors 4215 formed of modified ELR materials. The power conditioning system 4220 may receive energy from the storage component 4210, condition the received energy (e.g., convert stored DC current to AC current), and supply the conditioned energy to various sources, such as a power installation 4230. One skilled in the art will appreciate that the energy storage system 4200 may be implemented in many other applications and devices not described herein.

Utilization of extremely low resistance materials, such as the modified ELR materials described herein, may provide a variety of advantages and benefits to the energy storage system 4200 and various applications. For example, conventional SMES systems lose the least amount of stored energy as compared to other energy storage systems, but costs and other problems associated with maintaining high temperature superconductors in the conventional SMES systems at temperatures of the order of liquid nitrogen have prohibited their widespread adoption, among other problems. On the other hand, the modified ELR inductors described herein provide similar benefits to the conventional SMES systems (e.g., few energy losses), without the problems (e.g., costs of cryocoolers) associated with conventional SMES systems, because they exhibit ELR properties at very high temperatures, such as anywhere between the temperature of liquid Freon to room temperatures, or higher.

In some examples, electrical transmission systems may utilize the ELR materials described herein. FIG. 104 is a schematic diagram illustrating a current limiting system 4300, such as a fault current limiter (FCL), having an ELR inductor. The current limiting system includes a current limiter 4310 composed of an ELR inductor 4315. The current limiter 4310, such as a series resistive limiter, is positioned between a line 4320 and a load 4330 and acts as a trigger coil by shunting a fault to resistor 4330, absorbing most of the energy during a fault on the system 4300. One skilled in the art will appreciate that an electrical transmission system may implement ELR inductors in many other applications and devices not specifically described in FIG. 104.

Utilization of extremely low resistance materials, such as the modified, apertured, and/or new ELR materials described herein, may provide a variety of advantages and benefits to electrical transmission systems and various applications. For example, ELR inductors may function to limit fault currents in a system during fault states without adding impedance to the system during normal operation states, because they exhibit extremely low resistance to current within the system, among other benefits.

In some examples, some or all of the systems and devices describes herein may employ low cost cooling systems in applications where the specific ELR materials utilized by the application exhibit extremely low resistances at temperatures lower than ambient temperatures. As discussed herein, in these examples the application may include a cooling system (not shown), such as a system that cools an ELR inductor to a temperature similar to that of liquid Freon, to a temperature similar to that of ice, or other temperatures discussed herein. The cooling system may be selected based on the type and structure of the ELR materials utilized by the applications and/or the inductors employed by the applications.

In addition to the systems, devices, and/or applications described herein, one skilled in the art will realize that other systems, devices, and application that include inductors may utilize the modified, apertured, and/or new ELR inductors described herein.

In some implementations, an inductor that includes modified ELR materials may be described as follows:

An inductor, comprising: an air core; and a modified extremely low resistance (ELR) element configured into a coil shape at least partially surrounding the air core; wherein the modified ELR element is formed of a modified ELR film having a first layer comprised of an ELR material and a second layer comprised of a modifying material bonded to the ELR material of the first layer.

An apparatus, comprising: a substrate; a coil embedded in the substrate; and a first magnetic core positioned above the surface of the substrate; and a cooling component configure to maintain the coil embedded in the substrate at a temperature lower than a surrounding temperature of the substrate; wherein the coil includes a first portion having an extremely low resistance (ELR) material and a second portion bonded to the first portion that lowers the resistance of the ELR material.

An apparatus, comprising: a magnetic core; and a three dimensional coil wrapped at least partially around the magnetic core; wherein the three dimensional coil includes a first portion having an extremely low resistance (ELR) material and a second portion bonded to the first portion that lowers the resistance of the ELR material.

An inductor configured to be placed between a load and a line, the inductor comprising: a modified ELR material having a first layer formed of an ELR material and a second layer formed of a material that modifies the resistance of the ELR material; wherein the inductor is configured to not resist current at normal load levels traveling through the inductor and resist current at fault load levels traveling through the inductor.

An energy storage system, comprising: a storage component, wherein the storage component includes an inductor formed of a modified ELR film and is configured to store energy in a magnetic field produced by the inductor; a power conditioning component, wherein the power conditioning component is configured to condition energy received from the storage component; and a power supply component, wherein the power supply component is configured to supply the conditioned energy to a recipient.

An inductor, comprising: a substrate; and a modified extremely low resistance (ELR) film formed on a surface of the substrate; wherein the modified ELR film includes a first layer comprised of an ELR material and a second layer comprised of a modifying material bonded to the ELR material of the first layer.

A transformer, comprising: a primary, wherein the primary includes: a first magnetic core; a first modified extremely low resistance (ELR) element configured into a coil shape having a first number of turns and at least partially surrounding the magnetic core; and a secondary, wherein the secondary includes: a second magnetic core; a second modified extremely low resistance (ELR) element configured into a coil shape having a second number of turns and at least partially surrounding the magnetic core; wherein the first and second modified ELR elements are formed of a modified ELR film having a first layer comprised of an ELR material and a second layer comprised of a modifying material bonded to the ELR material of the first layer.

An inductor for use in a signal processing device, comprising: a magnetic core; and a three dimensional coil wrapped at least partially around the magnetic core; wherein the three dimensional coil includes a first portion having an extremely low resistance (ELR) material and a second portion bonded to the first portion that lowers the resistance of the ELR material.

Chapter 7—Transistors Formed of ELR Materials

This chapter of the description refers to FIGS. 1-36 and FIGS. 105-112; accordingly all reference numbers included in this section refer to elements found in such figures.

Transistors and other similar devices, such as logic devices, that include components formed of modified extremely low resistance (ELR) and/or apertured ELR materials are described. As is discussed herein, modified and/or apertured ELR materials exhibit extremely low resistance to electric charge (e.g., the flow of electrons) and/or extremely high conductance of electric charge at high temperatures, such as temperatures above 150 K, at ambient or standard pressures.

In some examples, the devices include a junction formed of a semiconducting element and an ELR element. For example, devices that may utilize such an ELR element-semiconductor junction include Josephson junctions, bipolar junction transistors, field effect transistors (FETs), amplifiers, switches, logic gates, microprocessor elements, microprocessors, and so on.

In some examples, the ELR materials are manufactured based on the type of materials, the application of the modified ELR material, the size of a component and/or device employing the ELR material, the operational requirements of a component and/or device employing the ELR material, and so on. For example, during the design and manufacturing of a transistor, the material used as a base layer of an ELR material-based electrode and/or the material used as a modifying layer of the ELR material-based electrode may be selected based on various considerations and desired operating and/or manufacturing characteristics.

Thus, in some examples, devices that employ ELR material-semiconductor junctions may perform faster and more reliably with respect to conventional devices, because conductive elements within the devices do not resist the flow of current, among other things. Furthermore, devices may be designed with fewer elements, which may lower costs associated with manufacturing, among other things.

As described herein, some or all of the modified, apertured, and/or other new ELR materials may be utilized by transistors and associated devices and systems that employ junctions, such as junctions formed of at least one conductive element and at least one semiconductor.

Figure 105:
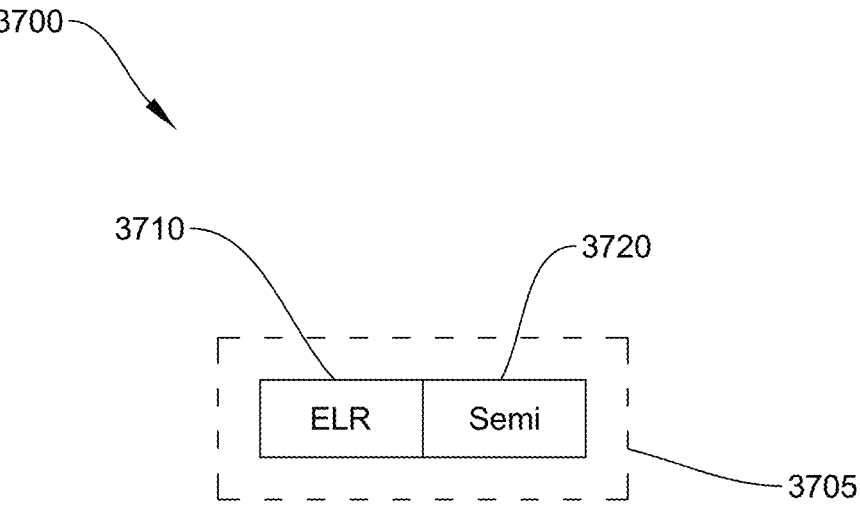

FIG. 105 is a schematic diagram illustrating a junction between an extremely low resistance (ELR) element and a semiconductor. The junction 3700 includes an ELR-based element 3710 and a semiconductor 3720. The semiconductor 3720 may be formed of a variety of different known semiconducting materials, such as silicon, gallium arsenide (GaAs), and so on.

In some examples, a device 3705 may employ the junction 3700. The ELR material-semiconductor junction 3700 may combine ELR-based electronics and semiconducting electronics. For example, the junction 3700 may act to combine Rapid Single Flux Logic (RSFL) circuits to semiconducting circuits. That is, the junction 3700 may be part of a Josephson Field Effect Transistor (JoFET) or other transistors that rely on the Josephson effect, whereby electric current flows between two weakly coupled ELR elements.

Figure 106:
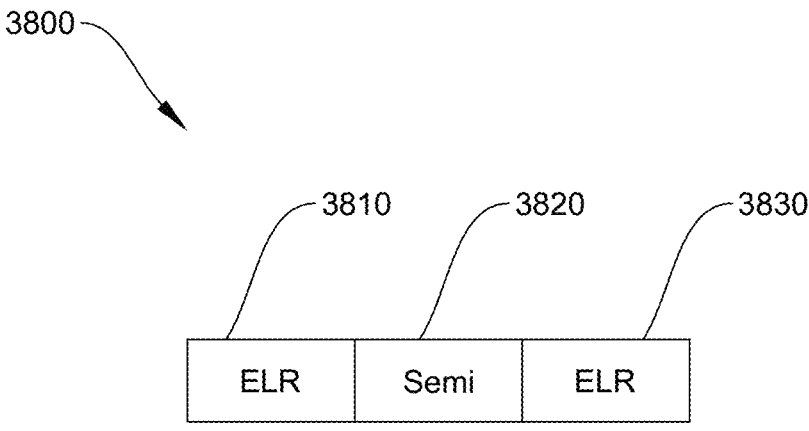

FIG. 106 is a schematic diagram illustrating a Josephson junction 3800 employing one or more ELR elements. The Josephson junction 3800 includes a first ELR element 3810 coupled to a second ELR element 3830 by a semiconductor 3820. The relative size of elements may vary according to application. That is, in some cases, the semiconductor 3820 may be formed of a smaller thickness or other geometry with respect to the ELR element 3810 and/or ELR element 3830. Furthermore, the ELR element 3810 may be formed of a certain thickness or other geometry that is different than a thickness and/or other geometry of the semiconductor 3820 and/or ELR element 3830.

Because the Josephson junction 3800 employs a semiconductor 3830 as the "insulator" between the first ELR element 3810 and the second ELR element 3830, the junction may act as a single-electron transistor, which can perform precise measurements because switching events at the junction are associated with the measurement of single fluxons, among other things.

For example, the Josephson junction 3800 may be used in Rapid Single Flux Quantum (RSFQ) components as qubits, in Superconducting Tunnel Junction (STJ) Detectors as detection components, and/or other applications.

In some examples, the ELR materials within the junctions 3700, 3800 may exhibit extremely low resistance to the flow of current at temperatures between the transition temperatures of conventional HTS materials (e.g., ~80 to 135 K) and ambient temperatures (e.g., ~275 K to 313 K), such as between 150 K and 313 K, or higher. In these examples, an ELR element and/or ELR-based device employing the ELR element may utilize a cooling system (not shown), such as a cyrocooler or cryostat, used to cool the ELR element to a critical temperature for the type of modified ELR material utilized by the device. For example, the cooling system may be a system capable of cooling the ELR element to a temperature similar to that of the boiling point of Freon™, to a temperature similar to that of the melting point of water, to a temperature lower than what is ambient or surrounding the ELR element or associated device, or other temperatures discussed herein. That is, the cooling system may be selected based on the type and structure of the ELR material utilized in the ELR element and/or ELR-based device.

As described herein, in some examples, the conductive elements formed of ELR materials within ELR-based junction devices exhibit extremely low resistances to electric charge. These conductive elements may be formed of nanowires, tapes or foils, wires, and so on.

There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials. In forming a wire, multiple modified ELR films may be sandwiched together to form the wire.

In forming an ELR wire, multiple ELR tapes or foils may be sandwiched together to form a macroscale wire. For example, an electrode may include one or more ELR tapes or foils.

In addition to ELR wires, electrodes and other conductive elements may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

Thus, the modified ELR materials may formed into tapes, foils, rods, strips, nanowires, thin films, and other shapes or structures capable of moving or carrying current from one point or location to another point or location.

In some examples, the type of materials used in the ELR materials may be determined by the type of application utilizing the ELR materials. For example, some applications may utilize ELR materials having a BSCCO ELR layer, whereas some applications may utilize a YBCO ELR layer. That is, the ELR materials described herein may be formed into certain structures (e.g., tapes or nanowires) and formed from certain materials (e.g., YBCO or BSCCO) based on the type of device or component utilizing the ELR materials, among other factors.

Various manufacturing processes may be employed when forming the ELR-based junction devices described herein. For example, a first layer of ELR material may be deposited onto a substrate (such as a semiconducting substrate), followed by a second layer of modifying materials deposited onto the first layer. A semiconducting element may be placed proximate to the ELR materials, forming a junction. Of course, one or ordinary skill in the art will realize other processes may be utilized.

As discussed herein, many devices and systems may utilize, employ and/or incorporate the ELR-based junctions, such as transistors that include components that exhibit extremely low resistances to current at high or ambient temperatures. The following section describes a few example devices, systems, and/or applications. One of ordinary skill will appreciate that other devices, systems, and/or applications may also utilize the ELR-based junctions.

Figure 107:
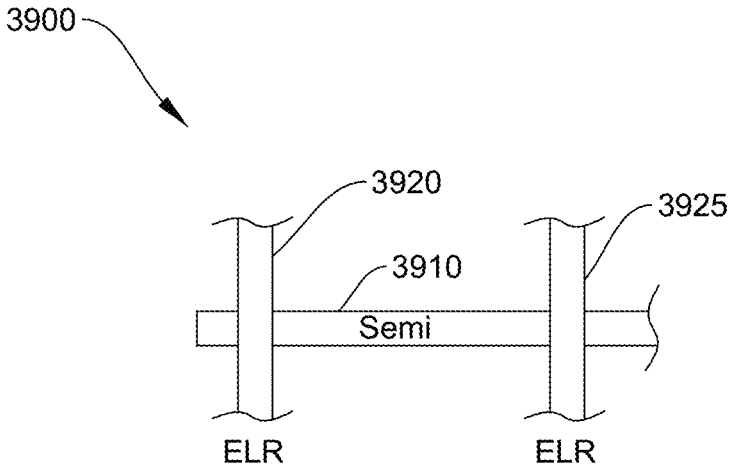

FIG. 107 is a schematic diagram illustrating a transistor 3900 employing a semiconducting nanowire and one or more ELR elements. The transistor 3900 includes a nanowire 3910 formed of a semiconducting material, a first ELR element 3920, and a second ELR element 3925. In some cases, the ELR elements 3920, 3925 are also nanowires or other similarly sized elements.

In operation, a supercurrent (that is, a current flowing without resistance) within the first ELR element 3920 travels through the nanowire 3910 to the second ELR element 3925. Application of a gate voltage on the nanowire, such as by a gate electrode possibly formed of ELR materials, may control the current as it travels through the semiconducting nanowire 3910.

Small circuits may, therefore, utilize multiple transistors 3900, such as an array of transistors 3900. For example, a superconducting quantum interference device (SQUID) may be formed of two of such transistors 3900, and may be employed as a switchable coupling element between quantum bits (qubits), among other applications.

Figure 108A:
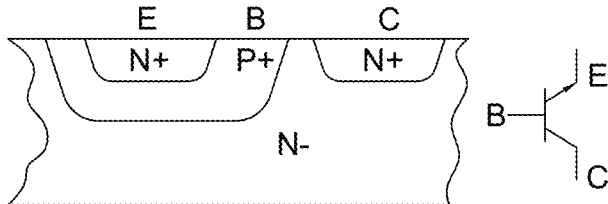
Figure 108B:
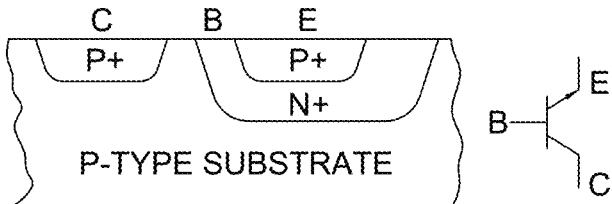

FIGS. 108A and 108B are schematic diagrams illustrating bipolar junctions transistors employing one or more ELR elements. FIG. 108A depicts an npn bipolar junction transistor 4000. The npn bipolar junction transistor 4000 includes an emitter electrode 4010, a collector electrode 4012, and a gate electrode 4014, some or all of which are formed of ELR material, such as the modified and/or apertured ELR materials described herein. Between the emitter electrode 4010 and the collector electrode 4012 is an npn junction formed of a first n-type semiconductor 4020, a p-type semiconductor 4024, and a second n-type semiconductor 4022.

FIG. 108B depicts a pnp bipolar junction transistor 4030. The pnp bipolar junction transistor 4030 includes an emitter electrode 4040, a collector electrode 4042, and a gate electrode 4044, some or all of which are formed of ELR material, such as the modified and/or apertured ELR materials described herein. Between the emitter electrode 4040 and the collector electrode 4042 is an npn junction formed of a first n-type semiconductor 4050, a p-type semiconductor 4054, and a second n-type semiconductor 4052.

In some examples, the npn bipolar junction transistor 4000 and/or the pnp bipolar junction transistor 4030 act as current regulating devices that control an amount of current flowing through the junction with respect to an amount of biasing voltage applied to their base terminal, such as a current-controlled switch. Because they are three terminal devices, they may affect input signals in three different ways: (1) providing a gain in voltage without a gain in current when in a common base configuration, (2) providing a gain in voltage and current when in a common emitter configuration, and (3) providing a gain in current without a gain in voltage in a common collector configuration. For example, the npn bipolar transistor 4000 may be employed as an amplifier when configured in the common emitter configuration.

Figure 109:
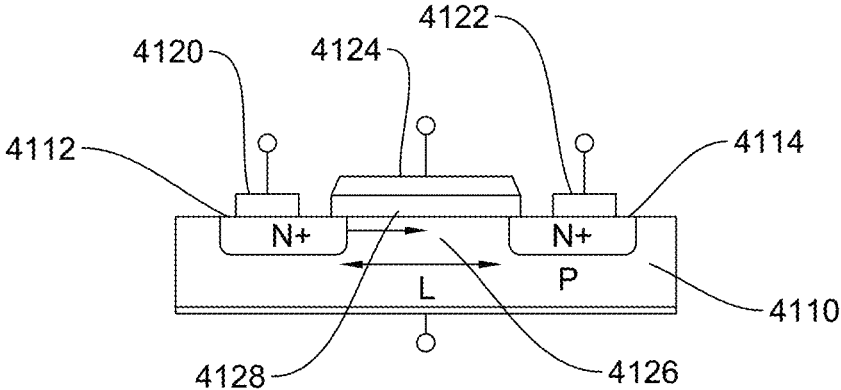

FIG. 109 is a schematic diagram illustrating a field effect transistor (FET), such as a metal oxide semiconducting field effect transistor (MOSFET), employing one or more ELR elements. The FET 4100 includes a substrate 4110 having an n-type source 4112 and an n-type drain 4114. The FET 4100 also includes a source electrode 4120, a drain electrode 4122, and a gate electrode 4124, some or all of which are formed of ELR material, such as the modified and/or apertured ELR material described herein. The FET 4100 also includes an insulating layer 4126D, generally formed of an oxide, that insulates the gate electrode 4124 from the substrate 4110.

During operation, a positive voltage is applied to the gate electrode 4124, which generates an electric field within a channel region 4128 that enables electrons to flow in the channel region 4128 from the source 4112 to the drain 4114. That is, the generated electric field establishes a field effect that allows a current to flow within the device, switching the transistor to an "on" state.

MOSFETs are generally employed to amplify and/or switch electronic signals. They may be configured as NMOS or PMOS devices, or grouped together to form complementary metal oxide semiconductor (CMOS) circuits. Example devices that may employ ELR-based MOSFETs, such as in CMOS circuits, will now be discussed.

FIG. 110 is a schematic diagram 4200 illustrating an amplifier employing one or more ELR-based transistor elements. An amplifier 4210 includes one or more transistors 4220 formed at least in part of ELR components, such as bipolar junction transistors, field effect transistors, and so on. In operation, the amplifier 4210 receives an input signal 4230, amplifies the signal, and produces an amplified output signal 4240. Many types of devices may employ the amplifier 4210, including mobile devices, televisions, radios, other devices that provide signal processing, radio transmission, sound reproduction, and so on.

In some examples, an amplifier employing ELR materials exhibits lower power dissipation and performs at higher speeds than an amplifier using conventional interconnects or metallization. The IC layout may be simplified because common resistance effects are reduced or eliminated, among other things.

Figure 111:
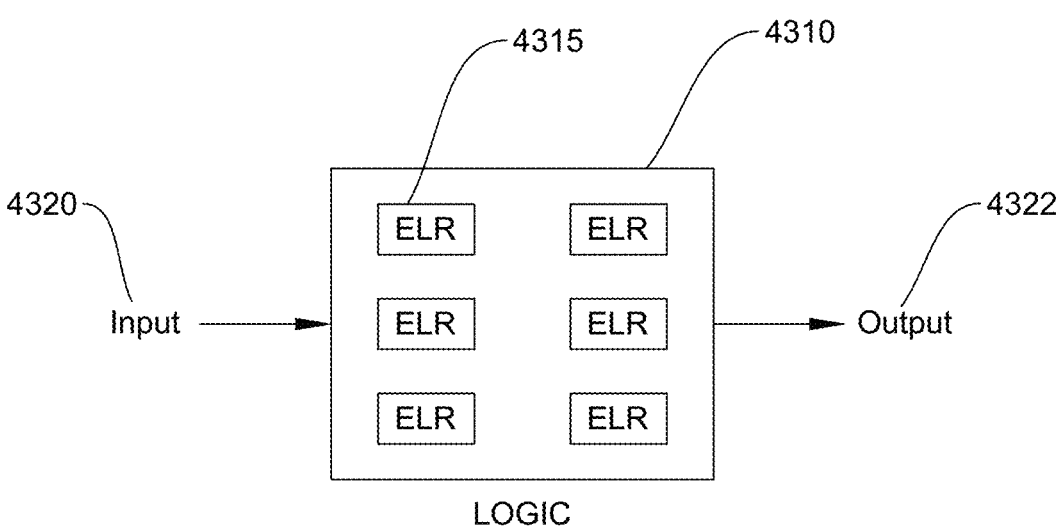

FIG. 111 is a schematic diagram 4300 illustrating a switch employing one or more ELR-based transistor elements. A switch 4310 includes one or more ELR-based transistors 4315, such as ELR-based bipolar junction transistors, ELR-based field effect transistors, and so on. In operation as a logic gate, memory, and/or information storage device, the switch 4310 receives an input signal 4320, such as an input voltage, and produces an output signal 4322 as being either in an "on" state, which may be associated with a "1" in computing logic, or an "off" state, which may be associated with a "0" in computing logic.

In operation within a switched-mode power supply, the switch 4310 receives an input signal 4320, such as a current type, and produces an output signal that modifies the current type. For example, the switch 4310 may receive current from a grid and condition the current for use with certain devices.

As an example, in a switching regulator, a dc voltage (Vin) is converted to a pulse width modulated PWM waveform at a high frequency. The mark-space ratio of the PWM waveform generally sets the transfer ratio (Vout/Vin). The PWM waveform is then filtered by an inductor and capacitor to give the desired output voltage (Vout). There are three types of regulators: A step down regulator (Vin>Vout) is referred to as a Buck regulator, a step up regulator is referred to as a Boost regulator and an inverting regulator (Vout=− Vin) is referred to as a Buck-Boost regulator. All may benefit from elimination of resistance in transistors, interconnects, inductor windings, capacitor electrodes, and/or other ELR-based elements. The result is higher efficiency, among other things.

The switch 4310 may be utilized in other applications, such as in analog-to-digital converters, digital-to-analog converters, microprocessors and other logic-based elements, and so on. In some cases, utilization of ELR elements facilitates improved efficiency, faster clock speeds resulting in faster conversion times (ADC, DAC) and/or calculation/ instruction times μC, μP, logic, simplified integrated circuit design, and other benefits.

Figure 112:

FIG. 112 is a schematic diagram illustrating a microprocessor 4400 employing one or more ELR-based elements. The microprocessor 4400 includes a logic component 4410 that includes one or more ELR-based transistors 4415, an accumulator 4417, a program counter 4420, an address register 4425, a controller sequencer 4430, a decoder 4435, a data register 4440, random access memory (RAM) 4450, and/or input/output (I/O) components 4455. The microprocessor 4400 also includes various information paths 4460, some or all of which may be formed of the modified and/or apertured ELR materials described herein. The conductive paths 4460 may be control bus path 4462, data bus paths 4464, address bus paths 4466, and so on.

Forming the logic component 4410 and/or some or all of the information paths 4460 of the microprocessor 4400 with the ELR materials described herein enables the microprocessor 4400 to perform more quickly and efficiently, among other benefits.

In some examples, ELR material-semiconductor junctions enable devices, such as switches, amplifiers, logic devices, memory devices, and so on, to perform at very high speeds without requiring complex components and/or architectures, because there is virtually no propagation delay in circuits utilizing ELR interconnects, achieving a high fidelity signal over long distances due to minimal resistance distortion, among other benefits.

Of course, one of ordinary skill in the art will realize that other systems and devices may employ the ELR-based junctions and transistors described herein.

In some implementations, a transistor that includes modified ELR materials may be described as follows:

A junction device comprising: a modified extremely low resistance (ELR) element; and a semiconductor located proximate to the modified ELR element; wherein the modified ELR element includes a layer of ELR material and a modifying layer that modifies one or more operating characteristics of the layer of ELR material.

A method of forming a junction, the method comprising: forming a modified extremely low resistance (ELR) element on a substrate; and forming a semiconductor located proximate to the modified ELR element on the substrate.

A junction formed on a substrate, comprising: a first element composed of a semiconducting material; and a second element formed of an extremely low resistance (ELR) material that exhibits extremely low resistance to a flow of charge at temperatures between 150 K and 313 K.

A Josephson junction device comprising: a first modified extremely low resistance (ELR) element; a second modified extremely low resistance (ELR) element; and a semiconductor located between the first modified ELR element and the second modified ELR element; wherein the first modified ELR element or the second modified ELR element includes a layer of ELR material and a modifying layer that modifies one or more operating characteristics of the layer of ELR material.

A method of forming a Josephson junction, the method comprising: forming a first modified extremely low resistance (ELR) element on a substrate; forming a semiconductor proximate to the first modified ELR element on the substrate; and forming a second modified extremely low resistance (ELR) element proximate to the semiconductor on the substrate.

A Josephson junction formed on a substrate, comprising: a first element formed of an extremely low resistance material; a second element formed of a semiconducting material and positioned proximate to the first element; and a third element formed of an extremely low resistance material; wherein the first element or the third element are formed of extremely low resistance (ELR) material that exhibits extremely low resistance to a flow of charge at temperatures between 150 K and 313 K.

A transistor, comprising: a first nanowire formed of a modified extremely low resistance (ELR) material; a second nanowire formed of the modified extremely low resistance (ELR) material; and a semiconducting nanowire having a first end coupled to the first nanowire to form a first junction and a second end coupled to the second nanowire to form a second junction; wherein the modified ELR material includes a layer of ELR material and a modifying layer that modifies one or more operating characteristics of the layer of ELR material.

A device for controlling a current, the device comprising: a semiconducting nanowire; a first modified extremely low resistance (ELR) element that emits current into the semiconducting nanowire; a second modified extremely low resistance (ELR) element that collects current from the semiconducting nanowire; and a control element that applies a voltage to the semiconducting nanowire to control current within the semiconducting nanowire.

A transistor, comprising: a first junction formed of a first modified extremely low resistance (ELR) nanowire placed proximate to a first region of a semiconducting nanowire; and a second junction formed of a second modified extremely low resistance (ELR) nanowire placed proximate to a second region of the semiconducting nanowire.

A bipolar junction transistor, comprising: an emitter electrode formed of a modified extremely low resistance (ELR) material; a collector electrode formed of the modified extremely low resistance (ELR) material; a base electrode formed of the modified extremely low resistance (ELR) material; a semiconducting element having a first end coupled to the emitter electrode to form a first junction and a second end coupled to the collector electrode to form a second junction; wherein the modified ELR material includes a layer of ELR material and a modifying layer that modifies one or more operating characteristics of the layer of ELR material.

A device for controlling a current, the device comprising: a semiconducting element; a first modified extremely low resistance (ELR) element that emits current into the semiconducting element; a second modified extremely low resistance (ELR) element that collects current from the semiconducting element; and a control element that applies a voltage to the semiconducting element to control current within the semiconducting element.

A bipolar junction transistor, comprising: a first junction formed of a first modified extremely low resistance (ELR) element placed proximate to a first region of a semiconducting component; and a second junction formed of a second modified extremely low resistance (ELR) element placed proximate to a second region of the semiconducting component.

A metal oxide semiconducting field effect transistor (MOSFET), comprising: a source electrode formed of a modified extremely low resistance (ELR) material; a drain electrode formed of the modified extremely low resistance (ELR) material; and a gate electrode formed of the modified extremely low resistance (ELR) material; wherein the modified ELR material includes a layer of ELR material and a modifying layer that modifies one or more operating characteristics of the layer of ELR material.

A device for controlling a current, the device comprising: a semiconducting region; a first modified extremely low resistance (ELR) element that provides a source of electrons into the semiconducting element; a second modified extremely low resistance (ELR) element that receives electrons from the semiconducting element; and a control element that applies a voltage to the semiconducting element to control a flow of electrons within the semiconducting element.

An electrode configured to be utilized by a metal oxide semiconducting field effect transistor (MOSFET), the electrode comprising: a layer of extremely low resistance (ELR) material; and a modifying layer that modifies one or more operating characteristics of the layer of ELR material.

A switch, comprising: a metal oxide semiconducting field effect transistor (MOSFET), comprising: a source electrode formed of a modified extremely low resistance (ELR) material; a drain electrode formed of the modified extremely low resistance (ELR) material; and a gate electrode formed of the modified extremely low resistance (ELR) material; wherein the modified ELR material includes a layer of ELR material and a modifying layer that modifies one or more operating characteristics of the layer of ELR material.

A logic device, comprising: a semiconducting region; a first modified extremely low resistance (ELR) element that provides a source of electrons into the semiconducting element; a second modified extremely low resistance (ELR) element that receives electrons from the semiconducting element; and a control element that applies a voltage to the semiconducting element to control a flow of electrons within the semiconducting element; wherein an actual flow of electrons indicates a first logic state corresponding to a 1, and a lack of flow of electrons indicates a second logic state corresponding to a 0.

A switch, comprising: an emitter configured to emit one or more electrons into a semiconducting element; and a collector configure to collect one or more electrons from the semiconducting element; wherein the emitter or collector includes a modified extremely low resistance (ELR) material.

An amplifier, comprising: a metal oxide semiconducting field effect transistor (MOSFET), comprising: a source electrode formed of a modified extremely low resistance (ELR) material; a drain electrode formed of the modified extremely low resistance (ELR) material; and a gate electrode formed of the modified extremely low resistance (ELR) material; wherein the modified ELR material includes a layer of ELR material and a modifying layer that modifies one or more operating characteristics of the layer of ELR material.

An amplifier, comprising: an emitter configured to emit one or more electrons into a semiconducting element; and a collector configured to collect one or more electrons from the semiconducting element; wherein the emitter or collector includes a modified extremely low resistance (ELR) material.

A method of amplifying a signal, the method comprising: receiving a current at an emitter; emitting electrons into a semiconducting element based on the received current; applying a voltage to the emitted current that achieves a gain in voltage or current with respect to the received current; and collecting an amplified current in a collector electrode formed of a modified extremely low resistance (ELR) material.

An amplifier, comprising: a metal oxide semiconducting field effect transistor (MOSFET), comprising: a source electrode formed of a modified extremely low resistance (ELR) material; a drain electrode formed of the modified extremely low resistance (ELR) material; and a gate electrode formed of the modified extremely low resistance (ELR) material; and a cooling system configured to maintain a temperature of the MOSFET at a certain temperature lower than an ambient temperature surrounding the MOSFET; wherein the modified ELR material includes a layer of ELR material and a modifying layer that modifies one or more operating characteristics of the layer of ELR material.

A junction device comprising: a modified extremely low resistance (ELR) element; and a semiconductor located proximate to the modified ELR element; and a cooling component that maintains the modified ELR element at a temperature in which the modified ELR element propagates charge at extremely low resistance; wherein the modified ELR element includes a layer of ELR material and a modifying layer that modifies one or more operating characteristics of the layer of ELR material.

A device for controlling a current, the device comprising: a semiconducting region; a first modified extremely low resistance (ELR) element that provides a source of electrons into the semiconducting element; a second modified extremely low resistance (ELR) element that receives electrons from the semiconducting element; a control element that applies a voltage to the semiconducting element to control a flow of electrons within the semiconducting element; and a temperature component that maintains the first ELR element, the second ELR element, or the third ELR element at a temperature lower than an ambient temperature of the device.

An information storage device, comprising: a memory region; a first modified ELR element that provides a source of electric charge into the memory region; a second modified ELR element that receives electric charge from the memory region.

A memory device, comprising: a semiconducting region; a first modified extremely low resistance (ELR) element that provides a source of electrons into the semiconducting element; a second modified extremely low resistance (ELR) element that receives electrons from the semiconducting element; and a control element that applies a voltage to the semiconducting element to control a flow of electrons within the semiconducting element; wherein an actual flow of electrons indicates a first logic state corresponding to a 1, and a lack of flow of electrons indicates a second logic state corresponding to a 0.

Chapter 8—Integrated Circuits Formed of ELR Materials

Part A—Integrated Circuit Devices

This section of the description refers to FIGS. 1-36 and FIGS. 113-121; accordingly all reference numbers included in this section refer to elements found in such figures.

Integrated circuit components that are formed of modified extremely low resistance (ELR) materials are described. A modified ELR material can be, for example, a film, a tape, a foil, or a nanowire. However, for ease of description it is assumed for the examples herein that a modified ELR material is a film, although other implementations can be used. The modified ELR materials provide extremely low resistances to current at temperatures higher than temperatures normally associated with current high temperature superconductors (HTS), enhancing the operational characteristics of the integrated circuits at these higher temperatures, among other benefits.

In some examples, the modified ELR films are manufactured based on the type of materials used in the integrated circuit, the application of the modified ELR film, the size of the component employing the modified ELR film, the operational requirements of a device or machine employing the modified ELR film, and so on. As such, during the design and manufacturing of an integrated circuit, the material used as a base layer of a modified ELR film and/or the material used as a modifying layer of the modified ELR film may be selected based on various considerations and desired operating and/or manufacturing characteristics.

Figure 113:
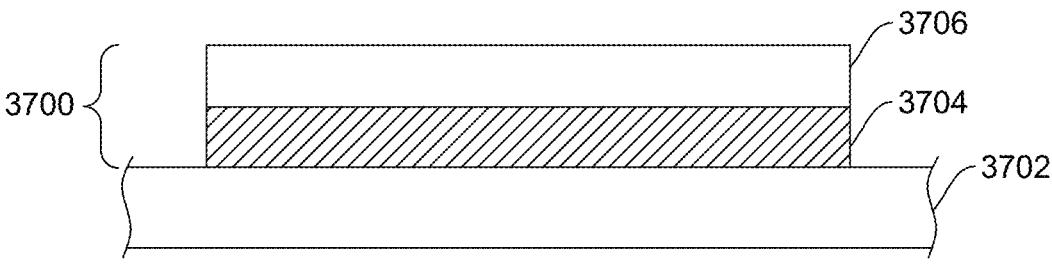
FIGS. 113 to 121 illustrate the forming of integrated circuit devices using ELR materials.

FIG. 113 is a schematic diagram illustrating a cut-away view of a conductive path 3700E formed, at least in part, of modified, apertured, and/or other new ELR materials, such as ELR materials having an ELR material base layer 3704 and a modifying layer 3706 formed on the base layer 3704. While various examples of the invention are described with reference to "modified ELR materials" and/or various configurations of modified ELR materials (e.g., modified ELR films, etc.), it will be appreciated that any of the improved ELR materials described herein may be used, including, for example, modified ELR materials (e.g., modified ELR material 1060, etc.), apertured ELR materials, and/or other new ELR materials in accordance with various aspects of the invention. As described herein, among other aspects, these improved ELR materials have at least one improved operating characteristic which in some examples, includes operating in an ELR state at temperatures greater than 150 K.

Various suitable modified ELR films are described in detail herein. Such a conductive path, when implemented in an integrated circuit, can be used, for example, for distributing power and propagating signals between circuit components in microprocessors, microcomputers, microcontrollers, digital signal processors (DSPs), systems-on-chip (SoCs), disk drive controllers, memories, application specific integrated circuits (ASICs), application specific standard products (ASSPs), field programmable gate arrays (FPGAs), or practically any other semiconductor integrated circuit.

As shown in the example of FIG. 113, the conductive path includes an ELR material base layer 3704 and a modifying layer 3706 formed on the base layer 3704. The conductive path can be formed on a substrate 3702, for example, the silicon substrate of an integrated circuit. The conductive path can also be formed on top of other IC layers. Being formed of a modified ELR film, the conductive path 3700 provides little or no resistance to the flow of current in the conductive path at temperatures higher than those used in conventional HTS materials, such as room or ambient temperatures (~21 C).

The material or dimensions of the substrate 3702 may be selected based on a variety of factors. For example, selecting a substrate material having a higher dielectric constant will generally reduce capacitance seen by a transmission line, and thus decrease the power necessary to drive a signal. One skilled in the art will appreciate the substrate may be formed of a number of different materials and into a number of different shapes in order to achieve certain desired properties and/or operating characteristics.

In some examples, the modified ELR conductive path provides extremely low resistance to the flow of current at temperatures between the transition temperatures of conventional HTS materials (e.g., can be in a range of ~80 to ~135 K) and room temperatures (~294 K). In these examples, the conductive path may include a cooling system (not shown), such as a cryocooler or cryostat, used to cool the conductive path 3700 to a critical temperature for the type of modified ELR film utilized for the conductive path 3700. For example, the cooling system may be a system capable of cooling the conductive path to a temperature similar to that of liquid Freon, to a temperature similar to that of frozen water, or other temperatures discussed herein. That is, the cooling system may be selected based on the type and structure of the modified ELR film utilized for the conductive path 3700.

Figure 114:
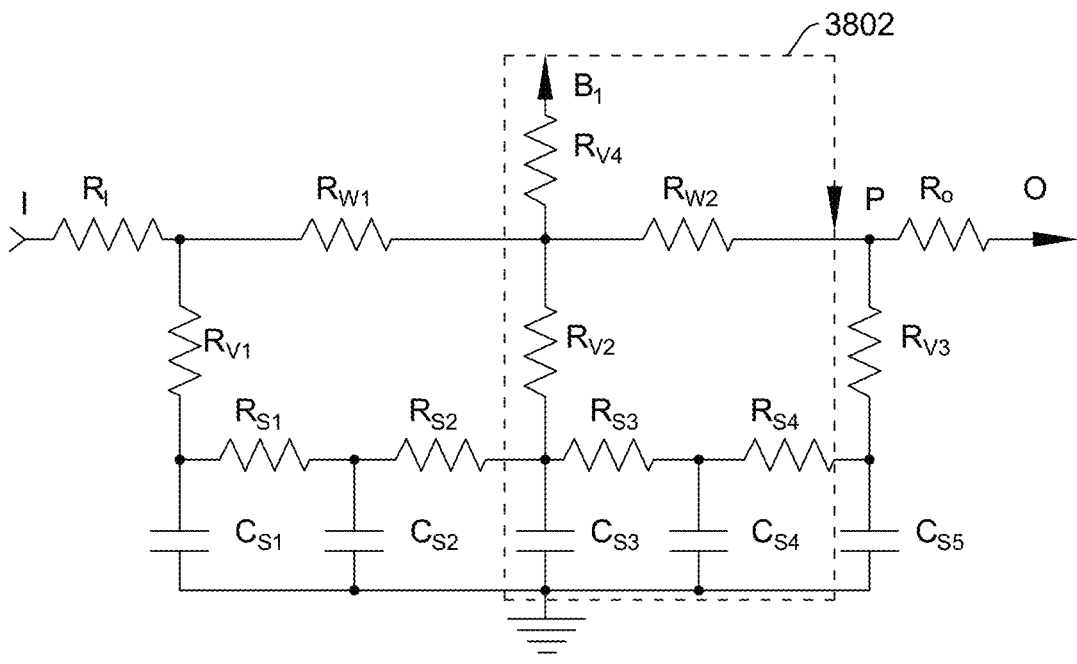

FIG. 114 is a schematic diagram, which represents an example model of a conductive path formed from a modified ELR film. The model includes an input, I, and an output, O. $R_I$ and $R_O$ correspond to the respective resistances of the connecting materials on the input and output end of conducting path formed from the modified ELR film. $R_{V1}$, $R_{V2}$, $R_{V3}$, and $R_{V4}$ correspond to resistances of vias and/or other connections from the internal conductive path to the outer skin of the conducting path. $R_{W1}$ and $R_{W2}$ correspond to the resistances of the internal conductive path of the modified ELR film. $R_{S1}$-$R_{S4}$, and $C_{S1}$-$C_{S5}$ correspond to the transmission line model of the outer skin of the conducting path. The elements encompassed by the dashed line 3802 can be serially duplicated at position P for each via (or other connection) on the conducting path. The example model of FIG. 114 shows a branch $B_1$ which connects to a via (represented by $R_{V4}$) and the output $O_I$ destination series path. In some examples, the model can include more elements including inductors.

Due to the extremely low resistance (represented by $R_{W1}$ and $R_{W2}$ of the model) of a conductive path formed from a modified ELR film, a signal propagating on the conductive path has a wave-front-delay time constant approaching zero. A signal propagates through the crystalline structure of a modified ELR film in a manner analogous to that of a waveguide, unencumbered by the capacitance of the outside environment. However, the signal also propagates on the outside skin of the modified ELR film which experiences normal resistance (represented by $R_{S1}$-$R_{S4}$ of the model) and the capacitance (represented by $C_{S1}$-$C_{S5}$ of the model) of the surrounding environment. Thus, the signal propagating through the crystalline structure of the modified ELR film can reach the destination node and change the voltage of the node before the outside skin has completely achieved its changed voltage.

As discussed herein, many integrated circuit devices and systems may utilize, employ and/or incorporate modified ELR conductive paths that exhibit extremely low resistances at high or ambient temperatures. In general, a device or system that provides a path for a current of electrons may incorporate the modified ELR conductive paths as described herein. The following section describes a few example devices, systems, and/or applications. One of ordinary skill will appreciate that other devices, systems, and/or applications may also utilize the modified ELR conductive paths.

Figure 115:
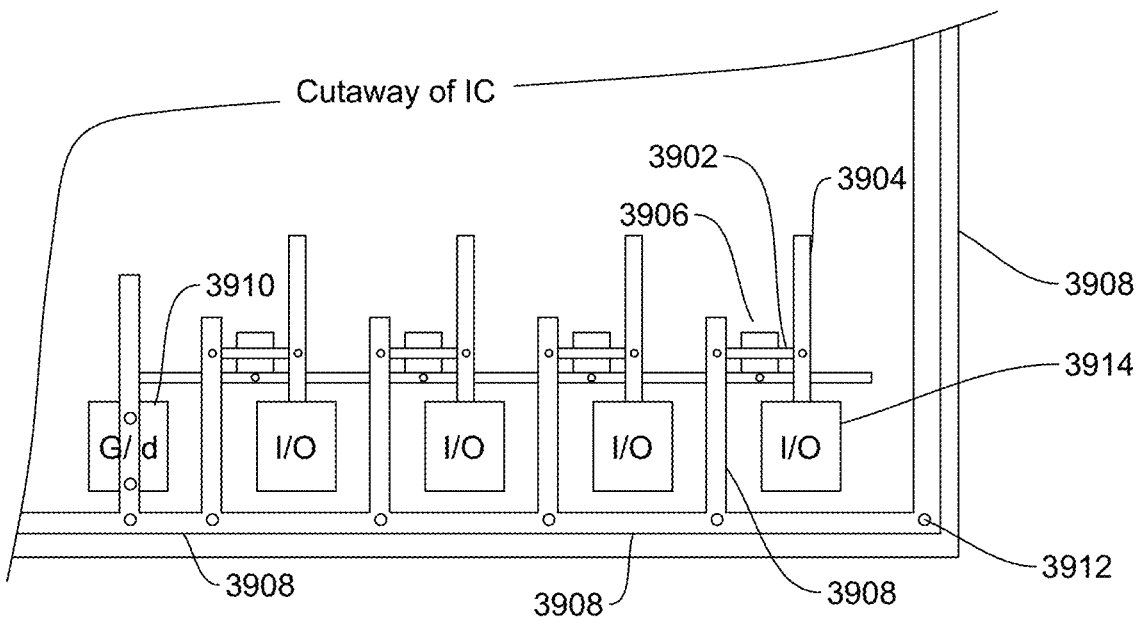

In some examples, electrostatic discharge (ESD) protection routing of an integrated circuit can utilize the modified ELR conductive paths as described herein. FIG. 115 is a diagram of an example integrated circuit including ESD protection routing formed of modified ELR conductive paths. As shown in FIG. 115, modified ELR material is used to implement the conductive path 3902, which establishes a connection between the normal signal path 3904 (which connects to input/output pad 3914 of the integrated circuit), and an ESD protection circuit 3906. Modified ELR material may also be used with conductive path 3908, which connects between the ESD protection circuit 3906 and ground 3910. Since, in some examples, a modified ELR conductive path can be directional, i.e., current flows along a particular plane of the modified ELR material, the ESD protection network of FIG. 115 may utilize two substantially orthogonal layers coupled together by vias, such as via 3912, to route the ESD to ground. In other examples, the normal signal path 3904 can also be formed of modified ELR material.

Modern integrated circuit technologies, with smaller feature size, have become much more vulnerable to ESD and manufacturers have had to develop technologies to handle ESD protection. Two problems are present in conventional technology for mitigating ESD events. The first is quickly detecting the ESD event and the second is conducting the charge through various routed circuits in a limited time before the charge can build up voltage reaching a damaging threshold. Appropriate protection ratings are difficult to achieve using conventional materials because the smaller transistors of modern integrated circuits have a lower breakdown voltage.

Implementing the ESD protection network of modified ELR material allows for sufficient protection ratings for ESD protection. First, because the conductive path 3902 between the normal signal path and the ESD protection circuit is implemented using modified ELR material, the ESD signal has a wave-front-delay time constant approaching zero. This allows the ESD protection circuit 3906 to detect the ESD event nearly instantaneously. A modified ELR material ESD protection network may provide an extremely quick response to sensing the ESD event and triggering the protection, in addition to providing current conduction for the ESD event, directing the ESD into appropriately designed paths (e.g., conductive path 3908)

before the charge can cause the voltage to build up to a level which damages circuit structures. The ESD protection voltage rating is directly proportional to how fast the ESD protection circuitry reacts to an ESD event. For example, an ESD protection circuit using conventional materials typically has a rating of 2,000 V Human-Body Model (HBM), while an ESD protection circuit using conductive paths formed of modified ELR materials might easily achieve a 16,000 V HBM rating because the response is sped up by eight fold or greater.

An ESD protection network from modified ELR conductive paths can be implemented on, for example: microprocessors, microcomputers, microcontrollers, DSPs, SoCs, disk drive controllers, memories, ASICs, ASSPs, FPGAs, neural networks, sensor arrays, MEMS, and generally any other semiconductor integrated circuit.

In some examples, the resistance of modified ELR conductive paths can be altered to create resistors in defined locations. The resistors can be used as components in circuits of the integrated circuit. For example, the resistors can be used in analog integrated circuits such as filters and amplifiers. The timing of digital circuits can be modified by adding resistance to a clock network. Signal integrity in critical areas can be improved by inserting extra resistance in the conductive path that carries the signal.

Figure 116:
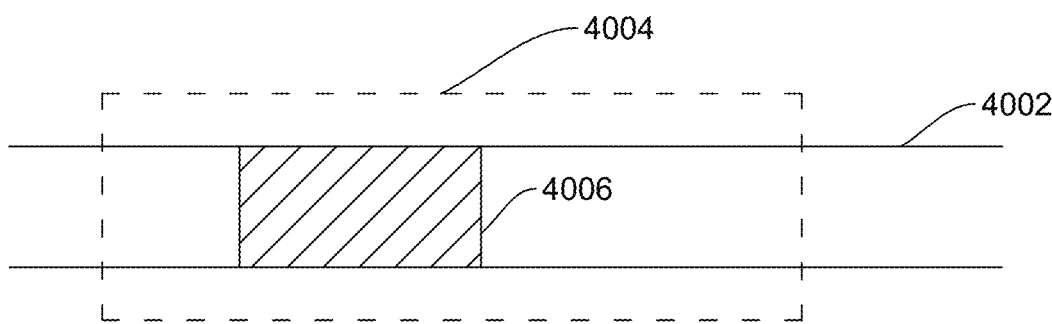

FIG. 116 is a diagram of an example laser programmable element on a conductive path formed from modified ELR material. The modified ELR conductive path 4002 of FIG. 116 includes a laser-modified section 4006. Integrated circuit chips typically have a passivation layer on the surface of the chip. In some examples this passivation layer is removed to create an opening 4004 to expose the modified ELR conductive path to the laser. When the laser modified section 4006 is exposed to a laser the resistance of the section is increased relative to the surrounding conductive path. In some examples, the energy from the laser rearranges the molecular structure of the conductive path at the laser-modified section such that the crystalline structure of the modified ELR material no longer acts as a waveguide. In other examples, the modifying layer of the modified ELR material is ablated by the laser and the reduced resistance that the modifying layer facilitates is lost. In other examples, both the modifying layer of the modified ELR material is ablated and the molecular structure of the conductive path is altered by the laser.

The dimensions of the laser-modified section define the resistance the section provides in the modified ELR conductive path. A laser modified section of a modified ELR conductive path can provide a resistor "insertion" into circuits, after the circuit has been manufactured, and can be particularly valuable for analog circuits as well as "tweaking" oscillators for changing clock frequencies on chips. In some examples, a linearly continuous length of modified ELR conductive path can be altered to provide the desired resistance. In other examples, multiple discrete sections of the modified ELR conductive path can be laser modified to provide an overall series resistance.

Figure 117:
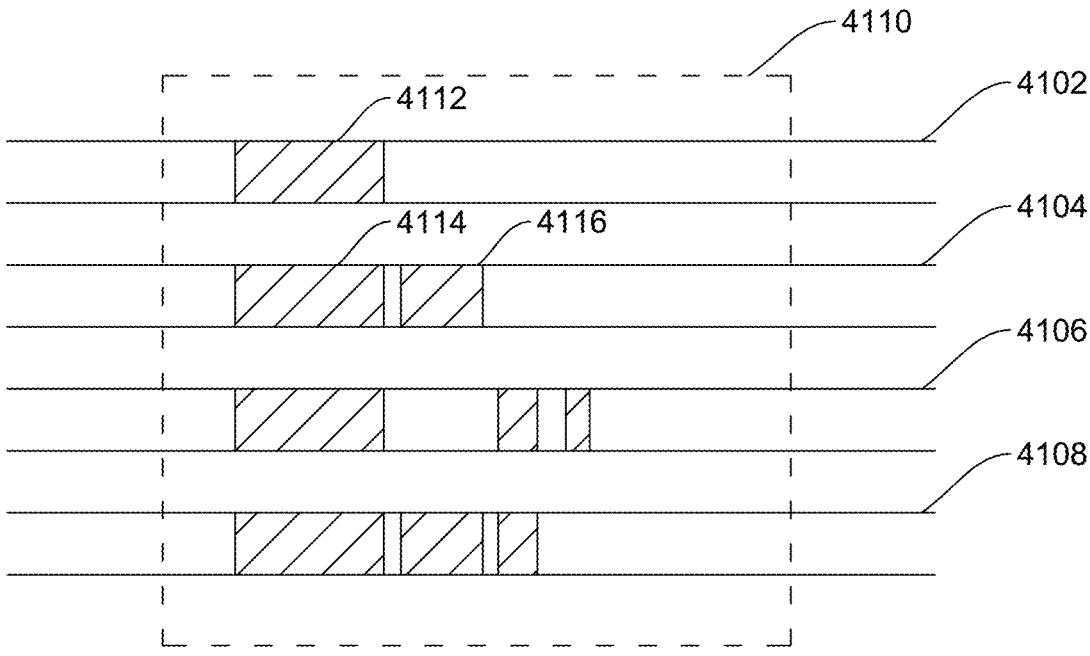

For example, FIG. 117 is a diagram of an example multi-bit laser programmable element on a conductive path formed from modified ELR material. FIG. 117 depicts modified ELR conductive paths 4102-4108 having various resistances which are made up of a number of discrete laser modified sections. As described above, in some examples, an opening 4410 in the passivation layer is provided to expose the conductive paths to the laser. Conductive path 4102 includes a single element resistance 4112 as discussed above with reference to FIG. 116. Conductive path 4104 includes two discrete laser modified sections 4114 and 4116 which add together to provide a total resistance for the conductive path 4104. It should be apparent to one of skill in the art that various configurations and dimensions of laser-modified sections can be combined to provide a desired resistance for the conductive path. As will be appreciated, other programming mechanisms such as ion-beams and electron-beams may be suitable for programming modified ELR conductive paths in certain applications.

In some examples, the resistance of modified ELR conductive paths can be temporarily altered by the presence of a magnetic field. The ELR state of the modified ELR material cannot exist in the presence of a magnetic field greater than a critical value, even at temperatures as low as absolute zero. This critical magnetic field is strongly correlated with the critical temperature for the modified ELR material. In some examples, modified ELR materials show two critical magnetic field values, one at the onset of a mixed ELR and normal state and one where ELR ceases. The property of mixed ELR state can be used to implement resistances of varying value by varying the magnetic field.

Figure 118:
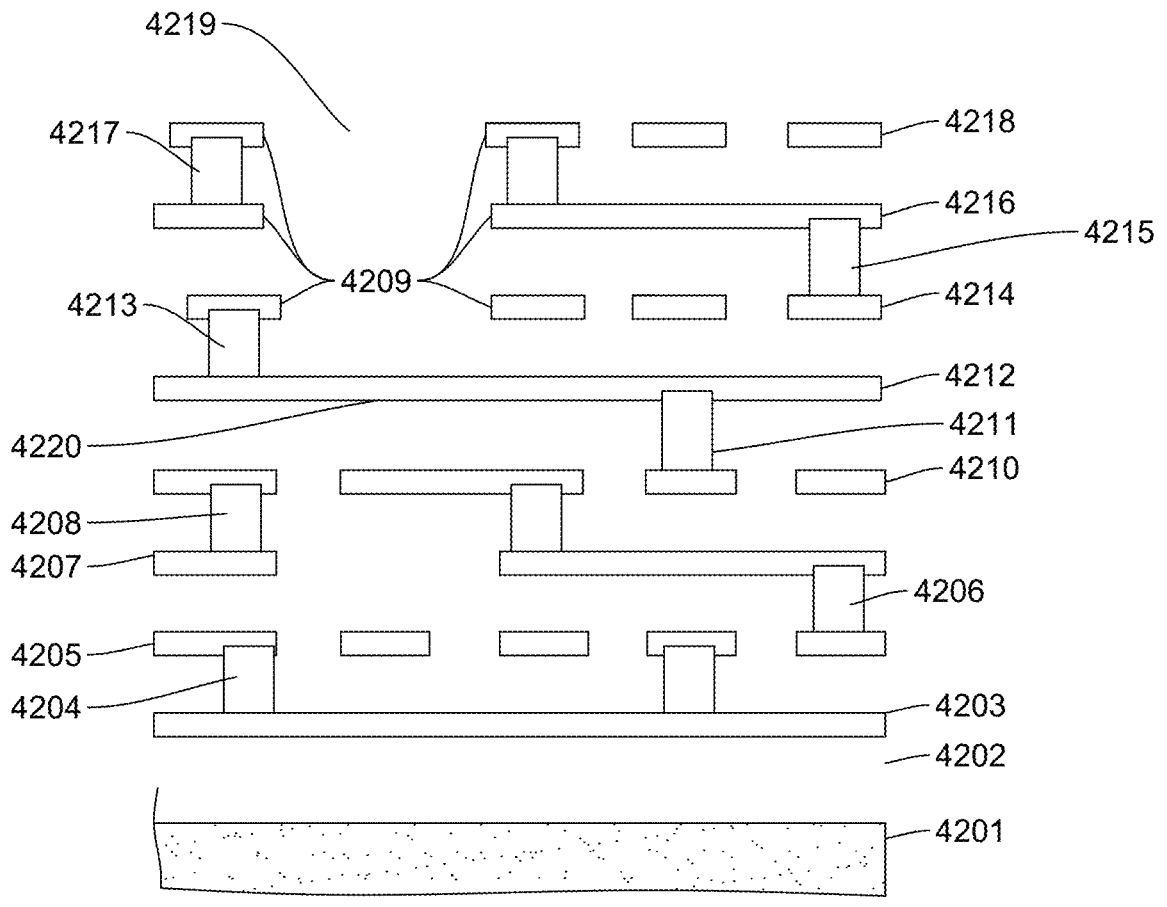

FIG. 118 is a schematic diagram illustrating a cut-away view of an example integrated circuit having a magnetically programmable element on a conductive path formed from modified ELR material. The integrated circuit includes a semiconductor substrate 4201; dielectric material 4202; interconnect layers 4203, 4205, 4207, 4210, 4212, 4214, 4216, and 4218; via layers 4204, 4206, 4208, 4211, 4213, 4215, and 4217; and a void 4219 which defines a magnetically programmable element 4220. In some examples, at least interconnect layer 4212 is formed from modified ELR material.

When the example integrated circuit of FIG. 118 is exposed to a magnetic field that is stronger than the critical magnetic field, the resistance of interconnect layer 4212 increases. The interconnect layers 4209 above the interconnect layer 4212 act as a shield to the magnetic field such that the void 4219 in the shielding layers 4209 defines a magnetically programmable element 4220. In some examples, multiple voids can define multiple magnetically programmable elements. In one example, each of the multiple magnetically programmable elements can be exposed to magnetic fields of a different strength to create various different resistances.

A magnetically programmable element in an integrated circuit can have many uses. For example, the elements can be used in analog integrated circuits as resistors that can be dynamically added, removed, and/or adjusted. The timing of digital circuits can be adjusted by adding, removing, and/or adjusting resistance by exposing a magnetically programmable element to a magnetic field. Signal integrity in critical areas can be improved by inserting extra resistance by exposing the conductive path that carries the signal to a magnetic field. A magnetically programmable element or a matrix of magnetically programmable elements can be used to measure a magnetic field similar to the way a thermistor is used to measure temperature.

Figure 119:
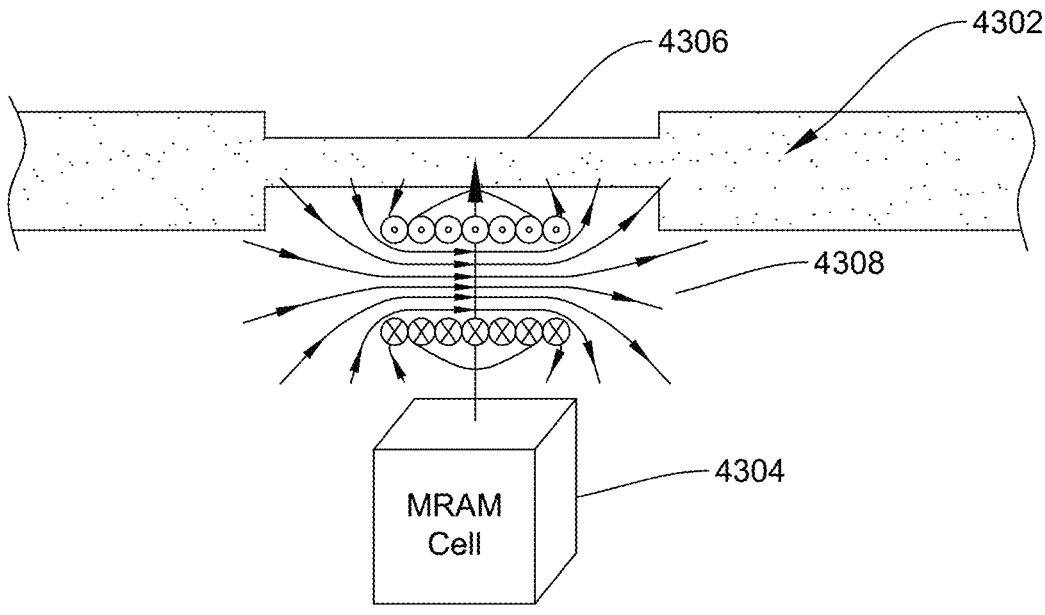

The magnetic field can be provided by a device installed near the magnetically programmable element. For example, the device may be a permanent magnet or an electromagnet. FIG. 119 is a diagram of an example magnetically programmable element activated by a magnetoresistive random access memory (MRAM) cell. In the example of FIG. 119, a conductive path 4302 of modified ELR material is formed near an MRAM cell 4304. While the source of the magnetic field 4308 in the example of FIG. 119 and FIG. 120 below are described as being MRAM cells, any magnetic field source such as an ELR sensor/antenna described in Appendix A can be used to produce the magnetic field.

The MRAM cell has at least two states and the magnetic field produced by the MRAM cell can vary depending on the state. The MRAM cell is in close enough proximity to the conductive path 4302 that the magnetic field produced by the MRAM cell is above the critical magnetic field for the conductive path for at least one state of the MRAM cell. In some examples, the width of the conductive path near the MRAM cell is reduced, for example, the reduced width section 4306. This reduction in width can affect the critical magnetic field required to change the resistance of the reduced width section.

Figure 120:
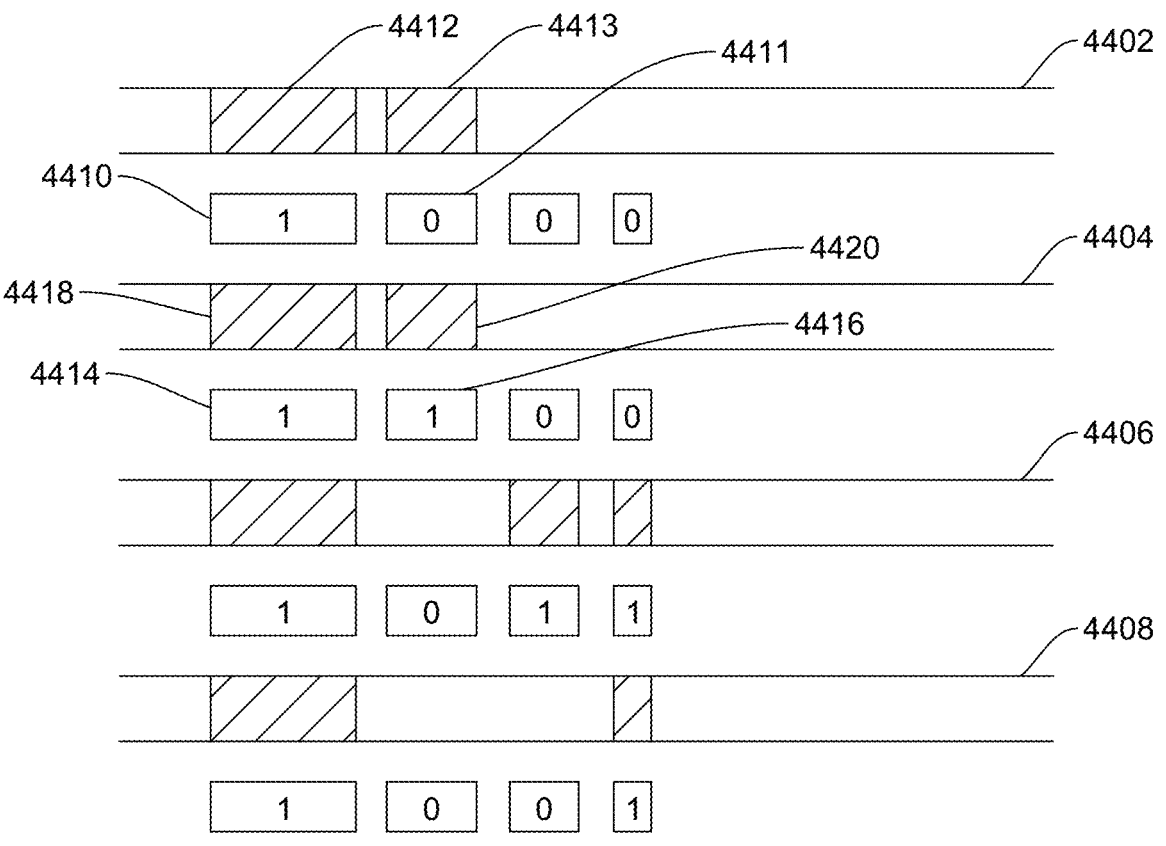

In some examples, more than one MRAM cell can be distributed or localized along a conductive path to implement multiple resistors of varying resistance. FIG. 120 is an example diagram of multiple MRAM cells distributed along a modified ELR conductive path. As shown in FIG. 120, each conductive path 4402-4408 has multiple MRAM cells, which can produce a magnetic field for a segment of the conductive path. Each MRAM cell can be selectively activated thereby making the resistance of the conductive path variable. For example, MRAM cell 4410 is in a first state, which is producing a magnetic field above the critical magnetic field for a segment 4412 of modified ELR conductive path 4402. The MRAM cell 4411 is in a second state, which does not produce a magnetic field above the critical magnetic field for a segment 4413 of the modified ELR conductive path 4402.

Multiple segments of a modified ELR conductive path can be exposed to magnetic fields creating multiple resistance values. For example MRAM cells 4414 and 4416 can both be in the first state and produce the critical magnetic field for segments 4418 and 4420 on the modified ELR conductive path 4404. Any number of segments of varying length can be combined to create almost limitless possible resistances produced on a conductive path. This arrangement of multiple MRAM cells, or other magnetic field sources, can be used, for example, in filters to create an adaptive filter where the resistance of the filter can be modified. The arrangement can also be used to adjust the impedance of a transmission line for matching purposes.

Figure 121:
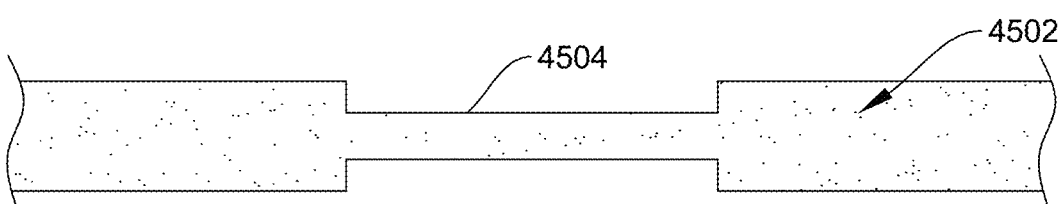

In some examples, a segment of a modified ELR conductive path can be used as a current limiting device by modifying the dimensions of the segment such that the current flowing through the conductive path rises above the critical current at the modified segment. For example, FIG. 121 is a diagram of a modified ELR conductive path 4502 with a current limiting segment 4504. While the example of FIG. 121 includes a reduced width segment of modified ELR material, one of skill in the art will appreciate that other dimensions of the modified ELR material can be changed. For example, the segment of modified ELR material can be made thinner or a multi-layer modified ELR material can have fewer layers.

In some examples, multiple elements can be created on a modified ELR conductive path. By designing the specific width and thickness as needed for each particular element, specific critical current could be reached in each specific case. Each particular element operates with negligible resistance in a normal use case when the current is below the critical current, but to meet some design strategies (e.g., mitigating a fault or for other desired conditions) when the current exceeds a segment's particular critical current the segment becomes more resistive than the rest of the conductive path. As described above, the resistance of the segment can be defined by thickness, width, and/or length of the segment.

In some examples, transistors or microelectromechanical systems (MEMS) switches can be employed to trigger when the critical current is reached in a particular segment of the conductive path. For example, a MEMS switch can be set to route current through a current limiting segment in response to certain conditions but to otherwise route the current through an alternative path.

In some examples, some or all of the systems and devices described herein may employ low cost cooling systems in applications where the specific modified ELR materials utilized by the application exhibit extremely low resistances at temperatures lower than ambient temperatures. As discussed herein, in these examples the application may include a cooling system (not shown), such as a system that cools a modified ELR conductive path to a temperature similar to that of the boiling point of liquid Freon, to a temperature similar to that of a melting point of water, or other temperatures discussed herein. The cooling system may be selected based on the type and structure of the ELR materials utilized by the application.

In addition to the systems, devices, and/or applications described herein, one skilled in the art will realize that other integrated circuit systems, devices, and applications may utilize the ELR conductive paths described herein.

Part B—Integrated Circuits and MEMS Devices

This section of the description refers to FIGS. 1-36 and FIGS. 122-130; accordingly all reference numbers included in this section refer to elements found in such figures.

Various implementations of the invention generally relate to extremely low resistance interconnects (ELRI), such as interconnects incorporating modified, apertured, and/or other new ELR materials. In some implementations, the ELRI can have a first layer comprised of an extremely low resistance (ELR) material and a second layer comprised of a modifying material bonded to the ELR material of the first layer. The ELRI can be used in a variety of systems and methods to create various improvements. Some examples where various efficiencies are created include, but are not limited to, systems and methods using ELRI for connecting microelectromechanical systems (MEMS) to an analog circuit on a semiconductor integrated circuit (IC), systems and methods using ELRI for connecting multiple MEMS together on an IC or on an IC mounting substrate, systems and methods for using ELRI for passive components used with MEMS on a semiconductor IC or on a mounting substrate, and systems and methods using ELRI for connecting MEMS to other circuits on an IC mounting substrate or system-in-package (SiP).

Some implementations provide for systems and methods using ELRI to connect MEMS to analog circuits on a semiconductor IC. Various implementations use ELRI material to implement the conductive paths for signals to propagate between analog circuit functions and MEMS elements. These conductive paths can have negligible resistance and have a wave-front-delay time constant approaching zero. As such, the delay of signals and drive current in the electrical interactions can be significantly reduced.

In accordance with various implementations, ELRI material can also be used to connect multiple MEMS together on an IC, on an IC mounting substrate, or elsewhere within an IC package. For example, an ELRI material can be used to implement the conductive paths for signals to propagate between various MEMS circuits on an IC. These conductive paths connecting various MEMS can combine or compensate different MEMS parameters or attributes creating a MEMS network or a virtual Multi-MEMS in the sense that they act electrically as one MEMS while having multiple and possibly variable parameters or attributes.

In one or more implementations, ELRI can be used in passive components on a MEMS on a semiconductor IC or on a mounting substrate. For example, in some implementations, an ELRI material can be used to implement passive components and/or the conductive paths between the passive components and other circuits. The conductive paths allow for signals to propagate with negligible resistance and with a wave-front-delay time constant approaching zero. The use of the ELRI material significantly reduces the delay of signals and the drive current in their electrical interactions. Moreover, these ELRI passive components and connections can sometimes include MEMS elements, including ELRI as part of the MEMS structure.

In addition, various implementations of the invention provide for systems and methods using ELRI for connecting MEMS to other circuits on an IC mounting substrate or system-in-package (SiP). In some of these implementations, an ELRI material can be used to implement the conductive paths for signals to propagate between MEMS elements and circuit function components which can have a variety of beneficial effects. For example, the conductive paths can have a negligible resistance and a wave-front-delay time constant approaching zero, thereby significantly reducing delay of signals and drive current in their electrical interactions.

The ELRI can be manufactured based on the type of materials, the application of the ELRI, the size of the component employing the ELRI, the operational requirements of a device or machine employing the ELRI, and so on. As such, during the design and manufacturing, the material used as a base layer of an ELRI and/or the material used as a modifying layer of the ELRI may be selected based on various considerations and desired operating and/or manufacturing characteristics. While various suitable geometries and configurations are shown and described herein for the layout and/or disposition of the modified ELR, numerous other geometries are possible. These other geometries include different patterns, configurations or layouts with respect to length and/or width in addition to differences in thickness of materials, use of different layers, ELR films having multiple adjacent modifying layers, multiple ELR films modified by a single modifying layer, and other three-dimensional structures. Thus any suitable modified ELR can be used depending upon the desired application and/or properties.

In the Figures, sizes of various depicted elements or components and the lateral sizes and thicknesses of various layers are not necessarily drawn to scale and these various elements may be arbitrarily enlarged or reduced to improve legibility. Also, component details have been abstracted in the Figures to exclude details such as precise geometric shape or positioning of components and certain precise connections between such components when such details are unnecessary to the detailed description of the invention. When such details are unnecessary to understanding the invention, the representative geometries, interconnections, and configurations shown are intended to be illustrative of general design or operating principles, not exhaustive.

Figure 122:
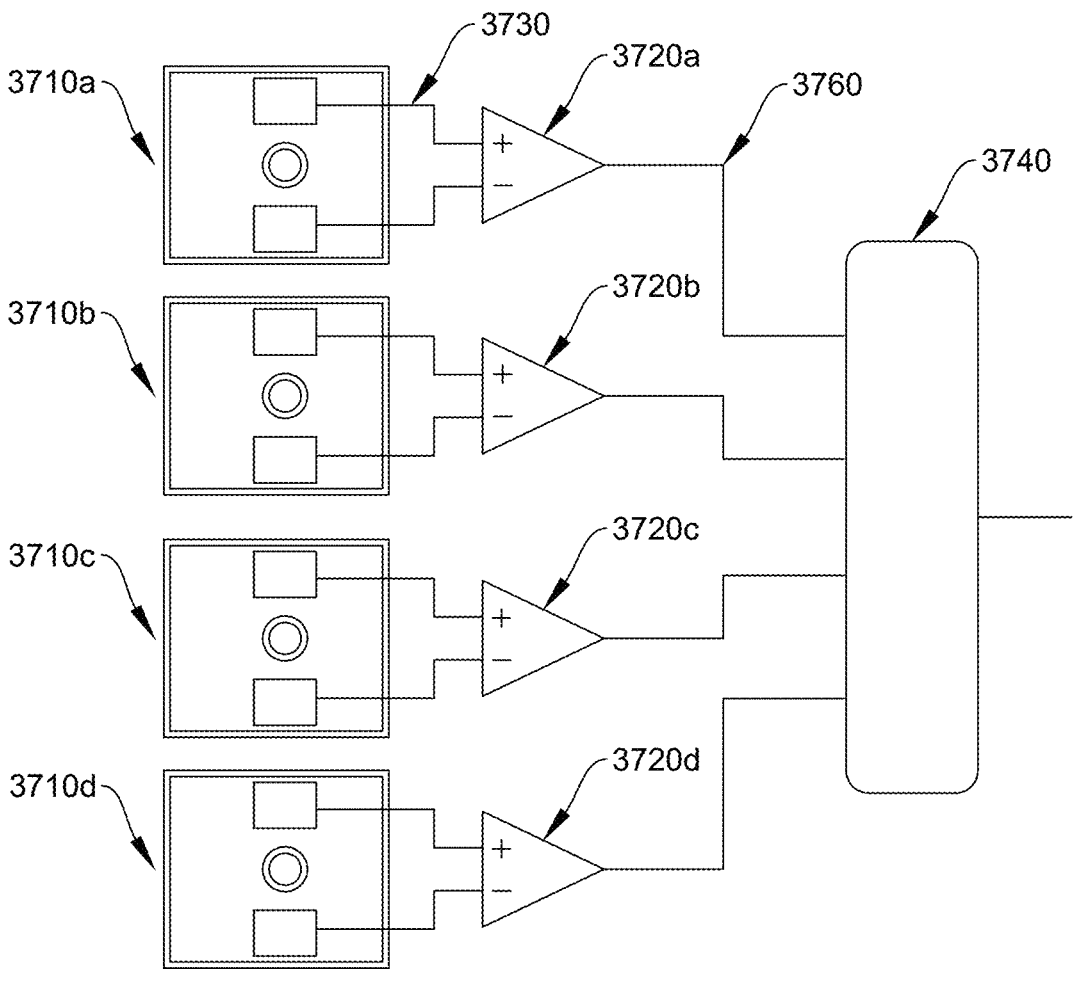
FIGS. 122 to 130 illustrate the forming of integrated circuits and MEMS devices using ELR materials.

FIG. 122 is a schematic illustrating a possible circuit design connecting MEMS 3710a-3710d with analog circuits 3720a-3720d using traditional interconnects such as 3730. In many circuit designs, analog circuits 3720a-3720d interface with and measure various MEMS parameters. However, any measurement is degraded by the connection parasitic resistance limiting the signal accuracy. As shown in FIG. 122, multiple analog circuits 3720a-3720d are required to amplify the signals generated by the MEMS mechanical-to-electrical energy conversion, and also to compensate for the parasitic losses encountered by the signals propagating through the resistive conductors 3760 providing signal(s) to component 3740 in traditional technology. Typically, better functionality is provided when the analog circuits are placed in very close proximity to the MEMS. In some cases, however, the MEMS 3710a-3710d cannot be located close to the analog circuits 3720a-3720d for other design and manufacturing reasons. As a result, degraded performance from the connection parasitics resulting from the traditional conductive paths occur and additional design considerations are required for adequate performance. Similarly, when MEMS are connected to other circuits and/or other components a similar degradation can occur when traditional conductive interconnects are used.

Some implementations of the invention provide for systems and methods using ELRI to connect MEMS to analog circuits on an IC. For example, the ELRI can be used to implement the conductive paths for signals to propagate between analog circuit functions and MEMS elements. These conductive paths can have negligible resistance and can have a wave-front-delay time constant approaching zero. As such, the delay of signals and drive current in the electrical interactions can be significantly reduced. In addition, the performance and accuracy tends to be superior over the use of traditional conductive paths by the reduced parasitic resistance of the connections to the MEMS circuits. Accordingly, the use of ELRI to connect the MEMS to components (e.g., analog circuits and/or other circuits) can allow the components to be connected to the MEMS circuits virtually independent of their location.

Figure 123:
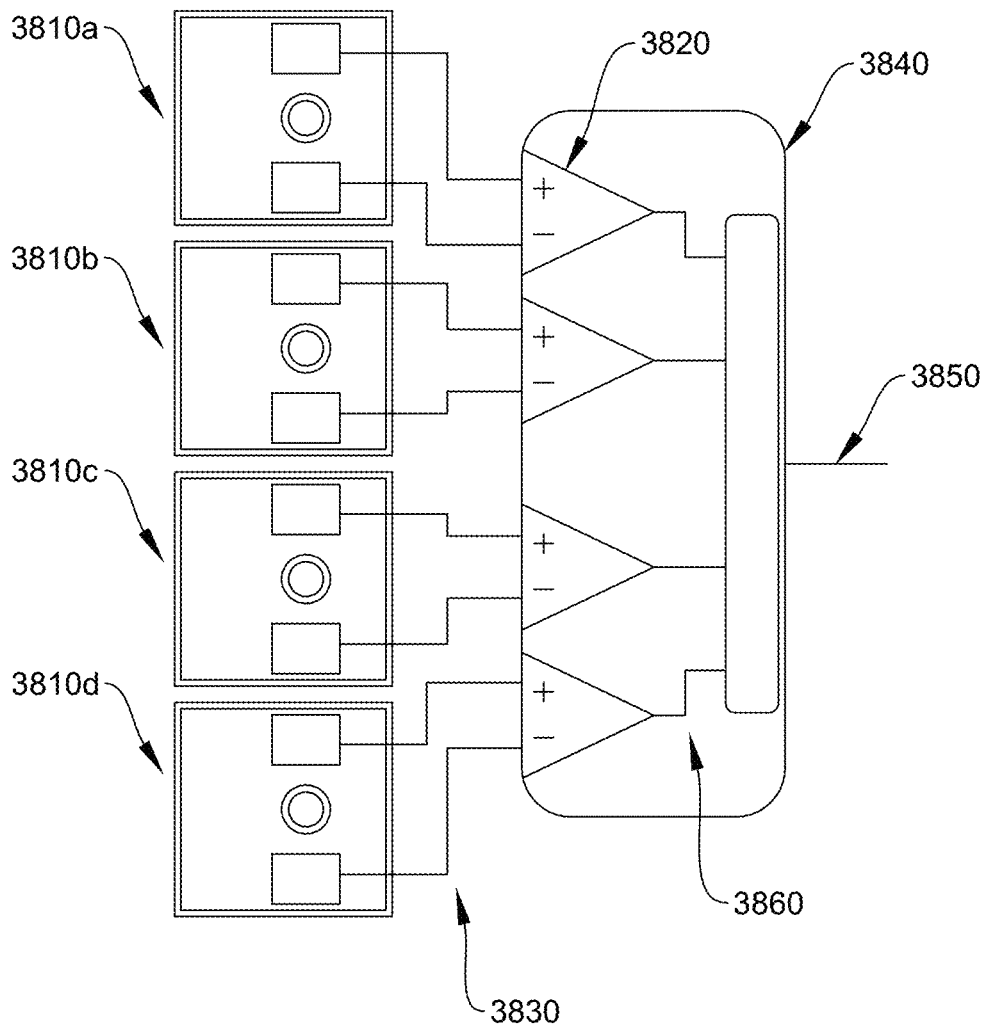

FIG. 123 is a schematic illustrating the use of ELRIs to connect MEMS to one or more analog circuits on an IC. In accordance with various implementations, the ELRI such as 3830, for connecting MEMS circuits 3810a-3810d each to an analog circuit 3820 of an analog circuit block 3840, could be implemented on virtually any semiconductor IC with MEMS structures and analog circuits. The analog circuits can interface with and measure the MEMS parameters. However, with traditional interconnects any measurement degrades with the connection parasitics and limits the accuracy. As will be appreciated, using ELRI 3830 can allow the analog circuit 3820 to be connected to the MEMS circuits 3810a-3810d virtually independent of their location and without substantial or significant parasitic resistance, and further may reduce the complexity of the required circuit design. The output of each analog circuit 3820 could be coupled through another ELRI 3860 to drive line 3850.

In some implementations of the invention, an IC is provided that includes one or more conductive paths, a MEMS, and a set of circuitry (e.g., analog circuit) connected to the MEMS through the one or more conductive paths. In some implementations, the one or more conductive paths are comprised of an ELRI having a first layer comprised of an ELR material (e.g., YBCO, BSCCO, or other) and a second layer comprised of a modifying material (e.g., chromium, copper, bismuth, cobalt, vanadium, titanium, rhodium, beryllium, gallium, selenium, silver or other) bonded to the ELR material of the first layer. In some implementations, the IC can have multiple levels of interconnect, each level separated from adjacent levels with an insulating dielectric having vias formed to electrically couple adjacent interconnect levels as required to continue conductive paths. Layers and each of the multiple levels of interconnect can include at least one of the one or more conductive paths. In accordance with some implementations, the ELRI can be a superconductor or a perfect conductor at ambient temperatures, or under other suitably desirable conditions.

The MEMS can include one or more components. Examples include, but are not limited to, a radio frequency circuit, a tunable transmission line, a waveguide, a resonator, ELR components, passive components, ELR passive components, a quasi-optical component, a tunable inductor, a tunable capacitor, and/or an electromechanical filter. As other examples, the one or more components can include sensors to detect environmental parameters. Examples of the types of sensors than can be used include, but are not limited to, a pressure sensor, a temperature sensor, a light sensor, a vibration sensor, an accelerometer, a humidity sensor, an electric field sensor, and/or a sound sensor.

Some implementations provide for an electronic device (e.g., a wireless device, Wi-Fi device, a spread spectrum device, a wireless USB device, a Bluetooth® device, etc) that includes a power supply connected an IC. The IC can have one or more conductive paths comprised of an ELRI having a first layer comprised of an ELR material and a second layer comprised of a modifying material bonded to the ELR material of the first layer. In addition, a set of circuitry (e.g., an RF circuit, an analog circuit, a digital circuit, etc) can be connected to a MEMS device through the one or more conductive paths. In some implementations, the IC in the electronic device can also include an RF antenna, an RF amplifier, an RF filter, and/or an RF controller. In some cases, these components can be ELR components made from ELR material. For example, the RF antenna can have a first ELR antenna layer comprised of ELR material and a second ELR antenna layer comprised of modifying material bonded to the ELR material of the first ELR antenna layer.

Figure 124:
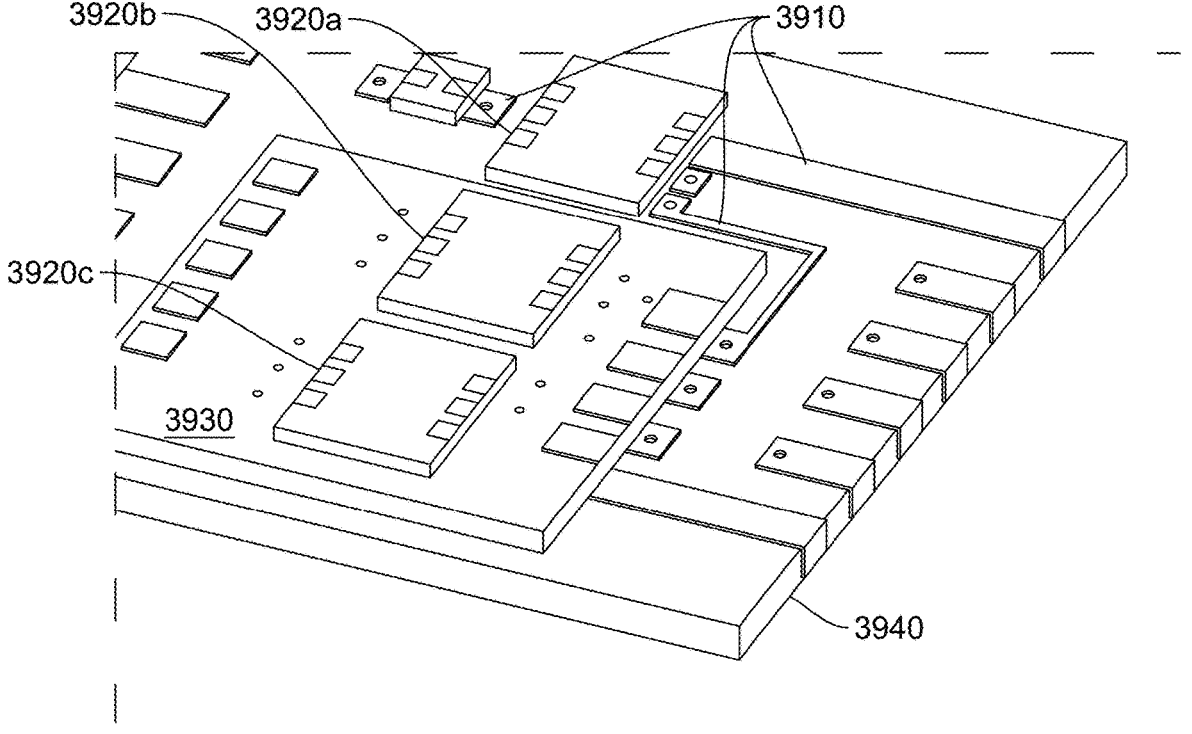

FIG. 124 illustrates the use of ELRI 3910 for connecting a MEMS 3920 to other circuits or components 3930 on an IC Mounting Substrate or a SiP 3940. For example, the ELRI 3910 can be used to connect the MEMS 3920 to a microprocessor, a microcomputer, a microcontroller, a DSP, a system on chip (SoC), an antenna, a second MEMS, an ASIC, an ASSP, an FPGA, and/or other circuit, component, or device 3930. The techniques used in these implementations can be used to connect MEMS 3920 to other circuits or components 3930. In addition, these techniques can be implemented on virtually any semiconductor IC mounting substrate containing a MEMS 3920 of same or varying types. For example, for a SiP, ELRI 3910 can be used to connect MEMS devices on the substrate to configure connections to ICs and other passive components, such as antennas, with no appreciable resistance allowing these elements to perform as though they were directly connected at their respective nodes, regardless of their physical location on the substrate.

In at least one implementation, an IC is provided that includes a MEMS, a network or components, and an IC mounting substrate. The IC mounting substrate can have one or more conductive paths comprised of an ELRI having a first layer comprised of an ELR material and a second layer comprised of a modifying material bonded to the ELR material of the first layer. The network of components can be connected to the MEMS through the one or more conductive paths. In some implementations, the network of components includes one or more ELRI passive components that are programmable, a microprocessor, a microcomputer, a microcontroller, a DSP, a system on chip (SoC), an antenna, a second MEMS, an ASIC, an ASSP, and/or an FPGA. In one implementation, the set of ELRI passive components are programmable to set a specific frequency or a Q of a transmitter circuit or a receiver circuit.

In some implementations, the MEMS can include one or more internal paths and/or components comprised of a first layer comprised of the ELR material and a second layer comprised of a modifying material bonded to the ELR material of the first layer. The one or more components can be electrical components and/or mechanical components. For example, in at least one implementation, the one or more components can include a set of ELRI passive components, a tunable transmission line, a waveguide, a resonator, a quasi-optical component, a tunable inductor, a tunable capacitor, an electromechanical filter, a sensor, a switch, an actuator, a structure, and/or other component.

The MEMS can also include, in some implementations, an input port to receive an input signal from outside the MEMS and/or an output port to transmit an internally generated signal outside of the MEMS. The input port can be connected to a component configured to receive the input signal and generate a response. In some cases, the input port and/or the output port can be connected to the component via one or more conductive paths to allow for signal transfer. In some implementations, the one or more conductive paths include a first layer comprised of an extremely low resistance (ELR) material and a second layer comprised of a modifying material bonded to the ELR material of the first layer.

Various implementations also provide for an electronic device having a power supply connected to an IC. In accordance with these implementations, the IC can include an IC mounting substrate having one or more conductive paths comprised of an ELRI having a first layer comprised of an ELR material and a second layer comprised of a modifying material bonded to the ELR material of the first layer. In addition, the IC can have a MEMS and a network of other components (e.g., a microprocessor, a microcomputer, a microcontroller, a DSP, SoC, an antenna, an RF controller, an RF circuit, an RF amplifier, a second MEMS, an ASIC, an ASSP, an FPGA, a neural network, and/or other component) connected to the MEMS through the one or more conductive paths. In some implementations, the MEMS can include one or more of the following components: a tunable transmission line, a waveguide, a resonator, a quasi-optical component, a tunable inductor, a tunable capacitor, and/or an electromechanical filter.

Many advantages can result from using ELRI for connecting MEMS circuits to an analog circuit and/or other circuits/components on an IC or SiP. For example, since the one or more conductive paths can have a near-zero parasitic resistance, this would allow the MEMS to be connected to the set of circuitry or components independent of location on a package. In addition, ELRI would enable MEMS and the circuits or components to be integrated on an IC with optimized locations and minimized degradations due to parasitic resistance. As another example, ELRI would allow the MEMS and the analog circuits to be designed somewhat independently. This independent design could facilitate prompt development. Moreover, this would allow MEMS IP and analog circuits IP to be more freely utilized. With ELRI allowing more independence between MEMS and analog circuit designs, more quantity and variety could be integrated on an IC, so MEMS ICs would proliferate in new products—that proliferation providing the learning curve for improved product design and manufacturing.

Using this ELRI technology in an IC product synergistically favors utilizing other ELRI technologies. Examples include MEMS ELRI technologies such as ELRI for connecting multiple MEMS circuits, ELRI for connecting a MEMS to other circuits on a mounting substrate or a SiP, ELRI for 3D interconnects on an IC (which connects the IC to the mounting substrate on package), ELRI for power supply distribution on a mounting substrate, and others, all of which further improves the development of all ELRI technologies and can improve the performance of the product.

Figure 125:
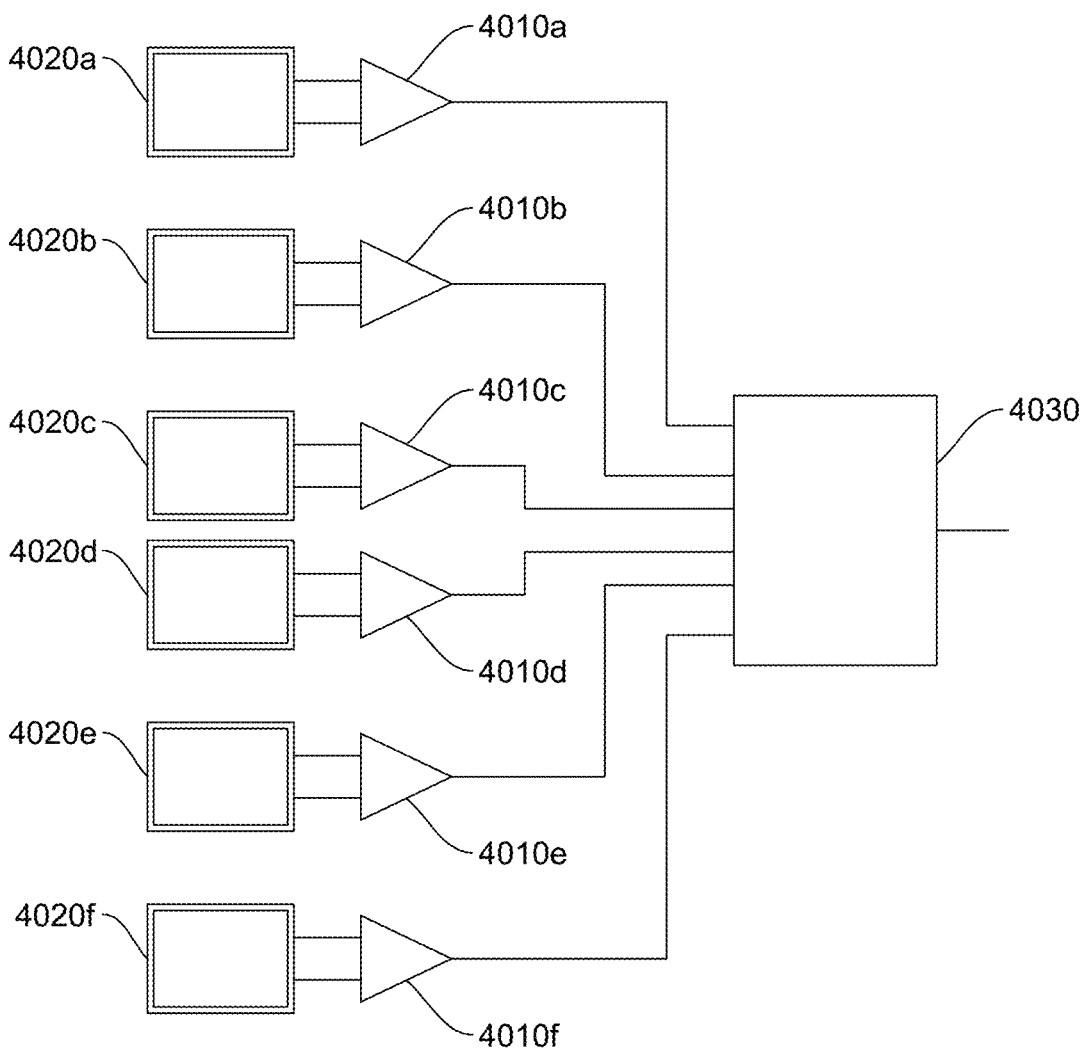

The resistance of metal interconnects created by traditional techniques for connecting MEMS circuits can limit and/or degrade their parameters or attributes. As illustrated in FIG. 125, some traditional designs have used amplifiers 4010a-4010f on the output of each MEMS 4020a-4020f to increase the signal strength. The output from amplifiers 4010a-4010f are then interfaced (e.g., by an analog interface 4030) to combine and/or operate on the outputs of the MEMS circuits. However, with the use of ELRI in accordance with various implementations of the invention, the MEMS and interface can be connected in such a way as to negate the parasitic effect of the interconnection.

Figure 126:
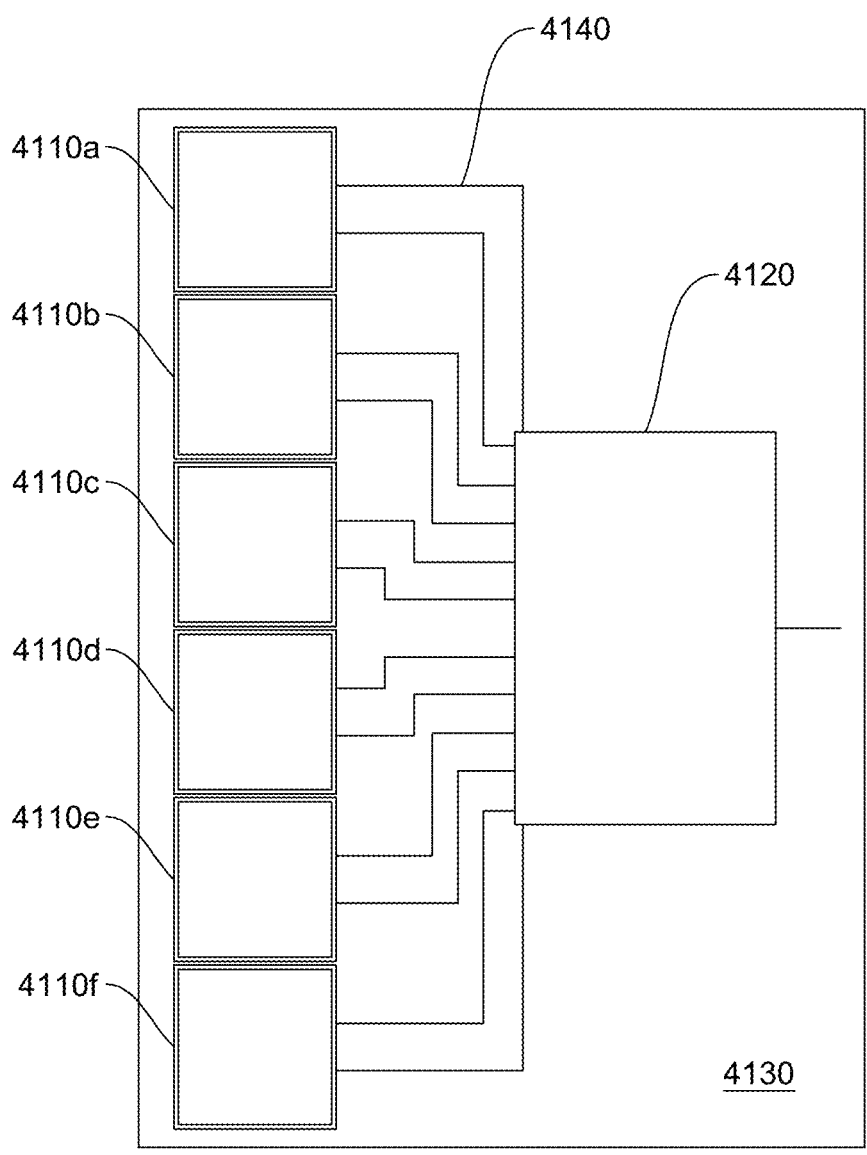

FIG. 126 is a schematic showing multiple MEMS 4110a-4110f connected to an interface device 4120. In accordance with various implementations, ELRI material can be used to connect multiple MEMS 4110a-4110f together on an IC, SiP, or on an IC mounting substrate 4130. For example, an ELRI material can be used to implement the conductive paths 4140 for signals to propagate between various MEMS circuits 4110a-4110f on an IC. These conductive paths connecting various MEMS 4110a-4110f can combine or compensate different MEMS parameters or attributes creating a MEMS network or a virtual multi-MEMS in the sense that they act electrically as one MEMS while having multiple and possibly variable parameters or attributes. In accordance with various implementations of the invention, ELRI for connecting MEMS circuits to other MEMS could be implemented on virtually any semiconductor IC with MEMS of same or varying types. In some cases, the ELRI will not degrade the output of the MEMS.

One example of virtual multi-MEMS is a MEMS capacitor connected through a MEMS switch to another MEMS capacitor as a "trim", to adjust margin. The "trim" component might or might not be subjugated to the same environmental forces that the primary encounters. Another is multiple MEMS sensing various environmental parameters. Examples include, but are not limited to, fluid pressure in a container, atmospheric pressure, temperature of the container, temperature of the air, ambient light, and vibration. The sensed environmental parameters can then be connected in an integrated control.

In some implementations, an IC is provided that includes a network of one or more MEMS, a set of circuitry, and one or more conductive paths. The one or more conductive paths can include an ELRI having a first layer comprised of an ELR material and a second layer comprised of a modifying material bonded to the ELR material of the first layer. In some implementations, the IC can have multiple layers that each has at least one conductive path. The network of MEMS can be interconnected through the one or more conductive paths. In addition, the set of circuitry (e.g., a digital circuit and/or an analog circuit) can be coupled (directly or indirectly) to the network of MEMS through the one or more conductive paths. In some implementations, the one or more conductive paths can have a near-zero parasitic resistance allowing the first MEMS to be connected to the set of circuitry independent of design requirements previously imposed by conductive characteristics of prior art interconnect material.

Figure 127:
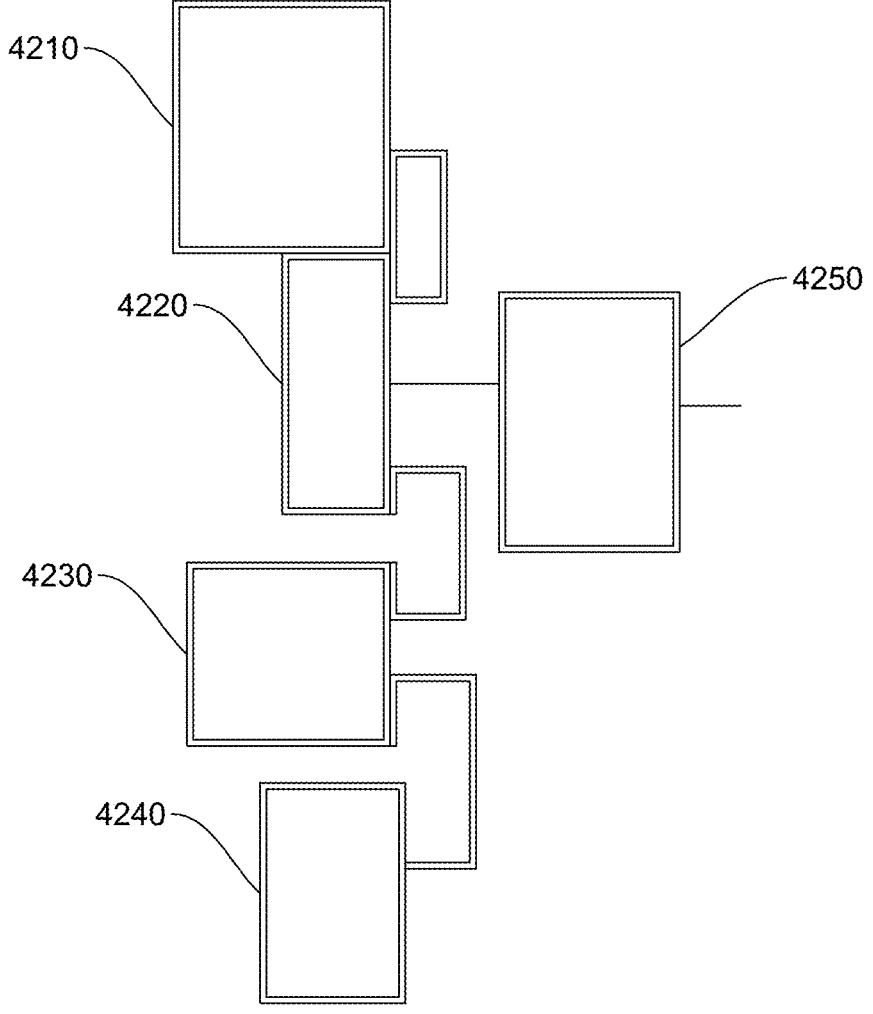

In at least one implementation, the network of MEMS includes a first MEMS having an output port and a second MEMS having an input port connected to the output port of the first MEMS through the one or more conductive paths. In some cases, additional MEMS (e.g., a third MEMS, a fourth MEMS, etc) can also be implemented on a single IC. As illustrated in FIG. 127, a multi-environment set of MEMS can be utilized. For example, MEMS 4210 can be configured to measure pressure, MEMS 4220 can be configured to measure temperature, MEMS 4230 can be configured to measure light, and MEMS 4240 can be configured to measure vibration. In some implementations, one of the MEMS, such as MEMS 4250, can include a radio frequency circuit, a sensor (e.g., a pressure sensor, a temperature sensor, a light sensor, a vibration sensor, an accelerometer, a humidity sensor, an electric field sensor, a magnetic field sensor, a sound sensor etc), an actuator (e.g., switch), and/or a mechanical or electrical structure (e.g., a tunable transmission line, a waveguide, a resonator, a quasi-optical component, a tunable inductor, a tunable capacitor, an electromechanical filter, etc).

In some implementations, an electronic device (e.g., wireless device) can be provided. The electronic device can include a power supply connected to an IC. The IC can have one or more conductive paths comprised of an ELRI having a first layer comprised of an ELR material and a second layer comprised of a modifying material bonded to the ELR material of the first layer. In various implementations, the IC also includes a network of one or more MEMS and a set of circuitry (e.g., an analog circuit) coupled to the network of MEMS through the one or more conductive paths. The IC and/or MEMS can include a variety of additional components some of which may be made from an ELR material. Examples include, but are not limited to, an RF circuit, an RF antenna, a tunable transmission line, a waveguide, a resonator, a quasi-optical component, a tunable inductor, a tunable capacitor, an electromechanical filter, a sensor, actuator, and/or other electrical or mechanical structure.

Figure 128:
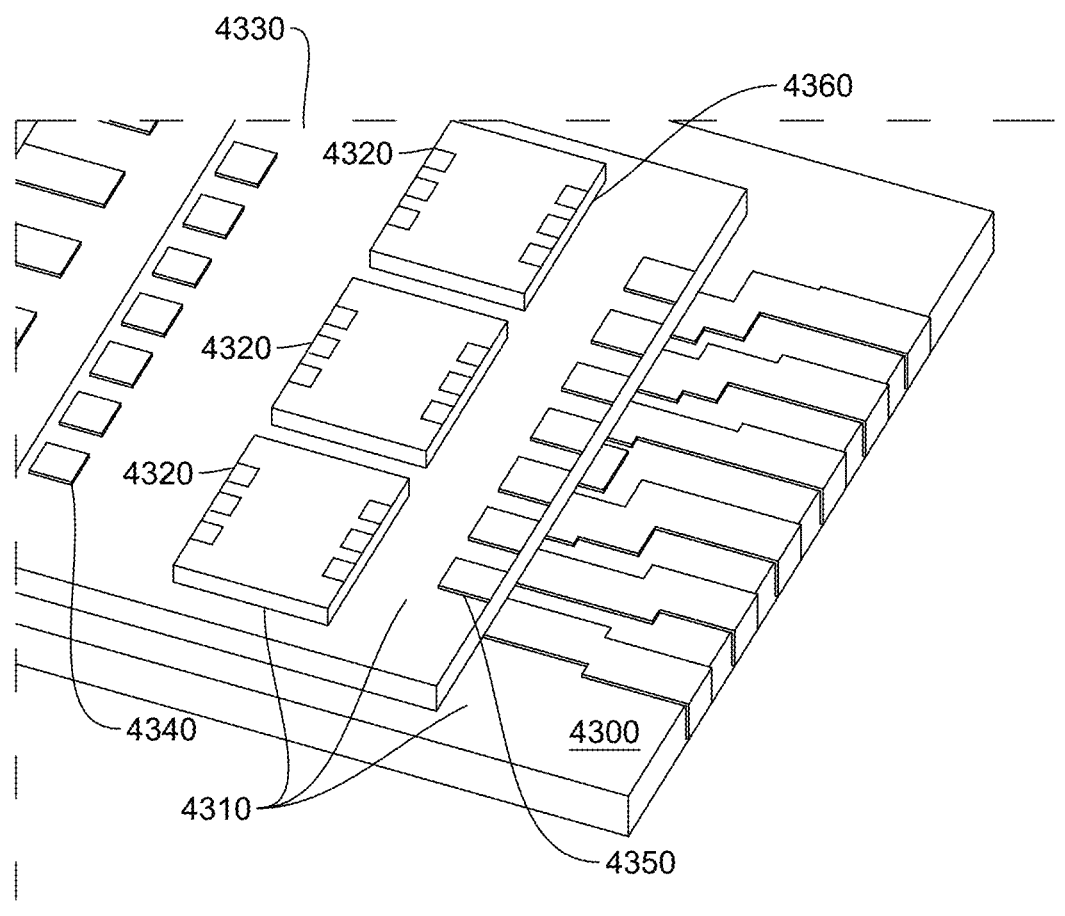

FIG. 128 illustrates an IC assembly 4300 using ELRI 4310 for connecting multiple MEMS circuits 4320 to create virtual multi-MEMS. The network of MEMS 4320 created by these interconnections can be designed. For example, some of the MEMS 4320 can be switches and some can be sensors exposed to varying environmental constraints. With ELRI 4310 connecting one MEMS to another with negligible parasitics, the integrated multi-MEMS would act as one MEMS with multiple and varying parameters or attributes.

As illustrated in FIG. 128, some implementations allow for MEMS 4320 to be implemented on an ASIC 4330 or other component. In the implementations shown in FIG. 128, ASIC 4330 has regular pads 4340 and extended pads 4350. In addition, IC assembly 4300 and/or ASIC 4330 can use ELRI 3D interconnects 4360 to interconnect some of the components.

Being able to design a virtual multi-MEMS device on an IC offers greater capability, which opens vast opportunities to sense the environment and respond electronically. Using the ELRI in accordance with various implementations of the invention in an IC product also synergistically favors utilizing other ELRI technologies such as, but not limited to, ELRI for connecting MEMS circuits to an analog circuit on an IC, ELRI for "3D" interconnects, and/or ELRI for power supply distribution on a mounting substrate.

In one or more implementations, ELRI can be used in passive components in a MEMS on a semiconductor IC or on a mounting substrate. For example, in some implementations, an ELRI material can be used to implement passive components and/or the conductive paths between the passive components and other circuits/components. The conductive paths allow for signals to propagate with negligible resistance and with a wave-front-delay time constant approaching zero. As a result, the use of the ELRI material significantly reduces the delay of signals and the drive current in their electrical interactions. Moreover, these ELRI passive components and connections can sometimes include MEMS elements, including ELRI as part of the MEMS structure.

Various implementations create advantages over traditional systems and in some cases render certain MEMS manufacturing processes practical which would otherwise not produce components within usable limits. For example, the extremely low resistance enables integrating the passive components to "virtual nodes," as the components don't exhibit the parasitic resistance of present art technology. As another example, ELRI passive components, especially when used with MEMS, can create near-ideal components otherwise not available for integrating with other conventional circuits on an IC or on a MEMS substrate (such as inductors or transformers). Also, capacitors and inductors can be connected to program the specific frequency and/or Q of transmitter and receiver circuits. Either analog or digital MEMS elements can be used. In one implementation, registers store bits to enable various capacitors of strategic values to program various capacitances as needed for achieving desired circuit attributes. In another implementation, capacitors of preset values are selectively connected to achieve desired circuit attributes.

In accordance with various implementations, ELRI routing can connect MEMS switches to passive components formed in ELRI material, with negligible parasitic resistance, creating near-ideal components for integrating with other conventional circuits on an IC or on a MEMS substrate. MEMS ELRI passive components can connect to trim the capacitance or inductance (such as to program the specific frequency and/or Q of transmitter and/or receiver circuits) with possibly the influence of environmental forces to which the MEMS is designed to respond. In some cases, ELRI passive component inductors could be formed as a transformer to perform as signal isolation.

Figure 129:
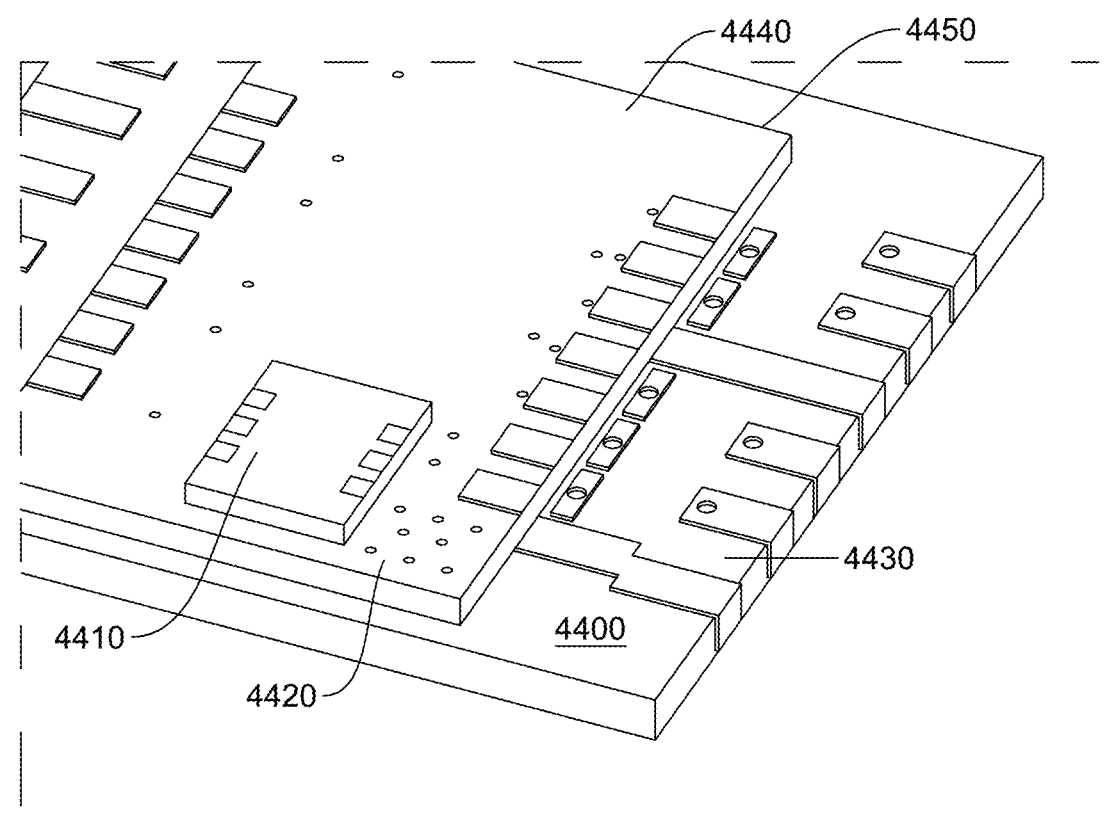

FIG. 129 shows an IC 4400 having a MEMS 4410 (possibly having ELRI passive components), a set of passive components 4420 implemented on a mounting substrate of the IC or a component, and one or more conductive paths 4430. In accordance with the implementations shown, the one or more conductive paths 4430 include an ELR having a first layer comprised of an ELR material and a second layer comprised of a modifying material bonded to the ELR material of the first layer. The set of passive components 4420 can be connected to the MEMS 4410 through the one or more conductive paths 4430. In one or more implementations, an ELR antenna 4440 and a spiral ELR inductor 4450 can be implemented on the IC.

In some implementations, a second set of ELRI passive components can be implemented on the IC or on the MEMS. The set of ELRI passive components can be programmable. For example, the components can be programmed to set a specific frequency or Q of a transmitter circuit or a receiver circuit. As another example, a register can be used to store bits and using MEMS to select various capacitors to achieve the specific frequency. In some cases, the passive components can include a switch and/or a sensor made of ELRI material.

Some implementations use a cooling system to dynamically program one or more MEMS and/or ELRI components. For example, a resistive ELRI component can be used to program a MEMS. As the cooling system decreases the temperature, the resistance in the ELRI element decreases, effectively turning off the element. Similarly, as the temperature is raised to the critical temperature of the ELRI segment, the resistance in the ELRI element increases thereby changing a state of the MEMS or programmable component.

In at least one implementation, a conductive path can have an ELR material with multiple layers. Each layer can have a specific (and possibly different) thickness. The modifying layer can be attached to the top layer resulting in more stiffness for the top layer. As the temperature changes, so will the conductive properties of the different layers. For example, the top layer will have the lowest resistance and will act as a superconductor or perfect conductor at higher temperatures than the other layers since the top layer is bonded directly to the modifying layer. As the temperature drops, subsequent layers will become less resistive and act more like superconductors or perfect conductors in the order of closeness to the modifying layer. As will be appreciated, the changes in the temperature change the conductive properties in the different layers and as a result will change the Jc and Hc of the ELRI.

The MEMS, in various implementations, can include one or more internal paths comprised of a first MEMS layer comprised of the ELR material and a second MEMS layer comprised of a modifying material bonded to the ELR material of the first MEMS layer. The MEMS can also be configured to sense one or more environmental parameters by using a pressure sensor, a temperature sensor, a light sensor, a vibration sensor, an accelerometer, a humidity sensor, an electric field sensor, and/or a sound sensor.

Various implementations also provide for a device having a power supply and an IC. The IC can have one or more conductive paths comprised of an ELRI having a first layer comprised of an ELR material and a second layer comprised of a modifying material bonded to the ELR material of the first layer. In addition, the IC can have a MEMS connected to a set of passive components through the one or more conductive paths. In some cases, the MEMS can include an RF circuit coupled to the RF antenna 4450 on the IC. The MEMS may also include one or more of a tunable transmission line, a waveguide, a resonator, a quasi-optical component, a tunable inductor, a tunable capacitor, and an electromechanical filter and/or other components as discussed above.

ELRI for passive components can be used with MEMS to create near-ideal components otherwise not available for integrating, where a network of passive components could be designed, some being switches, some MEMS being sensors exposed to varying environmental constraints. With ELRI connecting them with negligible parasitics, the integrated near-ideal components would act as extensions of the MEMS with multiple and varying parameters or attributes. Being able to design a virtual near-ideal Multi-MEMS device on an IC offers an order of magnitude greater capability, which opens vast opportunities to sense the environment and respond electronically.

Again, using this ELRI technology in an IC product synergistically favors utilizing other ELRI technologies. Examples include, but are not limited to, ELRI for connecting MEMS circuits to an analog circuit on an IC, ELRI for "3D" interconnects on an IC (which connects the IC to the mounting substrate), and ELRI for power supply distribution on an IC, or ELRI for Power Supply distribution on a mounting substrate. These and other ELRI technologies, can further improve the performance of the IC product.

Figure 130:
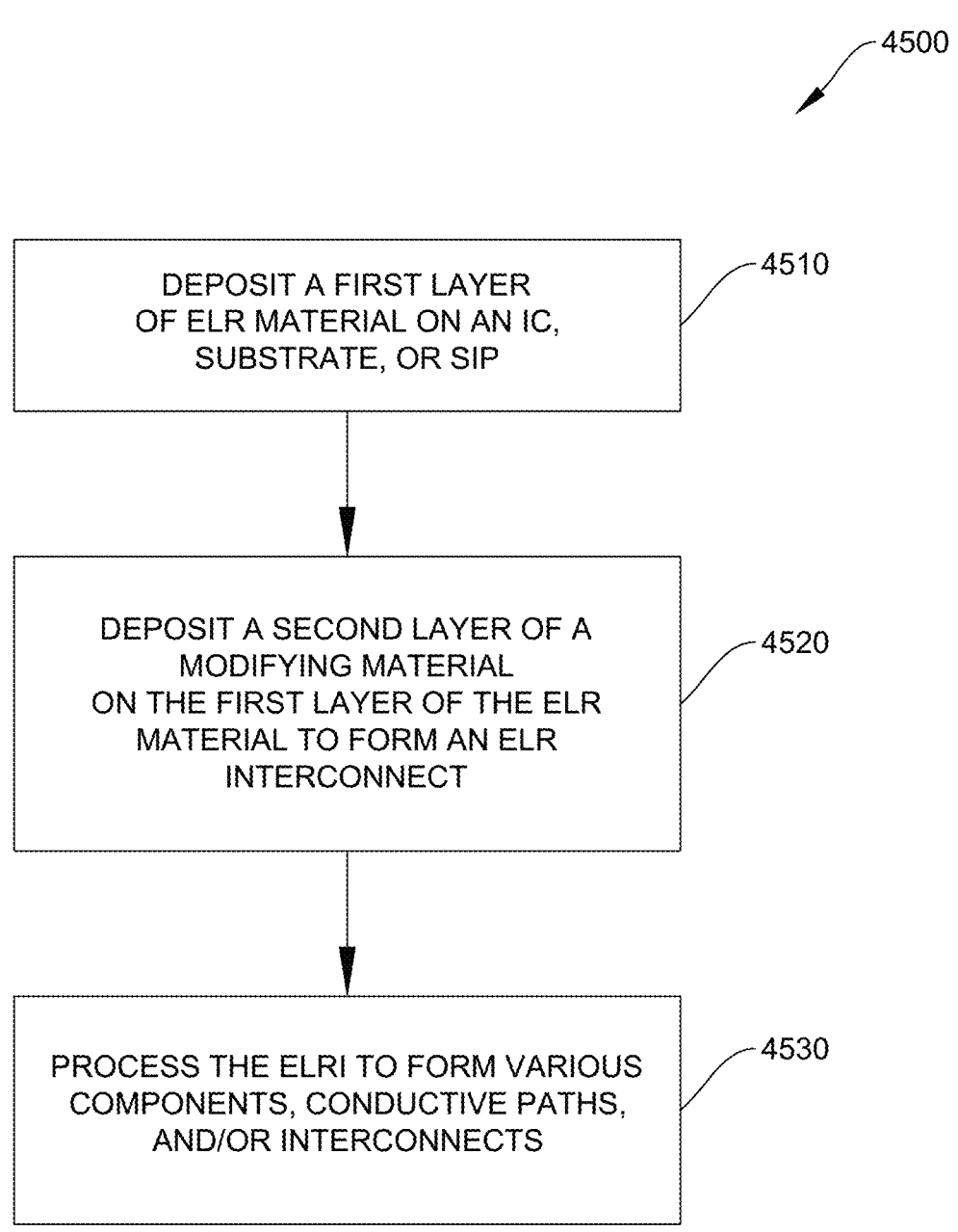

FIG. 130 is a flow chart 4500 showing a set of exemplary operations for manufacturing conductive paths, ELRI MEMS, and/or ELRI components on an IC. The ELRI can be manufactured based on the type of materials, the application of the ELRI, the size of the component employing the ELRI, the operational requirements of a device or machine employing the ELRI, and so on.

In the implementations shown in FIG. 130, a first depositing operation 4510 deposits a first layer of extremely low resistance (ELR) material on an IC, substrate, or SiP. In accordance with various implementations, the first layer can comprise YBCO or BSCCO. A second layer comprised of a modifying material on the first layer of the ELR material creating ELR interconnects is deposited during a second depositing operation 4520. The second layer can include chromium, copper, bismuth, cobalt, vanadium, titanium, rhodium, beryllium, gallium, silver or selenium. The material used as the first or base layer of an ELRI and/or the material used as a modifying layer of the ELRI may be selected based on various considerations and desired operating and/or manufacturing characteristics. Examples include, cost, performance objectives, equipment available, materials available, and/or other considerations and characteristics. Processing operation 4530 processes the ELR interconnects to form various components, conductive paths, and/or interconnects. For example, in some implementations, an ELRI MEMS, ELRI passive components, an ELRI RF antenna, a power distribution system, and/or a signal bus with one or more conductive paths capable of routing signals can be formed.

In addition to the systems, devices, and/or applications described herein, one skilled in the art will realize that other systems, devices, and application that include conductive paths may utilize the ELRIs described herein.
Part C—Integrated Circuit RF Devices This section of the description refers to FIGS. 1-36 and FIGS. 131-135; accordingly all reference numbers included in this section refer to elements found in such figures.

Various implementations of the invention generally relate to extremely low resistance interconnects (ELRI), such as interconnects that include modified, apertured, and/or other ELR materials. In some implementations, the ELRI can have a first layer comprised of an extremely low resistance (ELR) material and a second layer comprised of a modifying material bonded to the ELR material of the first layer. The ELRI can be used in a variety of systems and methods to create various improvements. Some examples where various efficiencies are created include, but are not limited to, systems and methods using ELRI in radio frequency (RF) circuits on an IC, systems and methods using ELRI for RF antenna (e) on a semiconductor IC, systems and methods for using ELRI in passive elements of RF transmitter and receiver circuits on a monolithic microwave IC (MMIC), and systems and methods using ELRI in embedded RF circuit functions on a semiconductor IC.

Some implementations provide for RF circuits on an IC that can use an ELRI material to implement the conductive paths for the RF circuits on the IC. The use of the ELRI material can result in a higher Q capability. As such, an IC using ELRI in the conductive paths can, depending on the desired application, require less active circuits and/or less semiconductor area for the various circuits. In some implementations, ELRI can be used to connect multiple individual blocks of RF circuits and/or other technologies, including other ELRI technologies.

In accordance with various implementations, ELRI material can be used to implement the conductive paths for RF antenna topologies on an IC. The resulting antenna topology can have an area less than conventional substrate topologies that do not use ELRI material. In addition, the RF antenna can be located in isolated locations without incurring the penalty of interconnect resistance, not necessarily having an off-chip interface, thereby yielding higher Q capability. As such, the RF antenna topologies resulting from the use of ELRI material in the conductive paths can use less active circuits and thus less semiconductor area for the various circuits.

In one or more implementations, ELRI can be used in passive elements of RF transmitter and receiver circuits on an MMIC. By using the ELRI material to implement passive elements and/or the conductive paths connecting RF circuits, the signals can propagate with a wave-front-delay time constant approaching zero. As a result, the delay of signals between the various functional elements can be virtually eliminated or significantly reduced. In some implementations, the ELRI material can form very high Q transmitter and receiver circuits.

In addition, various implementations of the invention provide for systems and methods using ELRI in embedded RF circuit functions on a semiconductor IC. In some of these implementations, the ELRI material can be used to implement the conductive paths for signals to propagate with a wave-front-delay time constant approaching zero. As a result, the delay of interface signals between the embedded RF circuit function(s) and the sub-systems enveloping the function(s), or between sub-system blocks connected to embedded function(s) can be significantly reduced or even eliminated. This makes these various blocks like virtual blocks, in the sense that each respective connecting signal seems to be touching its respective embedded node, so that it performs as the computer model indicates, with negligible parasitic variance, regardless of its actual physical location with respect to the embedded RF circuit function.

The ELRI can be manufactured based on the type of materials, the application of the ELRI, the size of the component employing the ELRI, the operational requirements of a device or machine employing the ELRI, and so on. As such, during the design and manufacturing, the material used as a base layer of an ELRI and/or the material used as a modifying layer of the ELRI may be selected based on various considerations and desired operating and/or manufacturing characteristics.

While various suitable geometries and configurations are shown and described herein for the layout and/or disposition of the modified ELR, numerous other geometries are possible. These other geometries include different patterns, configurations or layouts with respect to length and/or width in addition to differences in thickness of materials, use of different layers, ELR films having multiple adjacent modifying layers, multiple ELR films modified by a single modifying layer, and other three-dimensional structures. Thus any suitable modified ELR can be used depending upon the desired application and/or properties.

In accordance with various implementations of the invention, ELR RF circuits and/or antennas can be implemented on an IC. The RF circuits and/or antennas can use ELRI material, such as modified, apertured, and/or other new ELR material, to implement the conductive paths that connect the RF circuitry to the antennas and the conductive paths that are within the RF circuitry and/or the antennas. The use of the ELRI material can have many advantages over traditional interconnect material that can be appreciated by one of ordinary skill in the art.

While various examples of the invention are described with reference to "modified ELR materials" and/or various configurations of modified ELR materials (e.g., modified ELR films, etc.), it will be appreciated that any of the improved ELR materials described herein may be used, including, for example, modified ELR materials (e.g., modified ELR material 1060, etc.), apertured ELR materials, and/or other new ELR materials in accordance with various aspects of the invention. As described herein, among other aspects, these improved ELR materials have at least one improved operating characteristic, which in some examples includes operating in an ELR state at temperatures greater than 150 K.

For example, by using ELRI the RF antenna can be located in isolated locations without incurring the penalty of interconnect resistance, not necessarily having an off-chip interface, thereby yielding higher Q capability. As such, the RF antenna topologies resulting from the use of ELRI material in the conductive paths can require less active circuits and thus less semiconductor area for the various circuits. In some implementations, ELRI can be used to connect multiple individual blocks of RF circuits and/or other technologies, including other ELRI technologies. Moreover, because ELRI produces extremely low losses, RF antenna architectures and circuitry can be devised and implemented that would otherwise be impractical on an IC, and can even significantly reduce the active circuit amplification and filtering.

As another example, the use of ELRI also enables the IC design to dispose an RF antenna more closely to RF circuitry on the IC with improved conductive interconnects. This tends to result in lower parasitic losses yielding higher Q, such that design requirements can be simplified, e.g., avoiding special semiconductor processes and off package design. In addition, new RF products could be developed that were not feasible with prior art technology, such as single chip RF transceivers with much higher Q. This could, e.g., allow handheld instruments to address a large number of separate channels.

Figure 131:
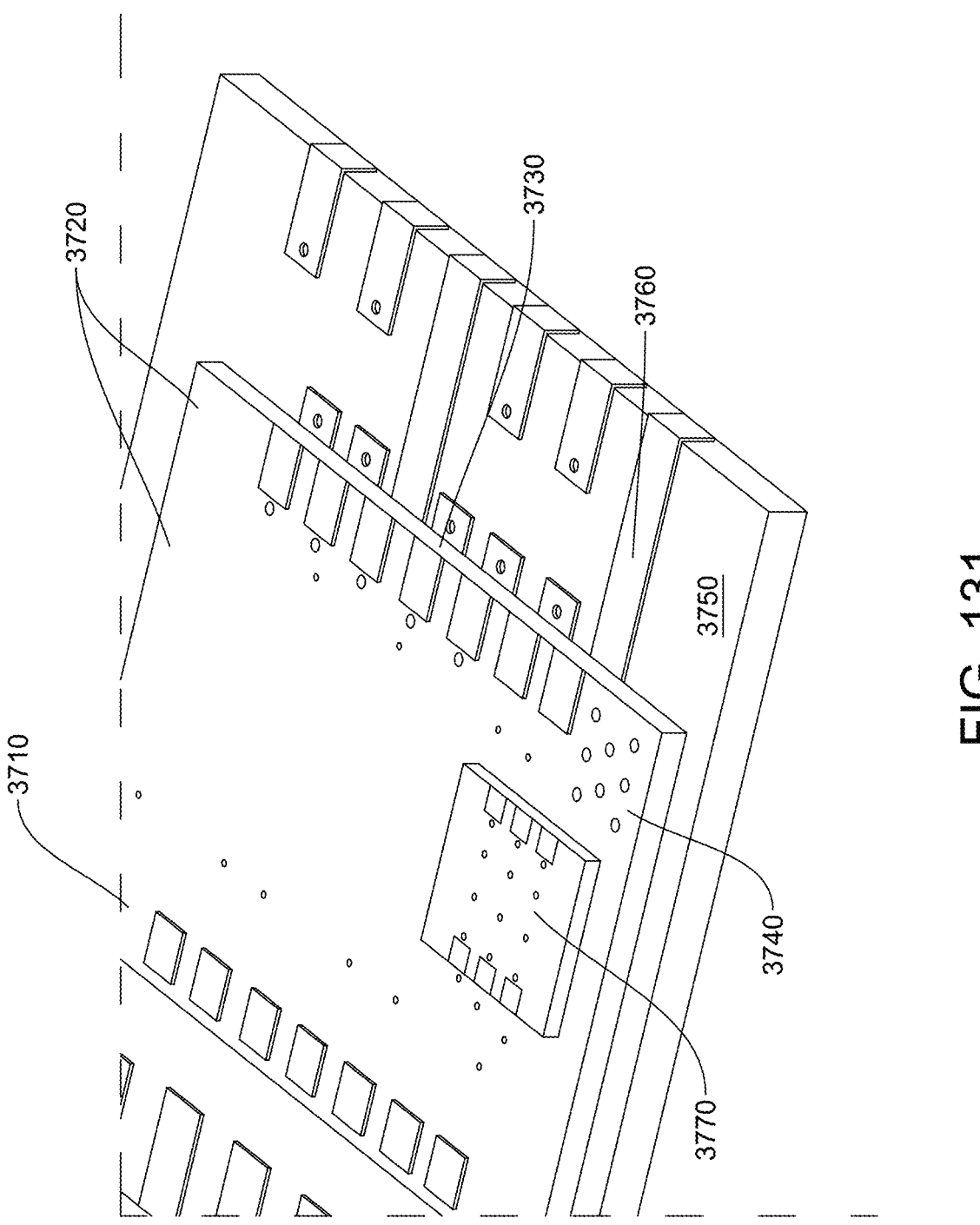
FIGS. 131 to 135 illustrate the forming of integrated circuit RF devices using ELR materials.

FIG. 131 illustrates the use of ELRI materials implementing the conductive paths for RF circuits on an IC 3710. In traditional integrated circuits, the RF circuitry is implemented off the chip from controller functions because of isolation requirements imposing special, more costly semiconductor processes. These processes, however, are often not cost effective for implementing the digital circuitry such as controller functions. In contrast, with ELRI connecting the RF antennas 3720 directly to the RF circuits, less parasitic losses are encountered, so RF circuitry can be implemented on the IC 3710 of the same chip with the digital circuitry without the need for special isolation or other more costly semiconductor processes.

In accordance with various implementations of the invention, when an ELRI material is used to implement the conductive paths 3730 and/or 3760 for RF circuits on IC 3710, a higher Q capability can result when compared to traditional circuits that do not use ELRI materials. In some implementations, ELRI can be used to connect individual blocks of the RF circuits as well as other technologies, including other ELRI technologies. As such, the RF circuits resulting from the use of ELRI material in the conductive paths can use less active circuits and possibly less semiconductor area for various circuits. In some implementations, RF circuits can be implemented on microprocessors, microcomputers, microcontrollers, digital signal processors (DSPs), systems on chips (SoC), disk drive controllers, ASICs, ASSPs, FPGAs, and/or any other semiconductor IC in various systems such as Bluetooth®, wireless USB, Wi-Fi, or other RF transceiver interfaces. According to certain aspects, using ELR as power and ground planes would reduce the noise coupling from digital to analog circuits.

As illustrated in FIG. 131, some implementations of the invention provide for an IC 3710 comprising an IC mounting substrate, an RF antenna 3720, and an RF circuit. The IC mounting substrate can have multiple layers and one or more conductive paths 3730 for signal routing. The one or more conductive paths 3730 can be made of a modified extremely low resistance interconnect (ELRI) having a first layer comprised of an extremely low resistance (ELR) material. In addition, the one or more conductive paths 3730 can also have a second layer comprised of a modifying material bonded to the ELR material of the first layer. Of course, the modified ELRI can take on any suitable formation or geometry.

In traditional integrated circuits, the RF antenna is implemented off the chip from controller functions because of parasitic losses. In contrast, with ELRI connecting the RF circuits directly to the RF antenna 3720, less parasitic losses tend to result, so that RF antenna 3720 can be implemented on the same chip with the RF circuits and digital circuitry of common devices.

Various implementations of the invention can produce one or more advantages which can be appreciated by one of ordinary skill in the art. For example, as just discussed, the use of ELRI can provide conductive capabilities that reduce or eliminate the penalty of parasitic losses due (e.g., due to interconnect resistance). As another example, because ELRI produces extremely low losses, RF circuitry can be devised and implemented that would be more cost effective and would otherwise be impractical. New RF products could also be developed that were not feasible with prior art technology, such as single chip RF transceivers with much higher Q, allowing handheld instruments to address a large number of separate channels. Certain implementations provide higher power efficiency due to reduced resistance losses. Some implementations will demonstrate increased sensitivity to analog and digital signals. There is the possibility of increased flexibility in placing system feature design elements. Further implementations will demonstrate increased signal fidelity. Still further implementations can show improved coordination between elements and increased information density within allocated band. Still other implementations enable new types of software and hardware logic that can be implemented on the ICs, or selective signal interference shielding.

Figure 132:
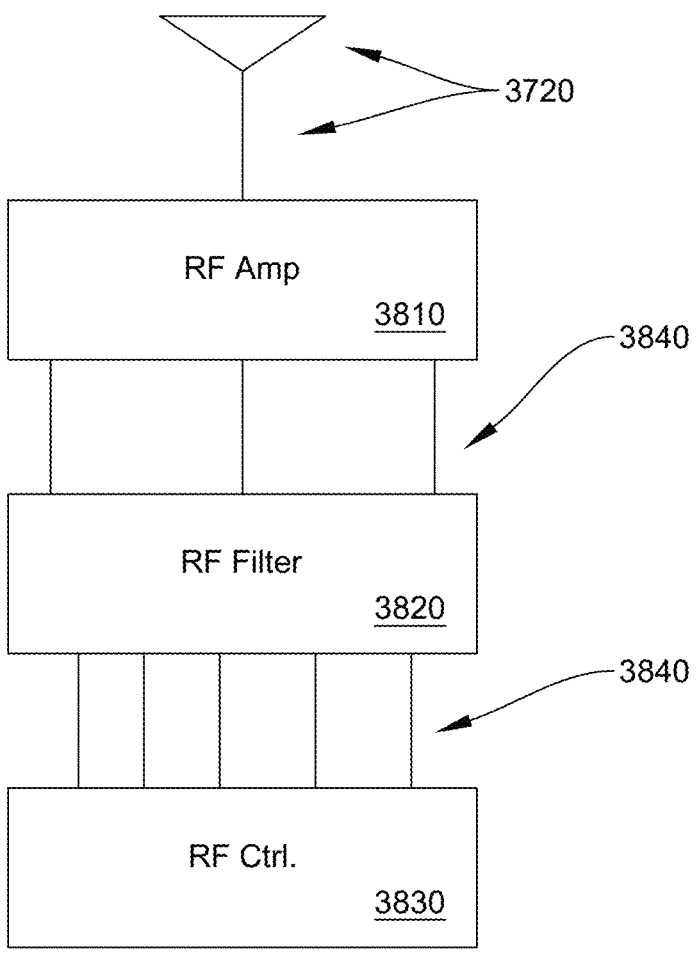
Figure 133:
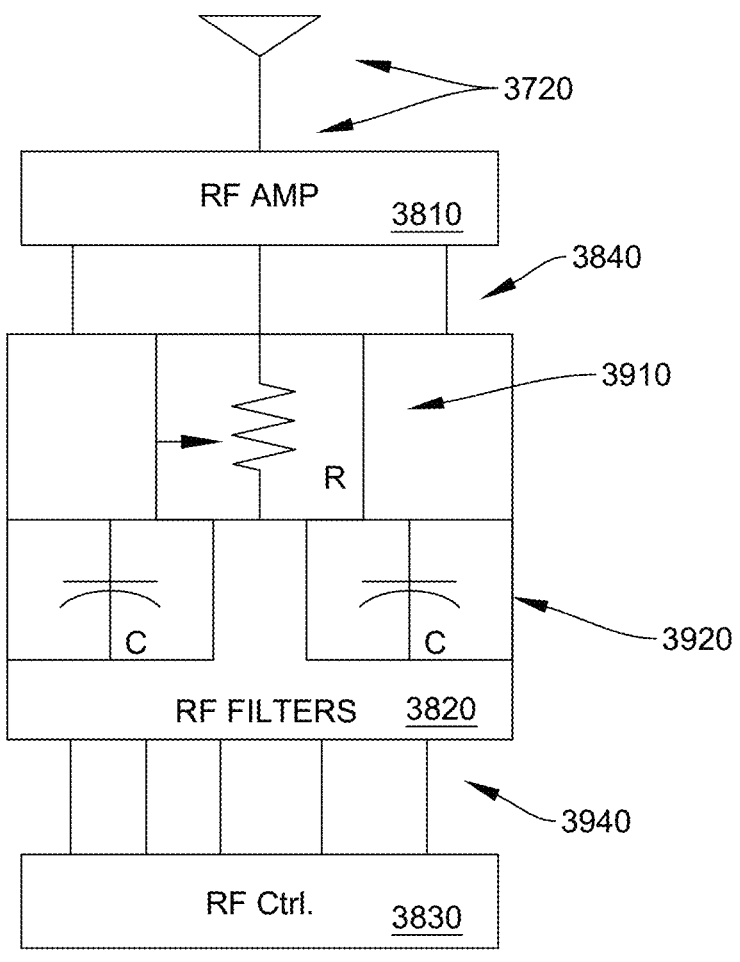
Figure 134:
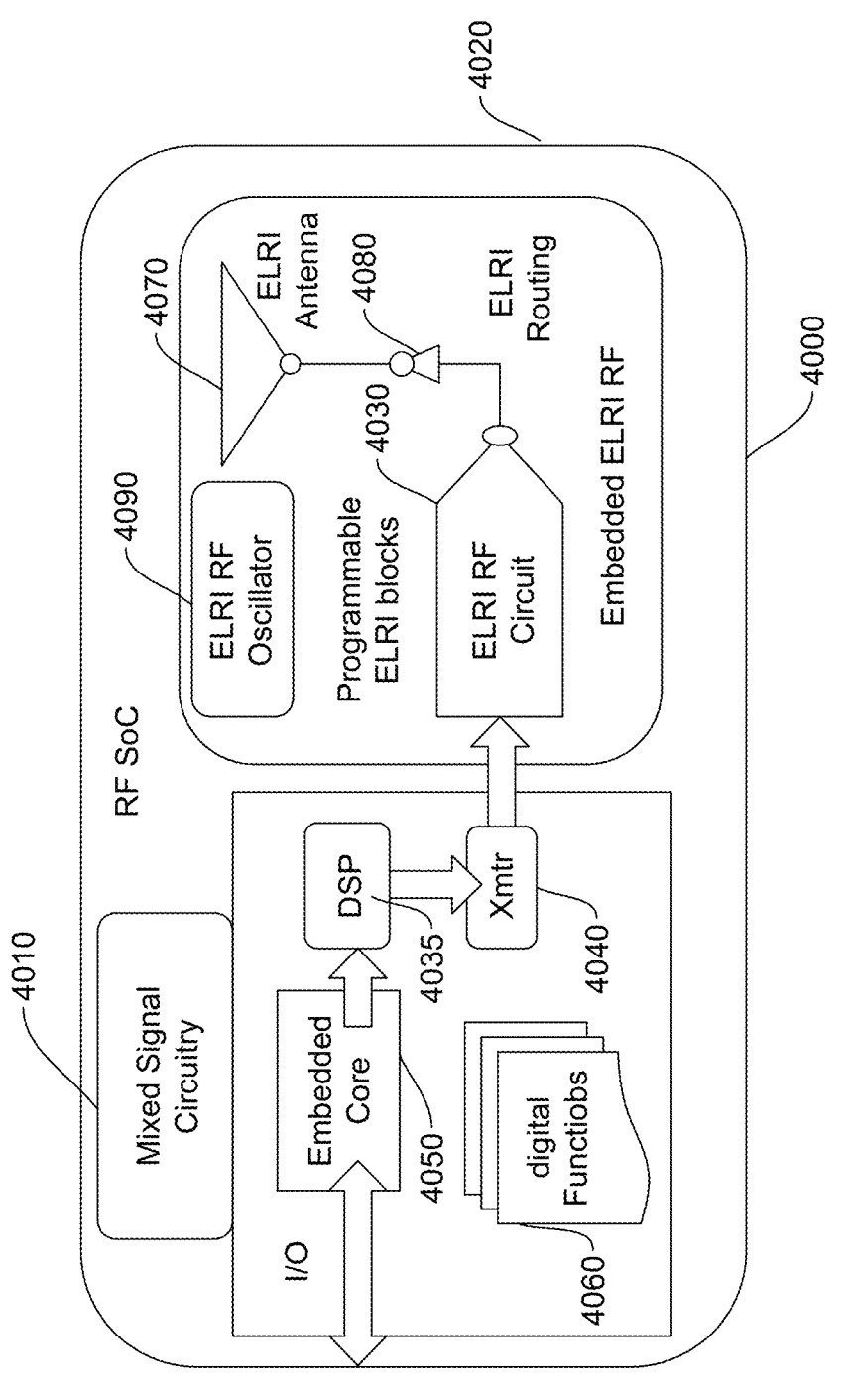

Some implementations of the invention include an integrated circuit (IC) 3710 having RF components that can be implemented on the IC or the IC mounting substrate. The RF component can include subcircuits. As shown in FIG. 132, the subcircuits can include an RF amplifier 3810, an RF filter 3820, and an RF controller 3830 (and other subcircuits) interconnected through one or more conductive paths 3840 that include a modified ELRI having a first layer comprised of an ELR material and a second layer comprised of a modifying material bonded to the ELR material of the first layer. In accordance with various implementations, the first layer can include YBCO or BSCCO. The second layer can include chromium, copper, bismuth, cobalt, vanadium, titanium, rhodium, beryllium, gallium, or selenium. The interconnect can be comprised of multiple levels/layers of interconnect, some of which would ideally be composed of modified ELRI (or otherwise traditional metal), each being insulated from other adjacent levels by a dielectric through which conductive vias are selectively placed to connect respective, continuous, conductive paths.

In some implementations, the RF component and RF antenna 3720 can be implemented on the same chip. For example, the IC mounting substrate can also include an RF antenna 3720 comprised of a first layer of the antenna comprised of ELR material and a second layer of the antenna comprised of modifying material bonded to the ELR material of the first antenna layer. As a result, the RF component does not require isolation through implementation on a separate chip.

In some implementations, a wireless device can be implemented including a power supply, a set of digital circuitry, and/or an RF transceiver utilizing ELRI technology. The wireless device can be any device or handheld transceiver that may use an RF transceiver or circuitry. Examples include, but are not limited to, a Wi-Fi device, a spread spectrum device, cell phones, wireless phones, a wireless USB device, a Bluetooth® device, a set of wireless earphones, a hearing aid, a medical transponder, a secure garage door opener, a radio frequency identification (RFID) tag, a remote security controller capable of adjusting a thermostat, or any security-conscious household, commercial, or industrial device within a property, a handheld computer interface, an automobile key transmitter, an RF interface security device, audio/video transceivers, and many others. The interfaced security devices can include universal remote security controllers to control property security (secure garage door opener, security alarm set/reset/inquiry, thermostat programming, general electrical control, etc.) and automobile key transmitters. In addition, the wireless device can be a handheld transceiver for special applications, like meter reading and inventory inquiries with special RFID tags, handheld computer interfaces (Bluetooth® program actuator and data transceiver) and the like.

The wireless devices which use the ELRI for RF circuitry can include a variety of improvements. For example, spread spectrum devices can be built with orders of magnitude more individual channels (e.g., 100 or more individual channels). In addition, cell phones, wireless phones, Bluetooth® devices, tablet and other computers, and other Wi-Fi devices will have greater reception/distance. In some cases, the reception/distance can be approximately an order of magnitude higher than the reception/distance available with traditional technology.

In some implementations, the RF transceiver can be coupled to the power supply and the set of digital circuitry. In some cases, the RF transceiver can be located on the same chip as the digital circuitry. The RF transceiver can include an RF antenna 3720 coupled to the RF circuit. In accordance with various implementations of the invention, the RF circuit can include one or more subcircuits interconnected through one or more conductive paths 3730 and/or 3760 comprising a modified ELRI having a first layer comprised of an ELR material and a second layer comprised of a modifying material bonded to the ELR material of the first layer. In at least one implementation, the RF antenna 3720 can include a first ELR layer of the RF antenna comprised of ELR material and a second ELR layer of the RF antenna comprised of modifying material bonded to the ELR material of the first ELR antenna layer.

In present technology, monolithic microwave integrated circuits (MMICs) are only at the MSI & LSI levels of integration, because of the need to go off chip for passive devices capable of the higher frequencies. And, up to now, the cost of the semiconductor technology required for transistors capable of microwave frequencies has not been conducive to products requiring VLSI. In one or more implementations of the invention, ELRI can be used in passive elements of RF transmitter and receiver circuitry on an MMIC. By using the ELRI, MMICs can be created that integrate all functions on the same chip (e.g., the MMIC does not include off chip passive devices or interfaces) thereby transforming its capabilities. In some implementations, the MMIC can include a microprocessor, a microcomputer, a microcontroller, a DSP, a system on chip (SoC), a Disk Drive Controller, an ASIC, an ASSP, and/or an FPGA.

By using the ELRI material to implement passive elements and/or the conductive paths connecting RF circuits, the signals can propagate with a wave-front-delay time constant approaching zero. As a result, the delay of signals between the various functional elements can be eliminated or significantly reduced. In some implementations, the ELRI material used in the passive elements 3740 form very high Q transmitter and receiver circuits. ELRI for passive elements of high RF transmitter and receiver circuits will supply the passive elements, and the negligible resistance of the interconnect will enable microwave frequency circuits to create the capability of VLSI. Since all the RF circuits can be done on the MMIC, going one more step—an added microcontroller or DSP, in the same process, can transform its capability.

The very high-Q amplification (VHQA) that can be created by the use of the ELRI can enable transmission with much lower power, and much narrower bands at very high frequencies. This level of VHQA can be used in walky-talkies for personal communication in consumer products (in the 2.4 GHz range), in military usage in various bands up to and beyond 100 GHZ, and in frequency hopping. In other implementations, the systems and methods can also be used for new metering and security data transmission, such as security sensor detections, and also in RADAR. In addition, very high frequency transceivers can be created for industrial and medical data transmission and controls in new high frequency bands.

Using this ELRI technology in an IC product synergistically favors utilizing other ELRI technologies. Examples include MEMS ELRI technologies such as ELRI for connecting MEMS circuits 3770 to an analog circuit on an IC 3710, ELRI for power supply distribution on an IC 3710, ELRI for 3D interconnects 3730 on an IC (which connects the IC to the mounting substrate 3750, through ELRI "3D" Interconnect 3730 on package 3750), and even ELRI for power supply distribution on a mounting substrate, all of which further improves the development of all ELRI technologies and especially improves the excellent performance of the RFIC product(s).

Various implementations of the invention provide for a MMIC made from a Monolithic semiconductor (e.g., silicon, GaAs, SiGe, GaN, SOS, SOI, etc.) or a multiple semiconductor monolithically constructed through "3 D" stacking or other novel manufacturing method, including MEMS on IC 3770 and/or MEMS on IC mounting substrate or SiP. The MMIC can include a set of ELRIs, an RF filter 3820 with one or more passive elements (e.g., laser programmable ELRI resistors 3910, and ELRI capacitors 3920 and 3740, an RF Oscillator 4090, an RF amplifier 3810, an RF controller 3830, and/or an RF antenna 3720, and other RF blocks 4030 and support blocks. The ELRIs, according to some implementations, can have a first layer comprised of an ELR material and a second layer comprised of a modifying material bonded to the ELR material of the first layer. In some implementations, the RF amplifier can be connected to the RF filter by the ELRIs. Similarly, the RF antenna 3720 can be connected to the RF amplifier 3810 by the ELRIs 3840, and the RF controller 3830 can be connect to the RF filter 3820 by ELRIs 3840.

In some implementations, the RF antenna 3720 has one or more conductive paths, in one or more levels of interconnect, that include a modified antenna ELRI having a first antenna layer comprised of ELR material (e.g., YBCO or BSCCO) and a second antenna layer comprised of modifying material (e.g., chromium, copper, bismuth, cobalt, vanadium, titanium, rhodium, beryllium, gallium, or selenium) bonded to the ELR material of the first antenna layer. In addition, the RF antenna 3720 may not require isolation from an RF controller 3830 through implementation on a separate chip.

The MMIC can be configured in various implementations to provide high frequency switching, microwave mixing, low noise amplification, or power amplification. The MMIC can also be configured to operate at microwave frequencies between, and including, 300 MHz and 300 GHz. In at least one implementation, the MMIC can operate at analog frequencies above 400 MHZ. In some implementations, the MMIC can be part of a wireless device, such as those discussed above.

Traditional technology uses interconnects that are usually formed from Aluminum or Copper based metal. Unfortunately, these interconnects have parasitic resistance that limits the location of the embedded functions to such degree that timing becomes critical and in many cases prohibits some multiple functions, among other things. Moreover, because of the proliferation of parasitic resistance, loading embedded programs or parameter settings can be impaired or limited by the addition of even more resistance in the facilitation circuitry and therefore embedded RF functions are generally not offered. In contrast, various implementations of the invention provide for systems and methods using ELRI in embedded RF circuit functions on a semiconductor IC 3710. The use of ELRI reduces or eliminates the limitations found with the use of the traditional technology and enhances the implementation of RF circuits on an IC 3710.

In some of these implementations, the ELRI material can be used to implement the conductive paths for signals to propagate with a wave-front-delay time constant approaching zero. As a result, the delay of interface signals between the embedded RF circuit function(s) and the sub-systems enveloping the function(s), or between sub-system blocks connected to embedded function(s) can be significantly reduced or virtually eliminated. This makes these various blocks like virtual blocks, in the sense that each respective connecting signal seems to be touching its respective embedded node, so that it performs as the computer model indicates, with negligible parasitic variance, regardless of its actual physical location with respect to the embedded RF circuit function. In some implementations, the embedded RF circuit functions could be implemented on embedded microprocessors, microcomputers, microcontrollers, DSPs, SoC, ASICs, ASSPs, FPGAS, and any semiconductor IC with embedded functions of same or varying types.

Various implementations of the invention can provide one or more benefits. For example, by using ELRI routing in embedded RF function IC design, higher speed circuitry can be created, without significant skews between global signals, without the power lost due to buffering requirements in the present art. In addition, design companies with sparse RF design experience could add RF circuits to their SoC. Moreover, many present RF function IC products could be redesigned to embed ELRI RF functions and achieve higher performance as well as lower power usage (e.g., operating voltage around, or less than, 0.25 Volts, and very low quiescent current in their Operational Amplifiers).

In some cases, embedded functions could be placed in locations on the IC that are more convenient to all aspects of the design. As a result, the development and design of the embedded RF functions could be less restrained, without requiring different customized interface buffers normally (in traditional technology) depending on most parasitic aspects of the enveloping SoC. Moreover, independent placement allowed by ELRI allows better "Con-current Engineering" in SoC development, since embedded functions could be designed more independently and solutions from a variety of sources could be more easily embedded. In some implementations, the embedded RF functions can become "Place & Route" cells, with accompanying embedded tool package (especially for design companies with sparse RF design experience).

In some instances, the decision to use ELRI for embedded RF circuits would favor the decision to use other applicable ELRI technologies. Examples include, but are not limited to ELRI for power supply distribution, ELRI for clock routing, or ELRI for SoC routing on an IC and to connect to the substrate, ELRI for 3D interconnects on an IC, ELRI for RF antenna on a mounting substrate, and/or others. Various cost functions can be utilized by designers to select the appropriate combinations to complete the RF product optimization.

Some implementations provide for an IC 3710 having an IC substrate, a set of circuitry 4010 (e.g., analog or digital circuitry) implemented on the IC substrate, and/or one or more programmable blocks 4020. The IC substrate can have one or more conductive paths in one or more layers of the substrate. The conductive paths can be comprised of an extremely low resistance interconnect (ELRI) having a first layer comprised of an extremely low resistance (ELR) material and a second layer comprised of a modifying material bonded to the ELR material of the first layer. A first programmable block can be connected to the set of circuitry through the one or more conductive paths. The first programmable block may include one or more components implemented on the substrate such as, but not limited to, a digital signal processor (DSP) 4035, an RF transmitter 4040 coupled to the DSP 4035; and/or an embedded core 4050 implemented on the IC substrate.

In accordance with some implementations, the embedded core 4050 can be programmable to perform one or more functions 4060. In various implementations, the embedded core 4050 can be a microprocessor, a microcomputer, a microcontroller, a GPU, a Data Flow Processor, or a DSP.

A set of programmable ELRI blocks comprising components (e.g., ELRI RF circuit 4070, ELRI RF antenna 4070, ELRI routing 4080, ELRI RF amplifier, an ELRI RF filter, an ELRI RF controller, etc) made from the ELRI can also be implemented on the IC substrate. Depending on the desired application, the ELRI blocks could be programmable at the design level, or field programmable, or programmable in software after the system is running. In some implementations, the IC with the embedded functions 4060 can be part of a wireless device, such as those discussed above.

Figure 135:
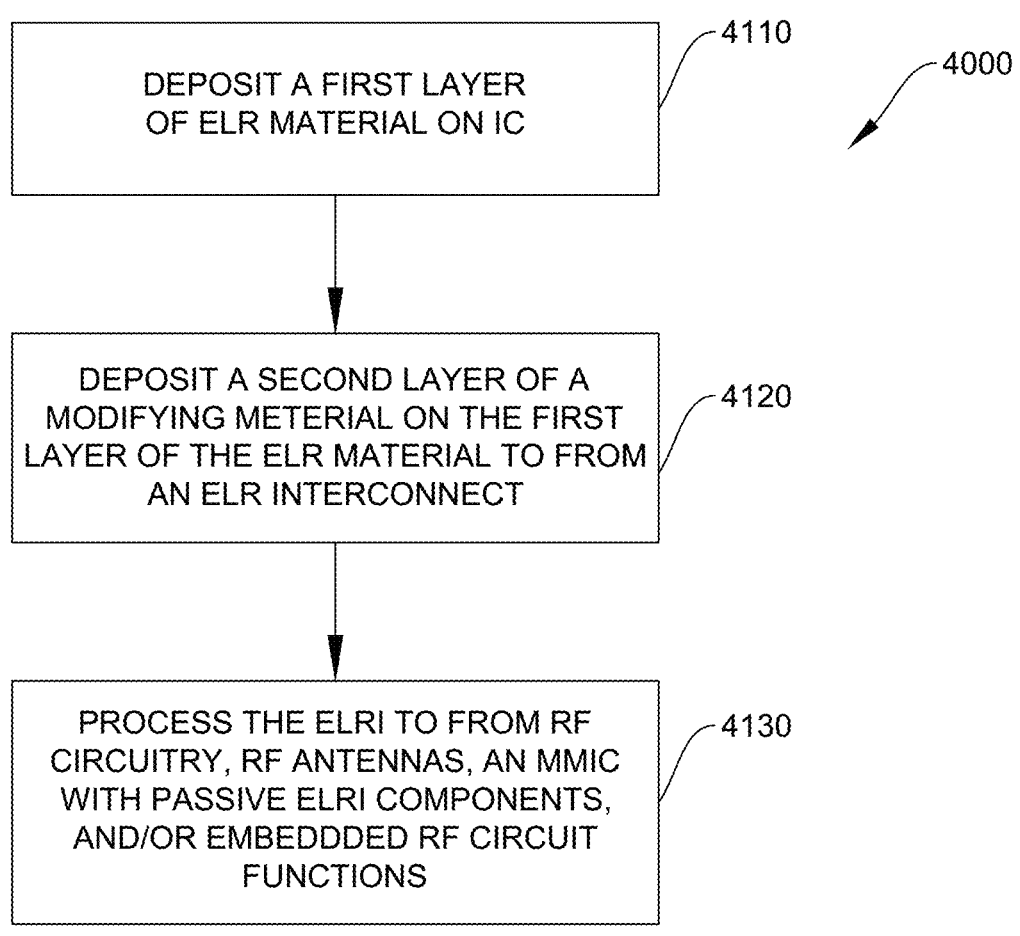

FIG. 135 is a flow chart 4100 showing a set of exemplary operations for manufacturing RF circuitry, RF antennas, an MMIC with passive ELRI components, and/or embedded RF circuit functions using ERLI on an IC. The ELRI can be manufactured based on the type of materials, the application of the ELRI, the size of the component employing the ELRI, the operational requirements of a device or machine employing the ELRI, and so on.

In the implementations shown in FIG. 135, a first depositing operation 4110 deposits a first layer of extremely low resistance (ELR) material on an IC. In accordance with various implementations, the first layer can comprise YBCO or BSCCO. A second layer comprised of a modifying material on the first layer of the ELR material, creating ELR interconnects is deposited during a second depositing operation 4120. The second layer can include chromium, copper, bismuth, cobalt, vanadium, titanium, rhodium, beryllium, gallium, silver or selenium. The material used as the first or base layer of an ELRI and/or the material used as a modifying layer of the ELRI may be selected based on various considerations and desired operating and/or manufacturing characteristics. Examples include, cost, performance objectives, equipment available, materials available, and/or other considerations and characteristics. Processing operation 4130 processes the ELR interconnects to form an RF antenna, a power distribution system, and/or a signal bus with one or more conductive paths capable of routing signals on the substrate.

In addition to the systems, devices, and/or applications described herein, one skilled in the art will realize that other systems, devices, and applications that include conductive paths may utilize the ELRIs described herein.

Part D—Integrated Circuit Routing

This section of the description refers to FIGS. 1-36 and FIGS. 136-144; accordingly all reference numbers included in this section refer to elements found in such figures.

Integrated circuit components, such as power distribution networks, clock distribution networks, and other signal distribution networks, that are formed of modified, apertured, and/or other new extremely low resistance (ELR) materials, are described. ELR material can be, for example, a film, a tape, a foil, or a nanowire. The ELR materials provide extremely low resistances to current at temperatures higher than temperatures normally associated with current high temperature superconductors (HTS), enhancing the operational characteristics of the integrated circuits at these higher temperatures, among other benefits. While various examples of the invention are described with reference to "modified ELR materials" and/or various configurations of modified ELR materials (e.g., modified ELR films, etc.), it will be appreciated that any of the improved ELR materials described herein may be used, including, for example, modified ELR materials (e.g., modified ELR material 1060, etc.), apertured ELR materials, and/or other new ELR materials in accordance with various aspects of the invention. As described herein, among other aspects, these improved ELR materials have at least one improved operating characteristic which in some examples, includes operating in an ELR state at temperatures greater than 150 K.

Figure 136:
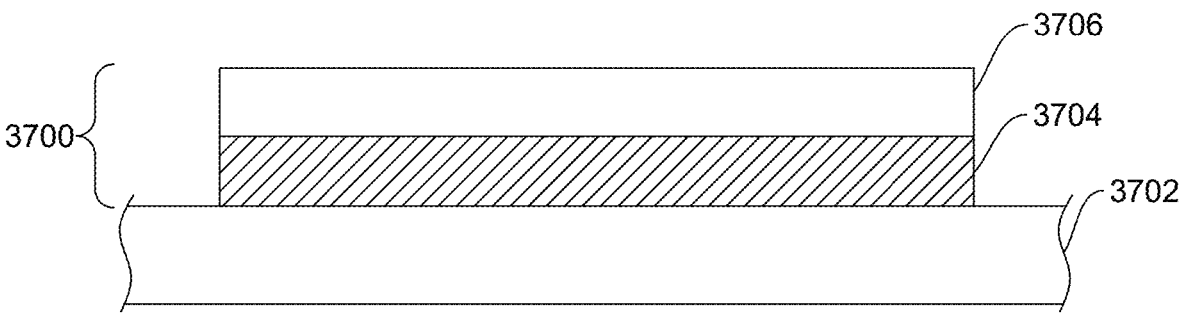
FIGS. 136 to 144 illustrate the forming of integrated circuit routing components and devices using ELR materials.

FIG. 136 is a schematic diagram illustrating a cut-away view of a conductive path 3700 formed, at least in part, of a modified ELR film, such as a film having an ELR material base layer 3704 and a modifying layer 3706 formed on the base layer 3704. Various suitable modified ELR films are described in detail herein. As will be appreciated, the modified ELR film could have more than one ELR material layer, and/or more than one modifying layer, or can take on any other suitable configuration or geometry. Such a conductive path, when implemented in an integrated circuit, in multiple levels of interconnect, insulated between themselves except for particular connecting vias designed to respectively connect each of the continuous conducting paths, using the levels to arrange convenient density and connectivity, which can be used, for example, for distributing power and propagating signals between circuit components in microprocessors, microcomputers, microcontrollers, digital signal processors, SoCs, disk drive controllers, memories, ASICs, ASSPs, FPGAs, or practically any other semiconductor integrated circuit that can be made compatible with modified ELR films.

As shown in the example of FIG. 136, the conductive path includes an ELR material base layer 3704 and a modifying layer 3706 formed, through any suitable process, on the base layer 3704. The conductive path can be formed on a substrate 3702, for example, the dielectric substrate of an integrated circuit. Being formed of a modified ELR film, the conductive path 3700 provides little or no resistance to the flow of current in the conductive path under suitable circumstances, such as at temperatures higher than those used in conventional HTS materials, such as room or ambient temperatures (~21 C).

The material or dimensions of the substrate 3702 may be selected based on a variety of factors. For example, selecting a substrate material having a higher dielectric constant will generally reduce capacitance seen by a transmission line, and thus decrease the power necessary to drive a signal. One skilled in the art will appreciate the substrate may be formed of a number of different materials and into a number of different shapes in order to achieve certain desired properties and/or operating characteristics.

In some examples, the modified ELR conductive path provides extremely low resistance to the flow of current at temperatures between the transition temperatures of conventional HTS materials (~80 to 135 K) and room temperatures (~294 K). In these examples, the conductive path may include a cooling system (not shown), such as a cryocooler or cryostat, used to cool the conductive path 3700 to a critical temperature for the type of modified ELR film utilized for the conductive path 3700. For example, the cooling system may be a system capable of cooling the conductive path to a temperature similar to that of liquid Freon, to a temperature similar to that of frozen water, or other temperatures discussed herein. That is, the cooling system may be selected based on the type and structure of the modified ELR film utilized for the conductive path 3700.

Figure 137:
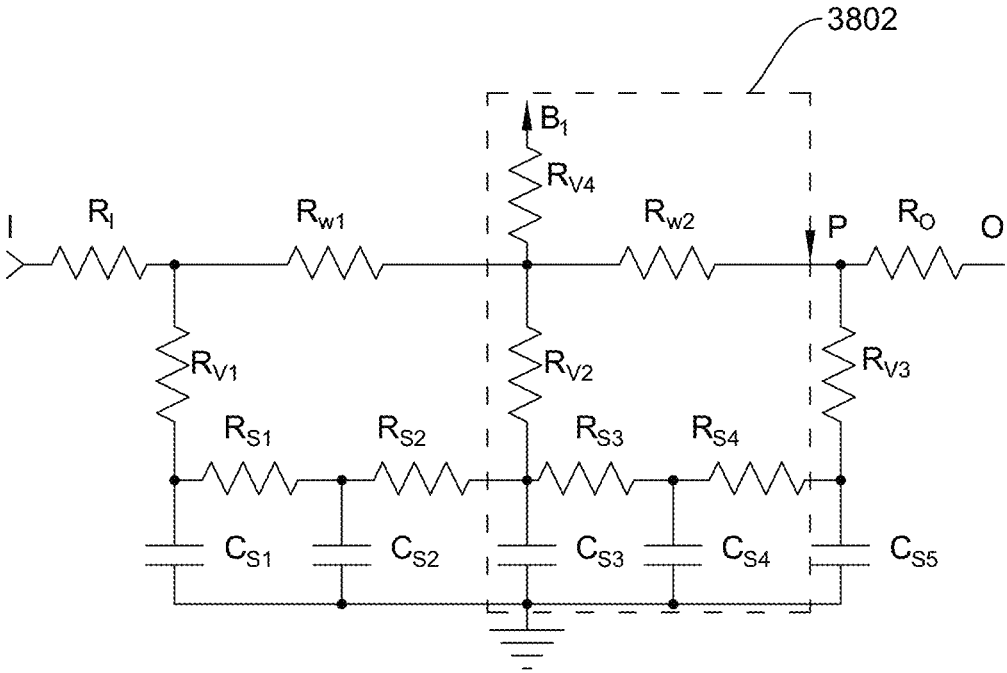

FIG. 137 is a diagram, which represents an example model of a conductive path formed from a modified ELR film. In some examples, the model includes an input "I" and an output "O." $R_I$ and $R_O$ correspond to the respective resistances of the connecting materials on the input and output end of conducting path formed from the modified ELR film. $R_{V1}$, $R_{V2}$, $R_{V3}$, and $R_{V4}$ correspond to resistances of vias and/or other connections of the outer skin to the conducting path. $R_{W1}$ and $R_{W2}$ correspond to the resistances of the internal path of the modified ELR film. $R_{S1}$-$R_{S4}$, and $C_{S1}$-$C_{S5}$ correspond to the transmission line model of the outer skin of the conducting path. The elements encompassed by the dashed line 3802 can be serially duplicated at position P for each via (or other connection) on the conducting path. The example of FIG. 137 shows a branch $B_1$ which connects to a conductive via (represented by $R_{V4}$) and the output O destination series path. In some examples, the model can include more elements including inductors.

Due to the extremely low resistance of a conductive path formed from a modified ELR film, a signal propagating on the conductive path has a wave-front-delay time constant approaching zero, thereby minimizing drive strength requirements, which reduces power consumed. Because a signal propagates through the crystalline structure of a modified ELR film, in a manner analogous to that of a waveguide, unencumbered by the capacitance of the outside environment, the signal tends to achieve minimal delay. However, the signal also propagates on the outside skin of the modified ELR film which experiences normal resistance and the capacitance of the surrounding environment. Thus, the signal propagating through the crystalline structure of the modified ELR film can reach the destination node and change the voltage of the node before the outside skin has completely achieved its changed voltage.

A reduction in drive strength requirements can also lead to a reduction in the transistor sizes that drive signals over conductive paths formed of modified ELR material. Having smaller transistor sizes can reduce the silicon area needed for the integrated circuit layout allowing for further miniaturization of integrated circuits and for circuits that perform more efficiently. Another benefit of conductive paths formed from modified ELR material is the reduction of the encumbrance or significance of the timing constraints in circuit design due to the reduced delay in the propagation of signals.

As discussed herein, many integrated circuit devices and systems may utilize, employ and/or incorporate modified ELR conductive paths that exhibit extremely low resistances at high or ambient temperatures. That is, virtually any device or system that provides a path for a current of electrons may incorporate the modified ELR conductive paths as described herein. The following section describes a few example devices, systems, and/or applications. One of ordinary skill will appreciate that other devices, systems, and/or applications may also utilize the modified ELR conductive paths, while there are some peculiar and novel advantages which might not seem obvious without due considerations.

Figure 138:
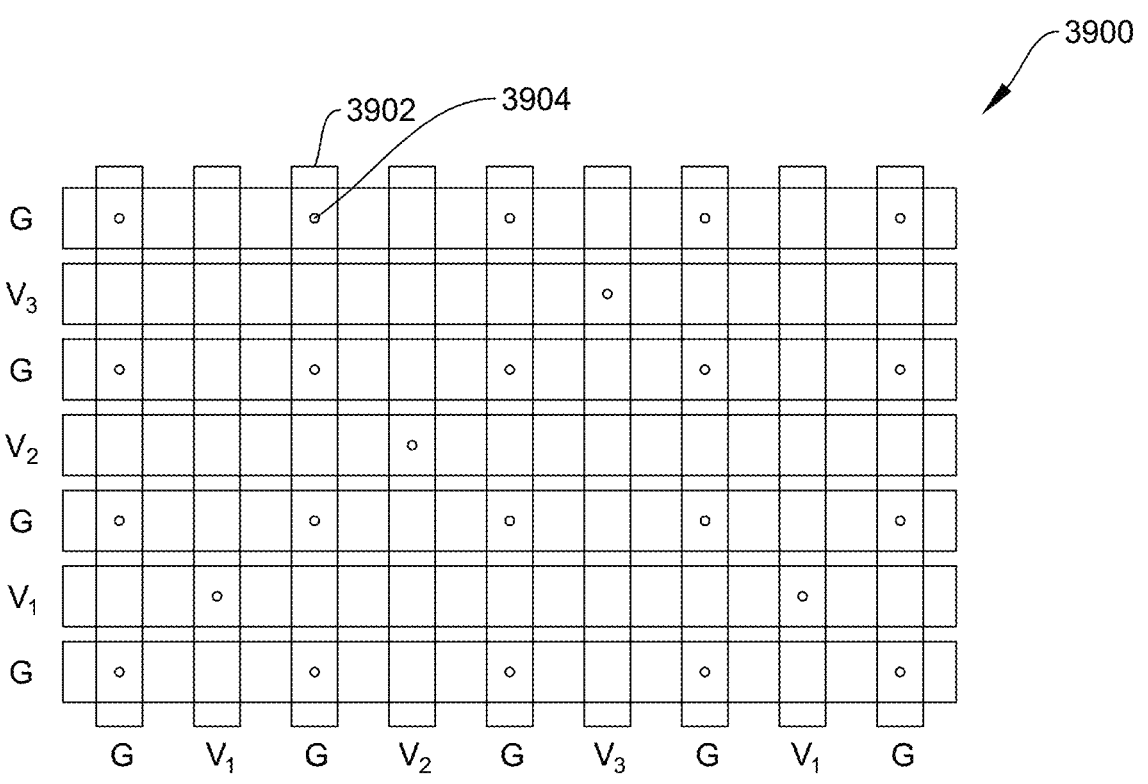

In some examples, a power supply distribution network of an integrated circuit can utilize the modified ELR conductive paths as described herein. FIG. 138 is a diagram of an example power distribution network 3900 formed of modified ELR conductive paths. As shown in FIG. 138, modified ELR material is used to implement the conductive paths, such as conductive path 3902, for voltage supplies ($V_1$-$V_4$) and ground (G) connections to be distributed around the integrated circuit with distributed voltage decreases approaching zero due to the low resistance of the modified ELR material. Since, in some examples, a modified ELR conductive path can be directional, i.e., current flows along a particular plane of the modified ELR material, the power supply distribution network 3900 of FIG. 138 utilizes two substantially orthogonal layers coupled together by vias, such as via 3904, to route power through the integrated circuit.

The power distribution network of a conventional integrated circuit is divided into several power domains, each having a particular voltage utilized by components of the integrated circuit. In conventional integrated circuits, i.e., circuits employing metallic conductive paths, each power domain typically has its own conducting layer because of the resistive materials used for the conductive paths. These traditional conductive paths have a significant amount of resistance resulting in power loss, through heat ($I^2R$) and through larger or extra transistors used in attempt to mitigate the propagation delays caused by resistance. The "brute force" required to drive resistive signal lines causes noise on the power distribution conductors, which must be decoupled. And in many cases, separate voltage domains are designed-in to separate particularly noisy circuits. However, because of the excellent conductivity of modified ELR material, in an integrated circuit that employs modified ELR conductive paths, all voltage and ground domains can be routed in the two orthogonal layers as shown in FIG. 138 without additional layers necessary. For example, voltages $V_1$, $V_2$, $V_3$, and a ground network can all be distributed over the integrated circuit using the two-layer power distribution network 3900 of FIG. 138.

Many other advantages come from using conductive paths formed from modified ELR material. For example, a power distribution network using modified ELR materials not only reduces power dissipation, but also reduces the "IR Drop" to negligible amounts, which in turn allows for lower operating voltage. This lower operating voltage reduces parasitic leakage of the transistors, thus improving overall circuit efficiency. Also, because of the extremely fast propagation of signals in mELR, noise pulses on the power distribution network get immediately propagated to all distributed decoupling capacitances. And when modified ELRI is used for routing signals, "brute force" drivers are not required, so there are much less noise violations.

A power supply distribution network formed from modified ELR conductive paths can be implemented on, for example: microprocessors, microcomputers, microcontrollers, DSPs, SoC, disk drive controllers, memories, ASICs, ASSPs, FPGAs, and virtually any other semiconductor integrated circuit that can be made compatible with modified ELR films or materials.

Figure 139:
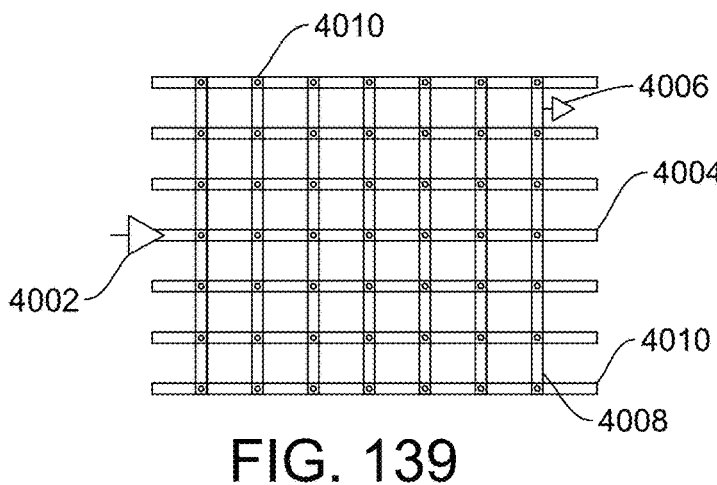

In some examples, a clock distribution network of an integrated circuit can utilize the modified ELR conductive paths as described herein. FIG. 139 is a diagram of an example clock distribution network formed of modified ELR conductive paths. FIG. 139 includes a clock driver 4002 coupled with a trunk path 4004 of the clock distribution network. As shown in FIG. 139, a clock distribution network formed from modified ELR conductive paths can distribute a clock signal from the clock driver 4002 to clocked components of the integrated circuit, such as gate 4006. The trunk path 4004 is coupled with substantially perpendicular branch paths, for example, branch path 4008, which distribute a clock signal to integrated circuit components. The clock distribution network of FIG. 139 also includes parallel branch paths, such as branch path 4010 which can further distribute clock signal to other circuit components. The branch paths 4010 can be coupled with the trunk path 4004 through vias, such as via 4012, connecting substantially orthogonal layers.

One advantage of using modified ELR conductive paths is that clock signals propagating over such a network have a wave-front-delay time constant approaching zero, without the need for extra buffer circuits or delay circuits, thereby minimizing propagation delay and clock skew between synchronous circuits.

Figure 140:
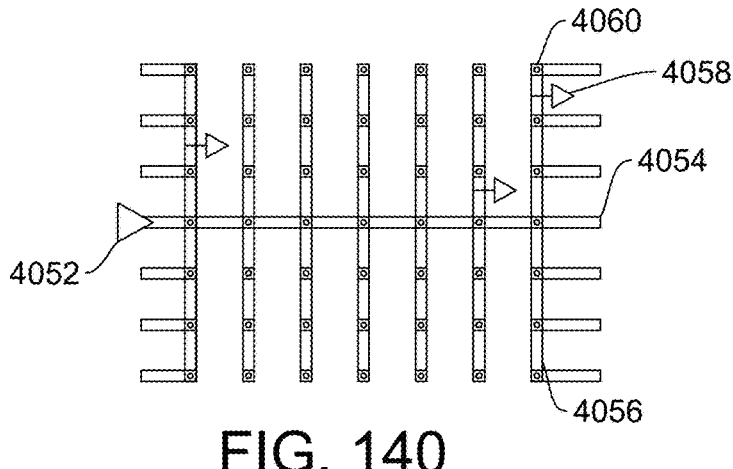

FIG. 140 is a diagram of an alternative layout illustrating a clock distribution network formed of modified ELR conductive paths. As shown in FIG. 140, the clock distribution network has one central trunk 4054 coupled with a clock driver 4052 to feed perpendicular branches, such as branch 4056, which, in turn, feed clock buffers to clocked components, such as gate 4058. Since, in one implementation, a modified ELR conductive path can be directional, e.g., current flows along a particular plane of the modified ELR material, the clock distribution network of FIGS. 139 and 140 utilize two substantially orthogonal layers connected together by vias, such as vias 4012 and 4060, to route a clock signal through the integrated circuit.

Figure 141:
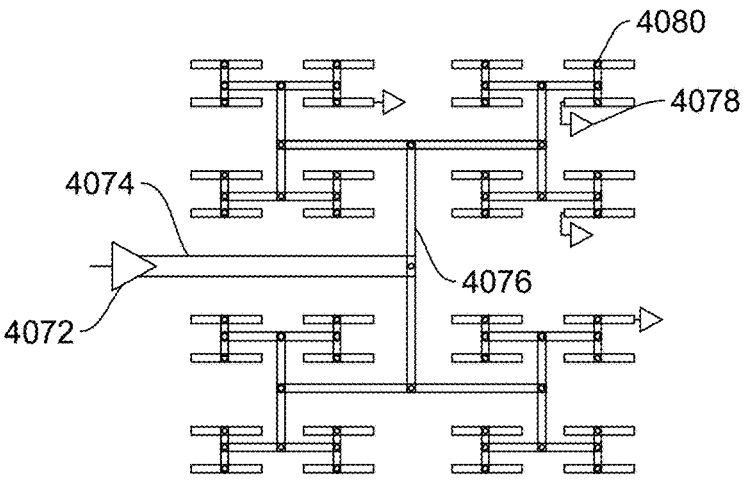

FIG. 141 is a diagram of an alternative layout illustrating a clock distribution network formed of modified ELR conductive paths. As shown in FIG. 141, the clock distribution network has one central trunk 4074 coupled with a clock driver 4072 to feed perpendicular branches, such as branch 4076, which, in turn, feed through the geometric progression H-structure of the clock distribution network to clocked components, such as gate 4078. Since, in one implementation, a modified ELR conductive path can be directional, e.g., current flows along a particular plane of the modified ELR material, the clock distribution network of FIGS. 139-141 utilize two substantially orthogonal layers connected together by vias, such as vias 4012, 4060, and 4080 to route a clock signal through the integrated circuit.

Some advantages of using modified ELR material for conductive paths of a clock distribution network include, for example, a significant reduction in power and speed losses from a convention resistive network due to buffering and the added capacitance of widening conductive paths to reduce resistance. Further, clock skew and insertion delay are appreciably reduced, thus reducing the encumbrance or significance of the design constraints. Similarly, multi-phase clock architectures can be implemented and still run synchronously due to the greatly reduced clock skew. Additionally, there are some sophisticated synchronous integrated circuit architectures, which do not require a clock signal to be propagated. These circuits use special software to assure their synchronicity. These circuits can utilize modified ELR conductive paths in their synchronous control signals, as though they were clocks, to realize similar advantages.

A clock distribution network formed from modified ELR conductive paths can be implemented on, for example: microprocessors, microcomputers, microcontrollers, DSPs, SoC, disk drive controllers, memories, ASICs, ASSPs, FPGAs, and virtually any other semiconductor integrated circuit that can be made compatible with modified ELR films or materials.

Figure 142:
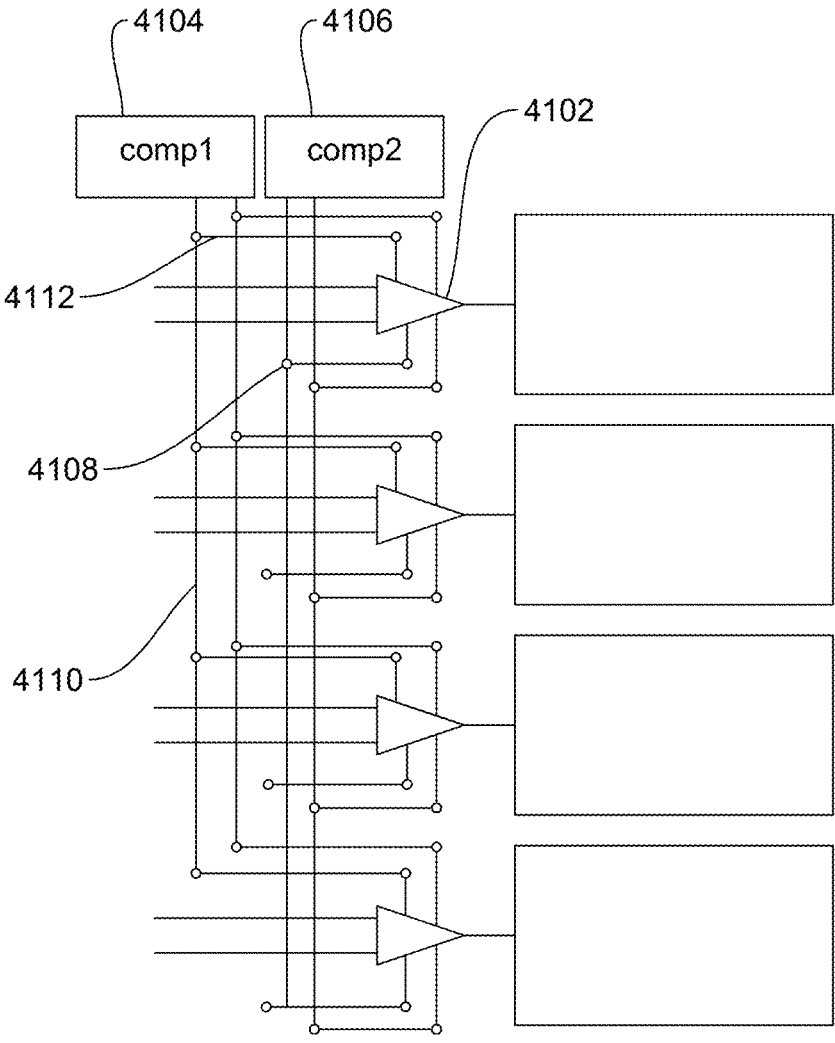

In some examples, analog components of an integrated circuit can be coupled with a compensating circuit using modified ELR conductive paths as described herein. FIG. 142 is a block diagram illustrating analog components coupled with compensation circuits by modified ELR conductive paths. Example block diagram of FIG. 142 includes analog components, for example, amplifiers, such as amplifier 4102, which are coupled with compensation circuits 4104 and 4106. As described previously, in one implementation, a modified ELR conductive path can be directional, e.g., current flows along a particular plane of the modified ELR material. Thus, in the example of FIG. 142, the conductive paths used to couple to the compensation circuits with the analog components can be implemented using two substantially orthogonal layers, for example 4110 and 4112, connected together by vias, such as via 4108, to route signals through the integrated circuit.

Analog circuits are typically more sophisticated and useful when provided compensation signals from compensation circuits. However, conventional conductive paths, for example aluminum or copper, introduce significant resistance, which degrades compensation signals and reduces overall system performance. One advantage of using modified ELR conductive paths to propagate signals between analog components and compensation circuits is, with a time constant approaching zero, the resistance interference in the compensation process is minimized.

Additionally, conventional integrated circuits including analog components are typically orientation sensitive, i.e., must be spatially balanced. If the circuit is unbalanced, the resistance in the conductive paths degrades performance and functionality. Implementing conductive paths formed of modified ELR material, with reduced resistance, alleviates most of the problem of location of individual analog components and integrated circuits. This allows for other considerations, for example, space considerations, to be taken into account when designing a circuit.

Figure 143:
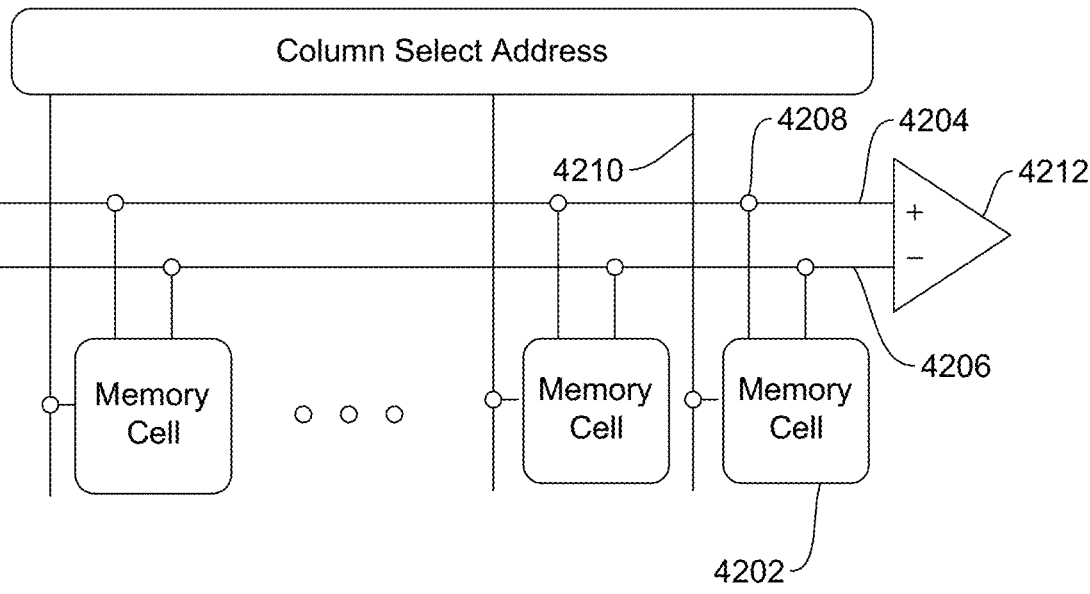

In some examples, conductive paths of memories can be implemented using modified ELR films as described herein. For example, FIG. 143 is a block diagram of an example memory implementing conductive paths with modified ELR conductive paths. In the example of FIG. 143, the memory uses modified ELR conductive paths for a low-threshold, high-speed memory "read" function. Each memory cell 4202 is coupled with bit lines 4204 and 4206, and an address line, such as line 4210, through vias, such as via 4208. The bit lines 4204 and 4206 are coupled with a sensing amplifier 4212 to enable low voltage sensing of the bit lines.

The speed and accuracy of a semiconductor memory is based on the sensing of a voltage of the memory cell. In some examples, a pair of bit lines is connected to all cells on a particular row of cells. When the column select line, for example, line 4210, is enabled, the complementary outputs of the memory cell 4202 on the selected column connect to the respective bit lines 4204 and 4206. As the transistors of the memory cell drive the bit lines 4204 and 4206, the sensing amplifier 4212 provides an output as soon as it can distinguish which bit line is high and which is low. The time it takes to charge the lines, such that the sensing amplifier can detect a difference, can be compromised in traditional technology, with its resistive interconnect, by the designed size of the cell (smaller cells produce smaller drive) and length of the row (longer rows cause more resistive-capacitive load for the memory cell to drive). However, bit lines formed from modified ELR films allow the transistors of the memory cell to drive the sensing amplifier input immediately toward the stored voltage levels thereby requiring only minimal power to sense and respond to these bit lines at a much quicker sample rate.

Memory sensing amplifiers are designed for a particular semiconductor technology and particular memory row lengths. Conventional memories have limited row lengths, and therefore smaller blocks, due to parasitic resistance. In order to achieve faster read times, conventional memories use higher quiescent currents such that the sensing amplifier reacts faster without waiting for the memory cell to drive the resistive bit lines to a different logic state. Thus, conventionally, faster memories equate to higher power usage. Because of the reduced effect resistance and capacitance a signal encounters as it propagates inside a modified ELR film's structure, the memory can produce faster and more accurate reads in the sensing amplifier with lower power usage. Further, bit lines formed from modified ELR films would allow for much larger blocks and still use much less power and achieve much higher performance.

Figure 144:
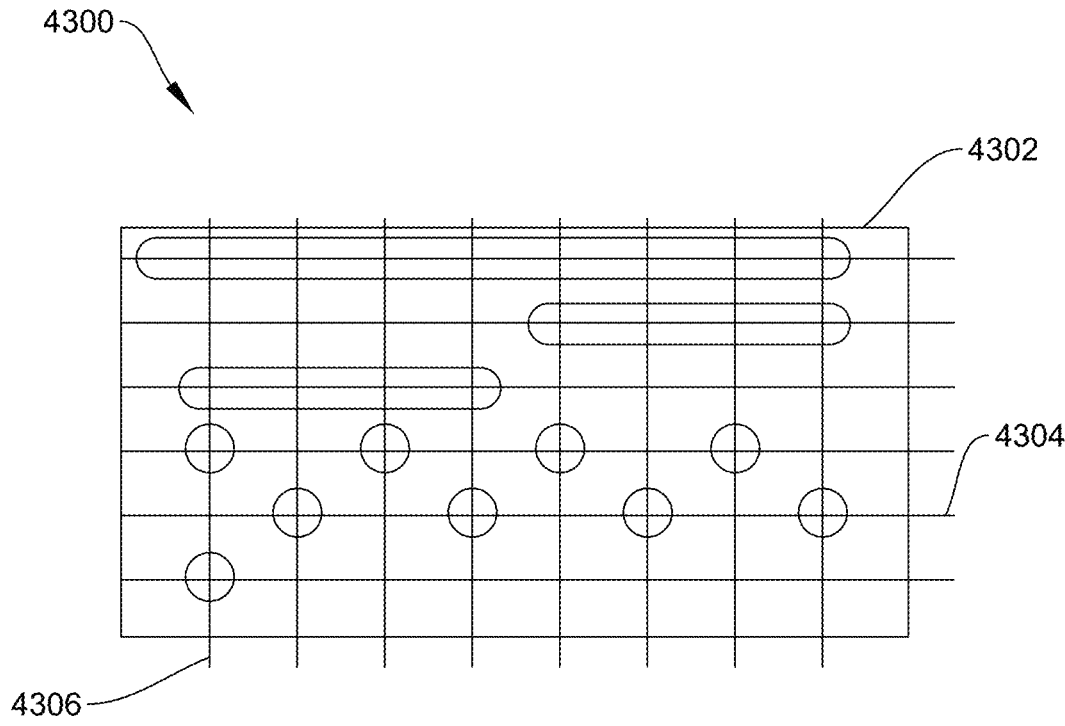

In some examples, a data bus and instruction lines in a data flow processor can be implemented using modified ELR conductive paths as described herein. FIG. 144 is a block diagram of an example function cell of a data flow processor 4300 with conductive paths formed from modified ELR material. The data flow processor includes a function cell 4302, a data bus 4306, and an instruction line 4304. The data bus 4306 and the instruction line 4304 can be implemented using a modified ELR film as described herein.

To define the limit of its performance, a processor built according to a dataflow architecture depends on the speed of the instruction signals propagating on an instruction line to execute a function and then data signals propagating on the data bus. Implementing a bus and instruction lines with a modified ELR film causes a signal to have a wave-front-delay time constant approaching zero, thereby minimizing drive strength requirements, which reduces power. Further, due to reduced propagation delay, instruction signals would practically instantaneously engage the functions, and data signals would instantaneously propagate to their instructed destination.

Conventional data flow processor operation frequency is limited by propagation delay in the data bus and instruction lines caused by resistance of conventional conductors. Implementing the conductors with modified ELR materials provides several orders of magnitude faster performance of the instruction lines and data bus, where an array of interconnects is strategic in implementing the architecture. For example, DSP applications could process several orders of magnitude faster frequencies, RF receivers could demodulate higher RF transmission bands, and DSPs could implement more sophisticated algorithms (i.e., with greater number of instructions) in the same time span as a processor using conventional conductors can achieve.

In some examples, some or all of the systems and devices describes herein may employ low cost cooling systems in applications where the specific modified ELR materials utilized by the application exhibit extremely low resistances at temperatures lower than ambient temperatures. As discussed herein, in these examples the application may include a cooling system (not shown), such as a system that cools a modified ELR conductive path to a temperature similar to that of liquid Freon, to a temperature similar to that of frozen water, or other temperatures discussed herein. The cooling system may be selected based on the application, and/or the type and structure of the modified ELR film or material utilized by the application.

In addition to the systems, devices, and/or applications described herein, one skilled in the art will realize that other integrated circuit systems, devices, and applications may utilize the modified ELR conductive paths described herein. Additionally, when terms such as "film" or "material" are used herein, it should be apparent that other structures or implementations are possible and within the scope of the claimed invention.

Part E—Integrated Circuit SiP Devices

This section of the description refers to FIGS. 1-36 and FIGS. 145-150; accordingly all reference numbers included in this section refer to elements found in such figures.

Various implementations of the invention generally relate to extremely low resistance interconnects (ELRI), such as ELRI incorporating modified, apertured, and/or other new ELR materials. In some implementations, the ELRI can have a first layer comprised of an extremely low resistance (ELR) material and a second layer comprised of a modifying material bonded to the ELR material of the first layer. The ELRI can be used in a variety of systems and methods to create various improvements. Some examples where the various efficiencies are created include, but are not limited to, systems and methods for a radio frequency antenna on an IC mounting substrate, power supply distributions on a semiconductor IC mounting substrate and system-in-package (SiP) substrate, and signal (e.g., control, clock, data and other signal types) routing on a semiconductor mounting substrate.

For example, when an ELRI material is used to implement the conductive paths for RF antenna topologies on an IC mounting substrate, the required area tends to be less than conventional substrate topologies that do not use ELRI material. In addition, the RF antenna can be located in isolated locations without incurring the penalty of interconnect resistance, thereby yielding higher Q capability. As such, the RF antenna topologies resulting from the use of ELRI material in the conductive paths may require less active circuits and thus less semiconductor area for the various circuits.

In some implementations, an ELRI material can be used to implement the conductive paths for voltage supplies (including multiple voltage domains) and ground connections to be routed as busses to multiple parts of the substrate. These paths form virtual nodes, since the distributed voltage variations approach zero. Furthermore, all high frequency incidental noise spikes on power distribution conductors near instantaneously travel to all decoupling capacitances where they are dampened.

In addition to providing conductive paths for voltage supplies, ELRI material can be used for routing control, clock, data and other signals on an IC Mounting Substrate (or SiP Substrate). The ELRI material provides extremely low-resistance conductive paths for the signals. In some implementations, the conductive paths can be routed on a pair or pairs of substantially orthogonal directional layers (insulated between themselves except for designed conductive vias) to connect to IC Pads, substrate pins, or any other component in the package.

The ELRI can be manufactured based on the types of materials, the application of the ELRI, the size of the component employing the ELRI, the operational requirements of a device or machine employing the ELRI, and so on. As such, during the design and manufacturing, the material used as a base layer of a ELRI and/or the material used as a modifying layer of the ELRI may be selected based on various considerations and desired operating and/or manufacturing characteristics.

Figure 145:
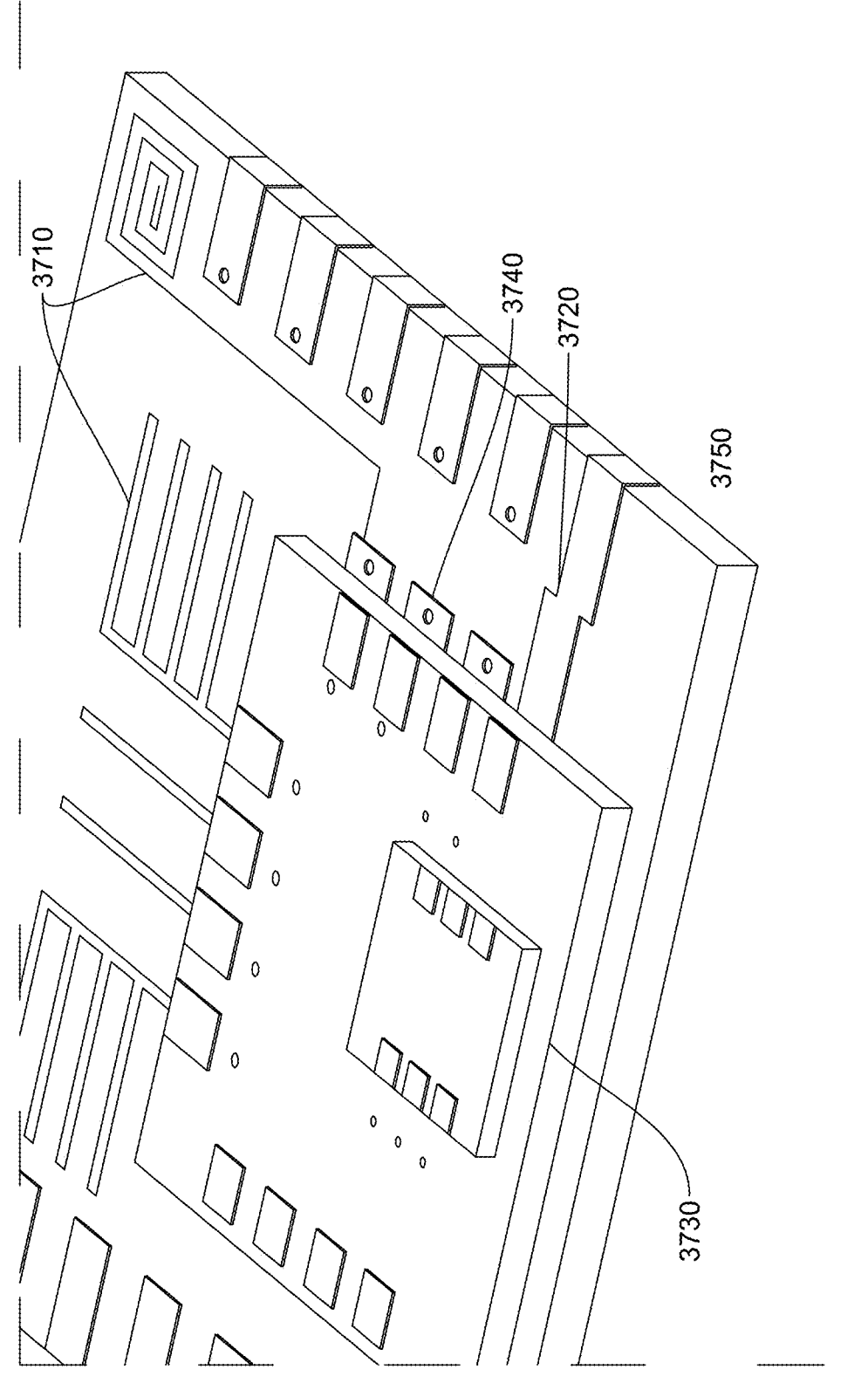
FIGS. 145 to 150 illustrate the forming of integrated circuit SiP devices using ELR materials.

FIG. 145 is diagram illustrating the use of ELRI materials implementing the conductive paths for RF antennas 3710 on a mounting substrate 3750. In traditional integrated circuits, the RF antenna is implemented off the chip from controller functions because of parasitic losses. In contrast, with ELRI connecting the RF circuits in IC 3730 directly to the RF antenna 3710, less parasitic losses are encountered, so that RF antenna 3710 can be implemented on the mounting substrate 3750 of the same chip with the RF circuits and IC 3730.

In accordance with various implementations of the invention, when an ELRI material is used to implement the conductive paths for RF antenna topologies on a mounting substrate 3750, the required area is less than in conventional substrate topologies. In addition, the RF antenna 3710 can be in isolated locations without incurring the penalty of interconnect resistance, thereby yielding higher Q capability with the passive parasitics. As such, the RF antenna topologies resulting from the use of ELRI material in the conductive paths require less active circuits and thus less semiconductor area for various circuits.

Various implementations of the invention can produce one or more advantages which can be appreciated by one of ordinary skill in the art. For example, as just discussed, the use of ELRI can provide conductive capability that allows antenna topologies in typically less area than conventional substrate topologies and in isolated locations without incurring the penalty of interconnect resistance. As another example, because ELRI has extremely low losses, RF antenna architectures can be devised and implemented that would be more cost effective and practical. In some implementations, the RF antenna design could even significantly reduce the active circuit amplification and filtering. ELRI also enables the design to implement RF antenna connected more closely to RF circuitry on the IC with improved conductive interconnect, with less parasitic losses yielding higher Q, such that it can achieve its design requirements without special semiconductor processes and without going off the IC's mounting substrate package. New RF products could also be developed that were not feasible with prior art technology, such as single chip RF transceivers with much higher Q, allowing handheld instruments to address a large number of separate channels.

In accordance with various implementations, RF antenna 3710 can be implemented with microprocessors, microcomputers, microcontrollers, computer memory, DSPs, SoC, Disk Drive Controllers, ASICs, ASSPs, FPGAs, neural networks, MEMS, MEMS arrays, micro energy storage devices, and for any other IC mounting substrate implementing RF circuit antennas 3710. As illustrated in FIG. 145, some implementations of the invention provide for an integrated circuit (IC) comprising an IC mounting substrate 3750, an RF antenna 3710, and an RF circuit 3730. The IC mounting substrate 3750 can have multiple layers and one or more conductive paths 3720 and 3740 for signal routing. The one or more conductive paths 3740 can be made of a modified extremely low resistance interconnect (ELRI) having a first layer comprised of an extremely low resistance (ELR) material. In addition, the one or more conductive paths 3720 and 3740 can also have a second layer comprised of a modifying material bonded to the ELR material of the first layer.

The radio frequency (RF) antenna 3710 can be implemented on the IC mounting substrate 3750. The RF circuit 3730 can also be implemented on the IC mounting substrate 3750 and connected to the RF circuit 3730 through the ELRI. In some cases, the RF antenna 3710 can be in close proximity to the RF circuit 3730 when compared to requirements for similar implementations without the ELRI. In some implementations, the RF antenna can include a first layer comprised of ELR material and a second layer comprised of modifying material bonded to the ELR material of the first layer.

In accordance with some implementations, a wireless device can include a power supply coupled to an RF transceiver using various configurations of ELRI. In accordance with various implementations, the RF transceiver can include a mounting substrate, an RF antenna, and an RF circuit. The mounting substrate can have one or more conductive paths (3720 and 3740). In some cases, the one or more conductive paths can be comprised of extremely low resistance interconnects (ELRI) having a first sub-layer comprised of an extremely low resistance (ELR) material and a second sub-layer comprised of a modifying material bonded to the ELR material of the first layer. The RF antenna can be implemented on the mounting substrate along with the RF circuit. The RF antenna can be connected to the RF circuit through the ELRI. In some implementations, the RF antenna includes a first layer comprised of ELR material and a second layer comprised of modifying material bonded to the ELR material of the first layer.

The wireless devices can be any device or handheld transceiver. Examples include, but are not limited to spread spectrum devices, cell phones, wireless phones, Bluetooth®, Wi-Fi, and Wi-Max devices, interfaced security devices, earphones, hearing aids, medical transponders, and many others. The interfaced security devices can include universal remote security controllers to control property security (secure garage door opener, security alarm set/reset/inquiry, thermostat programming, general electrical control, etc.) and Automobile key transmitters. In addition, the wireless device can be a handheld transceiver for special applications, like meter reading and inventory inquiries with special RFID tags, handheld computer interfaces (Bluetooth® program actuator and data transceiver) and the like.

The wireless devices which use the ELRI for RF antenna include a variety of improvements. For example, spread spectrum devices can be built with orders of magnitude more individual channels (e.g., 100 or more individual channels). Cell phones and Wireless phones, Bluetooth® device, and other Wi-Fi devices will have approximately an order of magnitude greater reception/distance.

Figure 146:
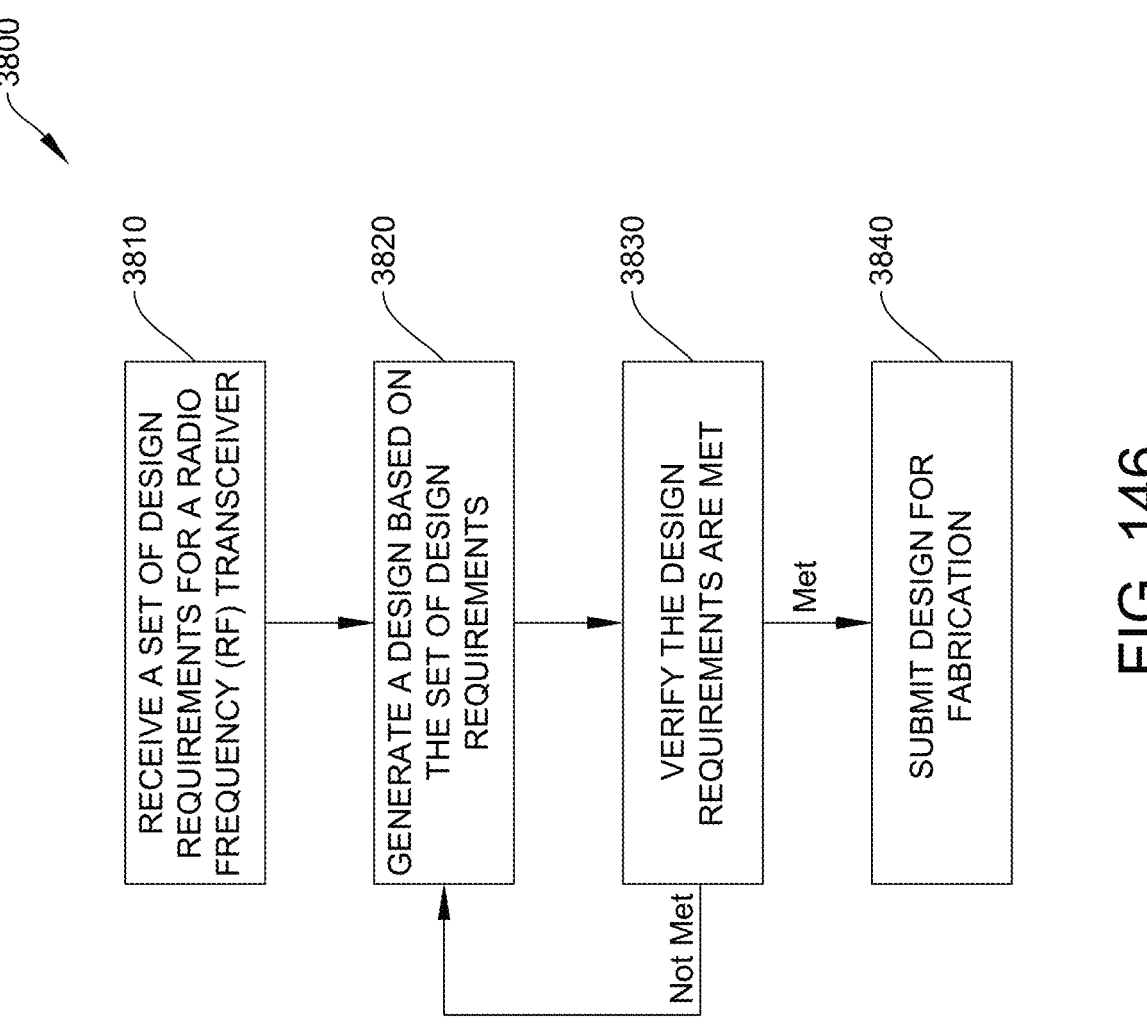

FIG. 146 is flow chart showing a set of exemplary operations 3800 for designing a radio frequency antenna using ELRI material. In accordance with the implementations illustrated in FIG. 146, receiving operation 3810 receives a set of design requirements for an RF transceiver. The design requirements can include an RF antenna implemented on an integrated circuit (IC) mounting substrate and an RF circuit implemented on the IC mounting substrate. In addition, the cost of various materials, types of available materials, location restrictions/requirements for various components, manufacturing methodologies, component size, range, Q factor, power requirements, and other design requirements can be included. For example, in one implementation, the design requirements can include that the RF antenna is in close proximity to the RF circuitry.

Generation operation 3820 produces a design by routing one or more conductive paths on the IC mounting substrate to connect the RF antenna to the RF circuit. The conductive paths can include extremely low resistance interconnects (ELRI) with a first layer comprised of an extremely low resistance (ELR) material and a second layer comprised of a modifying material bonded to the ELR material of the first layer. Generation operation 3820 takes into account the extremely low resistance interconnects and the affect on the various design requirements.

Verification operation 3830 verifies that the set of design requirements are met. If verification operation 3830 determines that the design is not met, an additional design iteration is performed by branching to generation operation 3820. Once verification operation 3830 determines the set of design requirements are met, the design is submitted for fabrication by branching to fabrication operation 3840.

On IC mounting substrates, such as BGA and PGA, there are often buses for power supply distribution. The conduction paths are commonly joined to reduce resistance from the external power source to any individual IC power pad. The resistances on traditional designs are still significant and limit the performance of the IC. In addition, on board an IC, multiple voltage domains are typically created to separate the resistance from the voltage supply node of various blocks in the conductive path connecting to the external power source. Moreover, the resistance causes distributed voltage "IR Drop" triggering iterative mitigation remedies of circuit design, including splitting into multiple voltage domains with the same voltage (to keep the noise in one block from affecting another block). In addition, noise cannot be dampened when resistance is so pervasive, so the mitigation is to keep lines separate until a more conductive connection to the external source.

In accordance with various implementations, ELRI can be used for power distribution. ELRI routing reduces the power dissipation (caused by running current through the resistance of the substrate lines), in addition to making the "IR Drop" negligible making multiple voltage domains and ground busses on the substrate "Virtual External Power Supply" nodes. Eliminating "IR Drop" on the lines allows connecting power and ground nodes on the mounted IC to be bonded to the virtual nodes on the substrate, in some cases reducing the number of pads.

Figure 147:
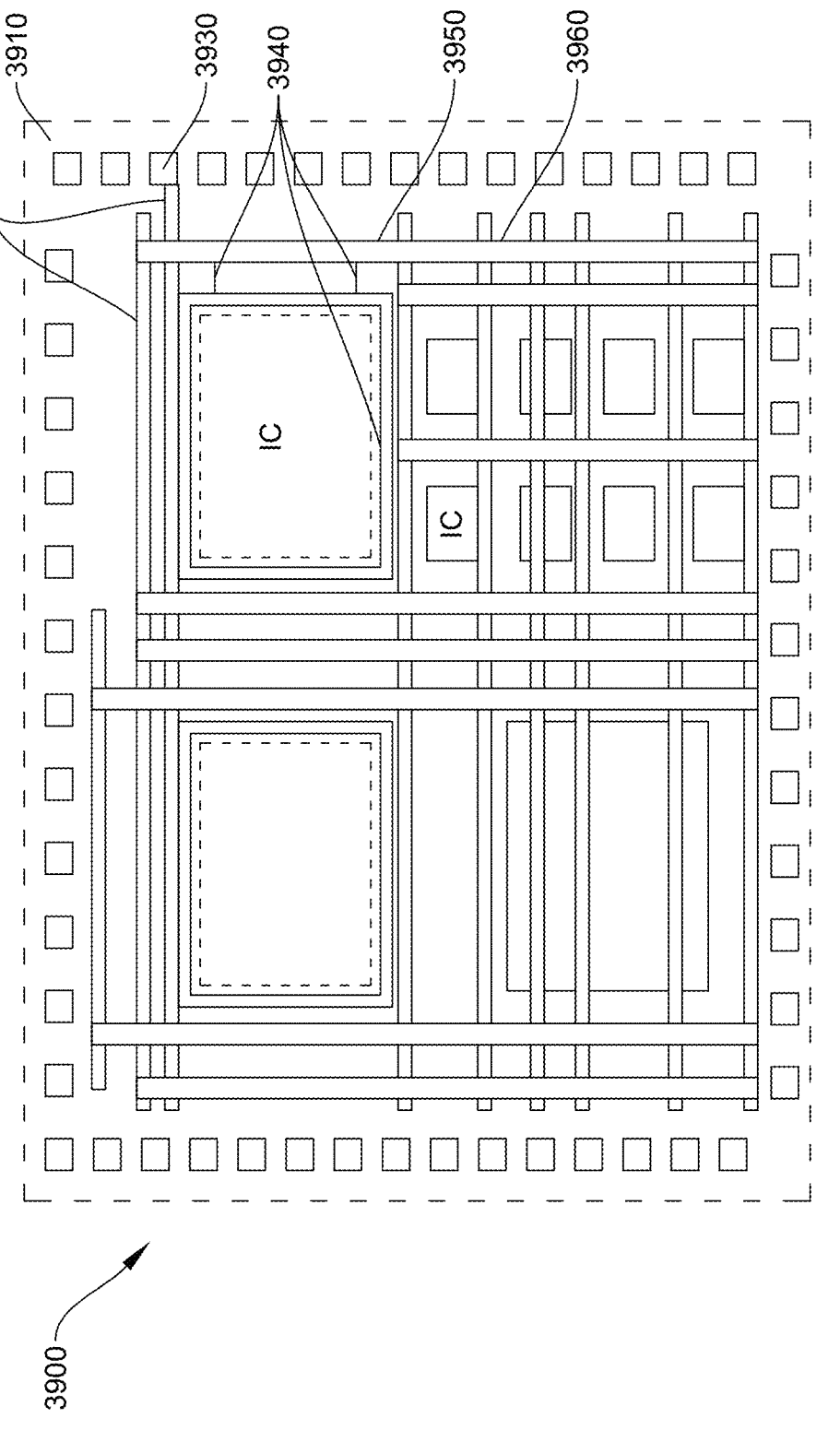

FIG. 147 is an example layout diagram illustrating a power supply distribution 3900 using ELRI on a substrate. ELR power distribution provides multiple voltage domains and ground connections with voltage differences approaching zero at various points on the lines, so each IC Power Supply Pad would bond to a "Virtual External Power Supply" for each given voltage.

In some implementations, an ELRI material can be used to implement the conductive paths for voltage supplies (including multiple voltage domains) and ground connections to be routed as buses throughout the layout. These paths form virtual nodes, since the distributed voltage variations approach zero. Furthermore, all high frequency noise spikes instantaneously travel to all decoupling capacitances where they are dampened or de-coupled. In accordance with various implementations, the conductive paths can be on any IC Mounting Substrate or SiP Substrate, such as a BGA or PGA substrate for single ICs, or a SiP or MCM substrate, or even Thin Film Passive Component substrate or for any system with one or more components on the substrate.

Some implementations of the invention provide for an IC package 3910 comprising a substrate, a power bus 3920, and one or more virtual nodes coupled to a pad 3930. The substrate can be a BGA substrate, a PGA substrate, an SiP substrate, an MCM substrate, or a thin film passive component substrate. Power bus 3920 can include one or more conductive paths having a low resistance resulting in a negligible IR drop for power distribution implemented on the substrate. The one or more conductive paths include a first layer comprised of an extremely low resistance (ELR) material and a second layer comprised of a modifying material bonded to the ELR material of the first layer. The one or more virtual nodes formed by ground connections routed around the substrate, wherein each ground connection includes a second ELR material and a second modifying material bonded to the second ELR material In some implementations, the one or more conductive paths can be arranged to form multiple voltage domains. The IC package 3910 can also include one or more virtual external power supply nodes created from the multiple voltage domains and ground connections. The IC package can include a set of extremely low resistance interconnects (ELRI) 3950 and an integrated circuit connected to the virtual external power supply nodes via one or more ELRI in the set of ELRI. The integrated circuit can, in some implementations have a low voltage circuit with an operating voltage of approximately 0.25 volts or less. In some implementations, the IC package 3910 can have multiple layers and have a multi-layer power distribution within the multiple layers as shown by 3960. In some implementations, the IC package 3910 can also include a set of wire bonds 3940 and one or more integrated circuits connected to the virtual external power supply nodes via one or more wire bonds 3940 in the set of wire bonds.

Various implementations of the invention include a circuit with a voltage supply, one or more integrated circuits, and an IC package 3910 with a power supply distribution to supply power from the voltage supply to the one or more integrated circuits. The IC package 3910 can include a substrate, a power bus 3920 and one or more virtual nodes. In accordance with various implementations, the substrate can be a BGA substrate, a PGA substrate, a SiP substrate, an MCM substrate, a thin film passive component substrate, or other. The power bus 3920 can have one or more conductive paths with a low resistance for power distribution implemented on the substrate and may form multiple voltage domains with virtual external power supply nodes. The low resistance in the conductive paths results in a negligible IR drop. In some implementations, the IC package 3910 can include multiple layers 3960 allowing a multi-layer power distribution within the multiple layers 3960.

The one or more conductive paths can include a first layer comprised of an extremely low resistance (ELR) material and a second layer comprised of a modifying material bonded to the ELR material of the first layer. The one or more virtual nodes can be formed by ground connections routed around the substrate. Each ground connection can include a second ELR material and a second modifying material bonded to the second ELR material.

In some implementations, the circuit includes a set of ELRI coupling the one or more integrated circuits to the virtual external power supply nodes via the set of ELRI. In other cases, the circuit can include a set of wire bonds 3940 coupling the one or more integrated circuits to the virtual external power supply nodes via the set of wire bonds 3940.

As will be appreciated by one or ordinary skill in the art, using ELRI for power distribution on a substrate provides new packaging methods and materials to significantly reduce noise and power usage on redesign of existing products that use ICs. The use of ELRI would also improve analog circuit design on ICs, because power supply margins would be supplied to IC Pads under tight, dependable control. In addition, the use of ELRI creates the possibility of new products that were unfeasible in prior art technology. For example, some analog circuits on ICs with digital circuits that do not work together in present technology because voltage margins cannot be delivered to the IC pad, would be feasible within the paradigm of the invention. Another example includes novel circuits and circuit architectures that would become feasible with lower power. In other cases, ICs could use power usurped from ambient environment, by utilizing ELRI for RF antenna on a mounting substrate with connections to the IC. Other examples include, very-low voltage circuits (in the 0.25 V operating range or less), which require extremely-low-voltage-drop packaging. A yet another examples include, reconfigurable ICs with MEMS switches controllable by sensors and/or logic elements, implemented in hardware and/or software.

In addition to providing conductive paths for voltage supplies, ELRI material can be used for routing signals on an IC Mounting Substrate (or SiP Substrate). The use of ELRI improves the quality of interconnection (over present art) by providing signal paths with near-zero resistance. In some implementations, the conductive paths can be routed on a pair or pairs of orthogonally directional layers to connect to IC Pads, substrate pins, or any other component in the package. In many cases, the use of ELRI material for signal routing would reduce the design time by eliminating iterative mitigation design remedies that are presently required because of the timing problems caused by the resistance of present art technology. The use of ELRI material might also allow margins for more ICs or other components on the substrate than would otherwise meet design requirements using present art technology.

Various implementations of the invention include an IC package comprising a substrate having a set of components (e.g., substrate pins, low voltage IC's, etc) and any required conductive paths. In accordance with various implementations, the substrate can be a BGA substrate, a PGA substrate, an SiP substrate, an MCM substrate, a thin film passive component substrate, or other. The IC package may have multiple layers allowing the one or more conductive paths to be routed on a pair or pairs of orthogonal directional layers separated by an insulator with particular connecting vias designed to respectively connect all continuous conducting paths.

The one or more conductive paths provide interconnections between the set of components and can include extremely low resistance (i.e., near-zero resistance) interconnects for routing signals on the substrate. According to some implementations, the extremely low resistance interconnects include a first layer comprised of an extremely low resistance (ELR) material and a second layer comprised of a modifying material bonded to the ELR material of the first layer.

Some implementations include a circuit having a voltage supply, one or more integrated circuits (e.g., with a reduced power output driver), and an IC package. The IC package can have a set of components (e.g., IC pads, substrate pins, etc) interconnected by a set of signal routing paths that transfer signals between the voltage supply and the one or more integrated circuits. The IC package can include a substrate and a signal bus. The signal bus can have one or more conductive paths for signal routing on the substrate. In some implementations, the one or more conductive paths include extremely low resistance (e.g., near-zero) interconnects having a first layer comprised of an extremely low resistance (ELR) material and a second layer comprised of a modifying material bonded to the ELR material of the first layer. In some implementations, the substrate can include an RF antenna with a first layer of the RF antenna comprised of ELR material and a second layer of the RF antenna comprised of modifying material bonded to the ELR material of the first layer of the RF antenna.

As will be appreciated by those of ordinary skill in the art, traditional interconnects result in distributed voltage "IR Drop", triggering iterative mitigation remedies of circuit design, including more layers on the substrate to route signals and reduce the noise between lines. In addition, noise cannot be dampened when resistance is so pervasive, so the most common mitigation is to keep lines separate and isolated from each other, which utilizes more routing resources. Various implementations of ELRI routing reduce the power dissipation caused by running current through the resistance of the substrate lines, in addition to reducing the signal's voltage "IR Drop" to a negligible amount, reducing the wasted power of the IC signal output driver.

Various implementations utilize ELRI for routing signals on an IC mounting substrate. The use of ELRI for routing signals will result in new packaging methods and materials to significantly reduce noise and power usage on redesign of existing products that use ICs. Moreover, using ELRI to route signals would improve analog circuit design on ICs, because signal margins would be delivered to IC Pads under tight, dependable control. In addition, using ELRI for signal routing would allow for the creation of new products that were unfeasible in prior art technology. Examples include, but are not limited to, analog circuits on ICs with digital circuits that do not work together in present technology because voltage margins cannot be delivered to the IC pad. New novel circuits and circuit architectures would become feasible with lower current, lower power, and tighter margins. ICs could use power harvested from ambient environment, by utilizing ELRI for RF antenna on a mounting substrate, with connections to the IC. Other examples include the use of very-low voltage circuits (in the 0.25 V operating range or less), which require extremely-low-voltage-drop packaging.

Figure 148:
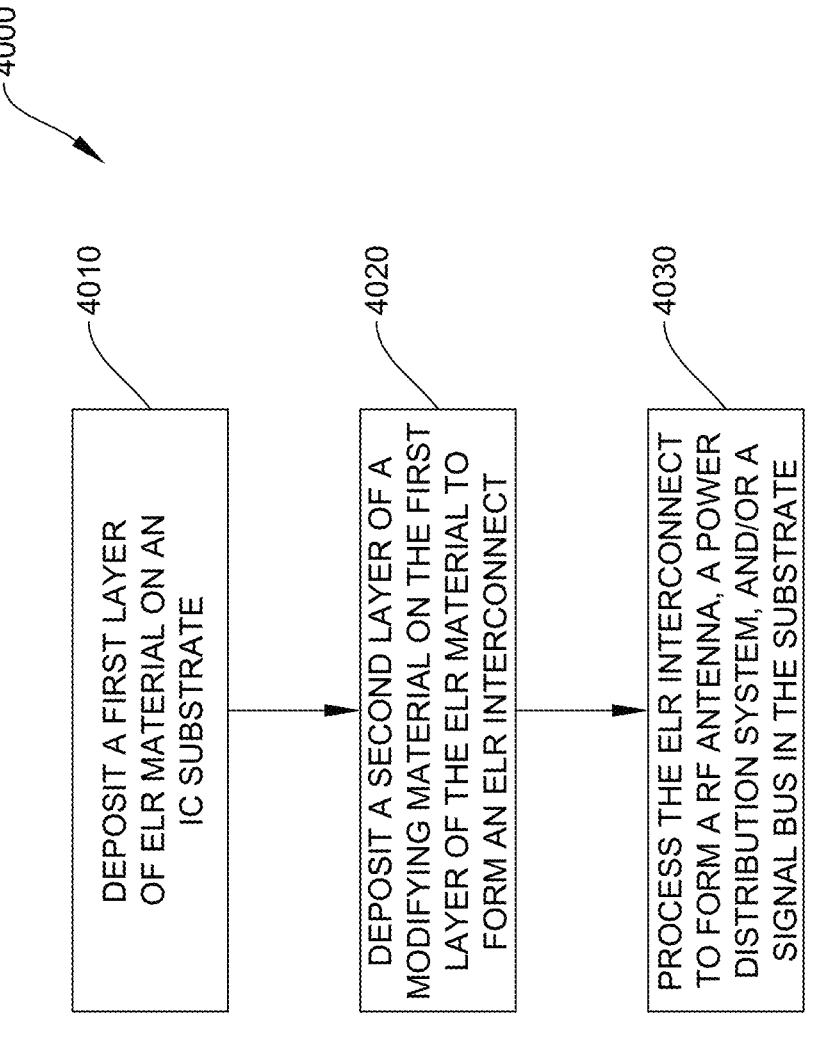

FIG. 148 is a flow chart 4000 showing a set of exemplary operations for manufacturing an RF antenna, a power distribution system, and/or a signal bus using ERLI on a substrate. The ELRI can be manufactured based on the type of materials, the application of the ELRI, the size of the component employing the ELRI, the operational requirements of a device or machine employing the ELRI, and so on.

In the implementations shown in FIG. 148, a first depositing operation 4010 deposits a first layer of extremely low resistance (ELR) material on a substrate. In accordance with various implementations, the first layer can comprise any suitable material such as YBCO or BSCCO. A second layer comprised of a modifying material on the first layer of the ELR material, creating ELR interconnects, is deposited during a second depositing operation 4020. The second layer can include any suitable material such as chromium, copper, bismuth, cobalt, vanadium, titanium, rhodium, beryllium, gallium, silver or selenium. The material used as the first or base layer of an ELRI and/or the material used as a modifying layer of the ELRI may be selected based on various considerations and desired operating and/or manufacturing characteristics. Examples include, cost, performance objectives, equipment available, materials available, and/or other considerations and characteristics. Processing operation 4030 processes the ELR interconnects to form an RF antenna, a power distribution system, and/or a signal bus with one or more conductive paths capable of routing signals on the substrate.

Figure 149:
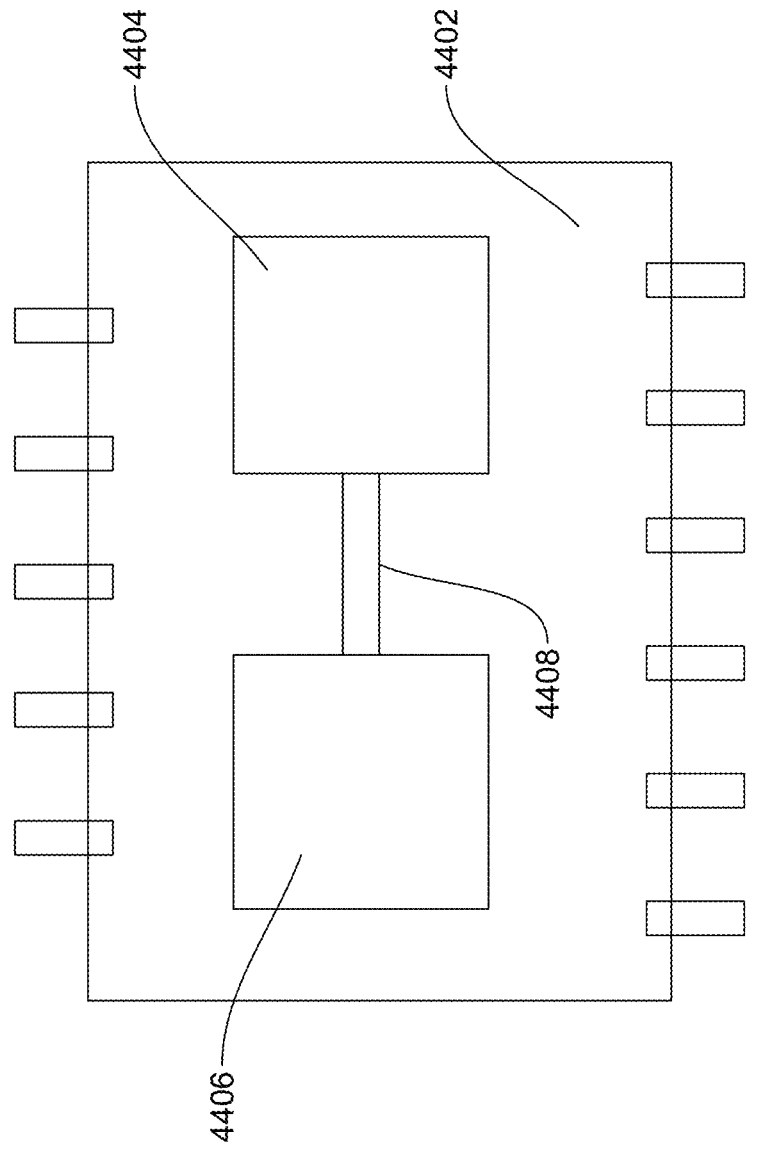

In some examples, conductive paths formed from modified ELR materials can be used in packaging integrated circuits. For example, FIG. 149 is a block diagram of an integrated circuit package with intra-package connections formed from modified ELR material. The integrated circuit package 4402 includes chips 4404 and 4406 and a conductive path 4408 of modified ELR material electrically coupling chip 4404 with 4406. Conventional conductive materials, e.g., copper and aluminum, are typically used for these inter-chip connections in integrated circuit packages. However, by using conductive paths formed of modified ELR material inter-chip communication is faster and more efficient.

Figure 150:
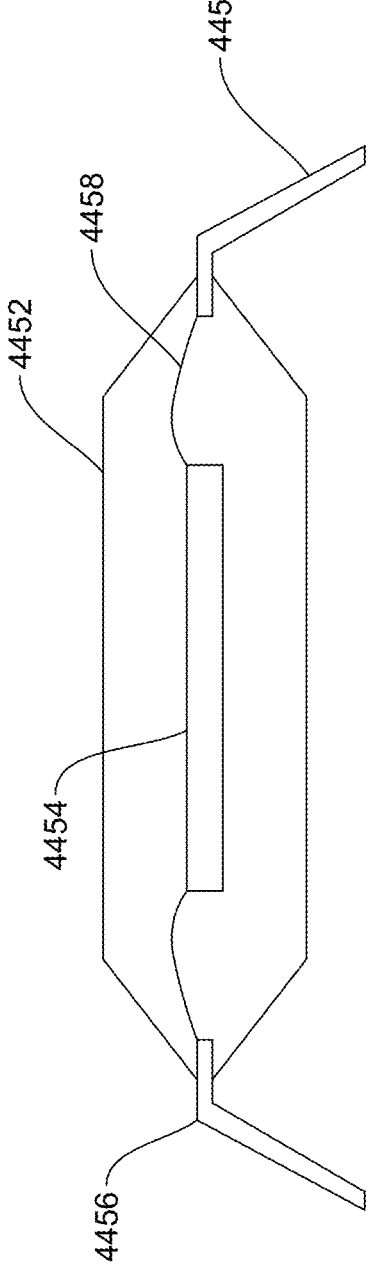

Another example of modified ELR materials used in integrated circuit packaging is shown in FIG. 150. The integrated circuit package 4452 in FIG. 150 includes a chip 4454, pins 4456 to connect the chip to outside components, and a modified ELR nanowire 4458 to electrically couple the pins 4456 with the chip 4454. In some examples, the pins 4456 can also be formed of modified ELR material. The advantages described above that are realized from using modified ELR materials for conductive paths can be used to more quickly and efficiently transmit signals to the system in which the packaged integrated circuit is a component.

In addition to the systems, devices, and/or applications described herein, one skilled in the art will realize that other systems, devices, materials and applications that include conductive paths may utilize the ELRIs described herein.

In the Figures, sizes of various depicted elements or components and the lateral sizes and thicknesses of various layers are not necessarily drawn to scale and these various elements may be arbitrarily enlarged or reduced to improve legibility. Also, component details have been abstracted in the Figures to exclude details such as precise geometric shape or positioning of components and certain precise connections between such components when such details are unnecessary to the detailed description of the invention. When such details are unnecessary to understanding the invention, the representative geometries, interconnections, and configurations shown are intended to be illustrative of general design or operating principles, not exhaustive.

In some implementations, an integrated circuit, component, and/or device includes modified ELR materials may be described as follows:

An integrated circuit comprising: an input/output pad; an electrostatic discharge protection circuit; a conductive path coupling the input/output pad with the electrostatic discharge protection circuit; and a ground network coupled with the electrostatic discharge protection circuit; wherein the conductive path and the ground network are formed of a modified extremely low resistance (ELR) material having a first layer comprised of an ELR material and a second layer comprised of a modifying material bonded to the ELR material of the first layer.

An integrated circuit comprising: a dielectric substrate; a conductive path disposed on the dielectric substrate of the integrated circuit, the conductive path formed of a modified extremely low resistance (ELR) material having a first layer comprised of an ELR material and a second layer comprised of a modifying material bonded to the ELR material of the first layer; and wherein at least a portion of the conductive path is a laser modified section, such that the laser modified section has a higher resistance than the rest of the conductive path.

An integrated circuit comprising: a dielectric substrate; a conductive path disposed on the dielectric substrate of the integrated circuit, the conductive path formed of a modified extremely low resistance (ELR) material having a first layer comprised of an ELR material and a second layer comprised of a modifying material bonded to the ELR material of the first layer; and wherein a plurality of sections of the conductive path include at least one laser modified section, such that the at least one laser modified section has a higher resistance than the rest of the conductive path.

An integrated circuit comprising: a conductive path disposed on a dielectric layer of the integrated circuit, wherein the conductive path is formed of a modified extremely low resistance (ELR) material having a first layer comprised of an ELR material and a second layer comprised of a modifying material bonded to the ELR material of the first layer; and a magnetic field source to produce a magnetic field affecting a portion of the conductive path such that the modified ELR material of the affected portion of the conductive path is more resistive than a non-affected portion.

An integrated circuit comprising: a conductive path disposed on a dielectric layer of the integrated circuit, wherein the conductive path is formed of a modified extremely low resistance (ELR) material having a first layer comprised of an ELR material and a second layer comprised of a modifying material bonded to the ELR material of the first layer; and a magnetoresistive random access memory (MRAM) cell to produce a magnetic field affecting a portion of the conductive path such that the modified ELR material of the affected portion of the conductive path is more resistive than a non-affected portion.

An integrated circuit comprising: a dielectric substrate; a conductive path disposed on the dielectric substrate of the integrated circuit, the conductive path formed of a modified extremely low resistance (ELR) material having a first layer comprised of an ELR material and a second layer comprised of a modifying material bonded to the ELR material of the first layer; and wherein at least a portion of the conductive path has different dimensions than the rest of the conductive path to define a current limiting element, such that the critical current of the current limiting element is less than the critical current of the rest of the conductive path.

An integrated circuit (IC) comprising: a plurality of conductive paths, wherein at least one of the plurality of conductive paths is comprised of an extremely low resistance interconnect (ELRI) having a first layer comprised of an extremely low resistance (ELR) material and a second layer comprised of a modifying material bonded to the ELR material of the first layer; a microelectromechanical system (MEMS); and a set of circuitry connected to the MEMS through the one or more conductive paths.

An integrated circuit (IC) comprising: one or more conductive paths comprised of an extremely low resistance interconnect (ELRI) having a first layer comprised of an extremely low resistance (ELR) material and a second layer comprised of a modifying material bonded to the ELR material of the first layer; a network of one or more microelectromechanical systems (MEMS); and a set of circuitry coupled to the network of MEMS through the one or more conductive paths.

An integrated circuit (IC) comprising: one or more conductive paths comprised of an extremely low resistance interconnect (ELRI) having a first layer comprised of an extremely low resistance (ELR) material and a second layer comprised of a modifying material bonded to the ELR material of the first layer; a microelectromechanical system (MEMS); and a set of passive components connected to the MEMS through the one or more conductive paths.

An integrated circuit (IC) package comprising: an IC mounting substrate having one or more conductive paths comprised of an extremely low resistance interconnect (ELRI) having a first layer comprised of an extremely low resistance (ELR) material and a second layer comprised of a modifying material bonded to the ELR material of the first layer; a microelectromechanical system (MEMS); and a network of components connected to the MEMS through the one or more conductive paths.

A microelectromechanical system (MEMS) comprising: one or more components each including a first layer having an extremely low resistance (ELR) material and a second layer having a modifying material bonded to the ELR material of the first layer.

A microelectromechanical system (MEMS) comprising: an input port to receive an input signal from outside the MEMS; a component configured to receive the input signal and generate a response; and one or more conductive paths connecting the component to the input port to allow the input signal to be transferred to the component, wherein the one or more conductive paths include a first layer comprised of an extremely low resistance (ELR) material and a second layer comprised of a modifying material bonded to the ELR material of the first layer.

A microelectromechanical system (MEMS) comprising: an output port; a component configured to generate a signal; and one or more conductive paths connecting the component to the output port to allow the signal generated by the component to be transferred to the output port, wherein the one or more conductive paths include a first layer comprised of an extremely low resistance (ELR) material and a second layer comprised of a modifying material bonded to the ELR material of the first layer.

An integrated circuit (IC) comprising: an IC mounting substrate; and a radio frequency (RF) component on the IC mounting substrate, wherein the RF component includes subcircuits interconnected through one or more conductive paths comprising a modified extremely low resistance interconnect (ELRI) having a first layer comprised of an extremely low resistance (ELR) material and a second layer comprised of a modifying material bonded to the ELR material of the first layer.

An integrated circuit (IC) comprising: a radio frequency (RF) antenna having one or more conductive paths, wherein the one or more conductive paths include a modified extremely low resistance interconnect (ELRI) having a first layer comprised of an extremely low resistance (ELR) material and a second layer comprised of a modifying material bonded to the ELR material of the first layer.

A monolithic microwave integrated circuit (MMIC) made from a single piece of silicon, the MMIC comprising: extremely low resistance interconnects (ELRIs) having a first layer comprised of an extremely low resistance (ELR) material and a second layer comprised of a modifying material bonded to the ELR material of the first layer a radio frequency (RF) filter including one or more passive elements; an RF amplifier connected to the RF filter by the ELRIs; and an RF antenna connected to the RF amplifier by the ELRIs.

A wireless device comprising: a monolithic microwave integrated circuit (MMIC) having a radio frequency (RF) transceiver and receiver circuit coupled to the power supply, wherein the RF transceiver and receiver circuit includes: extremely low resistance interconnects (ELRIs) having a first layer comprised of an extremely low resistance (ELR) material and a second layer comprised of a modifying material bonded to the ELR material of the first layer a radio frequency (RF) filter including one or more passive elements; an RF amplifier connected to the RF filter by the ELRIs; and a RF antenna connected to the RF amplifier by the ELRIs.

An integrated circuit (IC) comprising: an IC substrate having one or more conductive paths comprised of an extremely low resistance interconnect (ELRI) having a first layer comprised of an extremely low resistance (ELR) material and a second layer comprised of a modifying material bonded to the ELR material of the first layer; a set of circuitry implemented on the IC substrate; a first programmable block connected to the set of circuitry through the one or more conductive paths, and wherein the first programmable block includes: a digital signal processor (DSP) implemented on the substrate; a radio frequency (RF) transmitter coupled to the DSP; and an embedded core implemented on the IC substrate, wherein the embedded core is programmable to perform one or more functions and is coupled to the DSP; and a set of programmable ELRI blocks comprising components made from the ELRI.

An integrated circuit comprising: a substrate; and a plurality of conductive paths disposed on the substrate; wherein at least one of the plurality of conductive paths is formed of a modified extremely low resistance (ELR) material having an ELR material and a modifying material bonded to the ELR material.

An integrated circuit comprising: a first component; a second component; and a plurality of conductive paths including a specific conductive path electrically coupling the first component to the second component; wherein the specific conductive path is formed of a modified extremely low resistance (ELR) film having a first layer comprised of an ELR material and a second layer comprised of a modifying material bonded to the ELR material of the first layer.

A power distribution network for an integrated circuit comprising: a conductive path for electrically coupling a power supply to at least one component of the integrated circuit, the power supply either external or internal to the integrated circuit, the conductive path disposed on a substrate of the integrated circuit; wherein the conductive path is formed of a modified extremely low resistance (ELR) film having a first layer comprised of an ELR material and a second layer comprised of a modifying material bonded to the ELR material of the first layer.

A clock distribution network for an integrated circuit comprising: a clock driver; a trunk conductive path electrically coupled with the clock driver, the conductive path formed of a modified extremely low resistance (ELR) film having a first layer comprised of an ELR material and a second layer comprised of a modifying material bonded to the ELR material of the first layer; and a plurality of branch conductive paths electrically coupled with the trunk conductive path through a plurality of vias, the plurality of branch conductive paths formed of the modified ELR film.

A signal distribution network for an integrated circuit comprising: a plurality of conductive paths disposed on a substrate of the integrated circuit; wherein at least one of the plurality of conductive paths is formed of a modified extremely low resistance (ELR) film having a first layer comprised of an ELR material and a second layer comprised of a modifying material bonded to the ELR material of the first layer.

An integrated circuit comprising: an analog circuit; and a compensation circuit electrically coupled with the analog circuit by a conductive path; wherein the conductive path is formed of a modified extremely low resistance (ELR) film having a first layer comprised of an ELR material and a second layer comprised of a modifying material bonded to the ELR material of the first layer.

An integrated circuit comprising: a plurality of memory cells; and a sense amplifier electrically coupled with a memory cell of the plurality of memory cells; wherein the plurality of memory cells are coupled with the sense amplifier through a plurality of conductive paths, wherein at least one of the plurality of conductive paths is formed of a modified extremely low resistance (ELR) film having a first layer comprised of an ELR material and a second layer comprised of a modifying material bonded to the ELR material of the first layer.

A data flow processor comprising: a function cell; a bus electrically coupled with the function cell; and an instruction line coupled with the function cell; wherein the bus and the instruction line are formed of a modified extremely low resistance (ELR) film having a first layer comprised of an ELR material and a second layer comprised of a modifying material bonded to the ELR material of the first layer.

An integrated circuit (IC) comprising: an IC mounting substrate with one or more conductive paths comprising a modified extremely low resistance interconnect (ELRI) having a first layer comprised of an extremely low resistance (ELR) material and a second layer comprised of a modifying material bonded to the ELR material of the first layer; a radio frequency (RF) antenna implemented on the IC mounting substrate; and an RF circuit implemented on the IC mounting substrate, wherein the RF antenna is connected to the RF circuit through the ELRI.

An IC package comprising: a substrate; a power bus with one or more conductive paths for power distribution implemented on the substrate, wherein the one or more conductive paths include a first layer comprised of an extremely low resistance (ELR) material and a second layer comprised of a modifying material bonded to the ELR material of the first layer; and one or more virtual nodes formed by ground connections routed around the substrate, wherein the ground connections include a first ground connection layer comprised of a second ELR material and a second ground connection layer comprised of a second modifying material bonded to the second ELR material of the first ground connection layer.

An improved signal routing path for use on a substrate, the signal routing path including one or more conductive paths, wherein the improvement is characterized in that the one or more conductive paths each include a first layer comprised of an extremely low resistance (ELR) material and a second layer comprised of a modifying material bonded to the ELR material of the first layer.

A System-in-Package (SiP) comprising: a plurality of chips; and a conductive path electrically coupling a first chip of the plurality of chips with a second chip of the plurality of chips; wherein the conductive path is formed of a modified extremely low resistance (ELR) film having a first layer comprised of an ELR material and a second layer comprised of a modifying material bonded to the ELR material of the first layer.

Chapter 9—Rotating Machines Formed of ELR Materials

This chapter of the description refers to FIGS. 1-36 and FIGS. 151-158; accordingly all reference numbers included in this section refer to elements found in such figures.

Rotating machines, such as motors, generators, energy conversion devices, and/or flywheels, that include components formed of modified, apertured, and/or other new extremely low resistance (ELR) materials, are described. In some examples, the rotating machines include rotors having windings formed of ELR materials, stators having windings formed of ELR materials, and/or other components formed of ELR materials. For example, the windings of a rotor are composed of a modified ELR film having a YBCO layer and a modifying layer. The modified ELR materials provide extremely low resistances to current at temperatures higher than temperatures normally associated with current high temperature superconductors (HTS), enhancing the operational characteristics of the rotating machines at these higher temperatures, among other benefits.

In some examples, the ELR materials are manufactured based on the type of materials, the application of the ELR materials, the size of the component employing the ELR materials, the operational requirements of a device or machine employing the ELR materials, and so on. As such, during the design and manufacturing of a rotating machine, the material used as a base layer of a modified ELR film and/or the material used as a modifying layer of the modified ELR film may be selected based on various considerations and desired operating and/or manufacturing characteristics.

Figure 151A:
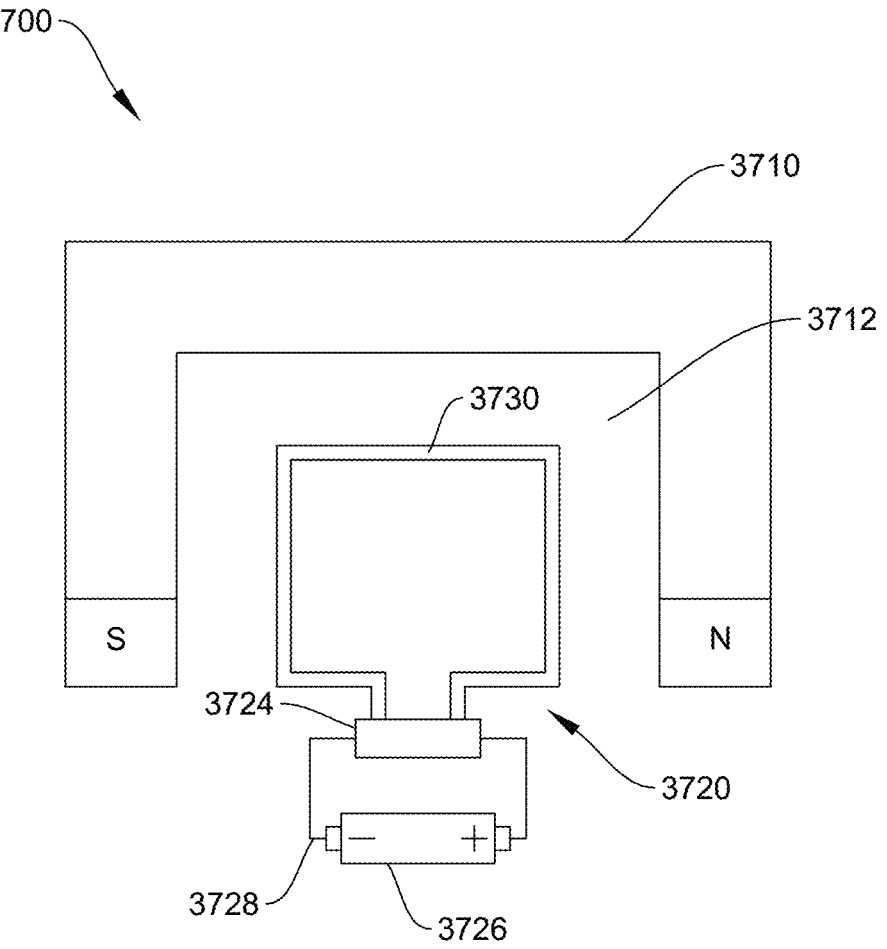
FIGS. 151A to 158 illustrate the forming of rotating machines using ELR materials.

FIG. 151A is a schematic diagram illustrating a rotating machine 3700 utilizing ELR materials. The rotating machine 3700 includes a stator 3710 and a rotor 3720, or armature. The stator 3710, in this example a permanent magnet having a north "N" pole and an opposing south "S" pole, produces a magnetic field within a gap 3712 that contains an ELR-based winding 3730 of the rotor 3720. The winding 3730 is formed of modified, apertured, and/or other new ELR materials, such as a film having a ELR material base layer and a modifying layer formed on the base layer. Various suitable ELR materials are described in detail herein.

A battery 3726 or other electricity source applies a voltage (AC or DC) to the ELR-based winding 3730 via leads 3728, causing current to flow within the ELR-based winding 3730. The ELR-based winding 3730 provides little or no resistance to the flow of current in the winding 3730 at temperatures higher than those used in conventional HTS materials, such as room or ambient temperatures (e.g., at ~21 degrees C.).

The current flow in the ELR-based winding 3730 produces a magnetic field within the magnetic field of the stator 3710, producing torque on the rotor 3720 and causing the rotor 3720 to rotate within the gap 3712 (i.e., the winding 3730 rotates in and out of the page) or otherwise relative to the stator 3710, such as about an axle 3724 or other support structure of the rotor 3720, and/or about itself, such as for rotors that do not include a support structure.

In some examples, the ELR material that forms the winding 3730, or other components, may provide extremely low resistance to the flow of current at temperatures between the transition temperatures of conventional HTS materials (e.g., at ~80 to 135 K) and room temperatures (e.g., ~294 K), or other temperatures lower than a temperature surrounding the winding 3730 or an associated rotating machine. For example, the ELR material may provide extremely low resistance to the flow of current at temperatures between 150 K and 313 K, or higher.

Figure 151B:
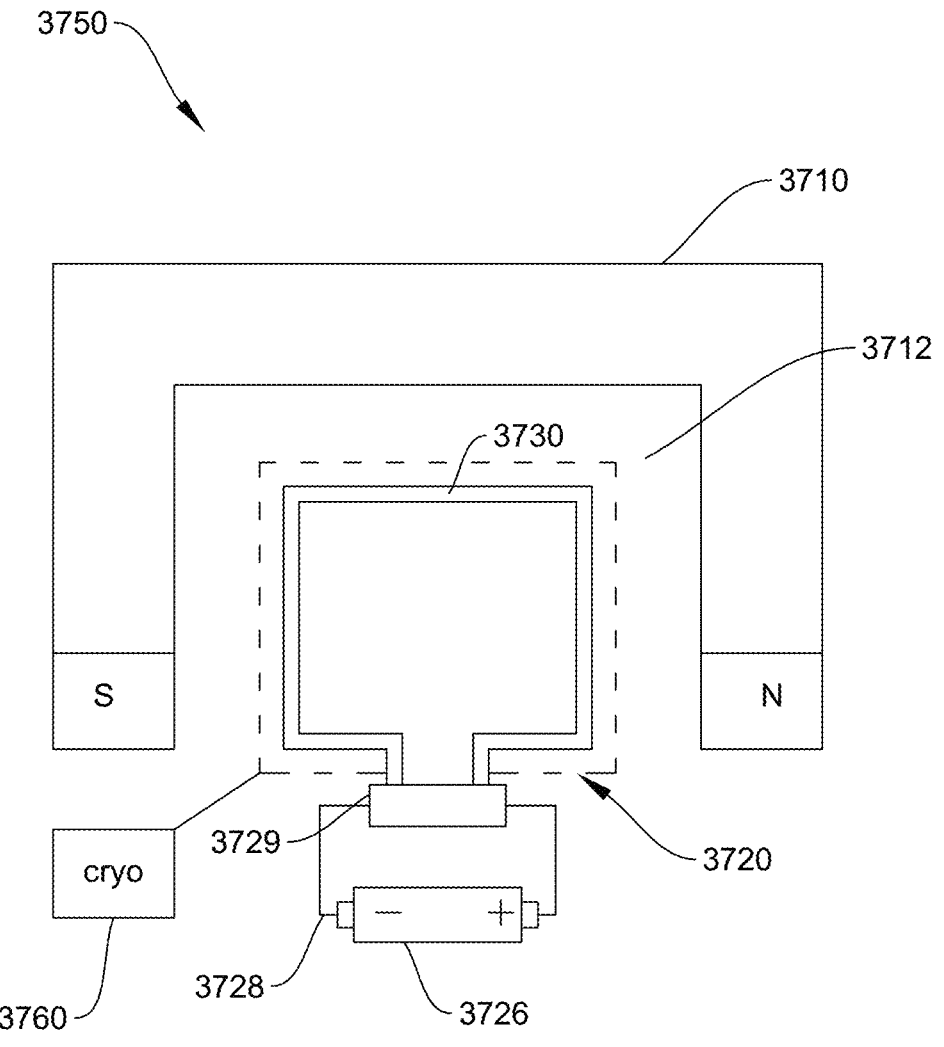

FIG. 151B is a schematic diagram illustrating a rotating machine 3750 having a cooling system. Similar to the rotating machine 3700 shown in FIG. 151A, the rotating machine 3750 includes a stator 3710 and a rotor 3720 having an ELR-based winding 3730 that provides extremely low resistance to the flow of current at various high temperatures (e.g. at T>150 K). The rotating machine 3750 includes a cooling system 3760, such as a cyrocooler or cryostat, used to cool the winding 3730 to a critical temperature for the type of modified ELR film utilized in the winding 3730 of the rotating machine 3750. For example, the cooling system 3760 may be a system capable of cooling the winding 3730 to a temperature similar to that of liquid Freon, to a temperature similar to that of ice, or other temperatures discussed herein. That is, the cooling system may be selected based on the type and structure of the ELR material utilized in the winding 3730 of the rotor 3720, and may cool the winding 3730 to a temperature lower than a surrounding temperature of the winding 3730.

In some examples, the cooling system 3760 may include or communicate with a monitoring component (not shown). The monitoring component may monitor, among other things, a temperature of an ELR winding, rotor, stator, and/or rotating machine, a resistivity of an ELR component, and other parameters. During monitoring, the monitoring component may cause the cooling system to increase and/or decrease an applied temperature or coolant when a monitored parameter satisfies a certain threshold. For example, if a monitored temperature rises above (or approaches) a critical temperature of an ELR material, the monitoring component may cause the cooling system to lower a temperature of the ELR material. Of course, one of ordinary skill in the art will appreciate that other techniques may be employed when monitoring and/or adjusting operation of a cooling system.

Although shown in FIGS. 151A and 151B in a general fashion, the rotating machines 3700 or 3750 may be a DC motor, an AC motor, a generator, an alternator, a mechanical energy to electrical energy converter, an inverter, or other machines and devices that convert electrical energy to mechanical energy and/or one form of electrical energy to another form of electrical energy (e.g., AC to DC). Further details regarding various rotating machines that may benefit from implementing ELR materials are discussed herein.

In addition to the stand alone winding shown in FIGS. 151A and 151B, the rotor 3720 of the rotating machine 3700 may be configured in a variety of ways, based on a number of factors, including the type of rotating machine, the use or application of the rotating machine, the size of the rotating machine, the operation requirements of the rotating machine, the type of ELR material, and so on. FIGS. 152A-D, 153, and 154A-B are schematic diagrams of various rotors for use within rotating machines that utilize modified, apertured, and/or other new ELR materials, although one of ordinary skill will appreciate that other rotors not specifically discussed may also utilize the ELR materials discussed herein.

Figure 152A:
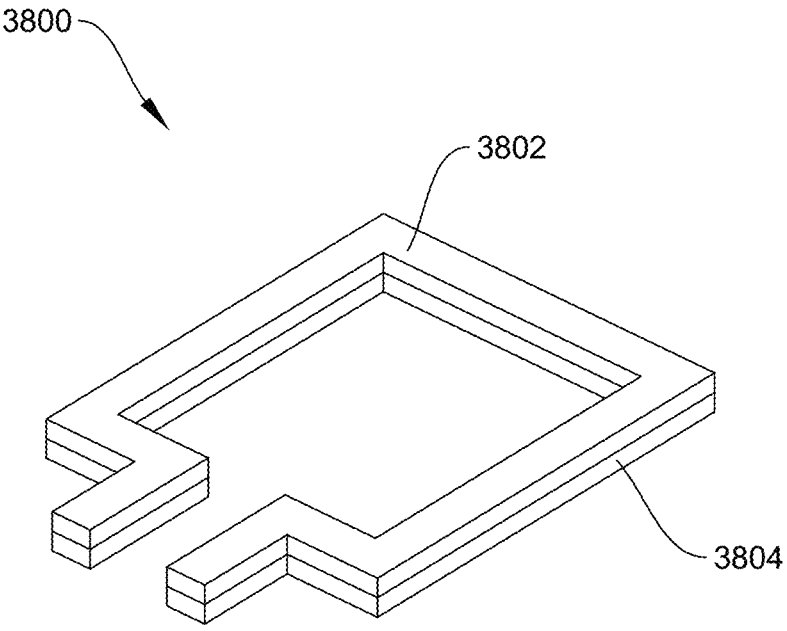

FIG. 152A is a schematic diagram illustrating a rotor 3800 having a winding formed of an ELR film 3802 and a support structure 3804 supporting the modified ELR film 3802. The ELR film 3802 may be formed on the support structure 3804, such as by forming the ELR film 3802 into a tape, foil or other similar component. The support structure 3804 may be formed of iron or other suitable materials (e.g., other magnetic materials, ceramics, amorphous metals, and so on) capable of providing support to the ELR film, providing strength to magnetic fields produced by current flowing through the ELR film 3802, and so on.

There are various techniques for producing and manufacturing tapes of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and/or other solution deposition techniques to produce modified ELR tapes.

Figure 152B:
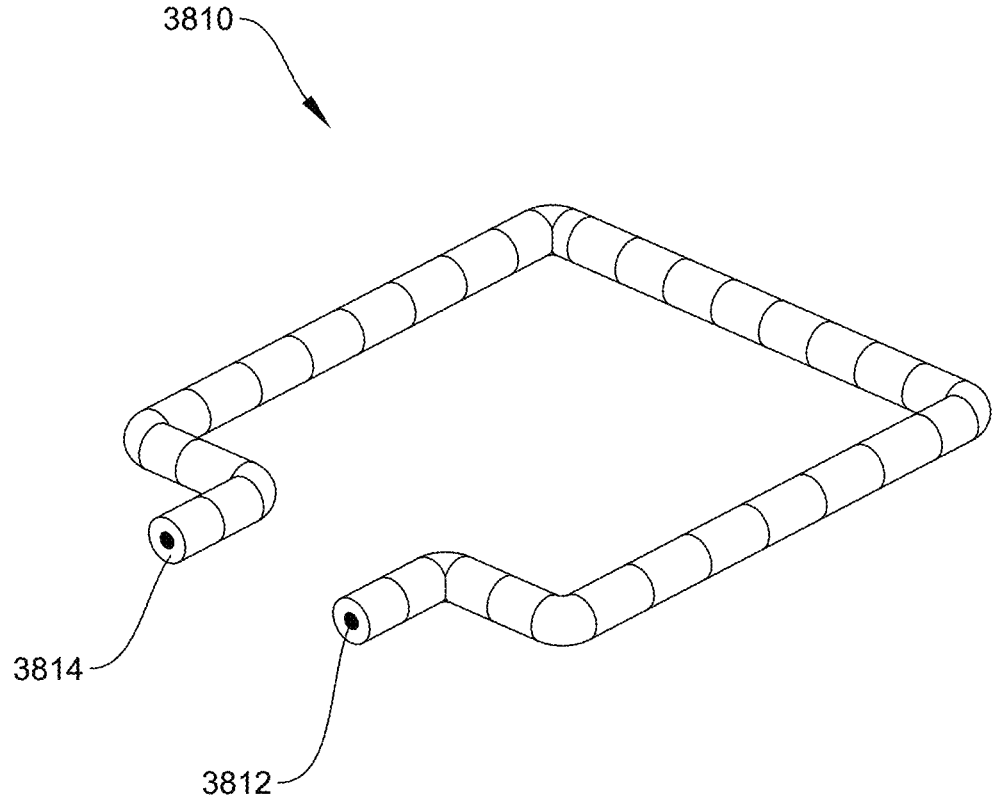

FIG. 152B is a schematic diagram illustrating a rotor 3810 having a winding formed as an ELR-based wire 3812, and a support layer 3814. Although the wire 3812 is formed within the support layer 3814 in the Figure, in some cases the wire may stand-alone or be formed around a support layer 3814.

In forming an ELR wire, multiple ELR tapes or foils may be sandwiched together to form a macroscale wire. For example, a winding may include a supporting structure and one or more ELR tapes or foils supported by the supporting structure.

In addition to ELR wires, the windings described herein may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

Figure 152C:
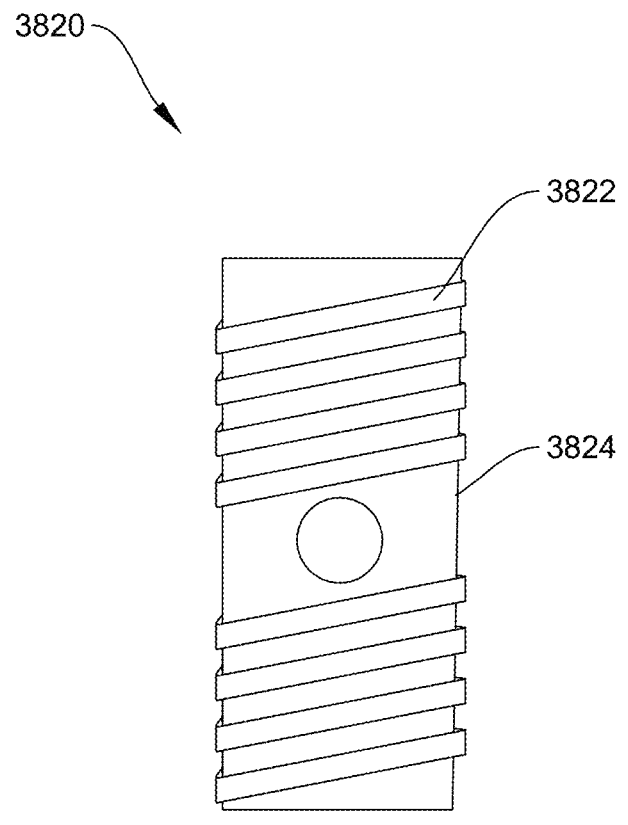

FIG. 152C is a schematic diagram illustrating a rotor 3820 having a winding 3822 formed of ELR materials, such as a modified ELR tape or wire, and a core or shaft 3824, such as an iron core. In some cases, the number of turns in the winding 3822 is selected based on the desired torque on the rotor 3820, or other factors. In some cases, the type of material used for the winding 3822 and/or the core 3824 is selected based on the desired torque on the rotor 3820, or other factors.

Figure 152D:
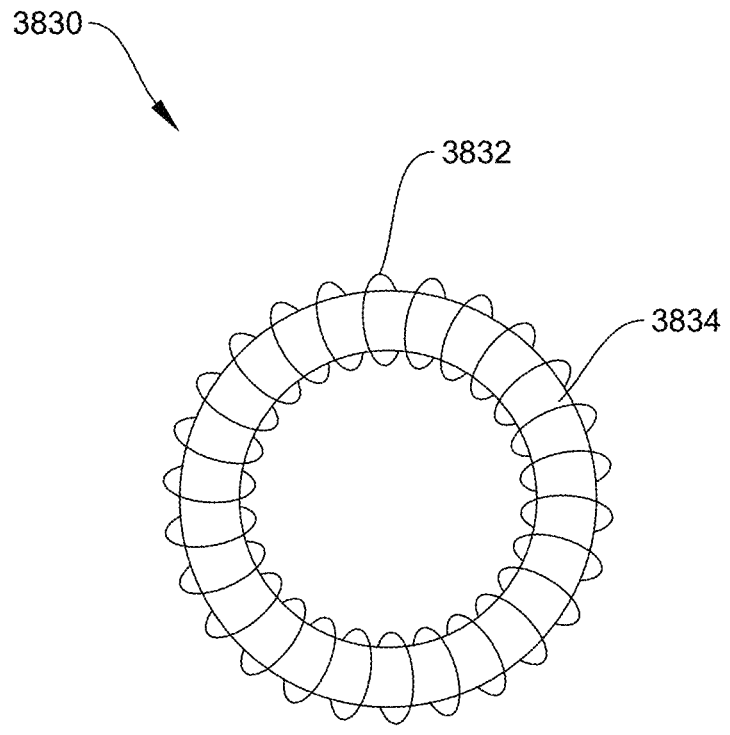

FIG. 152D s a schematic diagram illustrating a rotor 3830 having a winding 3832 formed of ELR materials, such as a modified ELR tape or wire, and a circular core 3834, such as an iron core. In some cases, the number of turns in the winding 3822 is selected based on the desired torque on the rotor 3830, or other factors. In some cases, the type of material used for the winding 3832 and/or the core 3834 is selected based on the desired torque on the rotor 3830, or other factors.

Figure 153:
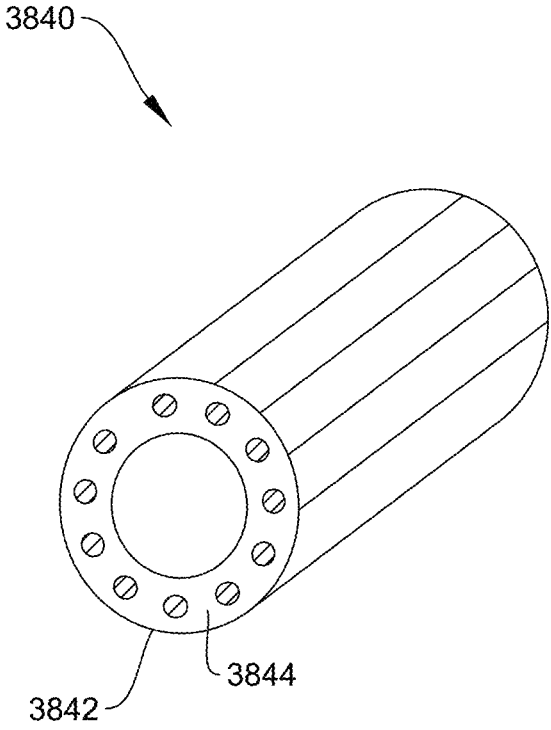

FIG. 153 is a schematic diagram illustrating a rotor 3840 having rods 3842 formed of ELR materials, such as a modified ELR tape or nanowire, and a supporting structure 3844. The rotor 3840 may be similar to the squirrel cage rotors known in the art, or other similar rotors.

Figure 154A:
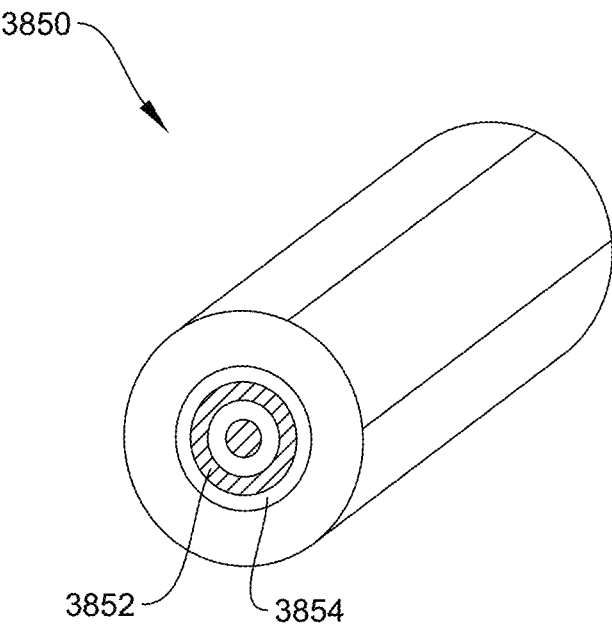

FIG. 154A is a schematic diagram illustrating a rotor 3850 having a ring 3852 formed of ELR materials, and one or more supporting rings 3854. In some cases, the ELR ring 3852 may be one continuous ring around the axis of rotation of the rotor 3850. In some cases, the ELR ring 3852 may be two or more discrete rings around the axis of rotation of the rotor 3850.

Figure 154B:
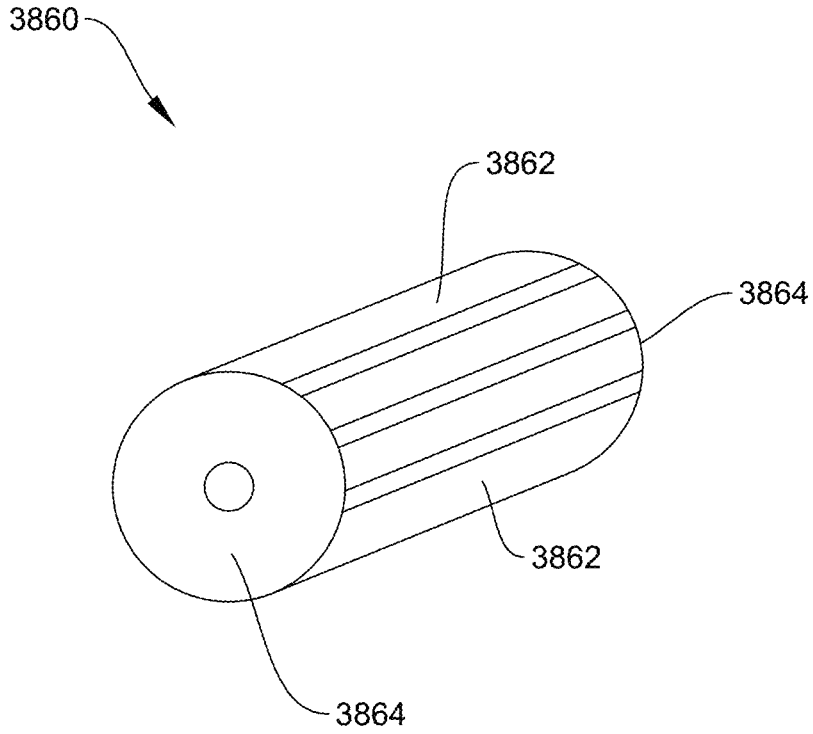

FIG. 154B is a schematic diagram illustrating a rotor 3860 having multiple strips or rods 3862 formed of ELR materials, such as modified ELR tapes or nanowires, and a support structure 3864. In some cases the ELR strips or rods 3862 are formed on a support structure 3864 that extends the length of the rotor 3860. In some cases, the support structure 3864 supports the ends of the strips or rods 3862, and the rotor 3860 is similar in construction to a squirrel cage rotor.

As mentioned above, one of ordinary skill will appreciate that the rotors contemplated for use with the ELR materials described herein may take on forms other than those illustrated in FIGS. 152A-D, 153, and 154A-B. That is, the ELR materials may be manufactured in a variety of ways to achieve the desired forms. The ELR materials may formed into wires, tapes, rods, strips, nanowires, films, foils, other shapes or structures, and/or other geometries capable of moving or carrying current from one point to another in order to produce a magnetic field. While some suitable geometries are shown and described herein for some windings, rotors, stators, and/or other components, numerous other geometries are possible. These other geometries include different patterns, configurations or layouts with respect to length and/or width, in addition to differences in thickness of materials, use of different layers, and other three-dimensional structures.

In some examples, the type of ELR materials used in windings and/or other components or devices may be determined by the type of application utilizing the ELR materials. For example, some applications may utilize ELR materials having a BSCCO ELR layer, whereas other applications may employ a YBCO ELR layer. That is, the ELR materials described herein may be formed into certain structures (e.g., tapes or wires) and formed from certain materials (e.g., YBCO or BSCCO) based on the type of machine or component utilizing the ELR materials, among other factors.

In addition to rotors, other components of a rotating machine may utilize the ELR materials described herein. For example, stators having conductive windings, leads between components (such as battery leads), and other components may employ ELR materials. Various rotating machines and components that may utilize the ELR materials described herein will now be discussed.

Figure 155:
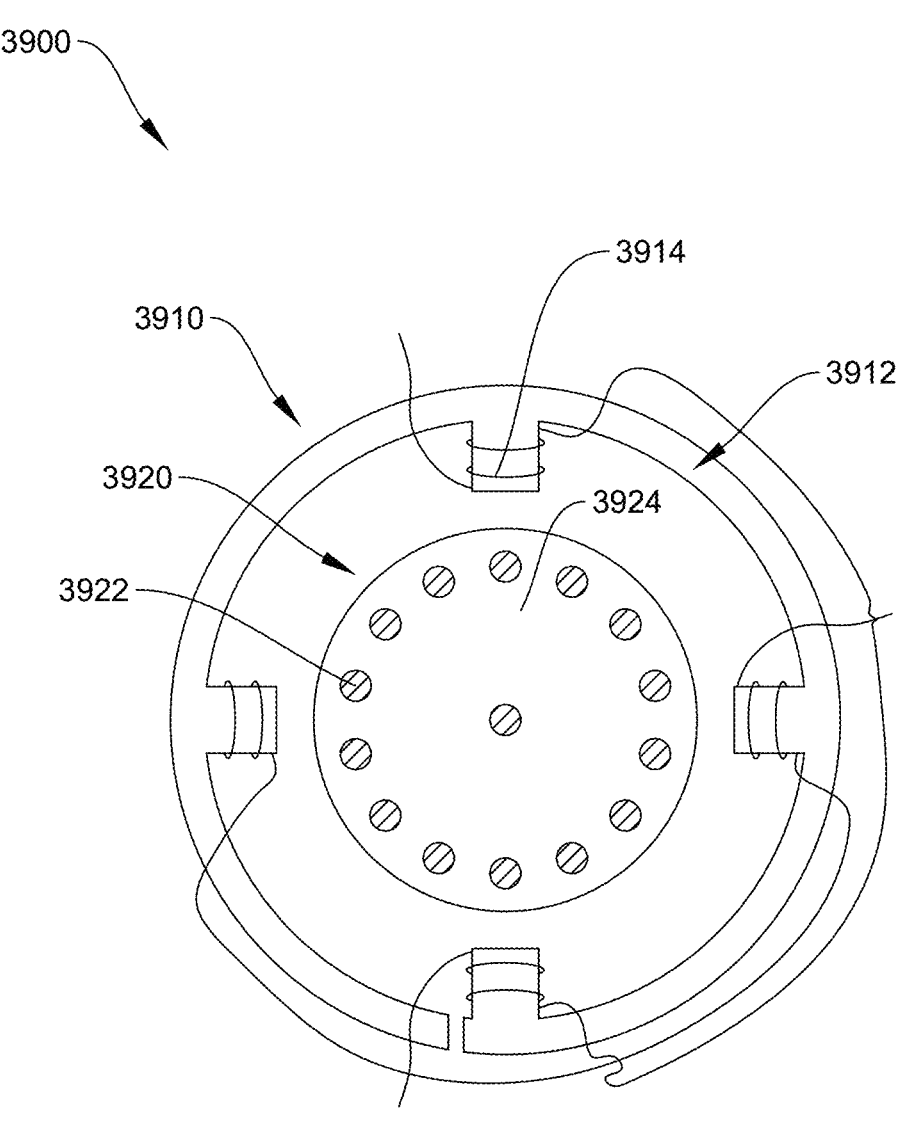

FIGS. 151A and 151B depict rotating machines having a rotor with a modified ELR film winding that carries current at an extremely low resistance to produce a magnetic field. However, in some examples, a rotating machine may include a stator having a modified ELR film winding that carries current to produce a magnetic field in a gap housing a rotor. FIG. 155 is a schematic diagram of a rotating machine 3900 having a stator with an ELR winding. The rotating machine 3900 includes a stator having a support structure 3912 and a winding 3914 formed of modified, apertured, and/or other new ELR materials, such as a modified ELR wire or tape. A rotor 3920 sits within a gap 3915 of the stator 3910. The rotor 3920 includes one or more ELR components, such as rods 3922, held together by a support structure 3924.

As discussed herein, the ELR winding 3914 and/or the ELR rods 3922 may be formed in a variety of ways using a variety of different materials. For example, the winding may be formed of a modified ELR tape or wire.

Thus, the ELR materials described herein may be utilized as or within a variety of different components of a rotating machine, including as or within the winding of a rotor, as or within the winding of a stator, as or within a rod or a rotor, as or within a tape, as or within a ring, as a lead or other connective element between components, and so on. A large variety of rotating machines, including motors, generators, alternators, rotating energy converters (AC to DC, DC to DC, DC to AC), flywheels, and others, may utilize such films. A few examples will now be discussed.

Figure 156:
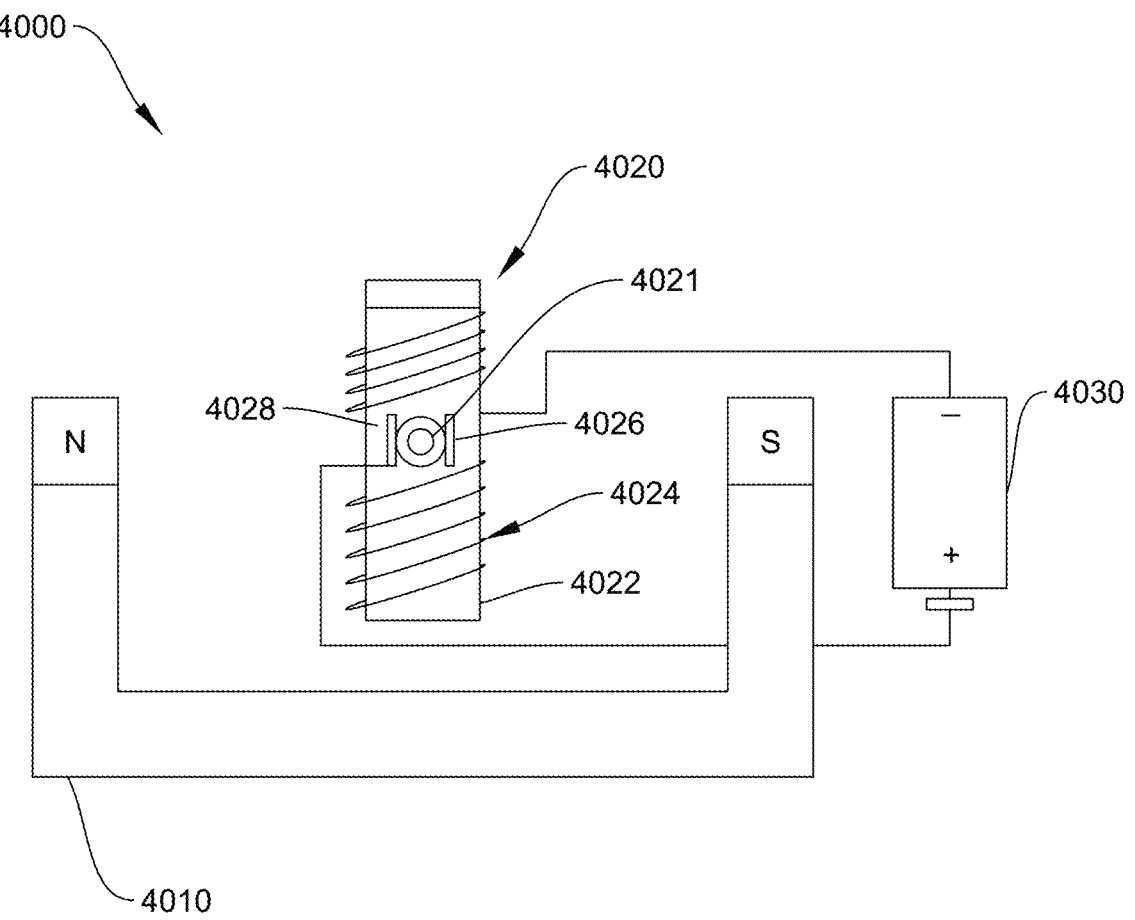

FIG. 156 is a schematic diagram of a brushed DC motor 4000 employing ELR materials. The brushed DC motor 4000 includes a stator 4010 formed of a permanent magnet, a rotor 4020 formed of a core 4022 (e.g., iron, ceramic, amorphous metal, air), and an ELR-based winding 4024, an axle 4021 or other support that facilitates rotation of the rotor 4020 within the stator 4010, brushes 4026 that provide current to the windings 4024 from a current source 4030, and a commutator 4028 that commutates the windings 4024 of the rotor 4020.

Various types of brushed DC motors, or stepper motors, may utilize modified ELR films as or within various components, including Permanent Magnet Brushed DC (PMDC) motors, Shunt-Wound Brushed DC (SHWDC) motors, Series-Wound Brushed DC (SWDC) motors, Compound Wound (CWDC) motors, and so on.

Figure 157:
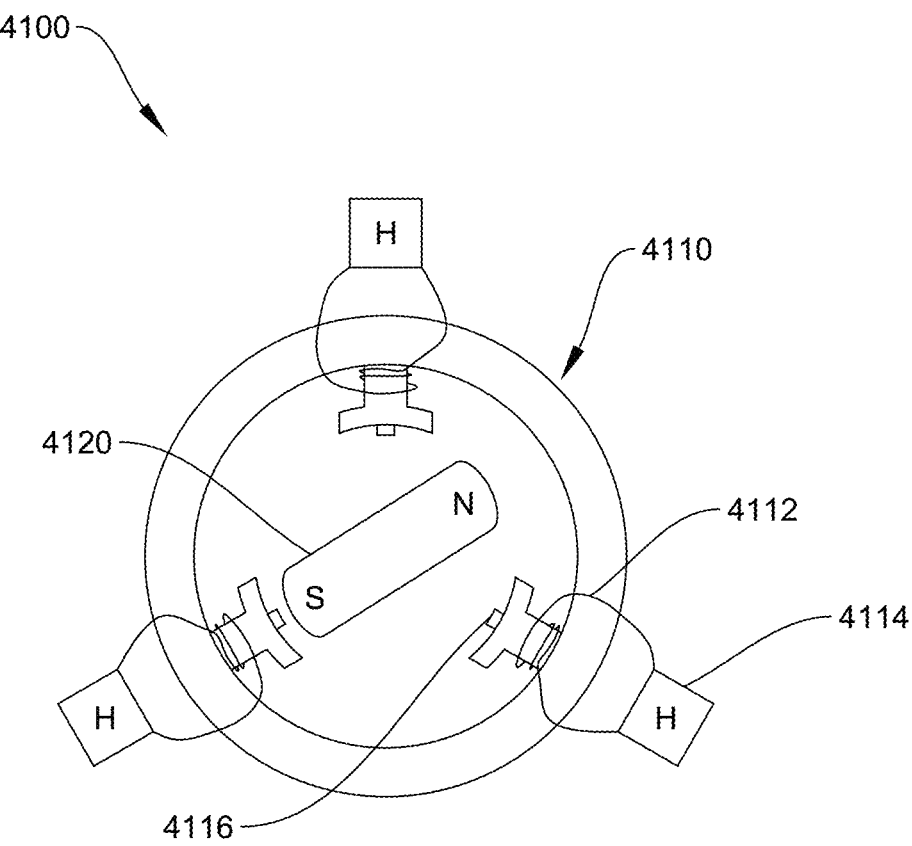

FIG. 157 is a schematic diagram of a brushless DC motor 4100 employing ELR materials. The brushless DC motor 4100 includes a stator 4110 formed of a support structure 4114 and a modified ELR film winding 4112, hall effect sensors 4116 and hall effect commutators 4118, and a rotor 4120 formed of a permanent magnet that rotates within the stator 4110. Various types of brushless DC motors, or electronically commutating motors, may utilize ELR materials as or within various components.

Figure 158:
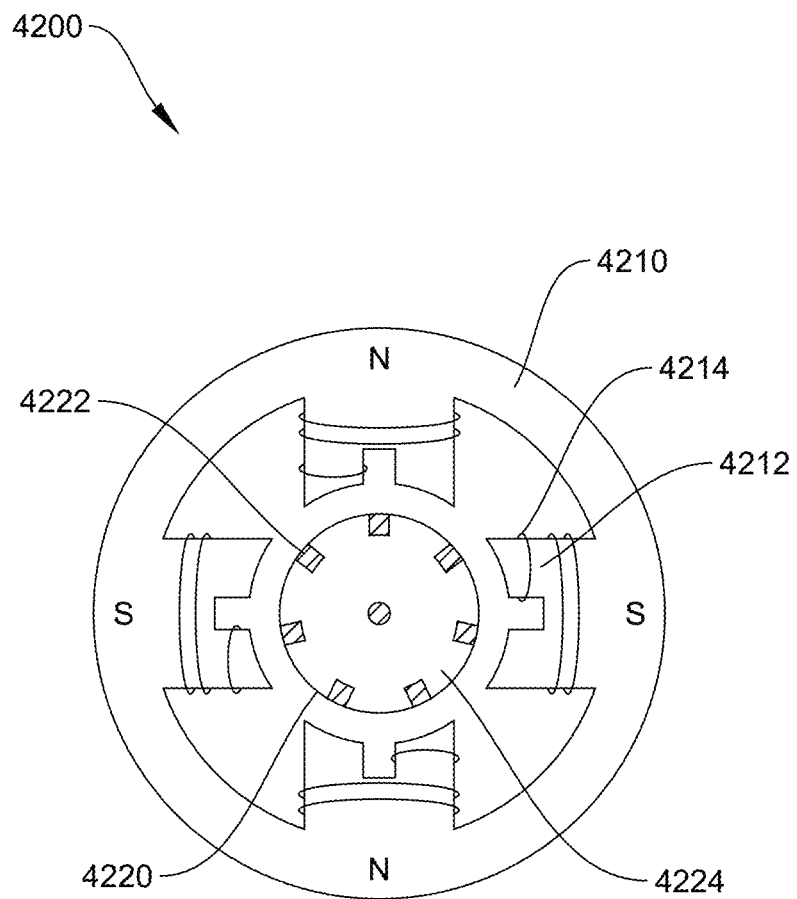

FIG. 158 is a schematic diagram of an AC motor 4200 employing ELR materials. The AC induction motor 4200 includes a stator 4210 having an ELR winding 4214 wrapped around poles 4212 of the stator 4210, and a rotor 4220, having conductive elements 4222 (which may be ELR materials) and a shaft 4224 or other support structure, that rotates within the stator 4210.

Various types of AC motors may utilize ELR materials as or within various components, including Single-Phase Induction motors (e.g., Split-Phase Induction motors, Capacitor Start Induction motors, Permanent Split Capacitor Induction motors, Capacitor Start/Capacitor Run Induction motors, Shaded-Pole AC Induction motors, and so on) and Three-Phase Induction motors (e.g., Squirrel Cage motors, Wound-Rotor motors, and so on).

Of course, one of ordinary skill in the art will appreciate other rotating machines may employ the ELR materials described herein, including Universal motors, Printed Armature or Pancake motors, Servo motors, Electrostatic motors, Torque motors, Stepper motors, Hub motors, Fan motors, generators, alternators, air core motors, flywheels, magnetic clutches, power machines, and/or other rotating machines.

The various rotating machines described herein may perform with improved or enhanced operating characteristics by utilizing modified, apertured, and/or other new ELR materials. For example, the rotating machines may exhibit fewer resistive losses from the resistances of various conductive elements, such as windings, leads, capacitive elements, and so on. It follows that devices employing rotating machines having improved operating characteristics may in turn benefit with similar improvements. Examples of devices that may employ rotating machines utilizing modified ELR materials include fans, turbines, drills, pumps, electric drive trains, the wheels on electric cars, train locomotive traction, electric clutches, conveyor belts, robots, vehicles, appliances, engines, manufacturing equipment, information storage systems, e.g. hard disk drives, physical exercise equipment, prosthetic devices, exoskeletons, toys, roller skates/blades, lawn and garden equipment, shoes, furniture, and many others.

In some implementations, a rotating machine that includes modified ELR materials may be described as follows:

A rotating machine, comprising: a stator assembly; and a rotor assembly positioned to rotate within the stator assembly, wherein the rotor assembly includes a support structure and a winding formed of a modified ELR material.

A rotor for use in a rotating machine, the rotor comprising: a support structure; and a winding coupled to the support structure and formed of a modified ELR material.

A rotating machine, comprising: a stator; and a rotor, wherein the rotor is formed of a material that provides extremely low resistances to electric current at temperatures greater than 150 Kelvin at standard pressure.

A rotor assembly for use in a rotating machine, the rotor assembly comprising: a core structure formed of a magnetic material; and a modified ELR film configured to carry electric current, wherein the modified ELR film is formed of a first layer comprised of an ELR material and a second layer comprised of a modifying material bonded to the ELR material of the first layer.

A stator assembly for use in a rotating machine, the stator assembly comprising: a support structure; and a modified ELR film configured to carry electric current, wherein the modified ELR film is formed of a first layer comprised of an ELR material and a second layer comprised of a modifying material bonded to the ELR material of the first layer.

A winding configured to carry an electric current in order to produce a magnetic field within a rotating machine, the winding comprising: a first layer, wherein the first layer is comprised of an ELR material; and a second layer, wherein the second layer is comprised of a modifying material bonded to the ELR material of the first layer.

A rotating machine, comprising: a stator assembly, wherein the stator assembly includes a support structure and a winding formed of a modified ELR material; and a rotor positioned to rotate within the stator assembly.

A stator for use in a rotating machine, the stator comprising: a support structure; and a winding coupled to the support structure and formed of a modified ELR material.

A rotating machine, comprising: a rotor; and a stator, wherein the stator is formed of a material that provides extremely low resistances to electric current at temperatures greater than 150 Kelvin at standard pressure.

A rotating machine, comprising: a stator assembly; a rotor assembly positioned to rotate within the stator assembly, wherein the rotor assembly includes a support structure and a winding formed of a modified ELR material; and a cooling system that maintains the winding formed of the modified ELR material at a temperature between 135 K and 273 K.

A rotating machine, comprising: a stator assembly, wherein the stator assembly includes a support structure and a winding formed of a modified ELR material; a rotor assembly positioned to rotate within the stator assembly; and a cooling system that maintains the winding formed of the modified ELR film at a temperature lower than a temperature surrounding the winding.

A rotating machine, comprising: a stator; a rotor, wherein the rotor is formed of a material that provides extremely low resistances to electric current at temperatures between 150 K and 313 K; and a cooling component that maintains the material providing extremely low resistances to electric current at or below a critical temperature of the material.

A DC motor, comprising: a stator assembly, wherein the stator assembly includes a gap configured to receive a rotor assembly; and a rotor assembly configured to rotate within the gap of the stator, the rotor assembly comprising: a core structure formed of a magnetic material; and a winding of modified ELR material configured to carry electric current, wherein the modified ELR material is formed of a first layer comprised of an ELR material and a second layer comprised of a modifying material bonded to the ELR material of the first layer.

An AC induction motor, comprising: a rotor assembly configured to rotate within a gap of a stator assembly, wherein the rotor assembly is formed of a magnetic material; and a stator assembly configured to provide a gap in which to receive the rotor assembly, the stator assembly comprising: a support structure; and a modified ELR material configured to carry electric current, wherein the modified ELR material is formed of a first layer comprised of an ELR material and a second layer comprised of a modifying material bonded to the ELR material of the first layer.

A brushed DC motor, comprising: a stator formed of a permanent magnet; and a rotor formed of an iron core and a modified ELR winding, wherein the modified ELR winding carries current at approximately zero resistance under ambient temperatures.

A DC motor, comprising: a stator assembly, wherein the stator assembly includes a gap configured to receive a rotor assembly; and a rotor assembly configured to rotate within the gap of the stator, the rotor assembly comprising: a winding of modified ELR material configured to carry electric current, wherein the modified ELR material is formed of a first layer comprised of an ELR material and a second layer comprised of a modifying material bonded to the ELR material of the first layer.

An AC induction motor, comprising: a rotor assembly configured to rotate within a gap of a stator assembly, wherein the rotor assembly is formed of a magnetic material; and a stator assembly configured to provide a gap in which to receive the rotor assembly, the stator assembly comprising: a support structure; and a modified ELR material configured to carry electric current, wherein the modified ELR material is formed of a first layer comprised of an ELR material and a second layer comprised of a modifying material bonded to the ELR material of the first layer.

A brushed DC motor, comprising: a stator formed of a permanent magnet; and a rotor formed of a non-magnetic core and a modified ELR winding, wherein the modified ELR winding carries current at approximately zero resistance under ambient temperatures.

A vehicle, comprising: a DC motor, wherein the DC motor includes: a stator assembly, wherein the stator assembly includes a gap configured to receive a rotor assembly; and a rotor assembly configured to rotate within the gap of the stator, the rotor assembly comprising: a core structure formed of a magnetic material; and a winding of modified ELR material configured to carry electric current, wherein the modified ELR material is formed of a first layer comprised of an ELR material and a second layer comprised of a modifying material bonded to the ELR material of the first layer.

An electric vehicle, comprising: an induction motor, wherein the inductor motor includes: a rotor assembly configured to rotate within a gap of a stator assembly, wherein the rotor assembly is formed of a magnetic material; and a stator assembly configured to provide a gap in which to receive the rotor assembly, the stator assembly comprising: a support structure; and a modified ELR material configured to carry electric current, wherein the modified ELR material is formed of a first layer comprised of an ELR material and a second layer comprised of a modifying material bonded to the ELR material of the first layer.

A motor vehicle, comprising: a support structure; multiple rotating machines, each including at least one modified ELR component; a cooling system coupled to the multiple rotating machines and configured to maintain a temperature of the at least one modified ELR component at a temperature lower than a temperature surrounding the at least one modified ELR component; and a monitoring component coupled to the cooling system and configured to monitor a state of the at least one modified ELR component.

An appliance, comprising: a DC motor, wherein the DC motor includes: a stator assembly, wherein the stator assembly includes a gap configured to receive a rotor assembly; and a rotor assembly configured to rotate within the gap of the stator, the rotor assembly comprising: a core structure formed of a magnetic material; and a winding of modified ELR material configured to carry electric current, wherein the modified ELR material is formed of a first layer comprised of an ELR material and a second layer comprised of a modifying material bonded to the ELR material of the first layer.

An electric appliance, comprising: an induction motor, wherein the inductor motor includes: a rotor assembly configured to rotate within a gap of a stator assembly, wherein the rotor assembly is formed of a magnetic material; and a stator assembly configured to provide a gap in which to receive the rotor assembly, the stator assembly comprising: a support structure; and a modified ELR material configured to carry electric current, wherein the modified ELR material is formed of a first layer comprised of an ELR material and a second layer comprised of a modifying material bonded to the ELR material of the first layer.

A system, comprising: an ELR-based sub-assembly, including: a component formed at least in part of a modified ELR material; and a coolant interface configured to receive or discharge coolant used to maintain the modified ELR material in an ELR state.

A rotating machine, comprising: an electrical sub-assembly, wherein the electrical sub-assembly includes a modified or apertured ELR material and is configured to receive electrical energy; and a rotational sub-assembly, wherein the rotational sub-assembly is configured to provide rotational energy based on the received electrical energy.

Chapter 10—Bearings Formed of ELR Materials

This chapter of the description refers to FIGS. 1-36 and FIGS. 159-167; accordingly all reference numbers included in this section refer to elements found in such figures.

Bearing assemblies, such as bearings for use in rotating machines, that include components formed of modified, apertured, and/or other new extremely low resistance (ELR) materials, are described. In some examples, the bearing assemblies include bearings having windings and/or coils formed of ELR materials or other components formed of ELR materials. For example, the windings of a bearing are composed of a modified ELR film having a YBCO layer and a modifying layer. The ELR materials provide extremely low resistances to current at temperatures higher than temperatures normally associated with current high temperature superconductors (HTS), enhancing the operational characteristics of the bearing assemblies at these higher temperatures, among other benefits.

Figure 159:
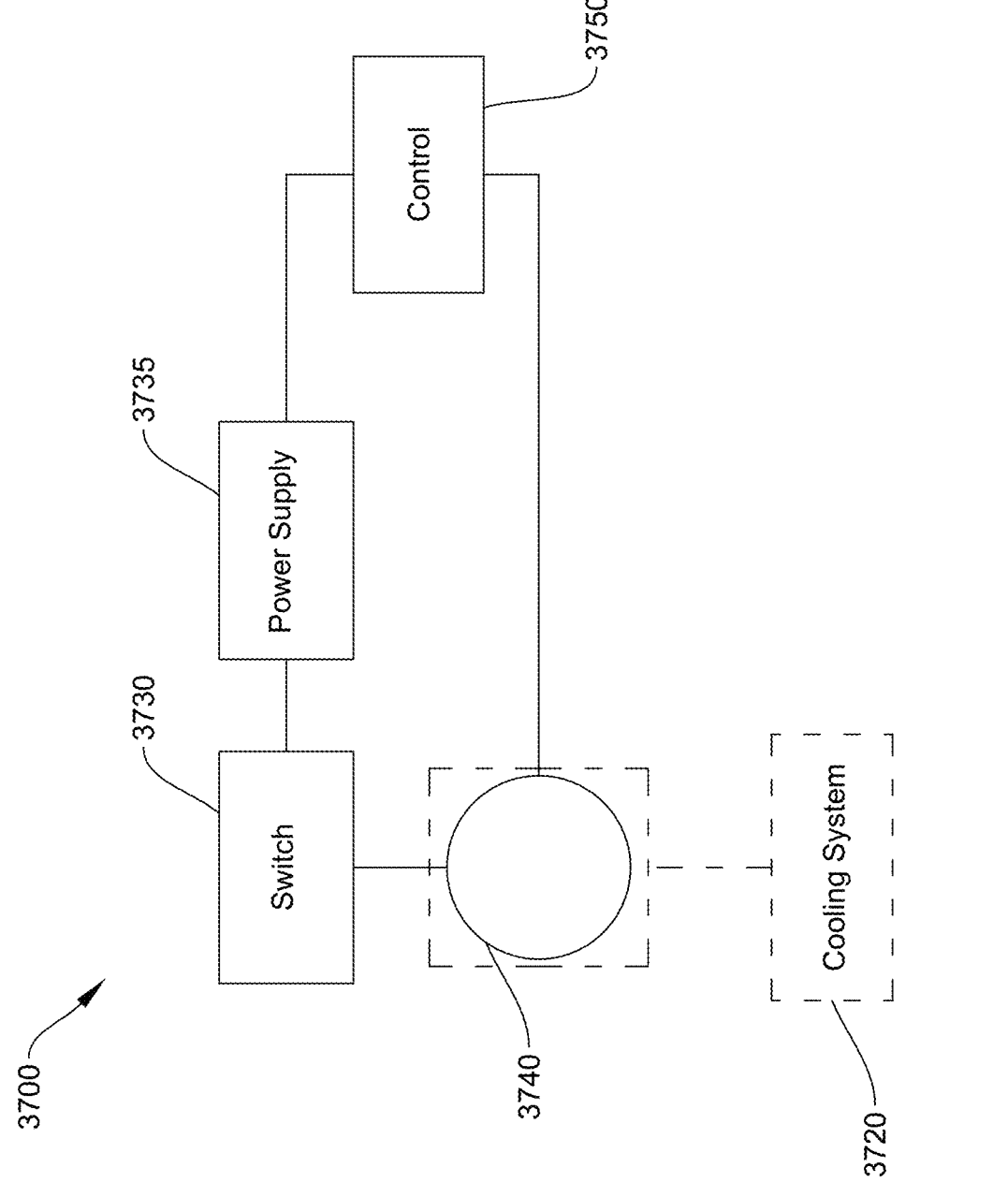
FIGS. 159 to 167 illustrate the forming of bearings using ELR materials.

As described herein, bearing assemblies, such as bearing assemblies that utilize levitated rotated bearings, may employ various ELR elements, such as modified ELR elements. FIG. 159 is a block diagram of a suitable circuit 3700 including a bearing assembly employing ELR materials. The circuit 3700 includes elements that provide, control, modify, and/or maintain a current within an ELR coil or winding of a bearing assembly 3710. The circuit 3700 includes a switch 3730, a power supply 3735, a controller 3750, and an optional cooling system 3720. The power supply 3735 provides power to the bearing assembly 3710 via the switch 3730 to cause a current within the ELR coil or winding of the bearing assembly 3710. The controller 3750 controls the application of the power supply 3735 on the bearing assembly 3710.

In some examples, the ELR coil or winding within the bearing assembly 3710, or other ELR components, may provide extremely low resistance to the flow of current at temperatures between the transition temperatures of conventional HTS materials (e.g., at ~80 to 135 K) and room or ambient temperatures (e.g., at ~294 K), or at other temperatures lower than a temperature surrounding a coil or winding. The circuit may, therefore, include a cooling system 3720, such as a cyrocooler or cryostat, used to cool various components of the bearing assembly 3710 to a critical temperature for the type of modified ELR material utilized by the bearing assembly 3710. For example, the cooling system 3720 may be a system capable of cooling the bearing assembly 3710 to a temperature similar to that of a boiling point of liquid Freon, to a temperature similar to that of the melting point of water, or to other temperatures discussed herein. That is, the cooling system 3720 may be selected based on the type and/or structure of the modified ELR material utilized in the bearing assembly 3710, by the environment in which the bearing assembly is located, and so on.

Figure 160:
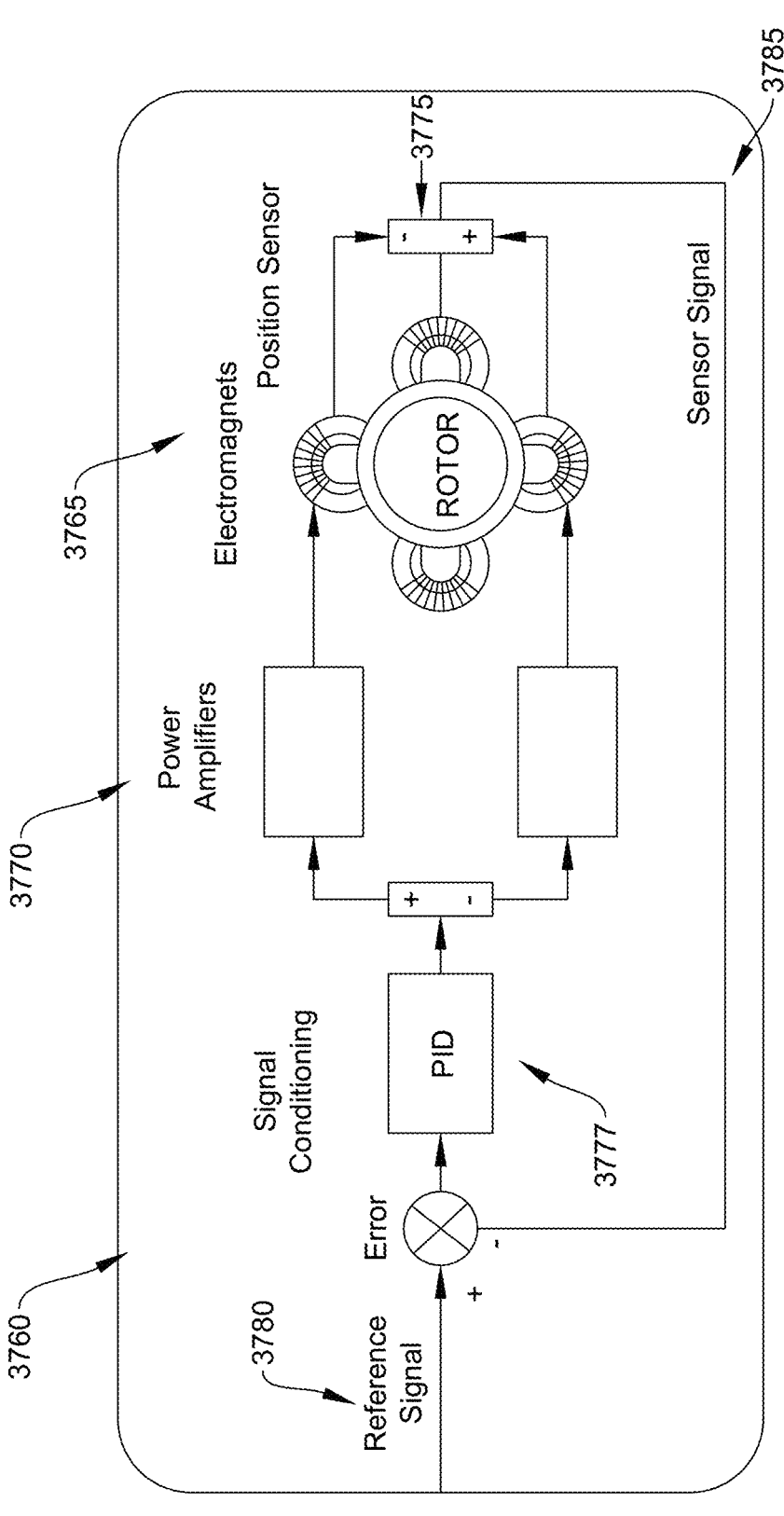

Various systems, devices, and other apparatus may employ bearing assembly 3700 or other bearing assemblies and/or components described herein. FIG. 160 is a block diagram of a system 3760 employing a bearing assembly, such as bearing assembly 3700. The system 3760 may include a bearing assembly 3765, such as a bearing assembly including an electromagnetic stator and rotor having ELR components. The system 3760 may also include power amplifiers 3770, which may include various ELR-based components, that amplify signals received from a signal-conditioning component 3770, such as a proportional-integral-derivative (PID) controller, in order to control operation of the bearing assembly, among other things. Furthermore, the system 3760 may include various other circuit elements 3775 capable of receiving reference signals 3780 and sensor signals 3785 in order to provide a control feedback loop with respect to the bearing assembly 3765.

The system 3760 may be incorporated by, part of, or act as a variety of devices, such as motors and other rotating machines, toys, gyroscopes, energy storage devices, energy conversion devices, information storage devices, appliances, vehicles, and other devices and apparatus capable of utilizing a rotating bearing.

Figure 161:
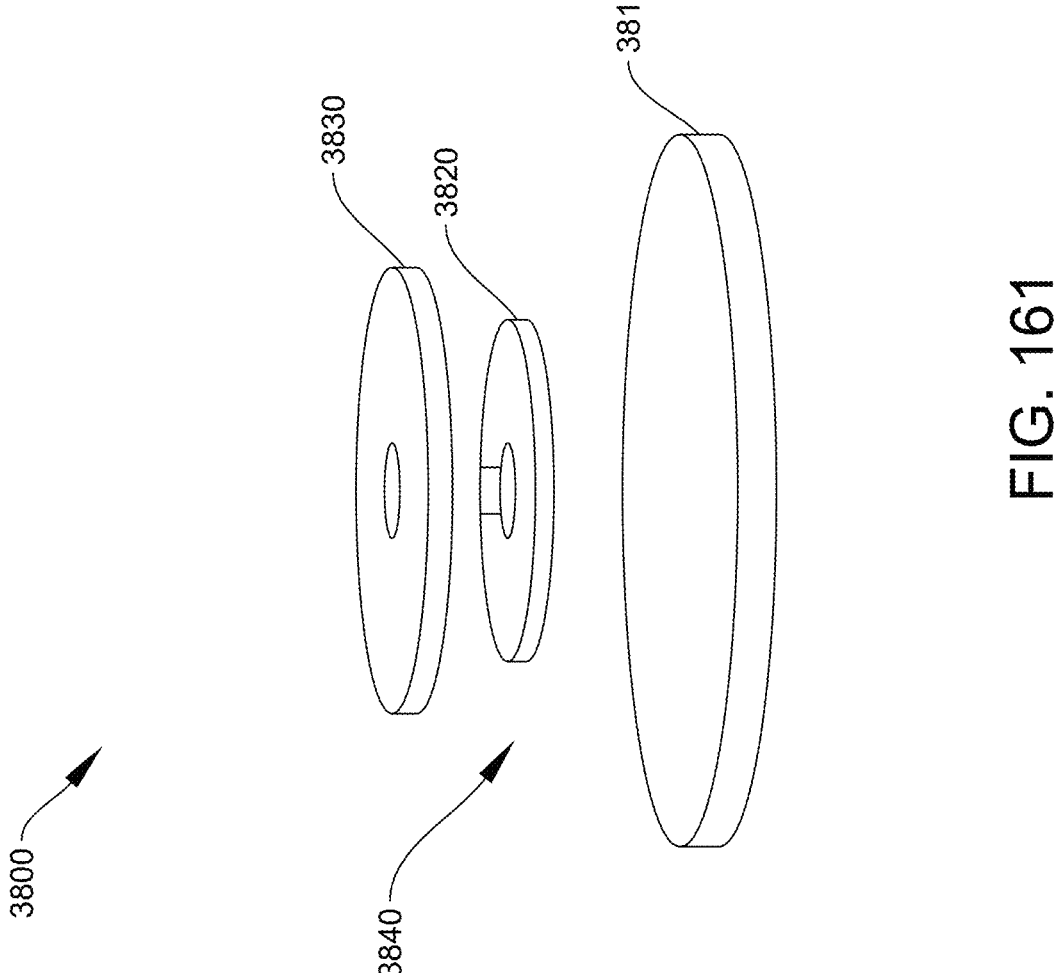

Various types and configurations of levitated bearing assemblies will now be discussed. FIG. 161 is a schematic diagram of a levitated bearing assembly 3800, such as a bearing assembly for use in a rotating machine. The bearing assembly 3800 includes an ELR bearing 3810, a magnetic rotor 3820, and a stator 3830. During operation, the bearing 3810 provides and/or generates a magnetic field that causes the rotor to levitate within a space or gap 3840 between the bearing 3810 and stator 3830.

The ELR bearing 3810 may be formed of some or all of the ELR materials described herein, such as modified and/or apertured ELR materials that exhibit extremely low resistance to current at temperatures between 150 K and 313 K, or higher. In some examples, the bearing 3810 may be formed of a disk of ELR material (as shown), such as a disk having a slight curvature towards center to assist in maintaining a levitated rotor 3820 over the bearing 3810. In some examples, the bearing 3810 may be a coil or winding, or other configuration of ELR elements capable of carrying a current at extremely low resistances and producing a magnetic field.

The rotor 3820 may be a permanent magnet capable of levitating and rotating between the bearing 3810 and the stator 3830. For example, the rotor 3820 may be a disk, donut, or other circular shaped objects. The rotor 3820 may be formed of multiple permanent magnets or may be formed of an electromagnet. The magnet or magnets of the rotor 3820 may be magnetized in various pole configurations in order to meet the needs of the machine utilizing the bearing assembly 3800. In some examples, the magnetization may be isotropic, anisotropic, and may have a pattern of multiple poles. For example, the rotor 3820 may include a first magnetic element coupled to the stator 3830, a second magnetic element coupled to the bearing 3810, and a buffer magnet that magnetically isolates the first magnet from the second magnet.

The stator 3830 may include an armature winding connected to a power source in order to produce a magnetic field that drives the rotor 3820. The stator may include positioning and/or sensing components, such as a Hall-effect sensing component, an electro-optical switch component, a radio frequency sensing component, and so on. The stator 3830 utilizes these components to determine information about the operation of the rotor 3820, and causes armature windings to adjust a produced magnetic field accordingly.

Figure 162:
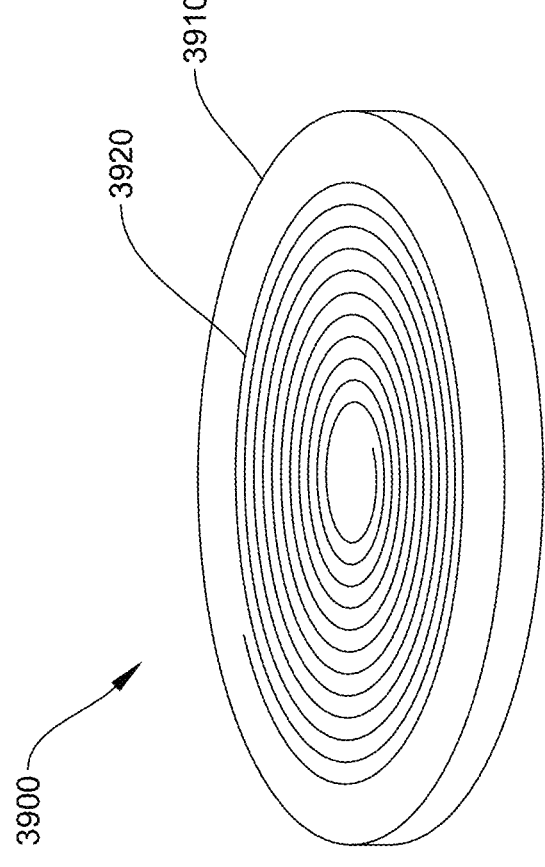

The bearing assembly 3800, as discussed herein, may of course utilize other bearing configurations. FIG. 162 is a schematic diagram of a bearing 3900 that includes a substrate 3910 and a coil or winding 3920 formed of an ELR material, such as a modified and/or apertured ELR material. The bearing 3900 carries current with extremely low resistance through the coil 3820, producing a magnetic field capable of levitating a magnetic rotor, such as rotor 3820.

Figure 163:
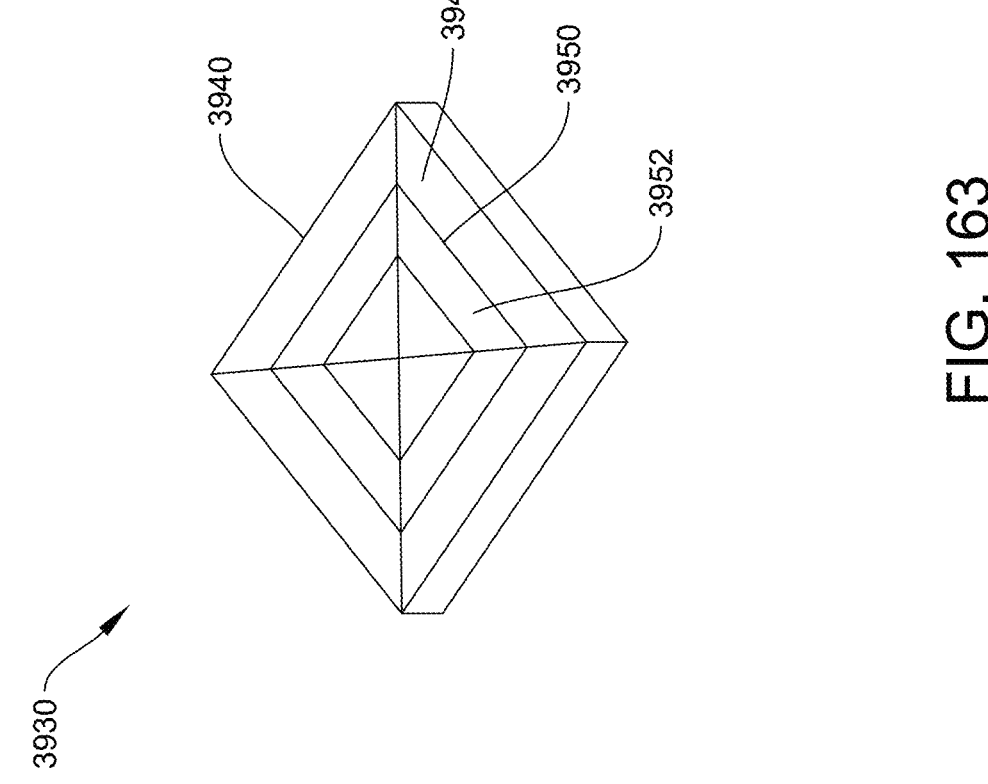

FIG. 163 is a schematic diagram of a bearing 3930 that includes two or more substrates 3940 positioned together to form a modified ELR loop 3950 (or loops) capable of carrying current in order to produce a magnetic field. For example, four triangular substrates 3942 each containing a strip of ELR material 3952 are positioned adjacent to one another such that the strips of ELR material 3952 form a loop 3950 that can circulate a current with extremely low resistance and produce a magnetic field capable of levitating a magnetic rotor, such as rotor 3820.

Figure 164:
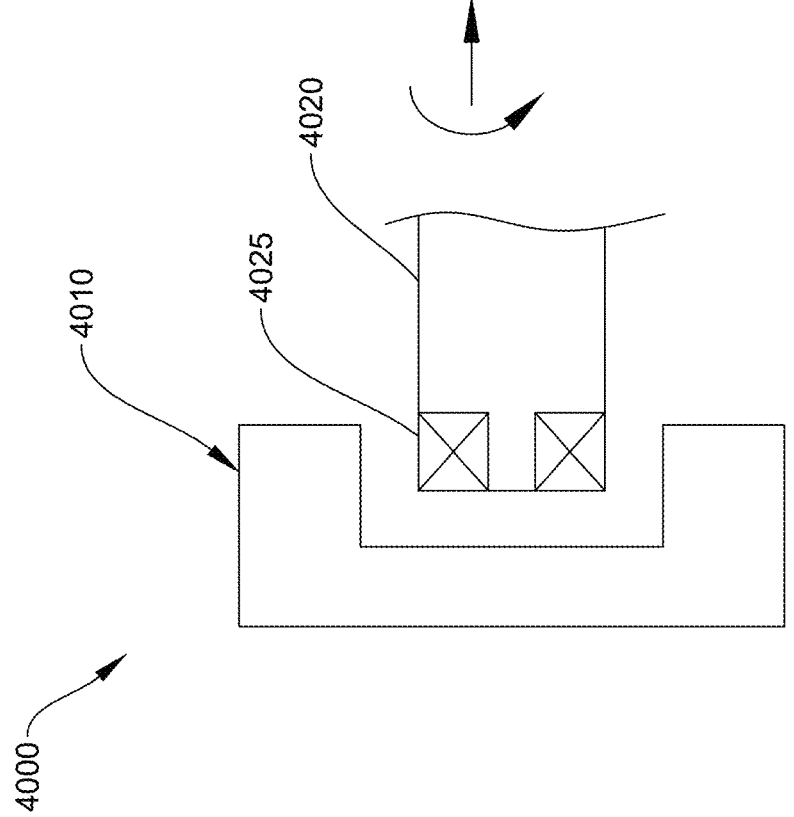
Figure 165:
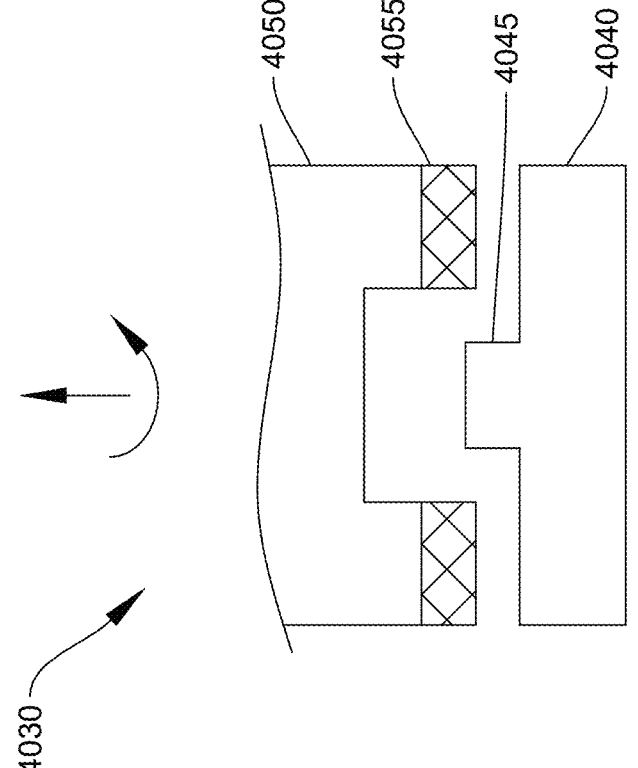
Figure 166:
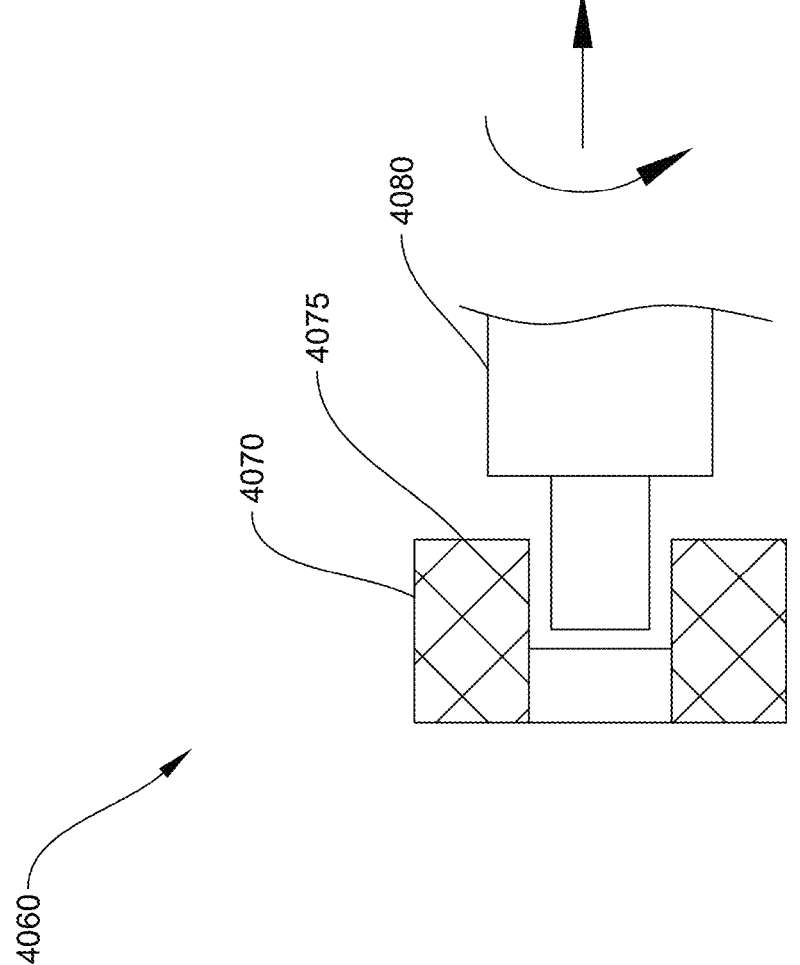

In addition to the disk-shaped bearing assemblies shown in FIG. 161, other bearing assemblies may utilize the ELR materials described herein. FIGS. 164-166 are schematic diagrams of various bearing assembly configurations.

In FIG. 164, a bearing assembly 4000 includes a rotatable shaft 4020 having a coil 4025 spaced within a gap of a bearing 4010. In some cases, the coil 4025 of the rotatable shaft 4020 is formed of ELR material, as described herein. In some cases, the bearing 4010 is formed of ELR material or includes a coil or loop formed of ELR material, as described herein. Excitation of the coil 4025 of the shaft 4020 produces a magnetic field, which causes the shaft to levitate with respect to the bearing 4010. In some cases, the bearing 4010 is formed in various shapes in order to assist in the positioning of the shaft 4020 with respect to the bearing 4010. Application of a second magnetic field by a stator and/or armature (not shown) causes the shaft to rotate while levitated.

In FIG. 165, a bearing assembly 4030 includes a rotatable shaft 4050 having a coil 4055 that surrounds a portion of a bearing 4040. The rotatable shaft 4050, therefore, may be donut shaped. In some cases, the coil 4055 of the rotatable shaft 4050 is formed of ELR material, as described herein. In some cases, the bearing 4040 is formed of ELR material or includes a coil or loop formed of ELR material, as described herein. Excitation of the coil 4055 of the shaft 4050 produces a magnetic field, which causes the shaft to levitate with respect to the bearing 4040. In some cases, the bearing 4040 is formed in various shapes in order to assist in the positioning of the shaft 4050 with respect to the bearing 4040. For example, the bearing 4040 includes a pedestal 4045, which may assist in centering the shaft 4050 over the bearing 4040. Application of a second magnetic field by a stator and/or armature (not shown) causes the shaft to rotate while levitated.

In FIG. 166, a bearing assembly 4060 includes a rotatable shaft 4080 and a bearing 4070 that includes a coil 4075 formed of an ELR material. Excitation of the coil 4075 of the bearing 4070 produces a magnetic field, which causes the shaft 4080 to levitate with respect to the bearing 4070. In some cases, the bearing 4070 may act as a stator, utilizing the coil 4075 to provide a field that levitates or positions the shaft 4080 in a space away from the bearing 4070 while also causing the shaft 4080 to rotate. In some cases, application of a second magnetic field by a stator and/or armature (not shown) causes the shaft to rotate while levitated. In some cases, the bearing 4070 is formed in various shapes in order to assist in the positioning of the shaft 4080 with respect to the bearing 4070.

Of course, one of ordinary skill in the art will appreciate that other configurations are possible. For example, the shafts described in FIGS. 164-166 may operate as bearings, and the bearings as shafts. Additionally, the bearings and/or shafts may include multiple ELR elements, such as ELR elements utilized to produce levitation of shafts with respect to bearings, ELR elements utilized to rotate shafts with respect to bearings, ELR elements utilized to control the positioning and/or rotation of shafts, and so on.

Figure 167:
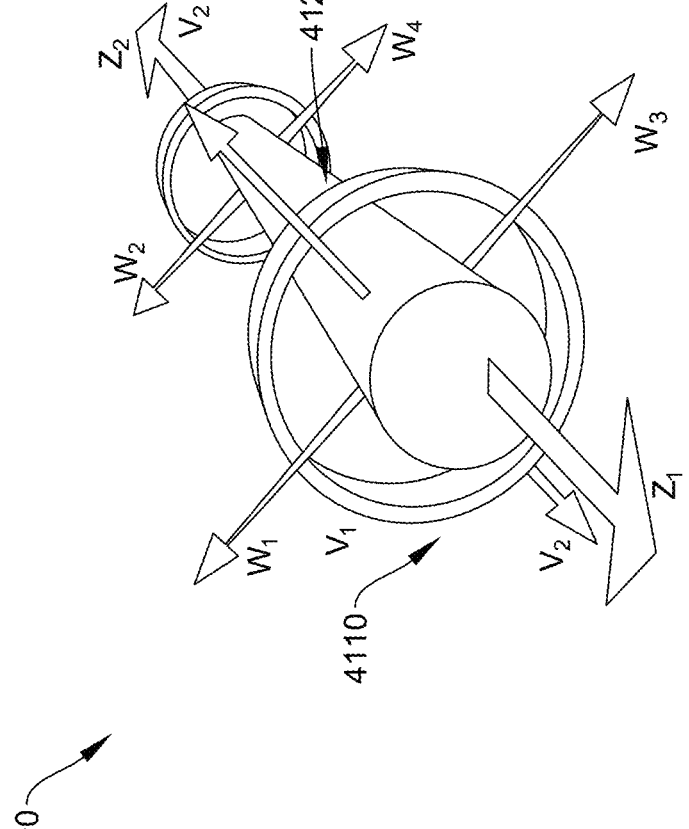

As an example, FIG. 167 illustrates a five-point shaft bearing assembly 4100. The bearing assembly 4100 includes multiple radial bearings 4110, and a rotatable shaft 4120. In some cases, the radial bearings 4110 are formed at least in part of ELR components. In some cases, the shaft is formed of ELR components, magnetic materials, or other materials. In some cases, sensors that monitor movement of the shaft and provide feedback to a control mechanism are formed of ELR components. The bearing assembly provides 5 axis control of the shaft, such as control of rotation of the shaft, control of translation of the shaft, control of movement and/or positioning of the shaft in three-dimensional space, and so on.

As described herein, the bearings, rotors and/or stators of the various bearing assemblies may include coils, windings, and/or disks that employ ELR materials, such as modified, apertured, and/or other new ELR materials. These coils, windings, and/or disks may employ tapes, films, foils, and/or wires formed for ELR materials.

In forming an ELR wire, multiple ELR tapes or foils may be sandwiched together to form a macroscale wire. For example, a coil may include a supporting structure and one or more ELR tapes or foils supported by the supporting structure.

In addition to ELR wires, the bearings, rotors, and/or stators may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

In addition to nanowires, ELR tapes or foils may also be utilized by the bearings, stators, and rotors described herein. There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials.

In some examples, the type of application utilizing the films may determine the type of materials used in the ELR materials. For example, applications may utilize ELR materials having a BSSCO ELR layer, whereas other applications may utilize ELR materials having a YBCO layer. That is, the ELR materials described herein may be formed into certain structures (e.g., tapes or wires) and formed from certain materials (e.g., YBCO or BSCCO) based on the type of bearing assembly or component utilizing the ELR materials, among other factors.

The ELR materials described herein may be utilized as or within a variety of different components of a bearing assembly utilized by a rotating machine, including as or within the winding of a bearing, as or within the winding of a rotor, as or within the winding of a stator, as or within a rod or a rotor, as or within a tape, as or within a ring, as a lead or other connective element between components, and so on. A large variety of rotating machines, including motors, generators, alternators, and others, may utilize such films.

Various types of brushed DC motors, or stepper motors, may utilize modified ELR films as or within various components, including Permanent Magnet Brushed DC (PMDC) motors, Shunt-Wound Brushed DC (SHWDC) motors, Series-Wound Brushed DC (SWDC) motors, Compound Wound (CWDC) motors, and so on.

Various types of AC motors may utilize modified ELR films as or within various components, including Single-Phase Induction motors (e.g., Split-Phase Induction motors, Capacitor Start Induction motors, Permanent Split Capacitor Induction motors, Capacitor Start/Capacitor Run Induction motors, Shaded-Pole AC Induction motors, and so on) and Three-Phase Induction motors (e.g., Squirrel Cage motors, Wound-Rotor motors, and so on).

Of course, one of ordinary skill in the art will appreciate other rotating machines may employ the modified ELR films described herein, including Universal motors, Printed Armature or Pancake motors, Servo motors, Electrostatic motors, Torque motors, Stepper motors, generators, alternators, and other rotating machines.

The various bearing assemblies described herein may perform with improved or enhanced operating characteristics by utilizing modified ELR films. For example, the bearing assemblies may exhibit fewer resistive losses from the resistances of various conductive elements, such as windings, leads, capacitive elements, and so on, or may last longer because certain elements do not exhibit wear due to friction. It follows that devices employing bearing assemblies having improved operating characteristics may in turn benefit with similar improvements. Examples of devices that may employ bearing assemblies utilizing modified ELR films include fans, turbines, drills, the wheels on electric cars, locomotives, conveyor belts, robots, vehicles, appliances, engines, manufacturing equipment, toys, gyros, MEMS based motors and components, and many other devices employing rotating machines.

In some implementations, a bearing assembly that includes modified ELR materials may be described as follows:

A bearing assembly, comprising: a bearing formed at least in part of a modified ELR material; and a rotor formed of a magnetic material and positioned proximate to the bearing; wherein the rotor levitates relative to the bearing when a magnetic field is produced by current flowing within the modified ELR material of the bearing.

A method of manufacturing a bearing assembly, the method comprising: forming a bearing of a modified ELR material; and positioning a rotor proximate to the formed bearing, such that the rotor is capable of levitating with respect to the bearing in response to a magnetic field produced by a current traveling through the modified ELR material of the bearing.

A bearing assembly, comprising: a bearing formed of an ELR material that exhibits extremely low resistance to carried charge at temperatures above 150 K.

A bearing for use within a bearing assembly, comprising: a substrate; and a coil formed at least in part of a modified ELR material.

A method of manufacturing a bearing, the method comprising: positioning a substrate; and depositing modified ELR material into a loop shape onto the positioned substrate.

A bearing for use in a levitated bearing assembly, comprising: a substrate; and a coil formed of an ELR material that exhibits extremely low resistance to carried charge at temperatures above 150 K.

A bearing assembly, comprising: a bearing formed at least in part of a modified ELR material; a cooling system configured to maintain a temperature of the bearing between 150 K and 313 K; and a rotor formed of a magnetic material and positioned proximate to the bearing; wherein the rotor levitates above the bearing when a magnetic field is produced by current flowing within the modified ELR material of the bearing.

A method of manufacturing a bearing assembly, the method comprising forming a bearing of a modified ELR material; coupling the formed bearing to a cooling system configure to maintain a temperature of the bearing between 150 K and 313 K; and positioning a rotor proximate to the formed bearing, such that the rotor is capable of levitating with respect to the bearing in response to a magnetic field produced by a current traveling through the modified ELR material of the bearing.

A bearing assembly, comprising: a bearing formed of an ELR material that exhibits extremely low resistance to carried charge at temperatures between 150 K and 313 K; and a cooling component that maintains a temperature of the ELR material of the bearing between 150 K and 313 K.

A rotating machine, comprising: a bearing formed at least in part of a modified ELR material; and a rotatable shaft formed of a magnetic material and positioned proximate to the bearing; wherein the rotatable shaft is spaced a certain distance from the bearing when a magnetic field is produced by current flowing within the modified ELR material of the bearing.

A motor, comprising: a bearing assembly, wherein the bearing assembly is formed of an ELR material that exhibits extremely low resistance to carried charge at temperatures between 150 K and 313 K; and a power component, wherein the power component is configured to provide power to the bearing assembly to produce a current within the ELR material of the bearing assembly.

A rotating machine, comprising: a bearing configured to produce a magnetic field; and a rotor configured to rotate and positioned proximate to the bearing based on a strength of the magnetic field; wherein the bearing or the rotor includes a material that exhibits extremely low resistance to charge at ambient temperature and standard pressure.

Chapter 11—Sensors Formed of ELR Materials

This chapter of the description refers to FIGS. 1-36 and FIGS. 168-223; accordingly all reference numbers included in this section refer to elements found in such figures.

Sensors that include components formed of modified, apertured, and/or other new extremely low resistance (ELR) materials are described. In some examples, the sensors include components that utilize nanowires of ELR materials. In some examples, the sensors include components that utilize a tape or foil formed of ELR materials. In some examples, the sensors include components that are formed using thin-film ELR materials. The ELR materials provide extremely low resistances to current at temperatures higher than temperatures normally associated with current high temperature superconductors (HTS), enhancing the operational characteristics of the sensors at these higher temperatures, among other benefits.

Uses of modified, apertured, and/or other new ELR materials in sensors will now be described in detail. In general, various configurations of sensors that employ ELR materials are possible and depend upon a type of sensor being designed. Various principles that govern design of conventional sensors may be applied to sensors employing the ELR materials described herein. Thus, while some sensor geometries and configurations are shown and described herein, many others are of course possible. Moreover, although various examples described herein may highlight how a particular sensor system may use a sensor or sensor component formed from such ELR materials, these examples are intended to be illustrative and not exhaustive. One having ordinary skill in the art who is provided with the various examples in this disclosure would be able to identify other components within the same or a similar sensor system that might be formed from such ELR materials.

Figure 168:
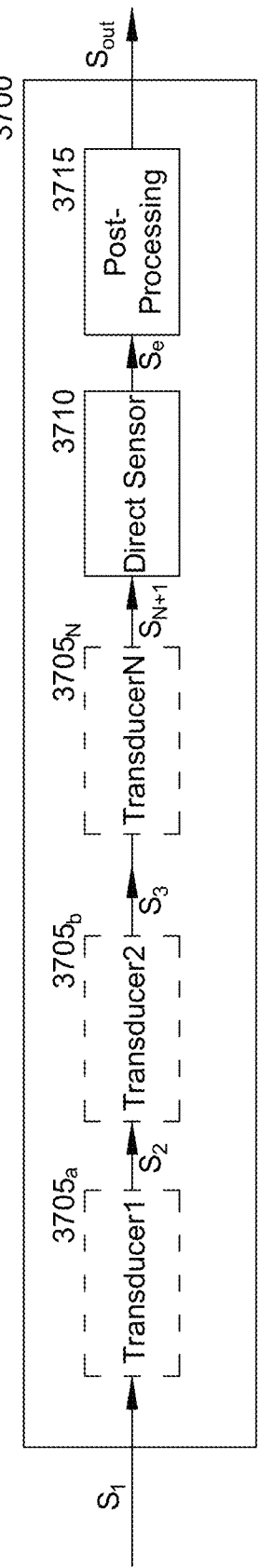
FIGS. 168 to 223 illustrate the forming of sensors using ELR materials.

FIG. 168 is a block diagram illustrating a sensor 3700 having components formed from, or at least partially incorporating, modified, apertured, and/or other new ELR materials. Generally speaking, the sensor receives a stimulus (or measurand) $s_1$ and responds with an electrical output signal $s_{out}$ that indicates a quantity, property, or condition of the stimulus. Non-exhaustive examples of stimulus and their related quantities, properties or conditions are illustrated in Table A below.

TABLE A

| Non-exhaustive examples of stimulus. | |
|---|---|
| Electric | Charge, current |
| | Potential, voltage |
| | Electric field (amplitude, phase, polarization, spectrum) |
| | Conductivity |
| | Permittivity |
| Magnetic | Magnetic field (amplitude, phase, polarization, spectrum) |
| | Magnetic flux |
| | Permeability |
| Acoustic | Wave amplitude, phase, polarization |
| | Spectrum |
| | Wave velocity |
| Biological | Biomass (types, concentration, states) |
| Chemical | Components (identities, concentration, states) |
| Optical | Wave amplitude, phase, polarization, spectrum |
| | Wave velocity |
| | Refractive index |
| | Emissivity, reflectivity, absorption |
| Mechanical | Position (linear, angular) |
| | Acceleration |
| | Force |
| | Stress, pressure |
| | Strain |
| | Mass, density |
| | Moment, torque |

158

TABLE A-continued

| Non-exhaustive examples of stimulus. | |
|---|---|
| | Speed of flow, rate of mass transport |
| | Shape, roughness, orientation |
| | Stiffness, compliance |
| | Viscosity |
| | Crystallinity, structural integrity |
| Radiation | Type |
| | Energy |
| | Intensity |
| Thermal | Temperature |
| | Flux |
| | Specific heat |
| | Thermal conductivity |

The sensor 3700 comprises one or more optional transducers 3705, a direct sensor 3710, and a post-processing module 3715. Each optional transducer converts a first signal having a first type of energy into a second signal having a second type of energy. For example, a first transducer 3705a may convert a mechanical stimulus signal $s_1$ into an optical signal $s_2$, which is then provided to a second transducer 3705b that converts the optical signal $s_2$ into a thermal signal $s_3$, and so on to produce an intermediary signal $s_{N+1}$. The direct sensor 3710 is also a transducer, but one that specifically transduces or converts an input signal into an electrical signal. The direct sensor 3710 receives the intermediary signal $s_{N+1}$ from the one or more transducers 3705 and converts it into an electrical signal se. In some sensors, the transducers 3705 are omitted and the direct sensor 3710 directly receives the stimulus signal or measurand $s_1$. The electrical signal produced, Se, may be modified (e.g., digitized, amplified, etc.) by the post-processing module 3715 in order to produce one or more output signals $s_{out}$ that indicate a quantity, property, or condition of the stimulus. The post-processing module 3715 may comprise, inter alia, input or output terminals, conductive paths, various analog and digital post-processing electronics such as data processors, digital signal processors, application-specific integrated circuits, amplifiers, filters, analog-to-digital converters, capacitance-to-voltage converters, differential circuits, bridge circuits, etc.

Table B shows non-exhaustive examples of the types of conversions that may be performed by the transducers 3705 and/or direct sensor 3710.

TABLE B

| Non-exhaustive examples of types of energy conversions. |
|---|
| Thermoelectric |
| Electroelastic |
| Thermooptic |
| Photoelastic |
| Photomagnetic |
| Spectroscopy |
| Physical transformation |
| Chemical transformation |
| Electrochemical process |
| Photoelectric |
| Thermomagnetic |
| Magnetoelectric |
| Electromagnetic |
| Thermoelastic |
| Biochemical transformation |

In some examples, the sensor 3700 may produce a non-electrical output signal $s_{out}$ that is interpretable by a human or equipment as indicating a quantity, property, or condition of the stimulus. For example, the sensor may produce an optical output signal indicating motion. In such examples, the post-processing module 3715 may perform post-processing on an intermediary electrical signal se from the direct sensor 3710 in order to produce the non-electrical output signal. In some examples, the direct sensor 3710 and/or post-processing module 3715 may be omitted in such examples (e.g., if transducer 3705 produces an optical signal that is interpretable by a human).

The sensor 3700 may include other components that are not shown in FIG. 168, including interface electronic circuits. For example, if the sensor 3700 is an active sensor, the sensor may include excitation circuits or other excitation sources (e.g., optical excitation sources). As another example, signal pre- or post-processing circuits may perform processing on a signal before or after the signal is transduced by any one of the transducers 3705 and the direct sensor 3710. Examples of other components that may be included in the sensor 3700 include processors, digital signal processors and application-specific integrated circuits, amplifiers, filters, light-to-voltage converters, excitation circuits (e.g., current generators, magnetic field sources (e.g., inductive coils or windings, including toroids, solenoids, etc.), voltage references, drivers, and optical drivers), analog-to-digital converters, waveguides, oscillators, capacitance-to-voltage converters, ratiometric circuits, differential circuits, bridge circuits, data transmission components, ground planes/loops, antennas, bypass capacitors, components that shield against sources of noise (e.g., electrical, magnetic, mechanical, and Seebeck noise), and power sources such as batteries.

Generally speaking, sensor 3700 may include various ELR components formed in whole or in part from modified, apertured, and/or other new ELR materials. The ELR components may be configured to, e.g., conduct electrical currents, transduce or convert a signal into or out of an electromagnetic signal (including, e.g., electrical currents and voltages), or otherwise transmit or modify electromagnetic signals. For example, one or more transducers 3705, the direct sensor 3710, the post-processing module 3715, or other pre- or post-processing electronics may further comprise ELR components formed from ELR nanowires, ELR tapes, and/or ELR foils formed from ELR films and/or ELR thin-films. The following list provides non-exhaustive examples of components within a sensor 3700 that may employ ELR materials.

Conductors (e.g., electrodes, contacts, wires, conductive traces/interconnections on an integrated circuit, etc.), Inductors, including inter alia, inductive coils or windings that may be formed as solenoids, toroids, other three dimensional shapes, printed on circuit boards and/or used as magnetic field sources, Capacitive elements (e.g., parallel plate capacitors, cylindrical capacitors, planar capacitors, etc.), Antennas.

Various sensors and/or sensor configurations may employ ELR components that are formed from ELR materials, such as those ELR components listed above, e.g., to conduct electrical currents, to transduce or convert a signal into or out of an electromagnetic signal (including, e.g., electrical currents and voltages), or otherwise transmit or modify electromagnetic signals. One having ordinary skill in the art who is provided with the various examples of ELR materials, sensing systems, and sensing principles in this disclosure would be able to implement, without undue experimentation, other sensors with one or more ELR components.

Moreover, although examples described herein may highlight how a particular sensing system may use a particular ELR component, these examples are intended to be illustrative and not exhaustive. One having ordinary skill in the art who is provided with the various examples in this disclosure would be able to identify other components within the same or a similar sensor system that might be formed from ELR components.

Moreover, one having ordinary skill in the art will appreciate that the inventors contemplate that ELR materials may be used in complex sensing systems that comprise a combination of two or more of the discrete sensing systems and principles described herein, even if those combinations are not explicitly described.

Additionally, although this application provides examples of circuits, sensors, and other components that may be used to perform a particular measurement or characterization of a value (e.g., the measurement of a resistance, capacitance, inductance, voltage, current, impedance, electromagnetic field strength, etc.), such examples are intended to be illustrative, not exhaustive. The various alternatives for making such measurements or characterizations such as these should be readily apparent to one having ordinary skill in the art. Moreover, although various sensors may be described as "detecting," "determining," or "calculating" a particular unknown quantity (e.g., an unknown resistance), unless explicitly stated otherwise, this is not intended to denote that the sensor must directly calculate the quantity mentioned. Instead, one having skill in the art will appreciate that the quantity may be determined by the sensor indirectly or inferentially. To illustrate, if the sensor is described as "detecting a resistance of element A," this may include determining the time constant of an RLC circuit that includes the element A, since the time constant may be directly affected by the unknown resistance value.

Moreover, although various components, such as capacitive elements or plates, may be described herein as being "metallic," "conductive" or "a conductor," one having skill in the art will appreciate that in some examples, capacitive elements or plates may be formed instead from semiconductive materials, without departing from the scope of the invention.

In the Figures, sizes of various depicted elements or components and the lateral sizes and thicknesses of various layers are not necessarily drawn to scale and these various elements may be arbitrarily enlarged or reduced to improve legibility. Also, component details have been abstracted in the Figures to exclude details such as precise geometric shape or positioning of components and certain precise connections between such components when such details are unnecessary to the detailed description of the invention. When such details are unnecessary to understanding the invention, the representative geometries, interconnections, and configurations shown are intended to be illustrative of general design or operating principles, not exhaustive.

Some or all of the systems and devices described herein may employ low cost cooling systems in applications where the specific ELR materials utilized by the application exhibit extremely low resistances at temperatures lower than ambient temperatures. As discussed herein, the application may include a cooling system (not shown), such as a system that cools ELR inductor to a temperature similar to that of the boiling point of liquid Freon, to a temperature similar to that of the melting point of water, or other temperatures discussed herein. The cooling system may be selected based on the type and structure of the ELR materials utilized by the application.

Numerous benefits may result from using ELR materials in sensing systems. For example, using ELR materials instead of HTS materials in a sensor may eliminate or reduce the complexity of cooling systems that are needed to operate the sensor, which may reduce its size, weight, and implementation and operating costs. Also, ELR materials may exhibit stronger and more nuanced temperature and photon sensitivity at higher (non-cryogenic) temperatures than HTS materials, which may provide improved thermoelectric, photoelectric, and other transduction characteristics at higher temperatures. Moreover, ELR materials may demonstrate stronger sensitivity to electromagnetic input signals and/or detect lower currents and/or lower voltages. Additionally, ELR materials may carry an electromagnetic signal (such as an input, intermediate, or output current or voltage) a much further distance than conventional conductors with less resistive loss, which may result in lower noise or less need for amplification of those signals, and/or permit lower current levels or greater separation between sensing components. Generally speaking, replacing conventional conducting and circuit elements such as copper conductors and conventional capacitors and inductors with ELR materials may reduce resistive losses, which may improve a sensor's operating efficiency, decrease waste heat, and/or improve other characteristics of its operation, such as stability, accuracy, speed of response, operating life, capital or operating costs, size, weight, feature size, sensor density, sensitivity, selectivity, hysteresis, linearity, saturation, repeatability, resolution, output impedance, and reliability. For example, using ELR materials in various components of a sensor (e.g., filters, oscillators, resonators, inductors, capacitors, amplifiers, etc.) may permit those components to operate more ideally (e.g., with a higher Q factor, greater gain, lower noise, etc.). A more idealized performance achieved by those components may in turn improve the overall performance of the sensor.

Figure 222:
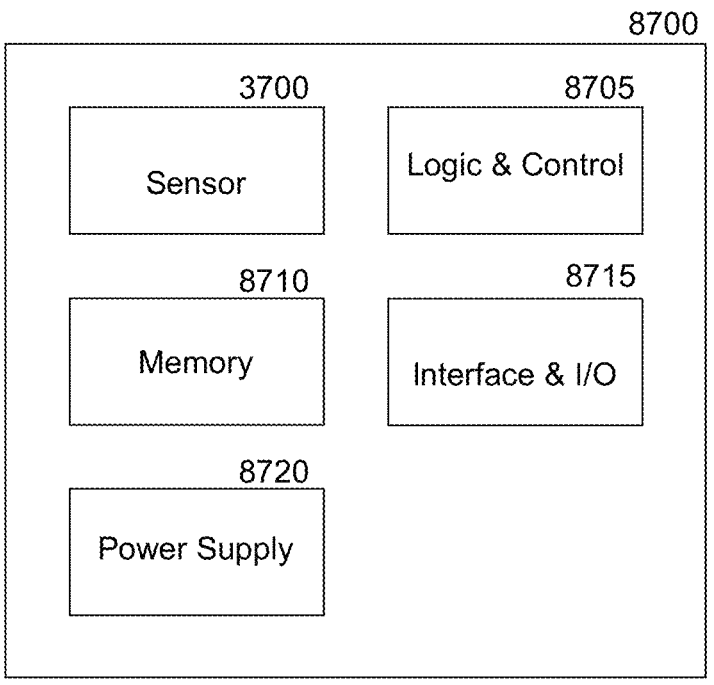

Before explaining the details of various sensor systems, a few applications to put the sensor system 3700 in context will be described. FIG. 222 shows an example of an apparatus or system 8700 that employs the sensor system 3700. The system 8700 receives or transmits signals via one or more ports, interfaces and/or I/O components 8715 such as antennas, hard-wire data interfaces (e.g., high-speed serial buses, contact pins) and user interface components (e.g., displays, speakers, keypads, etc.). The system includes the sensor system 3700, in addition to logic and control circuitry 8705, and/or analog or RF circuitry, memory 8710, as well as also a power supply 8720, all of which may be contained within a housing, package, or otherwise aggregated as a unit. In other examples, one or more systems 8700, such as a distributed sensor system, may be controlled in whole or in part by one or more logic and control components 8705 that are remote from the systems 8700.

The system 8700 can take one of many forms. In one example, the system is a mobile phone, smart phone, laptop, tablet or other portable electronic device. Under this example, the power supply 8720 may be a battery, and the sensor system 3700 may comprise, inter alia, a microphone (e.g., to detect speech and other sounds), an accelerometer (e.g., to detect movement, acceleration, or orientation of the device), tactile input sensors (e.g., a touch screen sensor and input buttons), a light and/or imaging sensor (e.g., to obtain photographs or videos), any and all of which may be formed on one or more semiconductor chips. The logic and control circuitry 8705 can include a processor, while the interface and I/O component 8715 can include an antenna, a USB port, a keyboard or keypad, pointing device, display device, speaker, or other known elements. Many other known components in this example of a portable electronic device are of course possible, but are not shown since they will be readily understood to one of ordinary skill in the art.

I. Position, Displacement, and Level Sensors

In some examples, the sensor 3700 may be configured to provide an output signal that is indicative of the position or displacement of a physical object or the level of a fluid that is proximate to the sensor. Indicating "position" means indicating the angular or linear coordinates of an object with respect to a particular reference while indicating a "displacement" means indicating a movement of an object from a reference position.

I.A. Resistance-Based Level Sensors

Figure 169:
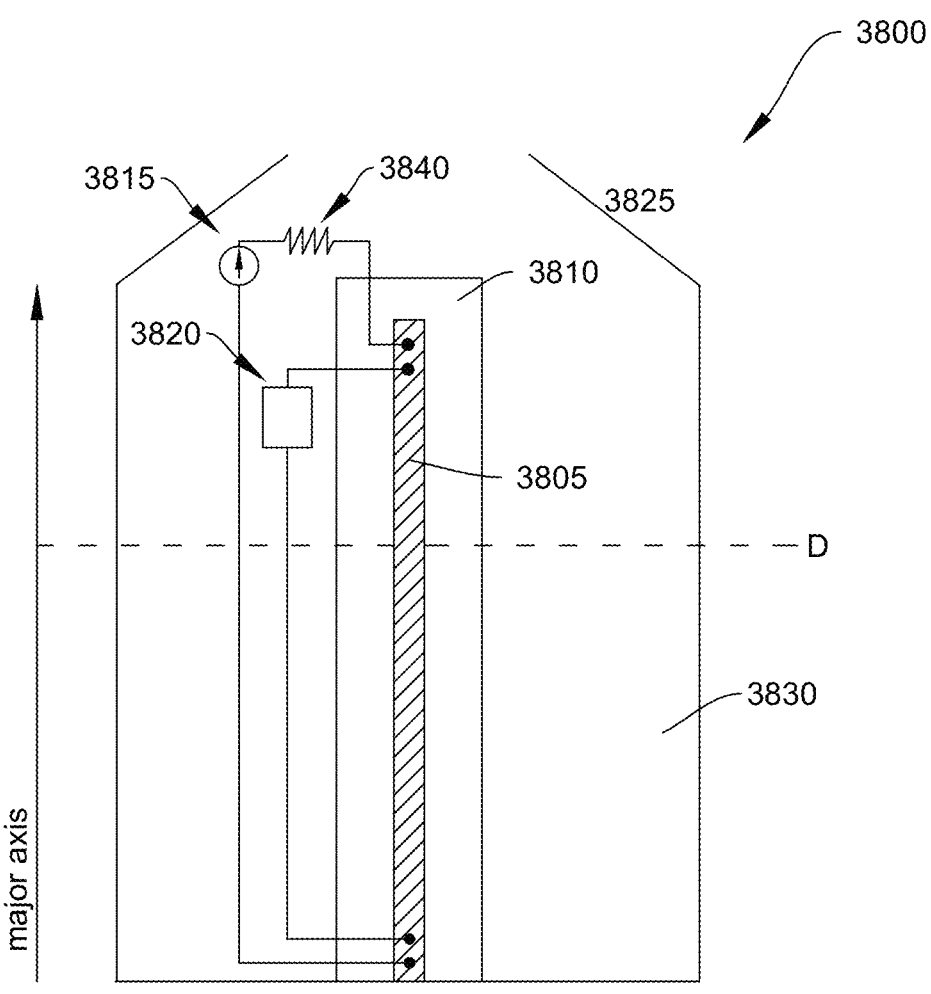

FIG. 169 shows a schematic diagram of one example of a sensor 3800 configured to produce an output signal indicative of the level of a cryogenic (e.g., liquid nitrogen, liquid helium, etc.) or low-temperature (e.g., liquid Freon, etc.) fluid 3830 that is stored in a cryostat (or other appropriate container) 3825 with a depth D. The sensor 3800 comprises a length of an ELR material 3805 that may be disposed on or in a supporting structure 3810 that retains the length of the ELR material substantially in parallel with a major axis of the cryostat. The ELR material may be formed as an ELR nanowire, an ELR tape, an ELR thin film, and ELR foil, or other configuration. A portion of the length of ELR material may be submerged so that it is in direct or close proximity to the low-temperature fluid 3830. The sensor 3800 may comprise one or more current or voltage sources 3815 configured to deliver a known electrical current or voltage input signal to the length of ELR material. The sensor 3800 may further comprise a heater 3840 configured to dissipate heat into the ELR material in order to raise the temperature of the exposed portion of the ELR material above the temperature of the low-temperature fluid 3830. The sensor 3800 may also comprise one or more current, voltage, or impedance meters 3820 that may be coupled to the length of ELR material at one or more known positions along the length of ELR material (e.g., by switch or other coupling device).

As described above, the resistivity of ELR materials may be highly dependent upon temperature. Therefore, the composition of the length of ELR material may be selected so that it demonstrates a first, lower resistivity (R1) when it is submerged in the low-temperature fluid 3830 (e.g., submerged below the level D shown in FIG. 169) and demonstrates a second, higher resistivity (R2) when it is not submerged in the low-temperature fluid (and in some examples, when warmed by the heater 3840). Thus, the total resistance of the length of the ELR material will have an inverse relationship to the level D of the low-temperature liquid in the cryostat. The inverse relationship between level and resistance may be determined theoretically or experimentally (e.g., by a calibration procedure). Additionally, a measured resistivity at any given point along the length of the ELR material provides an indication of whether that point is above or below the level D of the low-temperature fluid.

The level of the low-temperature liquid 3830 may therefore be determined by the following method, which may be implemented in whole or in part by computer-readable instructions. An input current or voltage signal may be applied to the length of ELR material; also, heat may be applied to the length of ELR material to raise the temperature of its exposed portion. The resistance of a portion of the length of ELR material may be determined, e.g., directly by using an impedance meter or indirectly by measuring a resultant voltage or current using a voltage or current meter. Using the measured resistance and a determined inverse relationship between fluid level and resistance, the level D of the low-temperature fluid may be determined. In some examples, the approximate resistivity in response to the input signal may be measured at one or more known points along the length of ELR material, and the measured resistivity may be utilized to determine which portions of the ELR material are submerged and therefore to determine the current level D of the low-temperature fluid.

Figure 170:
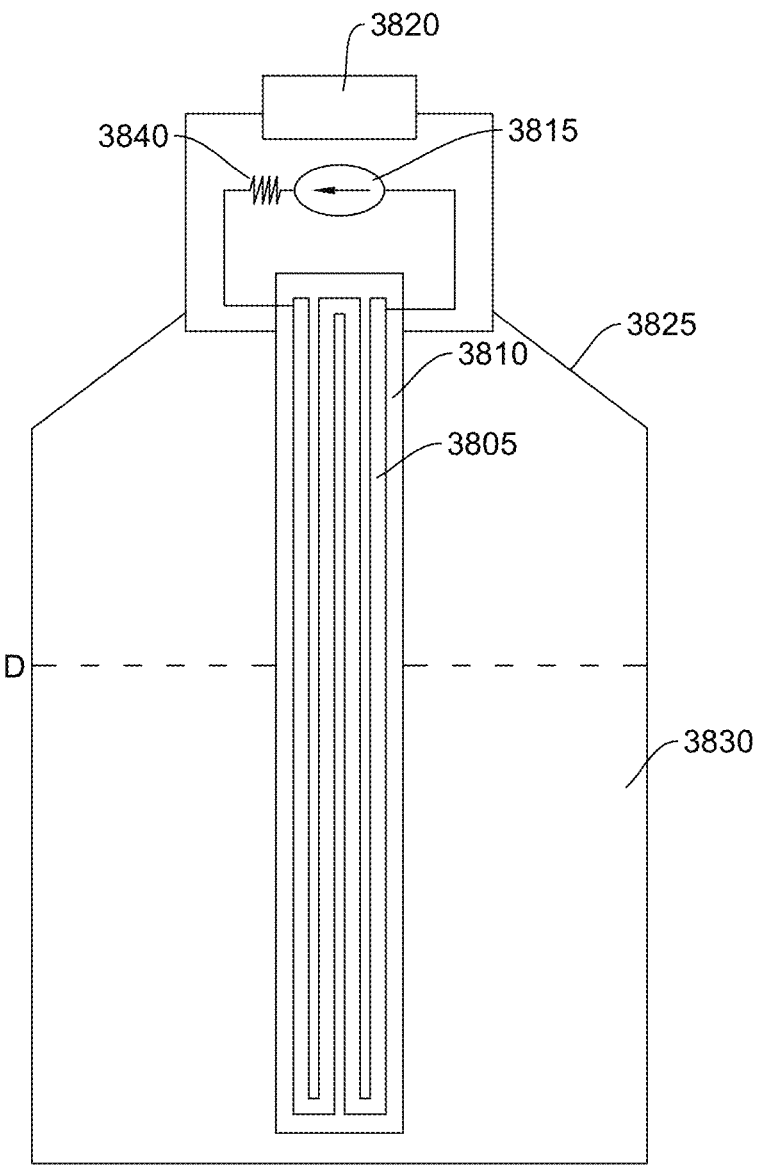

The sensing principles and methods described above may be utilized in conjunction with other configurations of ELR materials that are disposed directly in or in close proximity to a liquid having a known temperature. For example, although a single length of ELR material 3805 is shown in FIG. 169, multiple lengths of ELR material oriented along the major axis of the cryostat may be continuously joined by additional ELR material or conductive material in order to form a longer serpentine or meandering length 3850 on or in a supporting structure, as shown in FIG. 170.

I.B. Potentiometric Position and Level Sensors

Figure 171:
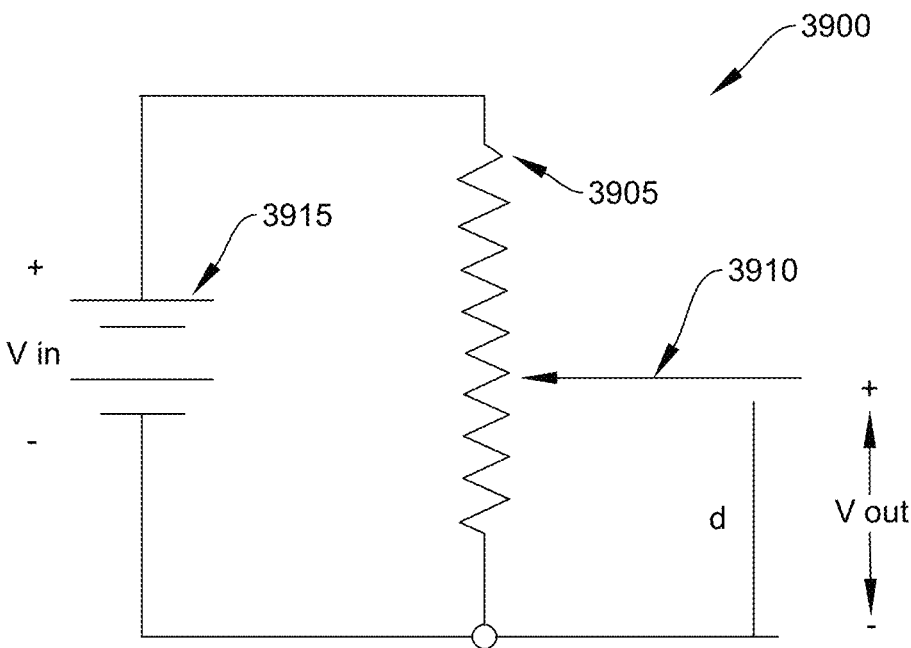

FIG. 171 shows a schematic diagram of an example of a potentiometric sensor 3900 having components formed from ELR materials and configured to produce an output signal Vout indicative of the displacement ("d") or position of an object. The sensor 3900 comprises a variable voltage divider or potentiometer 3905, such as a linear or rotary potentiometer, that comprises ELR nanowires, ELR tapes, ELR thin films, ELR foils, or other formations of the ELR materials described above. For example, a wiper and/or resistive element of the potentiometer may be formed from an ELR material. An object whose position is being measured (not shown) is mechanically coupled to the wiper 3910. The position of the object may be determined by applying an input voltage source 3915 (Vin) across the two ends of the potentiometer 3905 and measuring the output voltage (Vout) at the wiper 3910. In the case of a linear potentiometer, the measured wiper voltage may be known to be approximately proportional to the displacement of the object. For other types of potentiometers, the measured wiper voltage may have another known relationship to the input voltage (e.g., a logarithmic or exponential relationship).

Figure 172:
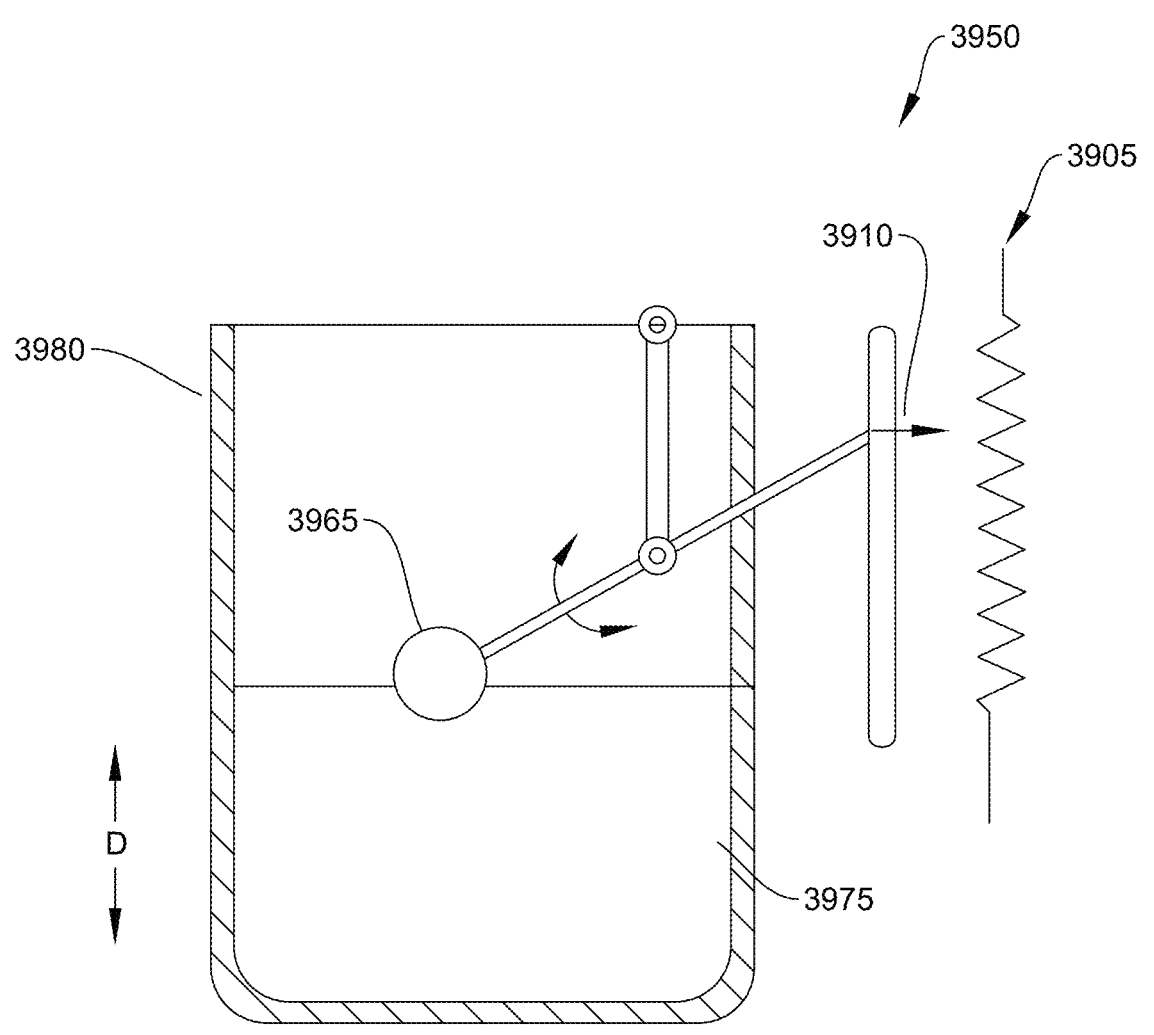

FIG. 172 shows a schematic diagram of an example of a potentiometric sensor 3950 having ELR components formed from ELR materials and configured to produce an output signal indicative of the level or depth D of a fluid 3975 in a container 3980. The elements shown in FIG. 172 are similar to those shown in FIG. 171. By coupling a float 3965 to the wiper 3910 of a potentiometer 3905 formed at least in part from ELR material, the level D of the fluid may be detected using principles and methods similar to those described above.

Figure 173:
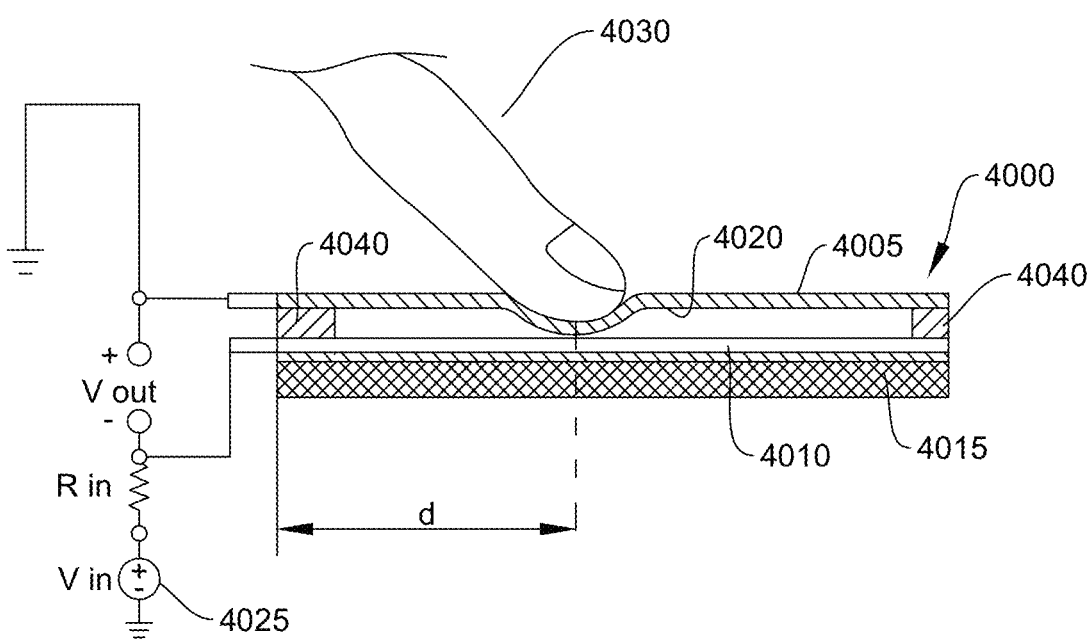

FIG. 173 shows a cross-section of an example of another potentiometric sensor 4000 having ELR components formed from ELR materials and configured to produce an output signal (Vout) indicative of the position of an object. The sensor 4000 comprises a first flexible or depressible sheet 4005 having a conductive surface 4020 that acts as a contact strip and a second rigid surface 4015 coated with a resistive material 4010. The conductive surface 4020 and/or resistive material 4010 may be formed from ELR nanowires, ELR tapes, ELR thin films, ELR foils, or other formations of ELR material. The two sheets are physically separated by separators 4040. One of the sheets may be grounded (or otherwise held at a known voltage) and the other sheet placed in series with a known input impedance Rin and a voltage source 4025 Vin. When an object 4030, such as a finger, presses the flexible sheet at a distance d from the end of the sensor, the conductive surface 4020 contacts the resistive material 4010, and the output voltage Vout across the two sheets changes in a known manner, e.g., in a manner that is approximately proportional to the distance d of the object from the end of the sensor. Therefore, by measuring the output voltage across the two sheets (Vout), the position of the object 4030 may be determined. Such potentiometric position sensors may be used in numerous applications, including for example, audio control devices and controls on other types of consumer and commercial electronics. Many other applications are of course possible.

Although FIGS. 169-173 show several examples of potentiometric sensors, the examples shown are not intended to be exhaustive and are provided for illustrative purposes. Other potentiometric sensors may be designed to comprise ELR components as would be appreciated. For example, any potentiometric sensor that measures position or another stimulus by using a changing resistance may comprise resistive, conductive or other ELR components formed from ELR materials. For example, references to a wiper and potentiometer are only examples for such sensors: a sensor employing the ELR materials may employ any variable voltage divider, variable impedance element, or other structure to provide a known variable electrical output based on a given input displacement or position.

I.C. Capacitive Displacement Sensors

In some examples, the sensor 3700 includes a capacitive displacement sensor that comprises a capacitive plate or structure formed at least in part from ELR nanowires, ELR tapes, ELR thin films, ELR foils, or other formations of ELR materials. As non-exhaustive examples, a capacitive displacement sensor having one or more capacitive plates or structures formed from ELR material may be (1) a monopolar sensor that uses a single capacitor formed from two capacitive plates or structures (as shown in FIGS. 175, 177, and 178), (2) a differential sensor that uses two capacitors formed from three or more capacitive plates or structures (as shown in FIG. 174), or (3) a capacitive bridge sensor that uses multiple capacitive plates or structures arranged in a bridge configuration (as shown in FIG. 176).

Figure 174:
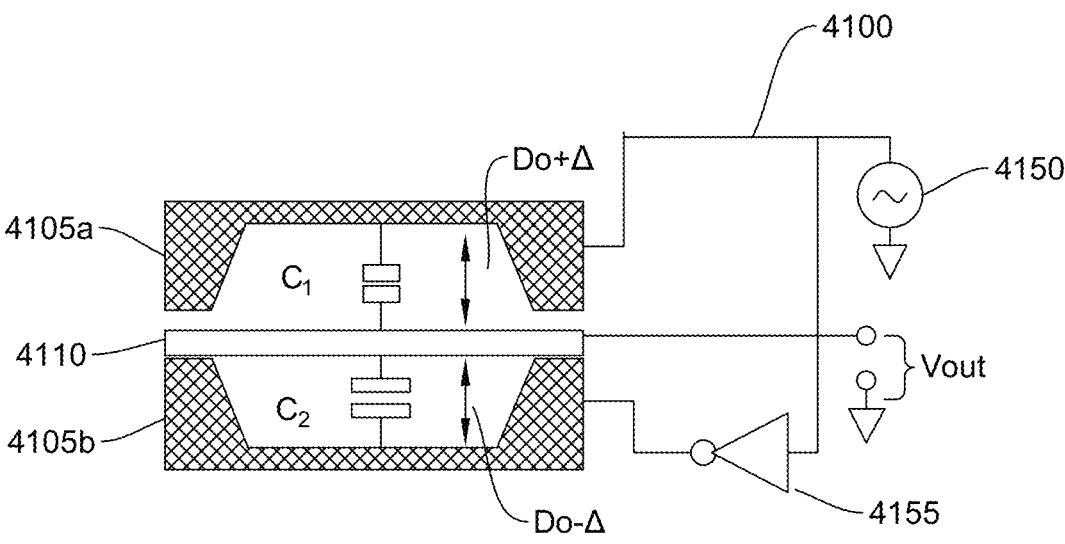

FIG. 174 illustrates the general operating principles of capacitive displacement sensors. As shown, a capacitive displacement sensor 4100 employs a moveable capacitive plate or structure 4110 that may be displaced relative to fixed capacitive plates or structures 4105a and 4105b by a distance A. As a result of the changed plate geometry, capacitances C1 and C2 that exist between the moveable plate 4110 and the fixed capacitive plates 4105a and 4105b change by a known quantity that can be determined theoretically and/or experimentally. The changed capacitances alter the output voltage (Vout) that is observed in response to an input source 4150. In this way, by monitoring the output voltage (Vout), the displacement (A) of an object that is mechanically coupled to the moving capacitive plate or structure 4110 may be determined.

Figure 175A:
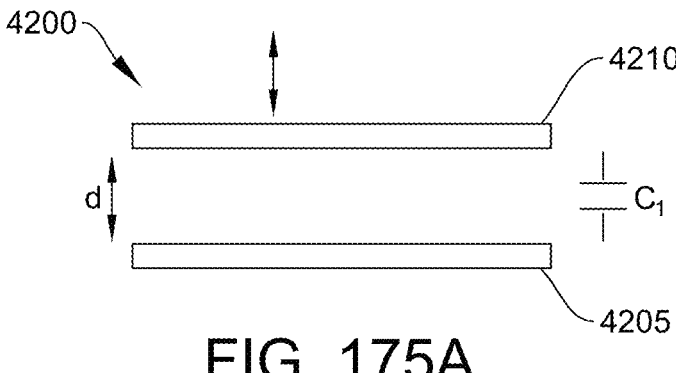
Figure 175B:
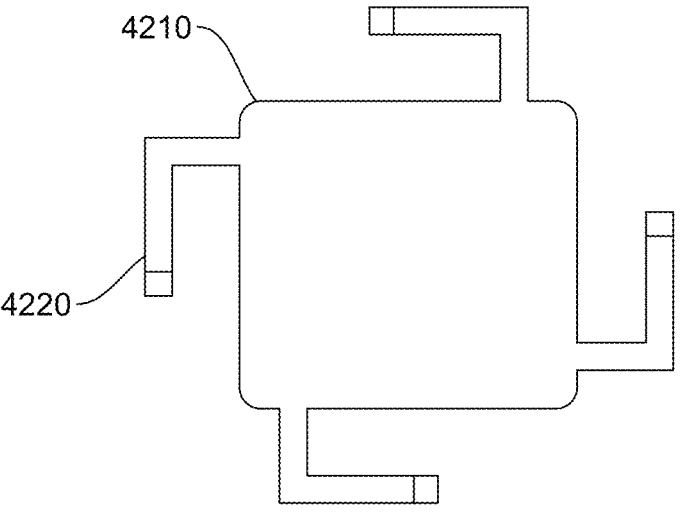
Figure 175C:
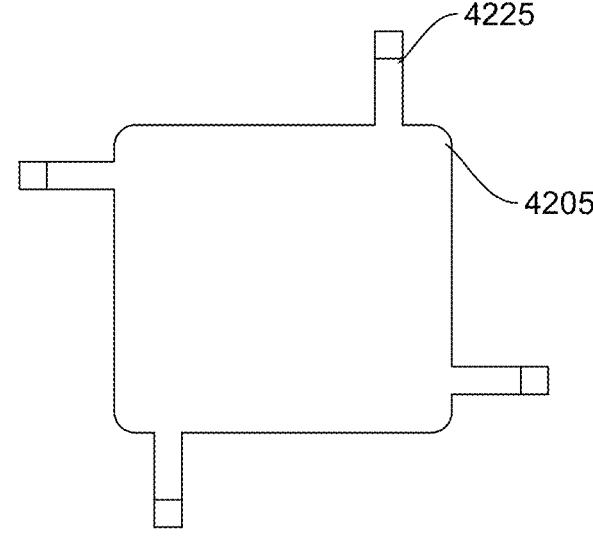
Figure 176:
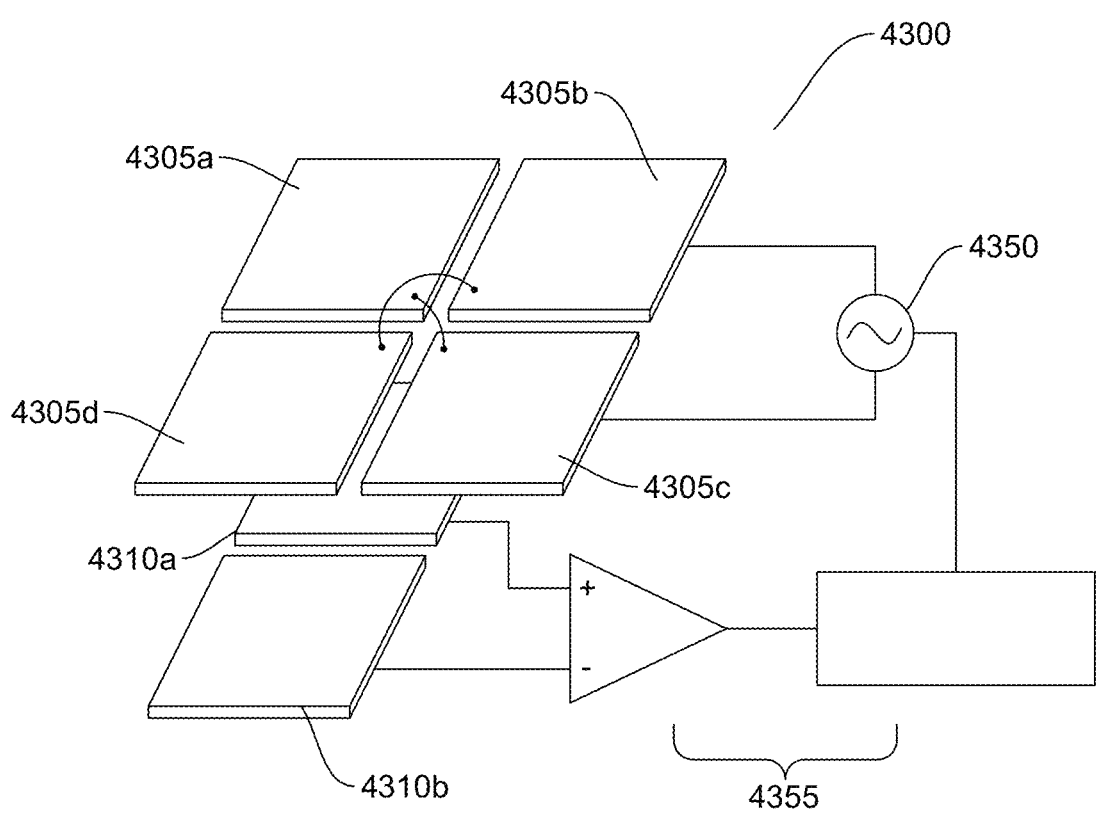
Figure 178:
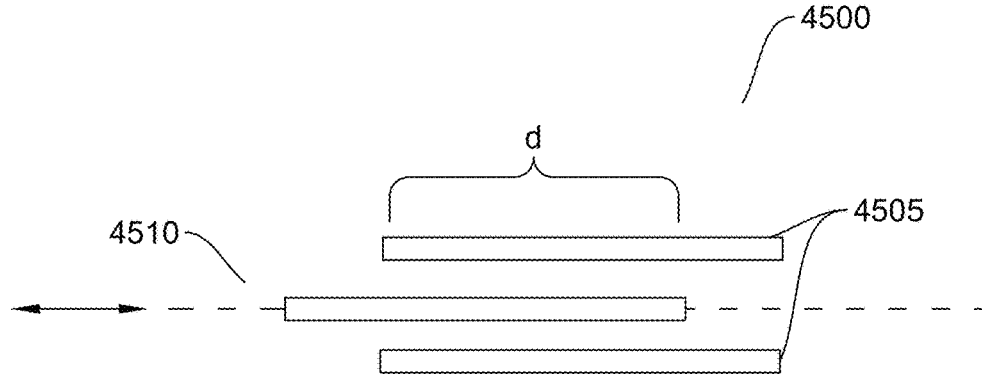

The sensors shown in FIGS. 175, 176 and 178 operate on similar principles. For example, a two-plate monopole sensor 4200 shown in FIG. 175A has a fixed reference plate 4205 separated from a moveable sensing plate 4210 by a dielectric (e.g., air); the distance d between the two plates depends on the movement of the moveable sensing plate. The capacitance C1 between the two plates varies with the distance d. As shown in FIGS. 175B and 175C, the two-plate monopole sensor may be implemented using MEMS technology. For example, the moveable sensing plate 4210 may be micromachined so that it is supported by a flexible suspension 4220 that permits it to move in relation to a micromachined reference plate 4205 having a rigid suspension 4225. In the capacitive sensor 4300 shown in FIG. 176, two moveable plates 4310*a* and 4310*b* are able to move in relation to four stationary plates 4305*a-d* arranged in a bridge configuration. In the capacitive sensor 4500 shown in the cross-sectional view of FIG. 178, the center conductor 4510 of a cylindrical capacitor may be a moveable capacitive element. The depth (d) to which it is inserted into a fixed outer capacitive structure 4505 affects the capacitance between the conductor 4510 and the outer structure 4505. Although a cylindrical capacitor is described, laterally moveable capacitive plates might be used in other examples. Of course, the various capacitive displacement sensors shown may also utilize additional interface electronics (e.g., inverter 4155 and amplifier/synchronous detector 4355) in order to produce a useable electronic signal indicative of the displacement or changed capacitances.

Figure 177:
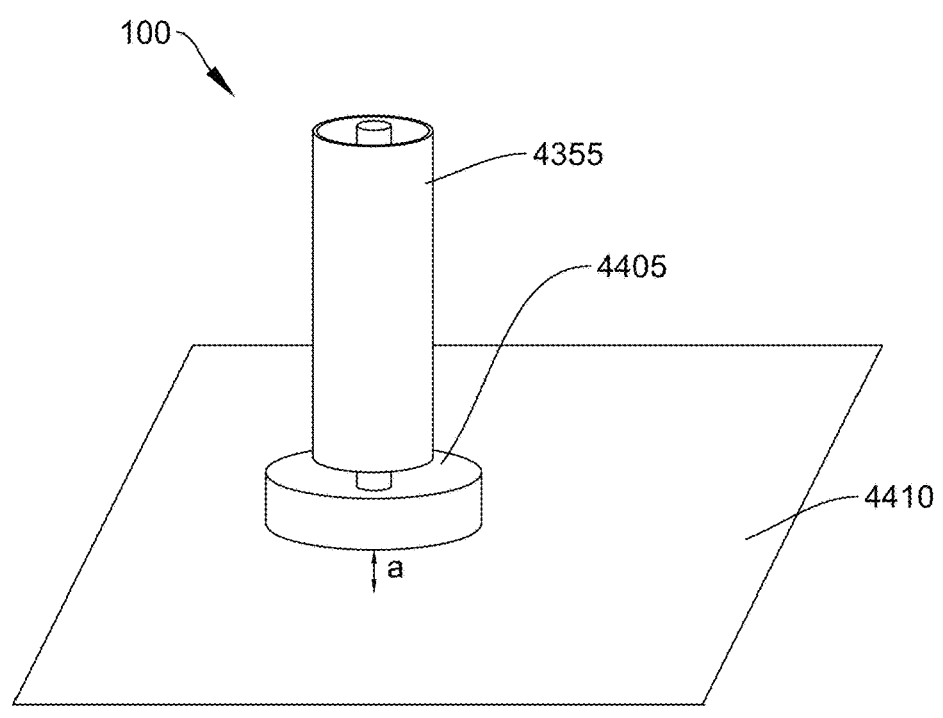

FIG. 177 shows a schematic of an example of a capacitive position sensor 4400 having components formed from ELR materials and configured to produce an output signal that is indicative of the position of a conductive object. As shown in FIG. 177, when an object 4410 whose distance or displacement is being measured is also conductive, the capacitive sensor 4400 may be a capacitive probe having a single capacitive plate or element 4405 formed at least in part from ELR nanowires, ELR tapes, ELR thin films, ELR foils, or other formations of ELR material and configured to capacitively couple to the conductive object 4410. The capacitive plate or element 4405 may be coupled to the central conductor of a cable 4355 and/or other electronics configured to measure a capacitance between the capacitive plate or element 4405 and the conductive object 4410. The coupling capacitance may depend on the distance (a) between the capacitive plate or element 4405 and conductive object 4410. Therefore, the sensor 4400 produces an output voltage that is related in a known fashion to the distance between the probe and the object. In some examples, the sensor 4400 may also be used to detect non-conductive objects.

The example configurations of capacitive displacement sensors shown in FIGS. 174-178 are not intended to be exhaustive, and various configurations of capacitive plates or elements that demonstrates a changed electrical output in response to a displacement of one or more capacitive plates or elements may be used. For example, plates or elements that were previously described as moveable may be fixed and vice versa. As another example, other capacitive elements having geometries other than plates and cylinders may be used. As yet another example, capacitive displacement sensors may include shielding elements and/or guard rings, and may include one or more separating dielectrics, such as liquid, elastomeric, or other deformable/non-rigid dielectrics. In any of the configurations, one or more of the capacitive plates or elements (or other elements of the sensor) may be wholly or partially formed from ELR material.

Capacitive displacement sensors that include components formed from ELR materials may be used in many applications, including precision positioning (e.g., in semiconductor processing and testing), disk drives, machine tool metrology, assembly line testing, precise thickness measurements, and complex sensing systems where a force, pressure, or temperature causes a displacement, and other applications as would be appreciated.

I.D. Inductance Sensors, Including Variable Inductance Displacement Sensors

Figure 179:
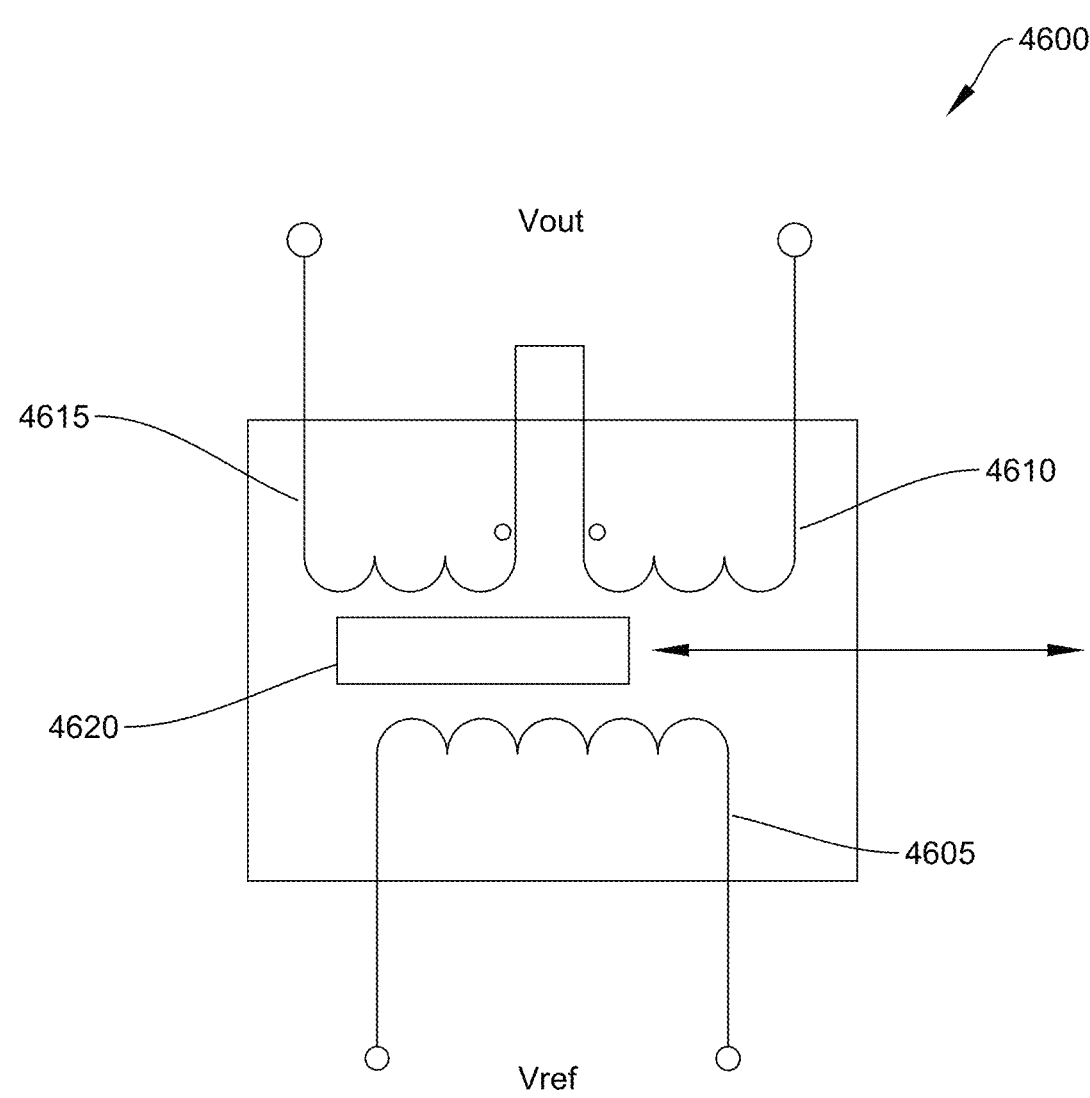
Figure 180:
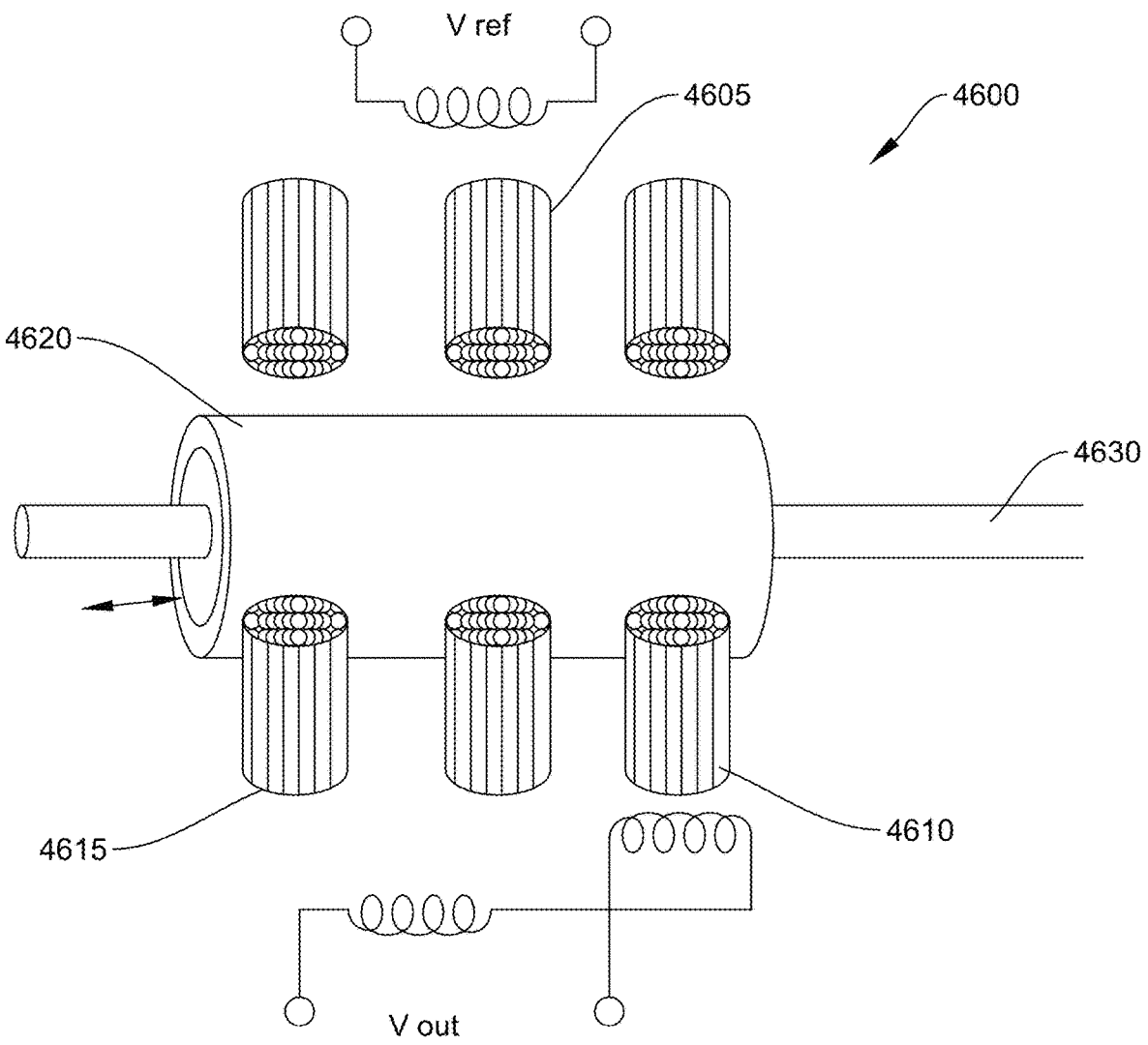

In some examples, the sensor 3700 comprises a variable inductance displacement sensor that comprises one or more coils (or other inductive components) formed at least in part from ELR material (e.g., ELR coils). FIG. 179 shows a circuit schematic of an example of a linear variable differential transformer sensor 4600 having ELR components formed from ELR materials and configured to produce an output signal indicative of the position of an object. FIG. 180 shows a cutaway view of the sensor 4600, with corresponding, simplified circuit notations. The linear variable differential transformer sensor 4600 includes a primary coil 4605, two secondary coils 4610, 4615 connected in opposed phase and positioned on either side of the primary coil, and a ferromagnetic core 4620 inserted between the primary and secondary coils (e.g., inserted coaxially into a cylindrical opening between the coils and guided along a coaxial pole 4630). Although not shown, the coils may be disposed in a supporting material that prevents them from directly contacting the core. One or more of the primary and/or secondary coils may be formed from ELR nanowires, ELR tapes, ELR thin films, ELR foils, or other formations of ELR material. The primary coil 4605 is driven by a reference voltage signal (Vref) and the differential output voltage (Vout) across the two secondary coils is measured. A displacement of the ferromagnetic core 4620 from its center position equidistant to the two secondary coils changes the path reluctance and thus the coupling between the primary and secondary coils. Therefore, the output voltage (Vout) may be monitored to determine the displacement of the ferromagnetic core and thus the displacement of an object that is mechanically coupled to the ferromagnetic core.

In other examples (not shown), the sensor 3700 may instead comprise a rotary variable differential transformer that includes a rotary ferromagnetic core and one or more coils composed of ELR materials. Such a sensor may operate on similar principles as the linear variable differential transformer sensor 4600 in order to measure angular displacement.

In still other examples of inductive sensors (not shown), one or more coils are mechanically coupled to an object whose position is being measured. In such examples, the mechanical displacement of the object results in the one or more coils being displaced relative to the other coils, which changes the level of coupling between the coils. Therefore the displacement of the object may be determined by measuring the output voltage across one or more secondary coils. In some examples, one or more coils are provided, and an object or core is moved to generate a measurable output from the coils.

Of course these examples are not intended to be exhaustive and various configurations of variable inductance or other inductance sensors may also utilize ELR material within a coil or other component as would be appreciated.

Variable inductance displacement sensors that include ELR components formed from ELR materials may be used in many applications, including position feedback in servomechanisms, gauge heads, and automated measurement in machine tools, and other applications as would be appreciated.

I.E. Eddy Current Position Sensors

Figure 181:
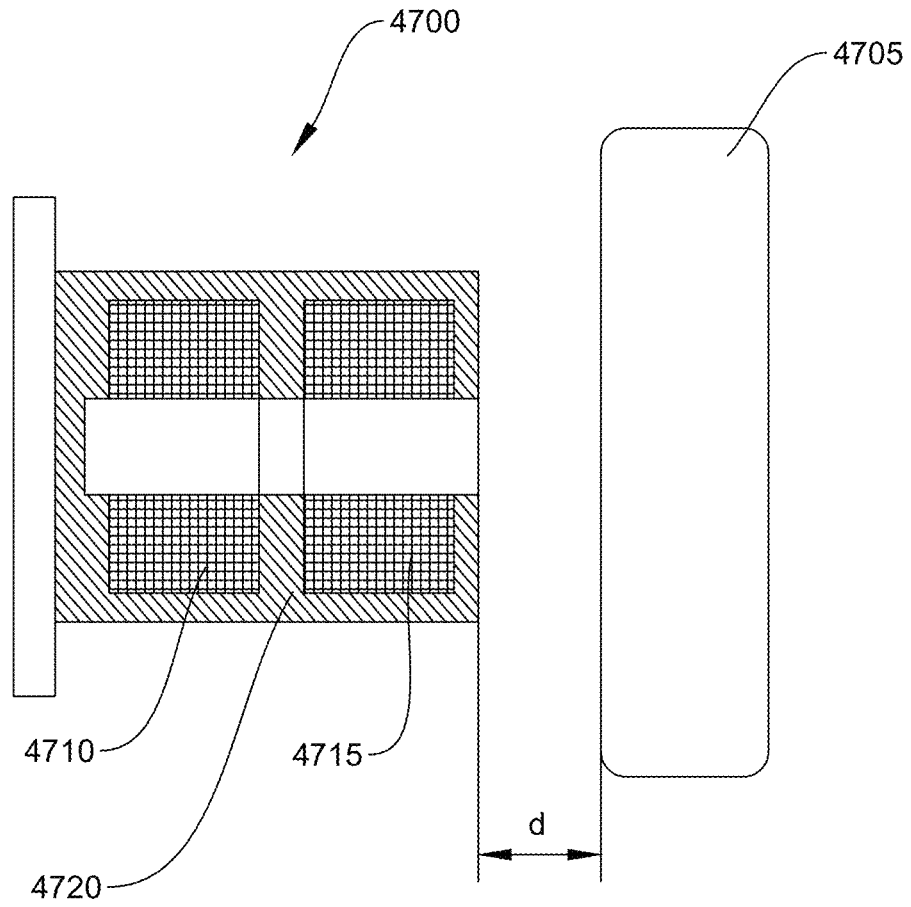

FIG. 181 shows a cross-sectional schematic of an example of an eddy current sensor 4700 having components formed from ELR materials and configured to produce an output signal indicative of the position of an object. The sensor 4700 comprises a reference coil 4710 and a sensing coil 4715, both wound around a ferrite core 4720. One or more of the coils may be formed from ELR nanowires, ELR tapes, ELR thin films, ELR foils, or other formations of ELR material. Although not shown, the sensor 4700 may also include a metal guard or other guard that directs the electromagnetic field towards the front of the sensor. The eddy current sensor 4700 can be used to measure the distance d between the sensor and a conductive object 4705. The sensor 4700 induces eddy currents in the conductive object, which produces a magnetic field opposing the sensing coil, and thus changes its magnetic impedance. The changed magnetic impedance, which depends on the distance d, may be measured, e.g., by detecting a misbalance between the sensing coil and the reference coil. In some examples, the reference coil may be omitted and the changed magnetic impedance may be determined, e.g. by measuring the absolute magnetic impedance of the sensing coil or by determining the change in current needed to maintain a constant magnetic field.

Although FIG. 181 shows one example of a two-coil configuration of an eddy current sensor, the example shown is for illustrative purposes only; various suitable configurations of a core (including ferromagnetic, ferrimagnetic, and non-ferrite cores such as air or dielectric cores) and coils/windings (including solenoids, toroids, and other arrangements) that may be used as an eddy current sensor may comprise coils or windings formed from ELR material. Also, various eddy current sensors may also use ELR coils, regardless of the mode of operation or measurement used. For example, a single coil eddy sensor design that detects an object by determining the current needed to maintain a constant magnetic field may also include a coil formed from ELR material.

Eddy current sensors having ELR materials may be used for various applications, including as a position sensor and also to sense or measure nonconductive coating thickness, material thickness, conductivity, plating, cracks, and surface flaws, and other applications, as would be appreciated.

I.F. Transverse Inductive Position Sensors

Figure 182:
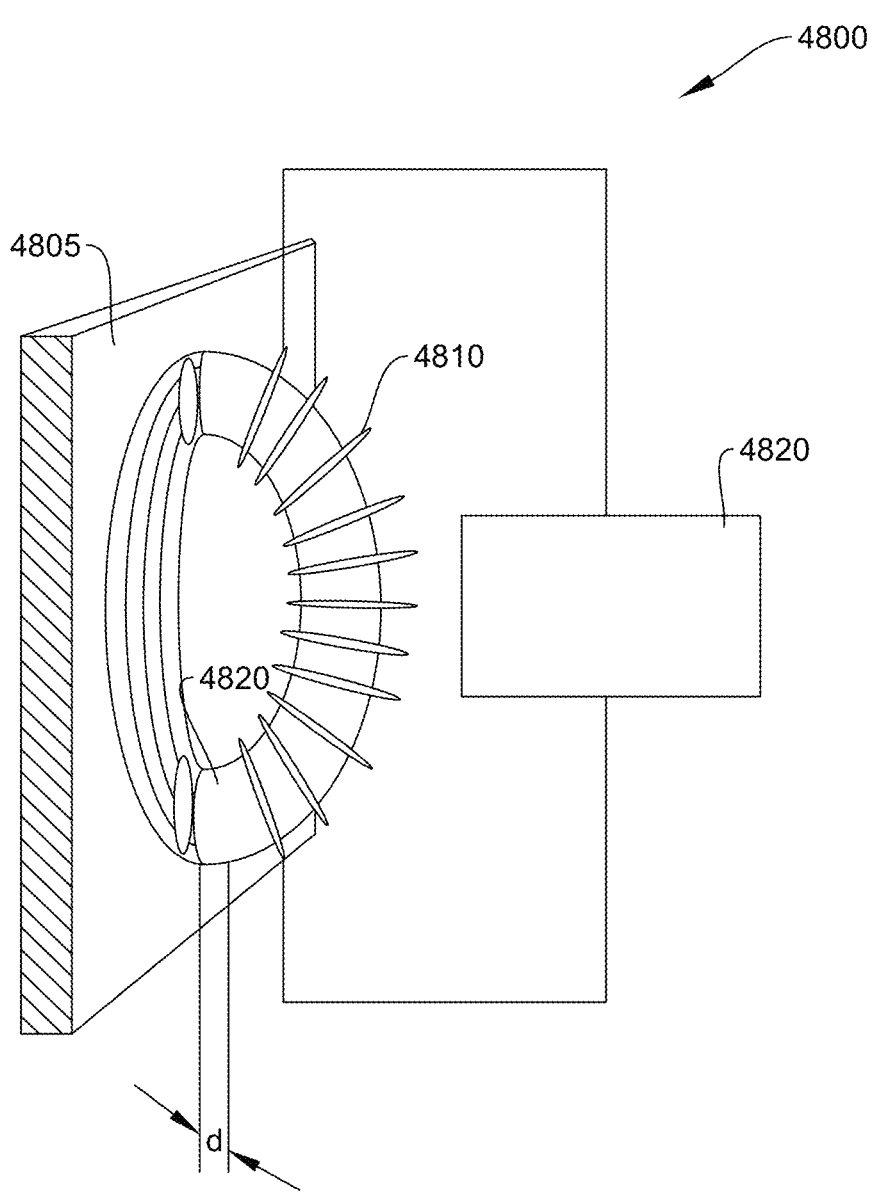
Figure 183:
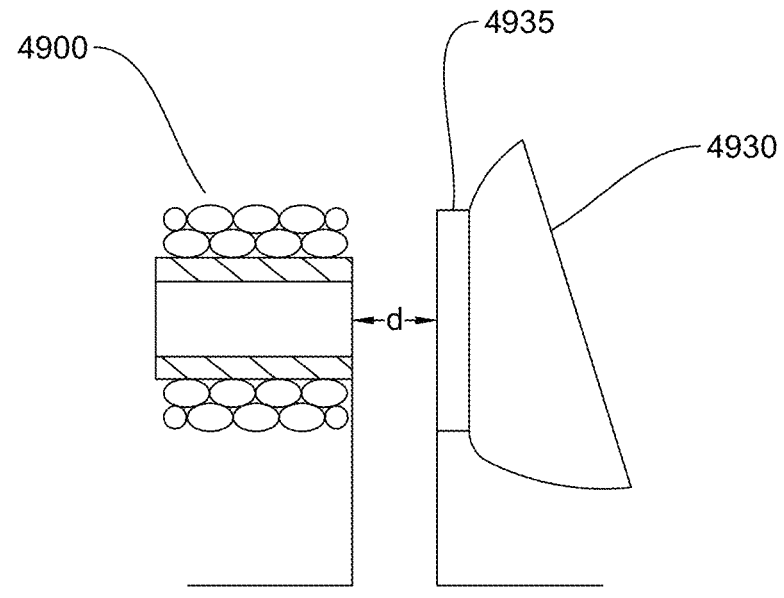

FIG. 182 shows a schematic of an example of a transverse inductive proximity sensor 4800 having components formed from ELR materials and configured to produce an output signal indicative of the position of a ferromagnetic object 4805. FIG. 183 shows a cross-sectional schematic of an example of a transverse inductive proximity sensor 4800 having components formed from ELR materials and configured to produce an output signal indicative of the position of an object. The sensor 4800 comprises a coil 4810 wound around a core 4815, such as a ferrite core. The coil may be formed from ELR nanowires, ELR tapes, ELR thin films, ELR foils, or other formations of ELR material. When the sensor is brought near a ferromagnetic object 4805, the inductance of the coil is altered in a manner that depends on the distance d. The changed inductance may be detected by an inductance meter 4820. Therefore the distance d between a ferromagnetic object 4805 and the sensor 4800 can be determined by measuring changes in inductance. As shown in FIG. 183, by coupling a non-ferromagnetic object 4930 to a ferromagnetic object such as a ferromagnetic disk 4935, the sensor 4800 may be used to indirectly determine the distance d to the non-ferromagnetic object 4930 using the same methods described above.

Although FIGS. 182 and 183 show two examples of a configuration of transverse inductive proximity sensors, the examples shown are for illustrative purposes only, and various other suitable configurations of a core (including ferromagnetic, ferrimagnetic and non-ferrite cores such as air or dielectric cores) and/or coils/windings (including solenoids, toroids, and other arrangements) are possible as would be appreciated. Various transverse inductive proximity sensors may comprise coils or windings formed from ELR material. Also, various transverse inductive proximity sensors may utilize ELR coils, regardless of its precise mode of operation and measurement.

I.G. Hall Effect Position Sensors

Figure 184:
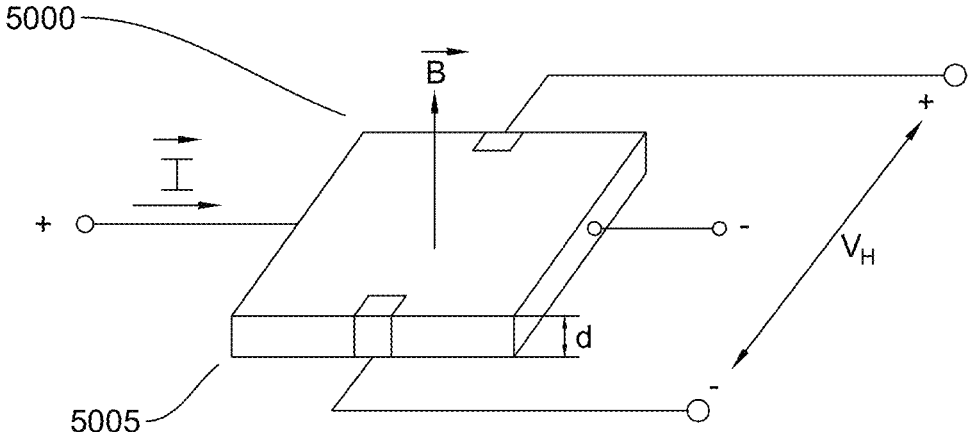

FIG. 184 shows a schematic illustrating the operating principles of a Hall effect sensor 5000 having ELR components formed from ELR materials and configured to produce an output signal indicative of a magnetic field and/or the position of an object. As shown, in response to an input current I (e.g., a DC current) applied across two terminals of a conducting strip 5005, a magnetic field (B) produces a transverse Hall potential difference ($V_H$) across the other two terminals of the conductor. The output signal $V_H$ (i.e., its sign and amplitude) depends on both the magnitude and direction of the magnetic field (B) and applied electric current (I). The conducting strip 5005 may be formed from ELR nanowires, ELR tapes, ELR thin films, ELR foils, or other formations of ELR material. Although not shown, the Hall effect sensor 5000 may be implemented in analog or bi-level form by integrating the sensor with interface circuits such as amplifiers or threshold electronics (such as a Schmitt trigger), respectively.

Figure 185:
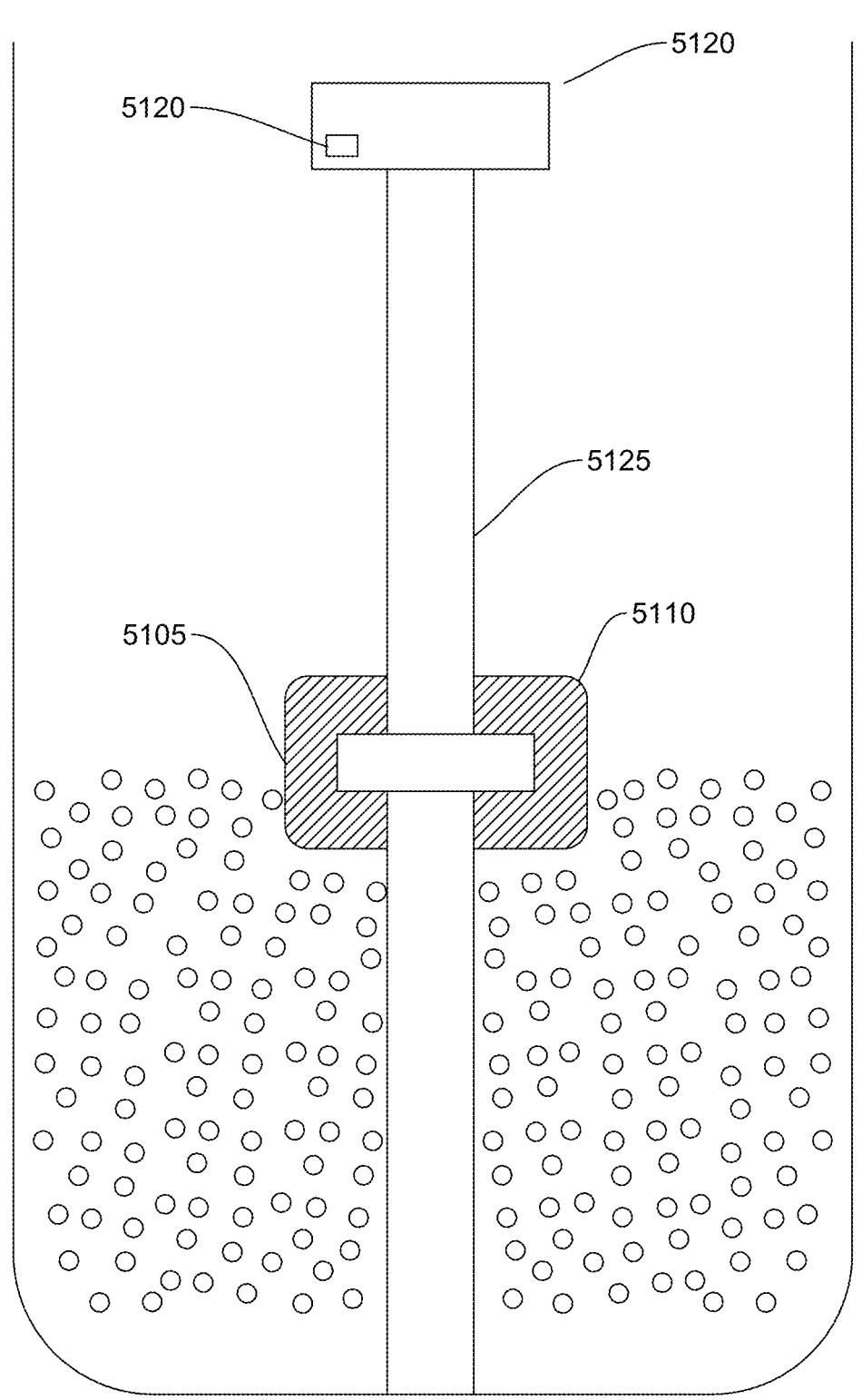

The output signal of a Hall effect sensor 5000 (or simply "Hall sensor") may be used to directly measure a magnetic field. The Hall effect sensor 5000 may also be combined with a magnetic field source such as a permanent magnet or other magnetic field source (e.g. solenoid or toroid) to detect position. In some examples of a Hall effect sensor, a permanent magnet or other magnetic field source is coupled to an object whose position is being measured. In such examples, the magnetic field detected by the Hall sensor therefore indicates the position of the object in relation to the Hall sensor, because the magnetic field that reaches the conductive strip will vary depending on the position of the object relative to the conductive strip. FIG. 185 shows one example of this general class of Hall effect position sensors. As shown, a magnet 5105 or other magnetic field source is placed into or on a float object 5110 so that the float moves up and down along a pole 5125 relative to the fixed Hall sensor 5120 located at the top of the pole.

Figure 186A:
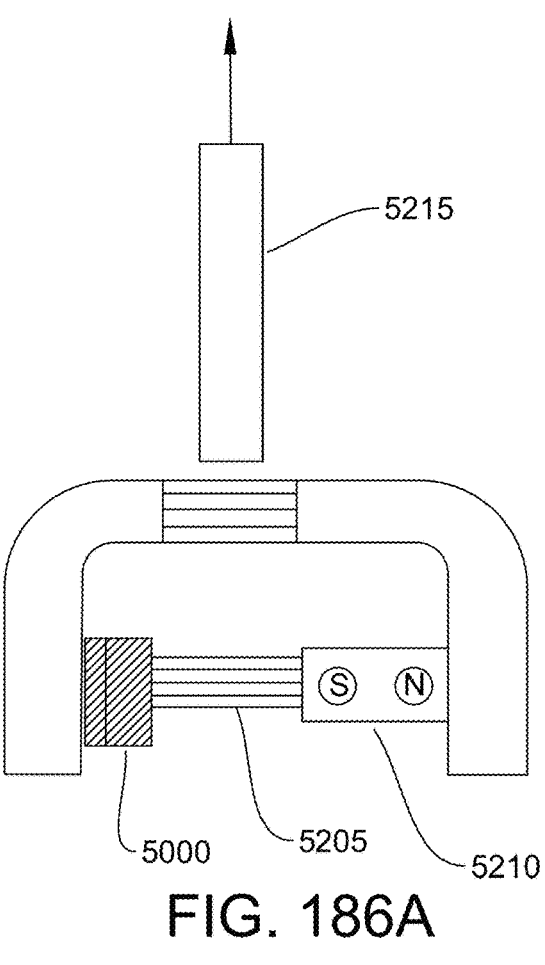
Figure 186B:
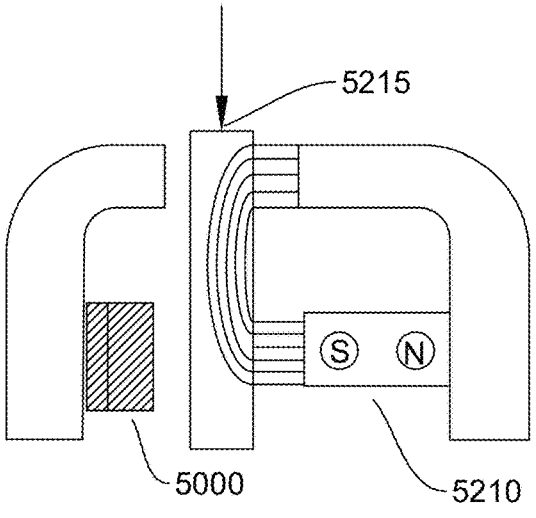

As another example illustrated by FIGS. 186A and 186B, a Hall effect sensor may include a magnetic field source 5210 (such as a permanent magnet) that is interruptible by a moveable ferromagnetic object, such as a plate or vane 5215. As shown in FIG. 186A, when the vane 5215 is in a first position that creates an air gap 5205 between the sensor and the magnet, the flux from the magnetic field source reaches the Hall sensor 5000 across the gap. As shown in FIG. 186B, when the vane 5215 is in a second position that occupies the gap 5205, the vane shunts the magnetic flux so that it does not reach the Hall sensor 5000. In such examples, the magnetic field detected by the Hall sensor therefore may indicate the position or displacement of an object coupled to the vane. The vane may have a linear or rotating motion. Such sensors may be used in automobile distributors, although many other applications are of course possible.

Various other sensors utilize the magnetoelectric transduction mechanism of a Hall sensor 5000. For example, sensors may employ multiple (e.g., four) Hall sensors configured in a bridge or other network arrangement and driven by a permanent magnet (or other magnetic field source) to measure linear or angular 3D position or motion. As another example, a Hall sensor may measure a current carried through a conductor by detecting a magnetic field produced by the current. As yet another example, a Hall sensor may be used to monitor disturbances to a magnetic field that result from bringing the sensor in proximity to a metallic structure, ferromagnetic or ferrimagnetic structure, or another type of object that disturbs the magnetic field.

Although FIGS. 184-186 show various examples of Hall effect sensors, the examples shown are for illustrative purposes only. Various other suitable configurations or geometries of a Hall effect sensor and/or other components (including permanent magnets, solenoids, toroids, and other magnetic field sources) used to characterize the position of an object or other types of stimulus may incorporate ELR materials. For example, various configurations may utilize a Hall effect sensor that comprises a conductive strip 5005 created from ELR nanowires, ELR tapes, ELR thin films, ELR foils, or other formations of the ELR material. As another example, various configurations may utilize a magnetic field source (e.g., solenoid or toroid) created from ELR nanowires, ELR tapes, ELR thin films, ELR foils, or other formations of ELR material.

Hall effect sensors may be used for numerous applications, including without limitation: rotating speed sensors (for anti-lock systems, automotive speedometers, disk drives, electronic ignition systems, tachometers, timing wheels, shafts, and gear-teeth), electronic compasses, electric motor control, position/motion sensing/switches, automotive ignition and fuel injection, fluid flow sensors, magnetic sensors, current sensors, and pressure sensors. Hall effect sensors may be included in, for example, automobiles, smart phones, printers, keyboards, industrial machinery, and some global positioning systems, and other applications, as would be appreciated.

I.H. Magnetoresistive Position Sensors

Various magnetoresistive sensors exploit anisotropic magnetoresistance characteristics of a conducting element. Magnetoresistive sensors may be used in many of the same configurations and applications as a Hall sensor, including as a proximity, position, or rotation detector. A magnetoresistive sensor detects changes in a magnetic field (such as a field generated by a permanent magnet or other magnetic field source such as a solenoid or toroid) by monitoring the resistance of the magnetoresistive conducting element, which changes in response to an altered magnetic field. Various configurations of magnetoresistive sensors may employ ELR components, such as ELR nanowires, ELR tapes, ELR thin films, ELR foils, or other formations of ELR material. For example, a magnetoresistive sensor may employ a magnetoresistive conductive element formed from an ELR thin film, ELR foil or other formation. As another example, a magnetoresistive sensor may employ a magnetic field source (such as a solenoid, toroid or other inductive winding) formed from ELR nanowires, ELR tapes, ELR thin films, and/or ELR foils.

I.I. Magnetostrictive Position Sensors

Various magnetostrictive sensors utilize a structure formed from magnetostrictive materials to convert magnetic energy into kinetic energy or vice versa. One example of a magnetostrictive position sensor uses ultrasonic waves to detect the position of a permanent magnet (or other magnetic field source) that is movable along the length of a waveguide. Such a system may employ one or more waveguides, magnetic field sources, piezoelectric sensors, and/or magnetic reluctance sensors. Various configurations of magnetoresistive sensors may comprise waveguides, magnetic field sources, magnetic reluctance sensors, or other ELR components formed from ELR nanowires, ELR tapes, ELR thin films, and/or ELR foils. Applications of magnetostrictive position sensors include hydraulic cylinders, injection molding machines, forges, elevators, mining, rolling mills, presses, and other devices that require fine resolution over long distances, and applications, as would be appreciated.

I.J. Radar Position Sensors

Various radar position sensors, such as pulse radar systems and continuous wave radar systems (including, inter alia, frequency modulated continuous wave radar, pulse Doppler, moving target indicator, frequency agile systems, synthetic aperture radar, inverse synthetic aperture radar, phased array radar), transmit pulses or continuous waves of high-frequency radio signals from an antenna and measure the electromagnetic signals reflected from a target object to determine its location, range, altitude, direction, and/or speed. The systems may use the delay in the reflected signal and/or frequency shifts to determine the position and/or speed of a target object. Various configurations of radar position sensors may comprise transmitters, synchronizers, power supplies, oscillators, modulators, waveguides, duplexers/multiplexers, antennas, filters, receivers, pre- and post-processing and control components, and/or other ELR components formed from ELR nanowires, ELR tapes, ELR thin films, and/or ELR foils.

I.K. Other Position, Displacement, and Level Sensors

Other types of sensors that comprise ELR components formed at least in part from ELR nanowires, ELR tapes, ELR thin films, ELR foils, or other formations of ELR material may produce an output signal indicative of the position (e.g., proximity), displacement of an object and/or the level of a fluid. Non-exhaustive examples of other position, displacement, and level sensors may comprise ELR components that are formed at least in part from ELR material include the following: (1) optical proximity, displacement and position sensors that may include a light source, photodetectors (e.g., photodiodes, phototransistors, CCD arrays, CMOS imaging arrays), and light guidance and modification components (e.g., lenses, mirrors, optical fiber cables, filters), such as (a) optical bridge sensors, (b) optical proximity detectors that use polarized light, (c) fiber-optic sensors, (d) Fabry-Perot sensors, (e) grating sensors, (f) linear optical sensors, and (g) other optical position, displacement and level sensors; (2) ultrasonic position, displacement, and level sensors; (3) thickness and ablation sensors including (a) ablation sensors (e.g., break-wire gauges, radiation transducer sensors, light pipe sensors, capacitive or resonant ablation gauges), (b) thin film thickness gauging sensors (e.g., capacitive sensors employing electrodes, and optical sensors); (4) level sensors, including e.g., (a) resistive level sensors, (b) optical level sensors, (c) magnetic level sensors, (d) capacitive level sensors (e.g., having coaxial capacitive plates), and (e) transmission line level sensors (e.g., sensors that detect reflectance from a liquid-vapor interface); (5) pointing devices, including optical pointing devices, magnetic pickup pointing devices, and inertial and gyroscopic pointing devices; and (6) satellite navigation systems such as global positioning systems, global navigation satellite systems (GNSS), and so on.

II. Occupancy and Motion Sensors

In some examples, the sensor 3700 may be configured to provide an output signal that is indicative of the presence of people or animals in a monitored area ("occupancy") or the motion of an object. Such sensors may be used in toys, consumer electronics, security systems, surveillance systems, energy management systems, personal safety systems, appliances, and many other types of systems.

II.A. Capacitive Occupancy/Motion Sensors

Figure 187:
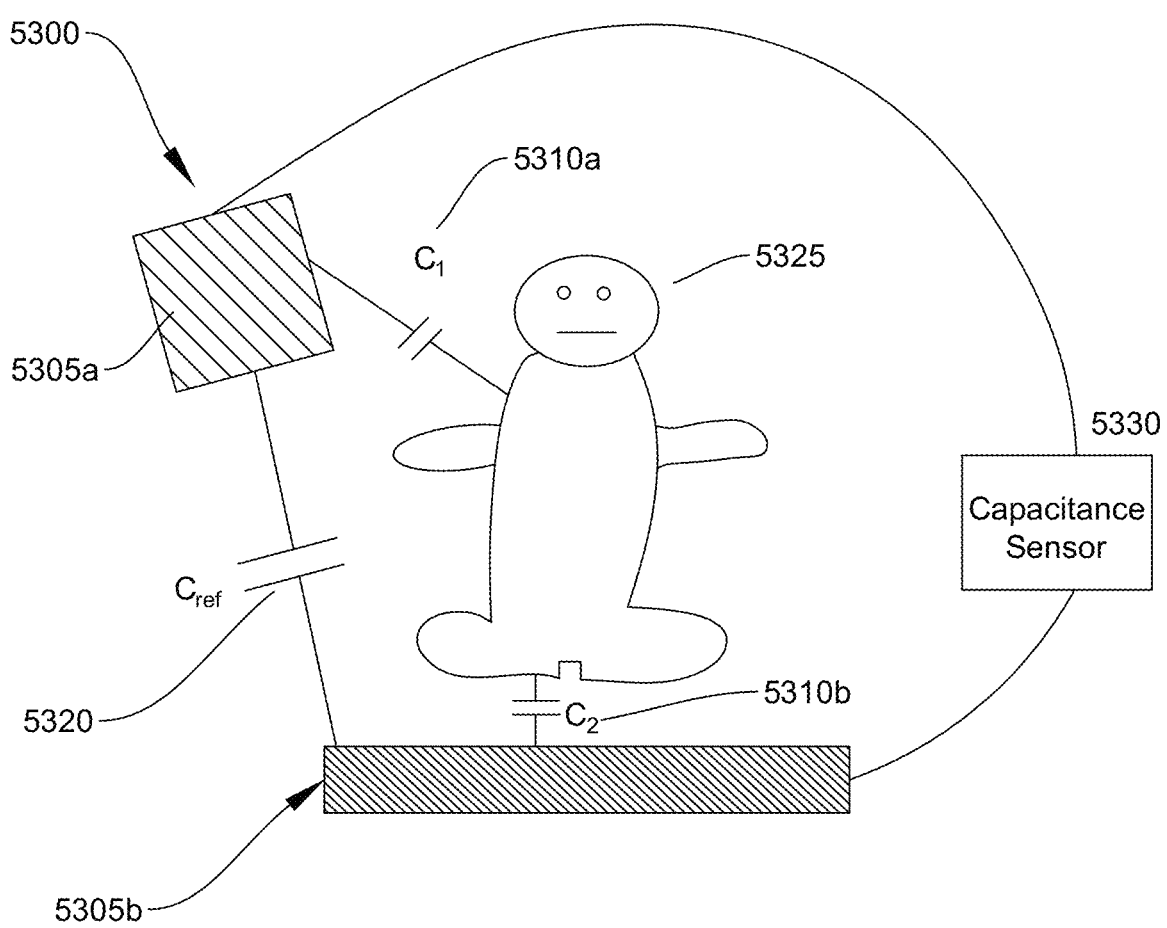

Capacitive sensors may detect occupancy or human/animal motion by measuring the effects of human or animal body capacitance. FIG. 187 shows one example of a capacitive occupancy or motion sensor 5300. As shown, the sensor 5300 may comprise one or more capacitive plates 5305 or other capacitive structures (including, e.g., a test plate 5305*a* and reference plate 5305*b*), shields (such as driven shields), an input source, and a capacitance sensor 5330 or other sensors configured to detect changes in the capacitance between the various capacitive plates or elements (e.g., changes from a known reference capacitance Cref 5320) caused by the presence of a human 5325 or animal. The change in capacitance may result because the human 5325 forms coupling capacitances with its surroundings, including coupling capacitances to the test plate 5305*a* and reference plate 5305*b* (C1 5310*a* and C2 5310*b*, respectively). Some or all of these components may be formed at least in part from ELR nanowires, ELR tapes, ELR thin films, ELR foils, or other formations of ELR material.

II.B. Triboelectric Detectors

Figure 188:
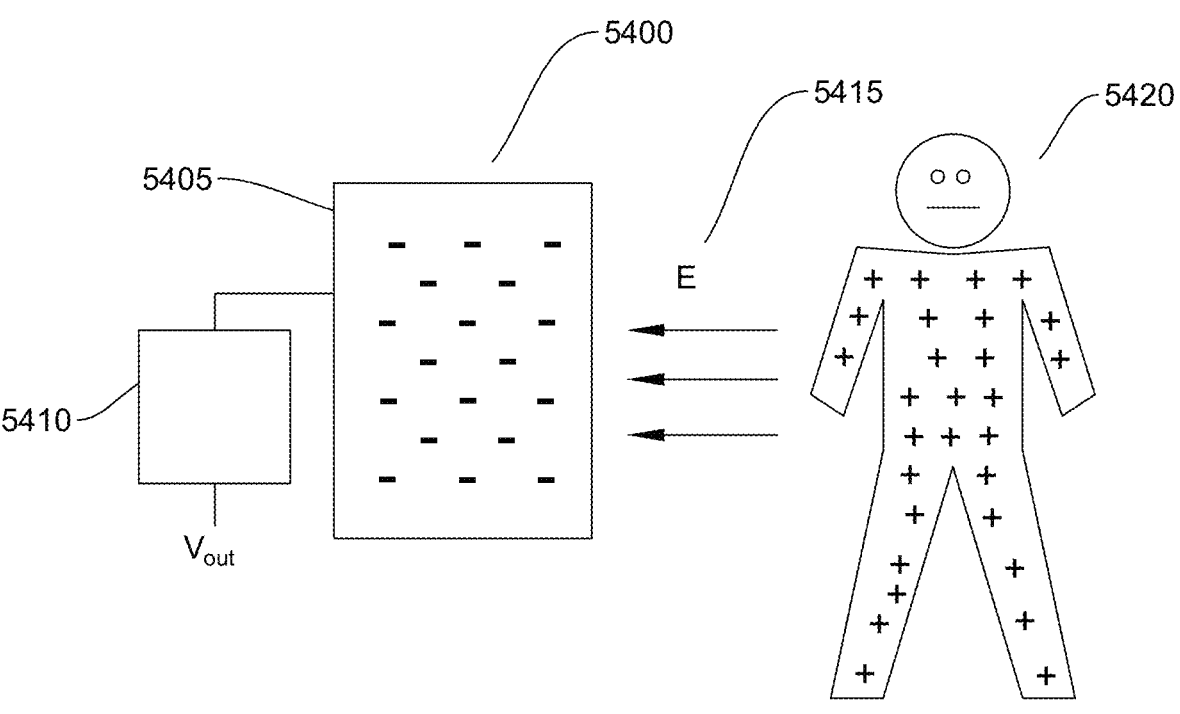

Various triboelectric sensors detect motion of a human, animal or other object by detecting disturbances in a static or quasi-static electrical field (e.g., 5415) that are caused by a moving human or animal carrying a surface charge caused by the triboelectric effect (or colloquially, "static electricity"). FIG. 188 shows one example of a monopolar triboelectric motion detector 5400. As shown, triboelectric sensors may comprise one or more electrode plates 5405 or other electrode structures, and an impedance converter 5410 or other post-processing electronics for detecting changes in the charge on the electrode plates/structures caused by the movement of a human 5420, animal or other charge carrier. These components may be formed at least in part from ELR nanowires, ELR tapes, ELR thin films, ELR foils, or other formations of ELR material.

II.C. Optoelectric Motion Sensors

Figure 189:
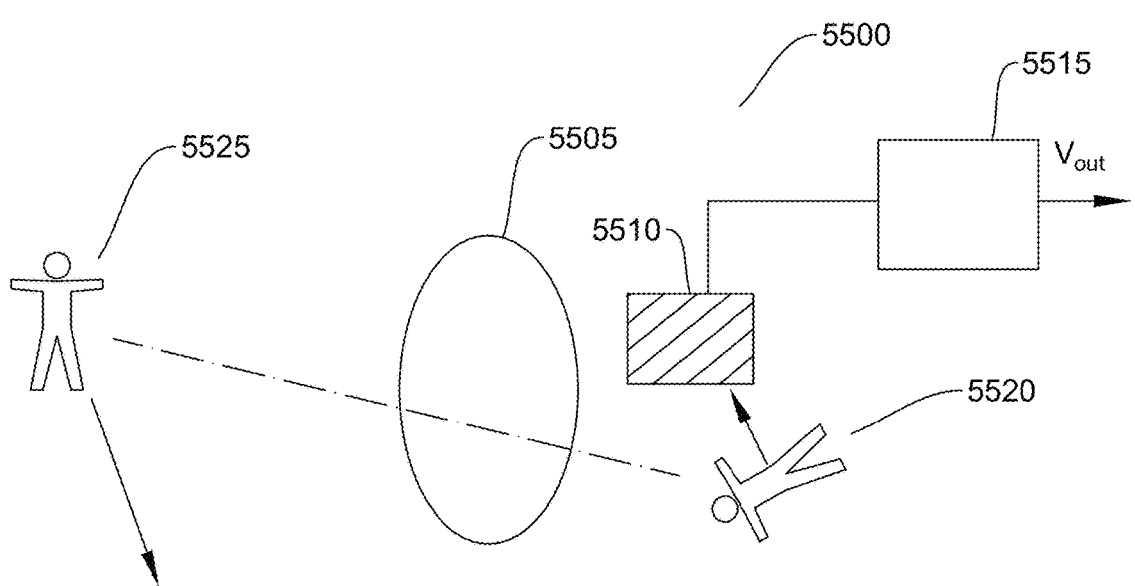

Various optoelectric motion sensors detect motion of a human, animal or other object in a monitored area by detecting visible or infrared light reflected or emanated from the object that creates an optical contrast between the object and its surroundings. The light detected may originate from a light source (such as a light emitting diode, daylight, moonlight, incandescent lamp, laser, etc.) or from the moving object itself (e.g., mid- and far-IR emission from a human body). FIG. 189 is a schematic that illustrates the general structure of an optoelectric motion sensor 5500. As shown, the sensor may comprise one or more focusing devices 5505 (e.g., lenses including pinhole lenses, facet lenses, Fresnel plastic lenses, and mirrors including parabolic mirrors, etc.); one or more light detecting elements 5510 (e.g., bolometers, thermopiles, pyroelectric elements, photovoltaic cells, photoconductive cells, photo resistors, PVDF film, CCD sensors, CMOS imaging sensors, etc.); and post-processing electronics 5515, such as amplifiers and comparators, configured to post-process the signal produced by the light detecting elements. Some or all of these components may be formed at least in part from ELR materials. For example, as described in greater detail herein, various light detecting elements may be formed at least in part from ELR nanowires, ELR tapes, ELR thin films, ELR foils, or other formations of ELR material. As shown, when an object 5525 (such as a person) moves across the field of view of the focusing device 5505 (as shown by arrow), the object's image 5520 moves and thereby creates a photon flux on the light detecting element 5510 different from the photon flux caused by an image of the static surroundings. The light sensitive element responds with a changed or disturbed voltage. The disturbance is detected by the post-processing electronics. Optoelectronic detectors may be used in security systems, energy management, consumer electronics, toys, etc.

II.D. Optical Presence Sensors

Figure 190:
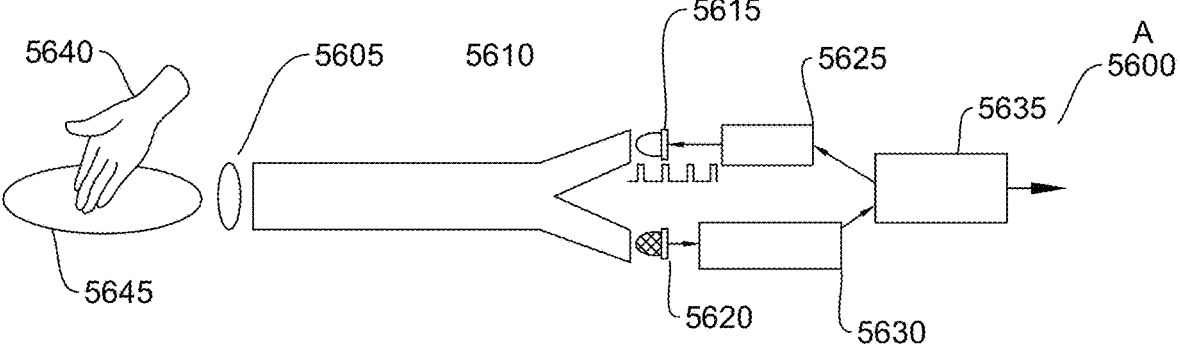

Various optical presence sensors detect the presence of an object in a monitored area by detecting an alteration in the amount of light that is reflected or absorbed by the object. FIG. 190 is a schematic that illustrates an example of an optical presence detector 5600. As shown, the optical presence detector includes a light source or emitter 5615 (such as an LED), driven by a driver 5625, that produces a light beam in the field of view of a light sensor 5620 (such as those described herein). The static background reflects a particular amount of light back to the light sensor, which creates a background output signal. When an object 5640 appears in the field of view of the light sensor 5620, it reflects or absorbs light in a manner different than the static surroundings. The light sensor and a light-to-voltage converter 5630 therefore produce a detectable output, different from the normal background signal, in response to the different light reflectance/absorption of the object. As shown, the optical presence detector may include various focusing and guidance elements such as a lens 5605 and a light pipe 5610 to produce the light beam 5645 and/or receive reflected light. Also, the sensor may include a processor 5635, configured to drive the light source 5615 and process the output signal of the light sensor 5620. Some or all of these components may be formed at least in part from ELR materials. For example, as described in greater detail herein, various light sensor elements may be formed at least in part from ELR nanowires, ELR tapes, ELR thin films, ELR foils, or other formations of ELR material. Such detectors may be used in robots, hand dryers, sinks, toilets, light switches, and other consumer, commercial, and household products.

II.E. Pressure Motion Sensors

Figure 191:
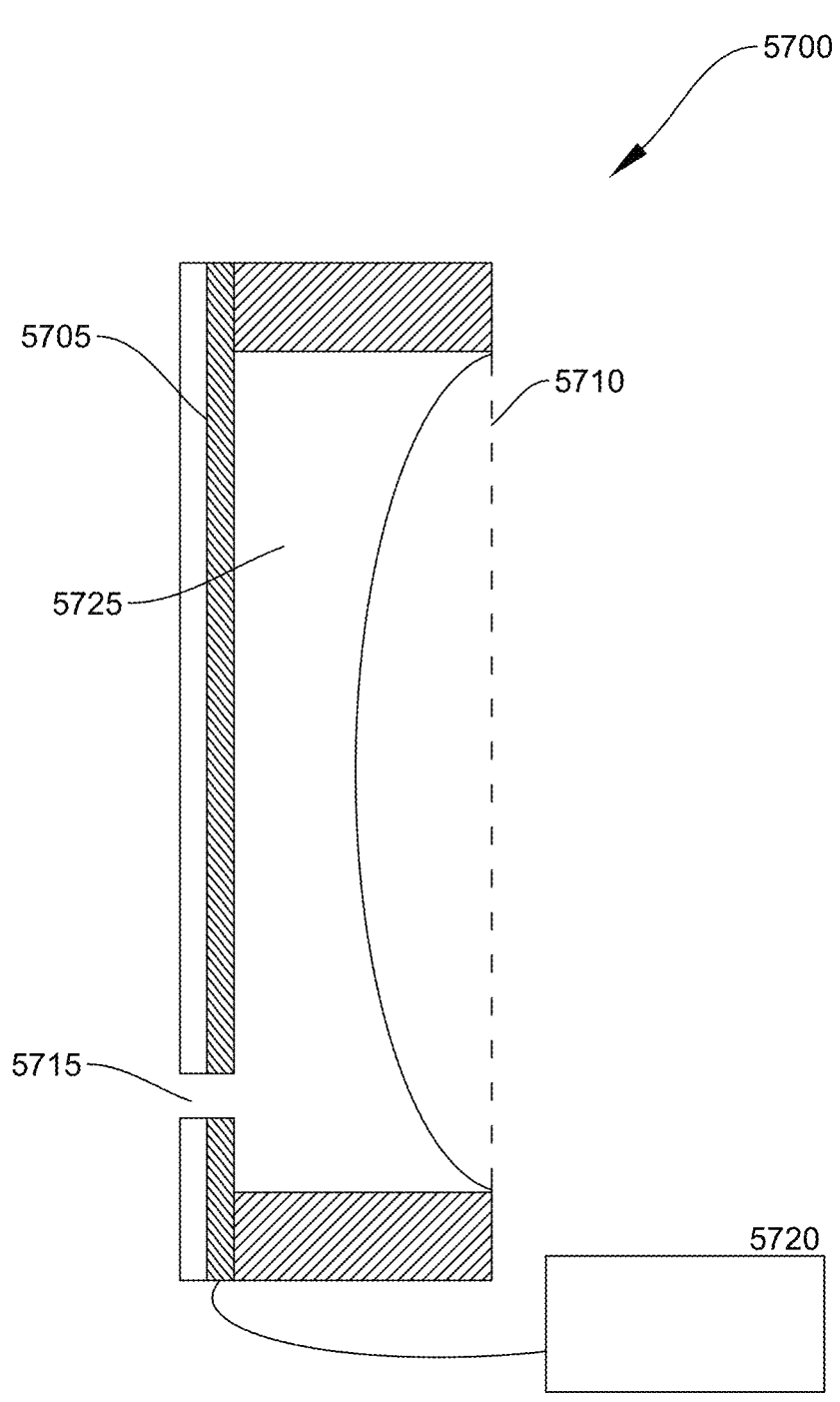

Various pressure motion sensors detect intrusions or other motion in a closed, controlled space by monitoring variations in air pressure that result from sudden movement of doors, windows, people, or other objects. FIG. 191 is a cross-sectional schematic that illustrates an example of an air pressure-gradient sensor 5700. As shown, air-pressure-gradient sensor 5700 may include a chamber 5725 formed in part from two opposing walls: a metallic or metalized flexible membrane 5710 or diaphragm (such as a metalized plastic membrane or metal foil) and a rigid metallic or metalized plate 5705, which includes a vent hole 5715. The two metallic surfaces, which may be formed from ELR materials, together have a coupling capacitance. Therefore, deflections of the membrane 5710 (from a neutral position shown with dashed line) caused by sudden changes in air pressure may be determined using a capacitance sensor 5720, e.g., a sensor that uses the capacitive displacement sensing systems and methods described herein. Of course, as described above, with respect to capacitive displacement sensors, other components of such motion sensors may be formed from ELR materials. In other examples, the air pressure-gradient sensor 5700 may include other types of displacement sensors to determine the deflection of the membrane, such as other displacement sensors described herein. In such examples, the membrane and/or rigid plate may not be metallic or metalized.

II.F. Other Occupancy and Motion Detectors

Other types of sensors that comprise ELR components formed at least in part from nanowires, tapes, thin films, foils, or other formations of ELR material may produce an output signal indicative of occupancy or motion. Various examples of other occupancy, presence, or motion sensors may comprise components that are formed at least in part from ELR material include: radar systems (as described herein), other air pressure/pressure-gradient sensors, acoustic sensors, photoelectric sensors that detect an interrupted light beam, pressure mats or other pressure-sensitive surfaces, stress or strain detectors embedded in a protected area, switch sensors including magnetic switches, vibration detectors, infrared motion detectors, ultrasonic detectors, video motion detectors, face recognition systems, laser detectors, alarm sensors, Reed switches, stud finders, triangulation sensors, wired gloves, and Doppler radar sensors.

III. Velocity and Acceleration Sensors

In some examples, the sensor 3700 may be a single- or multi-axis velocity sensor or accelerometer configured to provide an output signal that is indicative of the velocity or acceleration of an object, respectively. A velocity sensor may measure the linear or angular speed or rate of motion of an object. An accelerometer may measure the coordinate acceleration or proper acceleration of an object, e.g., by measuring weight per unit of test mass or specific force. Accelerometers may be used to determine, inter alia, orientation, coordinate acceleration (i.e., change of velocity of an object in space), vibration, shock, and falling. Multiple accelerometers may be used to detect differences in acceleration, e.g., as gradiometers.

Velocity sensors or accelerometers may be used in numerous applications, including without limitation: automobiles (e.g., for acceleration or velocity measurements, evaluation of engine/drive train and braking systems, electronic stability control systems, airbag deployment), trains, vulcanology, commercial or industrial equipment, vibration measurements/monitoring, seismic activity measurements, inclination measurements, gravimeters, machinery health monitoring, aircraft/avionics equipment, inertial navigation or guidance systems, medical equipment, and consumer products, including video game systems, sports equipment, and other portable electronics, such as mobile phones, camcorders and cameras (e.g., for image stabilization and/or orientation determinations), smart phones, audio players, tablet computers, laptop computers, personal digital assistants, and other mobile computers.

In some examples, position/displacement, velocity, and/or acceleration sensors may be used interchangeably due to the mathematical relationship between these quantities. As a first example, in low-frequency or low-noise applications, the displacement sensors and methods described elsewhere herein may be used for sensing velocity and acceleration. Additional post-processing, e.g., differentiation, may be performed on an output signal of the displacement sensor to determine one or more of the signal's mathematical derivatives that indicate velocity or acceleration. As a second example, in medium-frequency or medium-noise applications, the velocity sensors and methods described herein may be used for sensing acceleration. Additional post-processing, e.g., differentiation, may be performed on an output signal of the velocity sensor to determine the signal's mathematical derivative that that indicates acceleration. As a third example, the acceleration and/or velocity sensing systems and methods described herein may be used to determine velocity and/or position/displacement, respectively. Additional post-processing, e.g., mathematical integration, may be performed on the output signals of an acceleration and/or velocity sensor to determine the velocity and/or position/displacement of an object, respectively.

III.A. Electromagnetic Velocity Sensors

Figure 192:
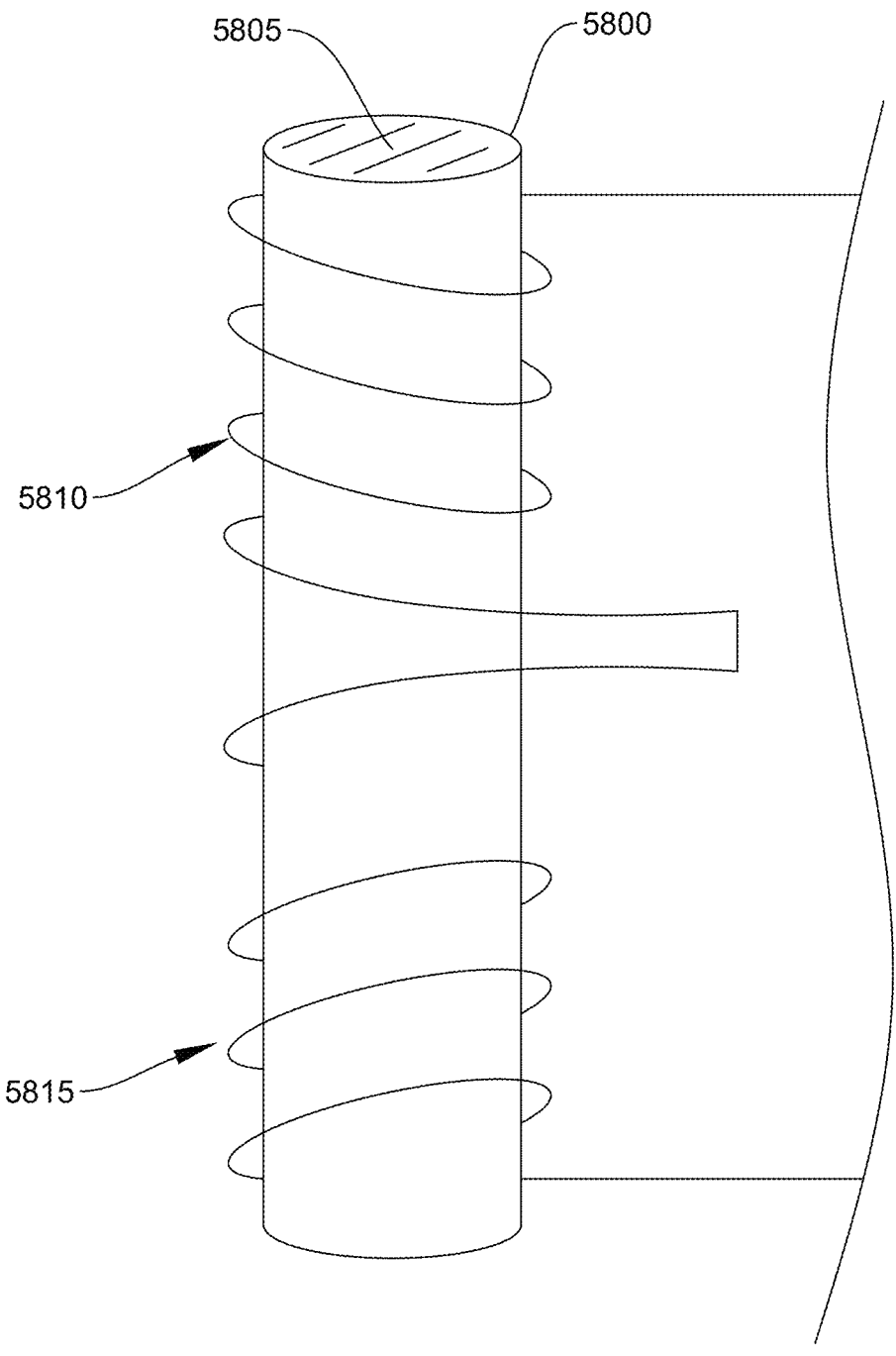

FIG. 192 shows a schematic illustrating the operating principles of an electromagnetic velocity sensor. As shown, the sensor 5800 comprises two or more induction coils 5810 and 5815 connected in series-opposite direction around a moveable permanent magnetic core 5805; the coils may be partially or wholly formed from ELR material. Under Faraday's law, moving the magnetic core within a coil induces a voltage in the coil proportional to the velocity of the core. Therefore, the output voltage across the two coils may be measured to determine the velocity of the core, and therefore the velocity of an object coupled to the core. The arrangement of coils shown is intended to be illustrative only and other geometries may be employed, including using one or more coils wrapped around a moveable rotary magnetic core for angular velocity measurements. The sensor shown may be used, for example for sensing the velocity of vibration.

III.B. Accelerometers Having Proof Masses

Figure 193:
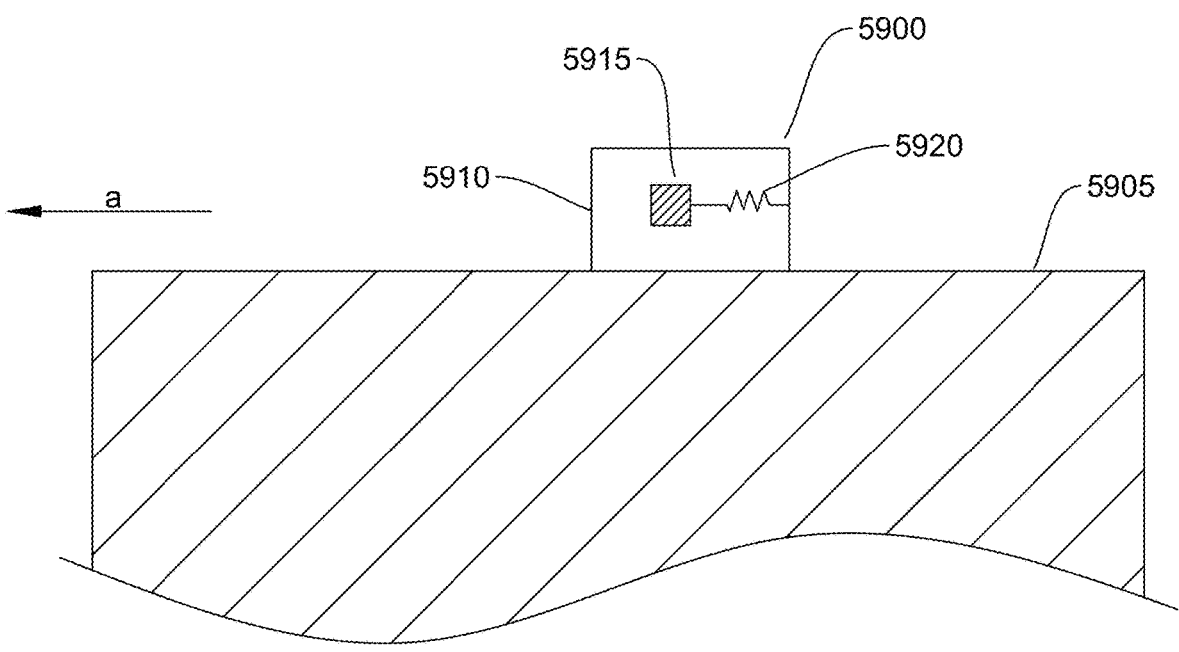

As illustrated in FIG. 193, various accelerometers 5900 determine acceleration (a) of an object 5905 coupled to the housing 5910 of the accelerometer by measuring the displacement of a relatively large moveable seismic, inertial or proof mass 5915 having a known weight and coupled to the accelerometer's housing by springs 5920, cantilevers, hinges or other elastic elements. To measure the displacement, the accelerometer 5900 may use one or more displacement sensors, such as the displacement sensors described herein. In such examples (including examples described further herein), the proof mass, components of a displacement sensor, and/or other components may be formed in whole or in part from ELR materials.

III.C. Capacitive Accelerometers

Figure 194:
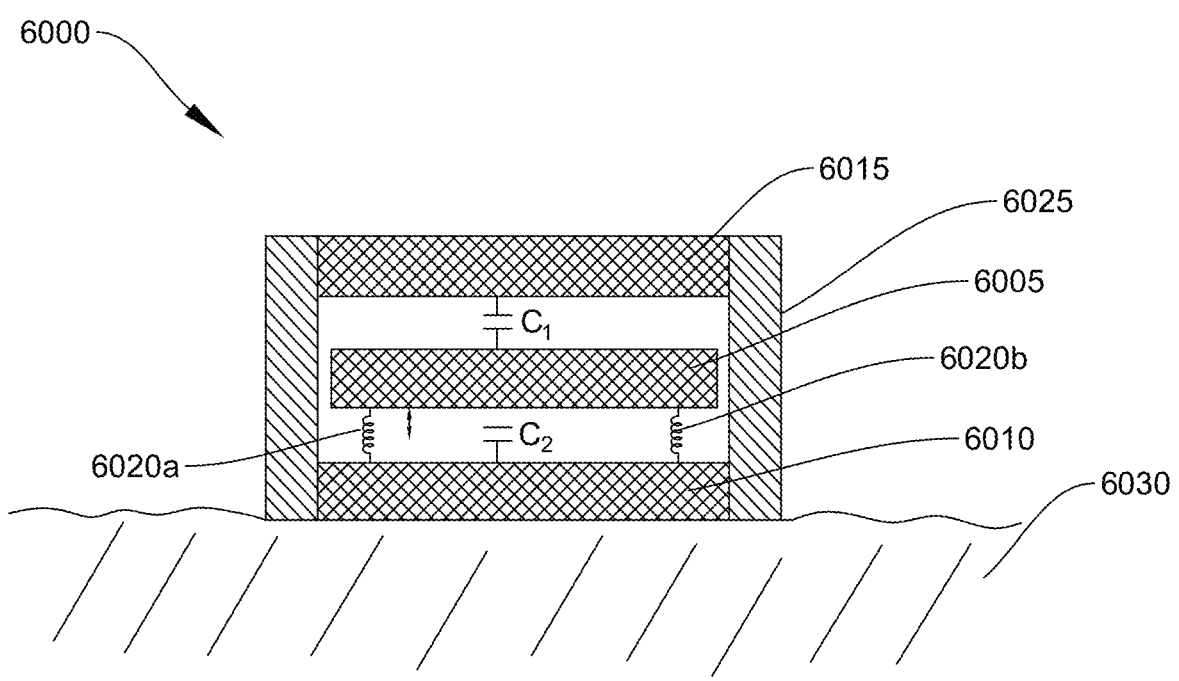

Various capacitive accelerometers determine the displacement of a proof mass, and therefore the acceleration of an object, by using capacitive displacement conversion methods, e.g., using principles and systems similar to those described herein with respect to capacitive displacement sensors. As shown in FIG. 194, in such examples, the sensor 6000 may comprise (1) a moveable proof mass 6005 supported by springs or other elastic elements 6020 (such as silicon springs) and configured to move within a housing 6025 of the sensor, and (2) two or more capacitive plates 6015, 6010, 6005 or elements, which may include the proof mass 6005 itself, moveable capacitive plates or elements, e.g., connected to the moveable proof mass (not shown), and/or stationary capacitive plates or elements 6005, 6010 whose positions are fixed with respect to the accelerometer's housing 6025. Any or all of these components or other components of the sensor 6000 may be formed in whole or in part from ELR materials. The movement of the proof mass during acceleration causes the capacitances between the various capacitive elements (e.g. C1, C2) to change due to the altered relative positions of the capacitive elements. The changed capacitances may be detected in any suitable way (including differential techniques and other methods described herein) and thus used to derive the displacement of the proof mass, which in turn may be used to determine the acceleration of an object 6030 coupled to the accelerometer's housing 6025. In some examples, a capacitive accelerometer may be micromachined, e.g., using MEMS technologies or other techniques.

III.D. Piezoresistive Accelerometers

Various piezoresistive accelerometers determine the displacement of a proof mass, and therefore the acceleration of an object coupled to the accelerometer, by using piezoresistive elements. In such examples, the sensor may comprise (1) a moveable proof mass supported by springs, hinges, or other elastic elements and configured to move within the housing of the accelerometer, and (2) piezoresistive strain gauge elements that measure strain in the spring or elastic elements caused by the displacement of the proof mass (further discussion of piezoresistive strain gauges is provided herein). Any or all of these components may be formed in whole or in part from ELR materials. In some examples, a piezoresistive accelerometer may be micromachined, e.g., using MEMS technologies or other techniques.

Figure 195:
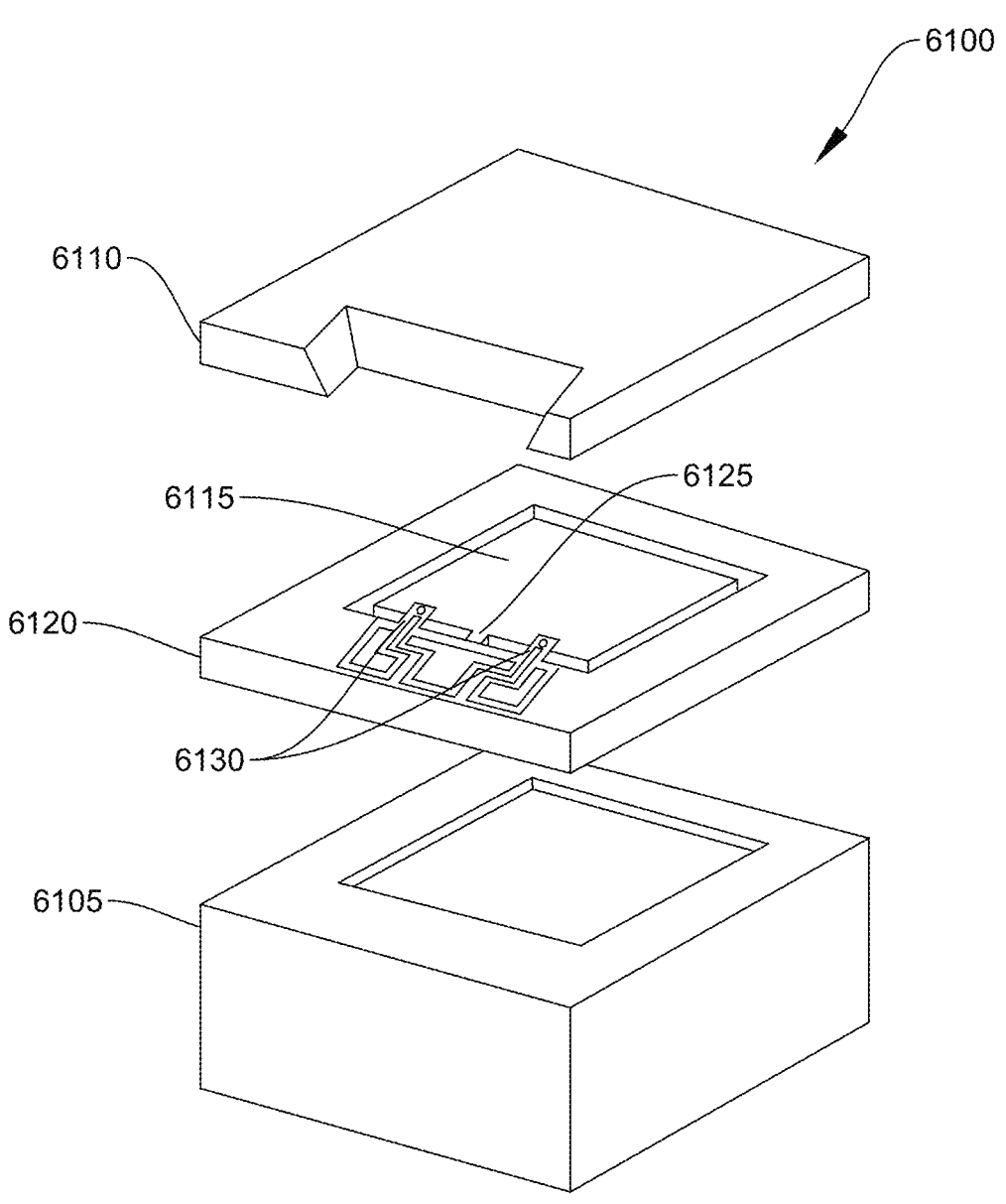

FIG. 195 shows an exploded view of one example of a piezoresistive accelerometer 6100. As shown, recesses within a lid layer 6110 and a base layer 6105 form a cavity within which the proof mass 6115 can move in response to acceleration. In an inner layer of silicon, the proof mass 6115 is coupled to a support ring 6120 via an elastic hinge 6125. Integrated strain gauges 6130 on the hinge provide output signals from the terminals that indicate the displacement of the proof mass and therefore the acceleration of the housing.

III.E. Piezoelectric Accelerometers

Figure 196:
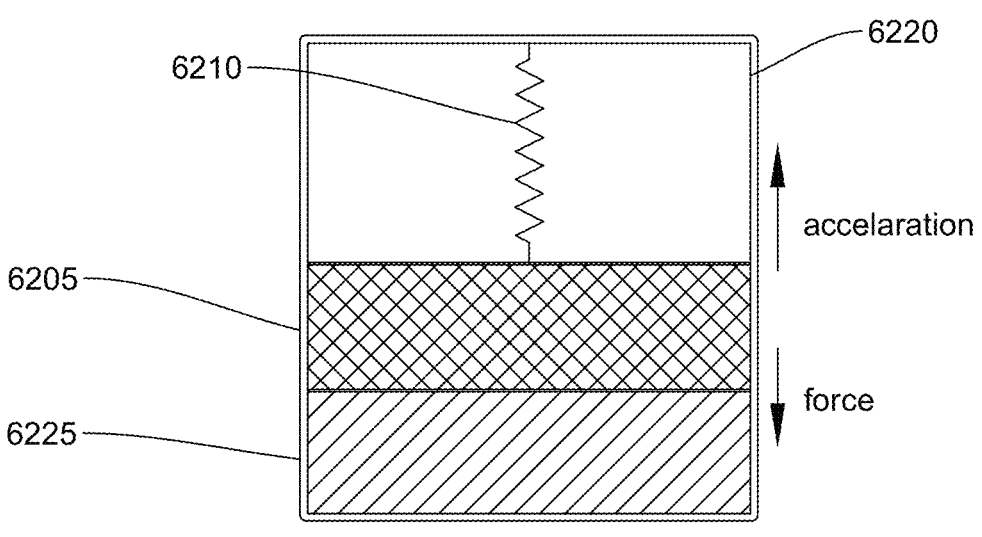

Various piezoelectric accelerometers determine the displacement of a proof mass, and therefore the acceleration of an object coupled to the accelerometer, by using piezoelectric elements. As shown in FIG. 196, in such examples, the sensor 6200 may comprise (1) a moveable proof mass 6205 configured to move relative to the housing 6220 of the accelerometer, and coupled to the housing via a spring, hinge or other elastic member 6210 and (2) piezoelectric elements 6225, such as elements formed from ELR materials, quartz crystal, barium titanante, lead zirconite titanate, lead metaniobite, or other ceramic piezoelectric materials, and configured to respond to movements of the proof mass (e.g., by shearing, compressive, bending, or other types of movement) with an electrical signal. Any or all of these components may be formed in whole or in part from ELR materials. As shown, when the housing of the accelerometer accelerates, it moves relative to the proof mass, which exerts force (e.g., a shearing, compressive or bending force) on the piezoelectric elements, causing an electrical output signal indicative of the acceleration. Although a compressive force is shown, in other configurations, the piezoelectric element may experience other types of forces from the proof mass. In some examples, a piezoelectric accelerometer may be micromachined, e.g., using MEMS technologies or other techniques. In some examples, the piezoelectric elements may be piezoelectric films disposed on the moveable proof mass and/or on springs, hinges, or micromachined cantilevers that support the proof mass.

III.F. Heated Plate Accelerometers

Figure 197:
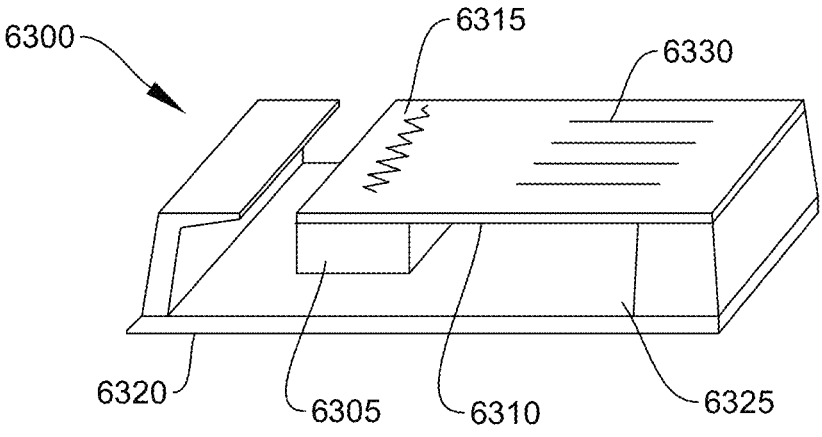

Various heated plate accelerometers determine the displacement of a heated proof mass, and therefore the acceleration of an object coupled to the accelerometer, by using temperature sensors to detect temperature fluctuations caused by movement of the proof mass. FIG. 197 shows one example of a heated plate accelerometer 6300 (with a roof component omitted) that comprises (1) a moveable proof mass 6305 configured to move relative to the housing of the accelerometer and supported by a cantilever beam 6310 or hinge, (2) a heating element 6315 (such as a resistor) configured to heat the proof mass to a defined temperature, (3) one or more heat sinks 6320 separated from the proof mass by a thermally conductive gas 6325 and configured to receive heat from the proof mass through the gas, (4) one or more temperature sensors 6330, such as thermopiles, disposed in, on, or near the cantilever beam or hinge (or another component) and configured to determine temperature fluctuations in the cantilever beam (or another component) that result from the proof mass being displaced from its neutral position. Any or all of these components or other components may be formed in whole or in part from ELR materials.

In still other examples, gas heated by a resistor or other heating element may be used as the seismic mass. The accelerometer may use thermopiles or other temperature sensors to detect temperature fluctuations caused by the movement of the heated gas that results during acceleration (i.e., from a convective force). In such examples, the heating element, temperature sensors, and/or other components may be formed in whole or in part from ELR materials.

III.G. Other Types of Velocity Sensors and Accelerometers

Other types of sensors that comprise ELR components formed at least in part from ELR nanowires, ELR tapes, ELR thin films, ELR foils, or other formations of ELR material may produce an output signal indicative of velocity or acceleration. Non-exhaustive examples of velocity sensors and accelerometers (including gyroscopes and gravitational detectors such as inclinometers or tilt detectors) that may comprise components that are formed at least in part from ELR material include the following types of velocity or acceleration sensors: satellite navigation systems such as global positioning systems and global navigation satellite systems, rotor gyroscopes (such as magnetic levitation gyroscopes), gravimeters (including (a) gravimeters that use a magnetically levitated sphere, and that may use coils or spheres formed from ELR material, and (b) gravimeters that comprise a spool and magnet both covered at least in part with ELR material), monolithic silicon gyroscopes, optical gyroscopes, conductive gravitational sensors (e.g., mercury switches, electrolytic tilt sensors), inclination sensors employing an array of photodetectors, piezoelectric sensors, micromachined capacitive (MEMS) sensors, shear mode sensors, surface bulk micromachined capacitive sensors, bulk micromachined piezoelectric resistive sensors, capacitive spring mass base sensors, electromechanical servo (servo force balance) sensors, null-balance sensors, strain gauge sensors, resonance sensors, thermal sensors (e.g., submicrometer CMOS process), magnetic induction sensors, variable reluctance sensors, optical sensors, surface acoustic wave (SAW) sensors, laser sensors, DC response sensors, triaxial sensors, modally tuned impact hammer sensors, pendulating integrating gyroscopic sensors, and seat pad sensors. Other, non-exhaustive examples of sensors that may be formed at least in part from ELR material include the following types of sensors: (1) free fall sensors; (2) inclinometers; (3) laser rangefinders; (4) linear encoders; (5) liquid capacitive inclinometers; (6) odometers; (7) rotary encoders; (8) Selsyn sensors; (9) sudden motion sensors; (10) tachometers; (11) ultrasonic thickness gauges; and (12) SONAR sensors.

IV. Force, Strain, and Tactile Sensors

In some examples, the sensor 3700 may be a sensor that comprises ELR material and is configured to provide an output signal that is indicative of a force, strain, and/or touch applied to an object. Like other types of sensors, force or strain sensors comprising ELR material may be (1) quantitative sensors configured to measure force or strain and reflect the measured value in an electrical output signal, or (2) qualitative sensors configured to detect a force or strain in excess of (or lower than) a threshold value.

IV.A. Piezoelectric Cables

Figure 198:
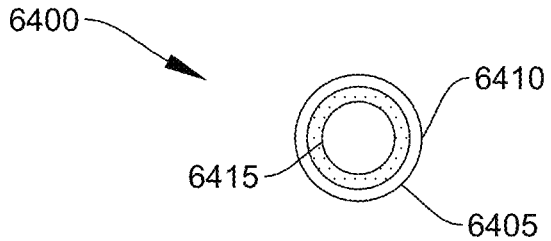

FIG. 198 shows one example of a piezoelectric cable that may be used to provide an output signal that is indicative of a force, strain, and/or or touch. As shown, the coaxial piezoelectric sensor 6400 includes a piezoelectric material 6405, such as a piezoelectric polymer or piezoelectric powder, that forms part of the dielectric between the center conductor core 6415 and the outer conductor sheath 6410 of a coaxial cable. When the cable is subjected to a compressive or stretching force, it produces a responsive charge or voltage that is picked up by the conductors. Such cables may be used for various purposes including monitoring vibration and automobile traffic. These cables may be adapted such that the center conductor core and/or outer conductor shield is formed in whole or in part from ELR materials.

IV.B. Complex Force Sensors (Including Load Cells)

Figure 199:
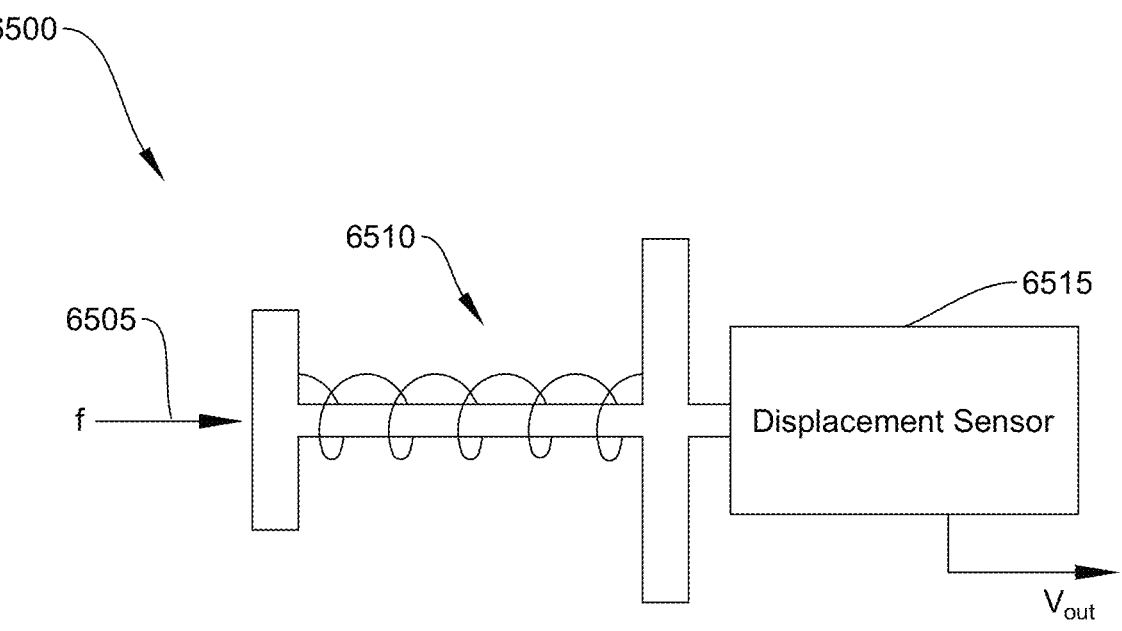
Figure 200:
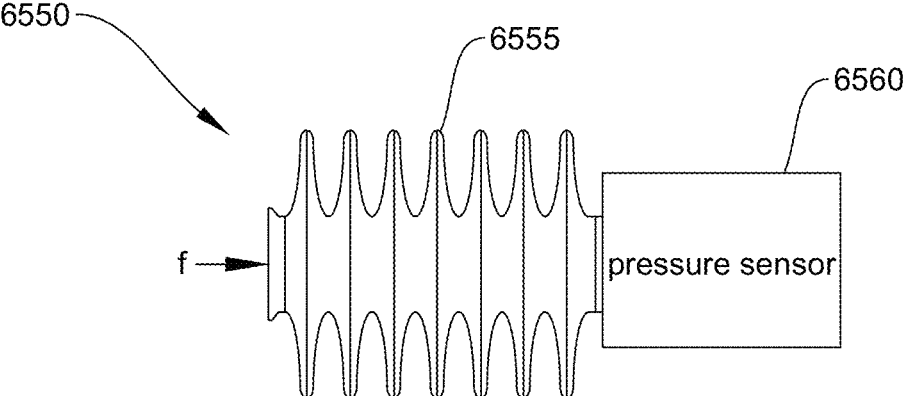

Complex force sensors, or force cells, may (1) transduce an unknown force into an intermediary signal using a first transducer, and (2) convert the intermediary signal into an electrical output signal using a second transducer (i.e., a direct sensor). FIG. 199 shows one example of a complex force sensor 6500 that has a spring 6510 or other force-to-displacement transducer that transduces an applied force 6505 into a displacement; the displacement is then measured by a displacement sensor 6515, such as a linear variable differential transformer sensor or any other type of displacement sensor, as described above. FIG. 200 shows a second example of a complex force sensor 6550 that has a bellows 6555, diaphragm, or other force-to-pressure transducer that transduces an applied force into a pressurized fluid. The generated pressure of the fluid is then measured by a pressure sensor 6560, such as those described herein. In a third example, not shown, an unknown force, via mechanical components (such as an elastic member), deforms one or multiple strain gauges (described herein), which may be arranged in a bridge configuration. The strain gauges convert the deformations into an electrical signal.

Other complex force sensors/force cells include: those that operate using different operating principles (cantilever, bending beam, compression, tensile, universal, shear, torque, hollow) and/or with different constructions (e.g., bending beam, parallel beam or binocular beam, canister, shear beam, single column, multi-column, pancake, load button, single-ended shear beam, double-ended shear beam, "s" type, inline rod end, digital electromotive force, diaphragm/membrane, torsion ring, bending ring, proving ring, or load pin). Any complex force sensors, such as those described herein may use ELR materials, e.g., in a direct sensor (such as those described herein) that converts an intermediary signal into an electrical output signal.

IV.C. Strain Gauges

Figure 201:
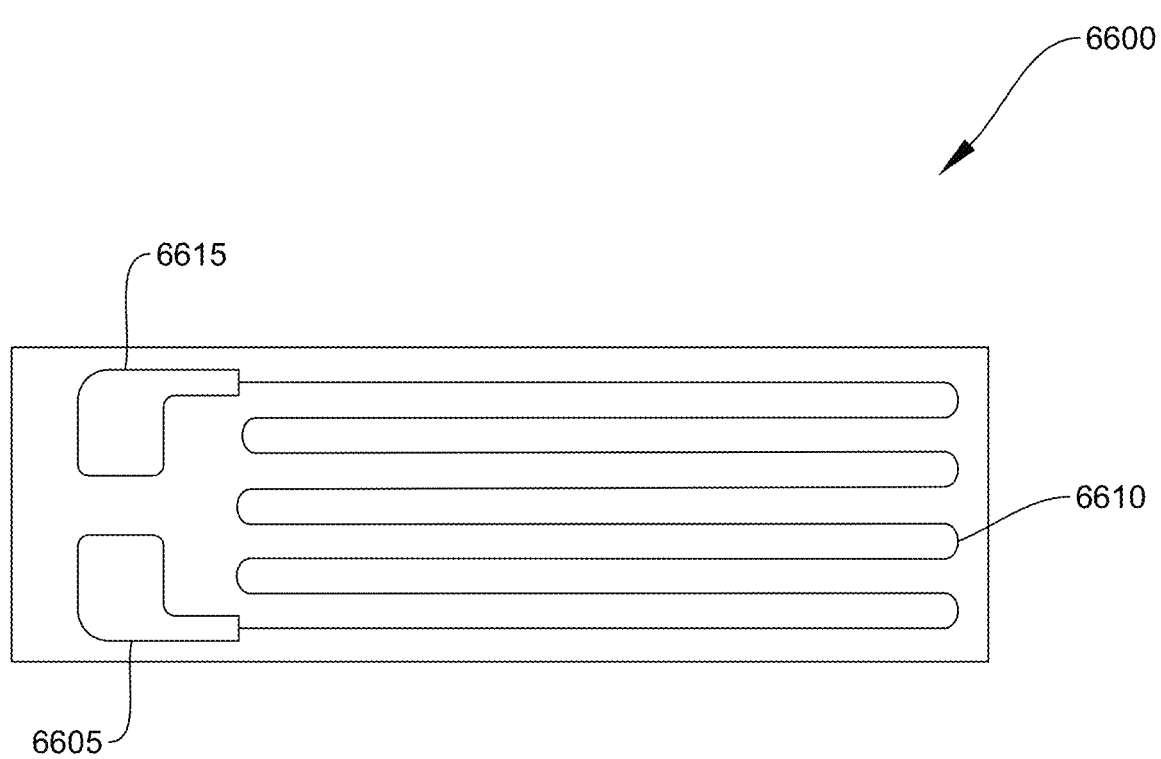

Various strain gauges measure the strain (deformation) of an object by producing and/or measuring piezoresistive changes in resistance that result from the deformation. FIG. 201 shows one example of a wire strain gauge 6600 that may be used to produce an output signal that is indicative of a strain. As shown, the strain gauge comprises a resistive element 6610 (e.g., a wire or foil) bonded with an elastic insulating backing 6605, which may be adhered or otherwise connected to an object that experiences an applied strain. The changed resistance may be measured using a Wheatstone bridge or other resistance sensor. The resistive element and/or resistance sensor may be formed from ELR materials. Although various shapes may be used, often the resistive element is formed in a serpentine format having multiple longitudinal segments that are much longer than the transverse segments. Multiple strain gauges may be arranged (e.g., to measure strains in different axes); they may also be arranged in bridge configurations. In some examples, strain gauges may also include temperature compensation components configured to compensate for resistive changes that result from changes in temperatures. ELR materials may also be incorporated into other types of strain gauges, including semiconductor strain gauges.

IV.D. Switch Tactile Sensors

Figure 202:
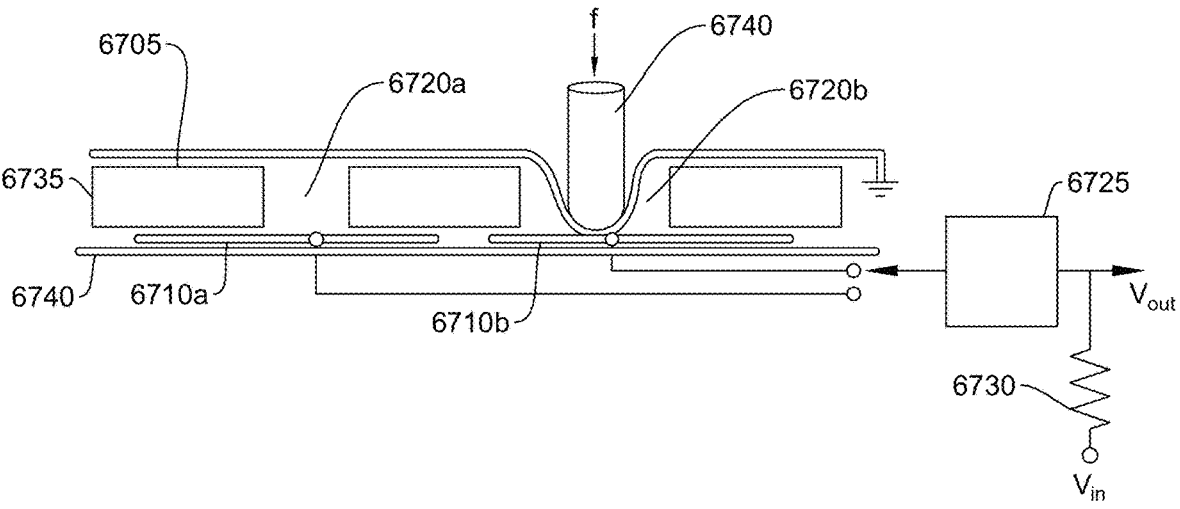

Various contact switch tactile sensors detect a contact force at a defined point. FIG. 202 shows one example of a switch tactile sensor 6700. As shown in the cross-sectional view of FIG. 202, the sensor 6700 comprises a grounded flexible or depressible conductive surface 6705 (e.g., a flexible foil, a film such as Mylar or polypropylene printed with conductive ink) separated from fixed conductors 6710 (such as a foil, conductive trace, or conductive ink printed or otherwise disposed on a rigid backing 6740) by a separator 6735 that has holes 6720. The fixed conductor is coupled to a pull-up resistor 6730. When an applied force (f) from an object 6740 deflects the flexible conductor down through a hole, the flexible conductor contacts a fixed conductor 6710*b* and grounds the pull-up resistor to drive the output voltage down. If more than one sensing area is provided, they may be multiplexed by a multiplexer 6725. Of course, other configurations could be utilized to achieve a similar on/off switching effect (e.g., a flexible conductor, not a fixed conductor, could be connected to a pull-up resistor; two flexible conductive surfaces could be used instead of fixed conductors). In any such switch configuration, the pull-up resistor, flexible conductive surfaces, fixed conductors, and/or any other components may be formed in whole or in part from ELR materials.

IV.E. Piezoresistive Tactile Sensors

Figure 203:
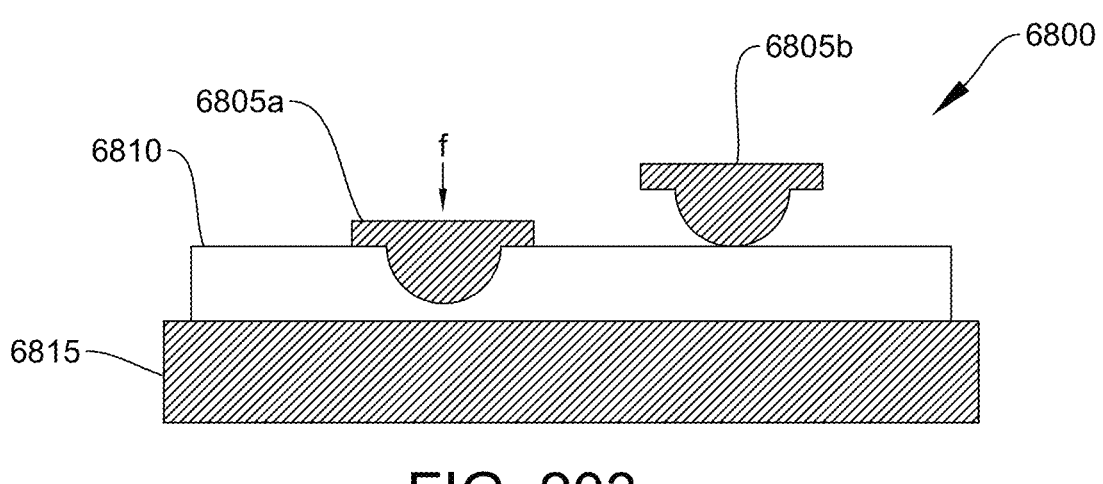
Figure 204:
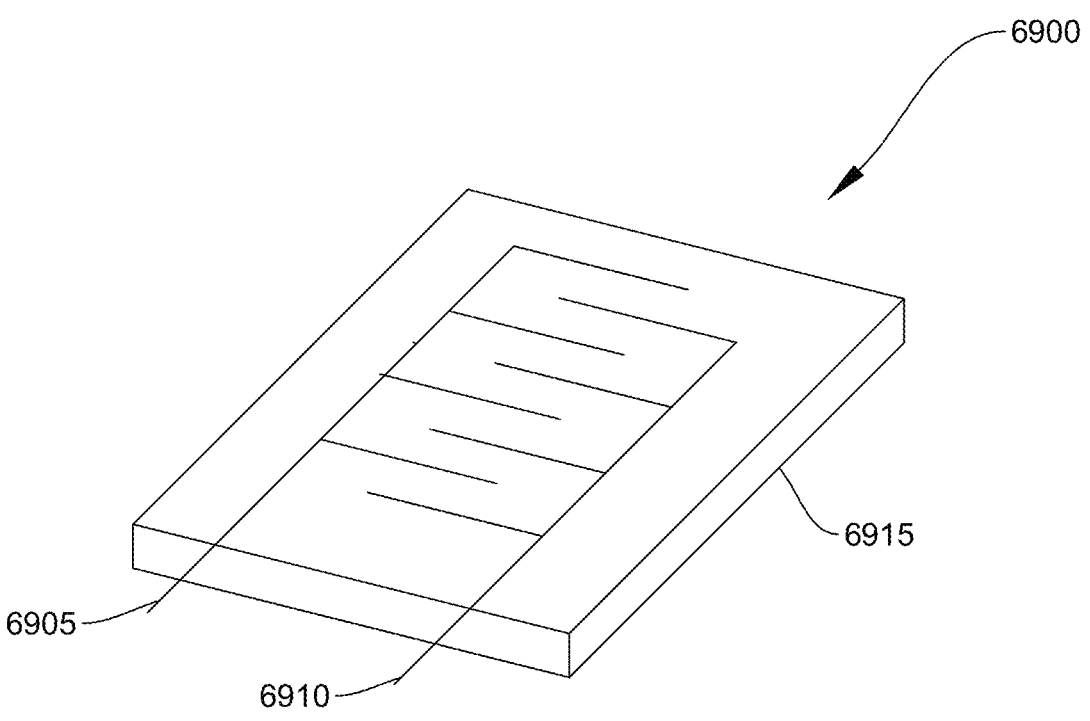

Various piezoresistive tactile sensors detect a contact force at a defined point by detecting changes in the resistance of a piezoresistive element that result from the contact force. FIG. 203 shows a cross-sectional view of one example of a piezoresistive tactile sensor 6800. As shown, the sensor 6800 includes one or more conductive pushers 6805 separated from a conductive plate 6815 or other conductive surface by a force-sensitive resistor 6810 such as a conductive elastomer or pressure-sensitive ink. An applied force (f) on a conductive pusher 6805*a* may result in a change in the contact area of the resistor and/or a change in the thickness of the resistor, either of which results in a change in the resistance between the pusher and plate, which may be detected and processed to determine that a contact force occurred. FIG. 204 shows another example of a piezoresistive tactile sensor 6900. As shown, the sensor includes two or more electrodes 6905, 6910, which may be formed in an interdigitized or other configuration, and disposed on a plastic or other film carrier (not shown) that puts the electrodes in contact with a semiconductive polymer 6915 that exhibits force-sensitive resistance. In any piezoresistive tactile sensors, resistive elements, conductive elements and/or other components may be formed in whole or in part from ELR materials.

IV.F. Capacitive Tactile Sensors

Various capacitive tactile sensors detect a contact force at a defined point by detecting a change in capacitance caused by either (1) a changed geometry of capacitive elements (e.g., changed distances between the elements or changed surface area of the elements) within the sensor due to an applied mechanical force, or (2) the presence of a conductive object (e.g., a human finger) that capacitively couples to capacitive elements within the sensor, in a manner that may vary with the distance between the object and the capacitive elements. All types of capacitive tactile sensors, including those described in further detail herein, may comprise components, including capacitive elements such as electrodes and other conductors, which are formed from ELR materials.

Figure 205:
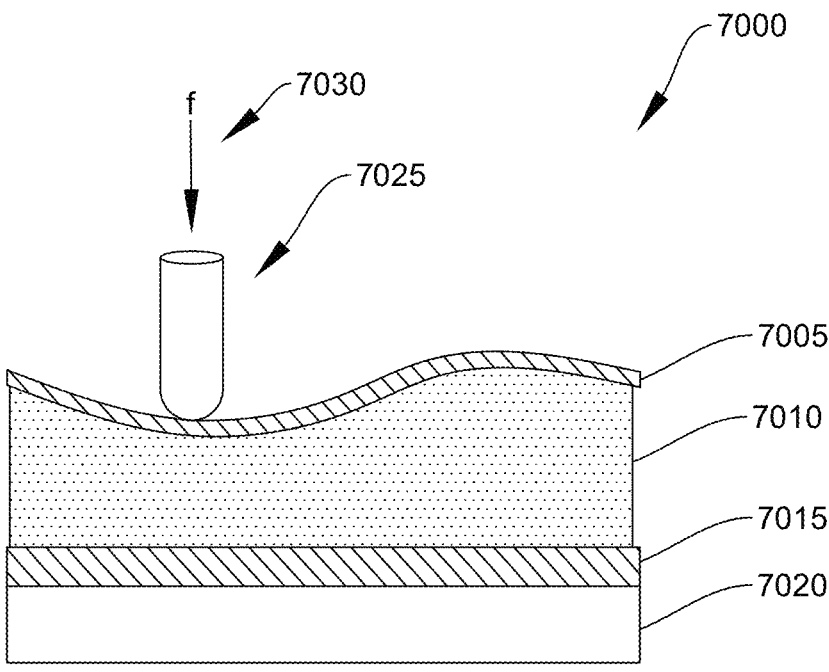

Generally speaking, the first class of capacitive sensors may be understood as comprising a force-to-displacement transducer (e.g., a button coupled to a spring or another type of elastic component, such as an elastomer-filled chamber) that, in response to an applied force, produces a displacement of a capacitive element that the sensor measures using a capacitive displacement sensor. The capacitive displacement sensor used may be one of those capacitive displacement sensors described herein, e.g., in FIGS. 174-178. FIG. 205 shows a cross-sectional view of an example of a capacitive tactile sensor 7000 that includes a first flexible or depressible conductive electrode 7005 or capacitive element separated by an elastic dielectric 7010 from a second conductive electrode 7015 or capacitive element. The second electrode may be patterned or otherwise disposed on a rigid base 7020. The dielectric used may have a high permittivity. When a force (f) 7030 is applied by an object 7025, the first flexible electrode 7005 may deform, altering the capacitance between the two electrodes. The sensor 7000 may detect the changed capacitance and analyze it to determine that a force was applied. The changed capacitance may be measured in any fashion known in the art, including measuring a time delay caused by a variable capacitance or by using the sensor 7000 as part of an oscillator and measuring the frequency response of the oscillator.

Figure 206A:
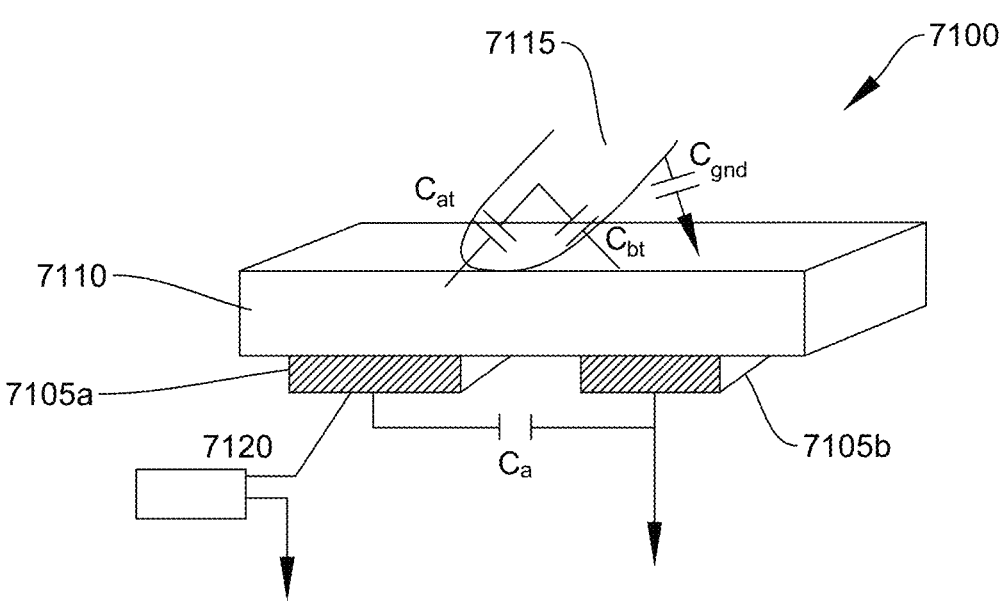

FIG. 206A shows another example of a capacitive tactile sensor 7100 that comprises a pair of electrodes 7105a, 7105b disposed on or otherwise coupled to the underside of a touch surface 7110, such as a glass or clear polymer touch screen surface. The electrode 7105b is grounded. The two electrodes may be arranged in an interdigitized configuration, or any other suitable configuration. The pair of electrodes has a baseline coupling capacitance Ca, which is monitored by a capacitance sensor 7120 that uses methods known in the art, such as those described above, to measure the capacitance. When a conductive object 7115 (e.g., a finger) approaches the surface, it capacitively couples with the first electrode 7105a and the second electrode 7105b (as shown by Cat and Cbt), which alters the total capacitance measured by the capacitance sensor 7120. The coupling capacitances between the object and the two electrodes 7105 may be a function of the distance of the object from the electrodes and the force being applied (if the conductive object is deformable). Although only two electrodes are shown, an array, grid (e.g., of rows and columns), or any other configuration of multiple electrodes may be utilized. If multiple electrodes are used, various capacitances between various combinations of the multiple electrodes may be monitored to detect the position of tactile contact.

Figure 206B:
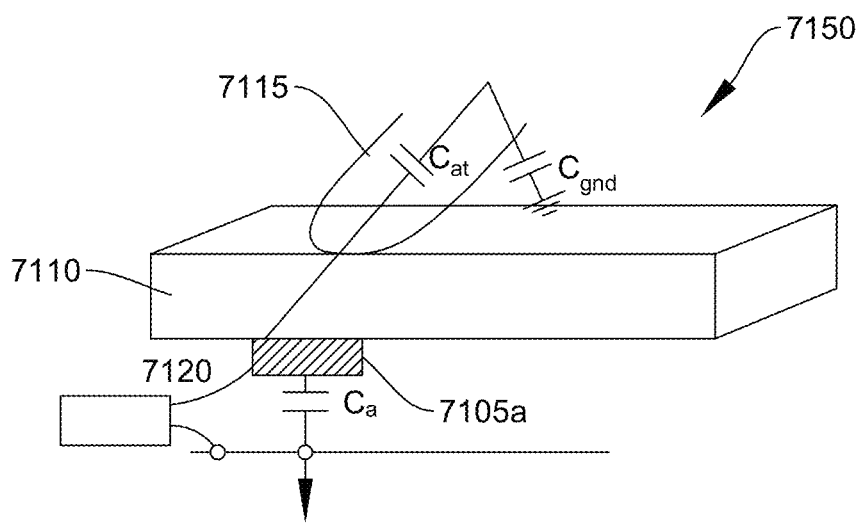

FIG. 206B shows another example of a capacitive tactile sensor 7150 that comprises an ungrounded electrode 7105 disposed on or otherwise coupled to the underside of a touch surface, such as a glass or polymer touch screen surface. The electrode has a baseline coupling capacitance to ground (Ca), which is monitored by the capacitance sensor 7120. When a conductive object 7115 (e.g., a finger), which has its own coupling capacitance to ground (Cgnd), approaches the surface, it forms a coupling capacitance with the electrode 7105 (as indicated by Cat), which alters the total capacitance measured by the capacitance sensor 7120. The coupling capacitance between the electrode 7105 and the conductive object 7115 is a function of the distance of the object from the electrode and the force being applied (if the conductive object is deformable). Although one electrode is shown, an array, grid (e.g., of rows and columns), or any other configuration of multiple electrodes may be utilized, and the capacitances between multiple electrodes and ground may be monitored to detect the position of tactile contact.

IV.G. Other Types of Force, Strain, and Tactile Sensors

Non-exhaustive examples of force, strain, and tactile sensors that may comprise components that are formed at least in part from ELR material include: (1) pressure-sensitive mats, (2) sensors that balance an unknown force against the gravitational force of a known mass, (3) sensors that determine acceleration of a known mass to which an unknown force is applied, (4) sensors that balance an unknown force against an electromagnetically generated force, (5) sensors that transduce an unknown force into a fluid pressure and then measure the resultant fluid pressure, (6) any piezoelectric tactile sensors, including sensors designed with piezoelectric films used in either active or passive modes, such as active ultrasonic coupling touch sensors, sensors having passive piezoelectric strips disposed in a rubber skin or other touch surface, piezoelectric film switches that may use a piezoelectric film laminated or otherwise disposed on a spring beam, piezoelectric film impact switches, and piezoelectric film vibration sensors, (7) MEMS sensors, including MEMS threshold tactile sensors that are formed from silicon materials and have a mechanical hysteresis, (8) acoustic touch sensors, including those that recognize sound waves propagating in an object that result from a user touching its surface or use surface acoustic wave technologies to measure the absorption of ultrasonic waves passing over a touch screen panel, (9) optical sensors, including those that use LEDs and photodetectors to detect changes in light intensity that result from a touch event, and (9) piezoelectric force sensors, including those that use piezoelectric oscillators or resonators to detect an applied force.

Non-exhaustive examples of force, density and level sensors that may be formed at least in part from ELR material include: (1) bhangmeters; (2) hydrometers; (3) magnetic level gauges; (4) nuclear density gauges; (5) torque sensors; and (6) viscometers.

Non-exhaustive examples of applications of the force, strain, and tactile sensors described herein include: robotics; touch screen displays, keyboards, and other devices; biomedical devices such as dental equipment, respiration monitors, and prostheses; industrial equipment such as counter switches for assembly lines, automated processes, shaft rotation; impact detection; utility metering; vending machines; and musical instruments.

V. Pressure Sensors

In some examples, the sensor 3700 may be a sensor that comprises ELR material and is configured to provide an output signal that is indicative of pressure.

V.A. Complex Pressure Sensors

Pressure sensors that comprise ELR material may include complex pressure sensors in which the unknown pressure acts on one or more deformable elements (such as bourdon tubes, diaphragms, capsules, bellows, barrel tubes, membranes, thin plates, or other components that undergo structural change under pressure) to create a mechanical displacement that is measured by a displacement sensor, such as the displacement sensors described herein. FIG. 191, described previously, illustrates one such complex pressure sensor, which may use a capacitive sensor to measure displacement.

V.B. Piezoresistive Pressure Sensors

Figure 207:
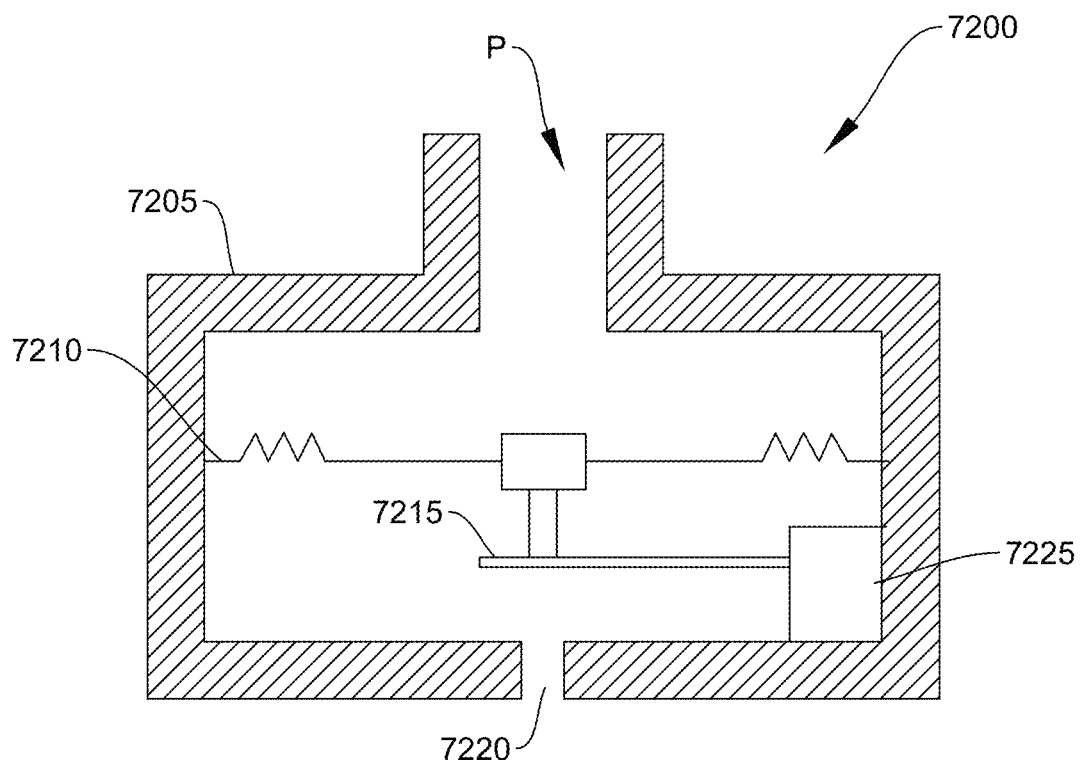

Various pressure sensors measure pressure using piezoresistive elements. Such pressure sensors may use ELR components, such as piezoresistive elements, resistive elements, or conductive elements formed in whole or in part from ELR materials. FIG. 207 shows a cross-sectional view of an example of a complex pressure sensor 7200 that may be used as an aneroid barometer. As shown, the sensor comprises a pressure chamber 7205 having a vent hole 7220 and a diaphragm 7210 that responds to a pressure p with a mechanical displacement. The diaphragm is mechanically coupled to a strain gauge 7215 (such as those described herein), so that the strain gauge provides an electrical signal indicative of the mechanical displacement of the diaphragm to post-processing electronics 7225. In some examples, the diaphragm may be formed from silicon using micromachining technologies.

Figure 208:
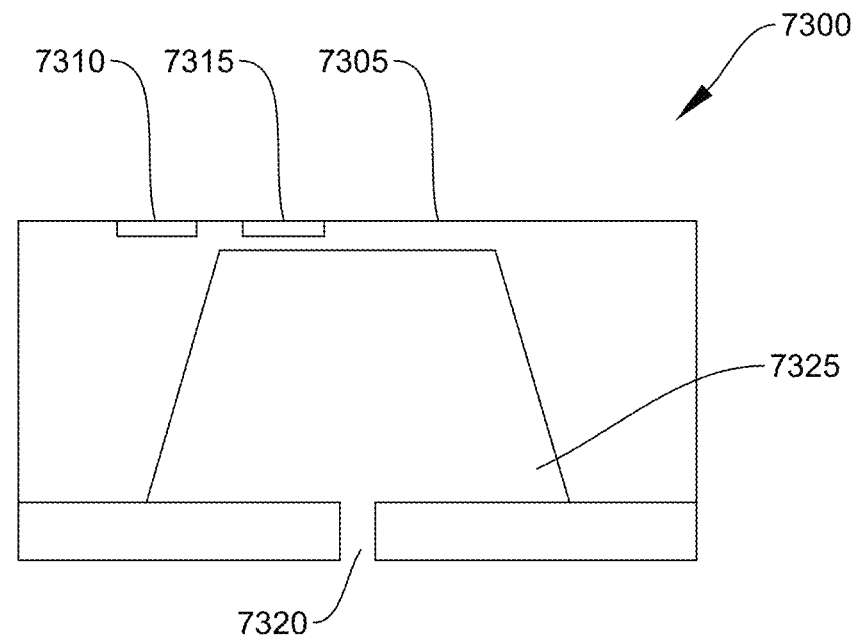

FIG. 208 shows a cross-sectional view of another example of a pressure sensor 7300 that may be formed in whole or in part from ELR material. As shown, the sensor comprises a pressure chamber 7325 having a vent hole 7320 and a diaphragm 7305 that responds to a pressure by flexing; the thin diaphragm may be fabricated by micromachining or otherwise treating silicon. Embedded in or on the membrane and its supporting rim structure are one or more piezoresistive elements 7310, 7315 (e.g., piezoresistive strain gauges), which may be formed by selectively diffusively treating, implanting, doping, or otherwise treating regions of silicon with impurities. When a pressure deflects the membrane 7305, the strain of the deflection will cause a change in the resistance of the piezoresistive elements in the membrane, which may be detected using a resistance sensor. In some examples, one or more of the piezoresistive elements may be connected in a Wheatstone bridge or other bridge configuration.

Of course, other configurations of piezoresistive pressure sensors are possible, including without limitation piezoresistive pressure sensors that use an intermediate scaling pressure plate (or other protective structure) and sensors that have packaging configured to facilitate the measurement of absolute pressure, differential pressure, or gauge pressure. In some examples, the piezoresistive elements may be temperature compensated (e.g., by temperature-stable resistors or other temperature compensating circuitry) or other post-processing may be performed to compensate for shifts in the resistance of the piezoresistive elements due to temperature.

V.C. Variable Reluctance Pressure Sensors

Figure 209A:
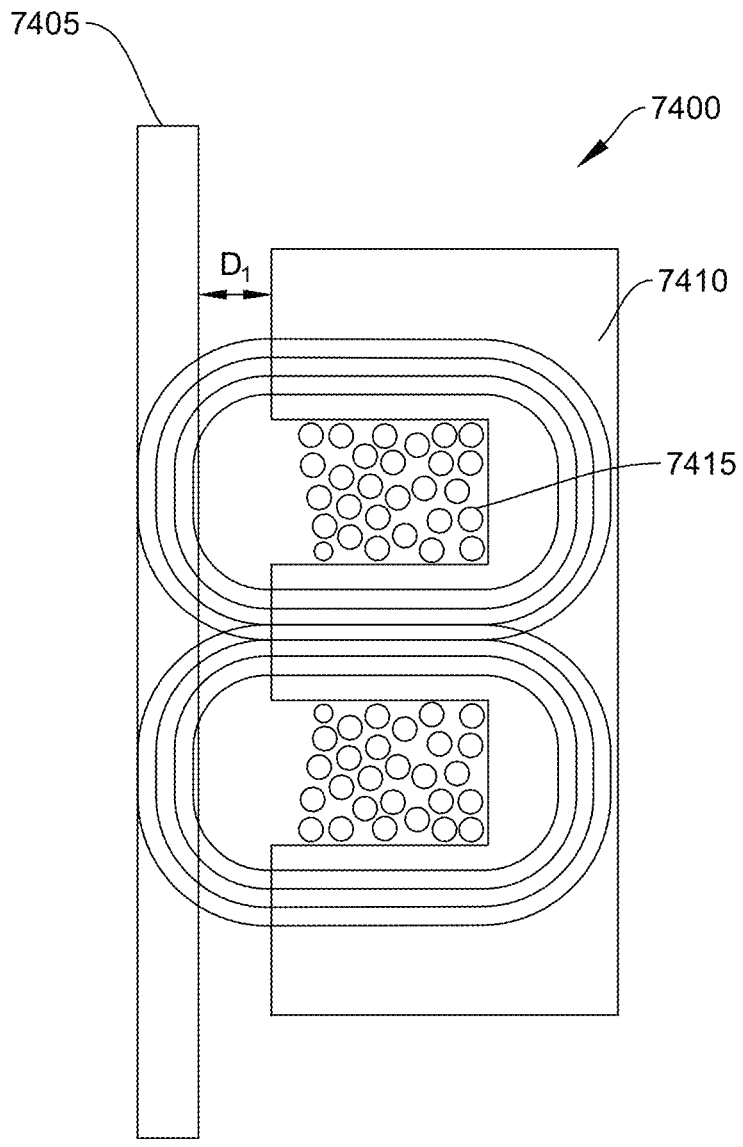
Figure 209B:
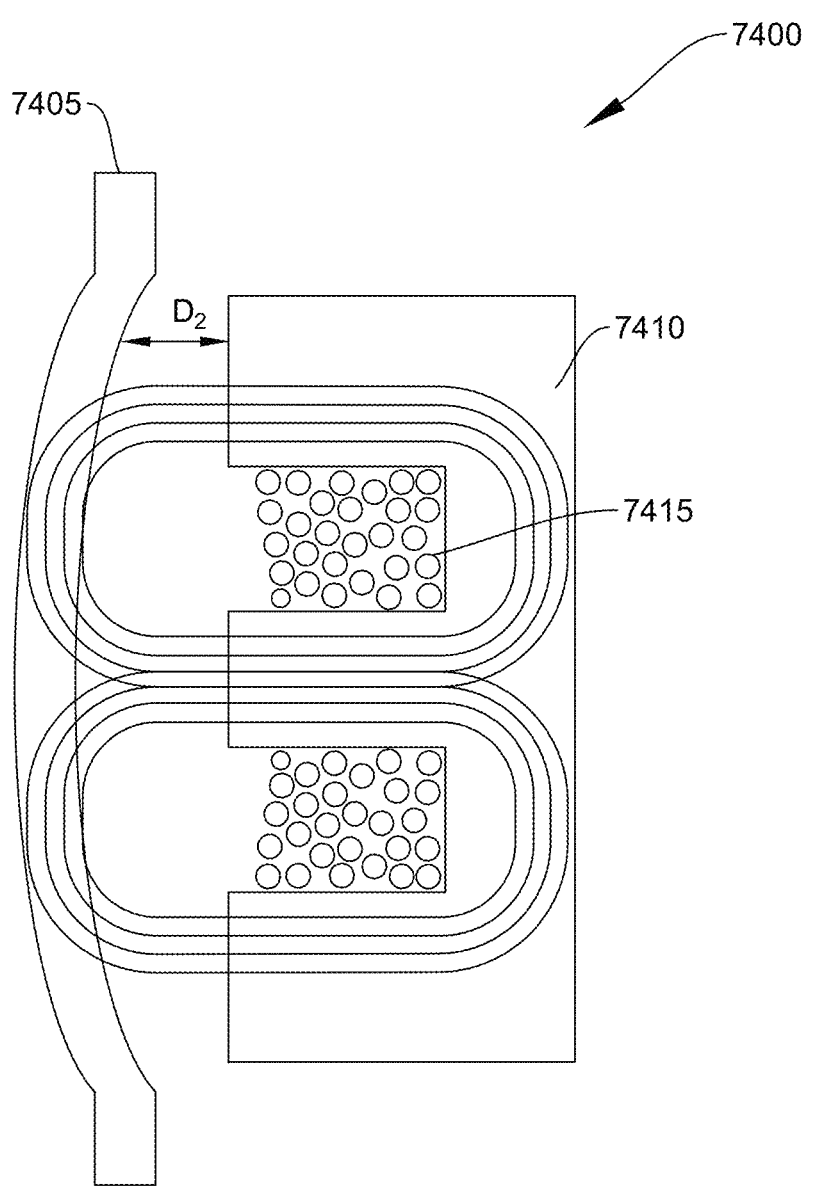

Various pressure sensors measure pressure by detecting variations in the reluctance of a differential transformer that result from the displacement of a magnetically conductive diaphragm. Such pressure sensors may use ELR components, e.g. coils, other conductors, or magnetically conductive elements formed in whole or in part from ELR materials. FIGS. 209A and 209B show cross-sectional views of a portion of a variable reluctance pressure sensor 7400. As shown, the sensor 7400 comprises an assembly, which is formed from a coil 7415 wrapped around an E-shaped core 7410, and a magnetically conductive diaphragm 7405 that is separated from the assembly by an air gap. FIG. 209A shows the diaphragm in a neutral position, with an air gap of D1. As shown in FIG. 209B, when the pressure changes, the diaphragm deflects (with a direction that depends on the pressure change), which alters the size of the air gap to D2. The size of the air gap modulates the inductance of the core-coil assembly. Thus, the change in inductance of the assembly can be measured to determine the pressure. The sensor 7400 typically comprises two core-coil assemblies located on opposite sides of the diaphragm and arranged as a differential transformer so that changes in inductance, and thus pressure, may be determined.

V.D. Other Pressure Sensors

Non-exhaustive examples of pressure sensors that may comprise components that are formed at least in part from ELR material include the following: (1) mercury pressure sensors; (2) complex pressure sensors, such as silicon diaphragm capacitive pressure sensors, that use a pressure-todisplacement sensor (e.g., a membrane, diaphragm (e.g., a silicon diaphragm), bellows, etc.) to create a displacement (e.g., of a silicon diaphragm that acts as a capacitive plate or another capacitive plate) that is measured using capacitance displacement sensors and techniques, such as those described herein; (3) optoelectronic pressure sensors, including sensors that use Fabry-Perot interferometers to measure the deflection of a diaphragm or similar pressure-to-displacement element; (4) indirect pressure sensors that use a flow meter as a differential pressure sensor; (5) vacuum sensors, such as Pirani gauges, ionization gauges (including Bayard-Alpert vacuum sensors), gas drag gauges, and membrane vacuum sensors (including, e.g., MEMS silicon implementations); (6) barographs; (7) barometers; (8) boost gauges; (9) hot filament ionization gauges; (10) McLeod gauges; (11) permanent downhole gauges; and (12) time pressure gauges.

VI. Flow Sensors

In some examples, the sensor 3700 may be a sensor that comprises ELR material and is configured to provide an output signal that is indicative of the volume flow rate or mass flow rate of a fluid such as a liquid or gas (or a related quantity such as the local or average velocity of the fluid).

VI.A. Pressure Gradient Flow Sensors

Figure 210:
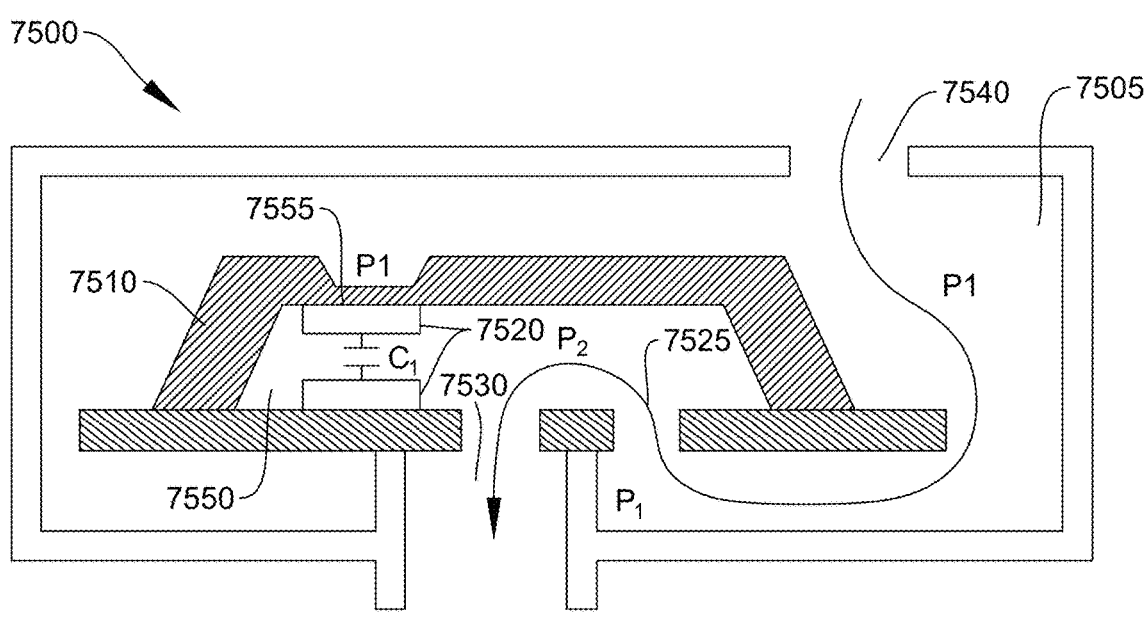

Various flow sensors measure a flow rate by using one or more pressure sensors to detect a pressure gradient of a gas or other fluid caused by the introduction of a flow resistance, such as orifices, porous plugs, and Venturi tubes (i.e., pipes having tapered profiles). Typically, such sensors may be used to measure the flow of nonviscous incompressible fluids. FIG. 210 shows a cross-sectional view of one example of a pressure gradient flow sensor 7500. As shown, the sensor 7500 comprises a first chamber 7505 which includes a capacitive pressure sensor 7510 having a second chamber 7550. After the gas passes through a first opening or inlet 7540 into the first chamber 7505, it has a first pressure P1 Within the first chamber. The gas then passes through a narrow channel 7525 having a relatively high pressure resistance into the second chamber 7550, where it has a second, different pressure P2. The gas then flows out from the second chamber via an opening or outlet 7530. The pressure differential (between P1 and P2) caused by the narrow, resistive opening is determined by measuring the deflection of a membrane 7555 using capacitive plates 7520. In such examples, the capacitive plates and/or other components may be formed in whole or in part from ELR materials. Although a capacitive pressure sensor is shown in FIG. 210, other types of pressure sensors, including those that comprise ELR materials, may be included instead, such as variable inductance or piezoresistive pressure sensors described herein.

VI.B. Thermal Transport Flow Sensors

Various thermal transport flow sensors, or thermoanemometers, measure a flow rate by detecting the rate of heat dissipation in a flowing medium (e.g., fluid), which may be determined by analyzing a flowing medium temperature, a temperature differential, and/or a heating power signal. Examples of thermal transport flow sensors include the following: (1) hot-wire anemometers and hot-film anemometers, (2) three-part thermoanemometers comprising two temperature detectors (e.g., resistive, semiconductor, or optical temperature detectors) and a heating element positioned between them, (3) two-part thermoanemometers comprising a first part that is a media temperature reference sensor and a second part further comprising a heater and a temperature sensor thermally coupled to the heater (both temperature sensors may be thermistors), and (4) microflow thermal transport sensors, including MEMS gas flow sensors, which may employ thermopiles as temperature sensors, cantilever designs, and/or self-heating resistor sensor designs. Applications of thermoanemometers include measurements of turbulence (e.g., in wind tunnels), flow patterns, and blade wakes (e.g., in radial compressors).

Figure 211:
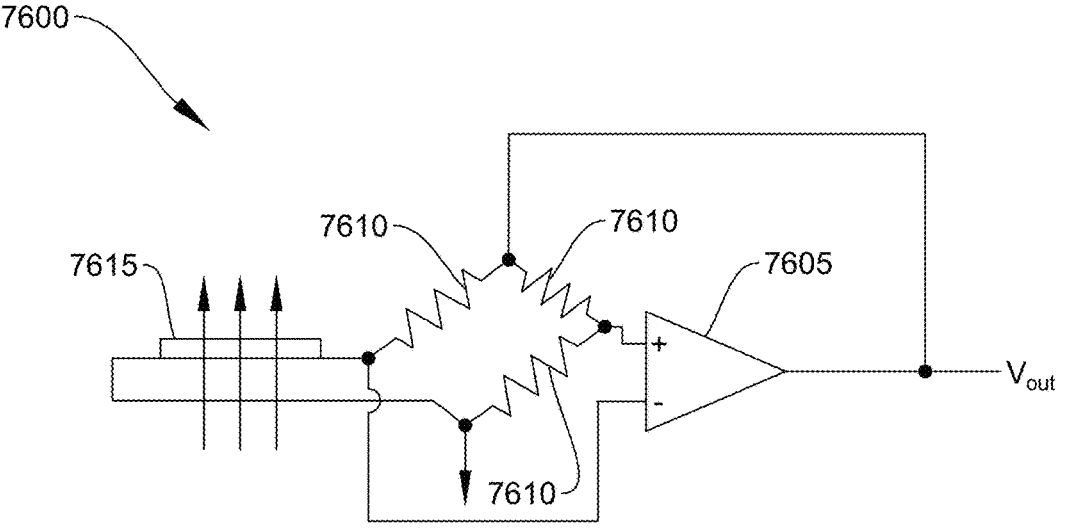

FIG. 211 shows a circuit diagram of one example of a constant temperature hot-wire anemometer sensor 7600. As shown, the sensor 7600 comprises a wire or film 7615 having a resistance (e.g., a conducting film deposited on an insulator such as a ceramic substrate) that is heated to a temperature in excess of the temperature of the fluid that flows across it (shown by the arrows). The fluid will cool the heated wire or film at a rate related to the rate of the flow. The flow rate therefore may be determined by either (1) determining the power required in order to maintain a constant temperature at the wire or film, or (2) maintaining a constant voltage across the wire or film and determining the reduction in the temperature of the wire or film caused by the fluid flowing across it (which in some examples may be determined by measuring the temperature-dependent resistance of the hot wire or hot tape). In FIG. 211, a null-balancing resistive bridge circuit 7610 coupled to a servo amplifier 7605 ensures that a constant temperature is maintained; the output voltage Vout indicates the mass flow rate.

Of course, various configurations of hot wires or hot films may be used, including wires supported by support needles and conductive films disposed on wedge-shaped, hemispherical, cylindrical, conical, parabolic, and flat supporting surfaces. Also, many other types of circuits may be used to detect the power needed to maintain a constant temperature and/or to measure a temperature change in a hot wire or hot film. In any example of a thermoanemometer, such as those described herein, various circuit components, such as resistors, hot wires/hot films, temperature sensors, conductors, and/or amplifiers, may be formed in whole or in part from ELR materials.

VI.C. Ultrasonic Flow Sensors

Various flow sensors measure a flow rate by employing ultrasonic waves to detect a transit time or delay, frequency shift, and/or phase shift affected by a flowing medium. In some examples, ultrasonic flow sensors may be implemented based on the Doppler effect. In other examples, ultrasonic flow sensors may detect a change in the effective ultrasound velocity in a flowing medium. Ultrasonic flow meters may comprise piezoelectric elements, or other components configured to act as ultrasonic generators and/or ultrasonic receivers, and various circuitry (such as drivers, oscillators, modulators/demodulators, amplifiers, transformers, electrodes, conductors, clocks, and selectors/switches) configured to generate ultrasonic signals and/or detect frequency shifts, transit times or delays, or phase shifts in ultrasonic signals. Any or all of these components, or other components, may be formed in whole or in part from ELR materials.

VI.D. Other Flow Sensors

Various examples of flow sensors that may comprise components that are formed at least in part from ELR material include the following: (1) transport sensors that detect the movement of a marker (e.g., a float, a radioactive element, a dye (e.g., colored fluid), or a different gas/liquid) introduced into the flowing fluid whose flow rate is being sensed, (2) both DC and AC electromagnetic flow sensors that register a voltage across pick-up electrodes in response to a conductive fluid crossing magnetic flux lines, (3) breeze sensors that detect changes in the velocity of a gas, e.g., using a pair of piezoelectric or pyroelectric elements, (4) Coriolis mass flow sensors for measuring mass flow rate directly, which may employ vibrating tubes with an inlet and outlet driven by an electromechanical drive system, (5) drag force sensors that measure a fluid flow using a drag element coupled to a rigid base by a flexible beam or other elastic cantilever whose deformation under the flow is measured using strain gauges, such as those described herein, (6) mechanical flow meters, such as bucket-and-stopwatch, piston meters/rotary pistons, variable area meters, turbine flow meters, Woltmann meters, single jet meters, paddle wheel meters, multiple jet meters, Pelton wheels, oval gear meters, nutating disk meters, (7) pressure-based flow meters, such as Venturi meters, orifice plates, Dall tubes, Pitot tubes, and multi-hole pressure probes, (8) optical flow meters, (9) sensors using open channel flow methods, such as level to flow, area/velocity, dye testing, and acoustic Doppler velocimetry, (10) thermal mass flow meters, (11) electromagnetic, ultrasonic, and Coriolis flow meters (including those described herein), (12) cryogenic flow sensors, (13) air flow meters, (14) gas meters, (15) water meters, and (16) sensors using laser Doppler flow measurement.

VII. Acoustic Sensors, Including Microphones

In some examples, the sensor 3700 may be a sensor, such as a microphone, that comprises ELR material and is configured to provide an output signal that is indicative of an acoustic input. Most examples of an acoustic sensor comprise a moving diaphragm and a displacement transducer (such as those described herein) configured to produce an electrical signal indicative of the deflection of the diaphragm in response to an acoustic input. The displacement transducer or other components in an acoustic sensor may comprise ELR material. Some examples of acoustic sensors may comprise additional components, such as interface electronics, mufflers, focusing reflectors or lenses, or other components. Acoustic sensors such as microphones may be used for numerous applications, including without limitation, hearing aids, recorders, karaoke systems, VOIP systems, motion picture production, telephones (including mobile phones), audio engineering, portable computers, speech recognition systems, complex sensors, microbalances, SAW devices, and vibration sensing.

VII.A. Condenser Microphones

Figure 212:
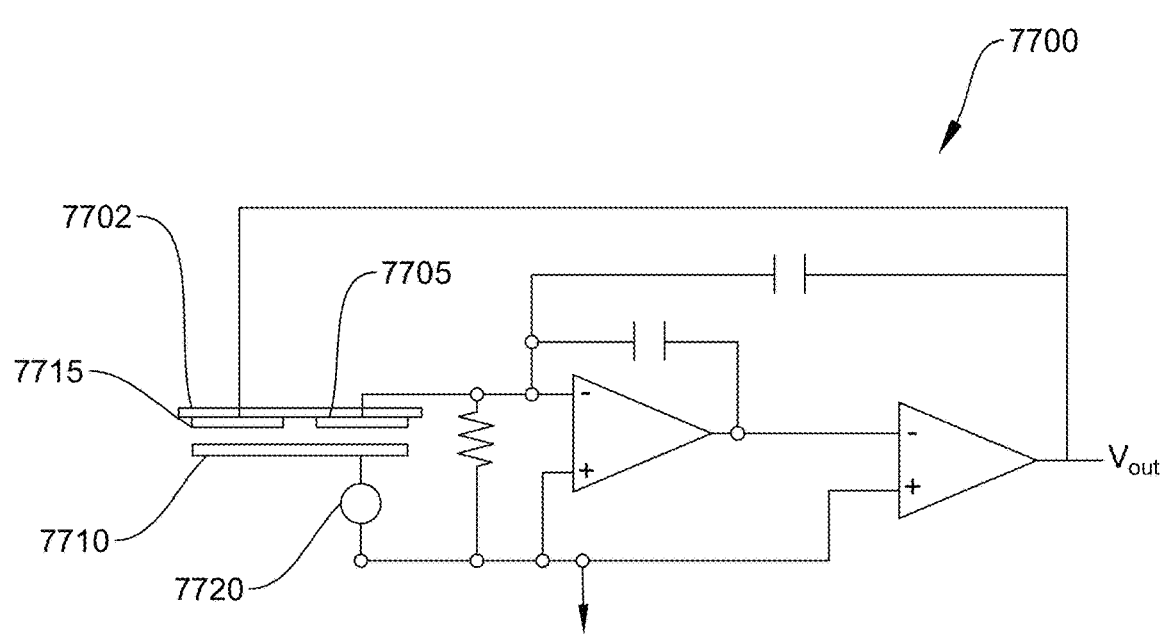

Various condenser microphones measure an acoustical signal by using capacitive displacement sensing techniques to detect the movement of a diaphragm caused by the signal's acoustical energy. FIG. 212 shows a circuit diagram of one example of a condenser microphone 7700. The circuitry shown in FIG. 212 is generally self-explanatory from the figure and the values of the components are dependent on the application, and are therefore omitted from this discussion. As shown, the condenser microphone has a diaphragm 7702 with a first electrode 7705 or capacitive element disposed on it or otherwise coupled to it and configured to respond to an acoustical pressure by moving relative to a fixed back plate 7710. The fixed back plate is coupled to a charge source 7720 such as an external power source, electret layer, internal power source, or phantom power source. The movement of the diaphragm, and thus the first electrode, relative to the back plate 7710 produces a capacitive discharge that may be detected and amplified to generate an electrical signal indicative of the acoustical signal. As shown, in some examples, the condenser microphone 7700 may also comprise feedback circuitry configured to drive a second electrode 7715 that acts as an actuator to provide mechanical feedback (e.g., deflection of the diaphragm 7702 by means of electrostatic force), e.g., in order to improve linearity and frequency range. In some examples, the first electrode 7705 and second electrode 7715 may be formed in an interdigitized pattern upon the diaphragm 7702. In a condenser microphone, the electrodes, other conductors, and/or other components of the circuit (e.g., capacitors, resistors, and amplifiers) may be formed in whole or in part by ELR material. In some examples, the diaphragm may be fabricated in silicon. In some examples, the diaphragm itself may act as the moving plate of the sensing capacitor. Of course, in some examples, the charge source may be coupled to the moving electrode 7705, not the fixed back plate 7710. In some examples, the condenser microphone may include two diaphragms that are electrically connected to provide a range of polar patterns (e.g., cardioid, omnidirectional, and figure eight).

In some radio frequency (RF) or high frequency examples of condenser microphones, an additional RF signal generated by a low-noise oscillator is either (1) modulated (e.g., frequency modulated) by the capacitance changes caused by the deflection of the diaphragm, or (2) modulated (e.g. amplitude modulated) by a resonant circuit that includes the sensing capacitor. A demodulator yields a low-noise audio frequency signal. In such examples, some or all components of a low-noise oscillator and/or a resonant circuit (e.g., conductive, resistive, capacitive, or inductive elements) may also be formed in whole or in part from ELR materials.

Condenser microphones that incorporate ELR materials may be used in numerous applications, including without limitation, telephone transmitters, karaoke microphones, and high-fidelity studio or laboratory microphones.

VII.B. Electret Microphones

Figure 213:
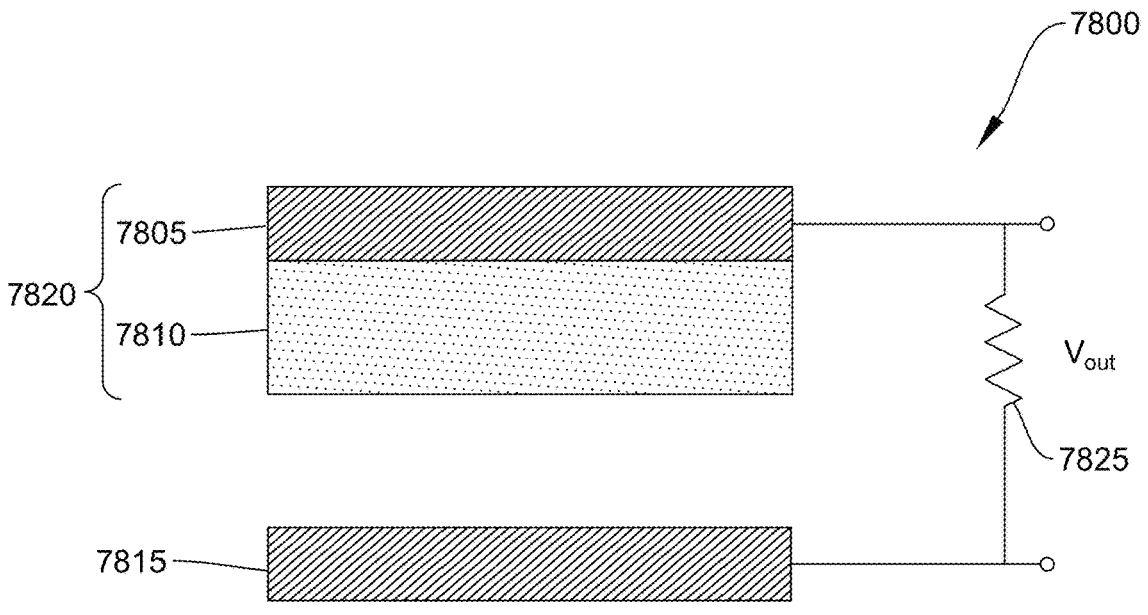

Various electret microphones measure an acoustical signal by using capacitive displacement sensing techniques to detect the movement of an electret diaphragm caused by the signal's acoustical energy. FIG. 213 shows a cross-sectional schematic of one example of an electret microphone 7800. As shown, the electret microphone comprises a metalized electret diaphragm 7820 (which in some examples may be formed from Teflon FEP or a foil) that further comprises a metallization layer 7805 disposed on or coupled to an electret layer 7810 or element, and is separated from a metal or metalized back plate 7815 by an air gap. The two metallic elements 7805, 7815 may be connected through a resistive or impedance element 7825. The metallic elements and/or resistive element may be formed in whole or in part from ELR material. Displacement of the electret diaphragm produces a changed output voltage across the resistive element. The electret layer 7810 is formed from a permanently electrically polarized, typically crystalline, dielectric material. In some examples, the electret microphone may not use an applied DC bias voltage; in others (e.g., for ultrasonic detection), a DC bias voltage is applied. In some examples, the electret microphone may include a preamplifier. Electret microphones that incorporate ELR materials may be used in numerous applications, including without limitation, headsets; mobile electronics such as telephones, mobile phones; mobile computers such as laptops and tablet computers; high-quality recording microphones; and small recording devices.

VII.C. Dynamic Microphones

Figure 214:
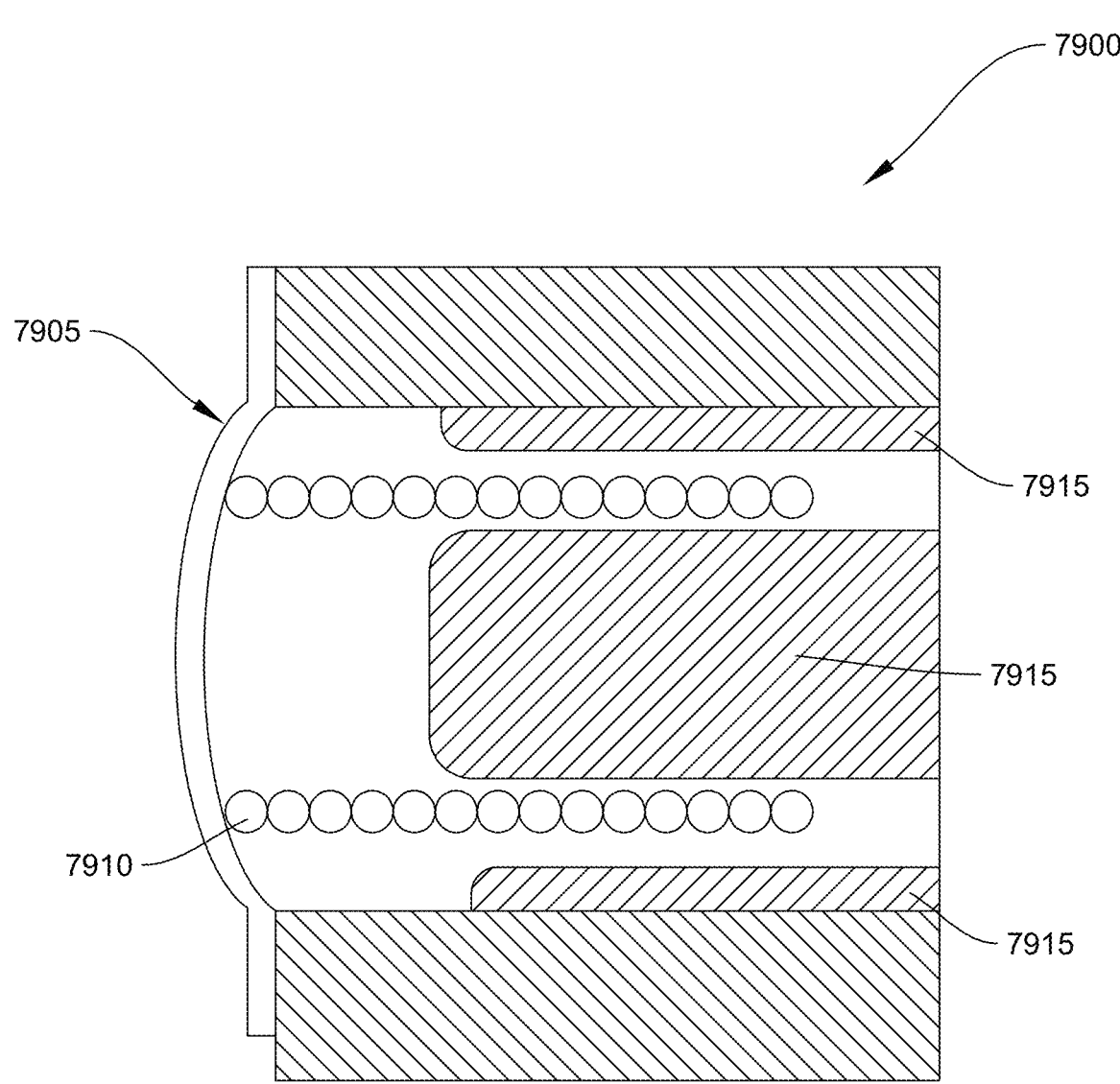

Various dynamic microphones measure an acoustical signal by using electromagnetic induction techniques to detect the movement of a diaphragm caused by the signal's acoustical energy. FIG. 214 shows a cross-sectional schematic of a moving coil dynamic microphone 7900. As shown, the microphone 7900 comprises a diaphragm 7905 coupled to a moveable induction coil 7910, which may be formed in whole or in part from ELR materials. When the diaphragm displaces in response to an acoustic wave, the coil moves within the magnetic field of a magnet 7915 to create a varying output voltage across the coil indicative of the displacement through electromagnetic induction. Other examples of dynamic microphones include ribbon microphones, which include a metal ribbon (often a corrugated ribbon) positioned in a magnetic field of a magnet. Vibrations of the ribbon caused by an acoustic wave may produce an output electrical signal across the ribbon indicative of its vibration. The ribbon and/or other components of a ribbon microphone may be formed from ELR materials. In some examples, the ribbon may be formed from ELR nanowires.

VII.D. Solid-State Acoustic Detectors

Various solid-state acoustic detectors measure the mechanical vibrations in a solid sensor, for example, to detect, characterize, or measure a stimulus (such as pressure, fluid, humidity, gaseous molecules, displacement, stress, force, temperature, chemicals, compounds, biomolecules, a mass, or microscopic particles) that modulates acoustical characteristics of the sensor, such as the propagation speed of acoustic waves in the solid, phase velocity, and/or attenuation coefficient. Solid-state acoustic detectors may be used, for example, in gravimetric and acoustic viscosity sensors. Solid-state acoustic detectors may comprise one or more piezoelectric elements, such as a thin film piezoelectric, quartz crystal, or other piezoelectric crystal, disposed on, under, or otherwise in contact with electrodes, which may be interdigitized and may be formed from ELR materials. The various piezoelectric elements may be disposed on, under, or in a substrate, such as a silicon substrate. In other examples, the piezoelectric elements may be electrodes (which may be formed from ELR materials) disposed on, in, or otherwise coupled to a piezoelectric plate or crystal (e.g., by photolithography).

In some examples, a solid-state acoustic detector comprises both (1) a piezoelectric "transmitter" element at one end of a plate or path configured to generate acoustic waves from an electrical signal, and (2) a piezoelectric "receiver" element at the other end of the plate or path configured to receive acoustic waves modulated by a stimulus during wave transmission from the transmitter and through the plate or path, and to convert those acoustic waves into electrical signals. In some examples, the intermediary plate or path between the transmitter and receiver may include a chemically-selective, adhesive, sorptive, hygroscopic, or other type of membrane, coating, film, or other surface whose mechanical, chemical, electrical or other properties change in the presence of certain chemical, mechanical or other stimulus. Examples of solid state acoustic sensors include flexural plate sensors, surface acoustic wave plate sensors, and sensors that use the following types of acoustic waves: bulk acoustic wave, thickness shear mode, shear-horizontal acoustic plate mode, shear-horizontal surface acoustic wave (or surface transverse wave), Love wave, surface skimming bulk wave, and Lamb wave.

Depending on the type of design and mode of operation used, solid-state acoustic sensors may be used to detect, measure, or characterize pressure, torque, shock, force, mass, vapor, dewpoint, humidity, biomolecules, chemicals, temperature, thickness, or other stimulus.

VII.E. Other Acoustic Sensors

Non-exhaustive examples of acoustic sensors that may comprise components that are formed at least in part from ELR material include the following: (1) resistive microphones, including carbon microphones and piezoresistive microphones, comprising piezoresistive transducers (e.g., stress-sensitive resistors in a micromachined diaphragm pressure sensor or a powder whose bulk resistivity is sensitive to pressure) configured to transduce an acoustic signal into an electrical output signal; (2) fiber-optic microphones (including fiber-optic interferometric microphones), which may comprise a light source (e.g. a laser source), an optical interferometer (e.g., a Michelson interferometer), and a reflective plate diaphragm, and which may be used in applications having hostile environments or requiring EMI/RFI immunity, such as structural acoustic tests, industrial turbines, turbo jets or rocket engines, industrial and surveillance acoustic monitoring, MRI and jet noise abatement; (3) laser microphones that aim a laser at particulates or the surface of a window or other plane surface that respond to acoustical pressures with a vibration, and then analyze the reflected light; (4) piezoelectric microphones that use a piezoelectric element (e.g., a piezoelectric crystal, piezoelectric ceramic disk, or piezoelectric film) to directly transduce an acoustical pressure or other mechanical stress into an electrical signal indicative of an acoustical signal, and may be used for, e.g., voice-activated devices, blood-pressure measurements, underwater sound measurements, contact microphones, and acoustic pickups in instruments; (5) MEMS sensors, which may include a diaphragm formed from silicon, and may be configured to use the same or similar displacement sensing principles of a condenser microphone; (6) geophones; (7) hydrophones; (8) seismometers; (9) ultrasonic sensors; and (10) SONAR sensors.

VIII. Humidity and Moisture Sensors

In some examples, the sensor 3700 may be a sensor that comprises ELR materials and is configured to provide an output signal that is indicative of the moisture or humidity of a sample. As used herein, "moisture" refers to the amount of water contained in a liquid or solid by absorption or adsorption that can be removed without altering its chemical properties. As used herein, "humidity" may refer to absolute humidity (mass of water vapor per unit volume of wet gas) or relative humidity (the ratio of the actual vapor pressure of air at any temperature to the maximum of saturation vapor pressure at the same temperature). Humidity and moisture sensors may be used for numerous applications, including, inter alia, testing pharmaceutical products, weather sensing, and soil investigation.

VIII.A. Capacitive Humidity and Moisture Sensors

Figure 215:
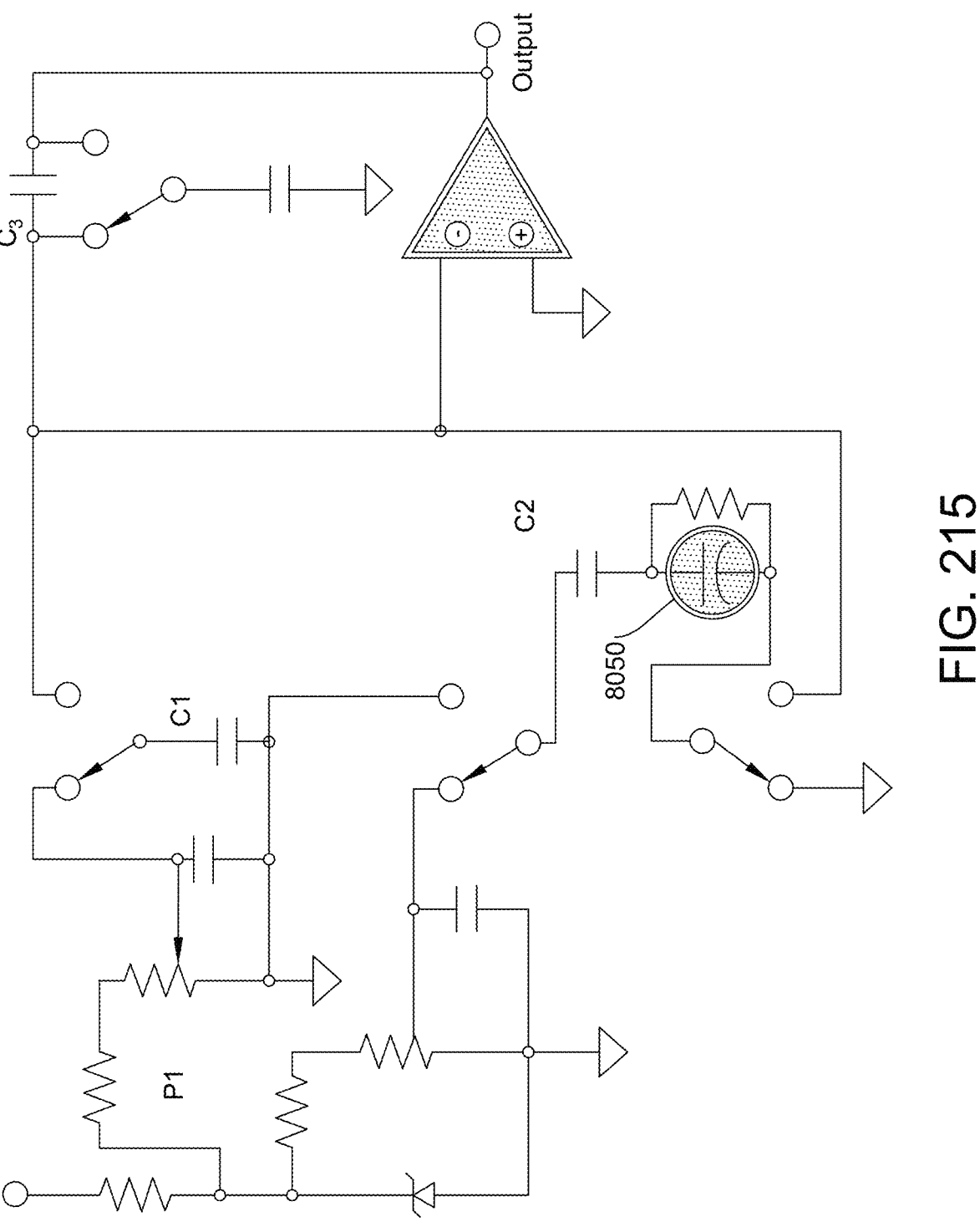

Various humidity and moisture sensors measure humidity or moisture by determining how a sample (e.g., an air sample or solid sample) introduced into the dielectric gap between the electrodes of a sensing capacitor affects its capacitance. In some examples of humidity sensors, the sensing capacitor is an air capacitor, and an air sample is introduced between the capacitive electrodes or plates. In other examples of humidity sensors, the electrodes of the sensing capacitor are separated by a dielectric material whose dielectric constant is strongly affected by humidity or moisture, such as a hygroscopic polymer film. In some examples, a humidity sensor is a thin film humidity sensor having two electrodes arranged in an interdigitized or other configuration and coated by a dielectric film, whose dielectric constant may also be affected by humidity or moisture. In some examples of moisture sensors, a solid or liquid sample is introduced into the space between two capacitive electrodes (e.g., capacitive plates). Any suitable method may be used to determine the absolute capacitance (or change in capacitance, e.g., from a reference value) of a humidity or moisture sensing capacitor (e.g., using an oscillator system). In some examples, differential techniques may be used to detect capacitance values. In some examples, a moisture or humidity sensor may also include temperature compensating circuitry and/or employ other post-processing circuitry to compensate for the temperature effect. FIG. 215 shows one example of a simplified circuit of a humidity sensor 8000 configured to measure the humidity of an air sample using a sensing capacitor 8050. The circuitry shown in FIG. 215 is generally self-explanatory from the figure and the values of the components are dependent on the application, and are therefore omitted from this discussion. In capacitive humidity and moisture sensors, the electrodes of the sensing capacitor, other circuit components (e.g., resistors, conductive traces, potentiometers, other capacitors, inductors, amplifiers, diodes, temperature compensating circuitry, etc.) may be formed in whole or in part from ELR materials.

VIII.B. Electrical Conductivity Humidity and Moisture Sensors

Various humidity and moisture sensors measure humidity or moisture by determining how a sample affects the resistance of a moisture-sensing conductive element (typically a nonmetal conductor), such as solid polyelectrolytes or polystyrene film treated with sulfuric acid, whose resistance is highly dependent on humidity or moisture. In such sensors, any known method may be used to determine the absolute resistance (or change in resistance, e.g., from a reference value) of a humidity or moisture sensing conductor. In some examples, differential techniques may be used to detect resistance values. In some examples, a moisture or humidity sensor may also include temperature compensating circuitry and/or employ or other post-processing to compensate for temperature effects. FIGS. 216A and 216B show the top and cross-sectional views, respectively, of one example of an electrical conductivity humidity or moisture sensor 8000 configured to measure the humidity or moisture of a sample. As shown, the sensor comprises two conductive electrodes 8105a, 8105b, each connected to a terminal 8110a, 8110b, arranged in a interdigitized or other configuration on a substrate 8120 and coated by or otherwise coupled to a hygroscopic conductive layer 8115 whose resistance varies with humidity and/or moisture. Although a planar substrate is shown, other configurations of a substrate (e.g., a probe tip) may be used in other examples. In some examples, a humidity sensor may be a solid-state humidity sensor that uses a porous oxide surface or layer (e.g., a porous aluminum oxide layer) that allows penetration of water molecules. The electrodes may be formed in whole or in part from ELR materials.

In soil and in other solids, the aqueous component of the solid may be the primary contributor to its electrical conductivity. Therefore, other examples of electrical conductivity moisture sensors include soil or other solid electrical conductivity sensors that comprise two or more electrode probes configured to be inserted into a soil or other solid sample. By applying input electrical signals to the electrodes (e.g., an AC current) the sensor determines the conductivity of the soil or solid and thus determines the moisture content of the soil or solid. In other examples of soil or solid electrical conductivity sensors, two or more coils may be used to measure the conductivity of the solid. For example, the sensor may comprise a first transmitting coil for inducing eddy currents in the soil or solid and a receiving coil for intercepting a fraction of a secondary induced electromagnetic field. In such examples, the electrodes and/or coils may be formed from ELR materials.

VIII.C. Other Humidity and Moisture Sensors

Non-exhaustive examples of humidity and moisture sensors that may comprise components formed at least in part from ELR material include the following: (1) thermal conductivity sensors that measure thermal conductivity of a gas and/or utilize thermistor-based sensors and that may include thermistors or other components formed in whole or in part from ELR materials, (2) optical hygrometers that may detect the dewpoint temperature of a gas, may comprise a mirror whose surface temperature is precisely regulated (e.g., by a thermoelectric heat pump) and a photodetector to detect changes in the reflective properties of the mirror due to water condensation, and/or may include photodetectors, heat pumps, LEDs, controllers, temperature sensors, and/or other components formed from ELR materials, and (3) oscillating hygrometers that may detect the changing mass of a chilled plate, may be implemented in part by SAW sensors and/or comprise a Peltier cooler, a heat sink, and a piezoelectric element, (4) gravimetric hygrometers that compare the mass of an air sample to an equal volume of dry air, and (5) psychrometers that comprise two thermometers.

IX. Radiation and Particle Detectors

In some examples, the sensor 3700 may be a sensor that comprises ELR materials and is configured to provide an output signal that is indicative of the presence, energy, and/or other characteristics of ionizing radiation including alpha particles, beta particles, neutrons, and cosmic rays and ionizing photons (e.g., high-frequency ultraviolet, X-ray, and gamma ray radiation).

IX.A. Scintillating Detectors

Various scintillating detectors detect or measure ionizing radiation by detecting light emitted from a scintillating material in response to ionizing radiation. Scintillating detectors may comprise scintillating material that fluoresces or otherwise produces light in response to ionizing radiation (e.g., phosphor, alkali halide crystals (e.g., sodium iodine), cesium iodide, organic-based liquids, or plastic (e.g., containing anthracene)), an optical photon detector and/or photomultiplier or electron multiplier (such as a photomultiplier tube or a channel photomultiplier, which may further comprise a photocathode, a bent channel amplification structure, and an anode). In some examples, the scintillating detector also comprises amplifiers, counter circuits, and/or other post-processing circuitry. In scintillating detectors, optical photon detectors, photomultipliers or electron multipliers, amplifiers, counter circuits, and/or other post-processing circuitry may be formed in whole or in part from ELR materials. If ELR materials are used for an optical photon detector, the high sensitivity of ELR materials to photons and/or their extremely low resistance may eliminate the need for a photomultiplier and/or reduce the amount of photomultiplication needed to produce a useable signal, even at ambient temperatures.

IX.B. Ionization Detectors

Various ionization detectors, or gas detectors, detect or measure ionizing radiation by detecting the production of ion pairs in response to ionizing radiation. FIG. 217 illustrates one example of an ionization chamber sensor 8200. As shown, the ionization chamber sensor comprises a chamber 8205 filled with a gas, solid, or liquid that ionizes in response to ionizing radiation (e.g., argon, helium, nitrogen, methane, or air), and two electrodes of opposite polarity 8215, 8210 biased by a voltage source (i.e., an anode and cathode, which may be arranged, e.g., in a parallel plate configuration, as coaxial cylinders, and/or in another fashion). In some examples, the walls of the chamber may form one of the electrodes. An ionization current produced at the electrodes in response to ionizing radiation may be measured by a galvanometer or electrometer. In an ionization chamber sensor the electrodes and/or other components may be formed in whole or in part from ELR materials.

Other types of ionization-based radiation detectors or gas detectors known in the art, such as proportional chambers, Geiger-Muller counters, and/or wire chambers, some of which may have similar construction to the ionization chamber sensor 8200, may similarly employ electrodes, wires, and/or other components formed in whole or in part from ELR materials.

IX.C. Other Radiation and Particle Detectors

Non-exhaustive examples of radiation and particle sensors that may comprise components that are formed at least in part from ELR material include for example: (1) semiconductor or solid-state radiation and particle detectors, such as (a) diamond detectors, (b) silicon diodes (or other diodes) including diffused junction diodes, surface barrier diodes, ion-implanted detectors, epitaxial layer detectors, lithium drifted pn-junction detectors, and avalanche detectors, and (c) germanium detectors, all of which may comprise a semiconductor material (e.g., Si, Ge, CdTe, $HGl_2$, or GaAs) with at least two contacts formed across it (e.g., in a parallel plate or coaxial configuration), (2) cloud and bubble chambers, which may comprise coils formed from ELR materials, (3) dosimeters (including, e.g., quartz fiber dosimeters, film badge dosimeters, thermoluminescent dosimeters, and solid state (MOSFET or silicon diode) dosimeters), (4) microchannel plates, (5) solid-state nuclear track detectors, (6) spark chambers, (7) neutron detectors, (8) superconducting tunnel junction sensors, and (9) microcalorimeters.

X. Temperature Detectors

In some examples, the sensor 3700 may be a sensor that comprises ELR material and is configured to provide an output signal indicative of the absolute or relative temperature of an object or material (e.g., relative to a reference object). Such sensors may be used in numerous applications, including without limitation circuit protection, self time delay circuits, heating thermostats, flow meters, liquid-level detectors, self-resetting overcurrent protectors, meteorology, climatology, electronic medical thermometers, degaussing coil circuits, climate control systems, monitoring coolant temperature or oil temperature, and temperature measurement for gas turbines, engines, kilns, and other industrial systems and processes.

X.A. Thermoresistive Sensors

Various temperature sensors may comprise ELR material and detect or measure absolute or relative temperature by detecting changes in the resistance of a sensing element caused by temperature, including (1) resistance temperature detectors, (2) pn-junction detectors that may use a diode or junction transistor as a sensing element, may be formed in a silicon substrate and/or be used for temperature compensation, (3) silicon resistive positive temperature coefficient (PTC) sensors, such as those incorporated into micromachined structures or packaged as discrete silicon sensors, and which may be formed from an n-type silicon cell metalized on one side and with contacts on the other, and (4) thermistors. Any or all of these temperature sensors may comprise ELR materials, e.g., in the temperature sensing element and/or in conductive elements such as lead wires, electrodes, or similar.

Figure 218A:
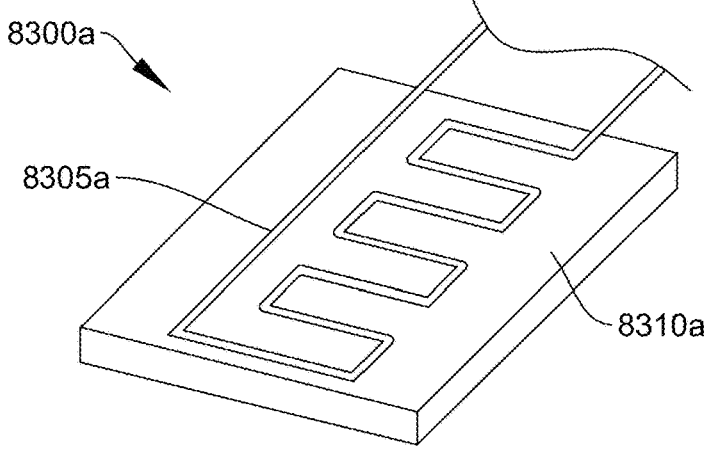
Figure 218B:
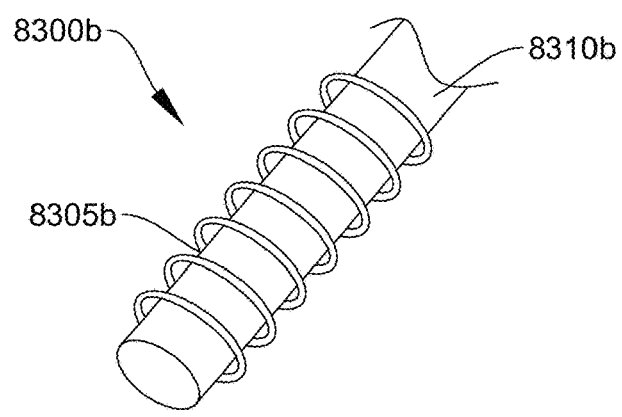
Figure 218C:
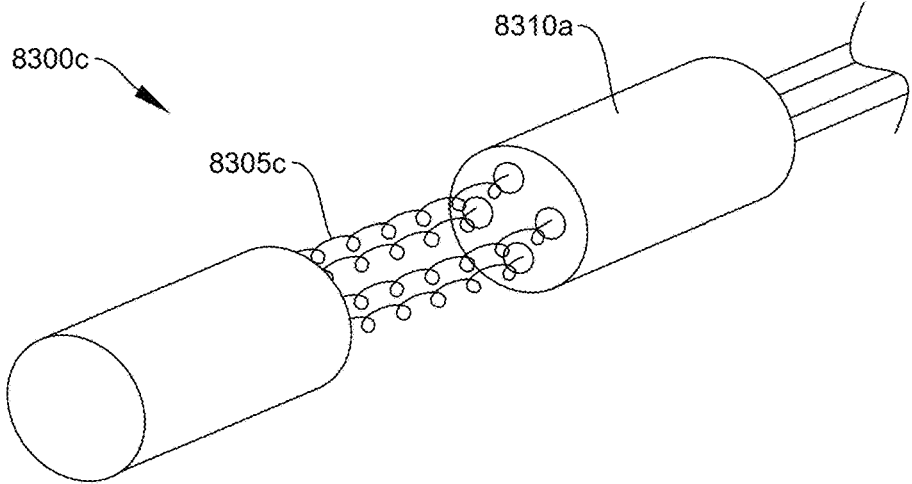

Resistance temperature detectors 8300, such as those shown in FIGS. 218A to 218C comprise a sensing element 8305 formed from a metal (e.g., platinum or tungsten), alloy, or other conductive or semiconductive material (such as germanium) having a resistance that strongly depends on temperature (typically with a positive temperature coefficient), and that is disposed on, encased in, or otherwise supported by a supporting structure 8310. For example, as shown in FIG. 218A, a sensing element 8305a may be a thin film disposed on a planar substrate (e.g., a silicon membrane) or other support structure 8310*a* in a serpentine or other configuration. As another example, as shown in FIG. 218B, the sensing element 8305*b* may be a wire wound around a support structure 8310*b* (such as a glass core) and/or with glass fused homogeneously around it. As yet another example, as shown in the cutaway view of FIG. 218C, the sensing element 8305*c* may be a wire formed into a coil configuration whose shape is maintained by a supporting structure 8310*c* (which may be, e.g., a sealed housing filled with an inert gas or a ceramic cylinder). The sensing element 8305 may be coupled to one or more lead wires, e.g., lead wires insulated with silicon rubber, PTFE insulators, glass fiber or ceramic. The sensing element 8305 may be wired in any suitable configuration, including e.g., a two-wire, three-wire or four-wire configuration (including, e.g., a four-wire Kelvin connection). Also, although not shown in FIGS. 218A to 218B, the detector 8300 may also comprise a casing, housing, or other protective element (e.g., a coating). Other examples of resistance temperature detectors include carbon detectors. In some examples, instead of a sensing element formed from conventional conductive metals, alloys or other materials, the sensing element may instead be formed in whole or in part from ELR material (e.g., ELR nanowire, ELR film, etc.), since the resistance of ELR materials may exhibit a strong temperature dependence. Also other components of a resistance temperature detector (such as contacts, lead wires, etc.) may be formed from ELR materials.

A thermistor comprises a sensing element formed from materials having a highly temperature-dependent resistance, such as metal-oxides, silicon or germanium, and may have additional components such as contacts and lead wires. The sensing elements may be formed in droplets, bars, cylinders, rectangular flakes, chips, and thick films. Thermistors include polymer PTC thermistors; bead-type thermistors (e.g., bare, coated with glass/epoxy, or encapsulated); chip thermistors which may have surface contacts for lead wires; thermistors fabricated by deposition of a semiconductive material on silicon, glass, alumina, or another type of substrate; and printed thermistors (e.g., thermistors with thermistor ink printed on a ceramic substrate), and positive temperature coefficient thermistors (e.g., thermistors having ceramic PTC materials). Various other thermistors may use ELR materials, e.g., as a sensing element and/or in contacts and/or lead wires as would be appreciated.

X.B. Other Temperature Detectors

Non-exhaustive examples of temperature sensors that may comprise components that are formed at least in part from ELR material include: (1) thermocouples and thermopiles, which may comprise a sensing element assembly or junction having bare or insulated wires or films, terminations, protective tubes, and/or thermowells, including thin film thermocouples having bonded junctions of foils and arranged in any suitable fashion, e.g., in either a free filament style or matrix style; (2) optical temperature sensors, such as fluoroptic sensors that use phosphor compounds; (3) infrared optical sensors; (4) interferometric sensors; (5) thermochromic solution sensors; (6) acoustic temperature sensors (including SAW and plate wave temperature sensors); (7) bimetallic strip sensors; (8) coulomb blockade temperature sensors; (9) silicon bandgap temperature sensors; (10) temperature sensors used in calorimeters; (11) piezoelectric temperature sensors, (12) exhaust gas temperature gauges, (13) Gardon gauges, (14) heat flux sensors, (15) microwave radiometers, and (16) net radiometers.

XI. Chemical Sensors

In some examples, the sensor 3700 may comprise ELR material and be configured to provide an output signal indicative of the presence, quantity, concentration or another characteristic of one or more target chemicals. Such sensors may be used in oxygen monitoring, exhaust systems, glucose monitoring, carbon dioxide monitoring, analytical equipment, monitoring industrial processes, quality control, environmental monitoring of workers, detection of explosives or VOCs, electronic noses, medical monitoring of oxygen and trace gas content, breathalyzers, detection of warfare agents, detection of environmental contaminants, or detection of hydrocarbon fuel leaks.

XI.A. Electrical and Electrochemical Sensors

Various chemical sensors determine the electrical effect of an analyte on a material and/or measure the electrical properties of an analyte, such as metal-oxide semiconductor sensors, electrochemical sensors, potentiometric sensors, conductometric sensors, amperometric sensors, elastomeric chemiresistors, chemicapacitors, and chemFETS, some of which are described further herein. Various electrical and electrochemical sensors may utilize components formed from ELR materials.

XI.B. Metal-Oxide Semiconductor Chemical Sensors

Figure 219:
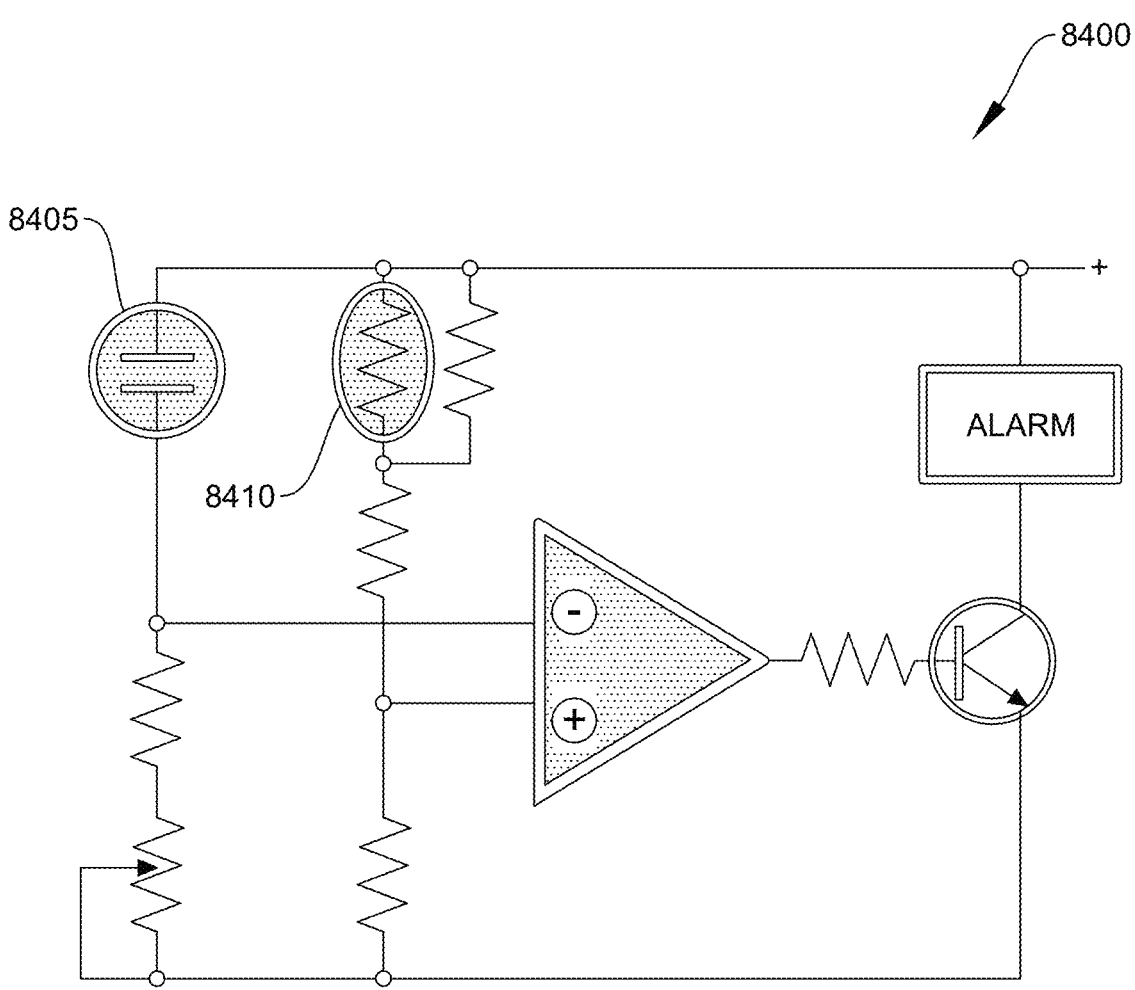

Various metal-oxide semiconductor chemical sensors may detect the presence, type, concentration, or another characteristic of one or more target species (e.g., oxidizable gases), e.g. by detecting changes in the resistance of a semiconductor sensing layer that result from changes in the concentration of target species. Typically, a metal-oxide semiconductor chemical sensor includes a semiconducting sensing layer, electrical contacts, leads and/or other electrical connections to determine layer resistance, and a heating element (e.g., a thermistor) for temperature control. In some examples, the sensor may be formed in a monolithically integrated sensor array that may include on-chip control systems and data acquisition components. FIG. 219 shows one example of a circuit of a $SnO_2$ metal-oxide semiconductor chemical sensor 8400. The circuitry shown in FIG. 219 is generally self-explanatory from the figure and the values of the components are dependent on the application, and are therefore omitted from this discussion. FIG. 219 illustrates that the semiconductor sensing layer (8405) may be incorporated into a Wheatsone bridge circuit or other bridge configuration, e.g., in conjunction with a thermistor 8410 or other heating element. Non-exhaustive examples of semiconducting layers that may be used include: $SnO_2$, tin oxide thin or thick films (including pure films, films doped with Pt or Pd, and films formed on silicon devices), Titania, Rhodium-doped $TiO_2$, and ZnO. Non-exhaustive examples of target species that may be detected include oxygen, carbon monoxide, hydrogen, methane, and other hydrocarbons. In any metal-oxide semiconductor chemical sensor, some or all of the components, including the sensing layer, electrical contacts, leads, heaters, and/or other components (e.g., resistors, amplifiers, or other interface components) may be formed in whole or in part from ELR materials.

XI.C. Electrochemical Sensors

Figure 220:
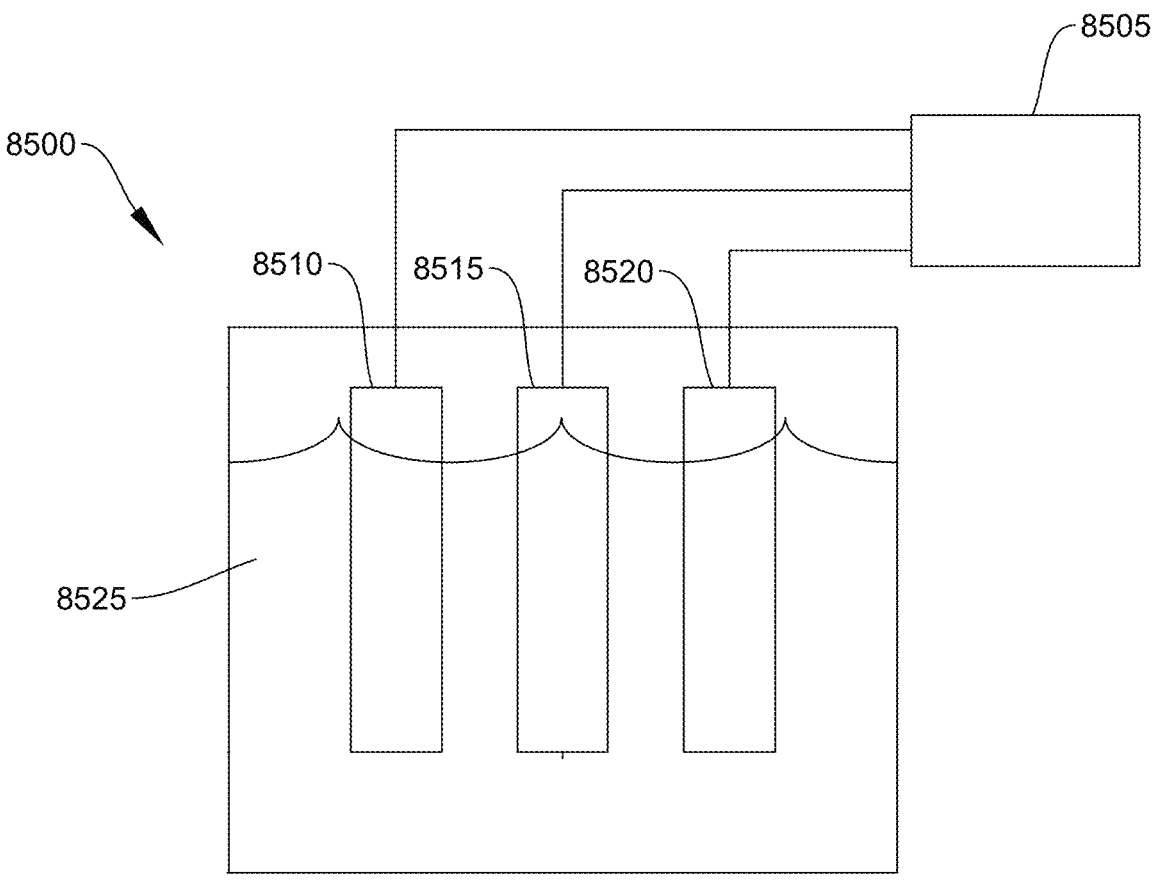

FIG. 220 shows a schematic of an example of an electrochemical sensor 8500, which may be, for example, a potentiometric sensor (e.g., one that measures voltage, e.g., due to a redox reaction), amperometric sensor (e.g., one that measure current), and/or conductometric sensor (e.g., one that measures conductivity, resistivity and/or capacitive impedance), or another type of electrochemical cell. As shown, the electrochemical sensor comprises two or more electrodes, which may include an indicator electrode, a reference electrode 8510 to correct for electrochemical potentials generated by electrodes and electrolyte, a working electrode 8515 where chemical reactions occur, and an auxiliary electrode 8520. The electrodes are partially or fully immersed in an electrolyte solution 8525, which may have the analyte dissolved therein, and are coupled, e.g., via wires, to an electrical control and/or measuring component (e.g., a potentiostat, bipotentiostat, polypotentiostat, amperostat, electrometer, or galvanostat). In some examples, one or more of the electrodes and/or wires may be formed from platinum, palladium, carbon-coated materials and/or ELR materials, may be formed in a thin- or thick-film formation, and/or may be treated to improve their reaction rates/life spans. In some examples, the sensor may comprise other components, e.g., a membrane, such as an ion-selective membrane or oxygen-permeable film (like Teflon). Examples of such sensors include, inter alia, pH meters, and Clark oxygen sensors (which may be used, e.g., for glucose monitoring).

XI.D. Other Chemical Detectors

Various examples of chemical sensors that may comprise components that are formed at least in part from ELR material include (1) elastomer chemiresistors or polymer conductive composites that swell due to the sorption of specific chemical targets and thus exhibit a changed (i.e., increased) resistance in the presence of a chemical target (in some examples, such chemiresistors may be formed in a thin film); (2) chemicapacitive sensors that have capacitive elements (e.g., two interdigitized or parallel electrodes, or two parallel plates) separated by a dielectric (such as a water-sensitive polymer) that absorbs specific chemical targets so that the capacitive elements exhibit a changed capacitance in the presence of a chemical target (in some examples, such chemicapacitive sensors may be formed in a thin film or MEMS configurations); (3) ChemFETs (including ISFETs, MEMFETs, SURFETs, and ENFETS) that include a field effect transistor (FET) whose gate is replaced by and/or coated by one or more layers of chemically-selective materials (such as gas-selective membranes, ion-selective membranes, or enzyme membranes), so that the FET responds differently (e.g., with a different conductance) in the presence of selected target species such as target gases, target ions, or target enzymes; (4) photoionization detectors that may use high-energy UV light to ionize molecules and an electrometer to measure a small current produced by the ionization; (5) acoustic wave devices (including quartz crystal or other microbalance sensors, SAW sensors, acoustic plate mode sensors, and flexural plate wave sensors and variants thereof), other mass or gravimetric sensors, and microcantilevers, all of which may detect changes in the mechanical properties of a structure caused by a change in the mass or the surface stress of the structure that results from the sorption of a target molecule on a surface of the structure, e.g., on a chemically-selective coating; (6) ion mobility spectrometers, that may use an electric deflection field to separate ions having different ion mobilities; (7) thermal chemical sensors that use temperature sensors (e.g., thermistors) coated with a chemically-sensitive material, such as an enzyme immobilized in a matrix, to detect the heat generated or absorbed by a chemical reaction at the coating; (8) pellistor and other catalytic sensors that may detect combustible gases; (9) spectroscopic systems, including infrared and UV spectroscopic systems, including non-dispersive IR systems, (10) fiber-optic transducers that may comprise a light source, optical detector, and an optrode that comprises a reagent, phase membrane or indicator that, in the presence of an analyte, undergoes changes in its optical characteristics that may be detected by reflection, absorption, surface plasmon resonance, luminescence (fluorescence and phosphorescences), chemiluminescence, or evanescent wave techniques; (11) biosensors that detect organisms, membranes, tissues, cells, organelles, nucleic acids, enzymes, receptors, proteins, and/or antibodies; (12) sensors (e.g., thermal, electrochemical, or optical) that comprise an enzymatic layer; (13) piezoelectric; (14) disposable chemical sensors and biosensors; (15) electronic noses and tongues (i.e., electronic smell and taste sensors); (16) breathalyzers; (17) carbon dioxide sensors; (18) carbon monoxide detectors; (19) catalytic bead sensors; (20) electrolyte-insulator-semiconductor sensors; (21) hydrogen sensors; (22) hydrogen sulfide sensors; (23) infrared point sensors; (24) microwave chemistry sensors; (25) nitrogen oxide sensors; (26) olfactometers; (27) pellistors; (28) zinc oxide nanorod sensors; (29) nuclear quadrupole resonance (NQR) sensors; (30) ion channel switch sensors; (31) piezoelectric sensors; (32) thermometric sensors; and (33) and magnetic sensors;

XII. Light Sensors

In some examples, the sensor 3700 may be a photosensor that comprises ELR materials and is configured to provide an output signal indicative of a measurand light signal. Such sensors may be used for numerous applications, including without limitation, mobile devices, cameras, camcorders, portable computers such as tablet computers, mobile phones, medical diagnostics, medical imaging, nuclear and particle physics, astronomy, computed tomography, and image scanners XII.A. Photocathodes, Phototubes, and Photomultipliers Various photosensors may comprise ELR materials and detect or measure light by using a photocathode, i.e., a negatively charged electrode that is coated with a photosensitive compound. These photosensors include phototubes and photomultipliers, including e.g., channel photomultipliers. In such examples, electrodes, dynodes, or other components may be formed in whole or in part from ELR materials.

XII.B. Quantum Photosensors

Various quantum photosensors may comprise ELR material and detect or measure light by transducing an incoming light signal directly to an electrical signal via the photoeffect, including (1) photodiodes having a PN or PIN configuration, including avalanche photodiodes, and which may be integrally formed with a current-to-voltage converter, (2) phototransistors, which may amplify a photodiode current by a current gain, (3) photoresistors, which may be formed from, e.g., CdSm, CdSe, Si, Ge, PbS, InSb, and which may have a resistance that varies in relation to incident light due to the photoeffect, (4) cooled quantum photosensors, e.g., quantum photosensors cooled by Dewars with dry ice, liquid helium, liquid nitrogen, or thermoelectric coolers, (5) one- or two-dimensional arrays of photodiodes for imaging (and/or arrays of other quantum photosensors, e.g., phototransistors or photoresistors), such as charge-coupled device (CCD) sensors (including frame transfer CCD sensors, electron-multiplying CCD sensors, and intensified CCD sensors) and complementary metal oxide semiconductor (CMOS) image sensors or active pixel image sensors, where each pixel comprises a photodetector and an active amplifier. Any or all of these photosensors may comprise ELR materials, e.g., in conductive elements such as interconnections, ground planes, and gates.

XII.C. Thermal Photosensors

Various thermal photosensors may comprise ELR material and detect or measure thermal radiation, including (1)

Golay cells or thermopneumatic detectors, including micromachined Golay cells; (2) thermocouple or thermopile infrared sensors (as described elsewhere herein) such as bismuth, antimony, silicon and MEMS thermopiles (including multiple thermopile sensors arranged in an array for thermal imaging); (3) pyroelectric sensors, which may comprise a pyroelectric ceramic plate or element and two or more electrodes, (4) active far-infrared sensors, (5) hot-electron photodetectors, and (6) gas flame detectors. Any or all of these photosensors may comprise ELR materials, e.g., in the temperature sensing element and/or in conductive elements such as lead wires, electrodes, or similar.

XII.D. Bolometers

Figure 221A:
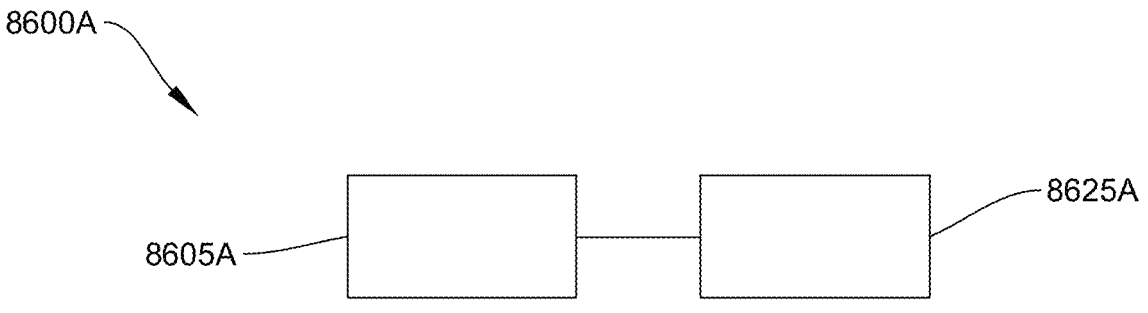
Figure 221B:
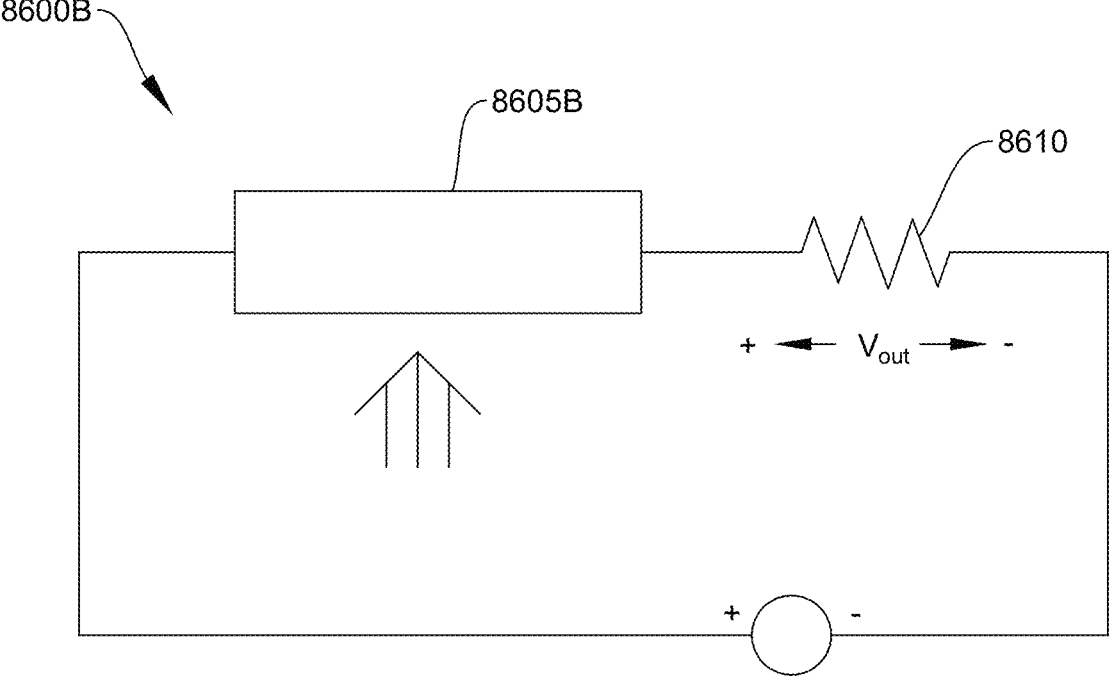

FIG. 221A shows a schematic of an example of a bolometer 8600A. As shown, the bolometer may use an absorptive element 8605A (such as a thin foil, metal film, or thin film, foil, or wire formed from ELR material) configured to absorb and convert infrared or other electromagnetic radiation into heat, and a temperature sensor 8625A, such as those described herein, to detect the resultant increase in temperature. FIG. 221B shows one example of a bolometer that uses a temperature-sensitive resistor as both its absorptive element 8605B and to provide thermo-resistive temperature sensing (e.g., a resistance temperature detector as described herein) whose changed resistance may be measured using a reference resistor 8610 or any other resistance sensing methods (e.g., fiber optic techniques). The absorptive element may be formed from a thin foil, a metal film, or ELR material, including, e.g., platinum, polysilicon, germanium, TaNO, and ELR films, wires, or foils. In some examples, an array of bolometers may be used, e.g., for IR imaging applications. In still other examples, thin-film or foil bolometers may be formed on a silicon or glass membrane, which may be supported by silicon so that it "floats" over a micromachined cavity.

XII.E. Other Light Sensors

Various examples of light sensors that may comprise components that are formed at least in part from ELR material include (1) colorimeters; (2) contact image sensors; (3) LED as light sensors; (4) Nichols radiometers; (6) fiber optic sensors; (7) photoionization detectors; (8) photoswitches; (9) Shack-Hartmann sensors; and (10) wavefront sensors.

XIII. Dust, Smoke and Other Particle Sensors

In some examples, the sensor 3700 may be a sensor that comprises ELR material, and is configured to provide an output signal that is indicative of airborne particles, such as smoke, dust, or other impurity particles. In some examples, the sensor may be an optical smoke or dust detector that uses a photosensor (e.g., a photodiode or phototransistor) and interface circuit to measure the scattering of the light produced by a light emitter, such as an LED. In such examples, the photosensor, light emitter and/or other components may comprise ELR material.

XIII.A. Ionization, Dust, Impurity and Smoke Sensors

Various ionization sensors detect smoke particles by monitoring for reductions in the ionization of air by ionizing particles. Such ionization sensors may comprise (1) an ionization chamber formed of two opposite electrodes (e.g., parallel plate electrodes or coaxial cylinder electrodes) with an applied electric field between them and (2) a small amount of a radioactive element (e.g., Americium-241) in or near the chamber that produces alpha-particles or other ionizing radiation. The sensor may detect smoke or other types of particles by detecting a reduction in air ionization that manifests itself as a reduced current across the two electrodes. The electrodes and/or other components of ionization sensors may be formed in whole or in part from ELR materials.

XIV. Electrical and Electromagnetic Sensors

In some examples, the sensor 3700 may be a sensor that comprises ELR material, and is configured to provide an output signal that is indicative of characteristics of an electrical, magnetic, or electromagnetic signal and/or the electromagnetic properties of a circuit, material, medium, or object. Non-exhaustive examples of such sensors include: (1) ammeters or current sensors (such as galvanometers, D'Arsonval galvanometers, moving iron ammeters, electrodynamic movement ammeter, hot-wire ammeters, digital ammeters, integrating ammeters, milliammeters, microammeters, and picoammeters), (2) voltage sensors or voltmeters (e.g., analog voltmeters, amplified voltmeters, digital voltmeters, vacuum tube voltmeters, AC voltmeters and field-effect transistor voltmeters); (3) oscilloscopes; (4) electrical reactance and susceptance sensors (e.g., ohmmeters); (5) magnetic flux sensors; (6) magnetic field sensors or magnetometers (e.g., fluxgate, superconducting quantum interference device (SQUIDs), atomic spin-exchange relaxation-free, rotating coil, Hall Effect (described herein), proton precession), magnetometers that use Josephson junctions, gradiometers, and optically pumped caesium vapor magnetometers; (7) electric field sensors; (8) electrical power sensors; (9) S-matrix meters (e.g., network analyzers); (10) electrical power spectrum sensors (e.g., spectrum analyzers); (11) electrical resistance and electrical conductance sensors (e.g., ohmmeters); (12) multimeters; (13) metal detectors; (14) leaf electroscopes; (15) magnetic anomaly detectors; (16) phase or phase-shift sensors; (17) ohmmeters; (18) radio direction finders; (19) watt-hour meters; (20) inductance sensors; (21) capacitance sensors; (22) electrical impedance sensors; (23) quality factor sensors; (24) electrical spectral density sensors; (25) electrical phase noise sensors; (26) electrical amplitude noise sensors; (27) transconductance sensors; (28) transimpedance sensors; (29) electrical power gain sensors; (30) voltage gain sensors; (31) current gain sensors; (32) frequency sensors; (33) electrical charge sensors (e.g., electrometers such as vibrating reed, valve, or solid-state electrometers); (33) duty cycle meters; (34) decibel meters; and (35) diode and transistor characterization sensors (e.g., for measuring drop, current gain, or other diode/transistor parameters).

XV. Other Sensors

Non-exhaustive examples of other sensors that may comprise components that are formed at least in part from ELR material include the following: bedwetting alarms, dew warning alarms, fish counters, hook gauge evaporimeters, pyranometers, pyrgeometers, rain gauges, rain sensors, snow gauges, stream gauges, tide gauges, air-fuel ratio meters, crank sensors, curb feelers, defect detectors, engine coolant temperature sensors, manifold absolute pressure (MAP) sensors, parking sensors, radar guns, speedometers, throttle position sensors, tire-pressure monitoring sensors, transmission fluid temperature sensors, turbine speed sensors, vehicle speed sensors, wheel speed sensors, air speed indicators, altimeters, attitude indicators, depth gauges, inertial reference units, magnetic compasses, MHD sensors, ring laser gyroscopes, turn coordinators, variometers, vibrating structure gyroscopes, and Yaw rate sensors.

Additional Sensors Having ELR Components or Suitable Implementations

As noted above, by employing ELR material in such sensors, the sensors provide resistance at orders of magnitude less than the best common conductors under similar conditions, thereby resulting in exceptionally high sensor performance. Further, such sensors can be fabricated in smaller and more compact forms.

Indeed, many of the sensors can be fabricated using thin-film manufacturing techniques, many of which are described herein, and which are common with semiconductor chip fabrication. Many of the sensors employing the ELR materials may be manufactured as single-layer devices, and thus the processing steps for creating such sensors are simplified to include only: photolithography, ion milling, contact metallization, and dicing (or equivalents thereof). Indeed, since the width of paths created or required for the ELR materials is greater than most widths used by current states-of-the-art semiconductor fabrication techniques, prior manufacturing techniques are more than adequate. But, the chip may be fabricated with some of the smallest scale manufacturing techniques, which may leave greater room on the chip for additional sensors or other circuitry. With greater densification, circuit designers have less restriction based on layout or distance issues, which can allow for quicker chip design, among other benefits.

Some of the sensors described herein may be monolithically integrated on a single chip (e.g., a MEMS, silicon or other semiconductor chip), often with other components, such as logic, RF components, analog circuitry, etc. By employing on-chip sensors, the chip may obviously benefit from improved performance. By employing the ELR material within the chip, the chip may enjoy greater density of circuitry, among other benefits. For example, by employing the ELR material, the chip enjoys less heat loss, and can employ thinner conductive lines because more current may travel per line. With less current traveling over each line, EMF effects on neighboring lines, on the sensor, and on other circuits can be reduced. Not only lines, but also interconnects, may be fabricated from the ELR material. Moreover, signals may be transmitted without amplification, since line losses are greatly reduced. Moreover, given the extremely low resistance of ELR materials, the distances between interconnected sensors or sensor components may be made exceptionally long (e.g., thousands of meters) with almost no regard for resistive loss. Thus, sensing systems may also be distributed across much longer distances than are currently possible.

In some examples, sensors may comprise ELR materials that have operating characteristics that change within a temperature range within which the sensor is designed to operate. Given that the response behavior of the sensor (and the ELR materials) can be determined, such behavior can be compensated over the sensor's temperature range as would be appreciated.

Figure 223:
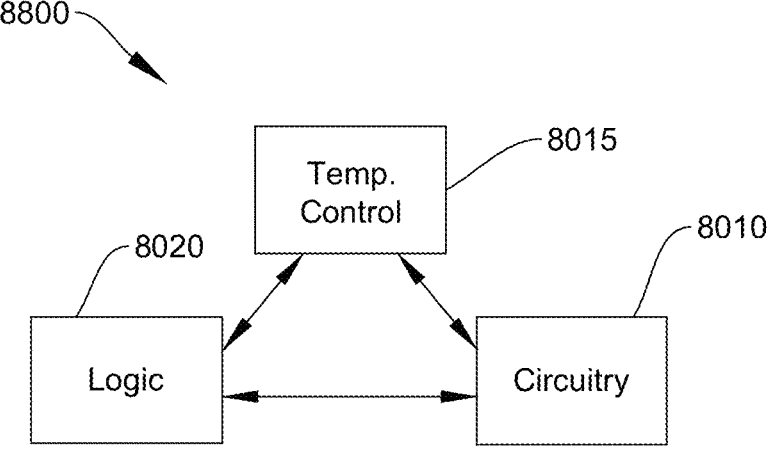

Referring to FIG. 223, an example is shown of a system 8800 that includes circuitry 8810 coupled to a temperature control circuit 8815, and logic 8820. (While various blocks are shown as interconnected in FIG. 223, fewer connections are possible.) The circuitry 8810 employs one or more of the sensors described herein, which are at least partially formed from the ELR material. The logic controls the temperature control circuitry, which in turn controls a cooler/refrigerator, such as a cryogenic or liquid gas cooler that cools the circuitry 8810. Thus, to increase or decrease the sensitivity or response of the system 8800, the logic 8820 signals the temperature control circuit 8815 to decrease or increase the temperature of the circuitry 8810. As a result, the circuitry 8810 employing the ELR material causes the ELR material to increase or decrease conductivity, thereby increasing or decreasing the circuit's sensitivity or response.

While individual sensors are shown, sensors may be joined together to form sensor banks, multiplexers, or other more complex sensor systems, grids or arrays. As with the other categories of sensors discussed herein, various configurations of sensor arrays that employ ELR materials are possible and depend upon the type of sensor array or multi-sensor system being designed. The ELR materials described herein may be used in complex sensor systems that comprise a combination of two or more of the sensors and principles described herein, even if those combinations are not explicitly described. In some examples, complex sensor systems may employ two or more dissimilar or heterogeneous sensors, not simply similar or homogenous sensors. In some examples, sensor systems or arrays may include relatively homogenous sensors all formed of the ELR material, or a heterogeneous mix of different types of sensors, some sensors formed of non-ELR material, or a combination of differing sensors and differing materials. In some examples, complex sensor systems or arrays may employ two or more sensors formed of two or more homogeneous sensors formed primarily of the ELR material, two or more heterogeneous sensors formed primarily of the ELR material, and/or two or more homogeneous/heterogeneous sensors formed of both conventional conductors and the ELR material.

Although specific examples of sensors that employ components formed partially or exclusively from ELR materials are described herein, one having ordinary skill in the art will appreciate that various sensor configurations may employ ELR components, such as those components listed above, e.g., to conduct electrical currents, receive signals, or transmit or modify electromagnetic signals.

While some suitable geometries, interconnections, circuits, and configurations are shown and described herein for some sensors, numerous other geometries, interconnections, circuits, and configurations are possible as would be appreciated. One having ordinary skill in the art who is provided with the various examples of ELR materials, sensors, and principles in this application would be able to implement, without undue experimentation, other sensors with one or more components formed in whole or in part from the ELR materials.

In some implementations, a sensor that includes modified ELR materials may be described as follows:

A sensor, comprising: at least one transducer that comprises a component formed from, or at least partially incorporating, a modified extremely low resistance (ELR) material, wherein the transducer senses a condition and produces an output, and wherein the ELR material is formed of ELR film having a first layer comprised of an ELR material and a second layer comprised of a modifying material bonded to the ELR material of the first layer.

An apparatus for sensing position or displacement of matter, comprising: a transducer system mechanically or electrically configured to sense position or displacement of matter, wherein the transducer system comprises a conductive component formed from, or at least partially incorporating, a modified extremely low resistance (ELR) material, wherein the transducer system produces a sensed output signal in response to the position or displacement of matter, and wherein the modified ELR material is formed of a modified ELR portion having a first layer comprised of an ELR material and a second portion comprised of a modifying material bonded to the ELR material of the first layer.

An apparatus for sensing a level of a fluid, comprising: a transducer system mechanically or electrically coupled to sense a level of the fluid and comprising a component formed from, or at least partially incorporating, a modified extremely low resistance (ELR) material, wherein the transducer system produces a variable impedance in response to the level of the fluid, and wherein the modified ELR material is formed of a modified ELR film having a first layer comprised of an ELR material and a second layer comprised of a modifying material bonded to the ELR material of the first layer.

An apparatus for sensing a position of an object, fluid or matter, the apparatus comprising: a potentiometric sensor mechanically coupled to sense the position of the object, fluid or matter by way of a movable member, wherein the potentiometric sensor comprises a component formed from, or at least partially incorporating, a modified extremely low resistance (ELR) material, wherein the potentiometric sensor produces a variable impedance in response to mechanical movement of the movable member in relation to the position of the object, fluid or matter, and wherein the modified ELR material is formed of a modified ELR portion having a first layer comprised of an ELR material and a second layer comprised of a modifying material bonded to the ELR material of the first layer.

A sensor for sensing a position of an object, the sensor comprising: at least one displaceable member configured to be displaced in relation to a position of, or in response to contact with, the object; and a transducer formed on or coupled to the displaceable member and comprising a capacitive sensor formed from, or at least partially incorporating, a modified extremely low resistance (ELR) material, wherein the capacitive sensor produces a variable impedance in response to displacement of the object relative to the displaceable member, and wherein the modified ELR material is formed of a modified ELR film having a first layer comprised of an ELR material and a second layer comprised of a modifying material bonded to the ELR material of the first layer.

An inductive sensor, comprising: at least one coil; and a magnetic field source; wherein the at least one coil and magnetic field source are inductively coupled together such that an inductance may be mutually induced therebetween; wherein the at least one coil, the magnetic field source, or both, are formed at least in part of a modified extremely low resistance (ELR) nanowire, wherein the modified ELR nanowire is formed of a modified ELR film having a first layer comprised of an ELR material and a second layer comprised of a modifying material bonded to the ELR material of the first layer.

A Hall effect sensor, comprising: at least one conductive portion configured to carry a current; and a magnetic field source; wherein the magnetic field source is positioned relative to the at least one conductive portion so as to induce a sensing signal representing a change in potential transverse to the current; wherein the at least one conductive portion, the magnetic field source, or both, are formed at least in part of a modified extremely low resistance (ELR) tape or nanowire, wherein the modified ELR tape or nanowire is formed of a modified ELR film having a first layer comprised of an ELR material and a second layer comprised of a modifying material bonded to the ELR material of the first layer.

A sensor for sensing occupancy or motion of an object, the sensor comprising: a transducer comprising a conductive surface near a sensing area and at least partially incorporating a modified extremely low resistance (ELR) material, wherein the transducer receives a triboelectric field from an object in the area or senses a change in capacitance related to the object being in the area, and produces a sense signal in response thereto, and wherein the modified ELR material is formed of a modified ELR film having a first layer comprised of an ELR material and a second layer comprised of a modifying material bonded to the ELR material of the first layer.

A velocity sensor, comprising: at least two coils; and a magnetic field source movable relative to the two coils; wherein the coils and magnetic field source are inductively coupled together such that velocity of the magnetic field source relative to the coils induces a corresponding output signal; wherein the two coils, the magnetic field source, or both, are formed at least in part of a modified extremely low resistance (ELR) nanowire, and wherein the modified ELR nanowire is formed of a modified ELR film having a first layer comprised of an ELR material and a second layer comprised of a modifying material bonded to the ELR material of the first layer.

An apparatus for sensing force or strain on an object, the apparatus comprising: a transducer system that includes: a first transducer mechanically configured to sense a force or strain exerted on the object and produce an intermediate output; and, a second transducer electrically configured to receive the intermediate output and produce a sense signal in response thereto that represents the force or strain exerted on the object, wherein the first and/or second transducers comprise a conductive component formed from, or at least partially incorporating, a modified extremely low resistance (ELR) material, wherein the modified ELR material is formed of a modified ELR portion having a first layer comprised of an ELR material and a second portion comprised of a modifying material bonded to the ELR material of the first layer.

A tactile sensor for sensing a contact force, the sensor comprising: at least one displaceable member configured to be displaced in response to a contact force; and a transducer formed on or selectively coupled to the displaceable member and comprising a sensor formed from, or at least partially incorporating, a modified extremely low resistance (ELR) material, wherein the sensor produces an impedance in response to the contact force that is different from a steady state or default impedance, and wherein the modified ELR material is formed of a modified ELR film having a first layer comprised of an ELR material and a second layer comprised of a modifying material bonded to the ELR material of the first layer.

A pressure sensor, comprising: at least one displaceable member held within a structure and configured to be displaced in response to pressure of a fluid acting on the displaceable member; and a transducer formed on or selectively coupled to the displaceable member and comprising a pressure sensor formed from, or at least partially incorporating, a modified extremely low resistance (ELR) material, wherein the sensor produces an impedance in response to the pressure, wherein the produced impedance is different from a steady state or default impedance, and wherein the modified ELR material is formed of a modified ELR film having a first layer comprised of an ELR material and a second layer comprised of a modifying material bonded to the ELR material of the first layer.

An acceleration sensor, comprising: at least two coils; and a magnetic field source movable relative to the two coils; wherein the coils and magnetic field source are inductively coupled together such that acceleration of the magnetic field source relative to the coils induces a corresponding output signal; wherein the two coils, the magnetic field source, or both, are formed at least in part of a modified extremely low resistance (ELR) nanowire, wherein the modified ELR nanowire is formed of a modified ELR film having a first layer comprised of an ELR material and a second layer comprised of a modifying material bonded to the ELR material of the first layer.

An apparatus for sensing a flow of a fluid, comprising: at least one displaceable member, held within a structure through which the fluid flows, and configured to be displaced in response to pressure of a fluid acting on the displaceable member; and a transducer formed on or selectively coupled to the displaceable member and comprising a sensor formed from, or at least partially incorporating, a modified extremely low resistance (ELR) material, wherein the sensor produces a variable impedance in response to the flow, and wherein the modified ELR material is formed of a modified ELR film having a first layer comprised of an ELR material and a second layer comprised of a modifying material bonded to the ELR material of the first layer.

An apparatus, comprising: a first conductive path carrying current; an acoustic sensor; wherein the first conductive path and/or sensor include a first portion having an extremely low resistance (ELR) material and a second portion bonded to the first portion that lowers the resistance of the ELR material; and wherein an acoustic signal relative to the first conductive path or sensor induces a sensing signal that represents a changed impedance in the sensor.

A humidity or moisture sensor component, comprising: a pair of spaced apart conductive paths formed on a surface that comprise at least part of conductive elements for the sensor component, wherein at least one of the conductive paths is comprised of a first material formed of a first portion comprised of an ELR material and a second portion comprised of a modifying material chemically bonded to the ELR material of the first portion, and wherein moisture or humidity in contact between the conductive paths induces a different impedance between the conductive paths as a sensor output signal.

A radiation or particle sensor, the sensor comprising: at least one scintillating material disposed to receive incident radiation or atomic particles and produce light in response thereto; and, at least one light sensitive member disposed relative to the scintillating material and configured to produce an output signal in response to the produced light; and at least one conductive member forming an output terminal, wherein the light sensitive member and/or conductive member is formed, in whole or in part, of a modified extremely low resistance (ELR) material, wherein the modified ELR material is formed of a modified ELR film having a first layer comprised of an ELR material and a second layer comprised of a modifying material bonded to the ELR material of the first layer.

An apparatus for sensing temperature, comprising: a transducer configured to sense a temperature and comprising at least one conductive component formed from, or at least partially incorporating, a modified extremely low resistance (ELR) material, wherein the transducer system produces a variable impedance in response to the temperature, and wherein the modified ELR material is formed of a modified ELR film having a first layer comprised of an ELR material and a second layer comprised of a modifying material bonded to the ELR material of the first layer.

A chemical sensor component, comprising: a pair of spaced apart conductive paths formed on a surface that comprise at least part of conductive elements for the chemical sensor component, wherein at least one of the conductive paths is comprised of a first material formed of a first portion comprised of an ELR material and a second portion comprised of a modifying material bonded to the ELR material of the first portion, and wherein a chemical in contact between the conductive paths induces a different impedance or electrical response between the conductive paths as a corresponding output signal.

A light sensor for sensing a received light signal, the sensor comprising: at least one light sensitive member disposed to receive the light signal and produce an output signal in response thereto; and at least one conductive member forming an output terminal, wherein the light sensitive member and/or conductive member is formed, in whole or in part, of a modified extremely low resistance (ELR) material, wherein the modified ELR material is formed of a modified ELR film having a first layer comprised of an ELR material and a second layer comprised of a modifying material bonded to the ELR material of the first layer.

An electric current, voltage or electric field sensor, comprising: at least one conductive portion configured to carry a current; and a magnetic field source; wherein the magnetic field source is positioned relative to the at least one conductive portion so as to induce a sensing signal representing a sensed electric current, voltage or electric field; wherein the at least one conductive portion, the magnetic field source, or both, are formed at least in part of a modified extremely low resistance (ELR) tape or nanowire, wherein the modified ELR tape or nanowire is formed of a modified ELR film having a first layer comprised of an ELR material and a second layer comprised of a modifying material bonded to the ELR material of the first layer.

A system, comprising: an array of multiple sensor elements, wherein each sensor element comprises—one or more conductive elements forming or coupled to a sensor, wherein at least part of the one or more conductive elements are comprised of a first material formed of a first portion comprised of an ELR material and a second portion comprised of a modifying material chemically bonded to the ELR material of the first portion, and wherein each of the one or more sensor elements provides a sensor output signal.

A system, comprising: logic or analog circuitry; and at least one sensor element coupled to the logic or analog circuitry, wherein the sensor element comprises-one or more conductive elements, wherein the one or more conductive elements include a geometry formed to output a sensor signal in response to a sensed quantity, property, or condition of an externally received stimulus, and, wherein at least part of the one or more conductive elements is comprised of a conductive material formed of a first portion comprised of an ELR material and a second portion comprised of a modifying material bonded to the ELR material of the first portion.

Chapter 12—Actuators formed of ELR Materials

This chapter of the description refers to FIGS. 1-36 and FIGS. 224-239; accordingly all reference numbers included in this section refer to elements found in such figures.

Various types of actuators employing extremely low resistance (ELR) materials are described herein. For some types of actuators described below, the actuators which include at least one transducer and at least one conductor (e.g. input and/or output leads or terminals) are formed of a modified ELR material. For some other types of actuators, a film, tape, foil, wire, nanowire, trace or other conductor is formed or placed on substrate, where the film, tape, foil, wire, nanowire, trace or other conductor employs the modified ELR material. Other types of actuators are constructed where certain components of the actuators or transducers themselves employ the modified ELR material.

Uses of the ELR material in actuators will now be described in detail. In general, many configurations of actuators are possible and are design considerations for a designer implementing an actuator formed with, or connected to the modified ELR material. Indeed, principles that govern the design of conventional actuators can be applied to generating actuators employing the modified ELR materials described herein. Thus, while some actuator geometries are shown and described herein, many others are of course possible. Moreover, although the description herein may highlight how a particular actuator system may use a particular component formed from modified ELR materials, these examples of modified ELR components are intended to be illustrative and not exhaustive. One having ordinary skill in the art who is provided with the various examples in this disclosure would be able to identify other components within the same or a similar actuator system that might be formed from modified ELR materials.

By employing modified ELR materials in and among the actuator components, a near ideal actuator can be achieved, which can provide exceptional efficiency. An actuator's performance is typically affected, if conventionally manufactured, by resistance internal to the conductive lines or elements, but if such lines are manufactured using the ELR tapes, ELR films, ELR foils, ELR wires, ELR traces, ELR nanowires, and/or other ELR conductors that employ modified ELR materials, such resistance will be negligible. Likewise, resistance caused by wires or coils, such as in inductors, can become negligible by employing the various configurations of ELR materials.

In some examples, any of the actuators described herein employing the modified ELR materials can provide extremely low resistance to the flow of current at temperatures between the transition temperatures of conventional HTS materials and room temperatures. In some examples, any of the actuators described herein employing the modified ELR materials can provide extremely low resistance to the flow of current at temperatures greater than 150 K, or other temperatures described herein. In these examples, the actuators may include a cooling system (not shown) used to cool the actuator elements to a critical temperature for the specific modified ELR material. For example, the cooling system may be a system capable of cooling at least the ELR materials in the actuator to a temperature similar to that of, for example, liquid Freon, or other temperatures discussed herein. That is, the cooling system may be selected based on the type and structure of the modified ELR materials utilized in the actuator and the application to which it is applied.

Figure 224:
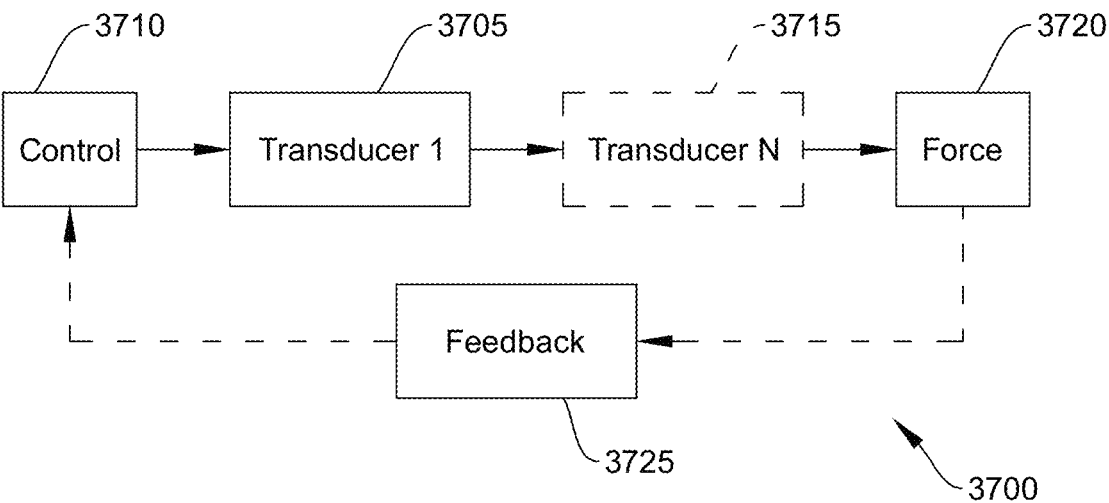
FIGS. 224 to 239 illustrate the forming of actuators using ELR materials.

Referring to FIG. 224, a basic example of an actuator 3700 is shown. The actuator 3700 includes at least one transducer 3705 that receives an input signal or control 3710. The actuator 3700 may also include one or more additional transducers 3715 that may receive an output from a previous transducer. The transducer 3705 (or last transducer 3715) produces output energy or force 3720 to move an object or otherwise produce some physical result.

The actuator may include feedback 3725 that is fed back to the control 3710 to modulate or control the input signal to the transducer 3705. While feedback 3725 is shown, a feed-forward system could be employed where each transducer provides to a subsequent transducer information regarding output of that transducer. Whether feedback or feed forward or both, the actuator system may include one or more sensors to send, for example, displacements, motion, or other variables useful in controlling the actuator.

In general, the actuator 3700 controls the flow of matter (or energy), and thus the transducer 3705 is an energy controller or energy converter, controlled by the control 3710. As described herein, numerous actuators and actuator systems are possible, including electromagnetic actuators (such as motors with mechanical/electrical commutators), fluid power actuators (such as proportional valves, switching valves, fluid power motors), electrochemical actuators (such as wax or metal hydride actuators), shape memory alloy actuators, piezoelectric actuators, magnetostrictive actuators, actuators employing electrorheological/magnetorheological fluids, and microactuators.

Figure 225:
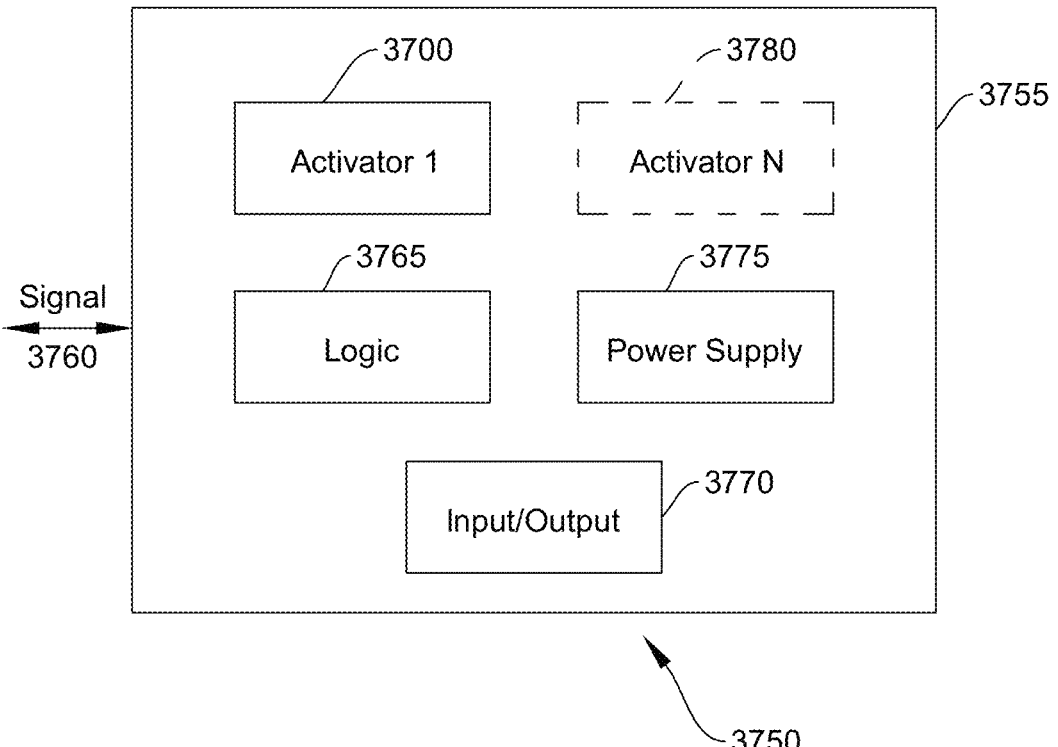

Before explaining the details of the actuator system, a few applications to put the actuator system in context will be described. FIG. 225 shows an example of an apparatus or system 3750 that employs the actuator 3700. The system 3750 receives (or transmits) a signal 3760 via a port or other input/output component. The system may include the actuator 3700, logic and/or analog circuitry 3765, a power supply 3775 and/or input/output (I/O) component 3770, any of which may be contained within a housing 3755 or otherwise aggregated as a unit. The system 3750 may also include one or more additional actuators 3780.

The system 3750 can take one of many forms. In one example, the apparatus is a laptop, tablet or other portable electronic device, such as one with a hard disk drive. Under this example, the power supply 3775 may be a battery, and the actuator system 3700 may form part of the disk drive read/write head motor or spindle motor circuitry. The logic 3765 can include a processor and memory, while the I/O 3770 can include a keyboard or keypad, pointing device, display device, microphone, speaker, button, accelerometer, or other known elements. Many other known components in this example of a portable electronic device are of course possible, but are not shown since they will be readily understood to one of ordinary skill in the art.

In another example, the system 3750 is a cellular telephone receiver/transmitter/transceiver for a cell site. In this example, the power supply 3775 can be line power from a public electric utility, back up generator, batteries, solar cells, etc. In this example, the logic 3765 may include the RF circuitry for facilitating wireless communications. The system may include an antenna, and a filter, such as a cavity filter, and the actuator forms part of a tuner for the filter.

In yet another example, the system 3750 forms part of a medical or scientific device. The device may receive signals, such as from one or more sensors, process those signals, produce an output signal processed by the logic 3765, and using the actuator system 3700, perform some output on the physical world, such as manipulate a medical device component such as an endoscope, surgical robot, cardiac pacemaker etc. Of course, many other examples are possible.

The applications and implementations of the actuators described herein range from single, monolithic chips to larger scale applications employing multiple boxes or devices, such as used in multi-actuator array systems. For example, when implemented as a microactuator on a chip, the system may include one or more actuators formed together with the logic, and may also include other components such as analog circuitry, memory, and input/output circuitry. Indeed, many of the actuators described above can be formed using microstrip technology on substrates, including wafer substrates. Thus, many of the actuators can be fabricated using thin-film manufacturing techniques, many of which are described herein, and all of which are common with Microelectromechanical Systems (MEMS) fabrication, or semiconductor chip fabrication. Many of the actuators employing the modified ELR materials may be manufactured as single-layer devices, and thus the processing steps for creating such actuators are simplified to include only: deposition, photolithography, ion milling, contact metallization, and dicing (or equivalents thereof). In some examples, the chip may be fabricated with some of the smallest scale manufacturing techniques, such as 1.3 nanometer scale technology, which may leave greater room on the chip for additional actuators or other circuitry. With greater densification, circuit designers have less restriction based on layout or distance issues, which can allow for quicker chip design, among other benefits.

Some of the actuators described herein may be monolithically integrated on a single chip, often with other components, such are RF components, analog circuitry, etc. By employing on-chip actuators, the chip may obviously benefit from improved performance. By employing the modified ELR material within the chip, the chip may enjoy greater density of circuitry, among other benefits. For example, by employing the modified ELR material, the chip enjoys less heat generation, and can employ thinner lines because more current may travel per line. Because of little or no resistance, drivers require less current to switch their signals. With less current traveling over each line, EMF effects on neighboring lines, on the actuator, and on other circuits can be reduced. Lines and interconnects may be fabricated from the modified ELR material. Moreover, signals may be transmitted without amplification, since line losses are greatly reduced.

Electromagnetic Actuators Using Modified ELR Materials

Figure 228:
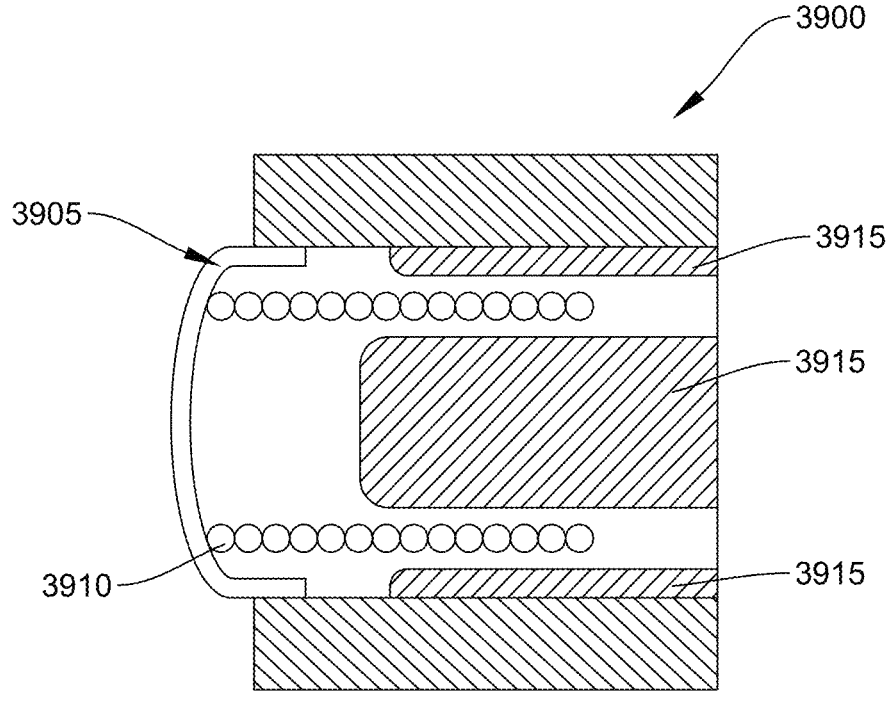

Various types of electromechanical actuators exist that convert electrical and/or magnetic energy into work, and can, in many cases convert work into electrical or electromagnetic energy. One of most common examples includes various motors. One simple example is a limited range linear motor. FIG. 228 shows a cross-sectional schematic of a moving coil actuator 3900. As shown, the actuator 3900 comprises a moving surface 3905 (such as a diaphragm or speaker cone) coupled to a moveable induction coil 3910, which may be formed in whole or in part from modified ELR materials. In one example, the actuator 3900 is an audio loudspeaker. When the coil 3910 is energized or receives a signal (e.g. an analog audio signal), the surface 3910 displaces air to form an acoustic wave. The coil 3910 moves left and right (relative to the Figure) within the magnetic field of a fixed magnet 3915 in response to a varying output voltage provided across the coil representative of displacement through electromagnetic induction.

Other examples of "voice-coil type" motors are possible, as well as other motors, particularly any manner of rotary motion electromechanical actuators, as well as swinging-armature actuators or other limited-motion electromechanical actuators. In general, these electromechanical actuators include at least one inductor. The inductor may include a core, and the modified ELR nanowire or tape configured into a coil shaped and at least partially surrounding the core, as discussed below.

Inductors Having Modified ELR Materials

Figure 226:
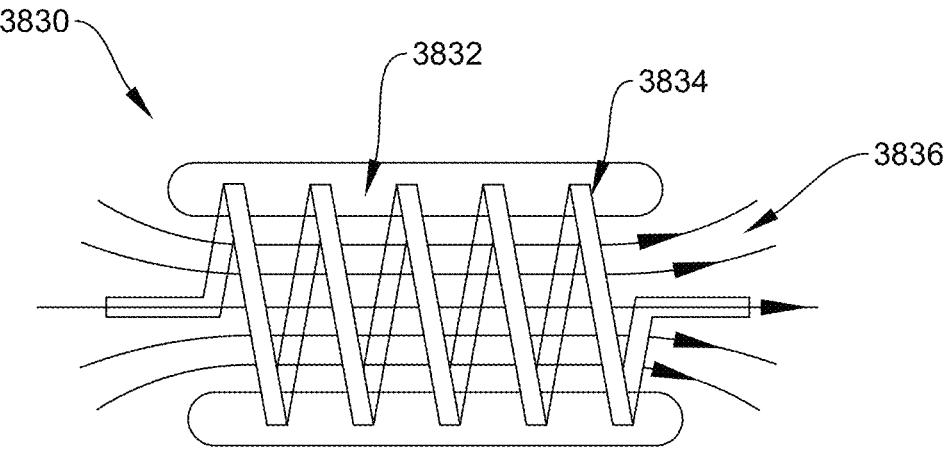

FIG. 226 is a schematic diagram illustrating an inductor 3830 having a modified ELR material. The inductor 3830 includes a coil 3834 and a core, which in this example is an air core 3832. When the coil 3834 carries a current (e.g., in a direction towards the right of the page), a magnetic field 3836 is produced in the core 3832. The coil is formed, at least in part, of a modified ELR material, such as a film having an ELR material base layer (e.g., an unmodified ELR material) and a modifying layer formed on the base layer. Various suitable modified ELR materials are described in detail herein.

A battery or other power source (not shown) may apply a voltage to the coil 3834, causing current to flow within the coil 3834. Being formed of a modified ELR material, the coil 3834 provides little or no resistance to the flow of current at temperatures higher than those required by conventional HTS materials, such as 150 K, room or ambient temperatures (294 K), or other temperatures described herein. The current flow in the coil produces a magnetic field within the core 3832, which may be used to store energy, transfer energy, limit energy, and so on.

Because the inductor 3830 includes a coil 3834 formed of ELR materials, the inductor may act similarly to an ideal inductor, where the coil 3834 exhibits little or no losses due to winding or series resistance typically found in inductors with conventional conductive coils (e.g., copper coils), regardless of the current through the coil 3834. That is, the inductor 3830 may exhibit a very high quality (Q) factor (e.g., approaching infinity), which is the ratio of inductive reactance to resistance at a given frequency, or Q=(inductive reactance)/resistance.

In one example, the core 3832 does not include any additional material, and the inductor 3830 is a coil without a solid core, such as a stand-alone coil (e.g., the coil shown in FIG. 226). In another example, the core 3832 is formed of a non-magnetic material (not shown), such as plastic or ceramic materials. The material or shape of the core may be selected based on a variety of factors. For example, selecting a core material having a higher permeability than the permeability of air will generally increase the produced magnetic field 3836, and thus increase the inductance of the inductor 3830. In another example, selecting a core material may depend on a desire to reduce core losses within high frequency applications. One skilled in the art will appreciate the core may be formed of a number of different materials and into a number of different shapes in order to achieve certain desired properties and/or operating characteristics.

Figure 227:
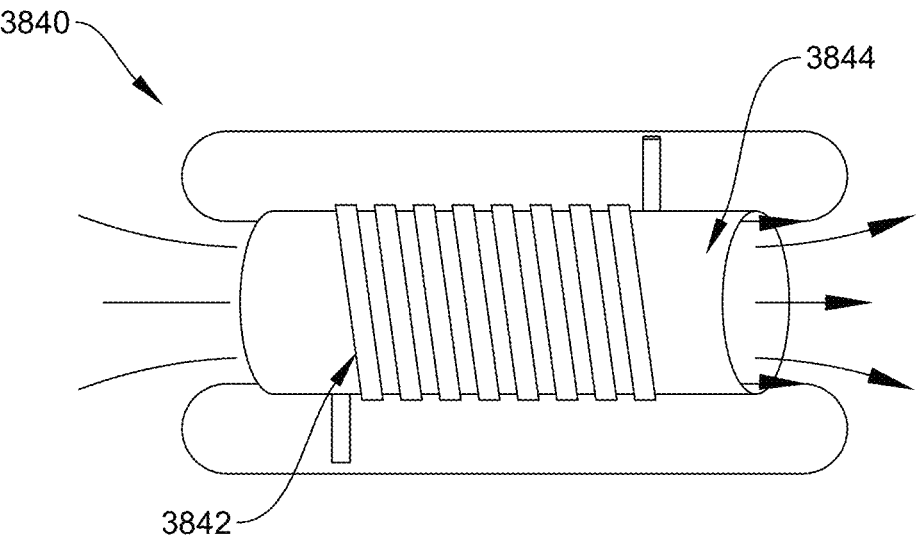

For example, FIG. 227 shows a magnetic core inductor 3840 employing a modified ELR material. The inductor 3840 includes a coil 3842 and a magnetic core 3844, such as a core formed of ferromagnetic materials. The current flow in the coil 3842 produces a magnetic field 3846 within the core 3844, which may be used to store energy, transfer energy, limit energy, and so on. The magnetic core 3844, being formed of ferromagnetic materials, increases the inductance of the inductor 3840 because the magnetic permeability of the magnetic material within the produced magnetic field 3846 is higher than the permeability of air, and thus is more supportive of the formation of the magnetic field 3846 due to the magnetization of the magnetic material. For example, a magnetic core may increase the inductance by a factor of 1,000 times or greater.

The inductor 3840 may utilize various different materials within the magnetic core 3844, such as a ferromagnetic material, like iron or ferrite, and/or be formed of laminated magnetic materials, such as silicon steel laminations. One of ordinary skill will appreciate that other materials may be used, depending on the needs and requirements of the inductor 3840.

In addition, the magnetic core 3844 (and, thus, the inductor 3840) may be configured into a variety of different shapes. In some examples, the magnetic core 3844 may be a rod or cylinder. In some cases, the magnetic core 3844 may be a donut or toroid. In some cases, the magnetic core 3844 may be moveable, enabling the inductor 3840 to realize variable inductances. One of ordinary skill will appreciate that other shapes and configurations may be used, depending on the needs and requirements of the inductor 3840. For example, the magnetic core 3844 may be constructed to limit various drawbacks, such as core losses due to eddy currents and/or hysteresis, and/or nonlinearity of the inductance, among other things.

As would be appreciated, the configuration of the coil 3834 may affect certain performance characteristics, such as the inductance. For example, the number of turns of a coil, the cross-sectional area of a coil, the length of a coil, and so on, may affect the inductance of an inductor. It follows that inductor 3830, although shown in one configuration, may be configured in a variety of ways in order to achieve certain performance characteristics (e.g., inductance values), to reduce certain undesirable effects (e.g. skin effects, proximity effects, parasitic capacitances), and so on.

In some examples, the coil 3834 may include many turns lying parallel to one another. In some examples, the coil may include few turns at different angles to one another. Thus, coil 3834 may be formed into a variety of different configurations, such as honeycomb or basket-weave patterns, where successive turns crisscross at various angles to one another, spider web patterns, where the coil is formed of flat spiral coils spaced apart from one another, as litz wires, where various strands are insulated from one another, and so on.

Figure 229:
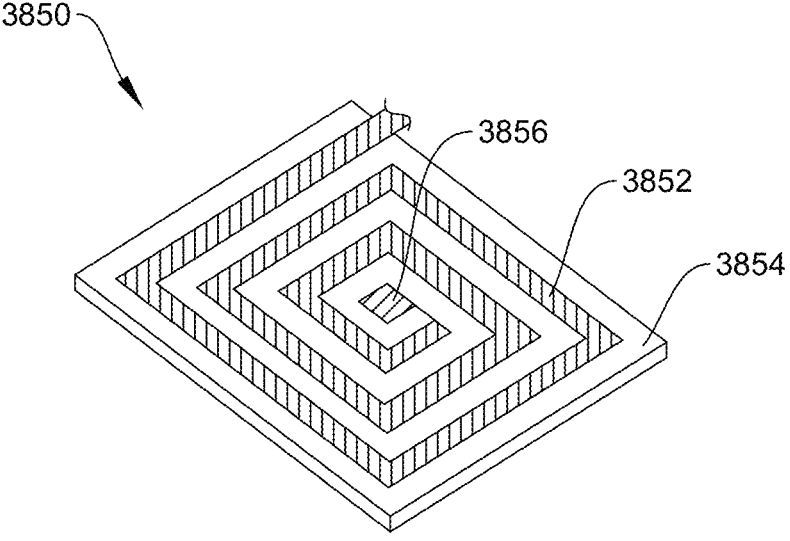

Furthermore, thin film inductors may utilize the ELR materials described herein. FIG. 229 is a schematic diagram illustrating an inductor 3850 employing a thin film component formed from modified ELR materials. The inductor 3850 includes a coil 3852 formed on a substrate 3854 (e.g., a printed circuit board, IC mounting substrate, etc.), and an optional magnetic core 3856. The coil 3852, which may be a modified ELR material deposited onto the substrate 3854, may be formed in a variety of configurations and/or patterns, depending on the needs of the device or system employing the inductor. Further, the optional magnetic core 3856 may be deposited onto the substrate 3854, as shown, or may be a planar core (not shown) positioned above and/or below the coil 3852.

Capacitive Displacement Actuators Using Modified ELR Materials

In addition to inductors, capacitors may be formed using the modified ELR material described herein, where such capacitors are employed in actuators or associated circuitry. Indeed, some of the same principles employed for inductors apply equally to capacitors. The electrostatic force acting between two charges is inversely proportional to the distance between the charges, and at large scales, the force is negligible, but as described below, at smaller scales, the force is useful. A simple actuator using electrostatic force can include a movable plate or beam that can be pulled toward a parallel electrode when a voltage is applied between them. The movable plate or electrode may be suspended by a mechanical spring, which can be a micromachined beam. When voltage is placed across the electrodes, opposite charges on each plate attract one another.

Figure 230:
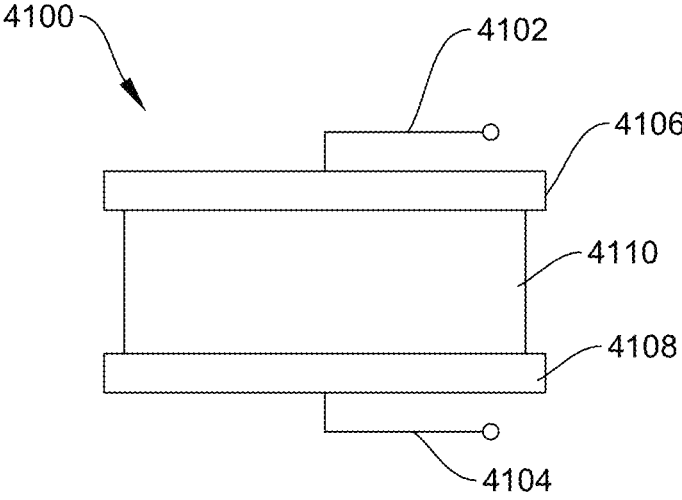

Referring to FIG. 230, an example of a simple parallel plate capacitor 4100 is shown. In this example, the capacitor includes input and output terminals and 4102 and 4104, which are connected respectively to conductive plates or areas 4106 and 4108. The conductive plates/areas are separated by a distance that may be at least partially filled with a dielectric 4110. The dielectric may be air, or any other known dielectric employed with capacitors, such as insulators, electrolytics, or other materials or compounds.

The plates/areas 4106 and 4108 may employ the modified ELR material. Alternatively or additionally, the input and output terminals 4102 and 4104 may employ the modified ELR material. While a simple parallel plate capacitor is shown, any form of capacitor may be employed, such as those formed on semiconductor chips.

In some examples, the actuator 3700 can include a capacitive displacement actuator that comprises a capacitive plate or structure formed at least in part from nanowires, wires, tapes, thin films, foils, traces or other formations of a modified ELR material. For example, a two-plate monopole actuator 4200 shown in FIG. 231A has a fixed reference plate 4205 separated from a moveable plate 4210 by a dielectric (e.g., air). As shown in FIGS. 231B and 231C, the two-plate monopole actuator may be implemented using MEMS technology. For example, the moveable sensing plate 4210 may be micromachined so that it is supported by a flexible suspension 4220 that permits it to move in relation to a micromachined reference plate 4205 having a rigid suspension 4225.

Figure 231A:
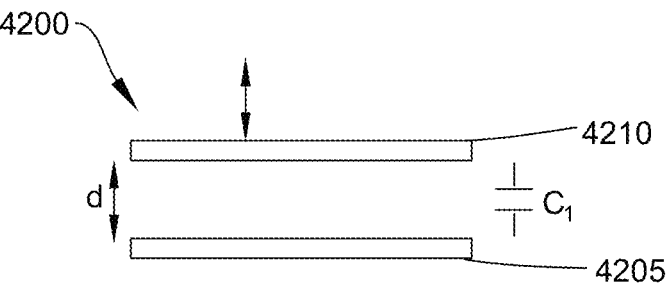
Figure 231B:
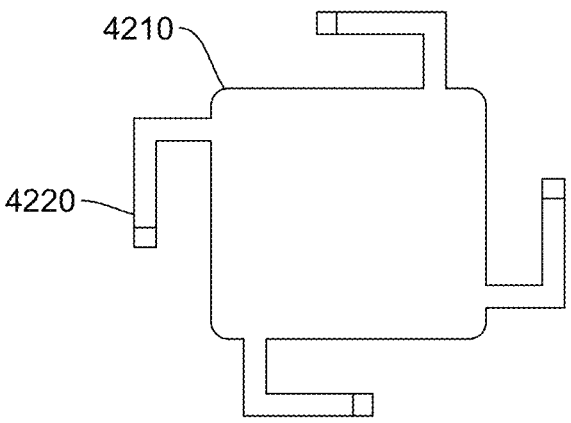
Figure 231C:
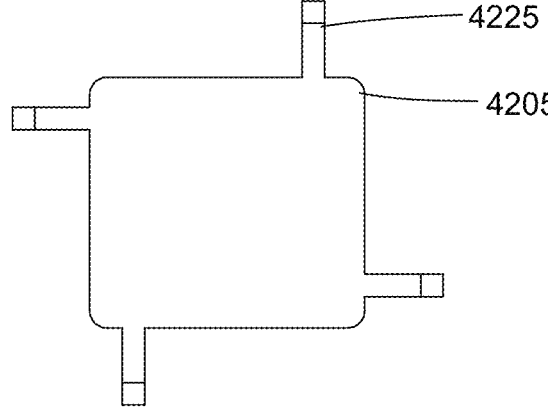

The example configuration of a capacitive displacement actuator shown in FIGS. 231A to 231C are not intended to be exhaustive, and any configuration of capacitive plates or elements that provide actuation using a changed electrical voltage input to displace one or more capacitive plates or elements may be used. For example, other capacitive elements having geometries other than plates (e.g. cylinders) may be used. In any of the configurations, one or more of the capacitive plates or elements (or other elements of the actuator) may be wholly or partially formed from a modified ELR material.

Piezoelectric/Piezomagnetic/Magnetostrictive     Actuators Using Modified ELR Materials Piezoelectric actuators employ certain materials, such as quartz, that expand or contract in the presence of an electric field. (Similar properties apply to piezoelectric magnetic actuators, or "piezomagnetic" actuators, that instead translate magnetic energy into mechanical energy). Piezoelectric actuators can include displacement amplifiers that use structures to increase or amplify the small displacement of the piezoelectric actuator to thereby produce greater movement. Applications for such actuators can include uses in underwater sonar systems, dynamic vibration absorbers, diesel fuel injectors, laser gyroscopes, precision position controlled actuators, ultrasonic motors, inchworm motors, etc. These devices, if efficient enough, may also convert mechanical energy into electrical energy or magnetic energy, which may be useful in sound or vibration sensors (such as geophones), in energy harvesting, etc.

Figure 232:
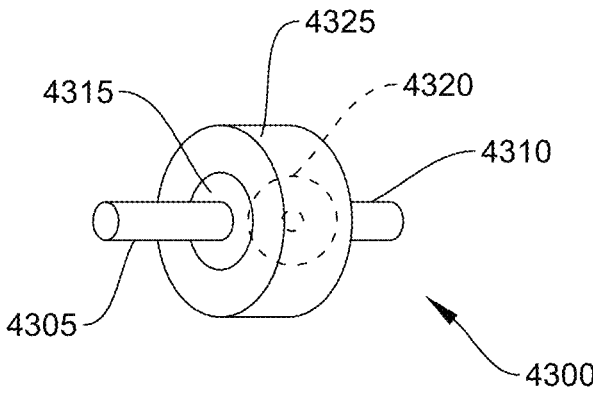

A basic example of piezoelectric actuator 4300 is shown in FIG. 232 that includes an input line 4305 and output line 4310, which are respectively coupled to an input electrode 4315 and output electrode 4320. The lines and electrodes can be constructed of or include the modified ELR materials described herein. The electrodes have sandwiched there between a piece of piezoelectric material 4325. The material 4325 can be made of quartz, lithium tantalate, lithium niobate, gallium arsenide, silicon carbide, langasite, zinc oxide, aluminum nitride, lead zirconium titanate, polyvinylidene fluoride, or other materials. Quartz is often preferred because a designer can select a temperature dependence of the material based on a cut angle of the quartz. While shown as a disc in FIG. 232, any other configuration is, of course, possible, such as plate.

Figure 233:
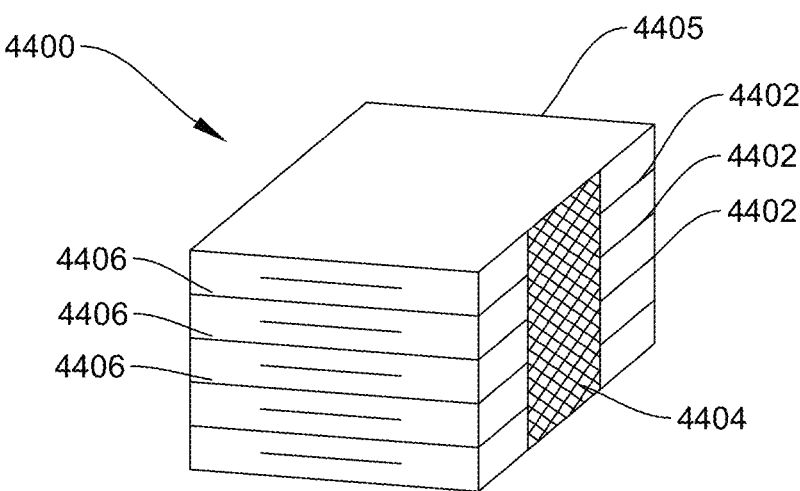

The actuator 4300 does not provide much displacement or movement. Therefore, as shown in FIG. 233, another piezoelectric actuator 4400 includes a piece of piezoelectric material 4405 having formed therein multiple layers of electrodes 4402, which are coupled to a terminal 4404. Opposing electrodes 4406 are formed between electrodes 4402 and also coupled to an opposite terminal (not shown). By applying a signal to the terminals, and thus to the electrodes, the layers of piezoelectric material sandwiched between the electrodes expands, thereby generating a force for the actuator 4400.

Magnetostrictive actuators employ certain materials, such as a magnetized ferromagnetic crystal, whereby its shape changes with increasing magnetic field strength. Magnetostrictive actuators often employ materials such as Terfenol-D ($TD_{0.3}$ $DY_{0.7}$ $Fe_2$), which can include permanent magnets in the actuators to pre-magnetize the actuator. Again, use of the modified ELR material, such as in inductor coils to generate the magnetic field for the actuator, can provide improved performance. As an example, the inductor 3840 of FIG. 227 can include a magnetostrictive rod axially through a center of the inductor to thereby form a magnetostrictive actuator.

Microactuators/MEMS Using Modified ELR Materials

Microactuators, such as MEMS, include three-dimensional mechanical structures with very small dimensions, such as those produced using lithographic procedures, anisotropic etching, and other similar techniques, often found in semiconductor manufacturing. Thus microactuators and MEMS are very small mechanical devices driven by electricity that allow for the execution of complex functions via one or more components such as processing units, sensors, transducers, and/or other circuits and systems. (Small dimensions do necessarily result in decreased actuation force or amplitude.) Examples of applications using such microactuators include microdrives or electromagnetic micromotors, positioning and gripper systems, microoptics, microchoppers, microfluidics such as microvalves and micropumps, etc. The use of MEMS electronic devices has become common in modern technology. For example, MEMS with environmental sensors can be found in airbags, communication devices, inkjet printers, display devices, cell phones, geophones, and many others.

Figure 234:
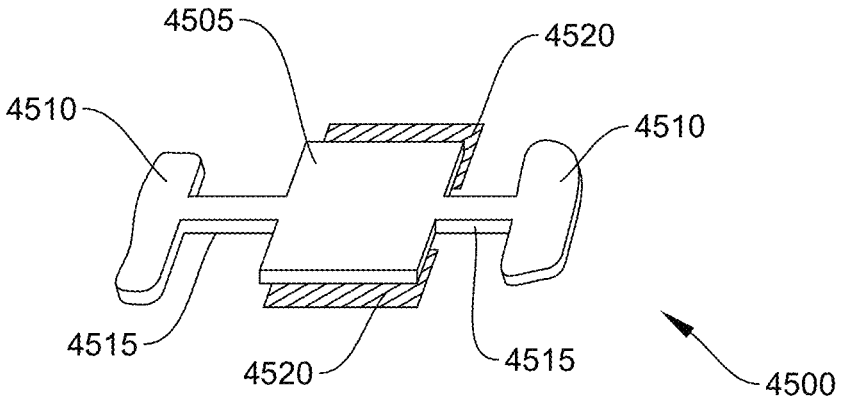
Figure 235:
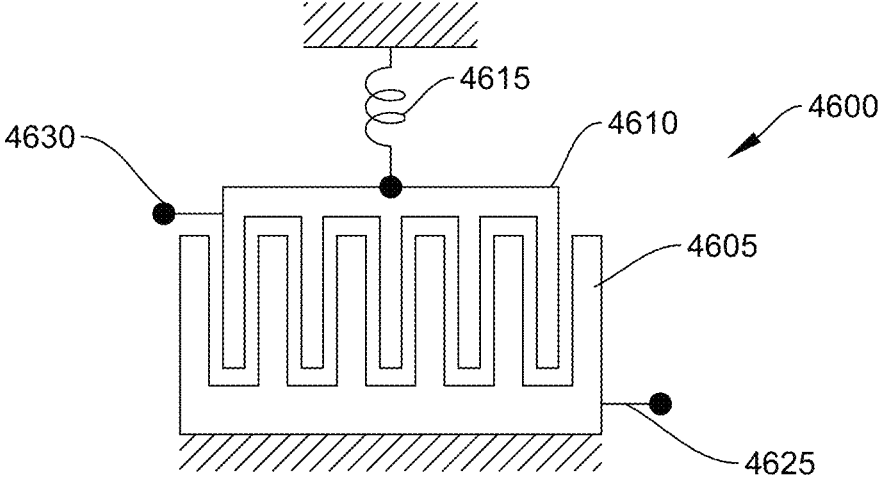

Examples of some electrostatic or capacitive actuators as MEMS are described above. Another example is shown in FIG. 234 as a micromirror 4500. The micromirror includes a reflective portion or plate 4505 that is connected to supporting structures 4510 by way of beams or axles 4515. Electrodes 4520 formed on a substrate and beneath the plate 4505 can be energized to tilt the plates toward either of the electrodes. Micromirror arrays often include hundreds or thousands of these micromirrors in an array with an array of control lines that allows individual mirrors to be controlled or rotated. As a result, impinging light can be reflected in different directions at a pixel level, where each pixel represents a separate micromirror. In other words, individual micromirrors can be turned "on" or "off". Such micromirror arrays can be used in video projection, to control the intensity and direction of incident light for windows in a structure, such as between two panes of insulated glass.

Microactuators may use electrostatic actuation whereby parallel electrodes can exert an attractive electrostatic force therebetween to move one part relative to a fixed part, as noted above. An example of such a device is a comb drive 4600, shown in FIG. 235. As shown, a fixed comb 4605 includes multiple finger electrodes that include interstitial recesses into which extend fingers of a movable comb 4610. The fixed and movable combs 4605 and 4610 include or couple to corresponding electrodes 4625 and 4630. A mechanical spring 4615 can secure the movable comb 4610, while allowing it to move. The fingers of the fixed and movable combs do not touch. The comb drive 4600 overcomes limitations of parallel plate capacitive drives or actuators, such as avoiding "pull-up" instability when voltages beyond a threshold are applied to the actuator.

Figure 236:
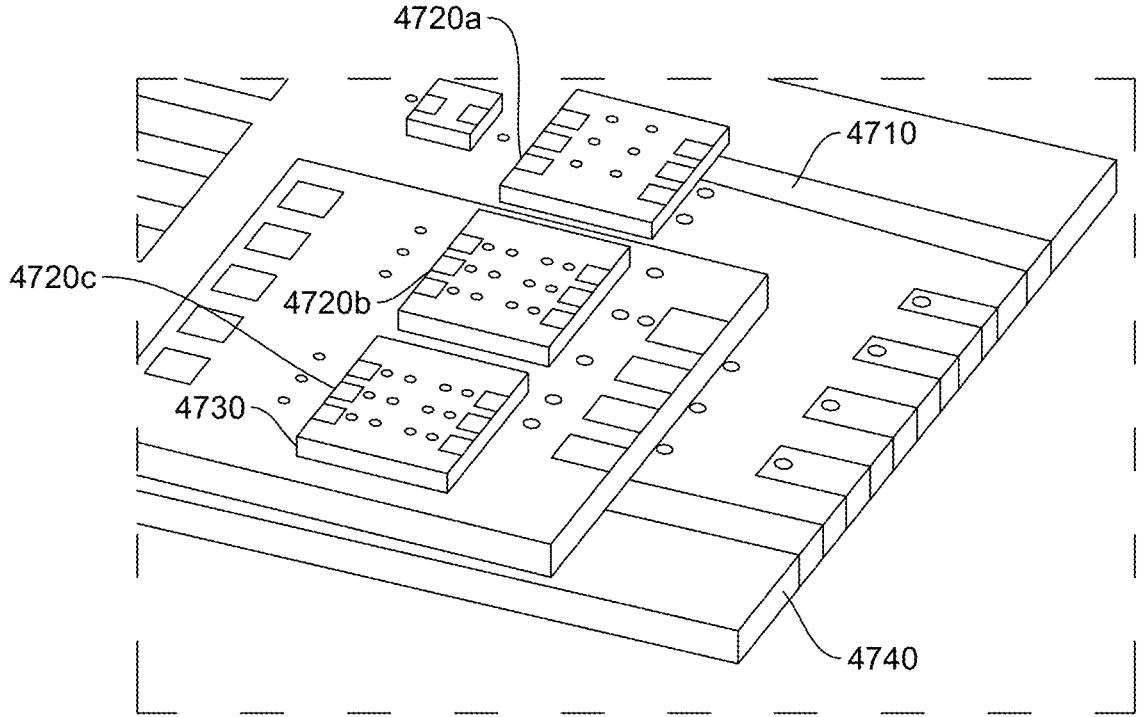

The modified ELR materials may be employed in interconnecting conductors, signal lines, and other portions of such microactuators. FIG. 236 illustrates the use of modified extremely low resistance interconnects (ELRI) 4710 for connecting a MEMS 4720 to other circuits or components 4730 on an IC Mounting Substrate or a system-in-package (SiP) 4740. For example, the ELRI 4710 can be used to connect the MEMS 4720 to analog circuitry and/or digital circuitry such as a microprocessor, a microcomputer, a microcontroller, a DSP, a system on chip (SoC), an antenna, a second MEMS, an ASIC, an ASSP, an FPGA, and/or other circuit, component, or device 4730. The techniques used in these implementations can be used to connect MEMS 4720 to other circuits or components 4730. In addition, these techniques can be implemented on virtually any semiconductor IC mounting substrate containing a MEMS 4720 of same or varying types. For example, for a SiP, ELRI 4710 can be used to connect MEMS devices on the substrate to configure connections to ICs and other passive components, such as antennas, with no appreciable resistance allowing these elements to perform as though they were directly connected at their respective nodes, regardless of their physical location on the substrate. (While the term "MEMS" is used frequently, it is intended to include any microactuator.)

The MEMS can include one or more components. Examples include, but are not limited to, a radio frequency circuit, a tunable transmission line, a waveguide, a resonator, ELR components, passive components, ELR passive components, a quasi-optical component, a tunable inductor, a tunable capacitor, and/or an electromechanical filter. As other examples, the one or more components can include sensors to detect environmental parameters. Examples of the types of sensors than can be used include, but are not limited to, a pressure sensor, a temperature sensor, a thermal radiation sensor, a microwave sensor, a terahertz sensor, a light sensor (including infrared, ultraviolet, x-ray & cosmic ray), a fluidic motion sensor (including gas and liquids), a vibration sensor, an accelerometer, a humidity sensor, an electric field sensor, a magnetic field sensor, and/or a sound sensor.

Overall the, IC mounting substrate can have one or more conductive paths, in multiple levels of interconnect, insulated between themselves except for particular connecting vias designed to respectively connect each of the continuous conducting paths, using the levels to arrange convenient density and connectivity, comprised of an ELRI having a first layer comprised of an ELR material (e.g., an unmodified ELR material) and a second layer comprised of a modifying material bonded to the ELR material of the first layer. The network of components can be connected to the MEMS through the one or more conductive paths. Alternatively or additionally, the MEMS can include one or more internal paths and/or components comprised of a first layer comprised of the ELR material and a second layer comprised of a modifying material bonded to the ELR material of the first layer. The one or more components can be electrical components and/or mechanical components. For example, in at least one implementation, the one or more components can include a set of ELRI passive components, a tunable transmission line, a waveguide, a resonator, a quasi-optical component, a tunable inductor, a tunable capacitor, an electromechanical filter, a sensor, a switch, an actuator, a structure, and/or other component.

Many advantages can result from using ELRI for connecting MEMS circuits to an analog/digital circuit and/or other circuits/components on an IC or SiP. For example, since the one or more conductive paths can have a near-zero parasitic resistance, this would allow the MEMS to be connected to the set of circuitry or components independent of location on a package. The conductive paths can have negligible resistance and have a wave-front-delay time constant approaching zero. As such, the delay of signals and drive current in the electrical interactions can be significantly reduced. In addition, ELRI would enable MEMS and the circuits or components to be integrated on an IC with optimized locations and minimized degradations due to parasitic resistance. As another example, ELRI would allow the MEMS and the analog circuits to be designed somewhat independently. This independent design could facilitate prompt development. Moreover, this would allow MEMS IP and analog circuits IP to be more freely utilized, especially by embedding pre-designed MEMS without requiring MEMS design expertise by users. With ELRI allowing more independence between MEMS and analog circuit designs, more quantity and variety could be integrated on an IC, so MEMS ICs would proliferate in new products—that proliferation providing the learning curve for improved product design and manufacturing.

Using this ELRI technology in an IC product synergistically favors utilizing other ELRI technologies. Examples include MEMS ELRI technologies such as ELRI for connecting multiple MEMS circuits, ELRI for connecting a MEMS to other circuits on a mounting substrate or a SiP, ELRI for 3D interconnects on an IC (which connects the IC to the mounting substrate on package), ELRI for power supply distribution on a mounting substrate, and others, all of which further improves the development of all ELRI technologies and can improve the performance of the product.

The ELRI, actuators and other components can be manufactured based on the type of materials, the application of the modified ELR materials, the size of the component employing the modified ELR materials, the operational requirements of a device or machine employing the modified ELR materials, and so on. As such, during the design and manufacturing, the material used as a base layer of an modified ELR material and/or the material used as a modifying layer of the modified ELR material may be selected based on various considerations and desired operating and/or manufacturing characteristics. While various suitable geometries and configurations are shown and described herein for the layout and/or disposition of the modified ELR material, numerous other geometries are possible. These other geometries include different patterns, configurations or layouts with respect to length and/or width in addition to differences in thickness of materials, use of different layers, modified ELR materials having multiple adjacent modifying layers, multiple modified ELR materials modified by a single modifying layer, and other three-dimensional structures. Thus any suitable modified ELR material can be used depending upon the desired application and/or properties.

In one example for use in ICs, a first depositing operation deposits a first layer of extremely low resistance (ELR) material on the dielectric insulator of an IC, substrate, or SiP. The first layer can be comprised of, for example, YBCO or BSCCO. A second layer, comprised of a modifying material, is deposited on the first layer of the ELR material, creating a single level of ELR interconnects. The second layer can include, for example, chromium or other modifying material described herein. The material used as the first or base layer of and/or the material used as a modifying layer may be selected based on various considerations and desired operating and/or manufacturing characteristics. Examples include chemical compatibility, cost, performance objectives, equipment available, materials available, and/or other considerations and characteristics. A processing operation such as photolithography and material removal (etching or other processing) then forms ELRI to form various components, conductive paths, and/or interconnects. For example, in some implementations, an ELRI MEMS, ELRI passive components, an ELRI RF antenna, a power distribution system, and/or a signal bus with one or more conductive paths capable of routing signals can be formed.

Furthermore, the process can include selecting certain high dielectric constant substrates to provide particular signal response. As noted above, the substrates on which the actuators or other circuits are formed can affect the output. Many substrates are possible, including any of the following, either in bulk or deposited on another substrate: amorphous or crystalline quartz, sapphire, aluminum oxide, $LaAlO_3$, $LaGaO_3$, $SrTiO_3$, $ZrO_2$, MgO, $NdCaAlO_4$, $LaSrAlO_4$, $CaYAlO_4$, $YAlO_3$, $NdGaO_3$, $SrLaAlO_4$, $CaNdAlO_4$, $LaSrGaO_4$, $YbFeO_3$. The substrate may be selected to be inert, compatible for growth, deposition or placement of good quality paths of modified ELR materials, and have desirable properties such as for use in filters formed on the substrate, including planar filters.

Electrochemical Actuators Using Modified ELR Materials

Figure 237:
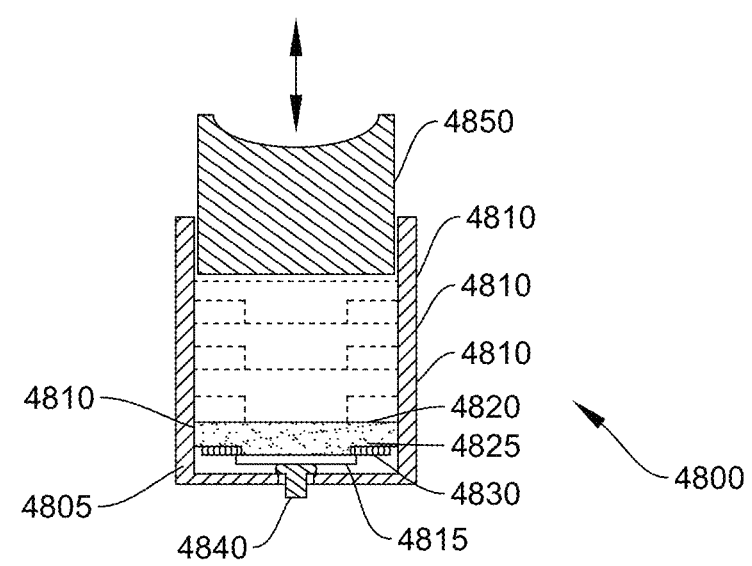

Electrochemical actuators are based on the principle of applying, for example, a small voltage to electrodes that catalyze a gas, and then increase pressure within a closed cell, such as with a fuel cell using electrochemical oxygen pump transports. FIG. 237 shows an example of an electrochemical actuator 4800 that includes a shell or housing 4805 that holds one or more coaxially aligned electrochemical actuators or fuel cells 4810. While one fuel cell 4810 is shown, three others are shown in broken lines, all stacked one atop the other with in the housing 4805.

Each fuel cell 4810 includes a first or lower electrode 4815 and a second or upper electrode 4820. The upper and lower electrodes define an intermediate chamber that holds a gas 4825. Each of the fuel cells can be formed as a disc, square, or other structure, and move freely within the housing 4805. An insulator 4830, formed as a ring or other structure, separates the upper and lower electrodes 4820 and 4830, while retaining the gas 4825.

The housing 4805 is formed of a conductive material such as a metal. When a voltage is applied to the housing 4805 and to an electrode 4840, a resulting voltage between the upper and lower electrodes 4820 and 4815 energizes the gas 4825. In response thereto, the gas expands, and generates an upward force, which can be exerted on a plunger or piston 4850. By using two or more fuel cells 4810, greater displacement can result.

Other electrochemical actuators are possible. For example, rather than employ a gas, a wax may be used, which has greater volume-temperature dependence, and thus its expansion can exert greater movement on a piston. Such a wax can be placed within a rigid container, into which a piston (or piston enclosed in an elastomer) is placed, and the container heated to expand the wax and squeeze or force out the piston.

The modified ELR material may be used for interconnections with electrochemical actuators, in addition to connections among the components of these actuators. For example, a modified ELR material can be applied to the upper and lower electrodes 4815 and 4820, as well as for the housing 4805 and electrode 4840. Modified ELR materials can be formed to wind around or within the housing. Other configurations or geometries are, of course possible.

Shape Memory Actuators Using Modified ELR Materials

Another example is the use of thermal actuation to cause, for example, a bimetallic device to deflect or extend in response to a temperature change. Another example is with shape memory alloy actuators that use shape memory metals or ceramics, which change state and expand/contract based on an externally applied electrical signal or temperature. Examples of such shape memory materials include nickel titanium, copper based alloys (e.g., CuZnAl and CuAlNi), or even $Ni_2MnGa$, which is a shape memory alloy controllable using magnetic fields.

By forming the shape memory material into certain geometric patterns, such as a spring, or coil, a small linear change in expansion of the alloy can be transmitted along its length to produce a greater ultimate displacement. By employing the modified ELR material to electrodes for circuitry for driving the shape memory material, improved performance can be achieved. Shape memory material actuators can be used in drive, control and release elements of all manner of vehicles, climate control elements, grippers, etc.

Electrorheological/Magnetorheological Fluid Actuators Using Modified ELR Materials Actuators employing electrorheological fluids typically include a pair of electrodes within a closed container that holds particular fluids that change in viscosity in response to an electric field, to the point that the fluid can "solidify" into a plastic body. Examples of suitable fluids include non-polar base fluids having small connectivity and no relative permittivity, into which polarizable solid particles with comparably high relative permittivity are dispersed. Light oils are examples of a base fluid, with the solid particles being, for example, silicic acid anhydrides, or alumosilicates, metal oxides, etc. Such actuators can operate in shear load, flow mode or squeeze mode, to thereby provide a force that is parallel to a pair of electrodes, through the pair of electrodes (where both are fixed), or toward a fixed electrode, respectively. Applications of such actuators can be in positioning drives, shock absorbers, tactile elements, etc.

Figure 238:
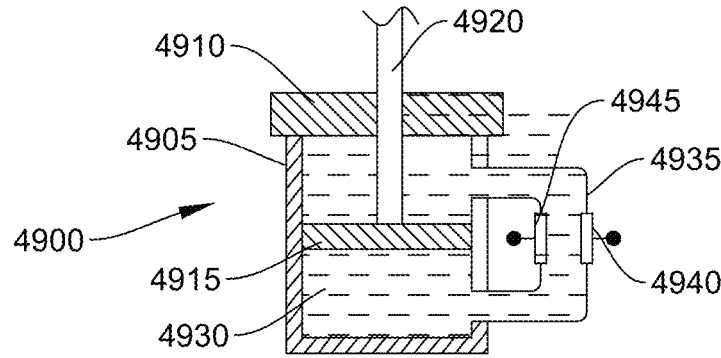

Referring to FIG. 238, an example of a shock absorber or actuator 4900 is shown, which includes a container or vessel 4905 having a cap 4910. The vessel can be a cylinder, into which extends a piston 4915 having a rod 4920 extending through a middle of the cap 4910. The vessel 4905 holds an electrorheological fluid 4930. A U-shaped duct or channel 4935 allows the fluid 4930 to move above and below the piston 4915. A pair of electrodes 4940 and 4945 receives an external electric signal that causes an electric field to extend between the electrodes. The electric field affects the viscosity of the fluid 4930, to thereby change the response of the piston 4915 with in the vessel 4905. While not shown, a valve can be positioned within the duct 4935 to restrict the flow of the fluid 4932 the volumes above and below piston 4915.

The modified ELR material can be applied to the electrodes 4940 and 4945 to thereby efficiently generate an electric field therebetween. While one geometry is shown, any other configurations are possible. Further, the same principles that apply for electrorheological fluids apply equally to magnetorheological fluids that employ ferro/ferromagnetic particles such as carbonyl iron alloys in a low-permeability base fluid that also includes a stabilizer to prevent particles from aggregating and coagulating. Applications can include uses in brakes, clutches, motor mounts, etc.

Suitable Implementations and Applications of Actuators Having Modified ELR Materials As noted above, the modified ELR material has a performance that is dependent on temperature. As a result, the actuators described herein employing the modified ELR material are likewise dependent on temperature. Temperature variation affects field penetration into strip conductors as described above. Such variations of the modified ELR material can be modeled based on the temperature versus response behavior for the modified ELR materials as described herein, or can be empirically derived. Notably, by employing the modified ELR materials, the resistance of the line is negligible, but that resistance can be adjusted based on temperature, as shown in the temperature graphs provided herein. Therefore, the actuator design can be adjusted to compensate for temperature, or the actuator output can be adjusted by varying the temperature.

Figure 239:
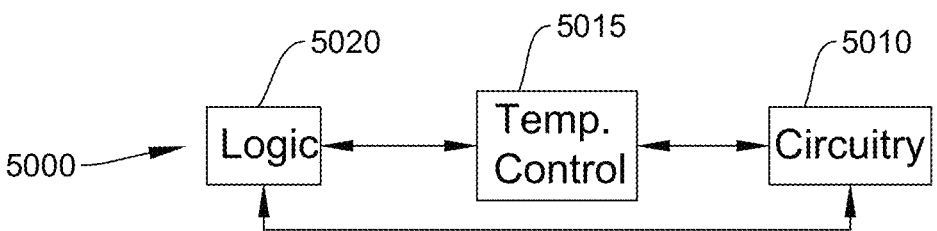

Referring to FIG. 239, an example is shown of a system 5000 that includes circuitry 5010 coupled to a temperature control circuit 5015, and logic 5020. (While various blocks are shown as interconnected in FIG. 239, fewer or more connections are possible.) The circuitry 5010 employs one or more of the actuators described herein, which are at least partially formed from the modified ELR material. The logic controls the temperature control circuitry, which in turn controls a cooler/refrigerator, such as a cryogenic or liquid gas cooler that cools the circuitry 5010. Thus, to increase the sensitivity or response of the system 5000, the logic 5020 signals the temperature control circuit 5015 to decrease the temperature of the circuitry 5010. As a result, the circuitry 5010 employing the modified ELR material causes the modified ELR material to increase conductivity, thereby increasing the circuit's sensitivity or response.

While certain actuators have been generally described above, many other actuators are possible. For example, the modified ELR materials may be incorporated into actuators to tune circuits (e.g. filters). While individual actuators are shown, actuators may be joined together to form more complex actuator systems or arrays. As with the other categories of actuators discussed herein, many configurations of actuator arrays are possible and are design considerations for a designer implementing a multi-actuator system that is at least partially formed from the modified ELR material. The modified ELR materials described herein may be used in complex actuator systems that comprise a combination of two or more of the actuators and principles described herein, even if those combinations are not explicitly described. Indeed, such complex actuator systems may employ two or more dissimilar or heterogeneous actuators, not simply similar or homogenous actuators. Such an actuator system or array can include relatively homogenous actuators all formed of the modified ELR material, or a heterogeneous mix of different types of actuators, some actuators formed of non-ELR material, or a combination of differing actuators and differing materials. Thus, complex actuator systems or arrays may employ two or more actuators formed of two or more homogeneous actuators formed primarily of the modified ELR material, two or more heterogeneous actuators formed primarily of the modified ELR material, and/or two or more homogeneous/heterogeneous actuators formed of both conventional conductors and the modified ELR material.

Although specific examples of actuators that employ components formed partially or exclusively from modified ELR materials are described herein, one having ordinary skill in the art will appreciate that virtually any actuator configuration may employ components that are formed at least partially from modified ELR materials, such as those components listed above. Various actuators and actuator systems widely employ conductive elements and other elements, some of which are listed above. (While the modified ELR material may be used with any conductive elements in a circuit, it may be more appropriate to state, depending upon one's definition of "conductive" that the modified ELR material facilitates propagation of energy or signals along its length or area.) As a result, it is impossible to enumerate in exhaustive detail all possible actuators and actuator systems that may employ components that are formed from modified ELR materials.

While some suitable geometries are shown and described herein for some actuators, numerous other geometries are possible. These other geometries include not only different patterns, configurations or layouts with respect to length and/or width, but also differences in thickness of materials, use of different layers, and other three-dimensional structures. The inventors contemplate that virtually all actuators and associated systems known in the art may employ modified ELR material and believe that one having ordinary skill in the art who is provided with the various examples of modified ELR materials, actuators, and principles in this application would be able to implement, without undue experimentation, other actuators with one or more components formed in whole or in part from the modified ELR materials.

In some implementations, an actuator that includes modified ELR materials may be described as follows:

An actuator, comprising: at least one transducer configured to convert received electrical energy into mechanical energy; at least one conductive input line coupled to the transducer, wherein the conductive output line is configured to input a signal to the at least one transducer to actuate the transducer; and, wherein at least part of the transducer or conductive line are formed of a modified extremely low resistance (ELR) portion, and, wherein the modified ELR portion is formed of a first layer comprised of an ELR material and a second layer comprised of a modifying material bonded to the ELR material of the first layer.

A method of manufacturing an actuator element, the method comprising: placing first and second spaced apart conductive portions, using an extremely low resistance (ELR) material, on a piezoelectric or piezomagnetic substrate, wherein the first and second spaced apart conductive paths form terminals for a piezoelectric or piezomagnetic actuator, and, wherein the ELR material is formed of a first portion comprised of an ELR material and a second portion comprised of a modifying material bonded to the ELR material of the first portion.

An actuator, comprising: a substrate; at least one micro-scale or nanoscale transducer formed on the substrate and configured to convert received electrical energy into mechanical energy; at least one conductive input line formed on the substrate and coupled to the transducer, wherein the conductive output line is configured to input a signal to the at least one transducer to actuate the transducer; and, wherein at least part of the transducer or conductive line are formed of a modified extremely low resistance (ELR) portion, and, wherein the modified ELR portion is formed of a first layer comprised of an ELR material and a second layer comprised of a modifying material bonded to the ELR material of the first layer.

A actuator system, comprising: multiple actuator elements, wherein each actuator element comprises—a transducer, and one or more conductive paths, wherein the one or more conductive paths include a geometry to provide an input signal to the transducer, wherein at least part of the transducer and/or one or more conductive paths are comprised of a first material formed of a first portion comprised of an ELR material and a second portion comprised of a modifying material chemically bonded to the ELR material of the first portion, and wherein multiple actuator elements collectively provide a combined actuator function.

A system, comprising: logic or analog circuitry; and at least one actuator element coupled among the antenna and the logic or analog circuitry as a unit, wherein the actuator element comprises-one or more electrical to mechanical transducer, one or more conductive paths, wherein the one or more actuators and/or conductive paths include a geometry formed to provide a actuation function based on a received control signal, wherein at least part of the one or more actuators and/or conductive paths are comprised of a conductive material formed of a first portion comprised of an ELR material and a second portion comprised of a modifying material bonded to the ELR material of the first portion.

Chapter 13—Filters formed of ELR Materials

This chapter of the description refers to FIGS. 1-36 and FIGS. 240-258; accordingly all reference numbers included in this section refer to elements found in such figures.

Various types of filters employing extremely low resistance (ELR) materials are described herein. For some types of filters described below, the filters include a substrate on which a film, tape, foil, wire, nanowire, trace or other conductor is formed or placed, and where the film, tape, foil, wire, nanowire, trace or other conductor employs a modified ELR. Other types of filters are constructed where certain components of the filters employ the modified ELR material. In some examples, the modified ELR materials are manufactured based on the type of materials, the application of the modified ELR material, the size of the component/element employing the modified ELR material, the operational requirements of a device or machine employing the modified ELR material, and so on. As such, during the design and manufacturing of a filter, the material used as a base layer (e.g., the unmodified ELR material) of a modified ELR material and/or the material used as a modifying material of the modified ELR material may be selected based on various considerations and desired operating and/or manufacturing characteristics. The modified ELR materials provide extremely low resistances to current at temperatures higher than temperatures normally associated with existing high temperature superconductors (HTS), thereby enhancing the operational characteristics of these filters at higher temperatures, among other benefits.

Uses of the modified ELR material in filters will now be described in detail. In general, many configurations of filters are possible and are design considerations for a filter designer implementing a filter formed of the modified ELR material. Indeed, principles that govern design of conventional filters can be applied to generating filters employing the modified ELR materials described herein. Thus, while some filter geometries are shown and described herein, many others are of course possible. Moreover, although the description herein may highlight how a particular filter system may use a particular component formed from modified ELR materials, these examples of modified ELR components are intended to be illustrative and not exhaustive. One having ordinary skill in the art, who is provided with the various examples in this disclosure would be able to identify other components within the same or a similar filter system that might be formed from modified ELR materials.

Figure 240:
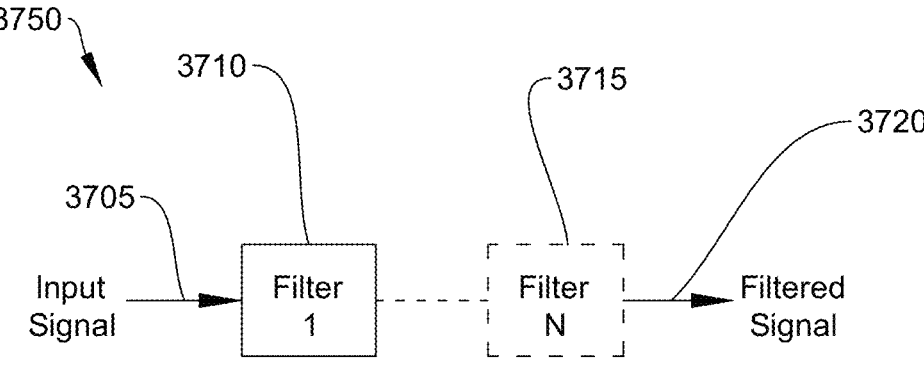

FIG. 240 shows a schematic diagram illustrating a filter system 3700 that can employ modified ELR materials. An input terminal or transmission line 3705 receives an input signal and provides it to a filter 3710. The filter 3710 can take one of many forms described herein. The filter system 3700 can include more than one filter, a second of which is shown as optional filter 3715. The filter signal, after passing through the one or more filters 3710, 3715, is output on line or terminal 3720 as a filtered signal.

Figure 241:
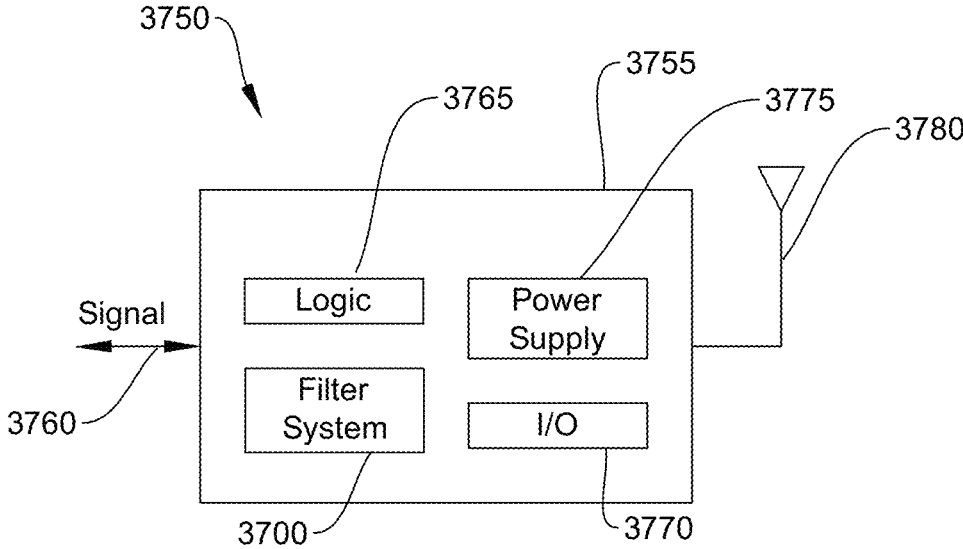

Before explaining the details of the filter system, a few applications to put the filter system in context will be described. FIG. 241 shows an example of an apparatus or system 3750 that employs the filter system 3700. The apparatus 3750 receives or transmits a signal 3760 via a port or other input/output component. The apparatus 3750 may include the filter system 3700, logic and/or analog circuitry 3765, a power supply 3775, and input/output (I/O) component 3770, any or all of which may be contained within a housing 3755 or otherwise aggregated as a unit. In the example of FIG. 241, the apparatus 3750 may also include an antenna 3780.

The apparatus 3750 can take one of many forms. In one example, the apparatus is a mobile phone, smart phone, laptop, tablet or other portable electronic device. Under this example, the power supply 3775 may be a battery, and the filter system 3700 may form part of RF circuitry, which may be formed on one or more semiconductor chips. The logic 3765 can include a processor and memory, while the I/O 3770 can include a keyboard or keypad, pointing device, display device, microphone, speaker, or other known elements. Many other known components in this example of a portable electronic device are of course possible, but are not shown since they will be readily understood to one of ordinary skill in the art.

In another example, the apparatus 3750 is a cellular telephone receiver/transmitter/transceiver for a cell site, or base station. In this example, the power supply 3775 can be line power from a public electric utility, back up generator, batteries, solar cells, etc. In this example, the logic 3765 may include the RF circuitry for facilitating wireless communications. The antenna 3780 can include one or more cellular telephone antennas.

In yet another example, the antenna 3780 is omitted, and the apparatus 3750 forms part of a medical or scientific device. The device may receive signals, such as from one or more sensors, filter those signals using the filter system 3700, and produce an output signal processed by the logic 3765. Of course, many other examples are possible. The applications and implementations of the filters described herein range from single, monolithic chips, such as RFID chips, to larger scale applications employing multiple boxes or devices, such as used in active antenna array systems, distributed cellular telephone sites, etc. For example, when implemented as an RFID chip, the device includes the antenna 3780 coupled to RF circuitry and logic, and memory. The device may be fabricated on a single chip, or, the antenna may be formed as a microstrip antenna formed on a substrate, such as a label, flexible substrate, printed circuit board, etc. with the remaining components monolithically integrated on a single chip (or multiple interconnected chips.)

Figure 242:
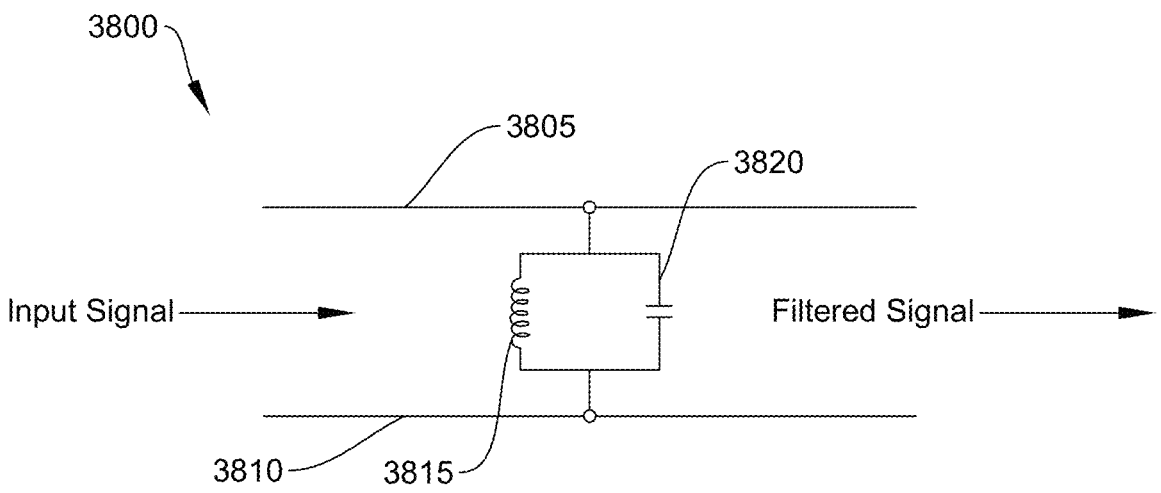

In an initial, basic example, the filter 3710 of the filter system 3700 can include a simple resonator structure, such as a filter 3800 formed as an LC tank circuit, shown in FIG. 242. As shown, the filter 3800 receives an input signal over lines 3805 and 3810. The filter includes an inductor 3815 and capacitor 3820 coupled in parallel. Two or more of such arrangements may be provided, as well as inductors and/or capacitors in series. In some examples, the filter 3800 may include one or more resistors as well. Of course, filter design is quite specific for the application in which the filter is to be employed, and the particular application, desired frequency or frequency range, and other factors drive the value and number of components employed in the filter. Thus, the particular values and numbers of components need not be described herein because they will differ from application to application and device to device.

In general, a lumped element filter, such as that shown in the FIG. 242, may include at least two elements coupled in series or in parallel, where at least one of the elements is an inductor or a capacitor. The inductor includes a core, and the modified ELR material configured into a coil and at least partially surrounding the core. The capacitor includes at least two conductive areas or elements, where at least one of the areas/elements is formed of the modified ELR material. A dielectric separates the two conductive areas/elements. Overall, at least some of the conductive elements in known or conventional filter components, such as inductors and capacitors, may be formed using the modified ELR material described herein (including planar filters, discussed below).

By employing modified ELR materials in and among the filter components, a near ideal quality factor of the resonator filter 3800 can be achieved, which can likewise result in exceptional selectivity of the filter, such as for wireless applications, among other applications. (Selectivity generally refers to a measure of performance of a radio receiver's ability to reject (i.e., attenuate) unwanted frequencies relative to a desired frequency or frequency band/channel.) The filter's performance is typically affected, if conventionally manufactured, by resistance internal to the conductive lines 3805 and 3810, but if such lines are manufactured using the modified ELR material, such resistance will be negligible. Likewise, resistance caused by coils in inductors can become negligible by employing the modified ELR materials.

In some examples, any of the filters described herein employing the modified ELR materials can provide extremely low resistance to the flow of current at temperatures between the transition temperatures of conventional HTS materials and room temperatures. In some examples, any of the filters described herein employing the modified ELR materials can provide extremely low resistance to the flow of current at temperatures greater than 150 K or more as described herein. In various examples, the filters may include an appropriate cooling system (not shown), used to cool the filter elements to a critical temperature for the specific modified ELR material. For example, the cooling system may be a system capable of cooling at least the ELR materials in the filter to a temperature similar to that of liquid Freon, for example, or other temperatures described herein. That is, the cooling system may be selected based on the type and structure of the modified ELR materials utilized in the filter. Other considerations for selecting the cooling system may also exist, e.g., the amount of power dissipated by the system.

Inductors Having Modified ELR Materials

Figure 243:
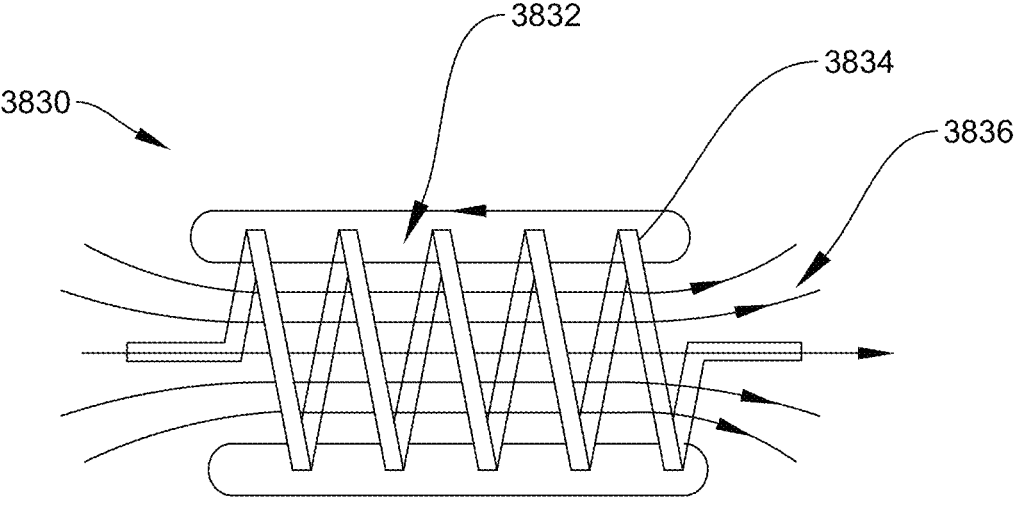

FIG. 243 is a schematic diagram illustrating an inductor 3830 having a modified ELR film formed from the modified ELR material. The inductor 3830 includes a coil 3834 and a core, which in this example is an air core 3832. When the coil 3834 carries a current (e.g., in a direction towards the right of the page), a magnetic field 3836 is produced in the core 3832. The coil is formed, at least in part, of the modified ELR film. Various suitable modified ELR films are described in detail herein.

A battery or other power source (not shown) may apply a voltage to the modified ELR coil 3834, causing current to flow within the coil 3834. Being formed of a modified ELR film, the coil 3834 provides little or no resistance to the flow of current at temperatures higher than those used in conventional HTS materials, such as, for example, temperatures greater than 150 K, room temperature, etc. The current flow in the coil produces a magnetic field within the core 3832, which may be used to store energy, transfer energy, limit energy, and so on.

Because the inductor 3830 includes a coil 3834 formed using the modified ELR materials, the inductor may act similarly to an ideal inductor, where the coil 3834 exhibits little or no losses due to winding or series resistance typically found in inductors with conventional conductive coils (e.g., copper coils), regardless of the current through the coil 3834. That is, the inductor 3830 may exhibit a very high quality (Q) factor (e.g., approaching infinity), which is the ratio of inductive reactance to resistance at a given frequency, or Q=(inductive reactance)/resistance.

In one example, the core 3832 does not include any additional material, and the inductor 3830 is a coil without a physical core, such as a stand-alone coil (e.g., the coil shown in FIG. 243). In another example, the core 3832 is formed of a non-magnetic material (not shown), such as plastic or ceramic materials. The material or shape of the core may be selected based on a variety of factors. For example, selecting a core material having a higher permeability than the permeability of air will generally increase the produced magnetic field 3836, and thus increase the inductance of the inductor 3830. In another example, selecting a core material may depend on a desire to reduce core losses within high frequency applications. One skilled in the art will appreciate the core may be formed of a number of different materials and into a number of different shapes in order to achieve certain desired properties and/or operating characteristics.

Figure 244:
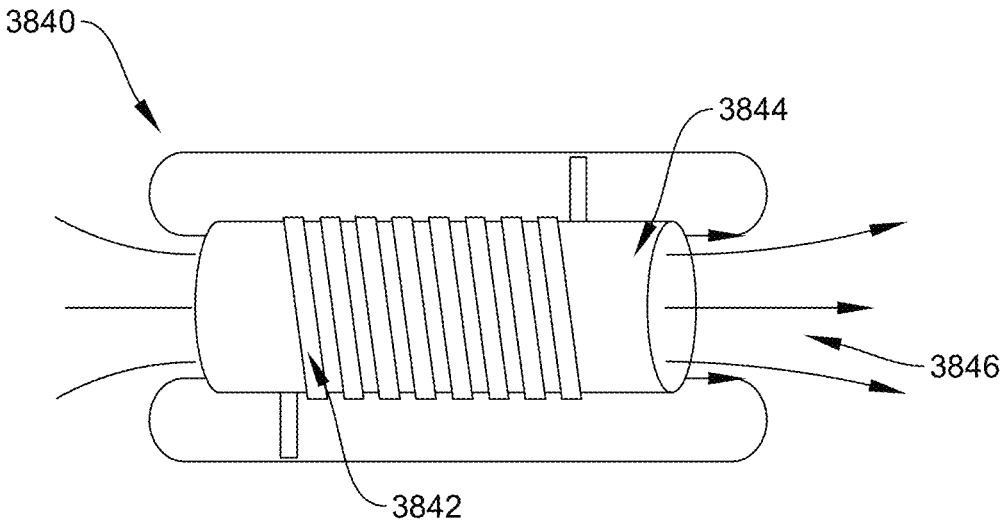

For example, FIG. 244 shows a magnetic core inductor 3840 employing a modified ELR film. The inductor 3840 includes a coil 3842 and a magnetic core 3844, such as a core formed of ferromagnetic or ferrimagnetic materials. The current flow in the coil 3842 produces a magnetic field 3846 within the core 3844, which may be used to store energy, transfer energy, limit energy, and so on. The magnetic core 3844, being formed of ferromagnetic or ferrimagnetic materials, increases the inductance of the inductor 3840 because the magnetic permeability of the magnetic material within the produced magnetic field 3846 is higher than the permeability of air, and thus is more supportive of the formation of the magnetic field 3846 due to the magnetization of the magnetic material. For example, a magnetic core may increase the inductance by a factor of 1,000 times or greater.

The inductor 3840 may utilize various different materials within the magnetic core 3844, such as a ferromagnetic material, like iron or ferrite, and/or be formed of laminated magnetic materials, such as silicon steel laminations. One of ordinary skill will appreciate that other materials may be used, depending on the needs and requirements of the inductor 3840.

In addition, the magnetic core 3844 (and, thus, the inductor 3840) may be configured into a variety of different shapes. In some examples, the magnetic core 3844 may be a rod or cylinder. In some cases, the magnetic core 3844 may be a donut or toroid. In some cases, the magnetic core 3844 may be moveable, enabling the inductor 3840 to realize variable inductances. One of ordinary skill will appreciate that other shapes and configurations may be used, depending on the needs and requirements of the inductor 3840. For example, the magnetic core 3844 may be constructed to limit various drawbacks, such as core losses due to eddy currents and/or hysteresis, and/or nonlinearity of the inductance, among other things.

As would be appreciated, the configuration of the coil 3834 may affect certain operational characteristics, such as the inductance. For example, the number of turns of a coil, the cross-sectional area of a coil, the length of a coil, and so on, may affect the inductance of an inductor. It follows that inductor 3830, although shown in one configuration, may be configured in a variety of ways in order to achieve certain performance characteristics (e.g., inductance values), to reduce certain undesirable effects (e.g. skin effects, proximity effects, parasitic capacitances), and so on.

In some examples, the coil 3834 may include many turns lying parallel to one another. In some examples, the coil may include few turns that different angles to one another. Thus, coil 3834 may be formed into a variety of different configurations, such as honeycomb or basket-weave patterns, where successive turns crisscross at various angles to one another, spider web patterns, where the coil is formed of flat spiral coils spaced apart from one another, as litz wires, where various strands are insulated from one another, and so on.

Figure 245:
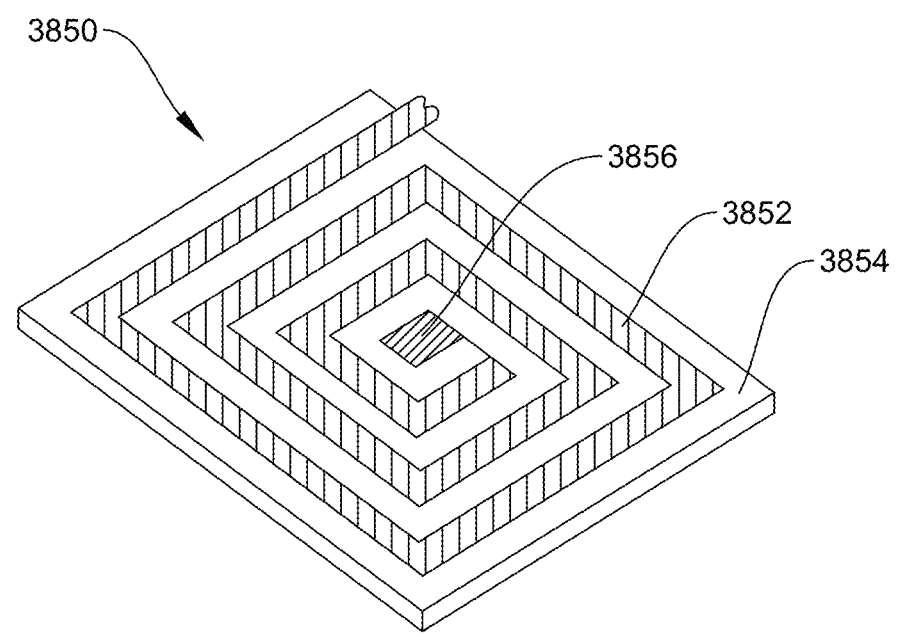

Furthermore, thin film inductors may utilize the ELR components described herein. FIG. 245 is a schematic diagram illustrating an inductor 3850 employing a modified ELR thin film component. The inductor 3850 includes a modified ELR coil 3852 formed onto a substrate 3854 (e.g., a printed circuit board), and an optional magnetic core 3856. The coil 3852, which may comprise modified ELR materials deposited onto or etched into the substrate 3854, may be formed in a variety of configurations and/or patterns, depending on the needs of the device or system employing the inductor. Further, the optional magnetic core 3856 may be deposited onto or etched substrate 3854, as shown, or may be a planar core (not shown) positioned above and/or below the coil 3852.

Capacitors Having Modified ELR Materials

Figure 246:
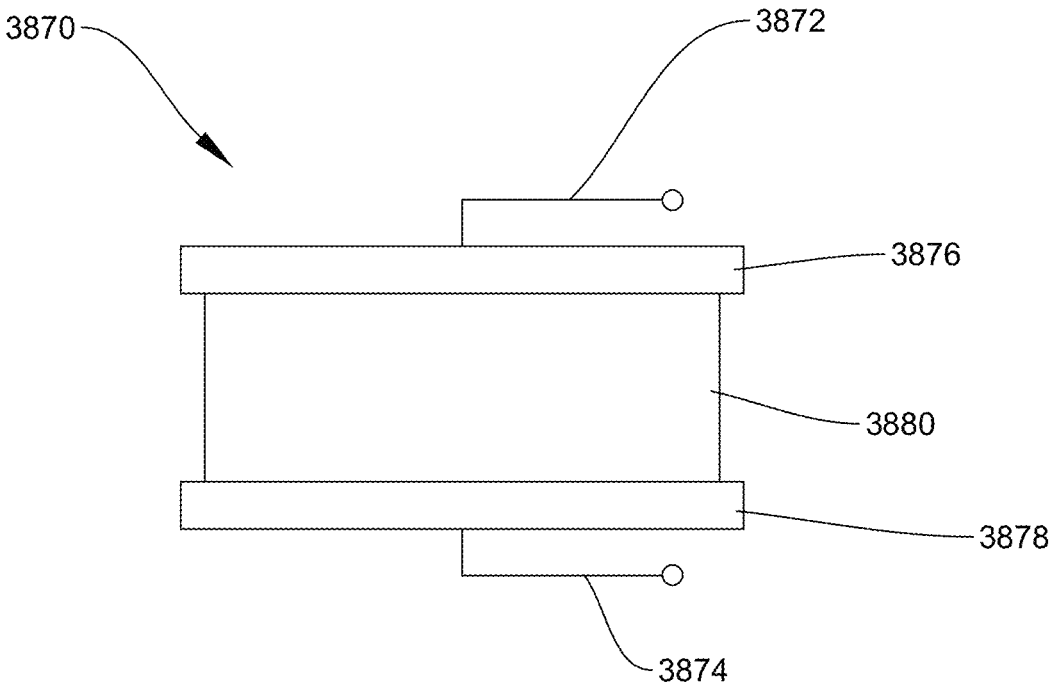

In addition to inductors, capacitors may be formed using the modified ELR material described herein. Indeed, some of the same principles employed for inductors apply equally to capacitors. Referring to FIG. 246, an example of a simple parallel plate capacitor 3870 is shown. In this example, the capacitor includes input and output terminals and 3872 and 3874, which are connected respectively to conductive plates or areas 3876 and 3878. The conductive plates/areas are separated by a distance that may be at least partially filled with a dielectric 3880. The dielectric may be air, or any other dielectric employed with capacitors, such as insulators, electrolytics, or other materials or compounds as would be appreciated.

The plates/areas 3876 and 3878 may employ the modified ELR material. In some examples, the input and output terminals 3872 and 3874 may employ the ELR material. While a simple parallel plate capacitor is shown, any form of capacitor may be employed, such as those formed on semiconductor chips.

Planar Filters Having Modified ELR Materials

One type of filter particularly suited for employing the modified ELR materials described herein are planar filters. Planar filters often employ conductive strip or microstrip transmission lines, which can be conductive traces formed on a dielectric substrate, such as a printed circuit board; however, such planar filters may be fabricated at much smaller scales and on smaller substrates, even employing semiconductor manufacturing processes and other nanoscale technologies.

Figure 247:
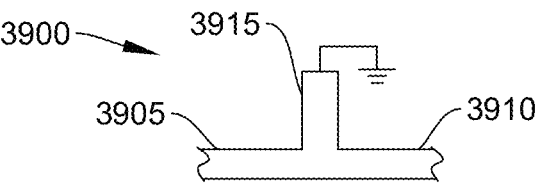
Figure 248A:
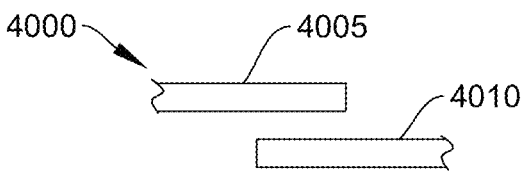
Figure 248B:
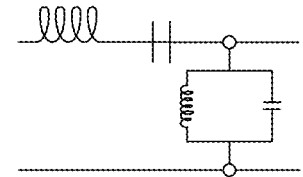

FIG. 247 shows an example of a simple planar filter structure, whose lumped-circuit approximation is substantially equivalent to the filter 3800 of FIG. 242. An input transmission line 3905 and an output line 3910 are interrupted by a stub 3915 that is connected to ground. (By not connecting the stub to ground, an effective series equivalent is formed with the inductor and capacitor in the series between the input and output lines 3905 and 3910). FIG. 248A shows another example of a planar filter 4000 having an input line 4005 and an output line 4010, coupled as open-circuited lines; an approximate semi-lumped element configuration of planar filter 4000 is shown in FIG. 248B.

Under planar filters or similar distributed element filters, the inductance, capacitance and resistance of the filter is not localized or "lumped" in discrete inductors, capacitors, resistors or other elements, but instead is formed by inserting one or more discontinuities in a transmission line, where the discontinuities represent a reactive impedance to a wave front traveling down the transmission line. A wave may be slowed when propagated along a superconducting transmission line because of increased inductance of the line via external magnetic field penetration, but more importantly, a normal conductor has a skin depth that is a function of frequency, where increasing frequency reduces skin depth. However, ELR materials, generally, represent very low loss along the transmission line, thereby typically reducing skin depth considerations. Thus, with the modified ELR materials described herein, skin depth may be ignored in some applications, or may be measured and employed/compensated for empirically, as well as considered when designing filters for particular applications.

Figure 249A:
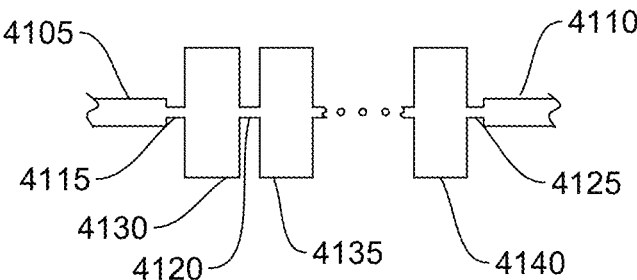
Figure 249B:
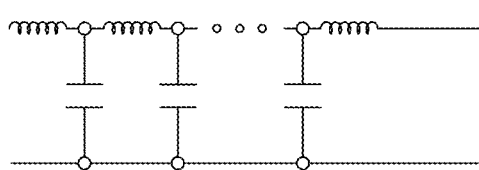

The stubs can lend themselves for use in band-pass filters, while low-pass filters may be constructed using a series of alternating sections of high- and low-impedance lines to correspond to series inductors and shunt capacitors when viewed in a lumped-element implementation. FIG. 249A shows an example of such a low-pass filter, while FIG. 249B shows its lumped-element approximation. Specifically, FIG. 249A shows an example of a stepped-impedance low-pass filter having input and output lines 4105 and 4110, and an alternating series of stepped high-impedance elements 4115, 4120 and 4125, and low-impedance elements 4130, 4135 and 4140 to form alternating inductive and capacitance impedance elements. Any number of elements can be employed, represented by the ellipses shown in the Figures. Of course, various other geometries are possible, and elements in the filter may be one-quarter of the wavelength desired to be affected by the filter.

Figure 250A:
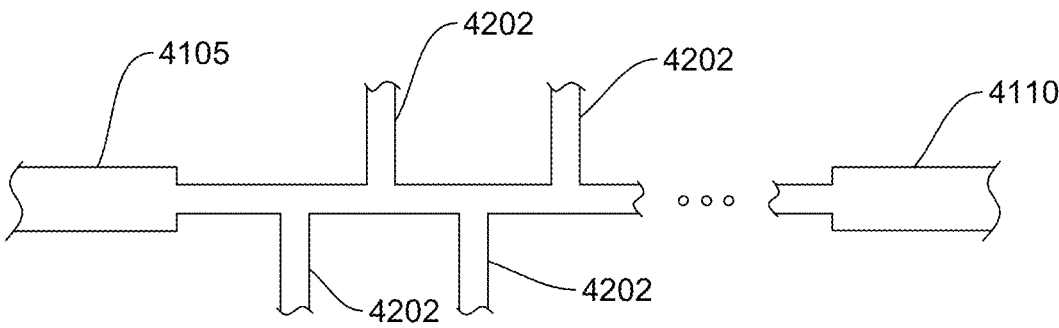
Figure 250B:
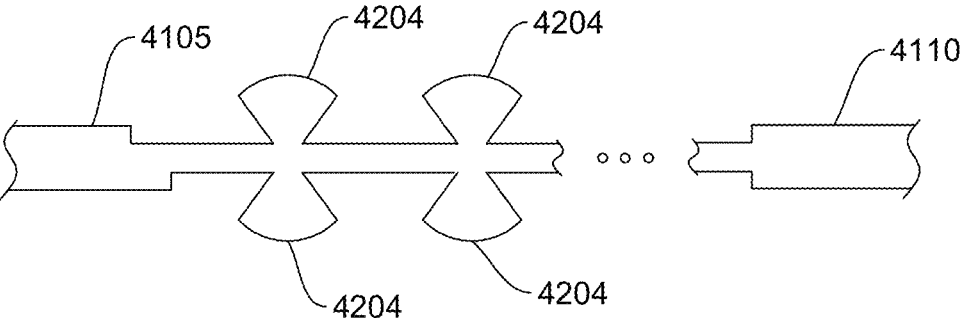

Examples of alternating stubs to likewise form low-pass filters are shown in FIG. 250A (with straight stubs 4202), and FIG. 250B (butterfly or radial stubs 4204). Geometries employing butterfly stubs, clover-leaf stubs, or other radial stubs, may permit easier modeling for the filter designer. Other geometries may include stubs to implement shunt capacitors, where stubs are positioned on opposite sides of the lines 4105 and 4110.

Figure 251A:
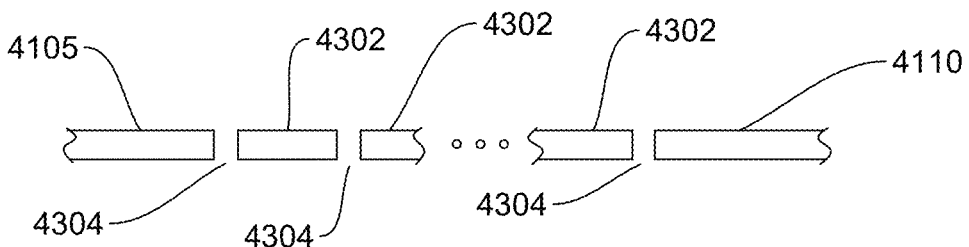
Figure 251B:
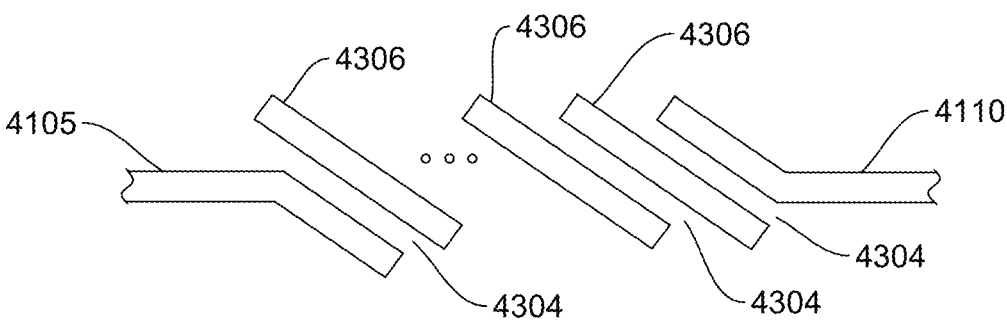

Another filter design employs capacitive gaps in the line, such as is shown in FIG. 251A, where the input and output lines 4105 and 4110 are coupled by way of conductive sections 4302 and gaps 4304. The conductive sections 4302 act as resonators, which can be about one-half of the desired wavelength. Prior capacitive gap filters of this nature were typically limited by insertion loss, resulting in a low Q factor. However, by employing the modified ELR materials described herein, such disadvantages of prior capacitive gap filters are avoided. Again, other geometries are, of course, possible. For example, FIG. 251B shows input and output lines 4105 and 4110 coupled by way of diagonal conductive strips 4306 separated by similar gaps 4304. The angled geometry of FIG. 251B helps reduce surface area needed on the substrate for the filter.

Figure 251C:
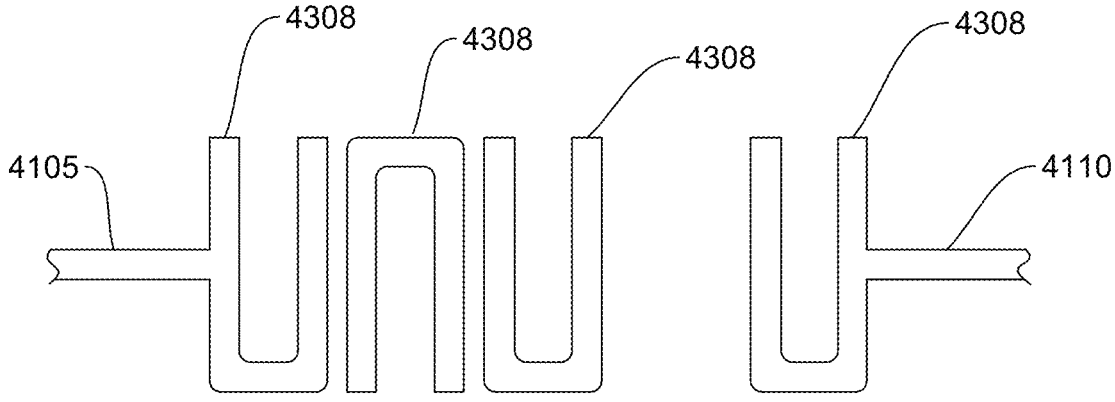

Yet another example is shown in FIG. 251C, which shows a strip line hairpin filter. As shown, the filter includes a series of U-shaped conductive traces or paths 4308 placed in a row, with each path being flipped 180 degrees from its neighbor. In all the examples, ellipses represent the fact that the filters can include more or less paths or elements than those shown.

Many of the planar filters described above incorporate some "conventional" filter concepts, and many other forms are of course possible. Indeed, the principles that govern design of conventional filters, such as microwave filters, can be applied to generating filters employing the modified ELR materials described herein. Further details regarding design of some filters may be found, for example, in N. Lancaster, *Passive Microwave Device Applications of High-Temperature Superconductors* (Cambridge University Press, 1997), e.g. chapter 5.

Delay-line/Slow-wave Transmission Line Filters Having Modified ELR Materials

Other filters include delay-line filters or slow-wave transmission line filters, which can likewise be formed as microstrips, strip lines, coplanar lines, etc., and deposited on one or more substrates, typically dielectric substrates. The thickness of the substrate (described below) can control insertion loss and cross-coupling between adjacent lines, where lines can be packed more closely without coupling to thereby provide longer delays for a given substrate. Delay lines employing the modified ELR materials described herein, provide an exceptionally lossless transmission media, with up to hundreds of nanoseconds of delay for only several decibels of loss.

Figures 252A, 252B, 252C:
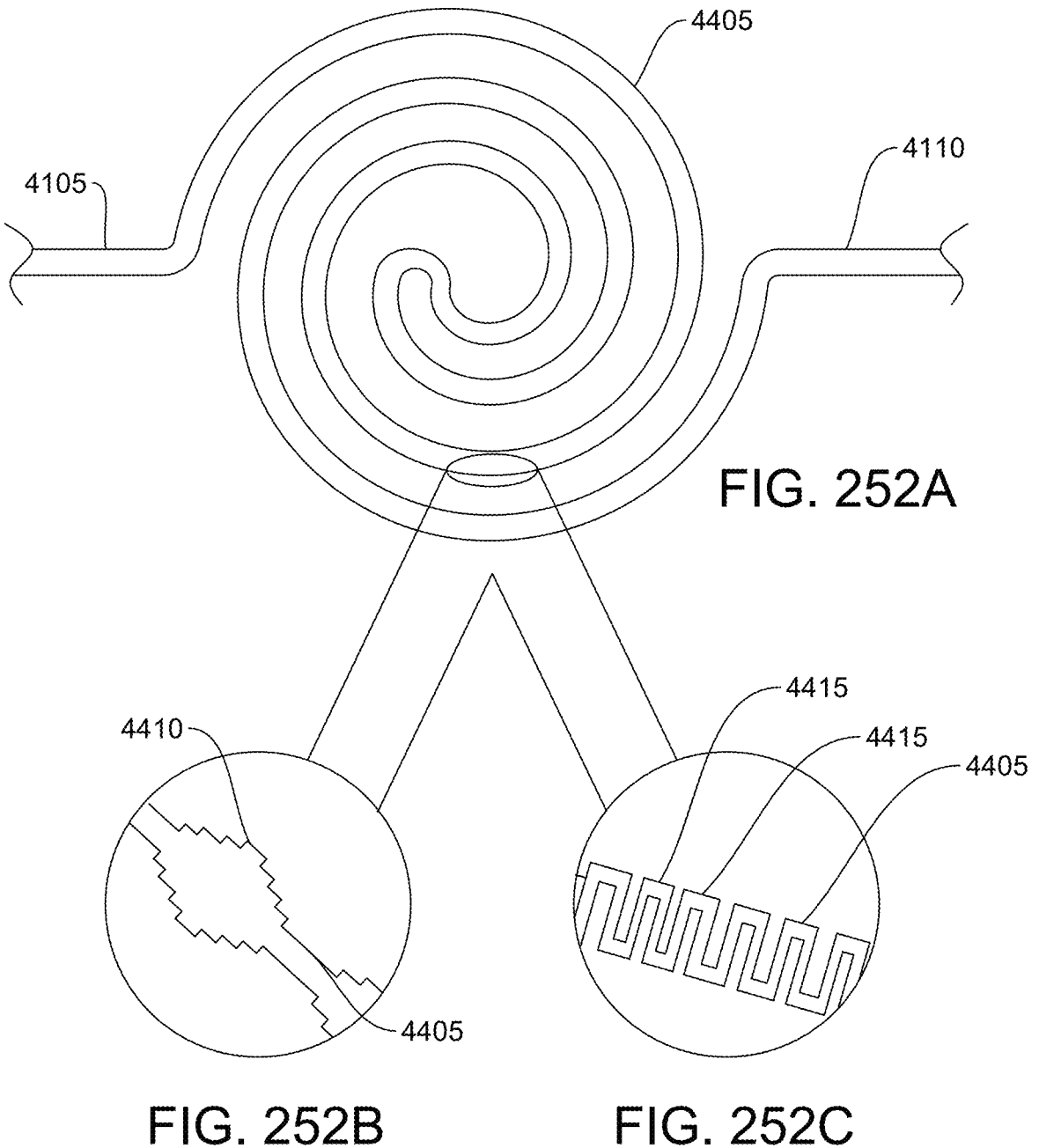

FIG. 252A shows an example of a single transmission line microstrip delay line filter having a coiled conductor 4405 coupled between input and output lines 4105 and 4110. The coiled portion 4405 can have sections of varying impedance, which can produce a filtering response. An example of such variations in impedance is shown as varying thicknesses in FIG. 252B, where the coiled line 4405 has bulges 4410. Each of the step-like portions of the bulges 4410 result in an impulse reflection that provides filtering.

Of course, other geometries may be employed beyond the coil 4405 and series of impedance steps 4410. For example, the delay line filter of FIG. 252A can employ first and second parallel lines, rather than the single line shown, with steps in each line, to thereby produce a dual delay line filter, where a backward propagating wave is generated in the second delay line by a series of couplers (not shown), and forward and backward waves propagate on the two separate lines. To add narrow band filtering, resonant sections can be incorporated within the delay line, such as employing stubs and gaps, as described herein. Overall, narrow-band filters can be manufactured less expensively using short delay lines that employ the modified ELR materials described herein.

FIG. 252C shows another example of a longer meandering path for the coiled line 4405 where individual loops or hairpins 4415 are incorporated into the line 4405. The geometry of FIG. 252C can increase miniaturization of the filter. Indeed, further miniaturization and filtering may be employed where the loops 4415 can include steps like those of 4410 in FIG. 252B. In general, each impedance step causes a reflection of a forward propagating wave, and pass bands occur when reflections interfere constructively, at frequencies where local periods of parts of the delay line are half a wavelength. Further details may be found, for example, in N. Lancaster, et al., "Miniature Superconducting Filters", IEEE Transactions on Microwave Theory and Techniques, Vol. 44, No. 7, 1339 (July 1996).

Filters similar to a delay line filter are filters based on slow-wave transmission lines. Such filters are often similarly formed as long transmission lines with a meandering or looping path, with discrete inductors and capacitors effectively formed along the length of the transmission line, which can cause the line to act in a manner similar to that of discrete or lumped elements. Such transmission line filters act as resonators and allow the filter designer to reduce or attenuate an electromagnetic wave's transmitted velocity via the impedance formed by the capacitance and inductance induced along the length of the transmission line using the narrow gaps between a coplanar ground plane and the transmission line (for capacitance), and a narrowing of the transmission line (for inductance).

Planar Lumped Element Filters Having Modified ELR Materials

Miniaturization of filters can be also realized by creating a planar filter using the modified ELR materials so that the resulting device forms or acts like a lumped element filter. Lumped elements, by definition, are smaller than the wavelength at which they operate and thus lumped element filters can be quite small at high frequencies. Notably, as line widths narrow to achieve greater density, the modified ELR materials described herein overcome some of the losses typically associated with finite resistance of conductors.

Referring to FIG. 253A, an example of a lumped element band-stop filter includes input and output conductive portions 4505 and 4510, with a center conductive portion 4520 separated from the input and output portions by gaps 4515. FIG. 253B shows an enlargement of the central conductive portion 4520, which shows a lower conductive portion 4525 and an upper portion 4530, where the lower portion includes upwardly-extending fingers 4535, while the upper portion includes downwardly-extending fingers 4540. Gaps exist between the fingers to generate a resonator element.

The element of FIG. 253A can operate as a switch, if a bias current is applied to turn the filter into its normal state as an all-pass filter, whereas the resonance provides a band-stop function. Further details may be found, for example, in the book by N. Lancaster, e.g. chapter 5.

Dual-mode filters employing the modified ELR materials are also possible. Referring to FIG. 254, an example of a dual-mode filter is shown. In general, a dual-mode microstrip resonator having a small perturbation splits the degenerate mode of a receive signal. In the example of FIG. 254, input and output terminals 4605 and 4610 coupled to a filter assembly that includes a pair of dual-mode resonators 4615 fabricated as squares having an upper corner 4617 beveled or missing. A conductor 4620 connects the pair of resonating squares 4615, to provide for a Chebyshev filter response. Also adding a second conductor 4625, provides for an elliptic filter response. While solid squares with a beveled corner are shown, other geometries are of course possible, such as circles with a protruding stub, rings, square rings, etc.

Planar filters provide for improved miniaturization at certain frequencies, but further miniaturization can be provided beyond the use of slow wave transmission lines, lumped element components, and serpentine/wandering but packed transmission lines. As noted above, the velocity of a signal can be reduced by increasing the inductance of conducting lines, such as transmission lines, while not increasing associated capacitance. Internal fields within the paths or lines formed of ELR materials increase inductance and benefit from small external inductances, e.g. by employing thin layers of dielectric between a ground plane and signal lines.

Furthermore, using high dielectric constant substrates can further reduce velocity of signals for a given frequency. As noted above, the substrates on which the planar filters are formed affect the output of the filters. Precision planar filters can be manufactured with differing Q factors using certain dielectric materials for the substrate. Many substrates are possible. For example, the substrates may take the form of one or more of the following, either in bulk or deposited on another substrate: amorphous or crystalline quartz, sapphire, aluminum oxide, $LaAlO_3$, $LaGaO_3$, $SrTiO_3$, $ZrO_2$, MgO, $NdCaAlO_4$, $LaSrAlO_4$, $CaYAlO_4$, $YAlO_3$, $NdGaO_3$, $SrLaAlO_4$, $CaNdAlO_4$, $LaSrGaO_4$, $YbFeO_3$. The substrate may be selected to be inert, compatible for growth, deposition or placement of good quality paths formed of modified ELR materials, and have desirable filtering properties described herein. Substrates having high dielectric constant and used with existing or conventional filters, can likewise provide good substrates for filters described herein.

Acoustic Wave Filters Having Modified ELR Materials

The modified ELR materials can be applied to certain substrates, such as piezoelectric substrates, to create surface acoustic wave (SAW) or bulk acoustic wave (BAW) devices. SAW and BAW devices can operate as filters because an acoustic wave traveling along the surface of a certain substrate (for a SAW device) or through a certain substrate (for BAW device) exponentially decays in the substrate. BAW devices disburse energy from one surface of the material, through a bulk or majority of the material, and to another surface, and these devices can minimize the amount of energy density on the surface; SAW devices instead focus energy on a surface of the material, which can make such devices more sensitive.

Figure 255:
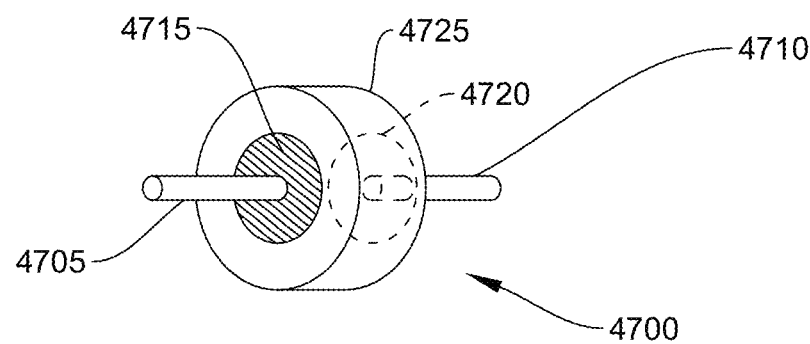

An example of an acoustic wave device 4700 is shown in FIG. 255, which may be employed in a filter or as a resonating circuit. The device 4700 is a BAW device that includes an input line 4705 and output line 4710, which are respectively coupled to an input electrode 4715 and output electrode 4720. The lines and electrodes can be constructed of or include the modified ELR materials described herein. The electrodes have sandwiched there between a piezoelectric material 4725. The material 4725 can be made of quartz, lithium tantalate, lithium niobate, gallium arsenide, silicon carbide, langasite, zinc oxide, aluminum nitride, lead zirconium titanate, polyvinylidene fluoride, or other materials. Quartz is often preferred because a filter designer can select a temperature dependence of the material based on a cut angle of the quartz.

The device 4700 may be referred to as a shear mode resonator because a voltage applied between the electrodes 4715 and 4720 results in a shear deformation of the material 4725. The material resonates as electromechanical standing waves are created, and displacement is maximized at the faces of the material on which the electrodes are placed. While shown as a disc in FIG. 255, any other configuration is, of course, possible, such as plate. If constructed as a plate, the device 4700 may operate as a shear-horizontal acoustic plate mode sensor having a relatively thin piezoelectric substrate sandwiched between two plates, one of which includes an interdigitated transducer (discussed below).

Figure 256:
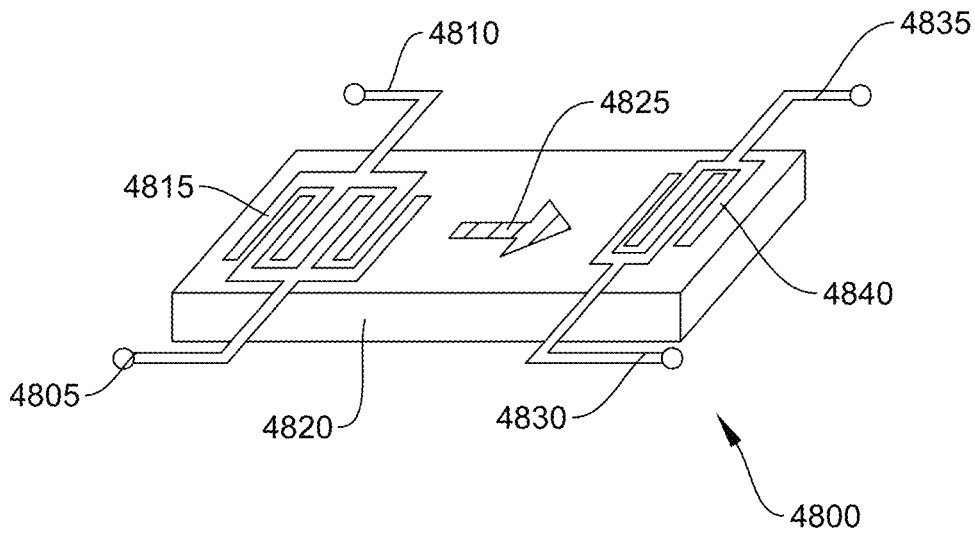

Another acoustic wave device is shown in FIG. 256 as surface acoustic wave device 4800. The device 4800 includes a pair of input lines 4805 and 4810 that input a voltage to an input transducer 4815 formed on a substrate material 4820. The substrate material 4820 can be formed of any of the above materials described with respect to the material 4725 for the device 4700. By applying a voltage to the input transducer 4815, the input transducer converts electric field energy into mechanical wave energy 4825 in the form of an acoustic wave that travels to an output transducer 4840 that has output terminals 4830 and 4835. The output transducer then converts the received mechanical energy back into an electric field that is applied to the output terminals 4830 and 4835. The input and output transducers 4815 and 4840 may be formed as interdigitated transducers, which can be interlocking fingers of conductive material, such as the ELR materials described herein, applied to the surface of the substrate material 4820.

The acoustic waves are distinguished primarily by their velocities and displacement directions, and many combinations are possible depending on the material employed for the material 4725 or substrate material 4820. (Boundary conditions also affect propagation of the acoustic wave.) The sensitivity of the devices 4700 and 4800 is often proportional to an amount of energy generated by the input, sensed by the output, and carried by the intervening material. By using modified ELR materials described herein, improved acoustic wave devices can be realized, since, for example, losses at the input and output of the devices is greatly minimized.

SAW devices are often used with radio frequency filters, where a delayed output at the output terminals is recombined to produce a finite impulse response filter or sampled filter. BAW devices can be used to implement lattice or ladder filters.

Cavity Filters Having Modified ELR Materials

Figure 257:
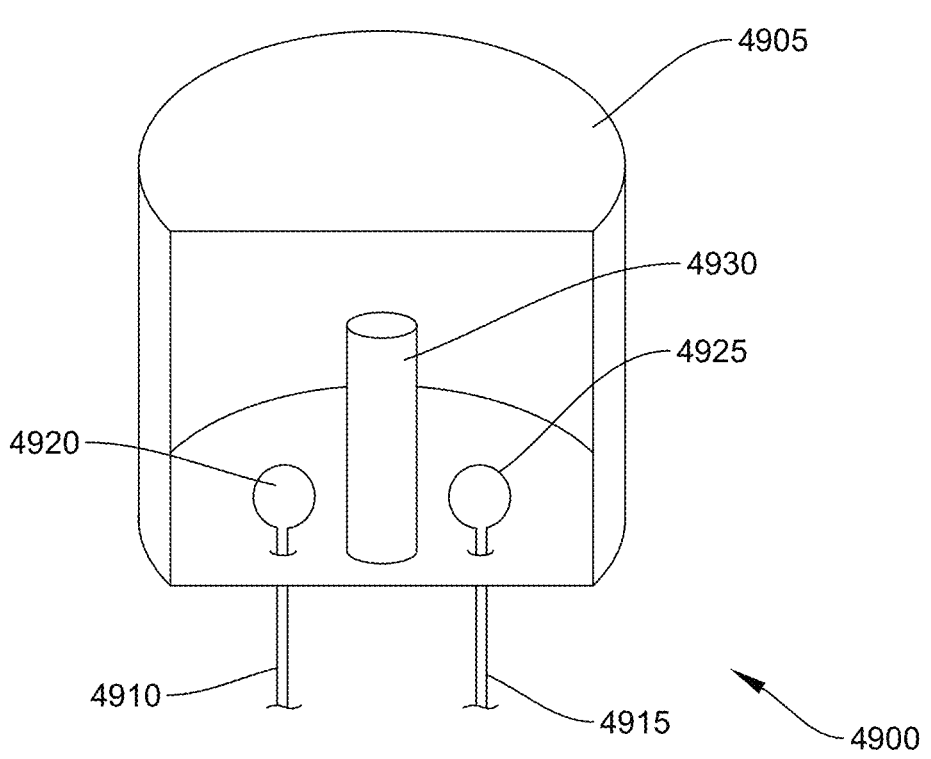

While the above filters are generally described as employing modified ELR materials deposited as planar conductive paths, stripline traces, etc., the geometries need not be planar. Instead, the modified ELR materials can be employed in multiple three dimensional configurations, such as part of coaxial arrangements, wave guides, or other structures. One example is to use the modified ELR materials in cavity filters, a simple example of which is shown in FIG. 257. Cavity filters pass a desired frequency, while rejecting other frequencies, and as thus act as bandpass or notch filters. Cavity filters are also employed as duplexers.

As shown, the cavity filter 4900 includes input and output lines 4910 and 4915, coupled respectively to input and output loops 4920 and 4925. The loops are placed within a cavity 4905, which is shown as a cylinder with a front-facing portion cutaway. The cavity also includes a resonator, shown as a central cylinder 4930. The central resonator is typically a dielectric element that is tunable by a tuning element (not shown) to adjust a capacitance or impedance of the element and thereby generate a desired resonance between a capacitance of the central portion 4930 and an inductance of the loops 4920, 4925.

The cavity 4905 helps contain an oscillating electromagnetic field, but losses occur within the cavity filter 4900. These losses are typically due to a finite conductivity of the walls of the cavity. By fabricating the cavity 4905 from the modified ELR materials described herein, such losses may be greatly minimized, thereby reducing decay of the oscillating field generated by the cavity filter 4900. In some examples, the cavity can be simply be formed from a conductive or dielectric cylinder coated with a thick film formed of the modified ELR material.

Further, two or more of the cavity filters can be coupled together and link, such as by coupling apertures or an internal split ring resonator, such as one formed from a thick film of the modified ELR material. Such cavity filters joined together can produce more accurate filter responses, such as for use by microwave filters or with other wireless transmission systems. While the cavity 4905 is shown as having a cylindrical configuration, many other configurations are possible, although modeling behavior of a cylinder is simpler than other more complex cavity geometries.

Furthermore, other types of cavity resonators are possible, such as dielectric resonators where, for example, the cylinder 4930 is formed of a dielectric material, and is coupled to or rests on the modified ELR materials at its base, all within the cavity 4905. By decreasing the length or height of the cavity and placing the resonator onto a film formed of the modified ELR material, the resonator need not be suspended within the cavity. Another type of cavity resonator may be a coaxial cavity resonator, a helical cavity resonator, cavities constructed with microstrip and stripline conductors, or coplanar resonators. Further details regarding such resonators may be found in the above-cited book by N. Lancaster, Chapter 3.

Additional Filters Having Modified ELR Materials or Suitable Implementations

The filters described above may be particularly suited for use in communications networks and devices, such as radio frequency, cellular, optical and microwave communications. As noted above, by employing a modified ELR material in such filters, the filters provide resistance at orders of magnitude less than the best common conductors under similar conditions, thereby resulting in exceptionally high filter gain-gains approaching that of an ideal filter. Further, such filters can be fabricated in smaller and more compact forms.

Indeed, many of the filters described above can be formed using microstrip technology on substrates, including wafer substrates, SiP substrates, etc. Thus, many of the filters can be fabricated using thin-film manufacturing techniques, many of which are described herein, and all of which are common with semiconductor chip fabrication. Many of the filters employing the modified ELR materials may be manufactured as single-layer devices, and thus the processing steps for creating such filters are simplified to include only: photolithography, ion milling, contact metallization, and dicing (or equivalents thereof). In some examples, the chip may be fabricated with some of the smallest scale manufacturing techniques, such as 1.3 nanometer scale technology, which may leave greater room on the chip for additional filters or other circuitry. With greater densification, circuit designers have less restriction based on layout or distance issues, which can allow for quicker chip design, among other benefits.

Some of the filters described herein may be monolithically integrated on a single chip, often with other components, such as RF components, analog circuitry, etc. By employing on-chip filters, the chip may obviously benefit from improved performance. By employing the modified ELR materials within the chip, the chip may enjoy greater density of circuitry, among other benefits. For example, by employing the modified ELR materials, the chip may operate with less heat loss, and can employ thinner lines. With less current traveling over each line, EMF effects on neighboring lines, on the filter, and on other circuits may be reduced. Interconnects, may also be fabricated from the ELR materials. Moreover, signals may be transmitted without amplification, since line losses are greatly reduced.

As noted above, the modified ELR material has a performance that is dependent on temperature. As a result, the filters described herein employing the modified ELR material are likewise dependent on temperature. Temperature variation affects field penetration into strip conductors, and which affects superconducting penetration depth, as described above. Such variations of the modified ELR material can be modeled based on the temperature versus response behavior for the modified ELR materials as described herein, or can be empirically derived. Notably, by employing the modified ELR materials, the resistance of the line is negligible, but that resistance can be adjusted based on temperature, as shown in the temperature graphs provided herein. Therefore, the filter design can be adjusted to compensate for temperature, or the filter output can be adjusted by varying the temperature.

Figure 258:
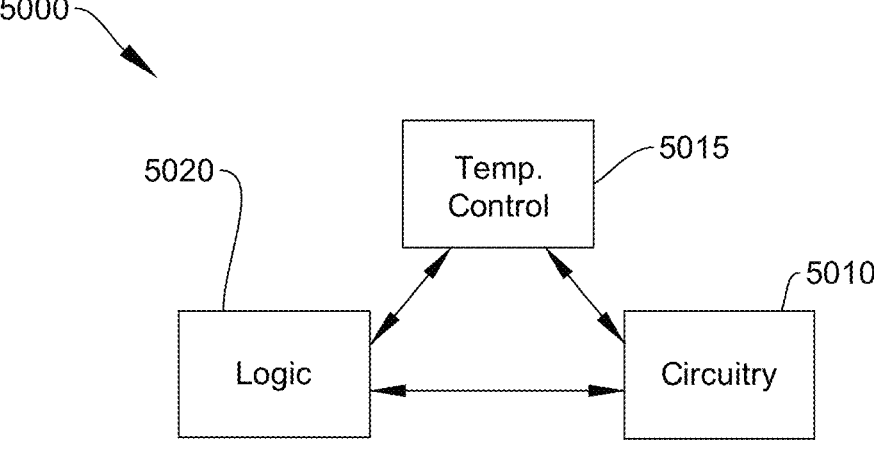

Referring to FIG. 258, an example is shown of a system 5000 that includes circuitry 5010 coupled to a temperature control circuit 5015, and logic 5020. (While blocks are shown as interconnected in FIG. 258, fewer or more connections are possible.) The circuitry 5010 employs one or more of the filters described herein, which are at least partially formed from the modified ELR material. The logic controls the temperature control circuitry, which in turn controls a cooler/refrigerator that cools the circuitry 5010. Thus, to increase the sensitivity or response of the system 5000, the logic 5020 signals the temperature control circuit 5015 to decrease the temperature of the circuitry 5010. As a result, the circuitry 5010 employing the ELR material causes the modified ELR material to increase conductivity, thereby increasing the circuit's sensitivity or response.

While certain filters have been generally described herein, many other filters are possible. For example, the modified ELR materials may be incorporated into tunable filters, in addition to the cavity resonators and other filters described above. The modified ELR materials may be implemented in switched-capacitor filters, or even garnet filters, atomic filters or other analog filters.

While individual filters are shown, filters may be joined together to form filter banks, multiplexers, or other more complex filter systems, signal conditioners, or arrays. As with the other categories of filters discussed herein, many configurations of filter arrays are possible and are design considerations for a filter designer implementing a filter array or multi-filter system that is at least partially formed from the modified ELR material. The modified ELR materials described herein may be used in complex filter systems that comprise a combination of two or more of the filters and principles described herein, even if those combinations are not explicitly described. Indeed, such complex filter systems may employ two or more dissimilar or heterogeneous filters, not simply similar or homogenous filters. Such a filter system or array can include relatively homogenous filters all formed of the modified ELR material, or a heterogeneous mix of different types of filters, some filters formed of non-ELR material, or a combination of differing filters and differing materials. Thus, complex filter systems or arrays may employ two or more filters formed of two or more homogeneous filters formed primarily of the modified ELR material, two or more heterogeneous filters formed primarily of the modified ELR material, and/or two or more homogeneous/heterogeneous filters formed of both conventional conductors and the modified ELR material.

Although specific examples of filters that employ components formed partially or exclusively from modified ELR materials are described herein, one having ordinary skill in the art will appreciate that virtually any filter configuration may employ components that are formed at least partially from modified ELR materials, such as those components listed above, e.g., to conduct electrical currents, receive signals, or transmit, or modify, or condition electromagnetic signals. Known filters and filter systems widely employ conductive elements and other elements, some of which are listed above. (While the modified ELR material may be used with any conductive elements in a circuit, it may be more appropriate to state, depending upon one's definition of "conductive" that the modified ELR material facilitates propagation of energy or signals along its length or area.) As a result, it is impossible to enumerate in exhaustive detail all possible filters and filter systems that may employ components that are formed from modified ELR materials.

While some suitable geometries are shown and described herein for some filters, numerous other geometries are possible. These other geometries include different patterns, configurations or layouts with respect to length and/or width, in addition to differences in thickness of materials, use of different layers, and other three-dimensional structures. The inventors contemplate that virtually all filters and associated systems known in the art may employ modified ELR material and believe that one having ordinary skill in the art who is provided with the various examples of ELR materials, filters, and principles in this application would be able to implement, without undue experimentation, other filters with one or more components formed in whole or in part from the modified ELR materials, although some novel advantages of modified ELR might not be obvious without due diligence to experience these inventions herein described.

In some implementations, a filter that includes modified ELR materials may be described as follows:

A filter, comprising: a substrate; a conductive input line formed on the substrate, wherein the conductive input line is configured to receive an input signal; a conductive output line formed on the substrate, wherein the conductive output line is configured to output a filtered signal; and, one or more conductive paths formed on the substrate, wherein the one or more conductive paths are formed between the conductive input line and the conductive output line and provide electromagnetic coupling between the conductive input line and the conductive output line, wherein the one or more conductive paths include a geometry formed to provide a filtering function for the received input signal, wherein the filtering function is at a desired frequency or range of frequencies, wherein at least part of the conductive input line, the conductive output line, or the one or more conductive paths are formed of a modified extremely low resistance (ELR) path, and, wherein the modified ELR path is formed of a first layer comprised of an ELR material and a second layer comprised of a modifying material bonded to the ELR material of the first layer.

A method of manufacturing a filter, the method comprising: forming a conductive path on a substrate using a modified extremely low resistance (ELR) film, wherein the modified ELR film includes a first layer comprised of an ELR material and a second layer comprised of a modifying material bonded to the ELR material of the first layer; wherein the conductive path includes a geometry configured to filtering function a received electromagnetic signal, and wherein the filtering of the received signal is for at least one desired frequency or range of frequencies.

A filter, comprising: one or more conductive paths formed on a substrate, wherein the one or more conductive paths include a geometry formed to provide a filtering function for a received input signal, wherein the filtering function is at a desired frequency or range of frequencies, wherein at least part of the one or more conductive paths are comprised of a conductive material formed of a first portion comprised of an ELR material and a second portion comprised of a modifying material chemically bonded to the ELR material of the first portion.

A filter, comprising: a substrate; and a meandering conductive path formed on the substrate—wherein the meandering conductive path comprises multiple turns formed in a substantially continuous length of the meandering conductive path to form a delay line or slow transmission line filter, wherein the meandering conductive path comprises modified extremely low resistance (ELR) film for providing extremely low resistance to an input electromagnetic signal, and, wherein the modified ELR film includes a first layer comprised of an ELR material and a second layer comprised of a modifying material bonded to the ELR material of the first layer.

A filter, comprising: at least two electrical elements coupled in series or in parallel, wherein at least one of the electrical elements is an inductive element or a capacitive element; wherein the inductive element stores energy in a magnetic field and comprises a modified extremely low resistance (ELR) material configured into a loop or coil shape, and wherein the capacitive element stores energy in an electric field and comprises the modified extremely low resistance (ELR) material configured into at least two, spaced apart conductors, and wherein the modified ELR material is formed of a first portion comprised of an ELR material and a second portion comprised of a modifying material bonded to the ELR material of the first portion.

A filter element, comprising: a piezoelectric material; an input conductor formed on a first portion of the piezoelectric material; and, an output conductor formed on a second portion of the piezoelectric material, wherein the first and second portions are spaced apart from each other to provide a separating area of the piezoelectric material, wherein at least one of the input and output conductors includes a modified extremely low resistance (ELR) material, wherein the modified ELR material is formed of a first portion comprised of an ELR material and a second portion comprised of a modifying material bonded to the ELR material of the first portion.

A filter element, comprising: a first and second conductive loops; a resonator; and a conductive enclosure for enclosing the first and second conductive loops and the resonator, wherein the conductive enclosure is configured to resonate an electromagnetic wave of at least one frequency, wherein at least one of the resonator, conductive enclosure and first and second conductive loops are at least partially formed from a modified extremely low resistance (ELR) material, wherein the modified ELR material is formed of a first portion comprised of an ELR material and a second portion comprised of a modifying material bonded to the ELR material of the first portion.

A filter system, comprising: multiple filter elements, wherein each filter element comprises—one or more conductive paths formed on a substrate, wherein the one or more conductive paths include a geometry formed to provide a filtering function for a received input signal, wherein the filtering function is at a desired frequency or range of frequencies, wherein at least part of the one or more conductive paths are comprised of a first material formed of a first portion comprised of an ELR material and a second portion comprised of a modifying material chemically bonded to the ELR material of the first portion, and wherein each of the one or more conductive paths collectively provide a combined filter function.

A system, comprising: an antenna; logic or analog circuitry; and at least one filter element coupled among the antenna and the logic or analog circuitry, wherein the filter element comprises-one or more conductive paths, wherein the one or more conductive paths include a geometry formed to provide a filtering function for a received input signal, wherein the filtering function is at a desired frequency or range of frequencies, wherein at least part of the one or more conductive paths are comprised of a conductive material formed of a first portion comprised of an ELR material and a second portion comprised of a modifying material bonded to the ELR material of the first portion.

Chapter 14—Antennas Formed of ELR Materials

This chapter of the description refers to FIGS. 1-36 and FIGS. 259-280; accordingly all reference numbers included in this section refer to elements found in such figures.

Various types of antennas employing extremely low resistance (ELR) films and materials, such as modified, apertured, and/or other new ELR materials, are described herein. For some types of antennas described below, the antennas include a substrate on which a film, tape, foil, wire, nanowire, trace or other conductor is formed or placed, and where the film, tape, foil, wire, nanowire, trace or other conductor employs a modified ELR. Other types of antennas are constructed where certain components of the antennas employ the modified ELR material. In some examples, the modified ELR materials are manufactured based on the type of materials, the application of the modified ELR material, the size of the component/element employing the modified ELR material, the operational requirements of a device or machine employing the modified ELR material, and so on. As such, during the design and manufacturing of an antenna, the material used as a base layer (e.g., the unmodified ELR material) of a modified ELR material and/or the material used as a modifying layer of the modified ELR material may be selected based on various considerations and desired operating and/or manufacturing characteristics.

Figure 259:
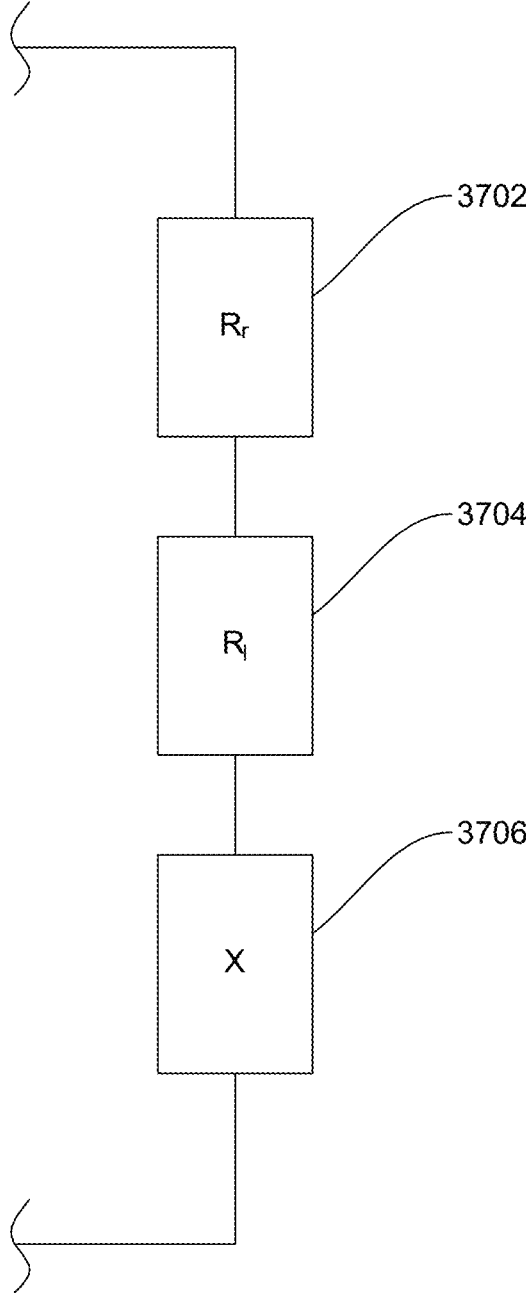
FIGS. 259 to 280 illustrate the forming of antennas using ELR materials.

FIG. 259 is a schematic diagram of an equivalent circuit of an antenna. The equivalent circuit for an antenna can be modeled as a series combination of radiation resistance 3702, loss resistance 3704, and a reactance 3706. For example, the reactance of the short dipole antenna can be modeled as a capacitance and the reactance of the small loop antenna can be modeled as an inductance. The radiation resistance 3702 can be considered to be an equivalent resistance, such that any power dissipated in it will actually represent power radiated. The loss resistance 3704 is due to the conductor losses in an antenna element itself.

As the size of an antenna (relative to wavelength) decreases, the loss resistance and radiation resistance also decrease. However, the radiation resistance decreases much more rapidly. At some point, particularly in electrically small antennas, the loss resistance will be more dominant than the radiation resistance and the antenna will become too inefficient to be practical. But, forming the antenna element from a modified ELR material will reduce the loss resistance and will allow for smaller antennas to be more efficient, among other benefits.

There are various rules of thumb for considering an antenna to be electrically small. The most common, but not exclusive, definition is that the largest dimension of the antenna is no more than one-tenth of a wavelength (i.e., A). Thus, a dipole with a length of $\lambda/10$, a loop with a diameter of $\lambda/10$, or a patch with a diagonal dimension of $\lambda/10$ would be considered electrically small. This definition makes no distinction among the various methods used to construct electrically small antennas. In fact, most work on these antennas involves selecting topologies suitable for specific applications, and the development of integral or external matching networks.

In some examples, the antenna elements of a short dipole or a small loop antenna can be a film, tape, foil, wire, nanowire, trace or other conductor formed or placed on a substrate, and where the film, tape, foil, wire, nanowire, trace or other conductor employs the modified ELR material. Antennas particularly suited for employing the modified ELR materials described herein are microstrip antennas, which can be conductive traces formed on a dielectric substrate, such as a printed circuit board; however, microstrip antennas may be fabricated at much smaller scales and on smaller substrates, even employing semiconductor manufacturing processes and other nanoscale technologies.

Figure 260:
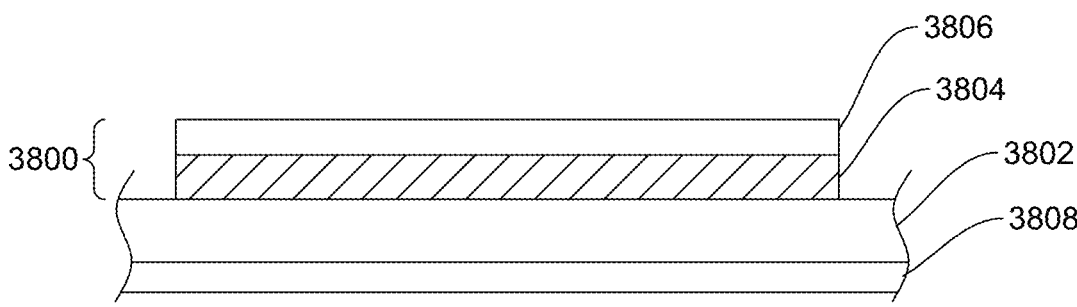

FIG. 260 is a diagram illustrating a cross section of a microstrip antenna element 3800 formed, at least in part, of a modified ELR material, such as a film having an ELR material base layer and a modifying layer formed on the base layer. Various suitable films formed from modified ELR materials are described in detail herein. As shown in the example of FIG. 260, the antenna element 3800 includes an ELR material base layer 3804 and a modifying layer 3806 formed on the base layer 3804. The antenna element can be formed on a substrate 3802, for example, a printed circuit board, the dielectric substrate of an integrated circuit, or any other dielectric material (including air). A ground plane 3808 is disposed on the opposite side of the dielectric substrate 3802. In some examples, the ground plane can also be formed of a modified ELR material. Being formed of a modified ELR material, the antenna element 3800 provides little or no resistance to the flow of current in the conductive path at temperatures higher than those used in conventional HTS materials, such as 150 K, room or ambient temperatures (294 K), or other temperatures described herein.

The material or dimensions of the substrate 3802 may be selected based on a variety of factors. For example, selecting a substrate material based on its dimensions and dielectric constant can help match the input impedance of the antenna to the impedance of the system or can improve the bandwidth and efficiency of the antenna. One skilled in the art will appreciate the substrate may be formed of a number of different materials and into a number of different shapes in order to achieve certain desired properties and/or operating characteristics.

Many substrate materials are possible. For example, the substrates may take the form of one or more of the following, either in bulk or deposited on another substrate: amorphous or crystalline quartz, sapphire, aluminum oxide, $LaAlO_3$, $LaGaO_3$, $SrTiO_3$, $ZrO_2$, MgO, $NdCaAlO_4$, $LaSrAlO_4$, $CaYAlO_4$, $YAlO_3$, $NdGaO_3$, $SrLaAlO_4$, $CaNdAlO_4$, $LaSrGaO_4$, $YbFeO_3$. The substrate may be selected to be inert, compatible for growth, deposition or placement of good quality modified ELR materials, and have desirable properties described herein. Substrates having high dielectric constant and used with existing or conventional antennas, can likewise provide good substrates for antennas described herein.

Figure 261:
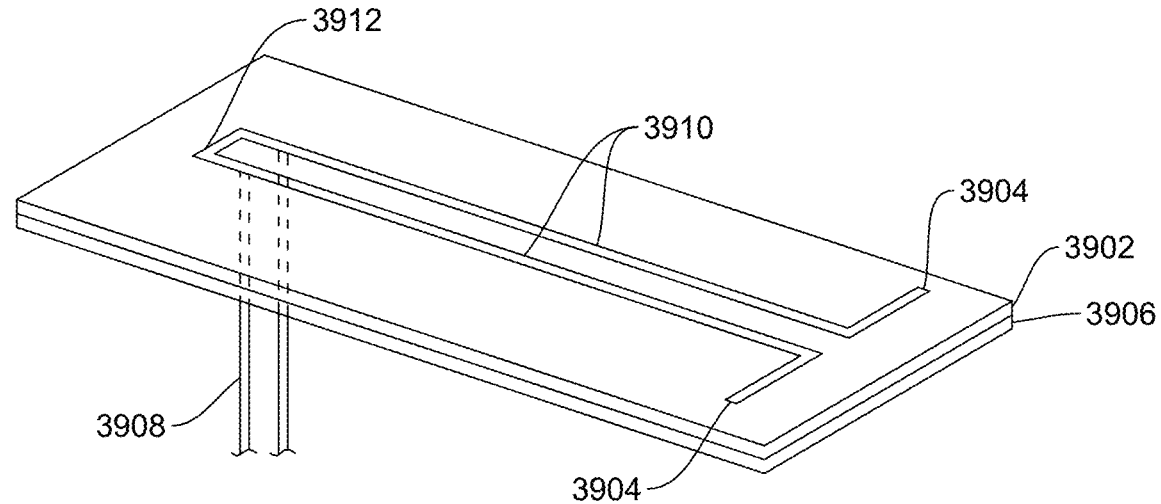

FIG. 261 is a diagram illustrating a short dipole antenna, and its corresponding matching network, formed of a modified ELR material. The antenna and the matching network are formed from a modified ELR material on dielectric substrate 3902. A ground plane 3906 is formed on the other side of the dielectric substrate 3902. In some examples, the ground plane is also formed of a modified ELR material. The antenna comprises runners 3904 which are connected to a system feed line 3908 through conductive paths 3910. The conductive paths 3910 along with the stub section 3912 form the matching network for the dipole antenna. Of course, many other antenna and matching network configurations are possible and are design considerations for a designer implementing a small dipole antenna formed of modified ELR material.

Figure 262:
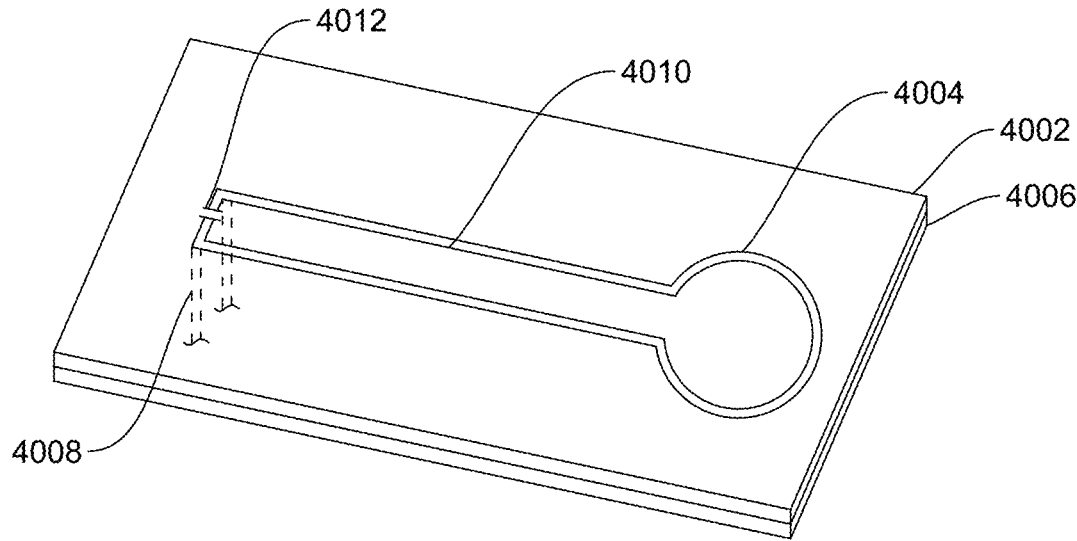

FIG. 262 is a diagram illustrating a small loop antenna, and its corresponding matching network, formed of a modified ELR material. The antenna and the matching network are formed from a modified ELR material on dielectric substrate 4002. A ground plane 4006 is formed on the other side of the dielectric substrate 4002. In some examples, the ground plane is also formed of a modified ELR material. The antenna comprises a loop of modified ELR material 4004, which is connected to a system feed line 4008 through conductive paths 4010. The conductive paths 4010 along with the capacitor 4012 form the matching network for the dipole antenna. Although the capacitor of FIG. 262 is shown as a discrete element, the capacitance of the matching network can also be formed using microstrip line principles.

While the small loop and dipole antennas above are described as being formed on a substrate using microstrip line technology, other techniques can be used to implement an antenna structure of modified ELR material. For example, a loop or dipole antenna can be formed from a modified ELR nanowire without being placed on a substrate.

Figures 263, 264, 265:
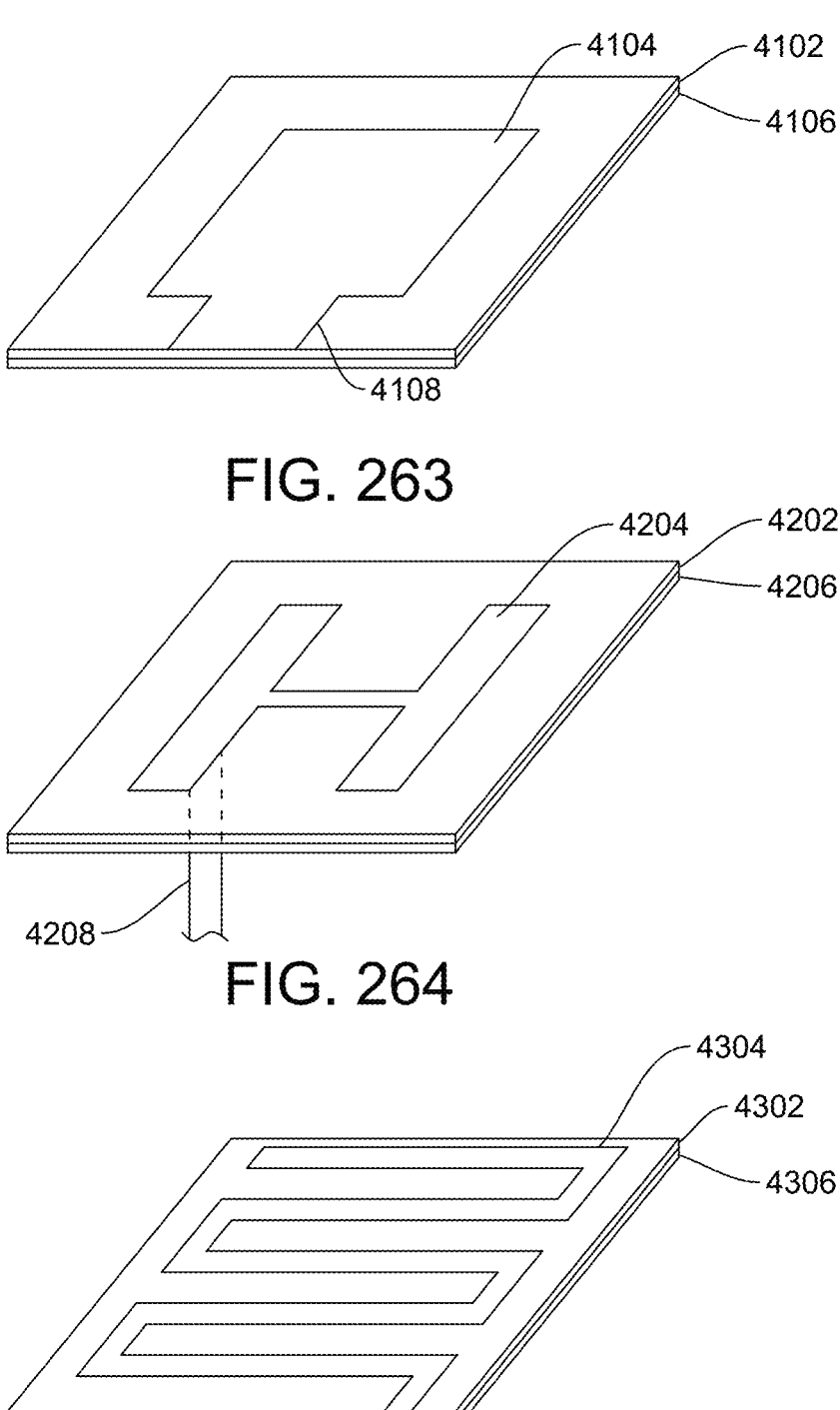

FIGS. 263-265 are other examples of microstrip antennas. As with the dipole and loop antennas described above, microstrip antennas, which have been miniaturized for use in mobile applications, are less efficient than larger patch antennas due to resistive losses. Forming the antenna elements of modified ELR materials reduces those resistive losses such that smaller antenna structures are sufficiently efficient. FIG. 263 is an example of a typical microstrip patch antenna. The antenna is formed on a dielectric substrate 4102, which separates the antenna element 4104 from the ground plane 4106. In the example of FIG. 263, the signal is fed to/from the antenna through an edge feed network 4108. One of ordinary skill will appreciate that other feed network configurations can be used, e.g., probe feed, inset edge feed, probe feed with a gap, edge feed with a gap, two layer feed, and aperture coupled feed, among others.

FIG. 264 is an example of a microstrip H-antenna, which compared to an ordinary patch antenna, can be significantly smaller while exhibiting similar operating characteristics. The antenna is formed on a dielectric substrate 4202 which separates the antenna element 4204 from the ground plane 4206. The H-antenna, in the example of FIG. 264, is fed by a probe feed network 4208 but can be fed by any number of suitable feed networks.

FIG. 265 is an example of a meander line antenna. As the name suggests the antenna element 4304 is formed in a meandering line on the substrate 4302 which separates the antenna element from the ground plane 4306. A meander line antenna can be designed to be a very small, narrow frequency antenna or can be designed to be a higher bandwidth antenna having multiple resonant frequencies.

Of course, many other antenna and matching network configurations are possible and are design considerations for a designer implementing an antenna formed of modified ELR material. Indeed, the principles that govern design of conventional antennas and matching networks can be applied to generating antennas employing the modified ELR materials described herein. Thus, while some antenna geometries are shown, many others are of course possible.

While generally described above as an electrically small antenna, the invention includes any type of antenna, not necessarily electrically small antennas. For example, any of the antennas described above (and below) may have a length of conductor at least partially formed from the modified ELR material. Alternatively or additionally, the modified ELR material may be formed or coated along the length of the conductor, or along any rigid, elongated structure having a geometry necessary for providing the functions of an antenna. Such a structure can be formed of a conductive material, a dielectric material, or both conductive and dielectric materials.

While some suitable geometries are shown and described herein for some antennas, numerous other geometries are possible. These other geometries include different patterns, configurations or layouts with respect to length and/or width in addition to differences in thickness of materials, use of different layers, and other three-dimensional structures.

Resonant Antennas Having Modified ELR Materials

A resonant antenna is an antenna that operates well at a single frequency or a narrow range of frequencies. Resonant antennas are typically in the range of one-half of a wavelength in length. As described above, electrically larger antennas are relatively efficient when compared with miniaturized versions of themselves. Resonant antennas made of conventional conductive materials are more efficient than miniaturized antennas used at the same frequency. However, performance improvements, such as higher radiation efficiency and stronger gains can still be achieved by implementing or modifying resonant antenna structures with modified ELR materials.

Resonant antennas can be configured in an almost limitless number of configurations. For example, microstrip antennas, similar to the antennas discussed above with reference to FIGS. 263-265, can operate as resonant antennas at a particular frequency, where the resonant frequency of the antenna is dependent on the size of the antenna element.

Figure 266:
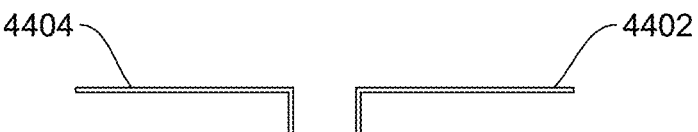

In addition to substrates, in some examples, resonant antennas are formed from wires, or other conductors not formed on a substrate. FIG. 266 is a diagram of an example dipole antenna formed of modified ELR material. The example antenna of FIG. 266 includes two open circuited conductors 4402 and 4404, formed of a modified ELR material, coupled with a feed network (not shown). In some examples, a half-wave dipole can be formed of a single conductor with a length of one-half of a wavelength, where the feed network is coupled with the conductor at the center point. In other examples, the length of the conductor or conductors can be adjusted, relative to wavelength, with the effect of changing the radiation pattern of the antenna.

Figure 267:
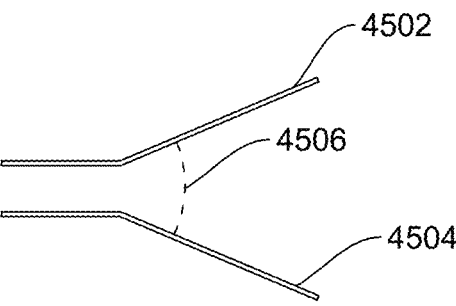
Figure 268:
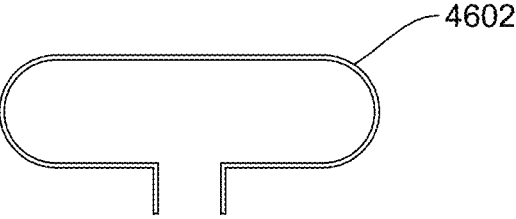

FIG. 267 is a diagram of an example vee dipole antenna formed of modified ELR material. The vee dipole is formed of two open circuited conductors 4502 and 4504, e.g., an open circuited transmission line, where the conductors are positioned relative to each other at an angle 4506. FIG. 268 is a diagram of an example folded dipole antenna formed of modified ELR material. The folded dipole is formed of a single conductor 4602 in a narrow loop.

Of course, many other antenna configurations are possible and are design considerations for a designer implementing a resonant antenna formed of modified ELR material. Indeed, the principles that govern design of conventional antennas and matching networks can be applied to generating antennas employing the modified ELR materials described herein. Thus, while some antenna geometries are shown, many others are of course possible.

Broadband Antennas Having Modified ELR Materials

Broadband antennas, those which operate effectively over a wide range of frequencies, can also benefit from being formed of modified ELR material. As with the other antennas discussed above, broadband antennas suffer from losses due to the resistance of the materials used to form the antenna elements. The loss in the antenna element of a broadband antenna is typically a function of frequency and limits the effectiveness of the antenna at low frequencies. If the resistance of the antenna element is reduced by forming the antenna element of a modified ELR material, then the antenna is more effective at a wider range of frequencies.

Figure 269:
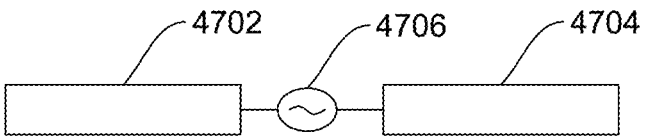
Figure 270:
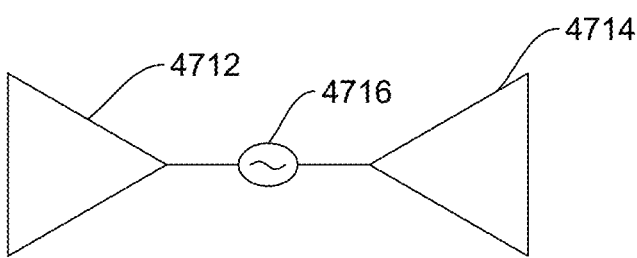
Figure 271:
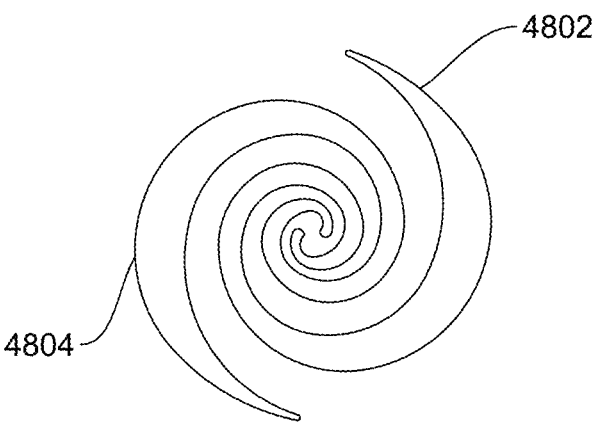

FIG. 269 is a diagram of an example ribbon dipole antenna formed of modified ELR material. The ribbon dipole includes a pair of wide, flat conductors 4702 and 4704 connected to a transmitter/receiver/transceiver 4706. The width of the conductors improves the bandwidth of the antenna over the traditional dipole antenna described above. In some examples, the width of the conductor can vary, further improving the bandwidth of the antenna. For example, the bowtie antenna of FIG. 270 includes a pair of conductors 4712 and 4714 that become wider as they get farther from the transmitter/receiver/transceiver 4716. The effective bandwidth of both the ribbon and bowtie antennas can be increased by forming the antenna elements from modified ELR material. In some examples, the antenna elements are formed on a dielectric substrate as described herein.

Other configurations of antenna elements further improve bandwidth. For example, the spiral antenna of FIG. 271 includes a pair of complimentary antenna elements 4802 and 4804 which yield extremely wide bandwidth. As with the other broadband antennas discussed herein, the effective bandwidth can be further increased by forming the elements of the spiral antenna from modified ELR materials.

Of course, as with the other categories of antennas discussed herein, many configurations of broadband antennas are possible and are design considerations for a designer implementing a broadband antenna formed of modified ELR material. Indeed, the principles that govern design of conventional broadband antennas and can be applied to generating antennas employing the modified ELR materials described herein. Thus, while some antenna geometries are shown, many others are of course possible.

Aperture Antennas Having Modified ELR Material

Another antenna structure that can benefit from being formed, or partially formed, from modified ELR materials is an aperture antenna. Part of the structure of an aperture antenna is an antenna aperture through which electromagnetic waves flow. An aperture antenna operating as a receiver collects waves through the aperture. Typically, aperture antennas are the antenna of choice for applications which require very high gain. As with the other antennas discussed herein, conventional aperture antennas suffer from ohmic losses due to the resistance of the materials used to form the antenna structure. Forming the antenna structure from modified ELR materials reduces these ohmic losses and improves the efficiency of the antenna.

Figure 272:
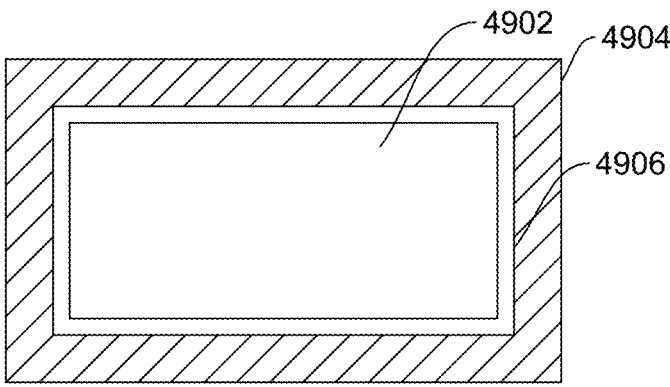

FIG. 272 is a diagram of a cross section of an antenna aperture formed of modified ELR material. The antenna aperture 4902 is defined by ELR material base layer 4904 and a modifying layer 4906 formed on the base layer. While the antenna aperture 4902 in the example of FIG. 272 is shown as a rectangle, one of ordinary skill will appreciate that the antenna aperture can be defined in other geometric shapes based on known design principles.

Figure 273:
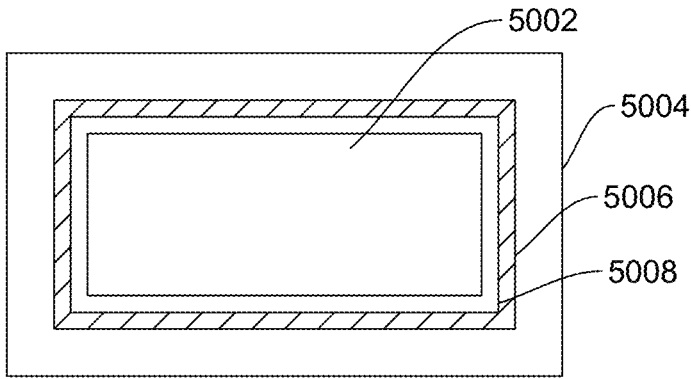

FIG. 273 is a diagram of a cross section of an antenna aperture partially formed of modified ELR material. In the example of FIG. 273, the antenna aperture 5002 is defined by a conventional material 5004, for example, aluminum or a dielectric layer. Because the electromagnetic waves propagate on the inside of the antenna aperture, the antenna aperture can be lined with modified ELR material to reduce the ohmic losses associated with the conventional material. The modified ELR material includes an ELR material base layer 5006 and a modifying layer 5008 formed on the base layer.

In some examples (not otherwise illustrated), different arrangements of modified ELR material may be used. For example, with respect to FIG. 272, the placement of ELR material base layer 4904 relative to modifying layer 4906 may be interchanged. In other words, in these examples, base layer 4904 may be disposed on the interior of the antenna aperture and the modifying layer 4906 may be disposed on the exterior of the antenna aperture. Likewise, with respect to FIG. 273, the placement of ELR material base layer 5006 may be interchanged with modifying layer 5008.

Figure 274:
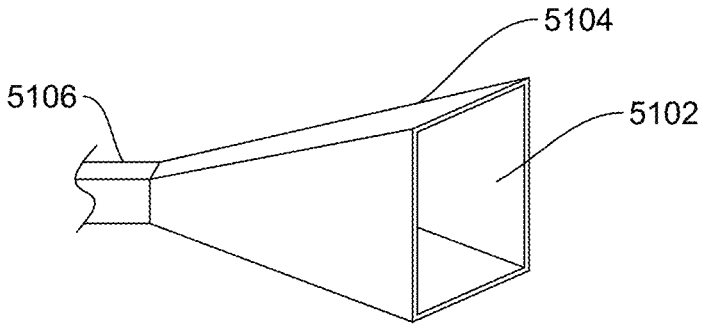

FIG. 274 is a diagram of an example horn antenna formed, at least in part, of modified ELR material, as described in FIGS. 272-273. The antenna aperture 5102 of the horn antenna of FIG. 274 is formed by flaring the sides of the waveguide 5106, which feeds the horn antenna, to form the horn section 5104. In the example of FIG. 274, the waveguide is flared in both directions. However, in other examples, the waveguide can be flared in only one direction while maintaining the dimensions of the waveguide in the other direction. Other shapes and configurations of aperture antennas can also benefit from the reduction in ohmic losses realized by forming the antenna, at least partially, of a modified ELR material.

Figure 275:
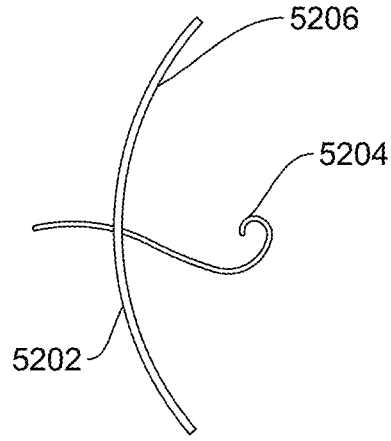

Another type of aperture antenna, which can benefit from the reduced losses of forming the structure of modified ELR materials, is a reflector antenna. Reflector antenna systems are often used in applications, which require a high gain. FIG. 275 is a cross section diagram of a reflector antenna formed of modified ELR material. The antenna system includes a reflector 5202 and a feed antenna 5204. The feed antenna can be many types of antennas, for example, any of the antenna elements described herein among others, any of which may be formed from or lined with modified ELR material. In some examples, the reflector is formed entirely of the modified ELR material. In other examples, as shown in FIG. 275, the reflector is lined with a layer 5206 of modified ELR material.

Of course, as with the other categories of antennas discussed herein, many configurations of aperture antennas are possible and are design considerations for a designer implementing an aperture antenna formed of modified ELR material. Indeed, the principles that govern design of conventional broadband antennas and can be applied to generating antennas employing the modified ELR materials described herein. Thus, while some antenna geometries are shown, many others are of course possible.

Antenna Arrays Having Antenna Elements Formed of Modified ELR Materials

Figures 276, 277:
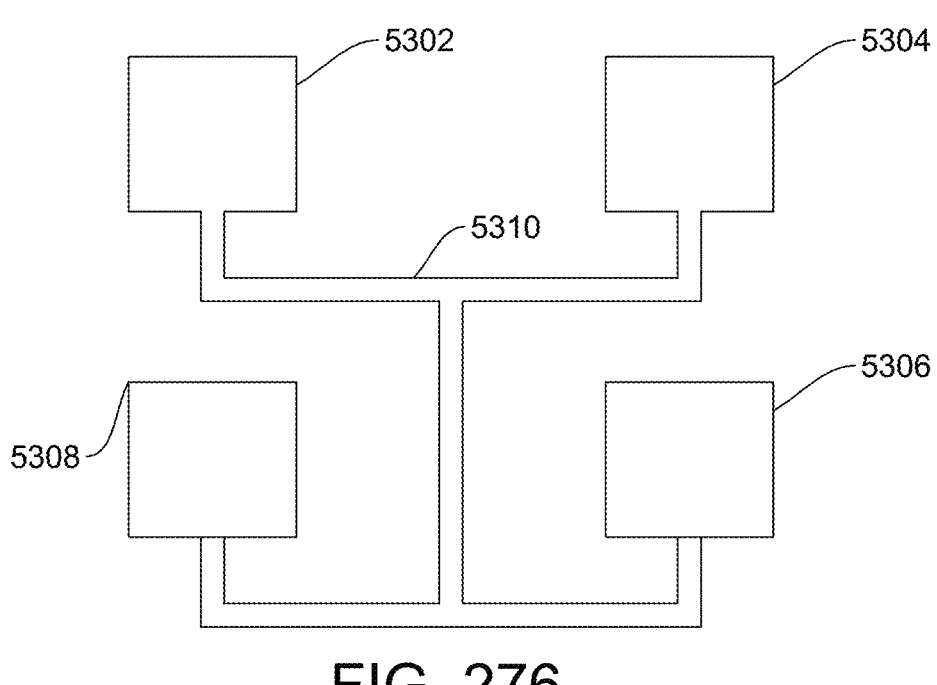

Often, multiple antenna elements are configured in an array to produce a radiation pattern that fits a particular purpose. For example, FIG. 276 is a diagram of an example array of patch antennas. The array includes patch antennas 5302-5308 formed of modified ELR material. The array of patch antennas 5302-5308 may be fed by feed network, shown schematically as 5310. The feed network, like the patch antennas, may be formed of the ELR material. In some examples, the feed network may be formed on any conductive, semiconductive or insulating substrate as would be appreciated.

FIG. 277 is a diagram of a Yagi-Uda array where antenna element 5312, formed of modified ELR material, is fed and the remaining elements 5314-5320 act as parasitic resonators which alter the radiation pattern of the fed antenna. In some examples, one or more of the parasitic elements 5314-5320 are formed of modified ELR material.

Figure 278:
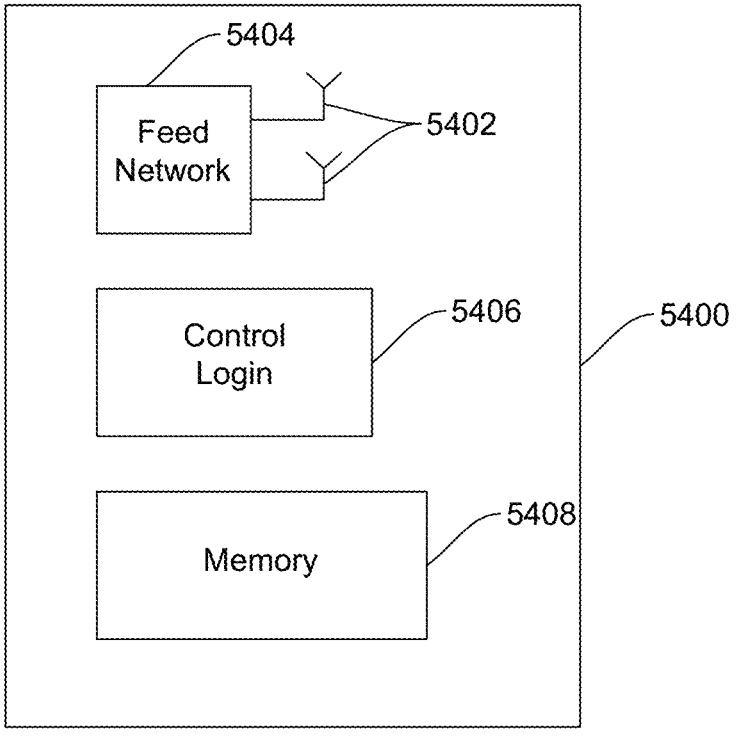

In some examples, control logic and feed networks can be used to control which elements of the antenna array are active or the phase and magnitude of signals delivered to each antenna element in order to modify the antenna's radiation pattern without having to physically modify the antenna array. FIG. 278 is a block diagram of an antenna array having components formed from modified ELR materials. The system 5400 includes an array of antennas 5402, a feed network 5404 to feed the array of antennas, control logic 5406, and memory 5408.

The antenna array can be one of many types. Two of the main types of antenna arrays include switched beam smart antennas and adaptive array smart antennas. Switched beam systems use multiple predefined fixed beam patterns. Control logic 5406 makes a decision as to which beam to use or access, at any given point in time, based upon the requirements of the system. Adaptive arrays allow the antenna to steer the beam to any direction of interest while simultaneously nulling interfering signals. Beam direction can be estimated using so-called direction-of-arrival (DOA) estimation methods.

In some examples all of the antenna elements that make up the array are uniform in geometry, while in other examples the antenna elements can vary in geometry. Similarly, the relationship between the antenna elements in the array can vary. For example, the antenna elements can be arranged in a linear array, a planar array, a conformal array, or a three-dimensional array. The arrangement and geometry of the antenna elements are design considerations for a designer implementing the antenna array to achieve the desired radiation pattern.

Signals are fed to/from the antenna array 5402 by feed network 5404. Feed network 5404 can include active and passive elements to achieve a desired radiation pattern from the array. For example, the feed network 5404 can include a finite impulse response (FIR) tapped delay line filter. The weights of the FIR filter may be changed adaptively, and used to provide optimal beamforming, in the sense that it reduces the error between the desired and actual beam pattern formed. Typical algorithms implemented by the FIR filter are the steepest descent, and least means squared algorithms.

Again, as with the other categories of antennas discussed herein, many configurations of antenna arrays are possible and are design considerations for a designer implementing an antenna array formed of modified ELR material. Such an array can include relatively homogenous antennas all formed of the ELR material, or a heterogeneous mix of different types of antennas, some antennas formed of non-ELR material, or a combination of differing antennas and differing materials. Similarly, many other components of the system 5400 can be implemented using modified ELR materials. Of course, while some antenna geometries are shown, many others are of course possible.

Matching Networks Having Modified ELR Materials and Other Implementations

Any antenna is more efficient and practical if it is matched to the system for which it acts as a transmitter/receiver. In order to match an antenna to its connected electronics a matching network is used to modify the impedance of the antenna structure to match the impedance of the system. As antennas become smaller, the antenna reactance becomes larger. The large reactance values, when combined with the small resistance values of smaller antennas, make a small antenna difficult to match to the system impedance. However, a matching network formed from a modified ELR material, such as those described herein, can considerably improve the matching of small antennas.

In some examples, any of the structures described herein employing the modified ELR materials can provide extremely low resistance to the flow of current at temperatures between the transition temperatures of conventional HTS materials and room temperatures. In some examples, any of the structures described herein employing the modified ELR materials can provide extremely low resistance to the flow of current at temperatures greater than 150 K or more as described herein. In these examples, the structures may include an appropriate cooling system (not shown) used to cool the structure elements to a critical temperature for the specific modified ELR material. For example, the cooling system may be a system capable of cooling at least the ELR materials in the structure to a temperature similar to that of liquid Freon, for example, or other temperatures described herein. That is, the cooling system may be selected based on the type and structure of the modified ELR materials utilized in the structure. Other considerations for selecting the cooling system may also exist, e.g., the amount of power dissipated in the structure.

In some examples, some or all of the systems and devices describes herein may employ low cost cooling systems in applications where the specific modified ELR materials utilized by the application exhibit extremely low resistances at temperatures lower than ambient temperatures. As discussed herein, in these examples the application may include a cooling system (not shown), such as a system that cools a modified ELR material to a temperature similar to that of liquid Freon, for example, or other temperatures discussed herein. The cooling system may be selected based on the type and structure of the modified ELR material utilized by the application.

Figure 279:
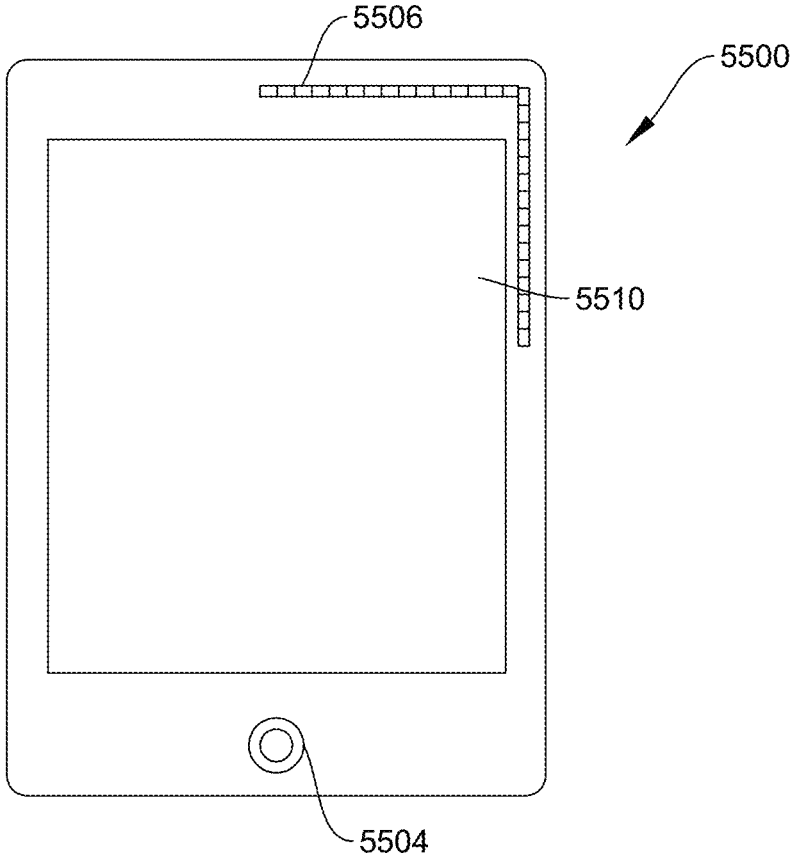

In addition to the systems, devices, and/or applications described herein, one skilled in the art will realize that other systems, devices, and application that include antennas may utilize the antenna formed from modified ELR materials as described herein. For example, FIG. 279 is a block diagram of a mobile device including an antenna formed from modified ELR materials. The mobile device described here is an illustration of one type of wireless device in which the techniques can be implemented; other wireless devices may also be used for implementing the techniques. For example, mobile devices may include cell phones, smart phones, personal digital assistants ("PDA"s), portable email devices (e.g., a Blackberry® device), portable media players (e.g., an Apple ipod Touch®), tablet or slate computers (e.g., an Apple iPad®), netbook computers, notebook computers, e-readers, or any other device having wireless communication capability.

The mobile device 5500 includes a display 5510. In some implementations, the display 5510 includes a touch-sensitive screen that allows for the direct manipulation of displayed data. The mobile device 5500 has a multifunction input module 5504 to operate the mobile device, navigate the display, and perform selections on any data. The input module 5504 can be, for example, a keyboard, mouse, trackball, touch-sensitive screen, or any other input module capable of communicating a user selection. Additionally, the mobile device 5500 employs an ELR antenna system 5506 formed from modified ELR materials to send and receive information on a wireless network. The antenna system 5506 can be coupled with a receiver, transmitter, or transceiver (not shown). While not shown, the device can include a portable power supply, memory, logic, and other components common to such devices.

The antennas described above may be particularly suited for use in communications networks and devices, such as radio frequency, cellular, optical and microwave communications. As noted above, by employing a modified ELR material in such antennas, the antennas provide resistance at orders of magnitude less than the best or common conductors under similar conditions, thereby resulting in exceptionally high antenna gain—gains approaching that of an ideal antenna. Further, such antennas can be fabricated in smaller and more compact forms.

Indeed, many of the antennas described above can be formed using microstrip technology on substrates, including wafer substrates. Thus, many of the antennas can be fabricated using thin-film manufacturing techniques, many of which are described herein, and all of which are common with semiconductor chip fabrication. Many of the antennas employing the modified ELR materials may be manufactured as single-layer devices, and thus the processing steps for creating such antennas are simplified to include only: photolithography, ion milling, contact metallization, and dicing (or equivalents thereof).

Figure 280:
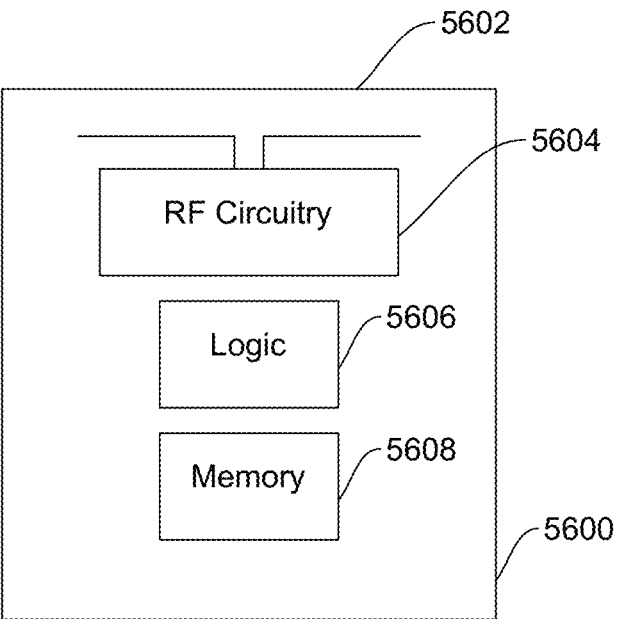

Another example of a device 5600 using the antennas described herein is shown in FIG. 280. The device includes an antenna 5602 coupled to RF circuitry 5604. The RF circuitry can include, for example, a receiver, a transmitter, a transceiver, signal generation circuitry, a modulator, a demodulator, etc. The device also includes logic 5606 and memory 5608. The device 5600 may be fabricated on a single chip, and may form, for example, an RFID chip. (Alternatively, the antenna 5602 may be a microstrip antenna formed on a substrate, such as a printed circuit board, with the components 5604, 5606, and 5608 being chips or circuits formed on, interconnected, or carried by that substrate.)

By employing on-chip antennas, the chip may obviously benefit from improved performance. By employing the modified ELR material within the chip, the chip may enjoy greater density of circuitry, among other benefits. For example, by employing the modified ELR material, the chip has less heat loss, and can employ thinner lines because more current may travel per line. Lines and interconnects may be fabricated from the modified ELR material. Moreover, signals may be transmitted without amplification, since line losses are greatly reduced. Further, the chip may be fabricated with some of the smallest scale manufacturing techniques, such as 1.3 nanometer scale technology, which may leave greater room on the chip for one or more antennas. With less current traveling over each line, EMF effects on neighboring lines, e.g., other circuits, can be reduced. With greater densification, circuit designers have less restriction based on layout or distance issues, which can allow for quicker chip design, among other benefits.

Although specific examples of antennas that employ components formed partially or exclusively from modified ELR materials are described herein, one having ordinary skill in the art will appreciate that virtually any antenna configuration may employ components that are formed at least partially from modified ELR materials, such as those components listed above, e.g., to conduct electrical currents, receive wireless signals, or transmit, transfer or modify electromagnetic signals.

Various antennas and antenna systems widely employ conductive elements and other elements, some of which are listed above. As a result, it is impossible to enumerate in exhaustive detail all possible antennas and antenna systems that may employ components that are formed from modified ELR materials. While some suitable geometries are shown and described herein for some antennas, numerous other geometries are possible. These other geometries include different patterns, configurations or layouts with respect to length and/or width, in addition to differences in thickness of materials, use of different layers, and other three-dimensional structures. The inventors contemplate that virtually all antennas and associated systems known in the art may employ modified ELR material and believe that one having ordinary skill in the art who is provided with the various examples of ELR materials, antennas, and principles in this disclosure would be able to implement, without undue experimentation, other antennas with one or more components formed in whole or in part from the modified ELR materials.

Moreover, although the description herein may highlight how a particular antenna system may use a particular component formed from modified ELR materials, these example of modified ELR components are intended to be illustrative and not exhaustive. One having ordinary skill in the art who is provided with the various examples in this disclosure would be able to identify other components within the same or a similar antenna system that might be formed from modified ELR materials.

Moreover, one having ordinary skill in the art will appreciate that the inventors contemplate that modified ELR materials may be used in complex antenna systems that comprise a combination of two or more of the antennas and principles described herein, even if those combinations are not explicitly described. Indeed, such complex antenna systems may employ two or more dissimilar or heterogeneous antennas, not simply similar or homogenous antennas.

In some implementations, an antenna that includes modified ELR materials may be described as follows:

A system comprising: a receiver, transmitter, or transceiver; and at least one antenna element coupled with the receiver, transmitter, or transceiver; wherein the at least one antenna element is formed of a modified extremely low resistance (ELR) material having a first layer comprised of an ELR material and a second layer comprised of a modifying material bonded to the ELR material of the first layer.

A structure comprising: multiple antenna elements; and a feed network coupled with the multiple antenna elements; wherein at least one antenna element of the multiple antenna elements is formed of a modified extremely low resistance (ELR) material having a first layer comprised of an ELR material and a second layer comprised of a modifying material bonded to the ELR material of the first layer.

A structure comprising: a dielectric substrate; and a broadband antenna element disposed on a first side of the dielectric substrate; wherein the antenna element is formed of a modified extremely low resistance (ELR) film having a first layer comprised of an ELR material and a second layer comprised of a modifying material bonded to the ELR material of the first layer.

A structure comprising: a dielectric substrate; and a resonant antenna element disposed on a first side of the dielectric substrate; wherein the antenna element is formed of a modified extremely low resistance (ELR) film having a first layer comprised of an ELR material and a second layer comprised of a modifying material bonded to the ELR material of the first layer.

A structure comprising: a dielectric substrate; and an electrically small antenna element disposed on a first side of the dielectric substrate; wherein the antenna element is formed of a modified extremely low resistance (ELR) film having a first layer comprised of an ELR material and a second layer comprised of a modifying material bonded to the ELR material of the first layer.

An aperture antenna comprising: a conductive surface forming an aperture, the aperture having a feed end and a radiating end; and a feed network coupled with the feed end of the aperture; wherein the conductive surface includes a modified extremely low resistance (ELR) material having a first layer comprised of an ELR material and a second layer comprised of a modifying material bonded to the ELR material of the first layer.

Chapter 15—Energy Storage Devices formed of ELR Materials

This chapter of the description refers to FIGS. 1-36 and FIGS. 281-288; accordingly all reference numbers included in this section refer to elements found in such figures.

Various types of energy storage devices employing extremely low resistance (ELR) materials, such as modified, apertured, and/or other new ELR materials are described herein. While various examples of the invention are described with reference to "modified ELR materials" and/ or various configurations of modified ELR materials (e.g., modified ELR films, etc.), it will be appreciated that any of the improved ELR materials described herein may be used, including, for example, modified ELR materials (e.g., modified ELR material 1060, etc.), apertured ELR materials, and/or other new ELR materials in accordance with various aspects of the invention. As described herein, among other aspects, these improved ELR materials have at least one improved operating characteristic which in some examples, includes operating in an ELR state at temperatures greater than 150 K.

Various energy storage devices including modified, apertured, and/or other new ELR materials will now be described in detail. In general, many configurations of energy storage devices are possible. Indeed, principles that govern design and configuration of conventional energy storage devices can be applied to designing energy storage devices employing the modified ELR materials described herein. Thus, while some energy storage devices and configurations are shown and described herein, many others are of course possible. Moreover, although the description herein may highlight how a particular energy storage device may use a particular component formed from modified ELR materials; these examples of modified ELR components are intended to be illustrative and not exhaustive. One having ordinary skill in the art who is provided with the various examples in this disclosure would be able to identify other components within the same or similar energy storage devices/systems that might be formed from modified ELR materials.

Figure 281:
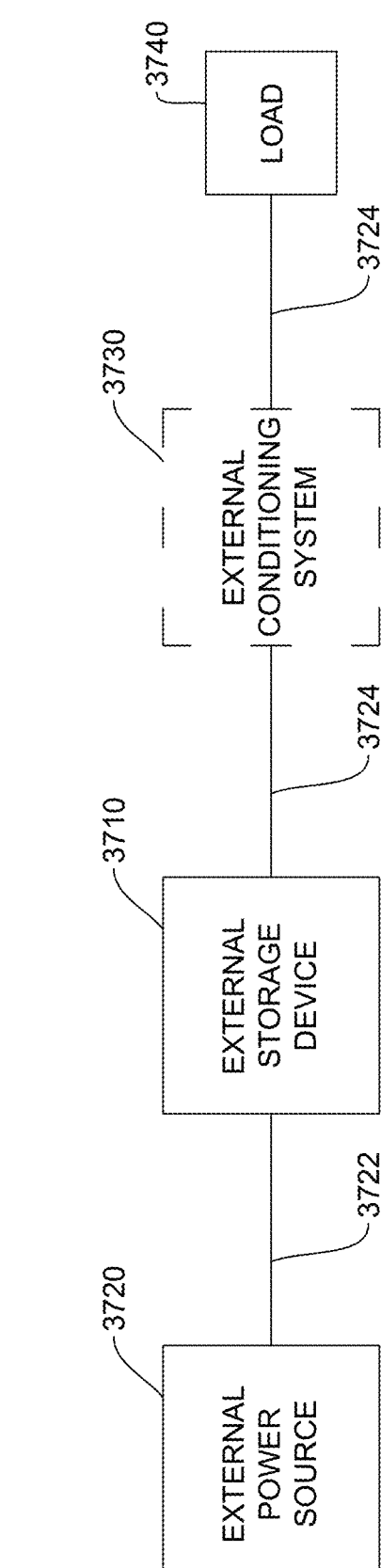
FIGS. 281 to 288 illustrate the forming of energy storage devices using ELR materials.

FIG. 281 is a block diagram illustrating an energy storage system 3700 having components formed from, or at least partially incorporating, modified ELR materials. The energy storage system 3700 can employ an energy storage device 3710 configured to receive and store energy from an external power source 3720. The power or energy is transmitted from the external power source 3720 to the energy storage device 3710 via line 3722. The stored energy, after optionally passing through an energy conditioning system 3730, is provided to a load 3740 over line 3724.

In this example, the external power source 3720 may be any suitable power or energy source including, but not limited to, a power or electric grid, a magnetic generator, a solar cell or solar panel, a photovoltaic (PV) cell or photo-electric cell, a transformer, a wind turbine, a hydroelectric generator, a thermal electric generator, a flywheel or other rotating machine functioning as a generator, and/or other types of renewable/non-renewable energy sources. Further details regarding examples of energy generation devices that provide energy to the energy storage device 3710 are discussed below.

The energy storage device 3710 may be any suitable power or energy storage device including, but not limited to, a battery, a power cell, a capacitor, a supercapacitor, a flywheel, magnetic energy storage, SMES, and the like. It some examples, it will also be appreciated that the energy storage device 3710 is a rechargeable storage device that can be drained of power and then replenished by the power source 3720. In some examples, the system 3700 is configured to receive power from a single external power source 3720 and deliver the stored energy to a single device/user. In other examples, the system 3700 comprises a power grid or array configured to receive power or energy from a number of different external power sources 3720 and store the energy in an array, grid, or distributed arrangement of energy storage device(s) 3710. The stored energy can then be delivered to any number of users/devices as desired.

The optional energy conditioning system 3730 is configured to modify or adjust the power output of the energy storage device 3710 (as necessary) to correspond to the load 3740. For example, the energy conditioning system 3730 may be used to invert stored DC current to AC current. The energy conditioning system 3730 may be employed to perform a variety of different modifications to the stored energy before the energy is delivered to the load 3740. In still further examples, the system 3700 may not include the energy conditioning system 3730. The load 3740 may be any of a variety of different devices, apparatuses, or facilities requiring electrical power or energy. The load 3740 can include, for example, a single device (e.g., a mobile phone, smart phone, laptop, tablet or other portable electronic device, computer, television, or other electrically-powered device), a home or factory, a group of homes or community, an electrical grid, etc. It will be appreciated that energy system design is quite specific for each application in which the energy storage device is to be employed, and the particular application, desired configuration and arrangement, and other factors drive the value and number of components employed in the system. Thus, the particular types and numbers of components need not be described herein because they will differ from application to application and device to device.

Generally speaking, the energy storage system 3700 may include various components formed in whole or in part from modified ELR materials. The ELR components may be configured to conduct electrical currents, transduce or convert a signal into or out of an electromagnetic signal (including, e.g., electrical currents and voltages), or otherwise transmit or modify electromagnetic signals. For example, one or more components of the energy storage device 3710, the external power source 3720, the transmission lines 3722 and 3724, the energy conditioning system 3730, and/or other related components may further comprise features formed from nanowires, tapes, or foils formed from modified ELR film and thin-film modified ELR films.

As mentioned previously, the external power source 3720 is configured to deliver power or energy to the energy storage device 3710. In some examples, as mentioned above, the power source 3720 may include a device such as a wind turbine, PV cell, hydroelectric generator, and the like that is configured to capture energy and convert the captured energy to electrical energy that is subsequently transferred to the energy storage device 3710. In some examples, at least a portion of the transmission lines and/or other components used to transmit the electrical energy to the energy storage device 3710 may be formed from modified ELR materials.

Although specific examples of energy storage devices that employ components formed from modified ELR materials are described herein, one having ordinary skill in the art will appreciate that virtually any energy storage device configuration may employ components that are formed from modified ELR materials, such as those components listed above, e.g., to conduct electrical currents, to transduce or convert a signal into or out of an electromagnetic signal (including, e.g., electrical currents and voltages), to convert stored energy to electrical energy, or to otherwise transmit or modify electromagnetic signals to/from the energy storage device. Known energy storage systems widely employ conductive elements and other elements listed herein. As a result, it is impossible to enumerate in exhaustive detail all possible energy storage devices/systems that may employ components that are formed from modified ELR materials. However, the inventors contemplate that virtually all energy storage devices known in the art may employ modified ELR material to various extents and believe that one having ordinary skill in the art who is provided with the various examples of ELR materials, energy storage devices systems, and associated principles in this disclosure would be able to implement, without undue experimentation, other energy storage devices or system with one or more components formed in whole or in part from the modified ELR materials.

Moreover, although the following description may highlight how a particular energy storage device/system may use a particular component formed from modified ELR materials, these examples of modified ELR components are intended to be illustrative and not exhaustive. One having ordinary skill in the art who is provided with the various examples in this disclosure would be able to identify other components within the same or a similar energy storage devices/systems that might be formed from modified ELR materials.

Moreover, one having ordinary skill in the art will appreciate that the inventors contemplate that ELR materials may be used in complex energy storage systems that comprise a combination of two or more of the discrete energy storage devices and principles described herein, even if those combinations are not explicitly described.

In the Figures, sizes of various depicted elements or components and the lateral sizes and thicknesses of various layers are not necessarily drawn to scale and these various elements may be arbitrarily enlarged or reduced to improve legibility. Also, component details have been abstracted in the Figures to exclude details such as precise geometric shape or positioning of components and certain precise connections between such components when such details are unnecessary to the detailed description of the invention. When such details are unnecessary to understanding the invention, the representative geometries, interconnections, and configurations shown are intended to be illustrative of general design or operating principles, not exhaustive.

Some or all of the systems and devices described herein may employ low cost cooling systems in applications where the specific modified ELR materials utilized by the application exhibit extremely low resistances at temperatures lower than ambient temperatures. As discussed herein, the application may include a cooling system (not shown), such as a system that cools a modified ELR inductor to a temperature similar to that of the boiling point of liquid Freon™, to a temperature similar to that of a melting point of water, or other temperatures discussed herein. The cooling system may be selected based on the type and structure of the modified ELR film utilized by the application.

Numerous benefits may result from using modified ELR materials in energy storage devices. For example, using modified ELR materials instead of HTS materials in an energy storage device may eliminate or reduce the complexity of cooling systems that are needed to operate the energy storage device, which may reduce its size, weight, and implementation and operating costs. Also, modified ELR materials may exhibit stronger and more nuanced temperature and photon sensitivity at higher (non-cryogenic) temperatures than HTS materials, which may provide improved thermoelectric, photoelectric, and other transduction characteristics at higher temperatures. Moreover, modified ELR materials may demonstrate stronger sensitivity to electromagnetic input signals and/or detect lower currents and/or lower voltages. Additionally, modified ELR materials may carry an electromagnetic signal (such as an input, intermediate, or output current or voltage) a much further distance than conventional conductors with less resistive loss, which may result in lower noise or less need for amplification of those signals, and/or permit lower current levels or greater separation between components of energy storage systems. Generally speaking, replacing conventional conducting and circuit elements such as copper conductors and conventional capacitors and inductors with modified ELR materials may reduce resistive losses, which may improve an energy storage device's operating efficiency, decrease waste heat, and/or improve other characteristics of its operation, such as stability, operating life, capital or operating costs, size, weight, feature size, and reliability. For example, using modified ELR materials in various components of an energy storage device may permit those components to operate more ideally. A more idealized performance achieved by those components may in turn improve the overall performance of the energy storage device.

Batteries

Figure 282:
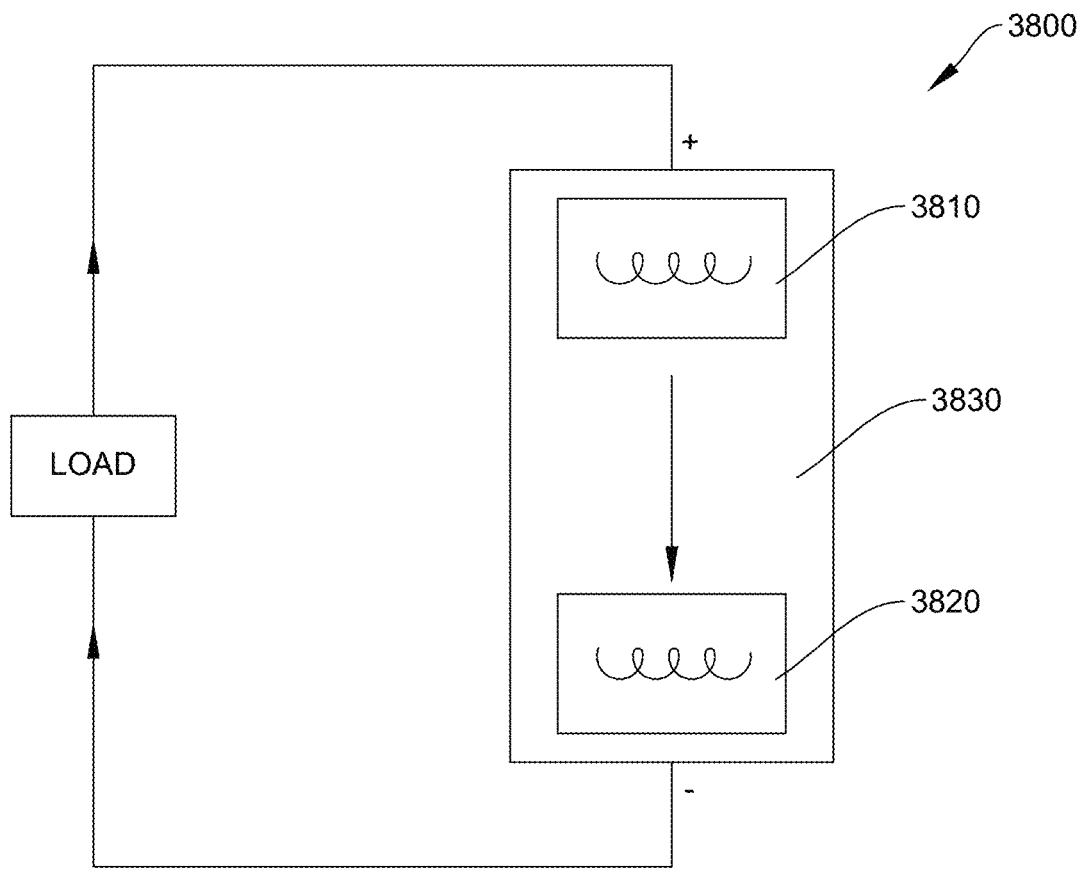

FIG. 282 is a schematic diagram of a battery 3800 employing modified ELR materials. The battery 3800, for example, comprises an electrical battery having one or more electrochemical cells that convert stored chemical energy into electrical energy. More specifically, the battery 3800 includes a cathode 3810 and an anode 3820 separated by an electrolyte 3830. The battery 3800 may comprise a primary cell/non-rechargeable battery or a secondary cell/rechargeable battery. The battery 3800 may comprise a lead-acid battery, an alkaline battery, a carbon-zinc battery, a NiMH battery, a NiCad battery, a Lithium-ion battery, a lithium ion polymer battery, or another suitable battery. It will be appreciated that although only a single, basic battery is shown, many different configurations of batteries are possible. Indeed, the battery 3800 may comprise any suitable type of battery used to convert stored chemical energy into electrical energy (e.g., rechargeable batteries or battery packs for use in portable electronic devices, batteries or battery packs for use in vehicles, large scale arrays of batteries for use with a utility or power grid, etc.).

One or more components of the battery 3800 (e.g., coils, etc.) may be formed from nanowires, tapes, or foils formed from modified ELR film and thin-film modified ELR films. Utilization of the modified ELR materials described herein may provide a variety of advantages and benefits to the battery 3800 and various applications in which the battery 3800 is employed. For example, the battery 3800 including modified ELR materials exhibits fewer resistive losses than conventional batteries, which can greatly affect the cost of operation by minimizing energy losses within the battery 3800. The battery 3800 is also expected to have better energy conversion efficiency than conventional batteries that do not include the modified ELR material.

As mentioned previously, design of an energy storage arrangement is quite specific for the application in which the energy storage device is to be employed, and the particular application, desired performance characteristics, and other factors drive the design and configuration of the battery 3800. Thus, the particular values and numbers of components need not be described herein because they will differ from application to application and device to device. The inventors contemplate that virtually all types of batteries known in the art may employ modified ELR material and believe that one having ordinary skill in the art who is provided with the various examples of ELR materials, batteries, and principles in this application would be able to implement, without undue experimentation, a number of different batteries 3800 with one or more components formed in whole or in part from the modified ELR materials.

Fuel Cells

Figure 283:
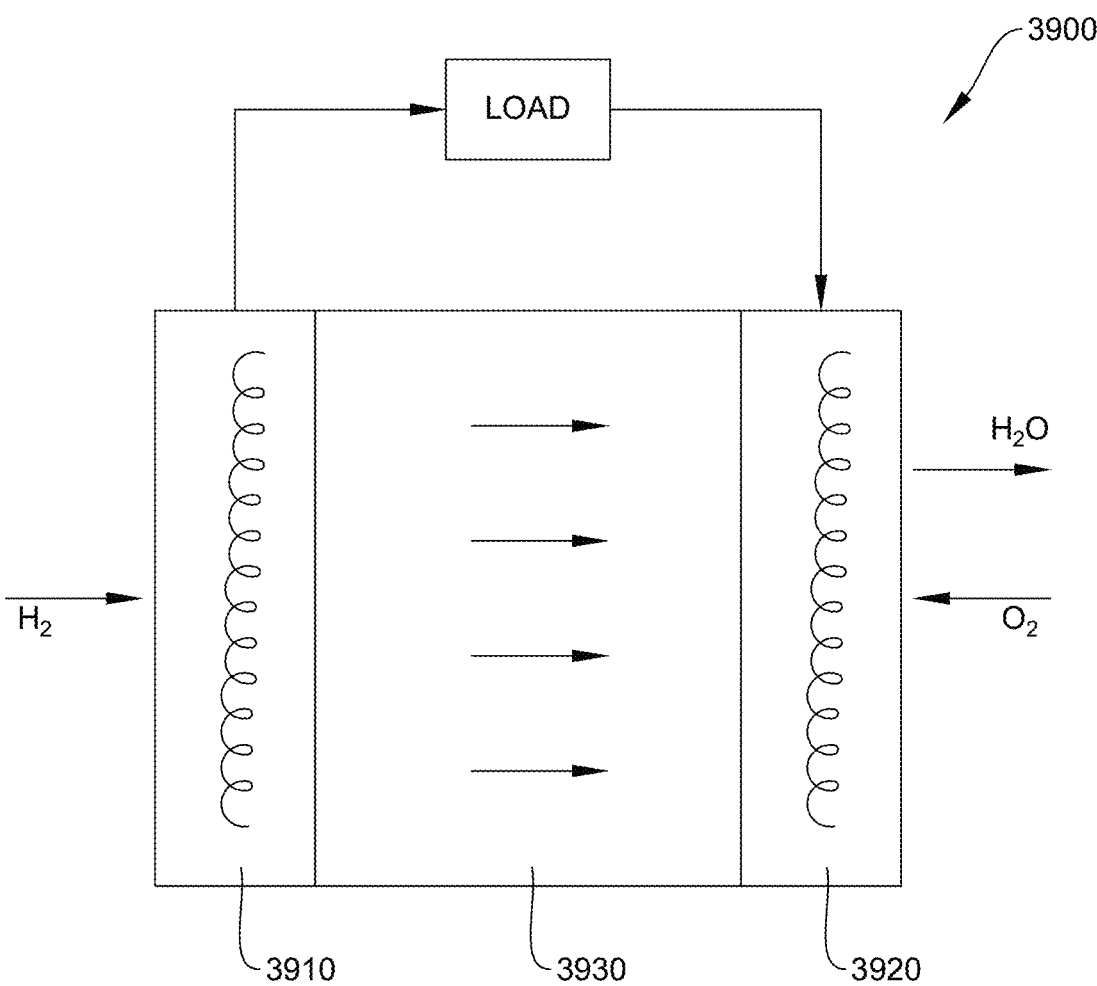

FIG. 283 is a schematic diagram of a fuel cell 3900 having one or more components formed from modified ELR materials. The fuel cell 3900, for example, includes an anode 3910, a cathode 3920, and an electrolyte 3930 between the anode 3910 and cathode 3920. The fuel cell 3900 is an electrochemical cell that converts reactants from an external source into electrical energy. This energy conversion process is accomplished via an electrochemical reaction whereby the reactants are consumed, by-products are expelled, and heat may be released or consumed. The fuel cell 3900 is configured to operate continuously to generate electricity as long as both fuel and oxidant are available. In some examples, pure hydrogen, hydrocarbons, alcohols, and hydrazine are fuels while pure oxygen and air are oxidants. In other example, however, other types of fuels and/or oxidants may be used.

The fuel cell 3900 may comprise any suitable type of fuel cell in which modified ELR materials may be utilized. The fuel cell 3900 can include, e.g., a polymer electrolyte membrane (PEM) fuel cell, a proton exchange membrane fuel cell, a direct methanol fuel cell, and alkaline fuel cell, a phosphoric acid fuel cells, a regenerative fuel cell, or another suitable type of fuel cell. The fuel cell 3900 may be used in a variety of different devices and applications including, but not limited to, vehicles such as cars, buses, boats, trains, and planes, portable electronic devices such as cellular phones and laptop computers, facilities such as hospitals, banks, police stations, wastewater treatment plants, cell towers and other telecommunications systems, etc.

As mentioned previously, one or more features of the fuel cell 3900 may be formed from nanowires, tapes, or foils formed from modified ELR film and thin-film modified ELR films. Utilization of the modified ELR materials described herein may provide a variety of advantages and benefits to the fuel cell 3900 and various applications in which the fuel cell 3900 is employed. Because fuel cells make energy electrochemically and do not burn fuel, fuel cells are fundamentally more efficient than combustion systems. Furthermore, the fuel cell 3900 including modified ELR materials is expected to operate far more efficiently than conventional fuel cells, which can further affect the cost of operation by minimizing energy losses within the fuel cell 3900. Thus, the fuel cell 3900 is expected to provide a highly efficient, low- or zero-emission device.

Flywheels

Flywheels are mechanical energy storage devices configured to rotate at a very high speed and store energy as rotational kinetic energy. To use this energy, a generator converts the kinetic energy stored in the spinning flywheel into electricity. Similarly, additional energy may be added to the system by using electricity to spin up the flywheel. Compared with other types energy storage devices, flywheels are highly efficient (e.g., many flywheels have an energy efficiency as high as 90%), require little or no maintenance, and have high energy densities.

Figure 284:
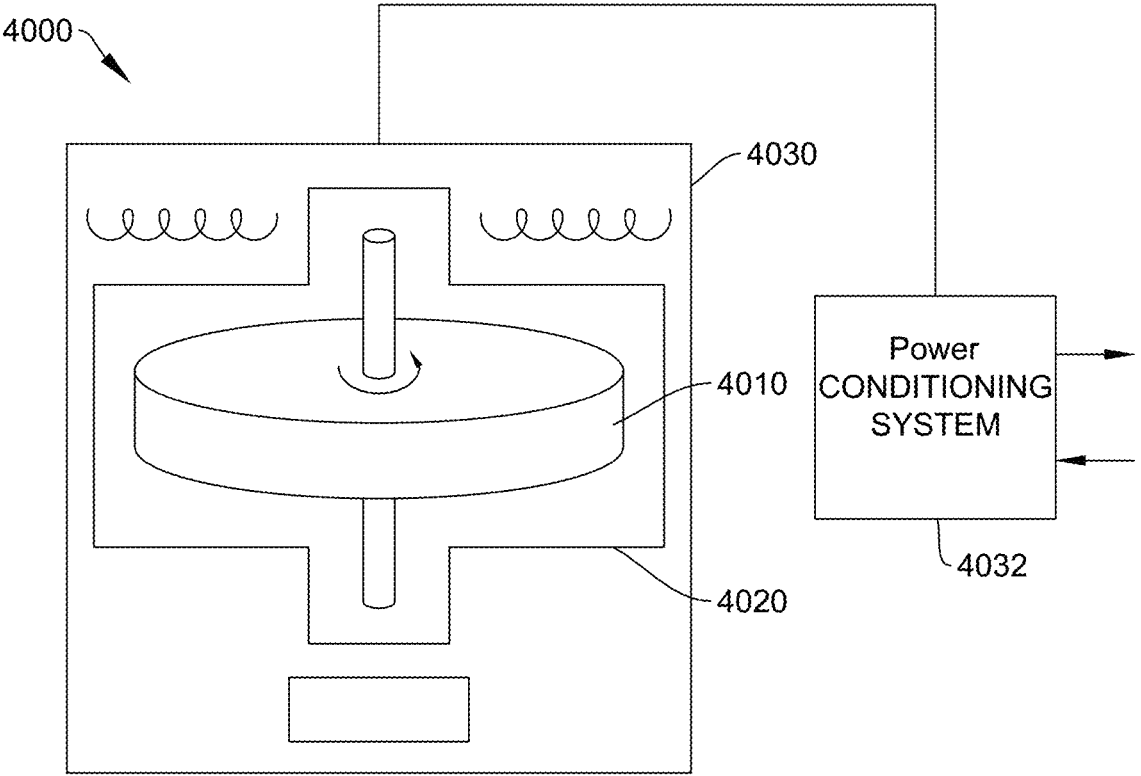

FIG. 284 is a schematic diagram of an example of an energy storage system 4000 including a flywheel 4010 having components formed from modified ELR materials. In this example, the flywheel 4010 is installed in a vacuum chamber or housing 4020 and operably coupled to a motor/generator 4030. The motor/generator 4030 is configured to drive the flywheel 4010. The system 4000 may optionally include a power conditioning system 4032 configured to modify or adjust the power output of the flywheel 4010 before power or energy is input/output from the system 4000.

The system 4000 may also include magnetic bearings (shown schematically) composed, at least in part, of the modified ELR materials. In one example, a lower surface of the flywheel 4010 carries a permanent ring magnet that travels above the bearings. The magnetic bearings support the flywheel 4010 through magnetic levitation rather than through any mechanical process. Further, the modified ELR materials are expected to block the magnetic field such that the system 4000 can provide generally frictionless and stable levitation of the flywheel 4010 within the housing 4020. Thus, by using the modified ELR materials described herein, nearly ideal energy efficiency can be realized with the system 4000 since losses due to friction, hysteresis, and/or eddy current are greatly minimized.

Flywheels may be utilized in a wide variety of different applications including, for example, large-scale grid energy storage systems. For example, flywheels may be used in conjunction with many types of renewable power sources (e.g., wind power, solar power, hydro power, etc.) to help overcome the problems with fluctuation and inconsistency often associated with such energy sources. In the case of production of electrical energy from wind, for example, it is typical to have excess energy with respect to demand in high wind conditions. For wind farm applications, the excess energy can be stored in a flywheel as rotational kinetic energy and released as electrical energy (power) when the demand becomes larger than the energy (power) produced. Flywheels may also be used in a number of other load-leveling applications and other related applications with other types of energy sources. As discussed above, utilization of flywheels employing the modified ELR materials described herein is expected to result in significant improvements in efficiency and operational characteristics as compared with conventional flywheels.

Magnetic Energy Storage (MES)

Figure 285:
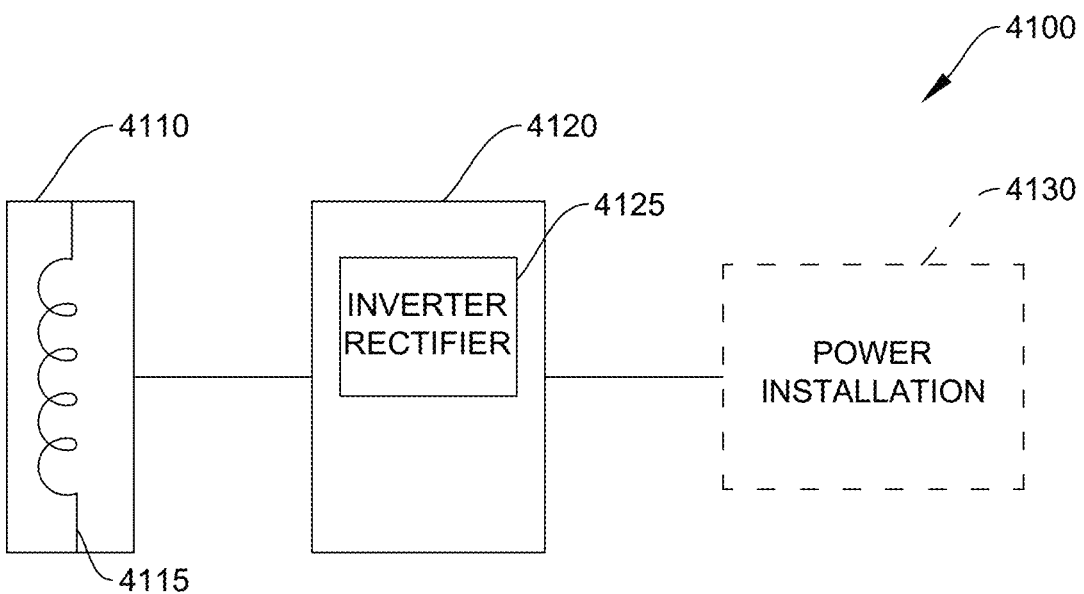

In some examples, energy storage devices, such as SMES systems and other magnetic storage systems, may utilize the modified ELR inductors described herein. Magnetic energy storage systems are configured to store energy in the magnetic field created by the flow of DC in a coil of superconducting material that has been cryogenically cooled. FIG. 285, for example, is a schematic diagram illustrating an energy storage system 4100 having component(s) formed from modified ELR materials. The energy storage system 4100 includes a storage component 4110 having an inductor coil 4115 or coils and a power conditioning system 4120 having an inverter/rectifier 4125. The storage component 4110 stores energy in magnetic fields produced by inductors 4115 formed of modified ELR materials. The power conditioning system 4120 may receive energy from the storage component 4110, condition the received energy (e.g., invert stored DC current to AC current), and supply the conditioned energy to various sources, such as a power installation 4130. One skilled in the art will appreciate that the energy storage system 4100 may be implemented in many other applications and devices not described herein.

Figure 286:
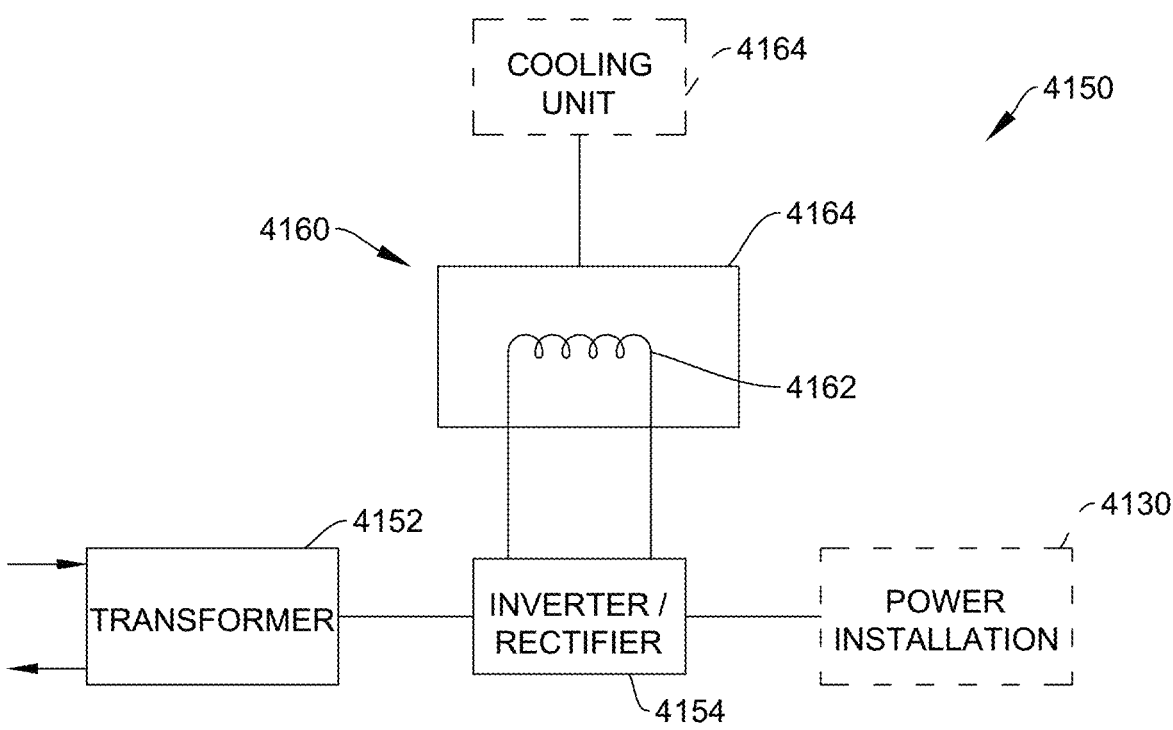

FIG. 286 is a schematic diagram of another example of an energy storage system 4150 employing one or more components formed from modified ELR materials. In this example, the energy storage system 4150 includes a transformer 4152 configured to condition or modify the incoming/outgoing signals to the system 4150. The transformer 4152 may include one or more components formed from modified ELR materials. The system 4150 further includes a power conditioning system 4154 (e.g., an inverter/rectifier). The system 4150 also includes a magnetic energy storage device 4160 including an energy storage magnetic coil 4162 positioned within a housing 4164 and a cooling component/cryostat 4166. The coil 4162, for example, may be formed completely or at least in part from the modified ELR material. The housing 4164 is configured to contain the magnetic field (i.e., Lorenz forces, etc.) and may include further support structures/assemblies (not shown). In some examples, at least a portion of the system 4150 may be buried in the ground. The cooling component 4166 is an optional component in the system 4150 and is configured to maintain the coil 4162 at a desired temperature. In other examples, the system 4150 may include different features and/or the features of the system 4150 may have a different arrangement.

Conventional SMES systems are generally more efficient than many of the other energy storage systems described herein, but are typically very expensive to operate because of the problems associated with maintaining the superconducting materials in such SMES systems at temperatures of the order of boiling liquid nitrogen. In contrast with conventional systems, however, the systems 4100 and 4150 described herein employing the modified ELR materials are expected to provide the benefits and efficiencies associated with conventional SMES systems without the high costs and problems associated with complex cooling systems. For example, as discussed previously, the materials described herein exhibit ELR properties at high temperatures (e.g., between the temperature of the boiling point or liquid Freon™ to ambient temperature or higher). Accordingly, elaborate, complex cooling systems are optional features that may not be necessary in many examples.

The systems 4100 and 4150 also include several additional advantages. For example, as compared with a number of the other energy storage devices described herein, the systems 4100 and 4150 including magnetic storage devices have a very short time delay during charge and discharge. Power is available to the power installation almost instantaneously. Further, the systems 4100 and 4150 are expected to have little or no loss of power because the current through the system encounters very little resistance. Thus, as compared with many other energy storage devices (e.g., batteries), the systems 4100 and 4150 are expected to be significantly more efficient to operate. Finally, because the primary components of the magnetic energy storage systems described above are generally stationary during operation, the systems 4100 and 4150 are expected to require significantly less maintenance and have greater reliability than other more complex energy storage systems.

Capacitors and Supercapacitors Having Modified ELR Components

Figure 287:
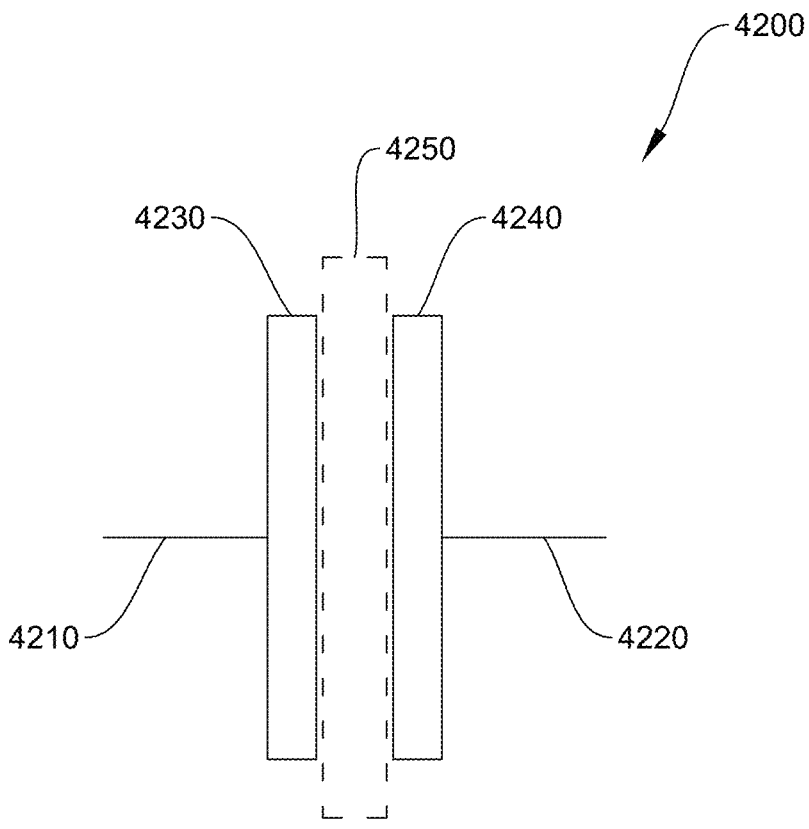

Capacitors may be formed using the modified ELR materials described herein. FIG. 287, for example, is a schematic diagram of a simple parallel plate capacitor 4200. The capacitor 4200 may be employed in any of the energy storage devices disclosed herein, or it may be used in other suitable devices or components. In this example, the capacitor 4200 includes input and output terminals 4210 and 4220 that are connected, respectively, to conductive plates or areas 4230 and 4240. The conductive plates/areas are separated by a distance that may be at least partially filled with a dielectric 4250. The dielectric may be air or any other known dielectric employed with capacitors, such as insulators, electrolytics, or other materials or compounds.

The plates/areas 4230 and 4240 may employ the modified ELR material. Alternatively or additionally, the input and output terminals 4210 and 4220 may employ the ELR material. While a simple parallel plate capacitor is shown, any form of capacitor may be employed, such as those formed on semiconductor chips, MEMS-based capacitors, and so on.

In some example, supercapacitors or ultracapacitors may be formed using the modified ELR materials described herein. Supercapacitors are configured to store power or energy differently than batteries and the other energy storage devices described herein. More specifically, supercapacitors polarize an electrolytic solution to store energy electrostatically. Although supercapacitors are electrochemical devices, no chemical reactions are involved in the energy storage mechanism. Thus, unlike many types of batteries, this operation is highly reversible and allows supercapacitors to be cycled (charged/discharged) hundreds of thousands of times without affecting performance. Further, most supercapacitors have close to 100% efficiency.

Figure 288:
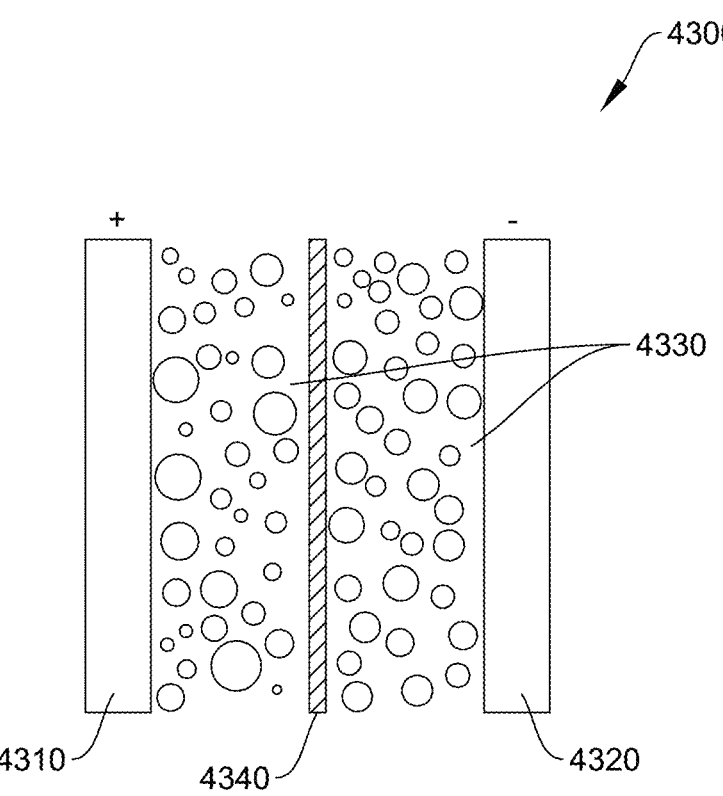

FIG. 288 is a schematic diagram of a supercapacitor or ultracapacitor 4300 employing components formed, at least in part, from modified ELR materials. The supercapacitor 4300 comprises two non-reactive porous plates or collectors 4310 and 4320. An electrolyte 4330 (e.g., activated carbon, sintered metal powders) is disposed between the two plates 4310 and 4320. In some examples, carbon is utilized as the electrolyte 4330 because it is chemically inert, electrically conductive, and can be easily processed to contain a large amount of internal pores. The surface area created by the internal pores of the carbon electrolyte allows for a significant amount of energy to be stored in the supercapacitor 4300. The supercapacitor 4300 also includes a dielectric separator 4340 between the two plates 4310 and 4320. In operation, a voltage potential is applied across the plates 4310 and 4320. The applied potential on the positive electrode (i.e., the plate 4310) attracts the negative ions in the electrolyte 4330, while the potential on the negative electrode (i.e., the plate 4320) attracts the positive ions. The separator 4340 is positioned to prevent the charges from moving between the two plates 4310 and 4320. The supercapacitor 4300 is configured to provide energy to a load (not shown).

One or more components of the supercapacitor 4300 may be formed from nanowires, tapes, or foils formed from modified ELR film and thin-film modified ELR films. For example, one or more of the plates 4310 and 4320 may be formed of the modified ELR materials described herein. Utilization of the modified ELR materials may provide a variety of advantages and benefits to the supercapacitor 4300 and various applications in which the supercapacitor 4300 is employed. For example, the supercapacitor 4300 including the modified ELR materials is expected to provide an approximately ideal energy storage device, namely one that provides close to 100% efficiency.

The configuration of the supercapacitor 4300 can be quite specific for the application in which the supercapacitor 4300 is to be employed, and the particular application, desired performance characteristics, and other factors drive the design and configuration of the supercapacitor 4300. For example, many applications that require short power pulses or low-power support of critical memory systems can benefit from the supercapacitor 4300. In other examples, the supercapacitor 4300 Pcan be employed as in a vehicle for power assist during acceleration and hill climbing and for recovery of braking energy. The supercapacitor 4300, for example, can be part of a vehicle's regenerative braking system to capture and store large amounts of electrical energy (generated by braking) and release it quickly for reacceleration. This feature is expected to significantly improve fuel efficiency under stop-and-go urban driving conditions and other driving conditions. Thus, the particular values and numbers of components of the supercapacitor 4300 need not be described herein because they will differ from application to application and device to device. The inventors contemplate that one having ordinary skill in the art who is provided with the various examples of ELR materials, supercapacitors, and principles in this application would be able to implement, without undue experimentation, a number of different supercapacitors 4300 with one or more components formed in whole or in part from the modified ELR materials.

Additional Energy Storage Devices

As noted above, by employing modified ELR material in such energy storage devices, the energy storage devices are expected to provide improved performance as compared with conventional energy storage devices. As further noted above, the modified ELR material has a performance that is dependent on temperature. As a result, the energy storage devices described herein employing the modified ELR material are likewise dependent on temperature. Temperature variation affects field penetration into strip conductors, and which affects superconducting penetration depth, as described above. Such variations of the material can be modeled based on the temperature versus response behavior for the modified ELR materials as described herein, or can be empirically derived. Notably, by employing the modified ELR materials, the resistance of the line is negligible, but that resistance can be adjusted based on temperature, as shown in the temperature graphs provided herein. Therefore, the energy storage device design and configuration can be adjusted to compensate for temperature, or the energy storage device performance can be adjusted by varying the temperature.

While individual energy storage devices are shown, energy storage devices may be joined together to form energy storage grids or arrays. As with the other categories of energy storage devices discussed herein, many configurations of energy storage devices are possible and are design considerations for designers implementing an energy storage array or a multi-component system that is at least partially formed from the modified ELR material. The modified ELR materials described herein may be used in complex energy storage systems that comprise a combination of two or more of the energy storage devices and principles described herein, even if those combinations are not explicitly described. Indeed, such complex energy storage systems may employ two or more dissimilar or heterogeneous energy storage devices, not simply similar or homogenous energy storage devices. Such a system or array can include relatively homogenous energy storage devices all formed of the modified ELR material, or a heterogeneous mix of different types of energy storage devices, some devices formed of non-ELR material, or a combination of differing devices and differing materials. Thus, complex energy storage systems or arrays may employ two or more energy storage devices formed of two or more homogeneous energy storage devices formed primarily of the modified ELR material, two or more heterogeneous energy storage devices formed primarily of the modified ELR material, and/or two or more homogeneous/heterogeneous energy storage devices formed of both conventional conductors and the modified ELR material.

Although specific examples of energy storage devices that employ components formed partially or exclusively from modified ELR materials are described herein, one having ordinary skill in the art will appreciate that virtually any energy storage configuration may employ components that are formed at least partially from modified ELR materials, such as those components listed above, e.g., to conduct electrical currents, receive signals, store various forms of energy, or transmit or modify electromagnetic signals. Known energy storage devices and systems widely employ conductive elements and other elements, some of which are listed above. While the modified ELR material may be used with any conductive elements in a circuit, it may be more appropriate to state, depending upon one's definition of "conductive" that the modified ELR material facilitates propagation of energy or signals along its length or area. As a result, it is impossible to enumerate in exhaustive detail all possible energy storage devices and systems that may employ components that are formed from modified ELR materials. Of course, any conductor described herein may be formed in whole or in part from modified ELR materials.

While some suitable geometries, interconnections, circuits, and configurations are shown and described herein for some energy storage devices and systems, numerous other geometries, interconnections, circuits, and configurations are possible. The inventors contemplate that virtually all energy storage devices and associated systems known in the art may employ modified ELR material and believe that one having ordinary skill in the art who is provided with the various examples of ELR materials, energy storage devices, and principles in this application would be able to implement, without undue experimentation, other energy storage devices with one or more components formed in whole or in part from the modified ELR materials.

In some implementations, an energy storage device that includes modified ELR materials may be described as follows:

An apparatus, comprising: at least one energy storage device configured to receive and store energy from an external power source, wherein the energy storage device comprises a component formed from, or at least partially incorporating, a modified extremely low resistance (ELR)

material, wherein the modified ELR material is formed of a modified ELR film having a first layer comprised of an ELR material and a second layer comprised of a modifying material bonded to the ELR material of the first layer.

An apparatus, comprising: at least one electrochemical cell configured to convert chemical energy into electrical energy, wherein the electrochemical cell comprises a component formed from, or at least partially incorporating, a modified extremely low resistance (ELR) material, wherein the modified ELR material is formed of a modified ELR film having a first layer comprised of an ELR material and a second layer comprised of a modifying material bonded to the ELR material of the first layer.

A capacitor, comprising: a first conductive feature; a second conductive feature; and a dielectric disposed between the first and second conductive features, wherein the first conductive feature, the second conductive feature, or both, are formed at least in part of a modified extremely low resistance (ELR) material, wherein the modified ELR material is formed of a first portion comprised of an ELR material and a second portion comprised of a modifying material chemically bonded to the ELR material of the first portion.

A method, comprising: receiving energy from a power source and converting the energy to electrical energy; and storing the electrical energy in an energy storage device operably coupled to the power source, wherein the energy storage device or transmission lines between the power source and the energy storage device are formed from, or at least partially incorporate, a modified extremely low resistance (ELR) material, wherein the modified ELR material is formed of a modified ELR film having a first layer comprised of an ELR material and a second layer comprised of a modifying material bonded to the ELR material of the first layer.

An apparatus, comprising: a flywheel carried within a housing and operably coupled to a generator; and at least one magnetic bearing adjacent to the flywheel and configured to engage the flywheel, wherein the magnetic bearing is formed from, or at least partially incorporates, a modified extremely low resistance (ELR) material, wherein the modified ELR material is formed of a modified ELR film having a first layer comprised of an ELR material and a second layer comprised of a modifying material bonded to the ELR material of the first layer.

An apparatus, comprising: at least one electrochemical cell configured to convert reactants from an external source into electrical energy, wherein the electrochemical cell comprises a component formed from, or at least partially incorporating, a modified extremely low resistance (ELR) material, wherein the modified ELR material is formed of a modified ELR film having a first layer comprised of an ELR material and a second layer comprised of a modifying material bonded to the ELR material of the first layer.

A system, comprising: an energy storage component coupled among one or more external power sources in an electrical power distribution grid, wherein the energy storage component comprises an element formed from, or at least partially incorporating, a modified extremely low resistance (ELR) material, wherein the modified ELR material is formed of a modified ELR film having a first layer comprised of an ELR material and a second layer comprised of a modifying material bonded to the ELR material of the first layer.

An apparatus, comprising: a magnetic energy storage device including a coil formed from, or at least partially incorporating, a modified extremely low resistance (ELR)

material; and a cooling component configured to maintain the coil at a desired temperature, wherein the modified ELR material is formed of a modified ELR film having a first layer comprised of an ELR material and a second layer comprised of a modifying material bonded to the ELR material of the first layer.

A supercapacitor, comprising: a first conductive plate; a second conductive plate adjacent to and spaced apart from the first conductive plate, wherein the first conductive plate, the second conductive plate, or both, are formed at least in part of a modified extremely low resistance (ELR) material, wherein the modified ELR material is formed of a first portion comprised of an ELR material and a second portion comprised of a modifying material chemically bonded to the ELR material of the first portion; an electrolyte disposed between the first and second conductive plates; and a dielectric separator between the first and second conductive plates.

Chapter 16—Fault Current Limiters Formed of ELR Materials

This chapter of the description refers to FIGS. 1-36 and FIGS. 289-304; accordingly all reference numbers included in this section refer to elements found in such figures.

Various types of fault current limiters employing inductor coils formed of extremely low resistance (ELR) materials, such as modified, apertured, and/or other new ELR materials, are described herein. While various examples of the invention are described with reference to "modified ELR materials" and/or various configurations of modified ELR materials (e.g., modified ELR films, etc.), it will be appreciated that any of the improved ELR materials described herein may be used, including, for example, modified ELR materials (e.g., modified ELR material 1060, etc.), apertured ELR materials, and/or other new ELR materials in accordance with various aspects of the invention. As described herein, among other aspects, these improved ELR materials have at least one improved operating characteristic which in some examples, includes operating in an ELR state at temperatures greater than 150 K.

The fault current limiters disclosed herein are suitable for applications of a variety of different scales. For example, these applications may range from smaller scale applications that limit fault current at the component or chip level, to medium scale applications that may limit fault current at the system or device level, to larger scale applications that limit fault current at the electric distribution or transmission levels. Before providing details regarding the novel fault current limiters, some details regarding some applications for the fault current limiters will be provided.

Figure 289:
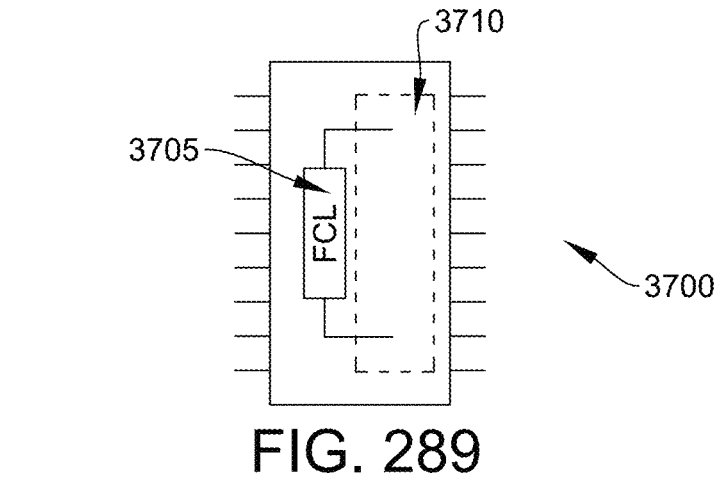

Regarding small-scale applications, FIG. 289 is a schematic diagram illustrating a chip or other monolithic structure containing a fault current limiter employing ELR material. Chip 3700 contains circuitry 3710 that is to be protected by fault current limiter 3705. The protected circuit 3710 may consist of one or more individual circuits or circuit components. In the implementation of FIG. 289, fault current limiter 3705 is placed in series with protected circuit 3710. However, a person of ordinary skill in the art will appreciate that the fault current limiter may connect to the protected circuit in any of multiple possible configurations, including a connection in parallel or a coupling via an electric or magnetic field.

By employing on-chip fault current limiters, the chip may obviously benefit from improved protection from faults, but may enjoy many additional benefits. By employing the ELR material within the chip 3700, the chip may enjoy greater density of circuitry, among other benefits. For example, by employing the ELR material, the chip has less heat loss, and can employ thinner conductors because more current may travel per conductor. Conductors and interconnects may be fabricated from the ELR material. Moreover, signals may be transmitted without amplification, since insertion losses are greatly reduced. Further, the chip may be fabricated with some of the smallest scale integrated circuit manufacturing techniques, such as ≤45 nm minimum feature size technology. With decreased feature size, circuit designers have fewer constraints based on conductor layout or length, which can accelerate physical design, among other benefits.

Figure 290:
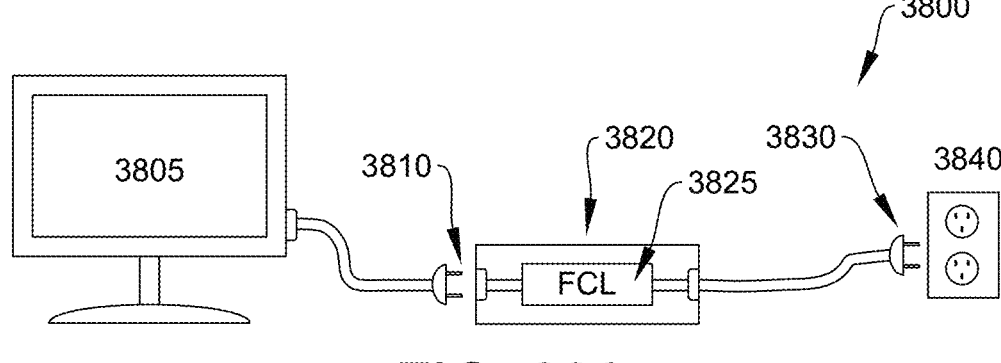

Regarding medium scale applications, FIG. 290 illustrates a system 3800 that includes a fault current limiter that may be encased in a housing and connected to a device such as a consumer appliance. For example, fault current limiter 3825 may reside on a board (such as a PCB) and be encased in a single housing 3820, to thereby form a box or appliance to protect any electrical equipment attached thereto. For example, the housing 3820 may contain a female connection at one end and a power cord having a male connection at the opposite end. In this example, a consumer may plug an electrical device (such as television 3805) into the female end 3810 of the fault current limiter housing 3820 and plug the male end 3830 into electrical outlet 3840. The electrical device 3805 would then be protected from fault current by fault current limiter 3825.

Although television 3805 is shown, a person of ordinary skill in the art will appreciate that the fault current limiter housing 3820 may be connected to a variety of consumer devices, such as personal computers, stereo equipment, alarm clocks, kitchen appliances, power tools, and the like. Moreover, the fault current limiter housing 3820 may be used with any other device, such as medical or scientific devices, which can be expensive and sensitive. Moreover, a person of ordinary skill in the art will appreciate that the fault current limiter housing 3820 and connections thereto may vary and are not limited to connections to standard power outlets.

Fault current limiters find significant service in large-scale applications, such as protecting equipment on an electric power grid. Fault current protection on an electric power grid is particularly important due to the large and expensive nature of equipment that resides on a power grid, as well as the large number of individuals and businesses (such as hospitals, airports, and commercial manufacturing plants) that may be impacted by a single fault on the grid.

Figure 291:
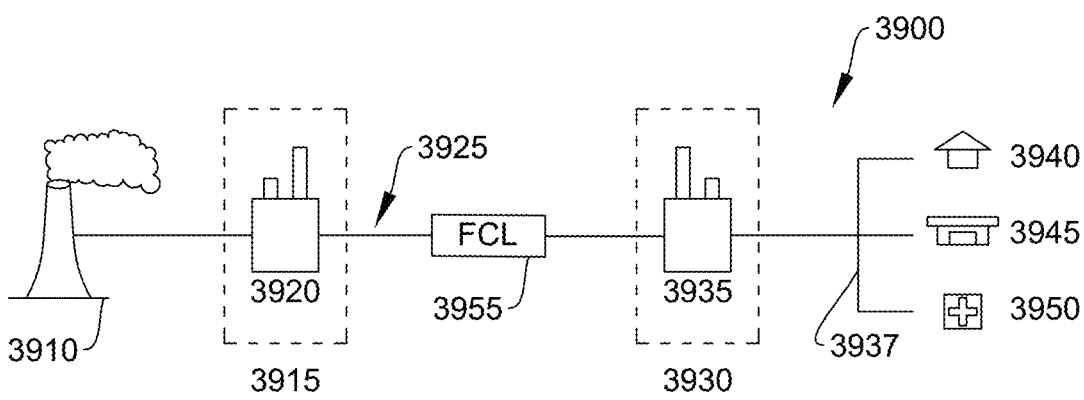

FIG. 291 is an illustration of an electric power grid that includes a fault current limiter that may employ modified ELR materials. Power plant 3910 generates electricity that energizes the grid. The power plant may be of any type capable of generating electricity for use on the grid, such as coal, geothermal, nuclear, methane, hydro, wind, or solar. After generation, the voltage from power plant 3910 is raised (or "stepped-up") to a higher voltage that is suitable for transmission over a long distance, such as 230 kV. The voltage step-up may occur in high voltage switchyard 3915, which may includes a step-up transformer 3920 therein that raises the voltage through a series of coils wrapped around a core.

The stepped-up voltage is transmitted over high voltage transmission lines 3925 to substation 3930. Substation 3930 includes a step-down transformer 3935, which lowers the voltage to a level suitable for distribution to customers, such as 13.3 kV. The distribution voltage is then carried over distribution lines 3937 to various customers, such as house 3940, school 3945, or hospital 3950. Power grid 3900 also includes fault current limiter 3955 coupled between step-up transformer 3915 and step-down transformer 3930. In this configuration, fault current limiter 3955 may protect step-up transformer 3920 and power plant 3910 from faults that may occur downstream, including faults in the high voltage transmission lines 3925 (between fault current limiter 3955 and substation 3930), substation 3930 (including step-down transformer 3935 and other components within substation 3930), distribution lines 3937, and customers (including house 3940, school 3945, and hospital 3950). Similarly, fault current limiter 3955 may protect high voltage transmission lines 3925 (between fault current limiter 3955 and substation 3930), substation 3930 (including step-down transformer 3935 and other components within substation 3930), distribution lines 3937, and customers (including house 3940, school 3945, and hospital 3950) from faults that may occur upstream, including faults in step-up transformer 3920 and power plant 3910.

Although FIG. 291 shows fault current limiter 3955 situated between step-up transformer 3920 and step-down transformer 3935, a person of ordinary skill in the art will appreciate that fault current limiter 3955 (as well as multiple additional fault current limiters) may be placed in one or more different positions on power grid 3900, including for example, between power plant 3910 and step-up transformer 3920 or between step-down transformer 3935 and any of customers 3940, 3945, or 3950. Additionally, a person of ordinary skill in the art will appreciate that one or more fault current limiters may be placed within power plant 3910, within high voltage switchyard 3915, or within substation 3930 (as described below and illustrated in FIGS. 292A and 292B).

FIGS. 292A and 292B show a schematic diagram of two possible implementations of substation 3935 incorporating a fault current limiter that can employ modified ELR materials. In a first implementation 4000, depicted in FIG. 292A, fault current limiter 4020 is located within substation 3930 and is coupled to step-down transformer 3935. Step-down transformer 3935 is coupled to power plant 3910 through high voltage lines 3925 and step-up transformer 3920, which is located within high voltage switchyard 3915. Fault current limiter 4020 is further coupled to house 3940 and school 3945 through substation feeder breakers 4030 and 4044, and is further coupled to hospital 3950 through substation feeder breakers 4030 and 4043. Fault current limiter 4020 may be coupled to additional consumers through substation feeder breakers 4041 and 4042. In the implementation of FIG. 292A, fault current limiter 4020 would protect multiple components associated with substation 3930. The multiple protected components include house 3940, school 3945, hospital 3950, and other consumers connected to substation feeder breakers 4041 and 4042, all of which pass their respective loads through substation feeder breaker 4030 before passing though fault current limiter 4020.

In a second implementation 4050, depicted in FIG. 292B, includes step-down transformer 3935 coupled to power plant 3910 through high voltage transmission lines 3925 and step-up transformer 3920, which resides within high voltage switchyard 3915. Fault current limiter 4070 is coupled to hospital 3950 through substation feeder breakers 4080 and 4093. House 3940 and school 3945 are coupled to step-down transformer 3935 through substation feeder breakers 4094 and 4080, but are not coupled to fault current limiter 4070. Step-down transformer 3935 may be coupled to additional consumers through substation feeder breakers 4091 and 4092. In the implementation of FIG. 292B, fault current limiter 4070 would protect hospital 3950 from fault current but would not protect house 3940 and school 3945. A person of ordinary skill in the art will appreciate that the fault current limiter may be placed in various positions in order to protect as many or as few specific components as is desired. This ability to place a fault current limiter in a position to protect a particular customer or component enables a power utility company to respond to the dynamic needs of an electric transmission and distribution system.

The fault current limiters disclosed herein may be of several different types that employ different methods to limit fault current. Described herein are two main types of fault current limiters that may employ modified ELR materials: resistive fault current limiters and inductive fault current limiters. Also described herein is a third, reactor type fault current limiter such as a saturable reactor type fault current limiter that may be formed of modified ELR materials. Although three types of fault current limiters are described herein (i.e., resistive, inductive, and saturable reactor type), a person of ordinary skill will appreciate that a variety of additional types of fault current limiters may be formed of modified ELR materials in addition to these three types.

FIG. 293 is a schematic illustration of a resistive fault current limiter, which operates by increasing the resistance in the current flow path to a level that prohibits current from flowing at fault levels. In particular, resistive fault current limiter 4100 may be implemented with modified ELR material having a variable resistance or impedance 4110 depending on the superconductive or ELR state of the ELR material at a given time, as shown in FIG. 293. Alternatively or additionally, the modified ELR material may be doped with an appropriate element or compound to tailor the resistivity of the modified ELR material and thereby provide a variable or selected resistance.

As shown, resistive fault current limiter 4100 consists of the modified ELR material placed in series with a circuit 4115 that is to be protected. When no fault condition is present (i.e., under normal operation), the current flowing through the modified ELR material remains below a critical current density of the modified ELR material. As a result, the modified ELR material remains in a superconductive or ELR state with little or no resistance 4110. This enables the protected circuit 4115 to operate efficiently without adding resistance or impedance that would degrade the efficiency of the circuit or system being protected. When a fault condition is present, the current that flows in the modified ELR material increases to a level that exceeds its critical current density. As a result, the modified ELR material is quenched [loses its superconductivity or ELR state] and transitions to a non-superconductive state. This transition to a non-superconductive state causes a sharp rise in the resistance or impedance 4110 of the protected circuit 4115. As a result, the large resistance or impedance serves to limit the flow of fault current in the protected circuit 4115. Resistive fault current limiter 4100 may also include shunt 4120, which absorbs energy during a fault.

Figures 294, 295, 296:
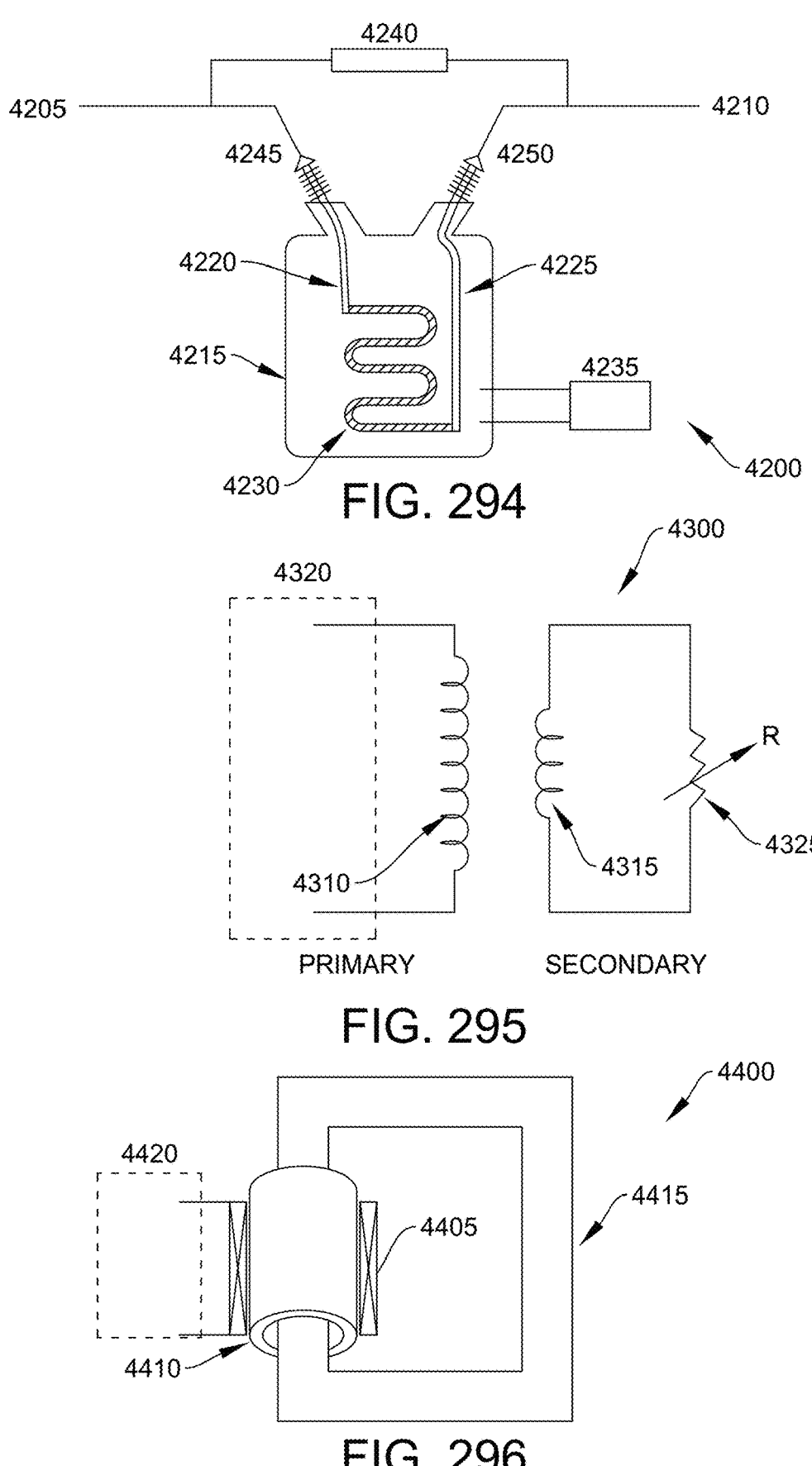

FIG. 294 illustrates a resistive fault current limiter 4200 that may find use in a variety of applications, including placement on a power grid. Resistive fault current limiter 4200 includes a housing or shell 4215 that is coupled in series with a line 4205 and a load 4210. The line 4205, which may be formed of either conventional materials or modified ELR materials, may enter the fault current limiter shell 4215 through external connection 4245. An input conductor 4220, formed of either conventional materials or modified ELR materials, is coupled between external connection 4245 and a section of modified ELR material 4230 that resides within fault current limiter shell 4215. The opposite end of ELR material 4230 is coupled to an output conductor 4225, which may be formed of either conventional material or modified ELR material. Output conductor 4225 is coupled to external connection 4250, which in turn is connected to load 4210.

A shunt impedance 4240 may be connected in series between line 4205 and load 4210. In addition, a cooling unit 4235 may be coupled to fault current limiter shell 4215 in order to cool the modified ELR material 4215 to its operating or ambient temperatures. Although the modified ELR material 4215 is capable of operating in a ELR state at temperatures higher than normal HTS materials (e.g. room temperatures, as described herein, cooling unit 4235 may nonetheless be necessary to cool the modified ELR material to its operating temperature due to excessive heat that may be generated by surrounding high voltage transmission equipment and exposure to ambient heat or sunlight in warm weather. Further, by controlling the temperature of the modified ELR material, the performance or response of the fault current limiter may be adjusted, as described in more detail herein.

Operation of resistive fault current limiter 4200 is consistent with the principles of resistive fault current limiters previously described herein. In particular, resistive fault current limiter 4200 is placed in series with a line 4205 and a load 4210. When no fault condition is present (i.e., under normal operation), the current flowing through modified ELR material 4230 remains below a critical current density of the modified ELR material. As a result, the modified ELR material remains in a superconductive or ELR state with little or no resistance or impedance. This enables the devices on the power grid to operate efficiently without adding resistance or impedance that would degrade the performance of the grid. When a fault condition is present, the current that flows through modified ELR material 4230 increases to a level that exceeds the critical current density of the modified ELR material. As a result, the modified ELR material loses its superconductivity or ELR state and transitions to a non-ELR state. This transition to a non-ELR state causes a sharp rise in the resistance or impedance of the protected portions of the grid. As a result, the large resistance or impedance limits the flow of fault current (and diverts most of the fault energy to shunt 4240 for absorption).

FIG. 295 is a schematic illustration of an inductive fault current limiter, which limits fault current by employing a transformer to insert impedance into the circuit to be protected. An inductive fault current limiter may be implemented as a transformer as shown in FIG. 295. As shown, an inductive fault current limiter 4300 consists of a primary winding, coil 4310 and a secondary winding, coil 4315. A circuit 4320 that is to be protected is connected in series with primary coil 4410. The secondary coil 4315 is part of a closed loop composed of modified ELR material (although some or all of the primary coil and attached circuitry may also be composed of the modified ELR material). While referring to a single coil, alternative systems may employ more than one coil for the primary inductor coil, the secondary inductor coil, or both.

When no fault condition is present (i.e., under normal operation), the primary coil creates a magnetic field, which is expelled from the secondary, a shorted turn that remains below the critical magnetic field density [Hc] of the modified ELR material. As a result, the modified ELR material in the secondary circuit 4325 remains in its superconductive or ELR state with little or no resistance and reflects little or no resistance and impedance to the primary inductor. This enables the protected circuit 4320 (which is connected in series with the primary) to operate efficiently without adding impedance and resistive losses that would degrade the performance and efficiency of the circuit or system being protected. However, when a fault condition is present, the increased magnetic field penetrates the secondary and couples to the core, which effectively introduces an inductance in the secondary circuit that reflects to the primary. This transition to a non-ELR state causes a sharp rise in the resistance 4325 in the secondary circuit, which in turn reflects to the primary together with losses in the core, which are resistive. As a result, the impedance and resistance reflected to the primary serve to limit the flow of fault current in the protected circuit 4320 (which is connected in series with the primary).

FIG. 296 illustrates an inductive fault current limiter 4400 that may find use in a variety of applications. A primary winding or coil 4405 made of either traditional materials or modified ELR material is connected in series with a circuit 4420 to be protected. Within the primary coil 4405 is a secondary coil 4410 formed of a closed loop or shorted turn of modified ELR material, which serves as a shield or screen. (Alternatively, the secondary coil 4410 may be inductively coupled to the primary coil 4405, but need not necessarily be within the primary coil.) In the example of FIG. 296, the primary is wound upon a tube formed of HTS or the modified ELR material, which acts as a single turn secondary winding. The secondary coil may be formed around a core 4415 that may be made of several types of materials, including ferromagnetic materials such as iron, as described herein.

Operation of the inductive fault current limiter 4400 is consistent with the principles of inductive fault current limiters described herein. When no fault condition is present (i.e., under normal operation), the primary coil 4405 creates a magnetic field that is below the critical magnetic field intensity Hc of the cylinder of modified ELR material 4410. Consequently the magnetic field is expelled from the secondary, which acts as a shield or screen. As a result, the modified ELR material in the secondary circuit 4410 remains in its superconductive or ELR state, and little or no resistance and inductive impedance reflects to the primary coil 4405. This enables protected circuit 4420 (which is connected in series with the primary coil) to operate efficiently without adding impedance that would degrade performance or resistance that would decrease efficiency. However, when a fault condition is present, the current flowing in the primary creates a magnetic field intensity, which exceeds the critical magnetic field intensity Hc of the modified ELR material. As a result, the modified ELR material in the secondary circuit 4410 transitions to a non-ELR state. This transition to a non-ELR state causes a sharp rise in the resistance of the secondary circuit 4410, which in turn reflects with its inductive impedance to the primary 4405. As a result, the large impedance reflected to the primary coil 4405 serves to limit the flow of fault current in protected circuit 4420 (which is connected in series with the primary coil 4405). In other words, during no fault conditions the magnetic field generated by the primary does not couple to the secondary, which acts as a shield or screen. Thus the primary is at low impedance. During a fault the magnetic field penetrates the shield exceeding Hc, the secondary circuit becomes resistive and the inductive impedance of the core and its losses are introduced to the circuit. An advantage of this type of fault current limiter is that the resistance and inductance in fault conditions may be adjusted individually to suit the line and load characteristics.

Figure 297:
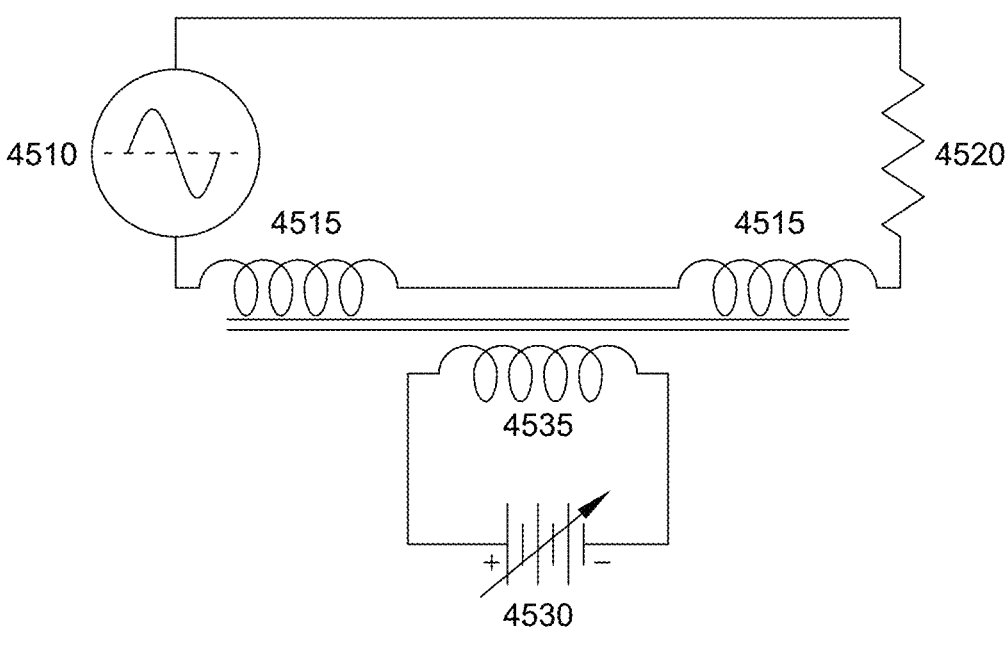

FIG. 297 is a schematic diagram of a saturable reactor-type fault current limiter, which limits fault current by saturating the core inside a load-carrying AC coils with a DC magnetic flux. Reactor fault current limiter 4500 includes an AC voltage source 4510 connected in series with two AC coil 4515 and load 4520, either or both of which may be comprised, in whole or in part, of the modified ELR material. Reactor fault current limiter 4500 further includes a DC voltage source 4530 connected in series with a DC coil 4535 formed of modified ELR materials. The AC coil is coupled to the DC coil through a core that may be formed of several possible materials, including a ferromagnetic material such as steel, as described herein. The DC coil is part of a closed loop and is composed of modified ELR material (although some or all of the DC coil and attached circuitry may also be composed of the modified ELR material). While referring to a single coil, alternative systems may employ more than one coil for the DC coil, the AC coil, or both.

When no fault condition is present (i.e., under normal operation), DC coil 4535 causes saturation of the core, where the core inductively couples the DC coil 4535 with the AC coils 4515. The saturated core results in low impedance in AC coils 4515, which enables current to flow normally. However, when a fault condition is present, magnetic flux rises in AC coils 4515 and causes the core to become unsaturated. The desaturation of the core results in an immediate increase in AC coil impedance, which in turn limits the fault current.

Figure 298:
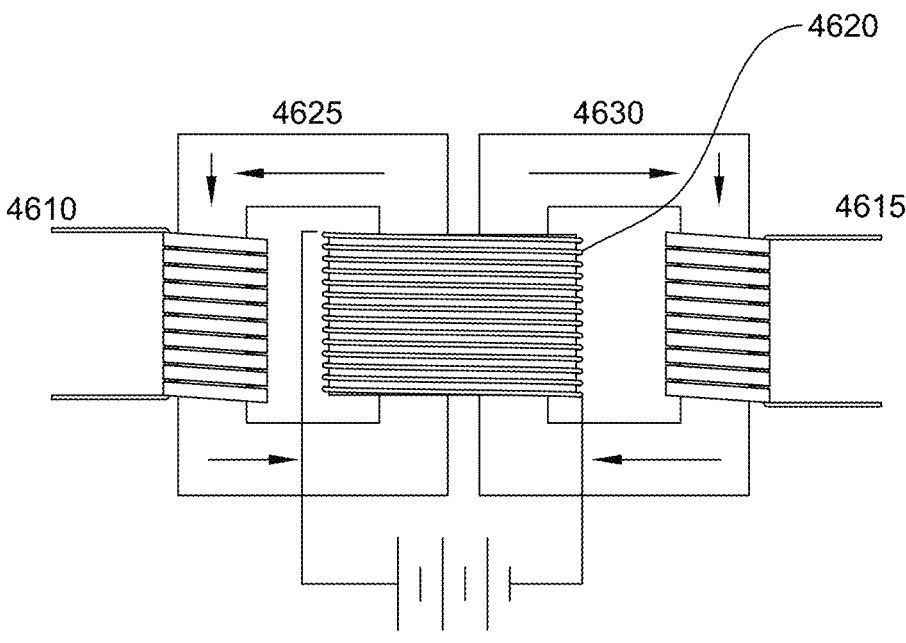

FIG. 298 illustrates a saturable reactor type fault current limiter 4600 that may find use in a variety of applications. Saturable reactor type fault current limiter 4600 includes two AC coils 4610 and 4615, at least one of which is connected to an AC load (not shown). Saturable reactor type fault current limiter 4610 further includes a DC coil 4620 connected in series with DC voltage source (not shown). The AC coils 4610 and 4615 are coupled to DC coil 4620 through cores 4625 and 4630 that may be formed of several possible materials, including a ferromagnetic material such as steel, as described herein. The DC coil 4620 is part of a closed loop composed of modified ELR material (although some or all of the DC coil and attached circuitry may also be composed of the modified ELR material). While referring to a single DC coil and two AC coils, alternative systems may employ one or more coils for the DC coil, the AC coil, or both.

When no fault condition is present (i.e., under normal operation), DC coil 4620 causes saturation of cores 4625 and 4630, which are coupled both to DC coil 4620 and AC coils 4610 and 4615. The saturated cores 4625 and 4630 result in a low impedance in AC coils 4610 and 4615, which enables current to flow normally in the protected AC circuit. However, when a fault condition is present, magnetic flux rises in AC coils 4610 and 4615 and causes cores 4625 and 4630 to become unsaturated. The desaturation of cores 4625 and 4630 results in an immediate increase in the impedance of AC coils 4610 and 4630, which in turn limits the fault current in the protected AC circuit.

The fault current limiters described herein may be implemented with inductors and other components formed at least partially from modified ELR or other materials, as described below.

Inductors Having ELR Components

Inductors, such as air core or magnetic core inductors, that include components formed from modified extremely low resistance (ELR) films, are described. In some examples, the inductors include a core and a nanowire coil formed from modified ELR film. In some examples, the inductors include a core and tape or foil coil formed from modified ELR film. In some examples, the inductors are formed using thin-film modified ELR films. The modified ELR films provide extremely low resistances to current at temperatures higher than temperatures normally associated with current high temperature superconductors (HTS), enhancing the operational characteristics of the rotating machines at these higher temperatures, among other benefits.

In some examples, the modified ELR films are manufactured based on the type of materials, the application of the modified ELR film, the size of the component employing the modified ELR film, the operational requirements of a device or machine employing the modified ELR film, and so on. As such, during the design and manufacturing of an inductor, the material used as a base layer of a modified ELR film and/or the material used as a modifying layer of the modified ELR film may be selected based on various considerations and desired operating and/or manufacturing characteristics.

Various devices, applications, and/or systems may employ the modified ELR inductors. In some examples, tuned or resonant circuits and their applications employ modified ELR inductors. In some examples, transformers and their applications employ modified ELR inductors. In some examples, energy storage devices and their applications employ modified ELR inductors. In some examples, current limiting devices and their applications employ ELR inductors.

Figure 299:
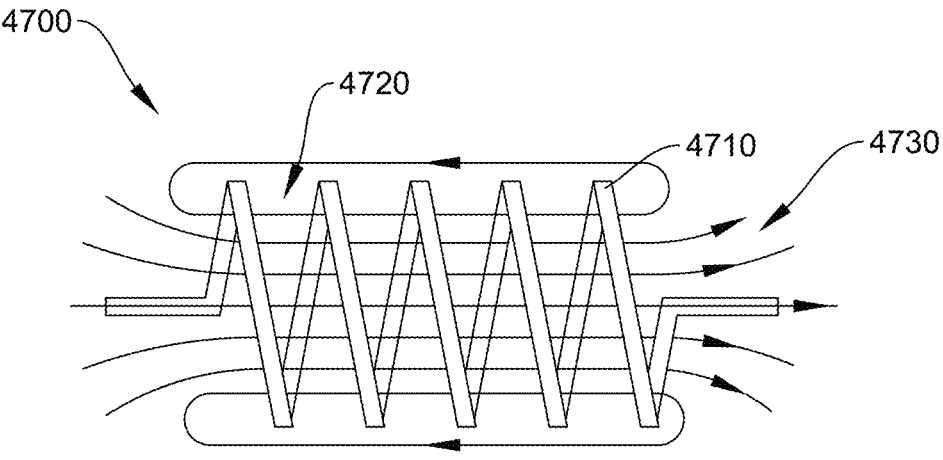

FIG. 299 is a diagram illustrating an air core inductor 4700 having a modified ELR film. The inductor 4700 includes a coil 4710 and an air core 4720. When the coil 4710 carries a current (e.g., in a direction towards the right of the page), a magnetic field 4730 is produced in the core 4720. The coil is formed, at least in part, of a modified ELR film, such as a film having a ELR material base layer and a modifying layer formed on the base layer. Various suitable modified ELR films are described in detail herein.

A battery or other power source (not shown) may apply a voltage to the modified ELR coil 4710, causing current to flow within the coil 4710. Being formed of a modified ELR film, the coil 4710 provides little or no resistance to the flow of current in the at temperatures higher than those used in conventional HTS materials, such as room or ambient temperatures (~21° C.). The current flow in the coil produces a magnetic field within the core 4720, which may be used to store energy, transfer energy, limit energy, and so on.

Because the inductor 4700 includes a coil 4710 formed of extremely low resistance materials (i.e. a modified ELR film), the inductor may act similarly to an ideal inductor, where the coil 4710 exhibits little or no losses due to winding or series resistance typically found in inductors with conventional conductive coils (e.g., copper coils), regardless of the current through the coil 4710. That is, the inductor 4700 may exhibit a very high quality (Q) factor (e.g., approaching infinity), which is the ratio of inductive reactance to resistance at a given frequency, or Q=(inductive reactance)/resistance.

In some examples, the modified ELR coil provides extremely low resistance to the flow of current at temperatures between the transition temperatures of conventional HTS materials (~80 to 135 K) and room temperatures (~294 K). In these examples, the inductor may include a cooling system (not shown), such as a cryogenic cooler or cryostat, used to cool the coil 4710 to a critical temperature for the type of modified ELR film utilized by the coil 4710. For example, the cooling system may be a system capable of cooling the coil 4710 to a temperature similar to that of liquid Freon™, to a temperature similar to that of ice or melting ice, or other temperatures discussed herein. That is, the cooling system may be selected based on the type and structure of the modified ELR film or material utilized in the coil 4710.

In some examples, the air core 4720 is self-supporting. In other examples, the air-corer 4720 is formed of a non-magnetic material (not shown), such as plastic or ceramic. The material or shape of the core may be selected based on a variety of factors. For example, selecting a core material having a higher permeability than the permeability of air will generally increase the density of the induced magnetic field 4730, and thus increase the inductance of the inductor 4700. In another example, selecting a core material may be governed by the desire to reduce core losses in high frequency applications. One skilled in the art will appreciate the core may be formed of a number of different materials and into a number of different shapes in order to achieve certain desired properties and/or operating characteristics.

As is known in the art, the configuration of the coil 4710 may affect certain operational characteristics, such as the inductance. For example, the number of turns of a coil, the cross-sectional area of a coil, the length of a coil, and so on, may affect the inductance of an inductor. It follows that inductor 4700, although shown in one configuration, may be configured in a variety of ways in order to achieve certain operational characteristics (e.g., inductance values), to reduce certain undesirable effects (e.g. skin effect, proximity effect, parasitic capacitances), and so on.

In some examples, the coil 4710 may include many turns lying parallel to one another. In some examples, the coil may include few turns that are wound at different angles to one another. Thus, coil 4710 may be formed into a variety of different configurations, such as honeycomb or basket-weave patterns, a wave winding, etc., where successive turns criss-cross at various angles to one another, spiderweb patterns, a pi winding, etc. where the coil is formed of flat spiral coils spaced apart from one another, as litz wires, where various strands are insulated from one another to reduce ac resistance, and so on.

Figure 300:
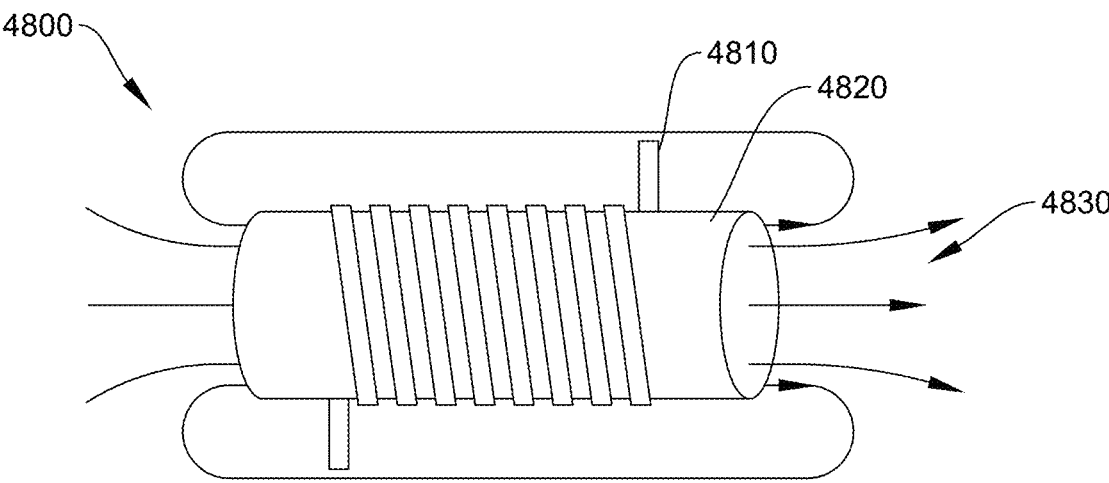

In addition to air core inductors, magnetic core inductors, such as inductor 4800, may also utilize modified ELR films, as will now be discussed. FIG. 300 is a schematic diagram illustrating a magnetic core inductor 4800 employing a modified ELR film. The inductor 4800 includes a coil 4810 and a magnetic core 4820, such as a core formed of ferromagnetic or ferromagnetic materials. Similar to the inductor 4700 of FIG. 299, a magnetic field 4830 is produced in the core 4820 when current is carried by the coil 4810. The coil is formed, at least in part, of a modified ELR film, such as a film having a ELR material base layer and a modifying layer formed on the base layer. Various suitable modified ELR films are described in detail herein. Being formed of a modified ELR film, the coil 4810 provides little or no resistance to the flow of current in the at temperatures higher than those used in conventional HTS materials, such as room or ambient temperatures (~21° C.). The current flow in the coil produces a magnetic field 4830 within the core 4820, which may be used to store energy, transfer energy, limit energy, and so on.

The magnetic core 4820, being formed of ferromagnetic or ferromagnetic materials, increases the inductance of the inductor 4800 because the magnetic permeability of the magnetic material within the produced magnetic field 4830 is higher than the permeability of air, and thus is more supportive of the formation of the magnetic field 4830 due to the magnetization of the magnetic material. For example, a magnetic core may increase the inductance by a factor of 1,000 or greater.

The inductor 4800 may utilize various different materials within the magnetic core 4820. In some examples, the magnetic core 4820 is formed of a ferromagnetic material, such as iron. In some examples, the magnetic core 4820 is formed of a ferromagnetic material, such as ferrite. In some examples, the magnetic core 4820 is formed of laminated magnetic materials, such as silicon steel laminations. One of ordinary skill will appreciate that other materials may be used, depending on the needs and requirements of the inductor 4800.

In addition, the magnetic core 4820 (and, thus, the inductor 4800) may be configured into a variety of different shapes. In some examples, the magnetic core 4820 may be a rod or cylinder. In some cases, the magnetic core 4820 may be a toroid. In some cases, the magnetic core 4820 may be moveable, enabling the inductor 4800 to realize variable inductances. One of ordinary skill will appreciate that other shapes and configurations may be used, depending on the needs and requirements of the inductor 4800. For example, the magnetic core 4820 may be constructed to limit various drawbacks, such as core losses due to eddy currents and/or hysteresis, and/or nonlinearity of the inductance, among other things.

Thus, in some examples, forming the coil 4710 of the inductor 4700 or the coil 4810 of the inductor 4800 using modified ELR materials and/or components, such as modified ELR films, increases the Q factor of the inductors by lowering or eliminating the resistance to current within the coils, among other benefits.

Manufacturing and/or Forming Inductors Composed of ELR Films

Figure 301:
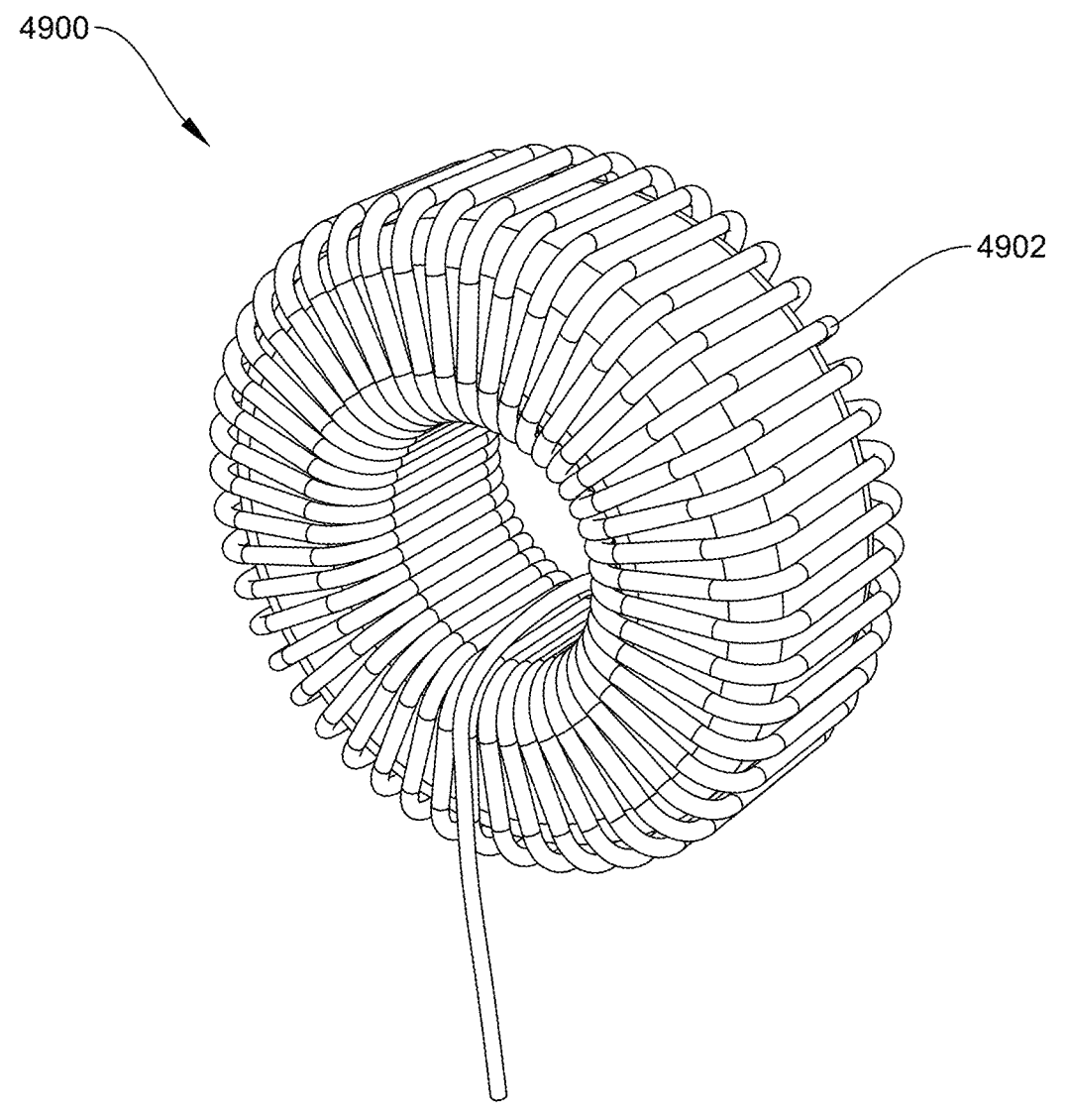

As described herein, in some examples, a coil of an inductor exhibits extremely low resistances to carried current because it is formed of modified ELR materials. FIG. 301 is a picture showing an inductor 4900 employing a modified ELR nanowire. The inductor 4900 includes a coil 4902 formed as a modified ELR nanowire that is composed of the ELR components described herein, such as modified ELR films.

In forming an ELR wire, multiple ELR tapes or foils may be sandwiched together to form a macroscale wire. For example, a coil may include a supporting structure and one or more ELR tapes or foils supported by the supporting structure.

In addition to ELR wires, inductors may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

Figure 302:
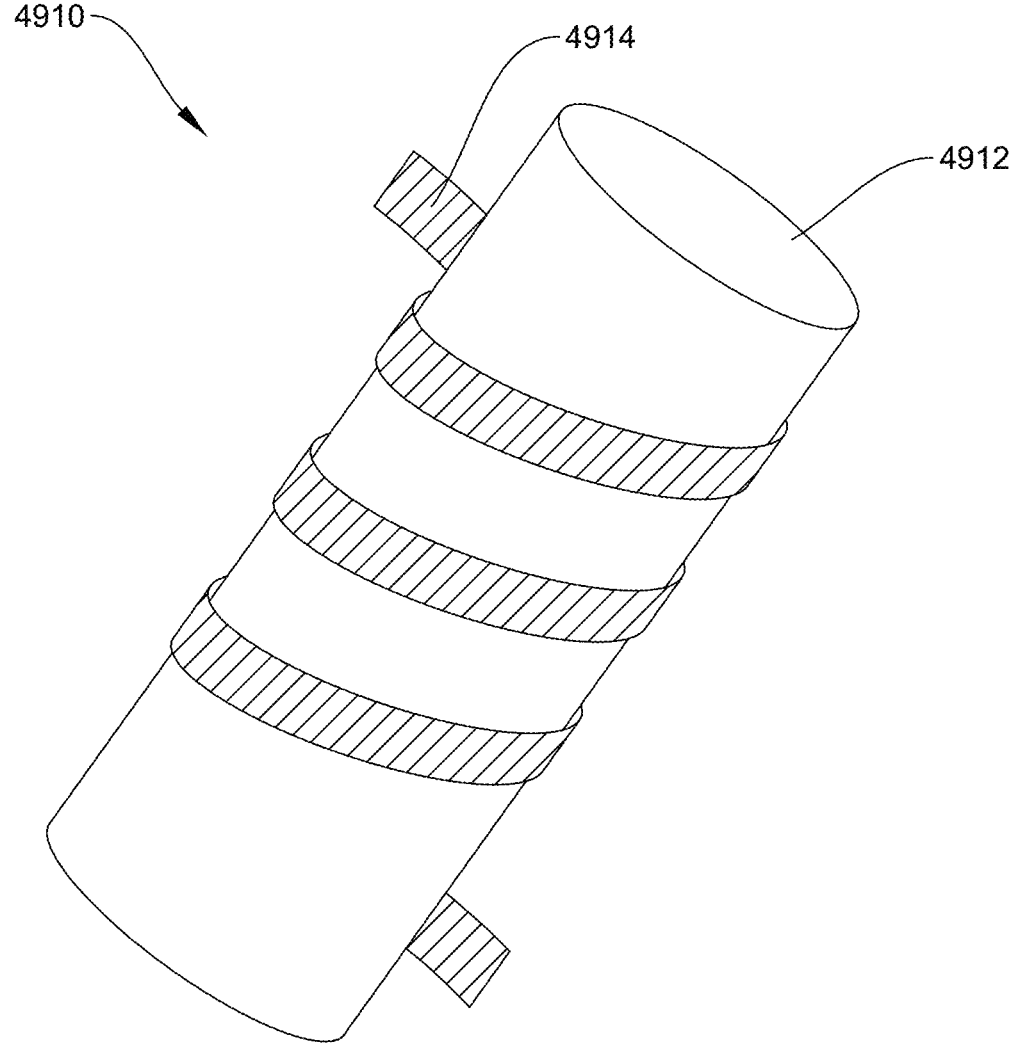

In addition to nanowires, modified ELR tapes or foils may also be utilized by the inductors and devices described herein. FIG. 302 is a diagram illustrating an inductor 4910 employing a modified ELR tape or foil. The inductor 4910 includes a core 4912, such as an iron core, and a coil 4914 formed of a modified ELR tape.

There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials.

Figure 303:
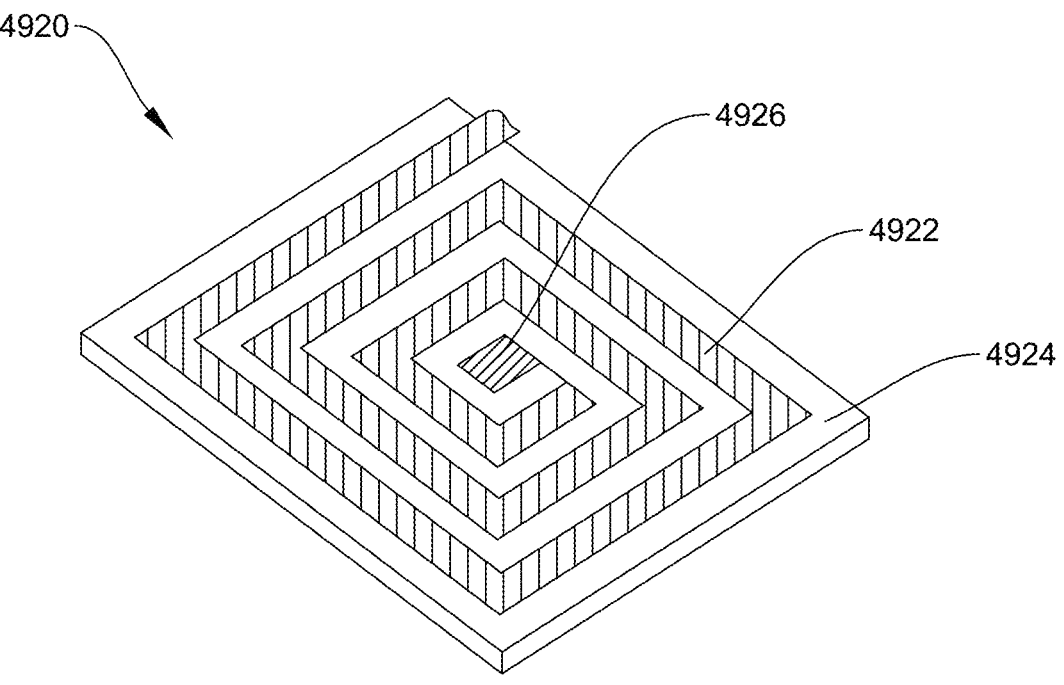

Furthermore, thin film inductors may utilize the ELR components described herein. FIG. 303 is a schematic diagram illustrating an inductor 4920 employing a modified ELR thin film component. The inductor 4920 includes a modified ELR coil 4922 formed onto a printed circuit board 4924, and an optional magnetic core 4926. The coil 4922, which may be a modified ELR film etched into the board 4924, may be formed in a variety of configurations and/or patterns, depending on the needs of the device or system employing the inductor. Further, the optional magnetic core 4926 may be etched into the boars 4924, as shown, or there may be a planar core (not shown) positioned above and/or below the coil 4922.

Thus, the modified ELR films may formed into tapes, foils, rods, strips, nanowires, thin films, and other shapes, geometries, or structures capable of moving or carrying current from one point to another in order to produce a magnetic field.

In some examples, the type of materials used in the modified ELR films may be determined by the type of application utilizing the films. For example, some applications may utilize modified ELR films having a BSCCO ELR layer, whereas other applications may utilize a YBCO layer. That is, the modified ELR films described herein may be formed into certain structures (e.g., tapes or nanowires) and formed from certain materials (e.g., YBCO or BSCCO) based on the type of machine or component utilizing the modified ELR films, among other factors.

Various processes may be employed in manufacturing an inductor, such as inductors 4900, 4910, and/or 4920. In some examples, a core is formed, maintained, received and/or positioned. The core may take on various shapes or configurations. Example configurations include a cylindrical rod, a single "I" shape, a "C" or "U" shape, an "E" shape, a pair of "E" shapes, a pot shape a toroidal shape, a ring or bead shape, a planar shape, and so on. The core may be formed of various non-magnetic and magnetic materials. Example materials include iron or soft iron, silicon steel, various laminated materials, alloys of silicon, carbonyl iron, iron powders, ferrite ceramics, vitreous or amorphous metals, ceramics, plastics, air, and so on.

In addition, a coil, such as a coil formed of a modified ELR nanowire, tape, or thin film, is configured into a desirable shape or pattern and coupled to the formed or maintained core. In some examples, there is no core, and the modified ELR nanowire is configured to the desirable shape or pattern. In some examples, a modified ELR nanowire coil is etched directly to a printed circuit board, and a planar magnetic core is positioned with respect to the etched coil. One of ordinary skill will appreciate that other manufacturing processes may be utilized when manufacturing and/or forming the inductors described herein.

While a single fault current limiter is generally described above for each application, two or more fault current limiters may be provided within a given chip, housing, grid substation, or other environment. Indeed, a given environment may employ one or more chips or implementations having one or more of the disclosed fault current limiters, which in turn may be incorporated into one or more housings, and which may further be incorporated into larger scale environments, such as within an electrical distribution grid. Of course, the fault current limiters described herein may be fabricated together with both the ELR material, as well as with conventional materials.

Additional Fault Current Limiter Applications Having ELR Components

The fault current limiters described above may be suited for use in numerous applications, ranging for use on a chip, to use in an electrical grid. By employing a modified ELR material in such fault current limiters, the fault current limiters provide resistance at orders of magnitude less than the best common conductors under similar conditions.

Further, such fault current limiters can be fabricated in smaller and more compact forms, such as on chips, as noted above, where such chips may include other components, such as logic, analog circuitry, etc. By employing on-chip fault current limiters, the chip may obviously benefit from improved protection and performance. By employing the ELR material within the chip, the chip may also enjoy greater density of circuitry, among other benefits. For example, by employing the ELR material, the chip enjoys less heat generation, and can employ thinner conductors because more current may travel in the same line width. Conductors, and interconnects may be fabricated from the ELR material. Moreover, signals may be transmitted without amplification, since insertion loss is greatly reduced.

As noted above, the modified ELR material has a performance that is dependent on temperature. As a result, the fault current limiters described herein employing the modified ELR material are likewise dependent on temperature. Temperature variation affects field penetration into strip conductors, which affects superconducting penetration depth. Such variations of the material can be modeled based on the temperature versus response behavior for the modified ELR materials as described herein, or can be empirically derived. Notably, by employing the modified ELR materials, the resistance of the line is negligible, but that resistance can be adjusted based on temperature, as shown in the temperature graphs provided herein. Therefore, the fault current limiter design can be adjusted to compensate for temperature, or the fault current limiter operation can be adjusted by varying the temperature.

Figure 304:
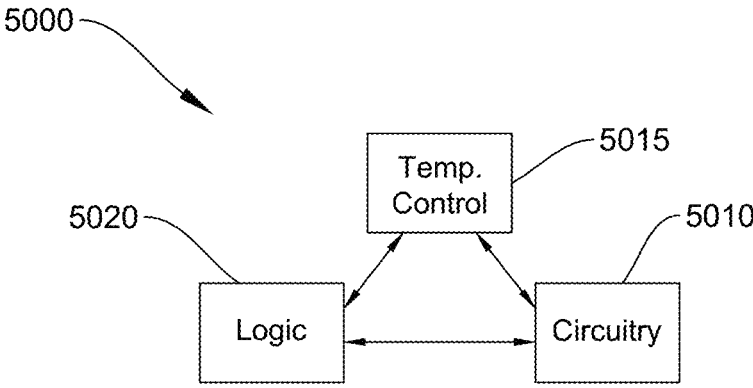

Referring to FIG. 304, an example is shown of a system 5000 that includes circuitry 5010 coupled to a temperature control circuit 5015, and logic 5020. (While all blocks are shown as interconnected in FIG. 304, fewer connections are possible.) The circuitry 5010 employs one or more of the fault current limiters described herein, which are at least partially formed from the ELR material. The logic controls the temperature control circuitry, which in turn controls a cooler/refrigerator, such as a cryogenic, liquid, or gas cooler that cools the circuitry 5010. Thus, to increase the sensitivity or response of the system 5000, the logic 5020 signals the temperature-control circuit 5015 to decrease the temperature of the circuitry 5010. As a result, the circuitry 5010 employing the ELR material causes the ELR material to increase conductivity, thereby increasing the circuit's sensitivity or response.

While individual fault current limiters are shown, fault current limiters may be joined together to form fault current limiter banks or arrays, or other more complex fault current limiter systems. As with the other categories of fault current limiters discussed herein, many configurations of fault current limiter arrays are possible and are design considerations for a designer implementing a fault current limiter or multi-fault current limiter system that is at least partially formed from the modified ELR material. The modified ELR materials described herein may be used in multi-fault current limiter systems that comprise a combination of two or more of the fault current limiters and principles described herein, even if those combinations are not explicitly described. Indeed, such multi-fault current limiter systems may employ two or more dissimilar or heterogeneous fault current limiters (e.g. resistive and inductive), not simply similar or homogenous fault current limiters (e.g. both inductive). Such an fault current limiter system can include relatively homogenous fault current limiters all formed of the modified ELR material, or a heterogeneous mix of different types of fault current limiters, some fault current limiters formed of non-ELR material, or a combination of differing fault current limiters and differing materials. Thus, complex fault current limiter systems may employ two or more fault current limiters formed of two or more homogeneous fault current limiters formed primarily of the modified ELR material, two or more heterogeneous fault current limiters formed primarily of the modified ELR material, and/or two or more homogeneous/heterogeneous fault current limiters formed of both conventional conductors and the modified ELR material.

Although specific examples of fault current limiters that employ components formed partially or exclusively from modified ELR materials are described herein, one having ordinary skill in the art will appreciate that virtually any fault current limiter configuration may employ components that are formed at least partially from modified ELR materials, such as those components listed above, e.g., to conduct electrical currents, receive signals, or transmit or modify electromagnetic signals. (While the ELR material may be used with any conductive elements in a circuit, it may be more appropriate to state, depending upon one's definition of "conductive" that the modified ELR material facilitates propagation of energy or signals along its length or area.) As a result, it is impossible to enumerate in exhaustive detail all possible fault current limiters and fault current limiter systems that may employ components that are formed from modified ELR materials.

While some suitable geometries are shown and described herein for some fault current limiters, numerous other geometries are possible. These other geometries include different patterns, configurations or layouts with respect to length and/or width, in addition to differences in thickness of materials, use of different layers, and other three-dimensional structures (e.g. in the types of coils and cores). The inventors contemplate that virtually all fault current limiters and associated systems known in the art may employ modified ELR material and believe that one having ordinary skill in the art who is provided with the various examples of ELR materials, fault current limiters, and principles in this application would be able to implement, without undue experimentation, other fault current limiters with one or more components formed in whole or in part from the modified ELR materials.

In some implementations, a fault current limiter (FCL) that includes modified ELR materials may be described as follows:

An inductive fault current limiter, comprising: a primary inductor coil connected in series with a circuit to be protected; and a secondary inductor coil placed in series in a closed loop; wherein the primary inductor coil and secondary inductor coil are inductively coupled together such that an inductance may be mutually induced between the primary inductor coil and the secondary inductor coil; wherein the secondary inductor coil comprises a core and a modified extremely low resistance (ELR) nanowire configured into a coil shape at least partially surrounding the core; and wherein the modified ELR nanowire is formed of a modified ELR film having a first layer comprised of an ELR material and a second layer comprised of a modifying material bonded to the ELR material of the first layer.

An apparatus, comprising: a first three dimensional coil wrapped at least partially around a first core; a second three dimensional coil wrapped at least partially around a second core; wherein the first three dimensional coil and the second three dimensional coil each include a first portion having an extremely low resistance (ELR) material and a second portion bonded to the first portion that lowers the resistance of the ELR material; and wherein the first three dimensional coil and the second three dimensional coil are inductively via the first three dimensional coil and the second three dimensional coil.

An inductive fault current limiter for use in an electrical power distribution grid, comprising: a primary inductor coil connected in series with a circuit to be protected, circuit to be protected is downstream of an electrical power generation source; and a secondary inductor coil placed in series in a closed loop; wherein the primary inductor coil and secondary inductor coil are inductively coupled together such that an inductance may be mutually induced between the primary inductor coil and the secondary inductor coil; wherein the primary inductor coil and secondary inductor coil are sized and configured to accommodate currents or voltages higher than currents or voltages associated with electrical power provided to standard household consumers; wherein the secondary inductor coil comprises a core and a modified extremely low resistance (ELR) nanowire configured into a coil shape at least partially surrounding the core; and wherein the modified ELR nanowire is formed of a modified ELR film having a first layer comprised of an ELR material and a second layer comprised of a modifying material bonded to the ELR material of the first layer.

A resistive fault current limiter, comprising: a resistive element coupled to a circuit to be protected wherein the resistive element is coupled in series between the circuit and a source of electrical power; wherein the resistive element includes at least a portion of which is formed from modified ELR nanowire or tape that is formed of a modified ELR film having a first layer comprised of an ELR material and a second layer comprised of a modifying material bonded to the ELR material of the first layer.

A reactor fault current limiter, comprising: a primary inductor coil connected in series with a circuit to be protected, wherein the circuit to be protected receives an alternating current power; and a secondary inductor coil placed in series in a closed loop; wherein the primary inductor coil and secondary inductor coil are inductively coupled together such that an inductance may be mutually induced between the primary inductor coil and the secondary inductor coil; wherein the secondary inductor coil comprises a core and a modified extremely low resistance (ELR)

nanowire configured into a coil shape at least partially surrounding the core; wherein the secondary conductor coil is coupled to a direct current voltage source; and wherein the modified ELR nanowire is formed of a modified ELR film having a first layer comprised of an ELR material and a second layer comprised of a modifying material bonded to the ELR material of the first layer.

An apparatus for protecting an appliance or device, the apparatus comprising: a first modified ELR nanowire or tape formed into a first three dimensional coiled shape, wherein the first modified ELR nanowire or tape is formed of a modified ELR film having a first layer of an ELR material and a second layer of a modifying material bonded to the ELR material; a second modified ELR nanowire or tape formed into a second three dimensional coiled shape around a core, wherein the second modified ELR nanowire or tape is formed of a modified ELR film having a first layer of an ELR material and a second layer of a modifying material bonded to the ELR material; wherein the second three dimensional coil receives a DC voltage, wherein the first three dimensional coil and the second three dimensional coil are positioned such that an inductance may be mutually induced between the first three dimensional coil and the second three dimensional coil; and an output electrical port for releasably coupling the first three dimensional coil with the appliance or device to be protected; an electrical power input port for receiving external electrical AC power; and, a housing for enclosing the first three dimensional coil and the second three dimensional coil, the output electrical port, and the electrical power input port.

Chapter 17—Transformers Formed of ELR Materials

This chapter of the description refers to FIGS. 1-36 and FIGS. 305-320; accordingly all reference numbers included in this section refer to elements found in such figures.

An ideal transformer would have no energy losses and would be 100% efficient, but conventional transformers dissipate energy in the windings, core, etc., often as a result of resistance in conductors. Existing transformers using superconducting windings have achieved efficiencies of over 99%, because most losses are due to electrical resistance in the windings. However, transformers with superconducting windings have the drawback of requiring costly, unreliable cryogenic cooling to achieve the high efficiency.

Described in detail herein are various types of transformers employing windings or inductor coils formed of modified, apertured, and/or other new extremely low resistance (ELR) films and materials, which overcome most problems of existing transformers and thereby approach that of an ideal transformer. The transformers described herein effectively reduce winding resistance to zero. Other losses in transformers result from eddy currents, hysteresis losses, magnetostriction, and stray field losses. Some of these losses are not directly compensated for by use of the ELR material, but others such as ac losses in the windings may be reduced by using the ELR material.

Various devices, applications and/or systems may employ the transformers described herein, all of which employ modified ELR materials described below. These transformers provide numerous benefits, such as transformers that are more efficient than those fabricated from conventional materials or existing HTS materials. An additional benefit is that the transformers described herein are capable of occupying less space than those fabricated from conventional materials and existing HTS materials. The reduction in size results from the increased current density of the modified ELR materials that form the windings of the transformers, and the reduced requirement to dissipate heat from those windings.

Furthermore, transformers wound with HTS materials require cryogenic cooling that may require winding heat-exchange modifications to ensure that all portions of the windings are maintained below the critical temperature (Tc). Accordingly, the transformers described herein using the modified ELR material provide the ability to protect circuits, step up/down alternating voltage or other benefits in applications ranging from small scale to large scale. For example, the transformers described herein may be employed as chargers for in small electronic devices such as mobile phones, in power supplies for larger electronic devices such as televisions or stereo systems, or they may be used in large scale applications such as in substation equipment or in regional electric transmission and distribution systems that carry thousands of amperes.

Any of the transformers described herein can be of one or more of several general types of transformers, including autotransformers, polyphase transformers, matching transformers, isolation transformers, polyphase transformers, high leakage reactance leakage transformers, resonant transformers, step-up or step-down transformers, etc. By employing the ELR materials for inductors and other elements of the transformers described herein, transformers can be fabricated that find broad application in many technologies, for use in protecting or isolating various electronic devices and electrical systems, among other applications.

The transformers disclosed herein are suitable for applications of a variety of different scales. For example, these applications may range from small-scale applications at the component or chip level (e.g., to protect circuits or change voltage levels), to medium scale applications at the system or device level (e.g., in 120 volt ac power supplies), to larger scale applications in electric distribution or transmission grids. Before providing details regarding the novel transformers, some details regarding some applications for the transformers will be provided.

Figure 305:
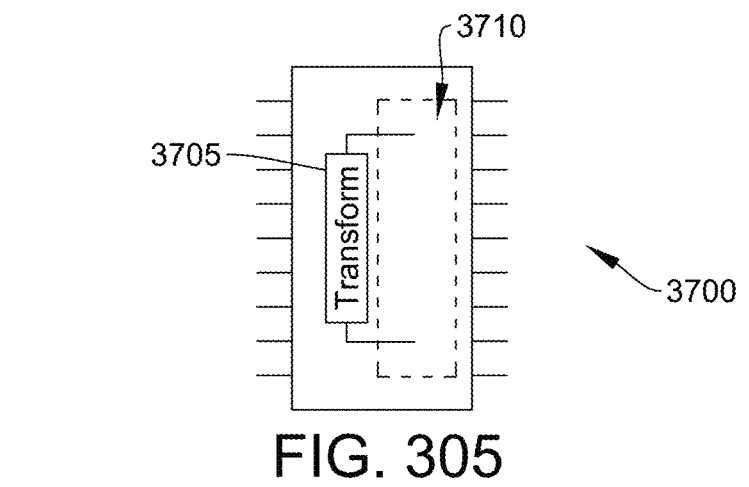
FIGS. 305 to 320 illustrate the forming of transformers using ELR materials.

Regarding small-scale applications, FIG. 305 is a schematic diagram illustrating a chip or other monolithic structure containing a transformer employing a modified ELR material. Chip 3700 contains circuitry 3710 that is to be protected/isolated, that operates from a rectified and filtered stepped up/down voltage, etc, via transformer 3705. The circuit 3710 may consist of one or more individual circuits or circuit components. In the implementation of FIG. 305, transformer 3705 is placed in series with protected circuit 3710. However, a person of ordinary skill in the art will appreciate that the transformer may connect to the circuit in any of multiple possible configurations, including a connection in parallel, coupling via an electric or magnetic field, etc.

By employing on-chip transformers, the chip may obviously benefit from the common benefits and operation of transformers, but may enjoy many additional benefits. By employing the ELR material within the chip 3700, the chip may enjoy greater density of circuitry, among other benefits. For example, by employing the ELR material, the chip has less heat loss, and can employ thinner conductors because more current may travel per conductor. Conductors and/or interconnects may be fabricated from the ELR material. Moreover, signals may be transmitted without amplification, since conductor insertion loss is greatly reduced. Further, the chip may be fabricated with some of the smallest scale integrated circuit manufacturing techniques, such as ≤45 nm minimum feature size technology. With decreased feature size, circuit designers have fewer constraints based on conductor layout or length, which can accelerate physical design, among other benefits.

Figure 306:
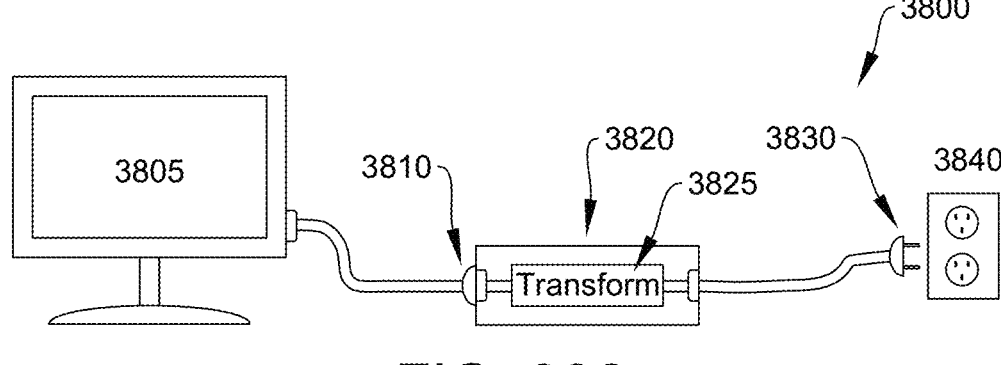

Regarding medium scale applications, FIG. 306 illustrates one example of a system 3800 that includes a transformer encased in a housing and connected to a device such as a consumer appliance. For example, transformer 3825 may reside on a board (such as a PCB) and be encased in a single housing 3820, to thereby form a box or appliance to protect/isolate and power any electrical equipment attached thereto. For example, the housing 3820 may contain a female connection at one end and a power cord having a male connection at the opposite end. In this example, a consumer may plug an electrical device (such as computer or television 3805) into the female end 3810 of the transformer housing 3820 and plug the male end 3830 into electrical outlet 3840. The electrical device 3805 would then be protected and powered by transformer 3825. Of course, the transformer may be integrated with other components within the electrical equipment itself (e.g., on the same printed circuit board as the circuits of the device), and thus be housed with those other circuits. Thus, the transformer can be housed within the computer or television 3805, rather than being an external, separate box.

Although television 3805 is shown, a person of ordinary skill in the art will appreciate that the transformer 3825 may be connected to or integrated with a variety of consumer devices, such as stereo equipment, alarm clocks, kitchen appliances, power tools, and the like. Moreover, the transformer 3825 may be used with any other device, such as medical or scientific devices. Moreover, a person of ordinary skill in the art will appreciate that the transformer 3825 and connections thereto may vary and are not limited to connections to standard power outlets or to standard consumer line voltages.

Figure 307:
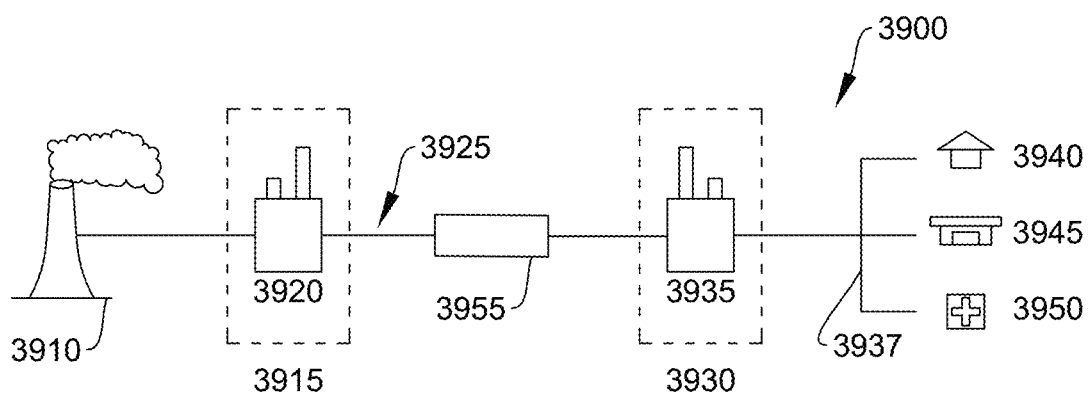

Transformers find significant service in large-scale applications, such as in electric power grids. FIG. 307 is an illustration of an electric power grid that includes at least one transformer that employs modified ELR materials. Power plant 3910 generates electricity that energizes the grid. The power plant may be of any type capable of generating electricity for use on the grid, such as coal, geothermal, nuclear, methane, hydro, wind, or solar. After generation, the voltage from power plant 3910 is raised (or "stepped-up") to a higher voltage that is suitable for transmission over a long distance, such as 230 kV. The voltage step-up may occur in high voltage switchyard 3915, which may include a step-up transformer 3920 therein that raises the voltage through a series of coils wrapped around a core.

The stepped-up voltage is transmitted over high voltage transmission lines 3925 to substation 3930. Substation 3930 includes a step-down transformer 3935, which lowers the voltage to a level suitable for local distribution, such as 13.3 kV. The distribution voltage is then carried over distribution lines 3937 to additional step-down transformers terminating at various customers, such as house 3940, school 3945, or hospital 3950. Power grid 3900 may include intermediate transformer 3955 coupled between step-up transformer 3915 and step-down transformer 3930. Additionally, a person of ordinary skill in the art will appreciate that more transformers may be placed within simplified grid of FIG. 307.

Figure 308:
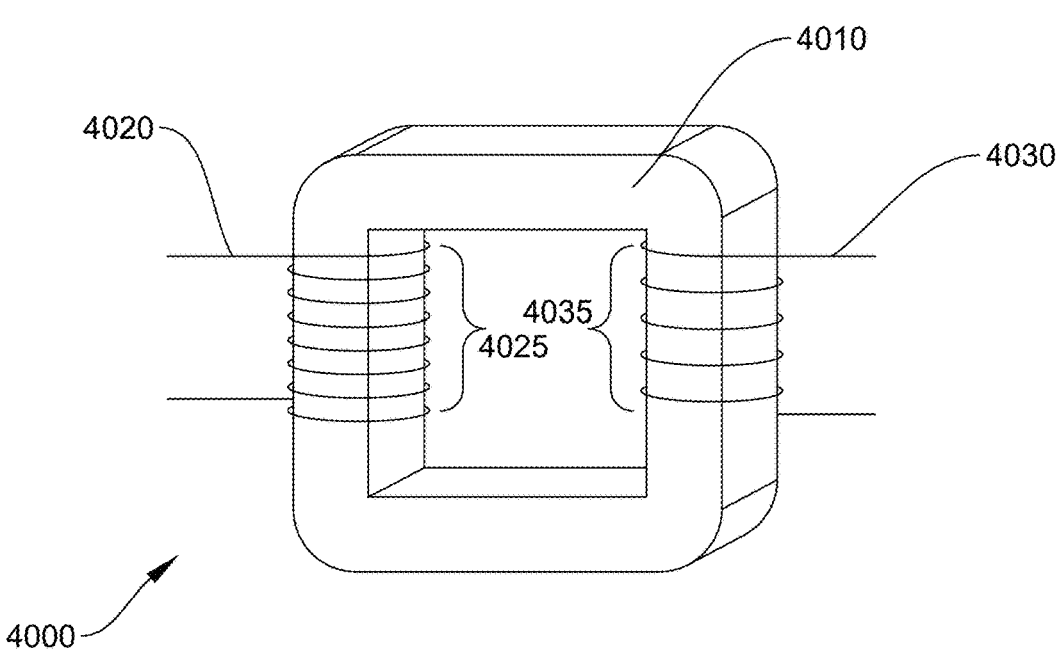

FIG. 308 is a schematic diagram illustrating a transformer 4000 having modified ELR primary and secondary windings. The transformer 4000 includes a magnetic core 4010, a primary winding 4020 having primary winding turns 4025, and a secondary winding 4030 having secondary winding turns 4035. The primary winding 4020 and the secondary winding 4030 are formed of the modified ELR materials, such as modified ELR nanowires. As noted above, in some examples, the transformer 4000 may be part of a utility power grid, while in other examples, the transformer 4000 may be part of appliances and other electronic devices that step up or down supply voltages during operation. In some examples, the transformer 4000 may be a signal or audio transformer rather than a power transformer. One skilled in the art will appreciate that the transformer 4000 may be implemented in many other applications and devices not described herein. One skilled in the art will appreciate that various core layouts and winding arrangements may be implemented depending on the application.

Utilization of extremely low resistance materials, such as the modified ELR materials described herein, may provide a variety of advantages and benefits to the transformer 4000 and/or various applications. For example, transformers utilizing modified ELR materials within coils exhibit fewer resistive losses, which can greatly affect the cost of operation by minimizing energy losses within the transformer, among other benefits, while avoiding the problems associated with conventional superconducting materials, such as the cost and reliability of cryogenic cooling systems, among other things.

Figure 309:
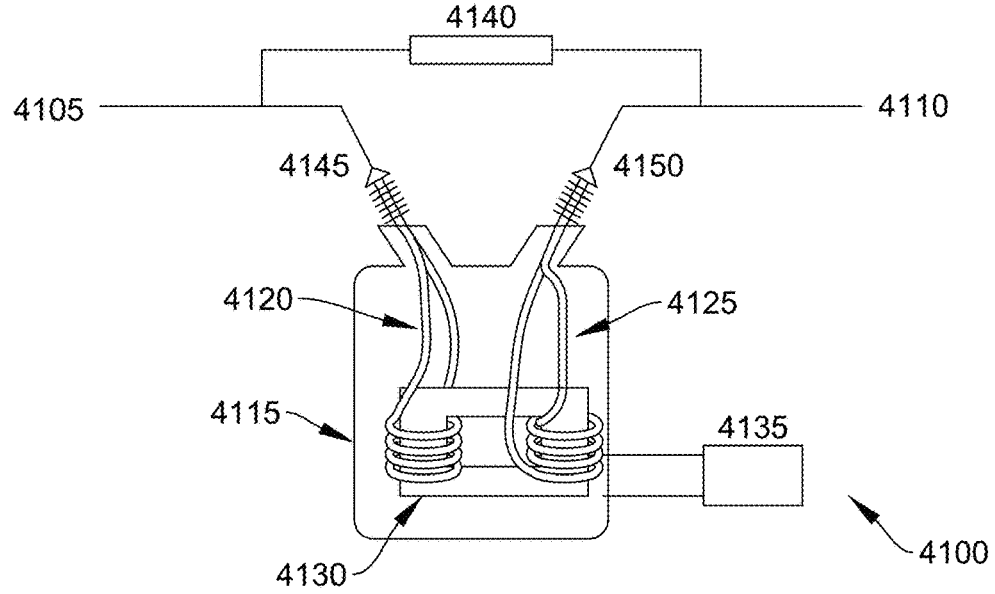

FIG. 309 illustrates another transformer 4100 that may find use in a variety of applications, including placement on a power grid. Transformer 4100 includes a housing or shell 4115 that is coupled to a line 4105 and a load 4110. The line 4105, which may be formed of either conventional materials or modified ELR materials, may enter the transformer shell 4115 through external connection 4145. A primary or first winding 4120, coupled to the line 4105 and formed of either conventional materials or modified ELR materials, is wound around a core 4130 that resides within transformer shell 4115. A second winding 4125 is wound around the opposite end of the core 4130 and may be formed of either conventional material or modified ELR material. An output conductor 4150 is coupled between the second coil 4125 and the load 4110.

Depending upon the application, the shell 4115 may contain a coolant such as transformer oil; however, by using the modified ELR material, the use or need for coolants may be reduced or eliminated. In addition, a cooling unit 4135 may be coupled to transformer shell 4115 in order to cool the modified ELR material 4115 to ambient temperatures. Although the modified ELR material is capable of operating in a superconductive state at room temperatures, as described herein, cooling unit 4135 may nonetheless be necessary to cool the modified ELR material to room temperatures due to excessive heat that may be generated by surrounding high voltage transmission equipment and exposure to ambient heat or direct sunlight in warm weather. Further, by controlling the temperature of the modified ELR material, the electrical performance or response of the transformer may be adjusted, as described in more detail herein.

Figures 310, 311, 312:
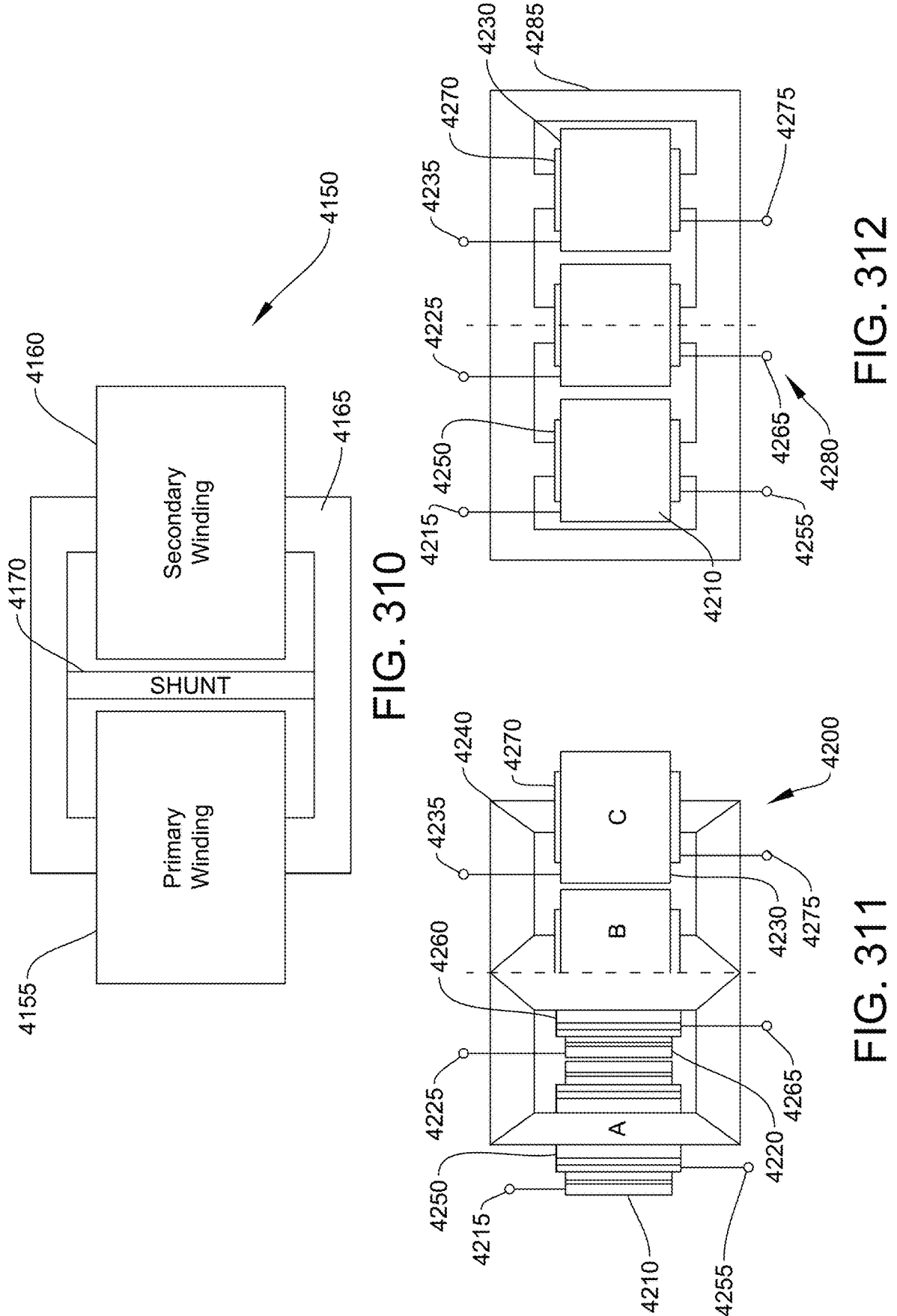

Depending upon the application, a shunt 4140, of core material may be placed between the primary and secondary windings such as to limit secondary short-circuit current. This type of transformer is referred to as a high leakage reactance transformer. Referring to FIG. 310, a simple example of a high leakage reactance transformer 4150 is shown. As shown, the transformer includes a primary winding 4155 and a secondary winding 4160, each wrapped around respective legs of a core 4165. Notably, the core includes a shunt 4170 between the primary and secondary windings.

FIG. 311 illustrates a three-phase core transformer 4200 that may find use in a variety of applications. First, second and third primary windings 4210, 4220 and 4230 each include separate terminals 4215, 4225 and 4235. Likewise, first, second and third secondary windings 4250, 4260 and 4270 each include separate terminals 4255, 4265 and 4275. (FIG. 311 shows a cross-sectional view of the first primary and secondary windings and half of the second primary and secondary windings.) The primary and secondary windings may be connected in wye, delta or other configurations (particularly in transforming involving more phases, coils, cores, etc.).

The first, second and third primary and secondary windings are formed around a core 4240, as shown in the drawing of FIG. 311. The core 4240 that may be made of several types of materials, including ferromagnetic materials such as steel, as described herein. FIG. 312 shows a three-phase shell transformer 4280, that is substantially similar to the transformer 4200, but includes a shell core 4285 as shown.

Three phase transformers find particular use in electrical distribution grids that employ three-phase electrical distribution. While three phases are shown, more phases are possible. Any polyphase transformer may include a bank of three or more single-phase transformers, or all phases incorporated into a single polyphase transformer. Any number of winding and core configurations are possible to give rise to different attributes, phase shifts, or other properties.

Figure 313:
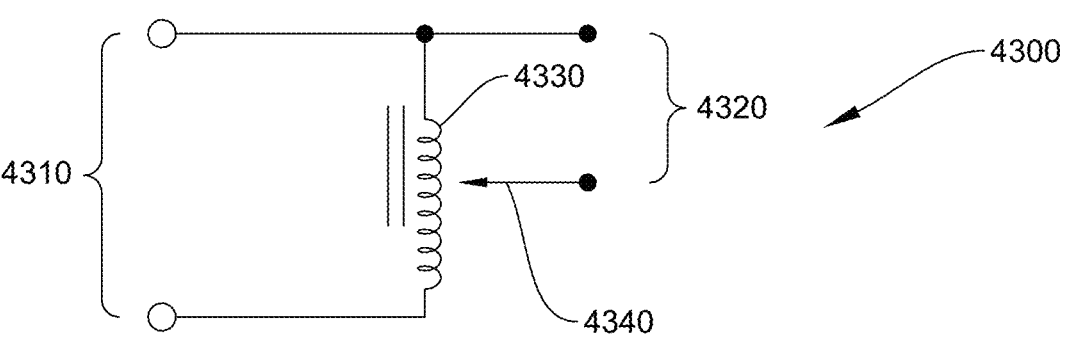

FIG. 313 shows an example of an autotransformer 4300 where portions of the same winding act as both the primary and secondary. As shown, the transformer 4300 includes a primary 4310 coupled to a single coil 4330. The secondary 4320 includes a movable tap 4340, although two or more fixed taps are possible, and the winding 4330 in the example of FIG. 313 is wrapped or formed around a core.

Figure 314:
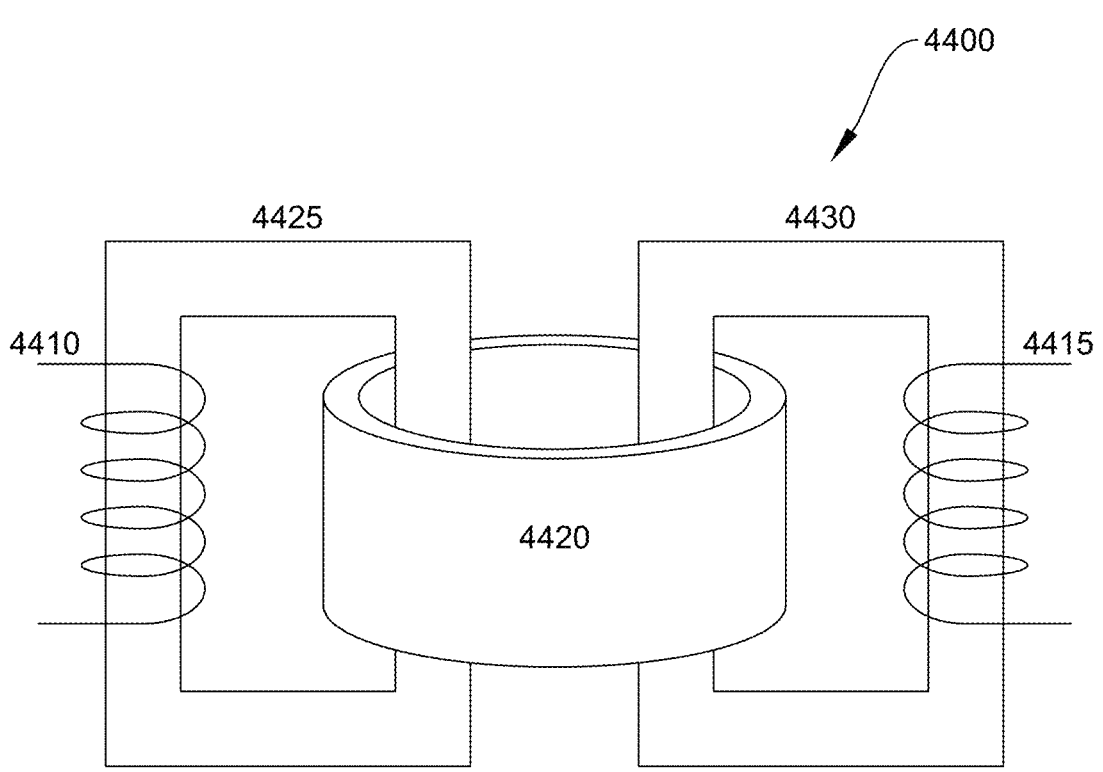

Many other types of transformers are possible. One other example is shown in FIG. 314, although many others are possible. As shown in FIG. 314, a transformer 4400 includes two coils 4410 and 4415, and an intermediate coil 4420. The coils 4410 and 4415 are inductively coupled to coil 4420 through cores 4425 and 4430, around which coils 4410 and 4415, respectively, are formed. The cores may be formed of several possible materials, including a ferromagnetic material such as steel, as described herein.

Many other geometries are possible. For example, toroidal cores may be employed. Many other core geometries are known. Further, as described herein, the core may be formed of many different types of materials, even cores that may partially or wholly employ the modified ELR material.

In addition to different cores, different windings are possible, as described below. For example, the transformers may be formed of inductors made with rectangular tape or strip, insulated with an appropriate insulator. Windings may be arranged in a way to minimize leakage inductance and stray capacitance, to thereby improve electrical characteristics, such as frequency response. Further, transformers may include windings with multiple taps or terminals to thereby permit multiple voltage ratios to be selected.

The transformers described herein may all be implemented with inductors and other components formed at least partially from modified ELR or other materials, as described below.

Inductors Having Modified, Apertured, and/or Other ELR Components

Inductors, such as air core or magnetic core inductors, that include components formed from modified extremely low resistance (ELR) films, are described. In some examples, the inductors include a core and a nanowire coil formed from modified ELR film. In some examples, the inductors include a core and tape or foil coil formed from modified ELR film. In some examples, the inductors are formed using thin-film modified ELR films. The modified ELR films provide extremely low resistances to current at temperatures higher than temperatures normally associated with current high temperature superconductors (HTS), enhancing the operational characteristics of the inductor machines at these higher temperatures, among other benefits.

In some examples, the modified ELR films are manufactured based on the type of materials, the application of the modified ELR film, the size of the component employing the modified ELR film, the operational requirements of a device or machine employing the modified ELR film, and so on. As such, during the design and manufacturing of an inductor, the material used as a base layer of a modified ELR film and/or the material used as a modifying layer of the modified ELR film may be selected based on various considerations and desired operating and/or manufacturing characteristics.

Various devices, applications, and/or systems may employ the modified ELR inductors. In some examples, tuned or resonant circuits and their applications employ modified ELR inductors. In some examples, transformers and their applications employ modified ELR inductors. In some examples, energy storage devices and their applications employ modified ELR inductors. In some examples, current limiting devices and their applications employ ELR inductors.

Figure 315:
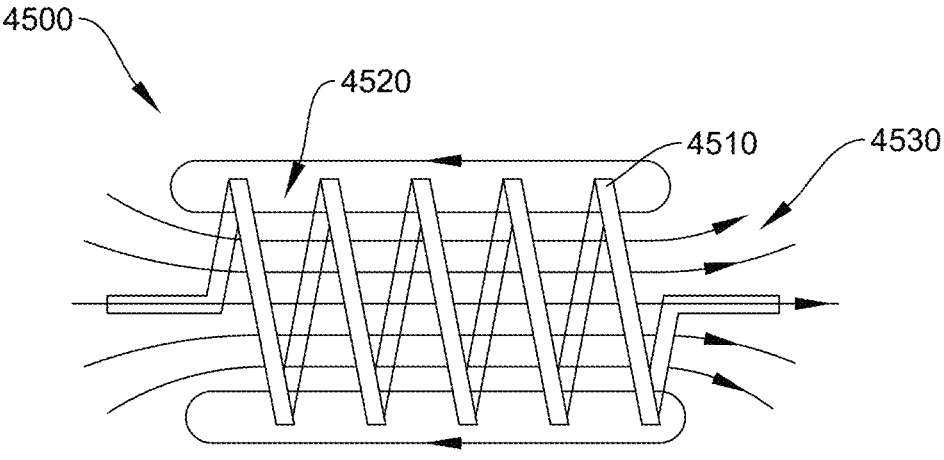

FIG. 315 is a diagram illustrating an air core inductor 4500 having a modified ELR film. The inductor 4500 includes a coil 4510 and an air core 4520. When the coil 4510 carries a current (e.g., in a direction towards the right of the page), a magnetic field 4530 is produced in the core 4520. The coil is formed, at least in part, of a modified ELR film, such as a film having a ELR material base layer and a modifying layer formed on the base layer. Various suitable modified ELR films are described in detail herein.

A battery or other power source (not shown) may apply a voltage to the modified ELR coil 4510, causing current to flow within the coil 4510. Being formed of a modified ELR film, the coil 4510 provides little or no resistance to the flow of current in the at temperatures higher than those used in conventional HTS materials, such as room or ambient temperatures (~21° C.). The current flow in the coil produces a magnetic field within the core 4520, which may be used to store energy, transfer energy, limit energy, and so on.

Because the inductor 4500 includes a coil 4510 formed of extremely low resistance materials (i.e., a modified ELR film), the inductor may act similarly to an ideal inductor, where the coil 4510 exhibits little or no losses due to winding or series resistance typically found in inductors with conventional conductive coils (e.g., copper coils), regardless of the current through the coil 4510. That is, the inductor 4500 may exhibit a very high quality (Q) factor (e.g., approaching infinity), which is the ratio of inductive reactance to resistance at a given frequency, or Q=(inductive reactance)/resistance.

In some examples, the modified ELR coil provides extremely low resistance to the flow of current at temperatures between the transition temperatures of conventional HTS materials (~80 to 135 K) and room temperatures (~294 K). In these examples, the inductor may include a cooling system (not shown), such as a cryogenic cooler or cryostat, used to cool the coil 4510 to a critical temperature for the type of modified ELR film utilized by the coil 4510. For example, the cooling system may be a system capable of cooling the coil 4510 to a temperature similar to that of the boiling point of liquid Freon™, to a temperature similar to that of the melting point of water, or other temperatures discussed herein. That is, the cooling system may be selected based on the type and structure of the modified ELR film utilized in the coil 4510.

In some examples, the air-cored 4520 is self supporting. In other examples, the air-cored 4520 is wound on a non-magnetic material or structure (not shown), such as plastic or ceramic. The material or shape of the core may be selected based on a variety of factors. For example, selecting a core material having a higher permeability than the permeability of air will generally increase the density of the induced magnetic field 4530, and thus increase the inductance of the inductor 4500. In another example, selecting a core material may be governed by the desire to reduce core losses in high frequency applications. One skilled in the art will appreciate the core may be formed of a number of different materials and into a number of different shapes in order to achieve certain desired properties and/or operating characteristics.

As is known in the art, the configuration of the coil 4510 may affect certain operational characteristics, such as the inductance. For example, the number of turns of a coil, the cross-sectional area of a coil, the length of a coil, and so on, may affect the inductance of an inductor. It follows that inductor 4500, although shown in one configuration, may be configured in a variety of ways in order to achieve certain operational characteristics (e.g., inductance values), to reduce certain undesirable effects (e.g., skin effect, proximity effect, parasitic capacitances), and so on. These techniques are generally adopted to increase the self-resonant frequency and quality factor (Q) of the inductor.

In some examples, the coil 4510 may include many turns lying parallel to one another. In some examples, the coil may include few turns that are wound at different angles to one another. Thus, coil 4510 may be formed into a variety of different configurations, such as honeycomb, basket weave patterns, a wave winding, etc., where successive turns criss-cross at various angles to one another, spiderweb patterns, a pi winding, etc., where the coil is formed of flat spiral coils spaced apart from one another, as litz wires, where various strands are insulated from one another to reduce ac resistance, and so on.

Figure 316:
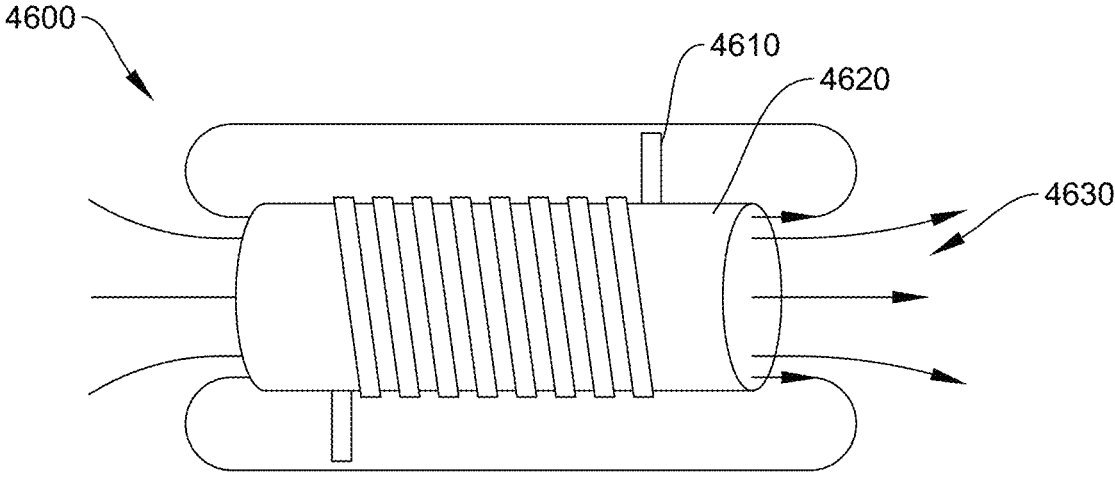

In addition to air core inductors, magnetic core inductors, such as inductor 4600, may also utilize modified ELR films, as will now be discussed. FIG. 316 is a schematic diagram illustrating a magnetic core inductor 4600 employing a modified ELR film. The inductor 4600 includes a coil 4610 and a magnetic core 4620, such as a core formed of ferromagnetic or ferrimagnetic materials. Similar to the inductor 4700 of FIG. 317, a magnetic field 4630 is produced in the core 4620 when current is carried by the coil 4610. The coil is formed, at least in part, of a modified ELR film, such as a film having a ELR material base layer and a modifying layer formed on the base layer. Various suitable modified ELR films are described in detail herein. Being formed of a modified ELR film, the coil 4610 provides little or no resistance to the flow of current in the at temperatures higher than those used in conventional HTS materials, such as room or ambient temperatures (~21° C.). The current flow in the coil produces a magnetic field 4630 within the core 4620, which may be used to store energy, transfer energy, limit energy, and so on.

The magnetic core 4620, being formed of ferromagnetic or ferrimagnetic materials, increases the inductance of the inductor 4600 because the magnetic permeability of the magnetic material within the produced magnetic field 4630 is higher than the permeability of air, and thus is more supportive of the formation of the magnetic field 4630 due to the magnetization of the magnetic material. For example, a magnetic core may increase the inductance by a factor of 1,000 or greater.

The inductor 4600 may utilize various different materials within the magnetic core 4620. In some examples, the magnetic core 4620 is formed of a ferromagnetic material, such as iron. In some examples, the magnetic core 4620 is formed of a ferrimagnetic material, such as ferrite. In some examples, the magnetic core 4620 is formed of laminated magnetic materials, such as silicon steel laminations. One of ordinary skill will appreciate that other materials may be used, depending on the needs and requirements of the inductor 4600.

In addition, the magnetic core 4620 (and, thus, the inductor 4600) may be configured into a variety of different shapes. In some examples, the magnetic core 4620 may be a rod or cylinder. In some cases, the magnetic core 4620 may be a toroid. In some cases, the magnetic core 4620 may be moveable, enabling the inductor 4600 to realize variable inductances. One of ordinary skill will appreciate that other shapes and configurations may be used, depending on the needs and requirements of the inductor 4600. For example, the magnetic core 4620 may be constructed to limit various drawbacks, such as core losses due to eddy currents and/or hysteresis, and/or nonlinearity of the inductance, among other things.

Thus, in some examples, forming coils of inductors using modified ELR materials and/or components, such as modified ELR films, increases the Q factor of the inductors by lowering or eliminating the resistance to current within the coils, among other benefits.

Manufacturing and/or Forming Inductors Composed of ELR Materials

Figure 317:
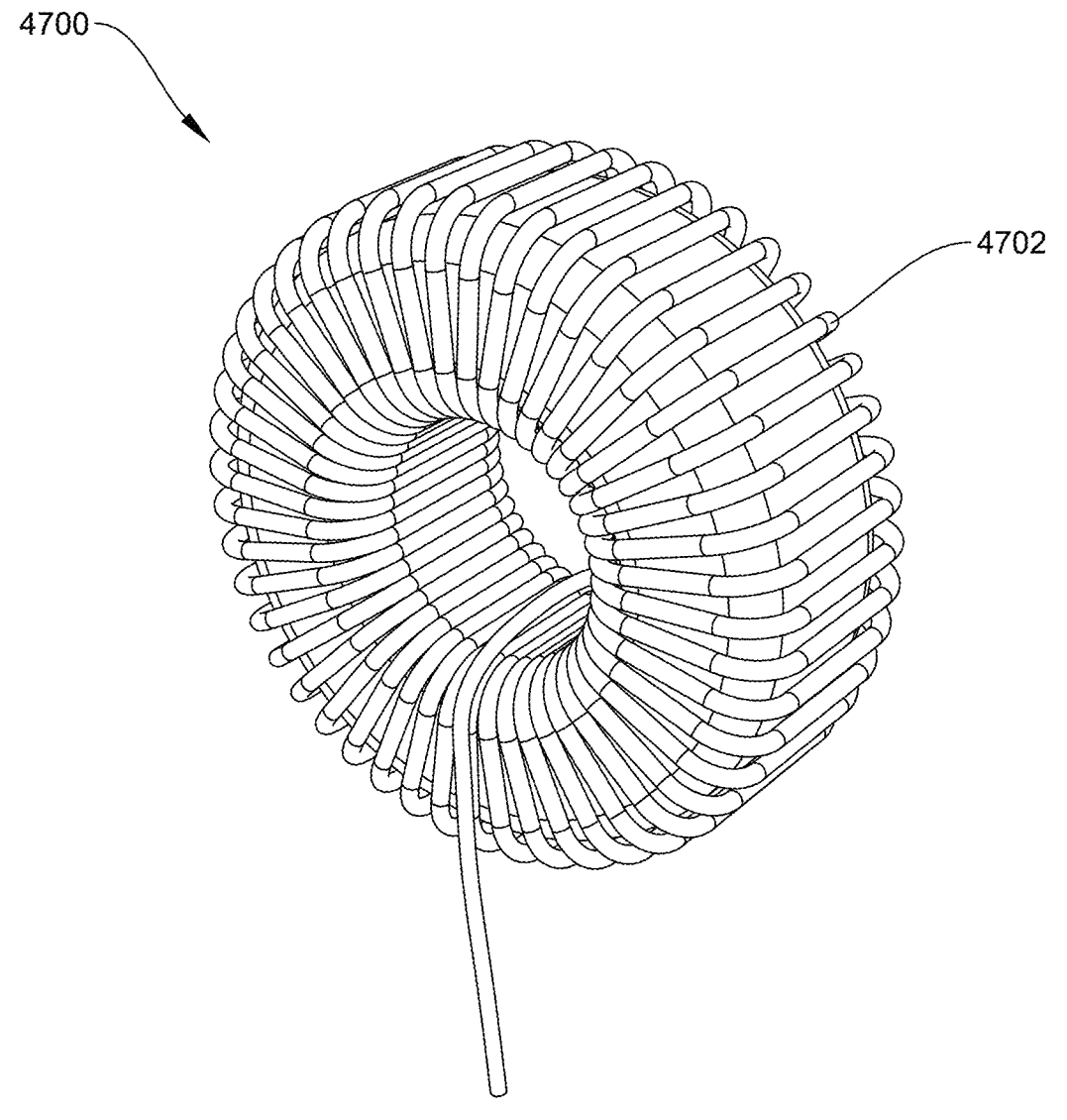
Figure 318:
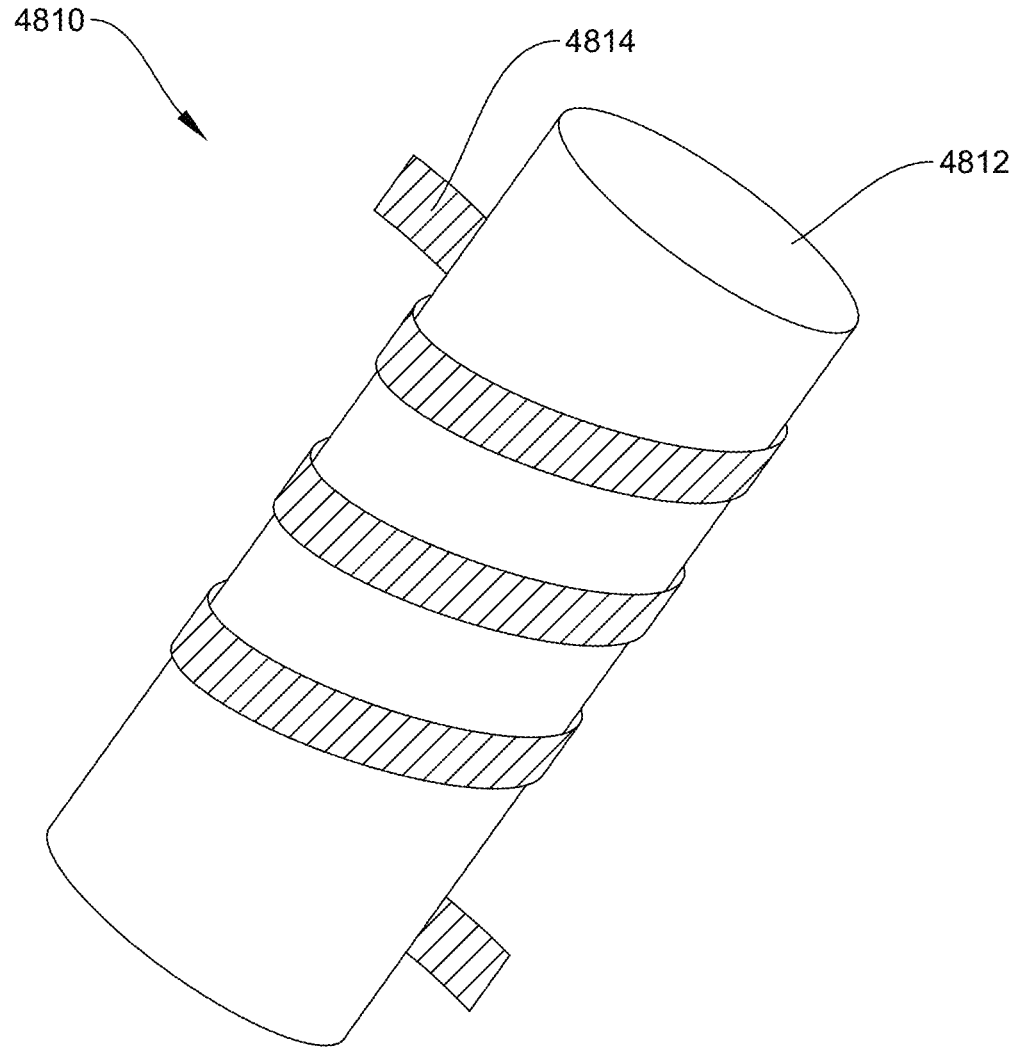

As described herein, in some examples, a coil of an inductor exhibits extremely low resistances to carried current because it is formed of modified ELR materials, such as modified ELR materials, apertured ELR materials, and/or other new ELR materials. FIG. 317 is a picture showing an inductor 4700 employing a modified ELR nanowire. The inductor 4700 includes a coil 4702 formed as a modified ELR nanowire that is composed of the ELR components described herein, such as modified ELR films.

In forming an ELR wire, multiple ELR tapes or foils may be sandwiched together to form a macroscale wire. For example, a coil may include a supporting structure and one or more ELR tapes or foils supported by the supporting structure.

In addition to ELR wires, inductors may be formed of ELR nanowires. In conventional terms, nanowires are nanostructures that have widths or diameters on the order of tens of nanometers or less and generally unstrained lengths. In some cases, the ELR materials may be formed into nanowires having a width and/or a depth of 50 nanometers. In some cases, the ELR materials may be formed into nanowires having a width and/or a depth of 40 nanometers. In some cases, the ELR materials may be formed into nanowires having a width and/or a depth of 30 nanometers. In some cases, the ELR materials may be formed into nanowires having a width and/or a depth of 20 nanometers. In some cases, the ELR materials may be formed into nanowires having a width and/or a depth of 10 nanometers. In some cases, the ELR materials may be formed into nanowires having a width and/or a depth of 5 nanometers. In some cases, the ELR materials may be formed into nanowires having a width and/or a depth less than 5 nanometers.

In addition to nanowires, ELR tapes or foils may also be utilized by the inductors and devices described herein. FIG.

318 is a diagram illustrating an inductor 4810 employing a modified ELR tape or foil. The inductor 4810 includes a core 4812, such as an iron core, and a coil 4814 formed of a modified ELR tape.

There are various techniques for producing and manufacturing tapes and/or foils of ELR materials. In some examples, the technique includes depositing YBCO or another ELR material on flexible metal tapes coated with buffering metal oxides, forming a "coated conductor. During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE), and other solution deposition techniques to produce ELR materials. In addition to nanowires, modified ELR tapes or foils may also be utilized by the inductors and devices described herein.

Figure 319:
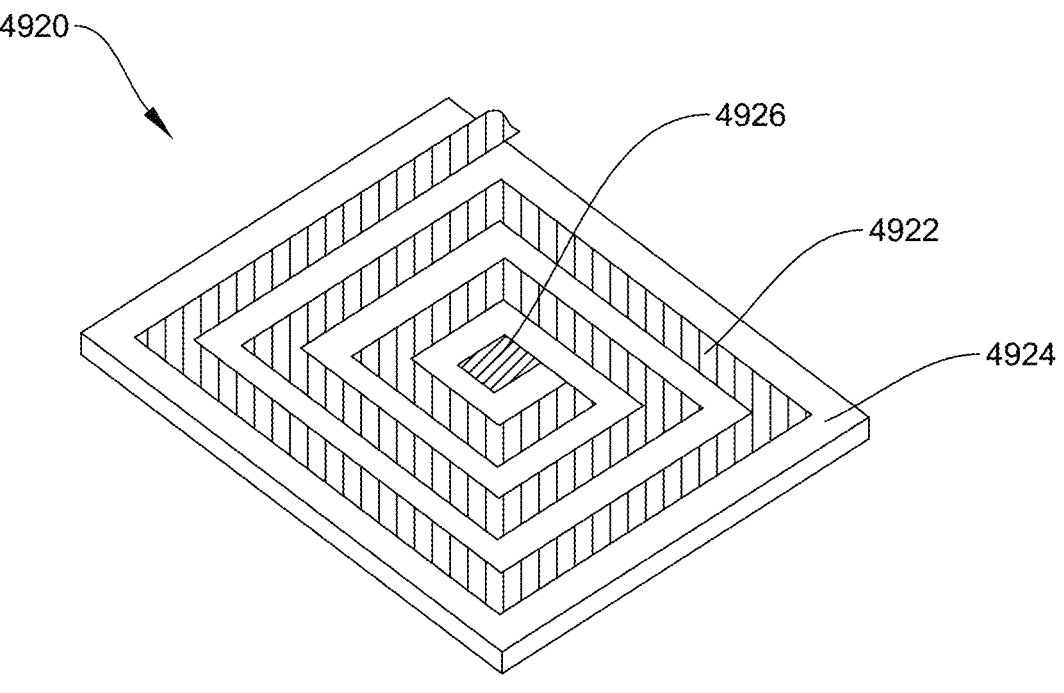

Furthermore, thin film inductors may utilize the ELR components described herein. FIG. 319 is a schematic diagram illustrating an inductor 4920 employing a modified ELR thin film component. The inductor 4920 includes a modified ELR coil 4922 formed onto a printed circuit board 4924, and an optional magnetic core 4926. The coil 4922, which may be a modified ELR film etched into the board 4924, may be formed in a variety of configurations and/or patterns, depending on the needs of the device or system employing the inductor. Further, the optional magnetic core 4926 may be etched into the board 4924, as shown, or there may be a planar core (not shown) positioned above and/or below the coil 4922.

To form a transformer, a second inductor or coil may be formed next to the inductor 4920. Alternatively or additionally, the second inductor may be formed underneath the inductor 4920, with both conductors formed on the same substrate, such as a printed circuit board. As noted herein, near ideal transformer response may be achieved by employing the modified ELR material described herein, and thus air core transformers may be acceptable for many applications.

Overall, the modified ELR films may formed into tapes, foils, rods, strips, nanowires, thin films, and other shapes or structures capable of moving or carrying current from one point to another in order to produce a magnetic field.

In some examples, the type of materials used in the modified ELR films may be determined by the type of application utilizing the films. For example, some applications may utilize modified ELR films having a BSCCO ELR layer, whereas other applications may use a YBCO layer. That is, the modified ELR films described herein may be formed into certain structures (e.g., tapes or nanowires) and formed from certain materials (e.g., YBCO or BSCCO) based on the type of machine or component utilizing the modified ELR films, among other factors.

Various processes may be employed in manufacturing an inductor, such as inductors described herein and thus the transformers described herein. In some examples, a core is formed, maintained, received and/or positioned. The core may take on various shapes or configurations. Example configurations include a cylindrical rod, a single "I" shape, a "C" or "U" shape, an "E" shape, a pair of "E" shapes, a pot shape a toroidal shape, a ring or bead shape, a planar shape, and so on. The core may be formed of various non-magnetic and magnetic materials. Example materials include iron or soft iron, silicon steel, various laminated materials, alloys of silicon, carbonyl iron, iron powders, ferrite ceramics, vitreous or amorphous metals, ceramics, plastics, air, and so on.

In addition, at least one coil, such as a coil formed of a modified ELR nanowire, tape, or thin film, is configured into a desirable shape or pattern and coupled to the formed or maintained core. In some examples, there is no core, and the modified ELR nanowire is configured to the desirable shape or pattern. In some examples, a modified ELR nanowire coil is etched directly to a printed circuit board, and a planar magnetic core is positioned with respect to the etched coil. One of ordinary skill will appreciate that other manufacturing processes may be utilized when manufacturing and/or forming the inductors described herein.

While a single transformer is generally described above for each application, two or more transformers may be provided within a given chip, housing, grid substation, or other environment. Indeed, a given environment may employ one or more chips having one or more of the disclosed transformers, which in turn may be incorporated into one or more housings, and which may further be incorporated into larger scale environments, such as with in an electrical distribution grid. Of course, the transformers described herein may be fabricated together with both the ELR material, as well as with conventional materials.

Additional Transformer Applications Having ELR Components

The transformers described above may be suited for use in numerous applications, ranging for use on a chip, to use in an electrical grid. By employing a modified ELR material in such transformers, the transformers provide resistance at orders of magnitude less than the best common conductors under similar conditions.

As noted above, the modified ELR material has a performance that is dependent on temperature. As a result, the transformers described herein employing the modified ELR material are likewise dependent on temperature. Temperature variation affects field penetration into conductors, and which affects superconducting penetration depth. Such variations of the material can be modeled based on the temperature versus response behavior for the modified ELR materials as described herein, or as can be empirically derived. Notably, by employing the modified ELR materials, the resistance of the line is negligible, but that resistance can be adjusted based on temperature, as shown in the temperature graphs provided herein. Therefore, the transformer design can be adjusted to compensate for temperature, or the transformer output can be adjusted by varying the temperature.

Figure 320:
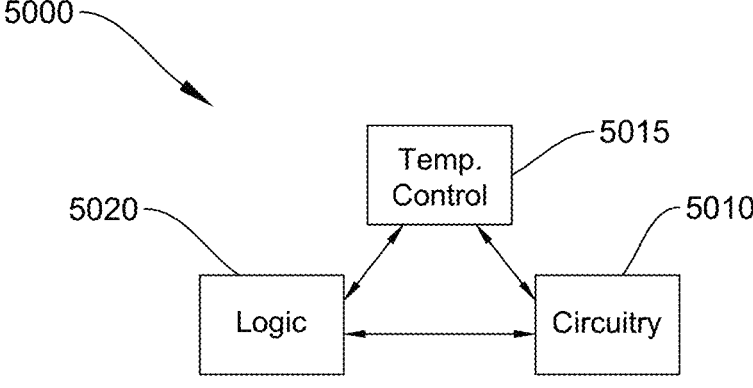

Referring to FIG. 320, an example is shown of a system 5000 that includes circuitry 5010 coupled to a temperature control circuit 5015, and logic 5020. (While all blocks are shown as interconnected in FIG. 320, fewer connections are possible.) The circuitry 5010 employs one or more of the transformers described herein, which are at least partially formed from the ELR material. The logic controls the temperature control circuitry, which in turn controls a cooler/refrigerator, such as a cryogenic or liquid gas cooler that cools the circuitry 5010. Thus, to increase the sensitivity or response of the system 5000, the logic 5020 signals the temperature control circuit 5015 to decrease the temperature of the circuitry 5010. As a result, the circuitry 5010 employing the ELR material causes the ELR material to increase conductivity, thereby increasing the circuit's sensitivity, response or efficiency.

While individual transformers are shown, transformers may be joined together to form transformer banks or arrays, or other more complex transformer systems. As with the other categories of transformers discussed herein, many configurations of transformer arrays are possible and are design considerations for a designer implementing a transformer or multi-transformer system that is at least partially formed from the modified ELR material. The modified ELR materials described herein may be used in multi-transformer systems that comprise a combination of two or more of the transformers and principles described herein, even if those combinations are not explicitly described. Indeed, such multi-transformer systems may employ two or more dissimilar or heterogeneous transformers, not simply similar or homogenous transformers. Such a transformer system can include relatively homogenous transformers all formed of the modified ELR material, or a heterogeneous mix of different types of transformers, some transformers formed of non-ELR material, or a combination of differing transformers and differing materials. Thus, complex transformer systems may employ two or more transformers formed of two or more homogeneous transformers formed primarily of the modified ELR material, two or more heterogeneous transformers formed primarily of the modified ELR material, and/or two or more homogeneous/heterogeneous transformers formed of both conventional conductors and the modified ELR material.

Although specific examples of transformers that employ components formed partially or exclusively from modified ELR materials are described herein, one having ordinary skill in the art will appreciate that virtually any transformer configuration or geometry may employ components that are formed at least partially from modified ELR materials, such as those components listed above, e.g., to conduct electrical currents, or transmit or modify electromagnetic signals. (While the ELR material may be used with any conductive elements in a circuit, it may be more appropriate to state, depending upon one's definition of "conductive" that the modified ELR material facilitates propagation of energy or signals along its length or area.) As a result, it is impossible to enumerate in exhaustive detail all possible transformers and transformer systems that may employ components that are formed from modified ELR materials.

While some suitable geometries are shown and described herein for some transformers, numerous other geometries are possible. These other geometries include not only different patterns, configurations or layouts with respect to length and/or width, but also differences in thickness of materials, use of different layers, and other three-dimensional structures (e.g., in the types of coils and cores). The inventors contemplate that virtually all transformers and associated systems known in the art may employ modified ELR material and believe that one having ordinary skill in the art who is provided with the various examples of ELR materials, transformers, and principles in this application would be able to implement, without undue experimentation, other transformers with one or more components formed in whole or in part from the modified ELR materials.

In some implementations, a transformer that includes modified ELR materials may be described as follows:

A transformer, comprising: a primary coil; and a secondary coil inductively coupled to the primary coil; wherein at least the secondary coil comprises a core and a modified extremely low resistance (ELR) nanowire configured into a coil shape at least partially surrounding the core; and wherein the modified ELR nanowire is formed of a modified ELR film having a first layer comprised of an ELR material and a second layer comprised of a modifying material bonded to the ELR material of the first layer.

A method of manufacturing a transformer, the method comprising: configuring a first elongated conductor into a first three dimensional coiled shape; configuring a second elongated conductor into a second three dimensional coil shape, wherein the first and second elongated conductors each include a first layer comprised of an ELR material and a second layer comprised of a modifying material chemically bonded to the ELR material of the first layer; placing the first three dimensional coil shape in proximity to the second three dimensional coil shape to induce inductive coupling therebetween.

A method of manufacturing a transformer, the method comprising: receiving a first modified ELR nanowire or tape, wherein the first modified ELR nanowire or tape is formed of a modified ELR film having a first layer of an ELR material and a second layer of a modifying material bonded to the ELR material; receiving a second modified ELR nanowire or tape, wherein the second modified ELR nanowire or tape is formed of a modified ELR film having a first layer of an ELR material and a second layer of a modifying material bonded to the ELR material; forming the first modified ELR nanowire or tape into a first three dimensional coiled shape as a primary winding; forming a transformer using the first three dimensional coil, and the second modified ELR nanowire or tape into a secondary winding; wherein the primary and secondary windings are positioned such that an inductance may be mutually induced therebetween.

An apparatus, comprising: a first three dimensional coil wrapped at least partially around a first core; a second three dimensional coil wrapped at least partially around the first or a second core; wherein the first three dimensional coil and the second three dimensional coil each include a first portion having an extremely low resistance (ELR) material and a second portion bonded to the first portion that lowers the resistance of the ELR material; and wherein the first three dimensional coil and the second three dimensional coil are inductively coupled.

A transformer for use in an electrical power distribution grid, comprising: a primary coil connected downstream of an electrical power generation source; and a secondary coil; wherein the primary coil and secondary coil are inductively coupled together such that an inductance may be mutually induced between the primary coil and the secondary coil; wherein the primary coil and secondary coil are sized and configured to accommodate currents or voltages higher than currents or voltages associated with electrical power provided to standard household consumers; wherein at least the secondary coil comprises a core and a modified extremely low resistance (ELR) nanowire configured into a coil shape at least partially surrounding the core; and wherein the modified ELR nanowire is formed of a modified ELR film having a first layer comprised of an ELR material and a second layer comprised of a modifying material bonded to the ELR material of the first layer.

A method of manufacturing a transformer for use in an electrical power distribution grid, the method comprising: configuring a first elongated conductor into a first three dimensional coiled shape; configuring a second elongated conductor into a second three dimensional coil shape, wherein the first and second elongated conductors each include a first layer comprised of an ELR material and a second layer comprised of a modifying material chemically bonded to the ELR material of the first layer, and, placing the first and second three dimensional coil shapes in relation to each other such that an inductance between the first three dimensional coil shape and the second three dimensional coil shape may be mutually induced, and, wherein the first three dimensional coil shape and the second three dimensional coil shape are sized and configured to accommodate currents or voltages at least 30% higher than currents or voltages associated with electrical power provided to standard household consumer.

An apparatus for use in or with an appliance or device, the apparatus comprising: a first modified ELR nanowire or tape formed into a first three dimensional coiled shape, wherein the first modified ELR nanowire or tape is formed of a modified ELR film having a first layer of an ELR material and a second layer of a modifying material bonded to the ELR material; a second modified ELR nanowire or tape formed into a second three dimensional coiled shape, wherein the second modified ELR nanowire or tape is formed of a modified ELR film having a first layer of an ELR material and a second layer of a modifying material bonded to the ELR material; wherein the first three dimensional coil and the second three dimensional coil are positioned such that an inductance may be mutually induced between the first three dimensional coil and the second three dimensional coil; an output electrical port for coupling the first three dimensional coil with the appliance or device to be protected; and an electrical power input port for receiving external electrical power, wherein the input port is coupled to the second three dimensional coil.

A semiconductor chip, comprising: a substrate; and, a transformer formed on the substrate, wherein the transformer comprises: a first three dimensional coil; a second three dimensional coil; wherein the first three dimensional coil and the second three dimensional coil each include a first portion having an extremely low resistance (ELR) material and a second portion bonded to the first portion that lowers the resistance of the ELR material; and wherein the first three dimensional coil and the second three dimensional coil are inductively coupled together.

Chapter 18—Transmission Lines Formed of ELR Materials

This chapter of the description refers to FIGS. 1-36 and FIGS. 321-325; accordingly all reference numbers included in this section refer to elements found in such figures.

Power transmission components, such as power transmission lines, wires, and/or cables, that employ extremely low resistance (ELR) materials, are described. The ELR materials, which may be modified ELR materials, apertured ELR materials, and so on, enable the power transmission components to transmit, carry, and/or transport power from one location to another without incurring resistive losses or incurring reduced resistive losses, among other benefits.

Figures 321A, 321B:
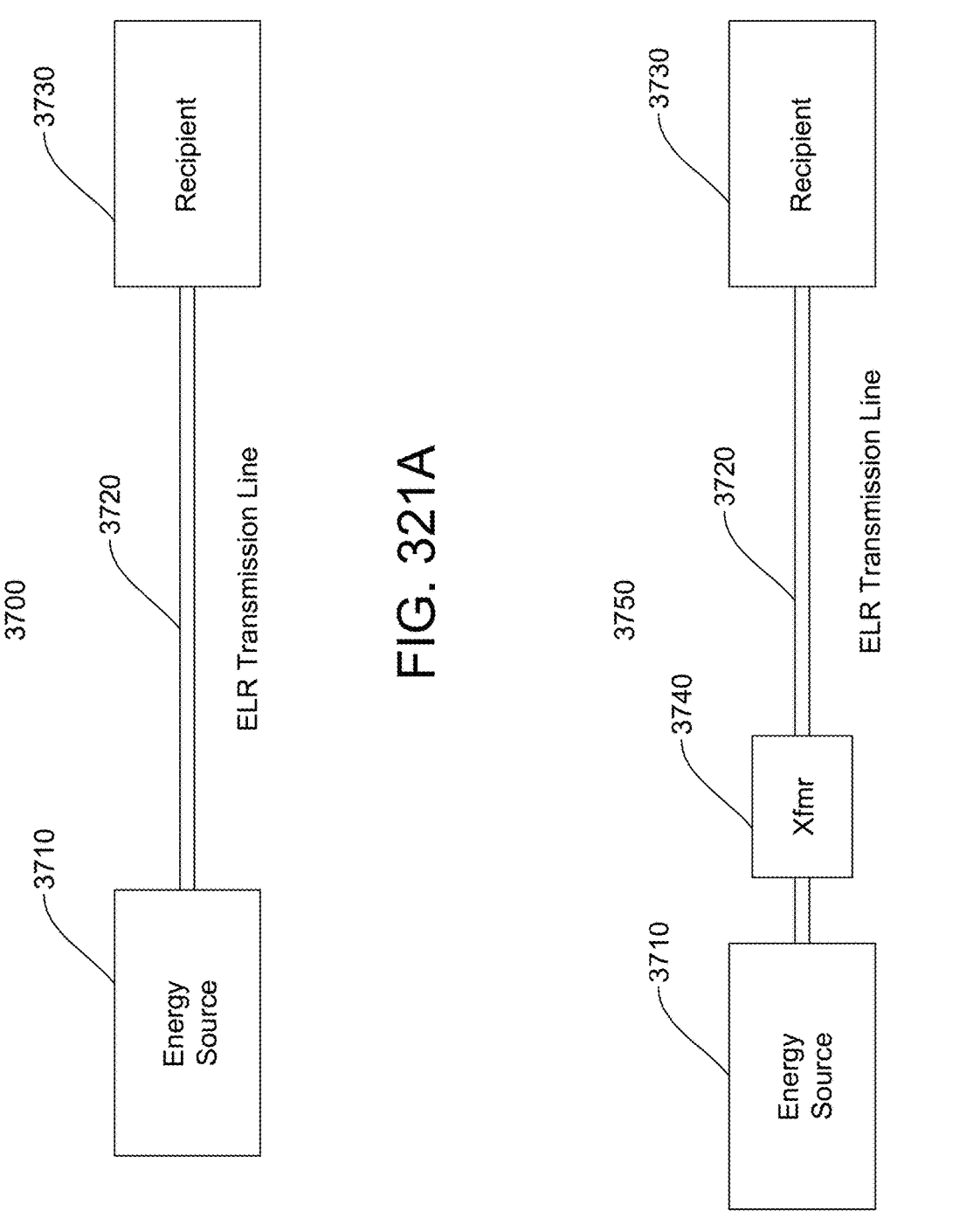

As described herein, some or all of the modified and/or apertured ELR materials described herein may be utilized by power transmission components, such as power transmission lines, wires, and/or cables, in a utility grid or other system requiring transmission of power from one location to another. FIGS. 321A and 321B illustrate power distribution systems that utilize extremely low resistance (ELR) materials.

FIG. 321A depicts a power transmission system 3700. The power transmission system 3700 includes an energy source 3710, a transmission line 3720, and a recipient 3730. The energy source 3710 may be an energy generation device and/or an energy storage device. For example, the energy source 3710 may be a static electricity device, an electromagnetic induction device (e.g. generator, dynamo, alternator, SuperConducting Magnetic Energy Storage (SMES) device and so on), an electrochemical device (e.g., battery, capacitors, fuel cell, and so on), a photoelectric effect device (e.g., solar or photovoltaic cells, and so on), thermoelectric effect device (e.g., thermocouples, thermopiles, and so on), a piezoelectric effect device, a nuclear generator, a green or renewable energy device (e.g., wind turbine, tidal wave device, and so on), and/or other devices capable of generating, storing, and/or providing energy for use within the system.

The recipient 3730 may be any entity receiving energy with the power transmission system 3700, such as a load, system node, or other component and/or entity that receives energy. The recipient 3730 may be a residence, electrical device, micro-grid, or other end user. For example, the recipient 3730 may include a distribution system network that carries electricity from a transmission line 3720 and delivers it to consumers. Typically, the distribution system network includes medium-voltage (less than 50 kV) power lines, electrical substations, pole-mounted transformers, low-voltage (less than 1 kV) distribution wiring, electricity meters, and so on.

The transmission line 3720 may be one or more overhead power lines, one or more underground power lines, or other cables and/or wires that transmit energy from one location to another. In some examples, the transmission line 3720 includes modified and/or apertured ELR materials, such as the ELR materials described herein that are capable of transmitting current with extremely low resistances at ambient temperatures and pressures.

The power transmission system 3700 may include other components configured to condition, control, disconnect, switch and/or otherwise assist in the transfer of energy from one location to another, such as in a utility grid. FIG. 321B depicts a power transmission system 3750 that includes a transformer 3740, in addition to an energy source 3710, transmission line 3720, and energy recipient 3730.

The power transmission system 3750 includes a transformer 3740, which may be utilized to increase and/or decrease a voltage associated with transmitted energy. For example, transmitting electricity at high voltages typically reduces energy losses due to resistance in the conductive elements of a transmission line. That is, for a given amount of power, raising the voltage reduces the current, and thus the resistive losses in the conductive elements. For example, raising the voltage by a factor of 10 reduces the current by a corresponding factor of 10, and therefore the resistive losses by a factor of 100.

The power transmission system 3700 and/or 3750 may include other components not shown in FIGS. 321A and 321B, such as fault current controllers, fault current limiters, sub-stations, information gathering devices, and so on. In some examples, utilizing the ELR materials described herein as current conductors within the transmission components, such as the transmission lines 3720, of the systems may enable the systems to transmit energy without raising the voltages in order to prevent certain resistive losses. Thus, in these examples, the ELR-based transmission lines 3720 described herein enable a power transmission system to transfer power at low voltages, which make the transmission systems safer, more efficient, and cheaper to build and maintain, among other benefits. The ELR-based transmission lines 3720 will now be discussed.

Figure 322:
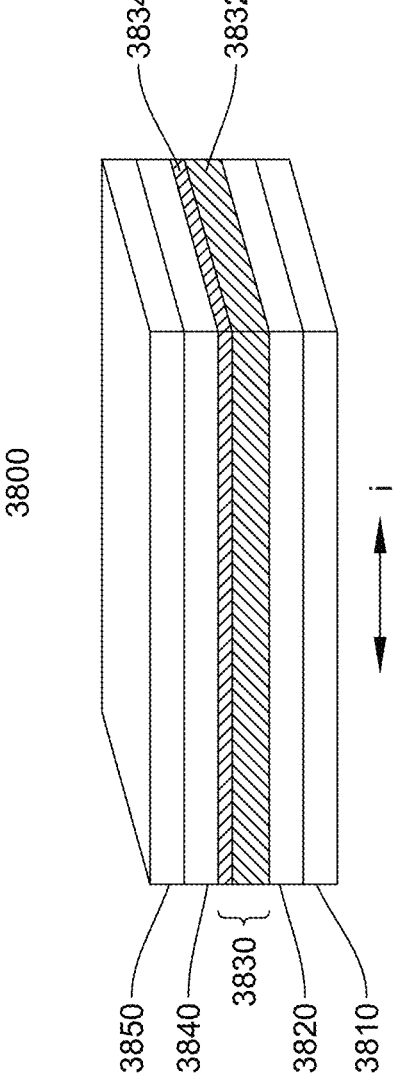

FIG. 322 is a schematic diagram 3800 illustrating various layers within a power transmission line. A power transmission line, such as power transmission line 3720, may contain a number of different layers, including an ELR-based conduction layer 3830, which may include an ELR layer 3832 and a modifying layer or layers 3834, such as those described herein.

Additionally, the power transmission line may include a substrate layer 3810, a buffer layer 3820, a conductive bypass layer 3840, and an insulating layer and/or stabilizing layer 3850. For example, the buffer layer 3820 may be formed of Magnesium Oxide (MgO), the bypass layer 3840 may be formed of silver, and/or the stabilizing layer 3850 may be formed of copper.

Figure 323:
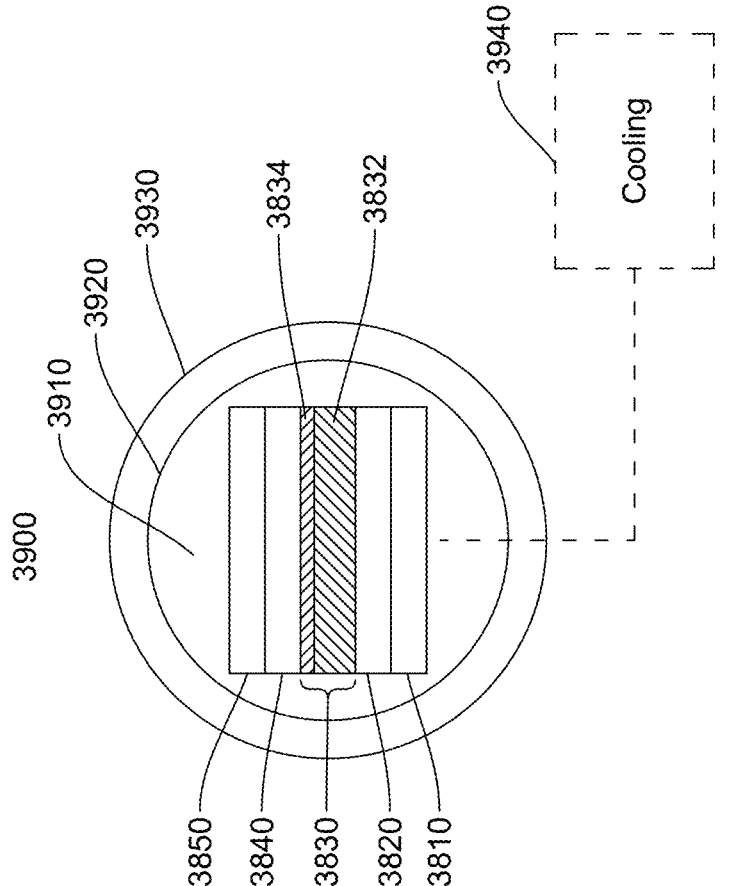

In some examples, an ELR-based cable may include layers 3810-3850 in the form of a tape or tapes, as well as other components utilized in manufacturing a cable suitable for transmitting current. FIG. 323 is a cross-sectional view of a power transmission cable 3900 that includes ELR-based transmission elements. In addition to the layers 3810-3850, the cable 3900 additionally includes a thermal insulation layer 3920 that provides thermal insulation between an internal region 3910 and a region ambient the cable 3900, such as a region outside a covering layer 3930 of the cable 3900.

In some examples, the ELR-based cable 3900 may include one or more tapes formed of layers 3810 wound around one or more formers that provide structural support for the tapes within the cable 3900. Although not shown in the Figures, the cable 3900 may include various other layers, such as insulating layers, shielding layers, support layers, protective layers, conductive layers, connection layers, and so on. In some examples, the ELR-based cable 3900 may include multiple formers supporting one or more wound ELR-based tapes.

In some examples, the ELR materials within the cable 3900 may exhibit extremely low resistance to the flow of current at temperatures between the transition temperatures of conventional HTS materials (e.g., ~80 to 135 K) and ambient temperatures (e.g., ~275 K to 313 K), such as between 150 K and 313 K, or higher. In these examples, the ELR-based cable 3900 may utilize a cooling system 3940, such as a cyrocooler or cryostat, used to cool a region 3910 housing the ELR materials within the cable 3900. The cooling system 3940 may be adapted to maintain the ELR materials at critical temperature for the type of modified ELR material utilized by the device. For example, the cooling system 3940 may be a system capable of cooling the ELR element to a temperature similar to that of the boiling point of Freon, to a temperature similar to that of the melting point of water, to a temperature lower than what is ambient to the ELR element, or other temperatures discussed herein. That is, the cooling system 3940 may be selected based on the type and structure of the ELR materials within the ELR-based cable 3900.

As described herein, in some examples, the conductive layers 3830 of ELR-based cables may exhibit extremely low resistance to carried current at ambient or other high temperatures, such as temperatures between 150 K and 313 K, or higher. Although one of ordinary skill will appreciate that the conductive layers 3830 may be formed into a variety of different configurations, such as wires, nanowires, and so on, in some examples, they are formed of ELR-based tapes and/or foils for use with ELR-based power transmission lines.

There are various techniques for producing and manufacturing tapes and/or foils of ELR materials. In some examples, the technique includes depositing YBCO or another ELR material on flexible metal tapes coated with buffering metal oxides, forming a "coated conductor." During processing, texture may be introduced into the metal tape itself, such as by using a rolling-assisted, biaxially-textured substrates (RABITS) process, or a textured ceramic buffer layer may instead be deposited, with the aid of an ion beam on an untextured alloy substrate, such as by using an ion beam assisted deposition (IBAD) process. The addition of the oxide layers prevents diffusion of the metal from the tape into the ELR materials. Other techniques may utilize chemical vapor deposition CVD processes, physical vapor deposition (PVD) processes, atomic layer-by-layer molecular beam epitaxy (ALL-MBE) and other solution deposition techniques to produce modified ELR tapes.

In some examples, the type of application utilizing the materials may determine the type of materials used in the ELR materials. For example, some applications may utilize ELR materials having a BSCCO ELR layer, whereas some applications may utilize a YBCO layer. That is, the ELR materials described herein may be formed into certain structures (e.g., tapes or nanowires) and formed from certain materials (e.g., YBCO or BSCCO) based on the type of device or component utilizing the modified ELR materials, among other factors.

Various manufacturing processes may be employed when forming the power transmission lines described herein. For example, a first layer of ELR material may be deposited onto a metal tape having a buffering oxide, such as MgO, formed on its surface. A second layer of modifying materials is then deposited onto the first layer. A protective layer may then be deposited onto the modifying layer, such as silver or another conductive metal. A stabilizing layer may then be formed onto the protective layer, such as a layer of copper. In some cases, shielding layers, insulation layers, protection layers, and other layers may also be formed within the power transmission lines.

For example, a transmission component of a power transmission cable may include an ELR-based tape spirally wound around a former or other base structure. A subsequent electrical insulation layer covers the ELR-based tape, a shielding layer covers the insulation layer, and a protection layer covers the shielding layer, forming the conductive core of the power transmission cable. One or more conductive cores may be placed within a housing of the cable. In some cases, the housing may be a thermally insulated housing part of and coupled to a cooling system configured to maintain a temperature inside the cable and surrounding the one or more conductive cores at a temperature lower than an ambient temperature of the power transmission cable.

Of course, one of ordinary skill in the art will realize other processes may be utilized during the manufacturing of ELR-based tapes, conductive cores, power transmission cables, and/or components of the transmission lines described herein.

Although power transmission cables for use in long distance power transmission are shown in FIG. 323, the ELR-based transmission lines described herein may be part of various other energy transmission components. Examples of transmission lines that may utilize the ELR materials described herein include power cords, mains cords, and/or line cords connecting electrical devices to power sources, such as outlets, wiring within structures, power communication cables, and so on.

Connecting ELR-Based Power Transmission Lines

Figure 324:
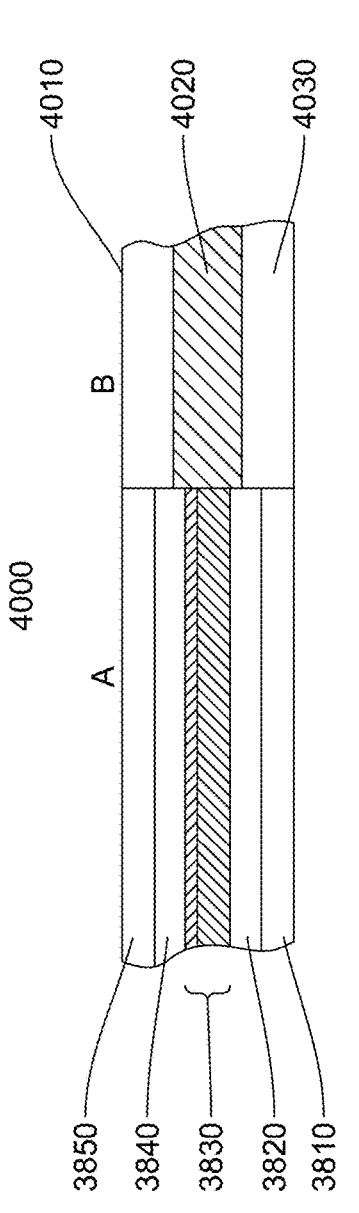
Figure 325:
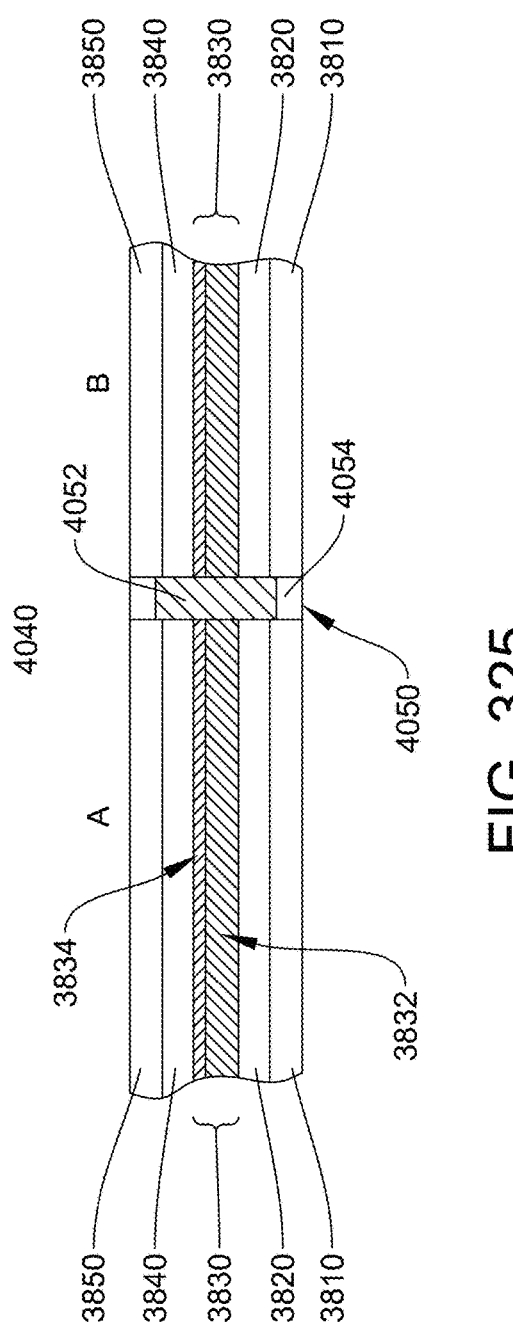

At times, it may be necessary to connect one ELR-based transmission line to another ELR-based transmission line or to a conventional transmission line without losing large amounts of energy due to faulty connections, improper bending, and other coupling issues. FIGS. 324 and 325 are schematic diagrams illustrating connections between ELR-based power transmission lines and other transmission components.

FIG. 324 depicts a side view of a system 4000 with an ELR-based transmission line 3800 connected to a conventional transmission line 4010 having a metal conductor 4020, such as copper, and other non-conductive layers 4030. The connection 4000 aligns the layers within the conductive element 3830 of the ELR-based transmission line 3800, including the ELR layer 3832 and the modifying layer 3834, with the metal conductor 4020 of the conventional transmission line 4010. Such alignment may facilitate a robust transfer of electrical energy from the ELR-based transmission line 3800 to the conventional transmission line 4010, among other things.

FIG. 325 depicts a system 4040 with an ELR-based transmission line A connected to an ELR-based transmission line B. A connection component 4050 is coupled to line A and line B, and includes a conductor 4052 and an insulation layer 4054. The conductor 4052 may be a conventional conductor, such as copper or aluminum, or may be formed of some or all of the ELR materials described herein. The conductor, which may be thicker than the conductive elements 3830 of the transmission lines, facilitates a robust transfer of electrical energy from one ELR-based transmission line 3800 to another, among other things. In some cases, there may be connections between modified and/or apertured ELR materials and current HTS or LTS ELR materials.

In some cases, the connection may be formed of multiple stages, diagonal orientations, and/or parallel lapp joints. Such configurations may enhance the connection area between components and/or may minimize heat build up at a connection point, among other benefits.

Thus, the ELR materials described herein may enable the development and use of power transmission lines, such as overhead and/or underground power cables, that transmit current with extremely low resistance without expensive cooling systems, among other benefits. Such use may enable power transmission systems to be simplified, because a reliance on high voltage power transmission schemes to reduce resistive losses in transmission will no longer be necessary. Therefore, ELR-based materials may enable power transmission systems that are lower voltage, higher current, more efficient, safer, more cost effective, and more reliable, among other benefits. For example, use of ELR materials may facilitate widespread use of DC power, among other things.

In some implementations, a transmission line that includes modified ELR materials may be described as follows:

A transmission line, comprising: a substrate layer; a buffering layer formed on the substrate layer; and a conductive layer, wherein the conductive layer is formed of a modified extremely low resistance (ELR) material.

A method of forming a power transmission line, the method comprising: forming a first layer of ELR material onto a substrate; and forming a second layer of modifying material onto the first layer of ELR material.

A power transmission component configured to transmit current from a first location to a second location, comprising: a conductive element, wherein the conductive element includes: a first layer of apertured ELR material; and a second layer of modifying material; wherein the modifying material causes the apertured ELR material to exhibit improved characteristics over characteristics of the ELR material without the modifying layer.

A transmission line, comprising: a substrate layer; a buffer layer formed on the substrate layer; a conductive layer formed on the buffer layer, wherein the conductive layer is formed of a modified extremely low resistance (ELR) material; and a temperature component, wherein the temperature component is configured to maintain a temperature of the conductive layer at a temperature lower than a temperature surrounding the transmission line.

A method of forming a power transmission line, the method comprising: forming a housing; forming a first layer of ELR material onto a substrate within the housing; forming a second layer of modifying material onto the first layer of ELR material; and coupling the housing to a cooling component configured to maintain a temperature of the housing at a temperature lower than a temperature surrounding the housing.

A power transmission component configured to transmit current from a first location to a second location, comprising: a conductive element, wherein the conductive element includes: a first layer of apertured ELR material; and a second layer of modifying material; wherein the modifying material causes the apertured ELR material to exhibit improved characteristics over characteristics of the ELR material without the modifying layer; and a cooling component, wherein the temperature component is configured to maintain a temperature of the conductive element at a temperature lower than a temperature surrounding the power transmission component.

A method of transferring current from an energy source to a recipient, the method comprising: inputting energy received from the energy source into a transmission line formed of modified extremely low resistance (ELR) material; and receiving the input energy from the transmission line at one or more recipients.

A system for transmitting power between components of the system, comprising: a power source; a power recipient; and a transmission line, wherein the transmission line includes modified extremely low resistance materials configured to transmit power from the power source to the power recipient with extremely low resistance at temperatures between 150 K and 313 K at standard pressure.

A method for transmitting power within a utility grid, the method comprising: receiving power into a transmission line having a conductive core formed of modified extremely low resistance (ELR) materials; and transmitting the received power through the transmission line via the conductive core at extremely low resistance.

A power cable, comprising: a housing; wherein the housing contains a conductive core formed of: a substrate layer; a buffer layer formed on the substrate layer; a conductive layer formed on the buffer layer, wherein the conductive layer is formed of a modified extremely low resistance (ELR) material; and a temperature component, wherein the temperature component is configured to maintain a temperature within the housing at a temperature lower than a temperature surrounding the housing.

A power transmission cable configured to transmit current from a first location to a second location, comprising: a housing; and a conductive core, wherein the conductive core includes: a former; and a conductive element wound around the former, wherein the conductive element includes: a first layer of apertured ELR material; and a second layer of modifying material; wherein the modifying material causes the apertured ELR material to exhibit improved characteristics over characteristics of the ELR material without the modifying layer.

A power cable, comprising: an extremely low resistance (ELR) tape, wherein the ELR tape includes: a substrate formed of metal; a buffer layer formed on the metal substrate; and a conductive layer formed on the buffer layer, wherein the conductive layer is formed of a modified extremely low resistance (ELR) material.

A power transmission system, comprising: an energy source; a transmission line that includes modified extremely low resistance (ELR) material; and an energy recipient.

A power cable for use with a utility grid, comprising: an extremely low resistance (ELR) tape, wherein the ELR tape includes: a substrate formed of metal; a buffer layer formed on the metal substrate; and a conductive layer formed on the buffer layer, wherein the conductive layer is formed of a modified extremely low resistance (ELR) material.

A power cable for connecting an electrical device to a power source, comprising: an extremely low resistance (ELR) tape, wherein the ELR tape includes: a substrate formed of metal; a buffer layer formed on the metal substrate; and a conductive layer formed on the buffer layer, wherein the conductive layer is formed of a modified extremely low resistance (ELR) material.

Thus, various electrical, mechanical, computing, and/or other devices, as described in Chapters 1-18, or others not specifically disclosed, may employ and/or include components formed from modified ELR materials, such as the modified ELR materials described herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of examples of the system is not intended to be exhaustive or to limit the system to the precise form disclosed above. While specific implementations of, and examples for, the system are described above for illustrative purposes, various equivalent modifications are possible within the scope of the system, as those skilled in the relevant art will recognize.

The teachings of the system provided herein can be applied to other systems, not necessarily the system described above. The elements and acts of the various examples described above can be combined to provide further implementations.

All of the above patents and applications and other references, including any that may be listed in accompanying filing papers, are incorporated by reference. Aspects of the system can be modified, if necessary, to employ the systems, functions, and concepts of the various references described above to provide yet further implementations of the system.

These and other changes can be made to the system in light of the above Detailed Description. While the above description details certain embodiments of the system and describes the best mode contemplated, no matter how detailed the above appears in text, the system can be practiced in many ways. Details of the local-based support system may vary considerably in its implementation details, while still being encompassed by the system disclosed herein. As noted above, particular terminology used when describing certain features or aspects of the system should not be taken to imply that the terminology is being redefined herein to be restricted to any specific characteristics, features, or aspects of the system with which that terminology is associated. In general, the terms used in the following claims should not be construed to limit the system to the specific embodiments disclosed in the specification, unless the above Detailed Description section explicitly defines such terms. Accordingly, the actual scope of the system encompasses not only the disclosed embodiments, but also all equivalent ways of practicing or implementing the system under the claims.

While certain aspects of the technology are presented below in certain claim forms, the inventors contemplate the various aspects of the technology in any number of claim forms. Accordingly, the inventors reserve the right to add additional claims after filing the application to pursue such additional claim forms for other aspects of the system.

We claim:

1. A computing device, comprising:
a component formed at least in part of a modified extremely low resistance (ELR) material, wherein the modified ELR material comprises:
a layer of a first ELR material, the first ELR material having a crystalline structure and a principal axis extending along an a-axis of its crystalline structure; and
a layer of a second ELR material, immediately adjacent to and on top of the layer of the first ELR material, the second ELR material also having a crystalline structure and a principal axis extending along an a-axis of its crystalline structure,
wherein the first ELR material and the second ELR material are different from one another.

2. The computing device of claim 1, wherein the modified ELR material has improved operating characteristics over those of the first ELR material and the second ELR material.

3. The computing device of claim 1, wherein the first ELR material and the second ELR material are different forms of the same ELR material.

4. The computing device of claim 3, wherein the first ELR material comprises the same ELR material with a first stoichiometry and the second ELR material comprises the same ELR material with a second stoichiometry different from the first stoichiometry.

5. The computing device of claim 1, wherein the first ELR material comprises YBCO and the second ELR material comprises NBCO.

6. An electrical device, comprising:
a component formed at least in part of a modified extremely low resistance (ELR) material, wherein the modified ELR material comprises:
a layer of a first ELR material, the first ELR material having a crystalline structure and a principal axis extending along an a-axis of its crystalline structure; and
a layer of a second ELR material, immediately adjacent to and on top of the layer of the first ELR material, the second ELR material also having a crystalline structure and a principal axis extending along an a-axis of its crystalline structure, wherein the first ELR material and the second ELR material are different from one another.

7. The electrical device of claim 6, wherein the modified ELR material has improved operating characteristics over those of the first ELR material and the second ELR material.

8. The electrical device of claim 6, wherein the first ELR material and the second ELR material are different forms of the same ELR material.

9. The electrical device of claim 8, wherein the first ELR material comprises the same ELR material with a first stoichiometry and the second ELR material comprises the same ELR material with a second stoichiometry different from the first stoichiometry.

10. The electrical device of claim 6, wherein the first ELR material comprises YBCO and the second ELR material comprises NBCO.

11. A mechanical device, comprising:

a component formed at least in part of a modified extremely low resistance (ELR) material, wherein the modified ELR material comprises:

a layer of a first ELR material, the first ELR material having a crystalline structure and a principal axis extending along an a-axis of its crystalline structure; and a layer of a second ELR material, immediately adjacent to and on top of the layer of the first ELR material, the second ELR material also having a crystalline structure and a principal axis extending along an a-axis of its crystalline structure, wherein the first ELR material and the second ELR material are different from one another.

12. The mechanical device of claim 11, wherein the modified ELR material has improved operating characteristics over those of the first ELR material and the second ELR material.

13. The mechanical device of claim 11, wherein the first ELR material and the second ELR material are different forms of the same ELR material.

14. The mechanical device of claim 13, wherein the first ELR material comprises the same ELR material with a first stoichiometry and the second ELR material comprises the same ELR material with a second stoichiometry different from the first stoichiometry.

15. The mechanical device of claim 11, wherein the first ELR material comprises YBCO and the second ELR material comprises NBCO.

\* \* \* \* \*